US012740309B2

(12) United States Patent
Song et al.

(10) Patent No.: US 12,740,309 B2
(45) Date of Patent: Sep. 15, 2026

(54) ORGANIC LIGHT EMITTING DIODE AND ORGANIC LIGHT EMITTING DEVICE INCLUDING THE SAME

(71) Applicant: LG Display Co., Ltd., Seoul (KR)

(72) Inventors: In-Bum Song, Paju-si (KR); Do-Han Kim, Paju-si (KR); Sung-Jin Park, Paju-si (KR); Jae-Min Moon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1024 days.

(21) Appl. No.: 17/953,866

(22) Filed: Sep. 27, 2022

(65) Prior Publication Data

US 2023/0124167 A1 Apr. 20, 2023

(30) Foreign Application Priority Data

Oct. 7, 2021 (KR) ........................ 10-2021-0133075

(51) Int. Cl.

*H10K 85/30* (2023.01)
*C09K 11/06* (2006.01)

(Continued)

(52) U.S. Cl.

CPC ............ *H10K 85/342* (2023.02); *C09K 11/06* (2013.01); *H10K 85/633* (2023.02);

(Continued)

(58) Field of Classification Search

CPC .. H10K 85/342; H10K 85/633; H10K 85/636; H10K 85/654; H10K 85/6572;

(Continued)

(56) References Cited

U.S. PATENT DOCUMENTS 10,897,013 B2 * 1/2021 Lee ........................ H10K 71/12
12,581,847 B2 * 3/2026 Moon ................. H10K 85/342

(Continued)

FOREIGN PATENT DOCUMENTS

CN 110790797 A 2/2020
WO WO 2018/157981 A1 9/2018

*Primary Examiner* — Michael M Dollinger

(74) *Attorney, Agent, or Firm* — Birch, Stewart, Kolasch & Birch, LLP

(57) ABSTRACT

An organic light emitting diode and an organic light emitting device including the organic light emitting diode are discussed. The organic light emitting diode can include a first compound represented by the following formula, a second compound as a p-type host and a third compound as an n-type host in an emitting material layer. As a result, the organic light emitting diode and the organic light emitting device have advantages in the driving voltage, the luminous efficiency and the lifespan.

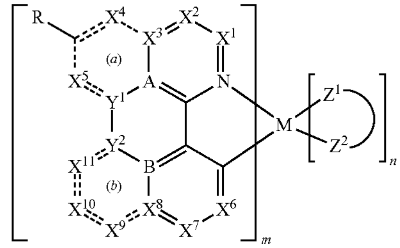

25 Claims, 8 Drawing Sheets

(51) Int. Cl.

| | |
|---|---|
| ***H10K 85/60*** | (2023.01) |
| *H10K 50/13* | (2023.01) |
| *H10K 59/12* | (2023.01) |

(52) U.S. Cl.

CPC ......... *H10K 85/636* (2023.02); *H10K 85/654* (2023.02); *H10K 85/6572* (2023.02); *H10K 85/6574* (2023.02); *H10K 85/6576* (2023.02); *C09K 2211/1029* (2013.01); *C09K 2211/185* (2013.01); *H10K 50/13* (2023.02); *H10K 59/12* (2023.02); *H10K 85/626* (2023.02)

(58) Field of Classification Search

CPC ........... H10K 85/6574; H10K 85/6576; H10K 50/13; H10K 59/12; H10K 85/626; H10K 50/19; H10K 2101/10; H10K 50/11; H10K 50/12; H10K 85/30; H10K 85/341; H10K 85/344; H10K 85/346; H10K 85/348; H10K 85/371; H10K 85/615; H10K 85/624; H10K 50/17; H10K 85/622; C09K 11/06; C09K 2211/1029; C09K 2211/185; G09F 9/335

See application file for complete search history.

(56) References Cited

U.S. PATENT DOCUMENTS

| | | | | |
|---|---|---|---|---|
| 2020/0055822 | A1* | 2/2020 | Wirges | C07D 403/10 |
| 2021/0202859 | A1* | 7/2021 | Shin | H10K 85/633 |
| 2022/0109118 | A1* | 4/2022 | Zhang | C07F 15/0033 |
| 2022/0127288 | A1* | 4/2022 | Moon | C09K 11/06 |
| 2023/0124167 | A1* | 4/2023 | Song | H10K 85/342 257/40 |
| 2023/0139277 | A1* | 5/2023 | Song | H10K 85/342 257/40 |
| 2023/0148324 | A1* | 5/2023 | Park | H10K 85/342 257/40 |

* cited by examiner

ORGANIC LIGHT EMITTING DIODE AND ORGANIC LIGHT EMITTING DEVICE INCLUDING THE SAME

CROSS-REFERENCE TO RELATED APPLICATIONS

This application claims priority to Korean Patent Application No. 10-2021-0133075, filed in the Republic of Korea on Oct. 7, 2021, which is expressly incorporated by reference into the present application.

BACKGROUND

Technical Field

The present disclosure relates to an organic light emitting diode, and more specifically, to an organic light emitting diode having excellent luminous efficiency and luminous lifespan and an organic light emitting device including the organic light emitting diode.

Discussion of the Related Art

An organic light emitting diode (OLED) display among a flat display device used widely has come into the spotlight as a display device replacing rapidly a liquid crystal display device (LCD). The OLED can be formed as a thin organic film with a thickness less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

The OLED includes an anode, a cathode and an emitting material layer, and the emitting material layer includes a host and a dopant (e.g., an emitter).

Since a fluorescent material as the dopant uses only singlet exciton energy in the luminous process, the related art fluorescent material shows low luminous efficiency. On the contrary, a phosphorescent material can show high luminous efficiency since it uses triplet exciton energy as well as singlet exciton energy in the luminous process. However, metal complex, representative phosphorescent material, has short luminous lifespan for commercial use.

In addition, the luminous efficiency and the luminous lifespan of the OLED can be affected by the exciton generation efficiency in the host and the energy transfer efficiency from the host to the dopant.

Accordingly, development of materials of the emitting material layer being capable of improving the luminous efficiency and the luminous lifespan of the OLED is desired.

SUMMARY OF THE DISCLOSURE

Accordingly, embodiments of the present disclosure are directed to an OLED and an organic light emitting device that substantially obviate one or more of the problems associated with the limitations and disadvantages of the related art.

An aspect of the present disclosure is to provide an OLED and an organic light emitting device having excellent luminous efficiency and luminous lifespan.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, in one aspect, the present disclosure provides an organic light emitting diode comprising: a first electrode; a second electrode facing the first electrode; and a first emitting part including a first red emitting material layer and positioned between the first and second electrodes, wherein the first red emitting material layer includes a first compound, a second compound and a third compound, wherein the first compound is represented by Formula 1-1:

[Formula 1-1]

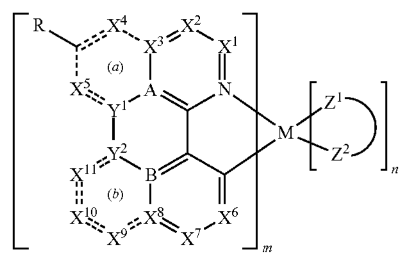

wherein M is molybdenum (Mo), tungsten (W), rhenium (Re), ruthenium (Ru), osmium (Os), rhodium (Rh), iridium (Ir), palladium (Pd), platinum (Pt) or silver (Ag); each of A and B is a carbon atom; R is an unsubstituted or substituted $C_1$-$C_{20}$ alkyl group, an unsubstituted or substituted $C_1$-$C_{20}$ alkyl silyl group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group; each of $X^1$ to $X^{11}$ is independently a carbon atom, $CR^1$ or N; only one of: a ring (a) with $X^3$-$X^5$, $Y^1$ and A; or a ring (b) with $X^8$-$X^{11}$, $Y^2$ and B is formed; and if the ring (a) is formed, each of $X^3$ and $Y^1$ is a carbon atom, $X^6$ and $X^7$ or $X^7$ and $X^8$ forms an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group; if the ring (b) is forms, each of $X^8$ and $Y^2$ is a carbon atom, $X^1$ and $X^2$ or $X^2$ and $X^3$ forms an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent $R^1$, and/or $R^2$ and $R^3$ form an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

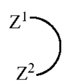

is an auxiliary ligand; m is an integer of 1 to 3; n is an integer of 0 to 2; and m+n is an oxidation number of M, wherein the second compound is represented by Formula 2-1: [Formula 2-1]

[Formula 2-1]

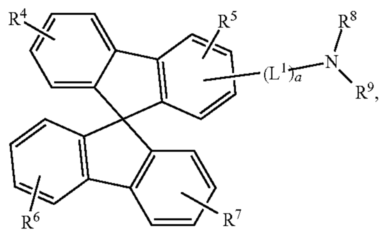

wherein each of $R^4$, $R^5$, $R^6$ and $R^7$ is independently selected from the group consisting of hydrogen, protium, deuterium, an unsubstituted or substituted $C_1$-$C_{20}$ alkyl group and an unsubstituted or substituted $C_6$-$C_{30}$ aryl group, each of $R^8$ and $R^9$ is independently selected from the group consisting of an unsubstituted or substituted $C_6$-$C_{30}$ aryl group and an unsubstituted or substituted $C_3$-$C_{30}$ heteroaryl group, $L^1$ is selected from the group consisting of an unsubstituted or substituted $C_6$-$C_{30}$ arylene group and an unsubstituted or substituted $C_3$-$C_{30}$ heteroarylene group, and a is 0 or 1, wherein the third

[Formula 3-1]

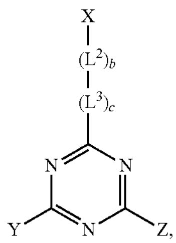

compound is represented by Formula 3-1: [Formula 3-1], wherein each of X, Y and Z is independently selected from the group consisting of an unsubstituted or substituted $C_6$-$C_{30}$ aryl group and an unsubstituted or substituted $C_3$-$C_{30}$ heteroaryl group; each of $L^2$ and $L^3$ is independently selected from the group consisting of an unsubstituted or substituted $C_6$-$C_{30}$ arylene group and an unsubstituted or substituted $C_3$-$C_{30}$ heteroarylene group; and each of b and c is independently 0 or 1.

In another aspect, the present disclosure provides an organic light emitting device comprising a substrate; and the above organic light emitting diode positioned on or over the substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION OF THE EMBODIMENTS

Reference will now be made in detail to aspects of the disclosure, examples of which are illustrated in the accompanying drawings.

In the present disclosure, a dopant (e.g., an emitter), an n-type host and a p-type host each having excellent optical property are included in an emitting material layer (EML) of an OLED so that the OLED has advantages in at least one of a driving voltage, a luminous efficiency and a luminous lifespan. For example, the organic light emitting device can be an organic light emitting display device or an organic light emitting lighting device. The explanation below is focused on the organic light emitting display device including the OLED. All the components of each OLED and each organic light emitting display device according to all embodiments of the present disclosure are operatively coupled and configured.

Figure 1:
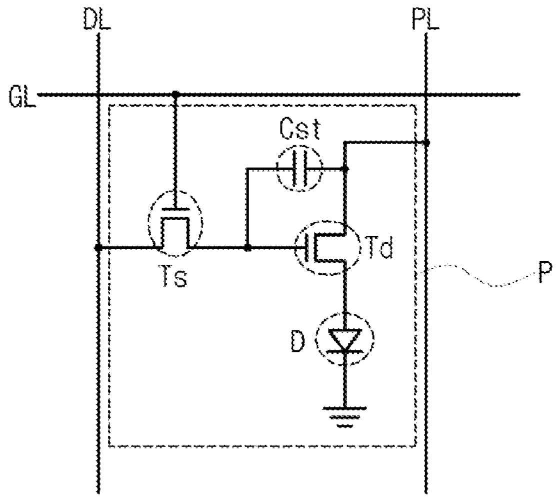
FIG. 1 is a schematic circuit diagram illustrating an organic light emitting display device according to an embodiment of the present disclosure.

FIG. 1 is a schematic circuit diagram illustrating an organic light emitting display device according to the present disclosure.

As shown in FIG. 1, the organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region can include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
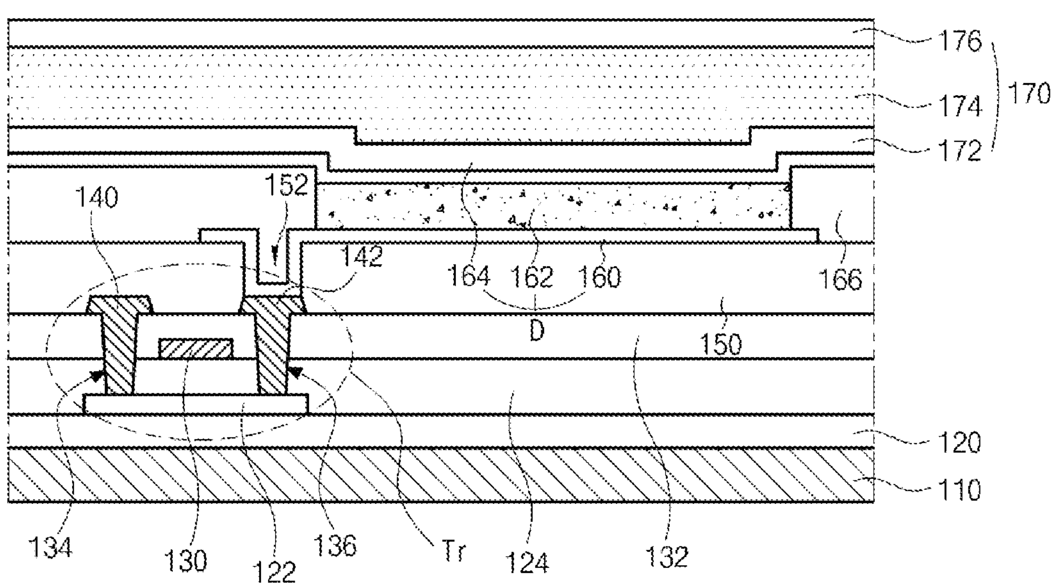
FIG. 2 is a cross-sectional view illustrating an organic light emitting display device according to a first embodiment of the present disclosure.

FIG. 2 is a schematic cross-sectional view of an organic light emitting display device according to a first embodiment of the present disclosure.

As shown in FIG. 2, an organic light emitting display device 100 includes a substrate 110, a TFT Tr on or over the substrate 110, a planarization layer 150 covering the TFT Tr and an OLED D on the planarization layer 150 and connected to the TFT Tr.

The substrate 110 can be a glass substrate or a flexible substrate. For example, the flexible substrate can be one of a polyimide (PI) substrate, a polyethersulfone (PES) substrate, a polyethylenenaphthalate (PEN) substrate, a polyethylene terephthalate (PET) substrate and a polycarbonate (PC) substrate.

A buffer layer 122 is formed on the substrate, and the TFT Tr is formed on the buffer layer 122. The buffer layer 122 can be omitted. For example, the buffer layer 122 can be formed of an inorganic insulating material, e.g., silicon oxide or silicon nitride.

A semiconductor layer 120 is formed on the buffer layer 122. The semiconductor layer 120 can include an oxide semiconductor material or polycrystalline silicon.

When the semiconductor layer 120 includes the oxide semiconductor material, a light-shielding pattern can be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities can be doped into both sides of the semiconductor layer 120.

A gate insulating layer 124 of an insulating material is formed on the semiconductor layer 120. The gate insulating layer 124 can be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120. In FIG. 2, the gate insulating layer 124 is formed on an entire surface of the substrate 110. Alternatively, the gate insulating layer 124 can be patterned to have the same shape as the gate electrode 130.

An interlayer insulating layer 132 of an insulating material is formed on the gate electrode 130 and over an entire surface of the substrate 110. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132.

The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

The gate line and the data line cross each other to define the pixel region, and the switching TFT is formed to be connected to the gate and data lines. The switching TFT is connected to the TFT Tr as the driving element. In addition, the power line, which can be formed to be parallel to and spaced apart from one of the gate and data lines, and the storage capacitor for maintaining the voltage of the gate electrode of the TFT Tr in one frame can be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 160, which is connected to the drain electrode 146 of the TFT Tr through the drain contact hole 152, an organic light emitting layer 162 and a second electrode 164. The organic light emitting layer 162 and the second electrode 164 are sequentially stacked on the first electrode 160. For example, a red pixel region, a green pixel region and a blue pixel region can be defined on the substrate 110, and the OLED D is positioned in each of the red, green and blue pixel regions. Namely, the OLEDs respectively emitting the red, green and blue light are respectively positioned in each of the red, green and blue pixel regions.

A first electrode 160 is separately formed in each pixel and on the planarization layer 150. The first electrode 160 can be an anode and can be formed of a conductive material, e.g., a transparent conductive oxide (TCO), having a relatively high work function. For example, the first electrode 160 can be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 is operated in a bottom-emission type, the first electrode 160 can have a single-layered structure of the transparent conductive material layer. When the organic light emitting display device 100 is operated in a top-emission type, the first electrode 160 can further include a reflection electrode or a reflection layer. For example, the reflection electrode or the reflection layer can be formed of silver (Ag) or aluminum-palladium-copper (APC) alloy. In the top-emission type organic light emitting display device 100, the first electrode 160 can have a triple-layered structure of ITO/Ag/ITO or ITO/APC/ITO.

A bank layer 166 is formed on the planarization layer 150 to cover an edge of the first electrode 160. Namely, the bank layer 166 is positioned at a boundary of the pixel and exposes a center of the first electrode 160 in the pixel.

The organic emitting layer 162 is formed on the first electrode 160. The organic emitting layer 162 can have a single-layered structure of an emitting material layer. Alternatively, the organic emitting layer 162 can further include at least one of a hole injection layer (HIL), a hole transporting layer (HTL), an electron blocking layer (EBL), a hole blocking layer (HBL), an electron transporting layer (ETL) and an electron injection layer (EIL) to have a multi-layered structure. In addition, the organic emitting layer 162 can include at least two EMLs, which is spaced apart from each other, to have a tandem structure.

As illustrated below, in the OLED D in the red pixel region, the EML in the organic emitting layer 162 includes a first compound being a red dopant (emitter), a second compound being a p-type host and a third compound being an n-type host. As a result, in the OLED D, the driving voltage is decreased, and the luminous efficiency and the luminous lifespan are increased.

The second electrode 164 is formed over the substrate 110 where the organic emitting layer 162 is formed. The second electrode 164 covers an entire surface of the display area and can be formed of a conductive material having a relatively low work function to serve as a cathode. For example, the second electrode 164 can be formed of aluminum (Al), magnesium (Mg), calcium (Ca), silver (Ag) or their alloy or combination. In the top-emission type organic light emitting display device 100, the second electrode 164 can have a thin profile (small thickness) to provide a light transmittance property (or a semi-transmittance property).

The organic light emitting display device 100 can further include a color filter corresponding to the red, green and blue pixel regions. For example, red, green and blue color filter patterns can be formed in the red, green and blue pixel regions, respectively, so that the color purity of the organic light emitting display device 100 can be improved. In the bottom-type organic light emitting display device 100, the color filter can be disposed between the OLED D and the substrate 110, e.g., between the interlayer insulating layer 132 and the planarization layer 150. Alternatively, in the top-emission type organic light emitting display device 100, the color filter can be disposed on or over the OLED D, e.g., on or over the second electrode 164.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 can be omitted.

The organic light emitting display device 100 can further include a polarization plate for reducing an ambient light reflection. For example, the polarization plate can be a circular polarization plate. In the bottom-emission type organic light emitting display device 100, the polarization plate can be disposed under the substrate 110. In the top-emission type organic light emitting display device 100, the polarization plate can be disposed on or over the encapsulation film 170.

In addition, in the top-emission type organic light emitting display device 100, a cover window can be attached to the encapsulation film 170 or the polarization plate. In this instance, the substrate 110 and the cover window have a flexible property such that a flexible organic light emitting display device can be provided.

Figure 3:
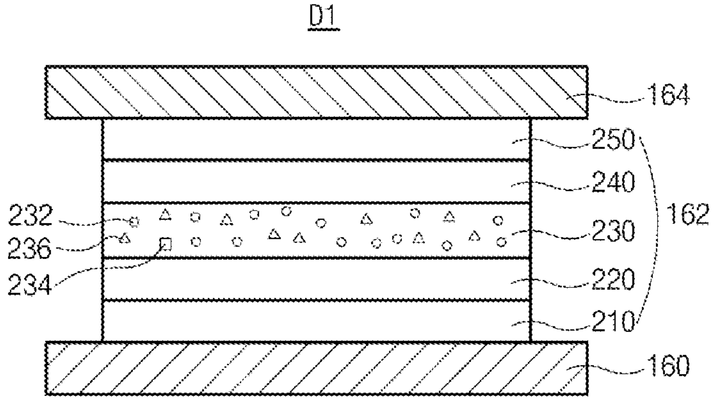
FIG. 3 is a cross-sectional view illustrating an OLED according to a second embodiment of the present disclosure.

FIG. 3 is a cross-sectional view illustrating an OLED according to a second embodiment of the present disclosure.

As shown in FIG. 3, the OLED D1 includes the first and second electrodes 160 and 164 facing each other and the organic emitting layer 162 therebetween. The organic emitting layer 162 includes a red EML 230.

The organic light emitting display device 100 (of FIG. 2) includes the red, green and blue pixel regions, and the OLED D1 can be positioned in the red pixel region.

The first electrode 160 is an anode for injecting the hole, and the second electrode 164 is a cathode for injecting the electron. One of the first and second electrodes 160 and 164 is a reflective electrode, and the other one of the first and second electrodes 160 and 164 is a transparent (semitransparent) electrode.

For example, the first electrode 160 can include a transparent conductive material, e.g., ITO or IZO, and the second electrode 164 can include one of Al, Mg, Ag, AlMg and MgAg.

The organic emitting layer 162 can further include at least one of the HTL 220 under the red EML 230 and the ETL 240 on or over the red EML 230. Namely, the HTL 220 is disposed between the red EML 230 and the first electrode 160, and the ETL 240 is disposed between the red EML 230 and the second electrode 164.

In addition, the organic emitting layer 162 can further include at least one of the HIL 210 under the HTL 220 and the EIL 250 on the ETL 240.

The organic emitting layer 162 can further include at least one of the EBL between the HTL 220 and the red EML 230 and the HBL between the ETL 240 and the red EML 230.

In the OLED D1 of the present disclosure, the red EML 230 can constitute an emitting part, or the red EML 230 and at least one of the HIL 210, the HTL 220, the EBL, the HBL, the ETL 240 and the EIL 250 can constitute the emitting part.

The red EML 230 includes a first compound 232 being the red dopant, a second compound 234 being the p-type host, e.g., a first host, and a third compound 236 being the n-type host, e.g., a second host. The red EML can have a thickness of 100 to 400 Å, e.g., 200 to 400 Å.

In the red EML 230, each of the second and third compounds 234 and 236 can have a weight % being greater than the first compound 232. For example, in the red EML 230, the first compound 232 can have a weight % of 1 to 20, e.g., 5 to 15.

In addition, in the red EML 230, a ratio of the weight % between the second compound 234 and the third compound 236 can be 1:3 to 3:1. For example, in the red EML 230, the second and third compounds 234 and 236 can have the same weight %.

The first compound 232 is represented by Formula 1-1. The first compound 232 is an organometallic compound and has a rigid chemical conformation so that it can enhance luminous efficiency and luminous lifespan of the OLED D1.

[Formula 1-1]

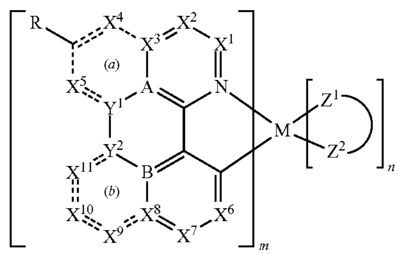

wherein

M is molybdenum (Mo), tungsten (W), rhenium (Re), ruthenium (Ru), osmium (Os), rhodium (Rh), iridium (Ir), palladium (Pd), platinum (Pt) or silver (Ag);

each of A and B is a carbon atom;

R is an unsubstituted or substituted $C_1$-$C_{20}$ alkyl group, an unsubstituted or substituted $C_1$-$C_{20}$ alkyl silyl group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

each of $X^1$ to $X^{11}$ is independently a carbon atom, $CR^1$ or N;

only one of: a ring (a) with $X^3$-$X^5$, $Y^1$ and A; or a ring (b) with $X^8$-$X^{11}$, $Y^2$ and B, is formed; and if the ring (a) is formed, each of $X^3$ and $Y^1$ is a carbon atom, $X^6$ and $X^7$ or $X^7$ and $X^8$ forms an unsubstituted or substituted $C_3$-$C_{30}$ alicyclic ring, the unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group;

if the ring (b) is forms, each of $X^8$ and $Y^2$ is a carbon atom, $X^1$ and $X^2$ or $X^2$ and $X^3$ forms an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent $R^1$, and/or $R^2$ and $R^3$ form an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

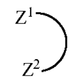

is an auxiliary ligand;

m is an integer of 1 to 3; and n is an integer of 0 to 2; and m+n is an oxidation number of M.

As used herein, the term "unsubstituted" means that the specified group bears no substituents, and hydrogen is linked. In this case, hydrogen comprises protium, deuterium and tritium without specific disclosure.

As used herein, substituent in the term "substituted" comprises, but is not limited to, unsubstituted or halogen-substituted $C_1$-$C_{20}$ alkyl, unsubstituted or halogen-substituted $C_1$-$C_{20}$ alkoxy, halogen, cyano, —CF3, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_1$-$C_{20}$ alkoxy silyl group, a $C_3$-$C_{20}$ cycloalkyl silyl group, a $C_6$-$C_{30}$ aryl silyl group and a $C_3$-$C_{30}$ hetero aryl silyl group.

As used herein, the term "alkyl" refers to a branched or unbranched saturated hydrocarbon group of 1 to 20 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. The alkenyl group can be substituted with one or more substituents.

As used herein, the term "alicyclic" or "cycloalkyl" refers to non-aromatic carbon-based ring composed of at least three carbon atoms. Examples of alicyclic groups include, but are not limited to, cyclopropyl, cyclobutyl, cyclopentyl, cyclohexyl, norbornyl, and the like. The alicyclic group can be substituted with one or more substituents.

As used herein, the term "alkoxy" refers to a branched or unbranched alkyl bonded through an ether linkage represented by the formula —O(-alkyl) where alkyl is defined herein. Examples of alkoxy include methoxy, ethoxy, n-propoxy, isopropoxy, butoxy, and tert-butoxy, and the like.

As used herein, the term "alkyl amino" refers to a group represented by the formula —NH(-alkyl) or —N(-alkyl)$_2$ where alkyl is defined herein. Examples of alkyl amino represented by the formula —NH(-alkyl) include, but not limited to, methylamino group, ethylamino group, propylamino group, isopropylamino group, butylamino group, isobutylamino group, (sec-butyl)amino group, (tert-butyl) amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl) amino group, dihexylamino group, N-ethyl-N-methylamino group, N-methyl-N-propylamino group, N ethyl-N-propylamino group and the like.

As used herein, the term "aromatic" or "aryl" is well known in the art. The term includes monocyclic rings linked covalently or fused-ring polycyclic groups. An aromatic group can be unsubstituted or substituted. Examples of aromatic or aryl include phenyl, 1-naphthyl, 2-naphthyl, 4-biphenyl, anthracenyl, and phenanthracenyl and the like. Substituents for each of the above noted aryl ring systems are acceptable substituents are defined herein.

As used herein, the term "alkyl silyl group" refers to any linear or branched, saturated or unsaturated acyclic or acyclic alkyl, and the alkyl has 1 to 20 carbon atoms. Examples of the alkyl silyl group include a trimethylsilyl group, a trimethylsilyl group, a t-butyldimethylsilyl group, a vinyldimethylsilyl group, a propyldimethylsilyl group, a triphenylsilyl group, a diphenylsilyl group, and a phenylsilyl group.

As used herein, the term "halogen" refers to fluorine, chlorine, bromine or iodine atom.

As used herein, the term "hetero" in such as "a hetero aromatic ring", "a hetero cycloalkylene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" and "a hetero aryl silyl group" means that at least one carbon atom, for example 1-5 carbons atoms, constituting an aromatic ring or an alicyclic ring is substituted with at least one hetero atom selected from the group consisting of N, O, S, Si, Se, P, B and combination thereof.

As used herein, the term "hetero aromatic" or "hetero aryl" refers to a heterocycle including hetero atoms selected from N, O and S in a ring where the ring system is an aromatic ring. The term includes monocyclic rings linked covalently or fused-ring polycyclic groups. A hetero aromatic group can be unsubstituted or substituted. Examples of hetero aromatic or hetero aryl include pyridyl, pyrrolyl, pyrazinyl, pyrimidinyl, thienyl (alternatively referred to as thiophenyl), thiazolyl, furanyl, imidazolyl, pyrazolyl, triazolyl, tetrazolyl, oxazolyl, oxadiazolyl, thiazolyl, and thiadiazolyl.

As used herein, the term "hetero aryl oxy" refers to a group represented by the formula —O— (hetero aryl) where hetero aryl is defined herein.

For example, when each of R and $R^1$ to $R^3$ in Formula 1-1 is independently a $C_6$-$C_{30}$ aromatic group, each of R and $R^1$ to $R^3$ can be independently selected from the group consisting of, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. As an example, when each of R and $R^1$ to $R^3$ is independently a $C_6$-$C_{30}$ aryl group, each of R and $R^1$ to $R^3$ can be independently selected from the group consisting of, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

Alternatively, when each of R and $R^1$ to $R^3$ in Formula 1 is independently a $C_3$-$C_{30}$ hetero aromatic group, each of R and $R^1$ to $R^3$ can be independently selected from the group consisting of, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group. As an example, when each of R and $R^1$ to $R^3$ is independently a $C_3$-$C_{30}$ hetero aryl group, each of R and $R^1$ to $R^3$ can be independently selected from the group consisting of, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl.

As an example, each of the aromatic group or the hetero aromatic group of R and $R^1$ to $R^3$ can consist of one to three aromatic or hetero aromatic rings. When the number of the aromatic or hetero aromatic rings of R and $R^1$ to $R^3$ is more than three, conjugated structure in the first compound 232 becomes too long, thus, the first compound 232 can have too narrow energy bandgap. For example, each of the aryl group or the hetero aryl group of R and $R^1$ to $R^3$ can be independently selected from the group consisting of, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl and phenothiazinyl.

Alternatively, two adjacent $R^1$, and/or $R^2$ and $R^3$ can form an unsubstituted or substituted $C_3$-$C_{30}$ alicyclic ring (e.g., a $C_5$-$C_{10}$ alicyclic ring), an unsubstituted or substituted $C_3$-$C_{30}$ hetero alicyclic ring (e.g., a $C_3$-$C_{10}$ hetero alicyclic ring), an unsubstituted or substituted $C_6$-$C_{30}$ aromatic ring (e.g., a $C_6$-$C_{20}$ aromatic ring) or an unsubstituted or substituted $C_3$-$C_{30}$ hetero aromatic ring (e.g., a $C_3$-$C_{20}$ hetero aromatic ring). The alicyclic ring, the hetero alicyclic ring, the aromatic ring and the hetero aromatic ring formed by: two adjacent $R^1$; or $R^2$ and $R^3$, are not limited to specific rings. For example, the aromatic ring or the hetero aromatic ring formed by those groups can be independently selected from the group consisting of, but is not limited to, a benzene ring, a pyridine ring, an indole ring, a pyran ring, a fluorene ring unsubstituted or substituted with at least one $C_1$-$C_{10}$ alkyl group.

The first compound 232 being the organometallic compound having the structure of Formula 1-1 has a ligand with fused with multiple aromatic and/or hetero aromatic rings, thus it has narrow full-width at half maximum (FWHM) in photoluminescence spectrum. Particularly, since the first compound 232 has a rigid chemical conformation, its conformation is not rotated in the luminous process so that it can maintain good luminous lifespan. In addition, since the first compound 232 has specific ranges of photoluminescence emissions, the color purity of the light emitted from the first compound 232 can be improved.

In addition, the first compound 232 can be a heteropletic metal complex including two different bidentate ligands coordinated to the central metal atom. (n is a positive integer in Formula 1-1) The photoluminescence color purity and emission colors of the first compound 232 can be controlled with ease by combining two different bidentate ligands. Moreover, it is possible to control the color purity and emission peaks of the first compound 232 by introducing various substituents to each of the ligands. For example, the first compound 232 having the structure of Formula 1-1 can emit yellow to red colors and can improve luminous efficiency of an organic light emitting diode.

In one exemplary aspect, the first compound 232 can have the ring (a) with $X^3$-$X^5$, $Y^1$ and A to be represented by Formula 1-2.

[Formula 1-2]

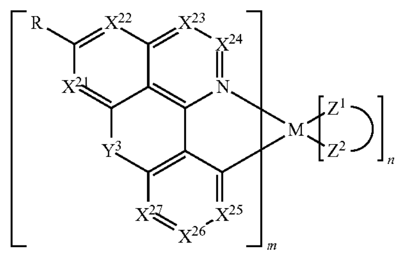

wherein each of $X^{21}$ to $X^{27}$ is independently $CR^1$ or N; $Y^3$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$; and each of M, R,

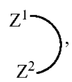, m, n, $R^1$ to $R^3$ and $R^a$ is same as defined in Formula 1-1.

In an alternative aspect, the first compound 232 can have the ring (b) with $X^8$-$X^{11}$, $Y^2$ and B to be represented by Formula 1-3

[Formula 1-3]

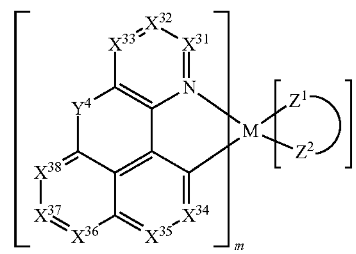

wherein each of $X^{31}$ to $X^{38}$ is independently $CR^1$ or N; $Y^4$ is $BR^2$, $CW^2R^3$, C═O, $SiR^2R^3$, $GeR^2R^3$, $PR^2$, P═O, O, S, $SO_2$, Se, $SeO_2$, Te, $TeO_2$, or $NR^a$; each of M,

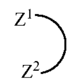, m, n, $R^1$ to $R^3$ and $R^a$ is same as defined in Formula 1-1.

For example, M can be iridium (Ir), palladium (Pd) or platinum (Pt). $X^{31}$ to $X^{38}$ can be $CR^1$. $R^1$ can be selected from the group consisting of hydrogen, protium, deuterium and a $C_1$-$C_{20}$ alkyl group unsubstituted or substituted with deuterium, or optionally, two of $R^1$s of $X^{31}$ to $X^{33}$ can form a $C_6$-$C_{30}$ aromatic ring unsubstituted or substituted with a $C_1$-$C_{20}$ alkyl group. $Y^4$ can be $CR^2R^3$, $N^a$ or O. Each of $R^2$ and $R^3$ can be independently selected from the group consisting of hydrogen, protium, deuterium, a $C_1$-$C_{20}$ alkyl group unsubstituted or substituted with deuterium and a $C_6$-$C_{30}$ aromatic group (aryl group). In addition, one of m and n can be 1, and the other one of m and n can be 2.

More particularly, in Formula 1-2, $X^{25}$ and $X^{26}$ are connected to each other to form an aromatic ring or a hetero aromatic ring so that the first compound 232 can be represented by Formula 1-4. Alternatively, in Formula 1-2, $X^{26}$ and $X^{27}$ are connected to each other to form an aromatic ring or a hetero aromatic ring so that the first compound 232 can be represented by Formula 1-5.

[Formula 1-4]

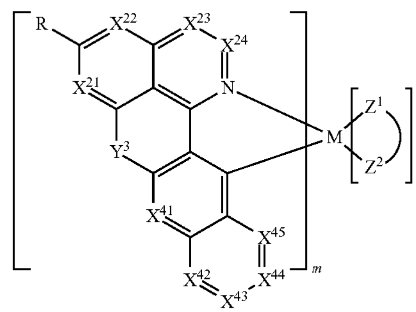

-continued

[Formula 1-5]

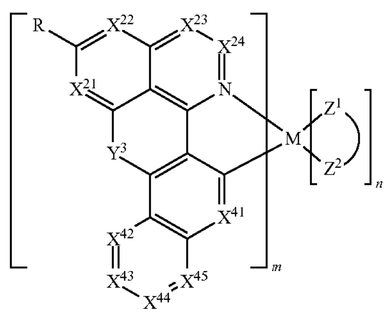

wherein each of $X^{41}$ to $X^{45}$ is independently $CR^1$ or N; each of M, R,

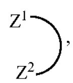

m, n and $R^1$ to $R^3$ is same as defined in Formula 1-1; and $X^{21}$ to $X^{24}$ and $Y^3$ is same as defined in Formula 1-2;

Alternatively, in Formula 1-3, $X^{31}$ and $X^{32}$ are connected to each other to form an aromatic ring or a hetero aromatic ring so that the first compound 232 can be represented by Formula 1-6. Alternatively, in Formula 1-3, $X^{32}$ and $X^{33}$ are connected to each other to form an aromatic ring or a hetero aromatic ring so that the first compound 232 can be represented by Formula 1-7.

[Formula 1-6]

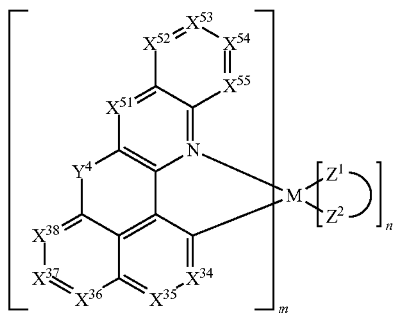

[Formula 1-7]

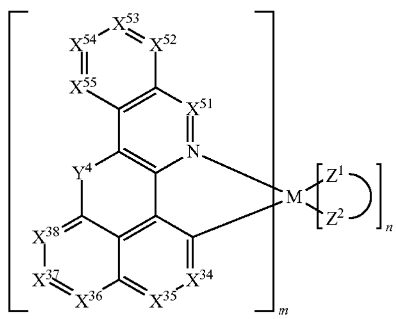

wherein each of $X^{51}$ to $X^{55}$ is independently $CR^1$ or N; M,

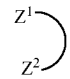

m, n, $R^1$ to $R^3$ is same as defined in Formula 1-1; and each of $X^{34}$ to $X^{38}$ and $Y^4$ is same as defined in Formula 1-3.

For example, M can be iridium (Ir), palladium (Pd) or platinum (Pt). One of $X^{34}$ to $X^{38}$ and $X^{51}$ to $X^{55}$ can be N, and the rest of $X^{34}$ to $X^{38}$ and $X^{51}$ to $X^{55}$ can be $CR^1$. $Y^4$ can be $CR^2R^3$, $N^a$, O or S. $R^1$ can be selected from the group consisting of hydrogen, protium, deuterium, a $C_1$-$C_{20}$ alkyl group unsubstituted or substituted with deuterium, a $C_1$-$C_{20}$ alkyl silyl group, a $C_6$-$C_{30}$ aromatic group (aryl group) or a $C_3$-$C_{30}$ hetero aromatic group (hetero aryl group). Each of $R^2$ and $R^3$ can be independently selected from the group consisting of hydrogen, protium, deuterium, a $C_1$-$C_{20}$ alkyl group unsubstituted or substituted with deuterium, a $C_3$-$C_{30}$ alicyclic group, a $C_3$-$C_{30}$ hetero alicyclic group, a $C_6$-$C_{30}$ aromatic group (aryl group) or a $C_3$-$C_{30}$ hetero aromatic group (hetero aryl group), or optionally, two adjacent $R^1$, and/or $R^2$ and $R^3$ can form a $C_3$-$C_{30}$ alicyclic ring, a $C_3$-$C_{30}$ hetero alicyclic ring, a $C_6$-$C_{30}$ aromatic ring or a $C_3$-$C_{30}$ hetero aromatic ring.

For example, in Formula 1-1, the auxiliary ligand

can be a bidentate ligand wherein $Z^1$ and $Z^2$ are independently selected from the group consisting of an oxygen atom, a nitrogen atom, and a phosphorus atom. The bidentate ligand can be acetylacetonate-based ligand, or N,N'- or N,O-bidentate anionic ligand.

As an example, the center coordination metal can be iridium and the auxiliary ligand

can be an acetylacetonate-based ligand. Namely, the first compound 232 can be represented by one of Formulas 1-8 to 1-11:

[Formula 1-8]

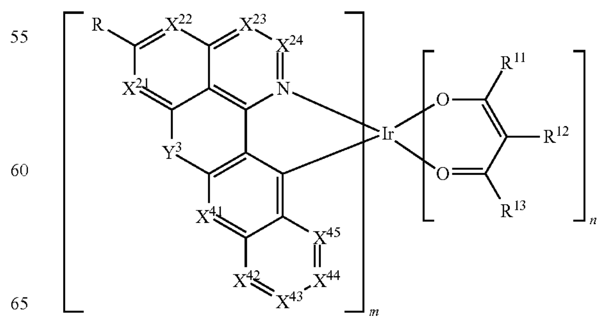

-continued

[Formula 1-9]

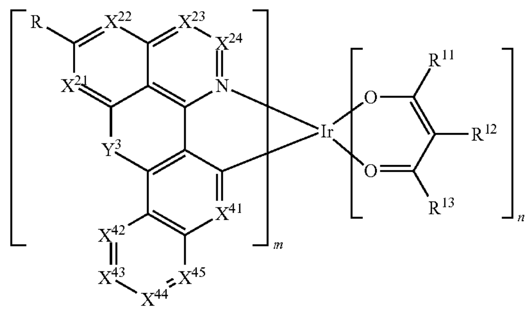

[Formula 1-10]

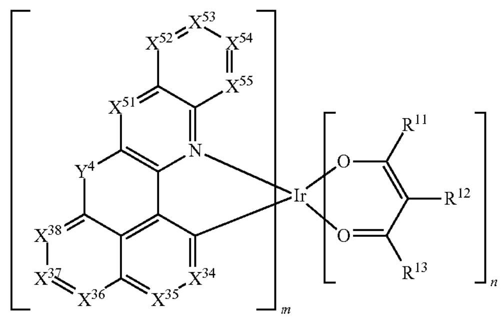

[Formula 1-11]

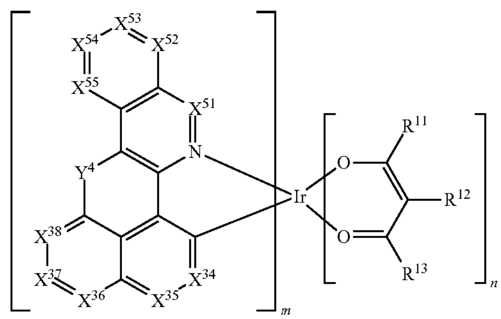

wherein R in Formulas 1-8 and 1-9 is same as defined in Formula 1-1; each of $X^{21}$ to $X^{24}$, $X^{34}$ to $X^{38}$, $X^{41}$ to $X^{45}$ and $X^{51}$ to $X^{55}$ is independently $CR^1$ or N; each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$; each of $R^1$ to $R^3$ and $R^a$ is same as defined in Formula 1-1; each of $R^{11}$ to $R^{13}$ is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group; m is an integer of 1 to 3; n is an integer of 0 to 2; and wherein m+n is 3.

In Formula 1-1, M can be iridium, one of Z and $Z^2$ can be an oxygen atom, and the other one of $Z^1$ and $Z^2$ can be a nitrogen atom. Namely, the first compound 232 can be represented by one of Formulas 1-12 to 1-15.

[Formula 1-12]

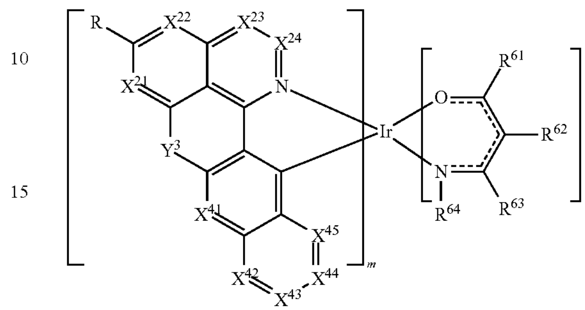

[Formula 1-13]

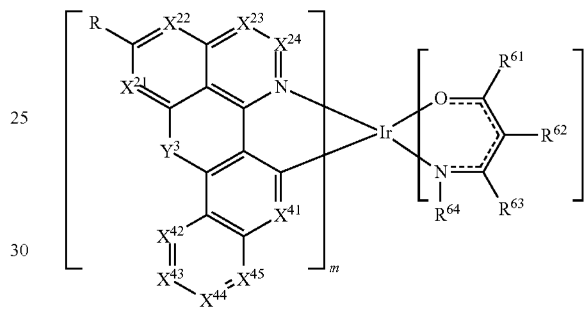

[Formula 1-14]

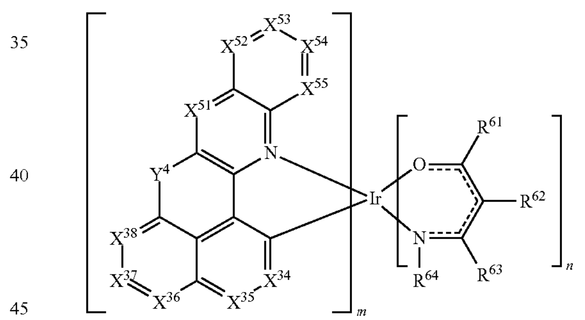

[Formula 1-15]

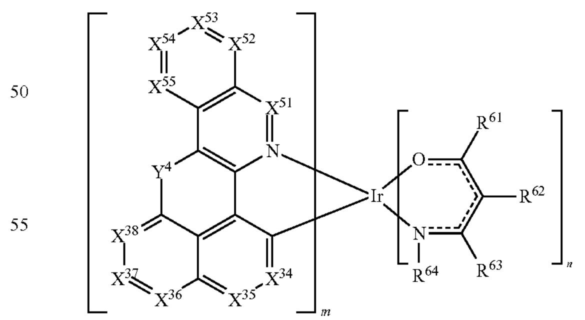

wherein R in Formulas 1-12 and 1-13 is same as defined in Formula 1-1; each of $X^{21}$ to $X^{24}$, $X^{34}$ to $X^{38}$, $X^{41}$ to $X^{45}$ and $X^{51}$ to $X^{55}$ is independently $CR^1$ or N; each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$; each of $R^1$ to $R^3$ and $R^a$ is same as defined in Formula 1-1; each of $R^{61}$ to $R^{64}$ is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group; m is an integer of 1 to 3; n is an integer of 0 to 2; and wherein m+n is 3.

In Formula 1-1, M can be iridium, $Z^1$ and $Z^2$ can be a nitrogen atom. Namely, the first compound 232 can be represented by one of Formulas 1-16 to 1-23.

[Formula 1-16]

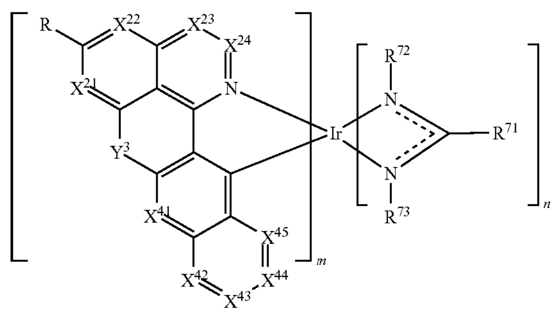

[Formula 1-17]

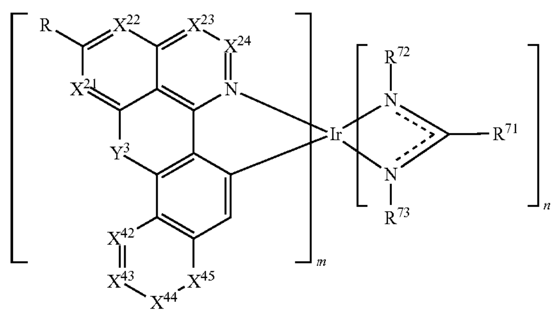

[Formula 1-18]

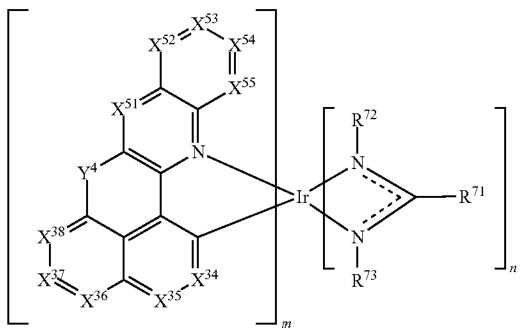

-continued

[Formula 1-19]

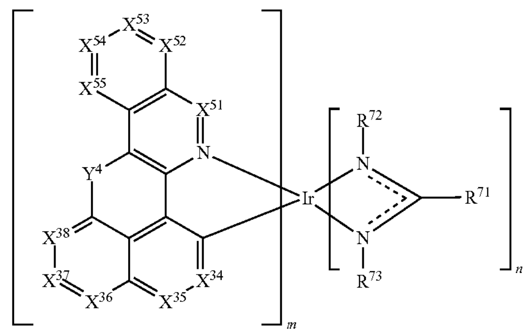

[Formula 1-20]

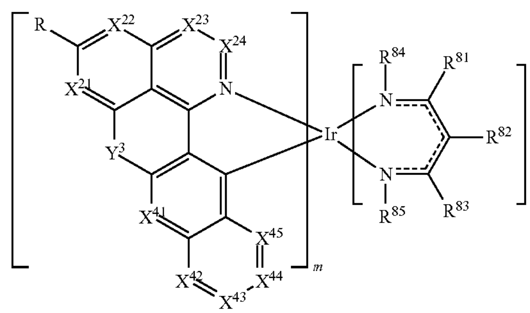

[Formula 1-21]

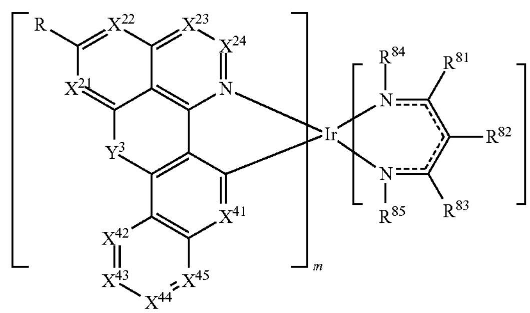

[Formula 1-22]

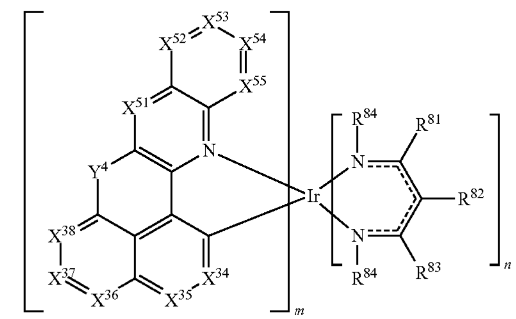

-continued

[Formula 1-23]

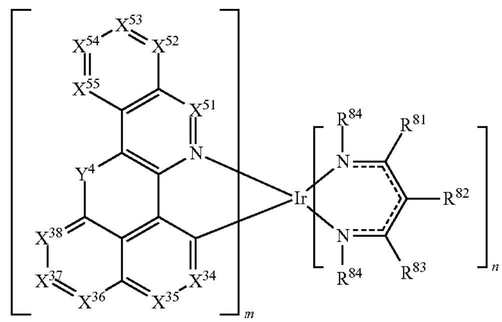

wherein R in Formulas 1-16, 1-17, 1-20 and 1-21 is same as defined in Formula 1-1; each of $X^{21}$ to $X^{24}$, $X^{34}$ to $X^{38}$, $X^{41}$ to $X^{45}$ and $X^{51}$ to $X^{55}$ is independently $CR^1$ or N; each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$; each of $R^1$ to $R^3$ and $R^a$ is same as defined in Formula 1-1; m is an integer of 1 to 3, n is an integer of 0 to 2, and wherein m+n is 3; each of $R^{71}$ to $R^{73}$ in Formulas 1-16 to 1-19 is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group; each of $R^{81}$ to $R^{85}$ in Formulas 1-20 to 1-23 is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group.

For example, the first compound 232 represented by Formula 1-8 can be one of the compounds in Formula 1-24.

[Formula 1-24]

1

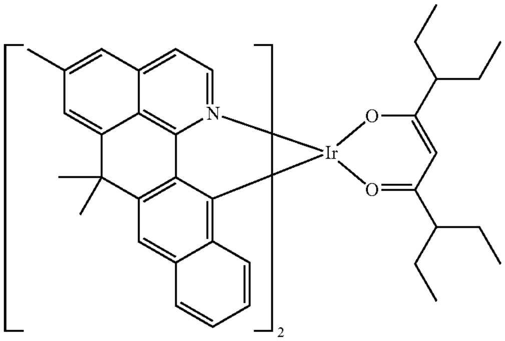

2

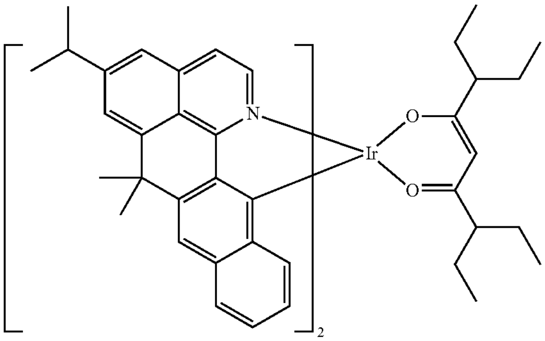

3

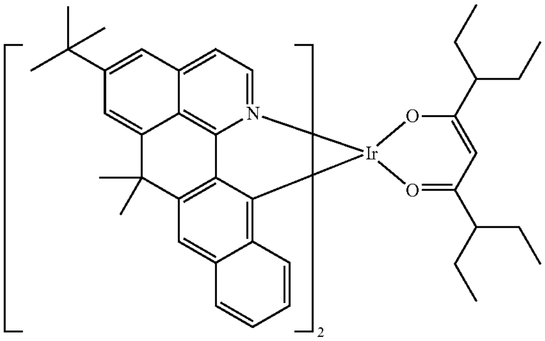

4

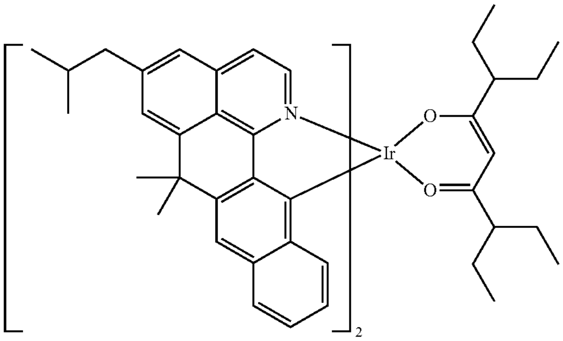

-continued
5
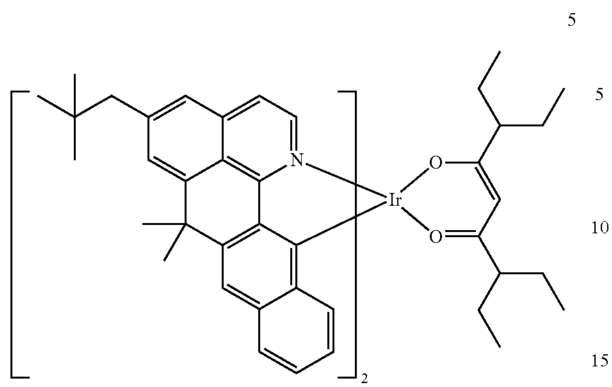
6
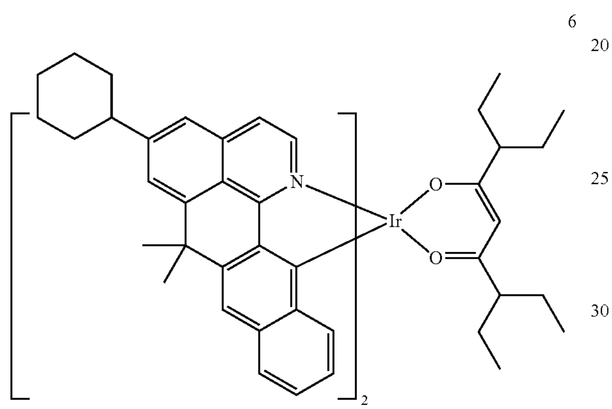
7
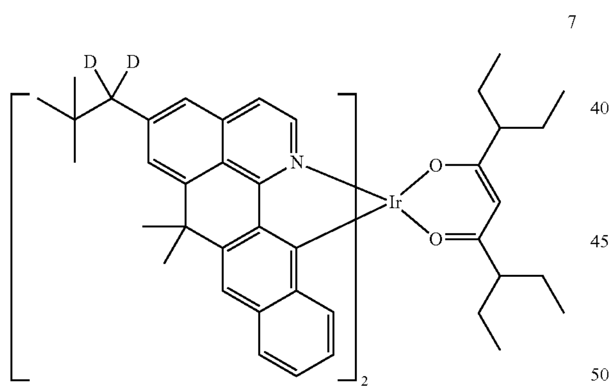
8
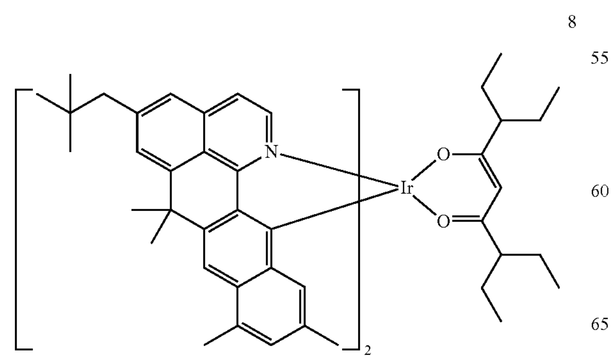
-continued
9
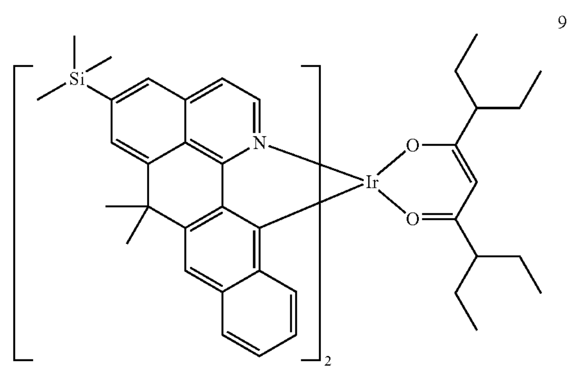
10
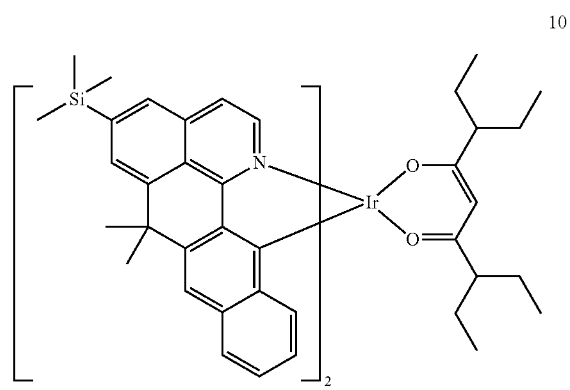
11
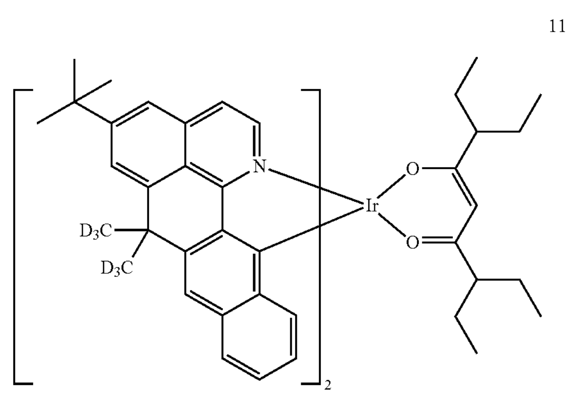
12
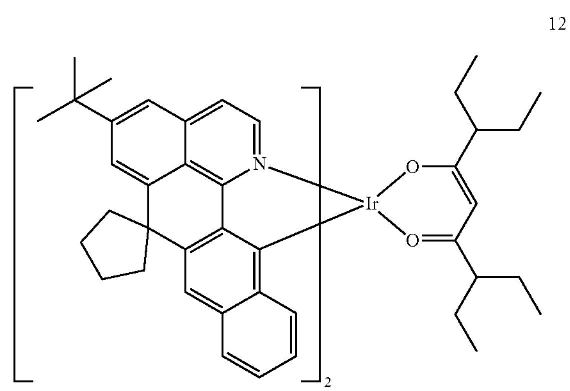

13
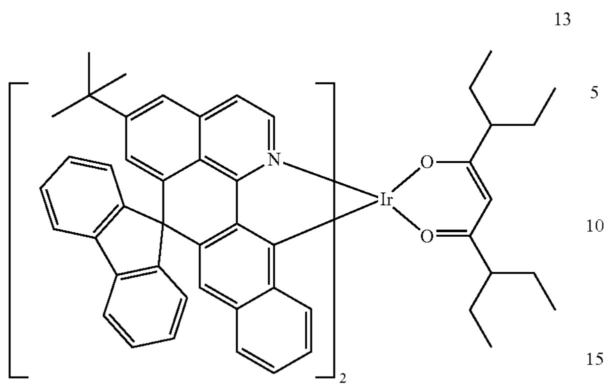
14
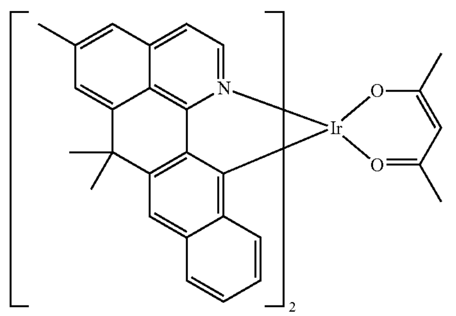
15
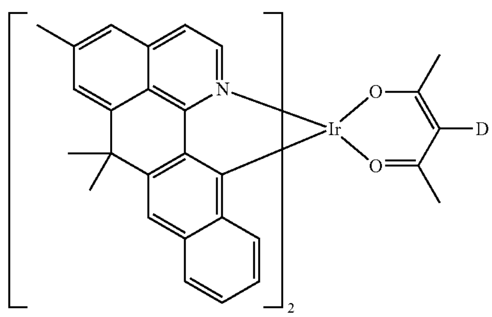
16
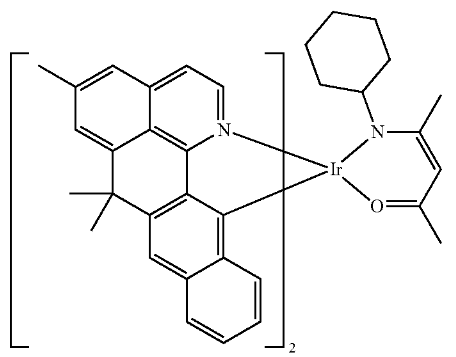
17
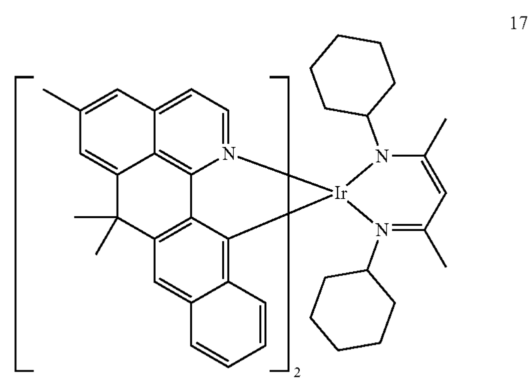
18
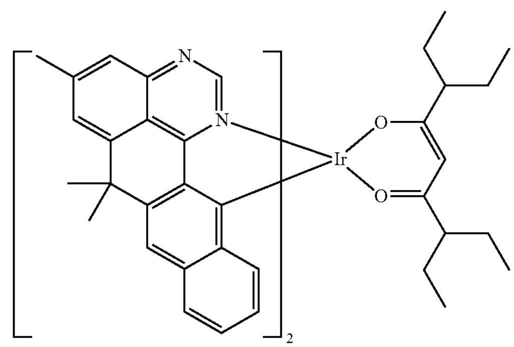
19
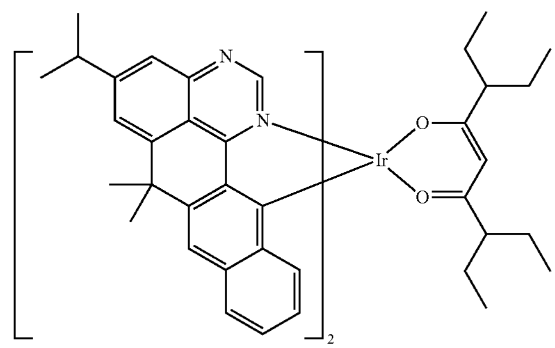
20
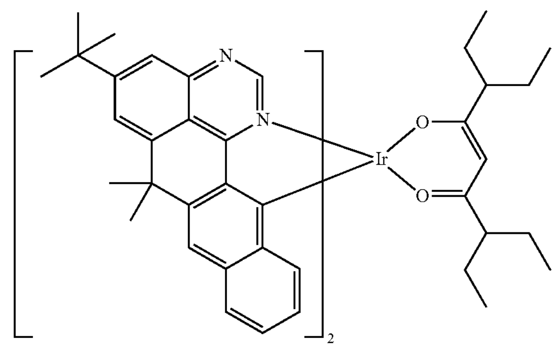

-continued
21
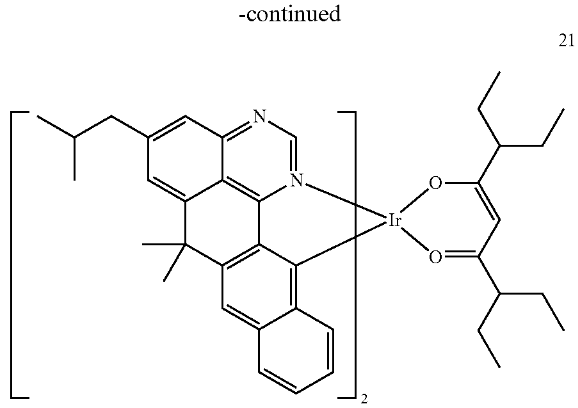
22
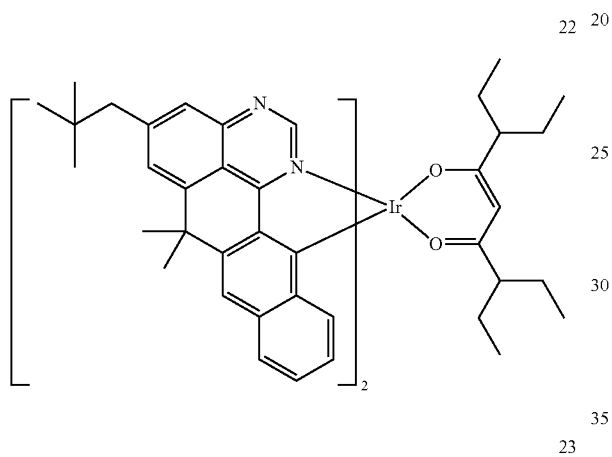
23
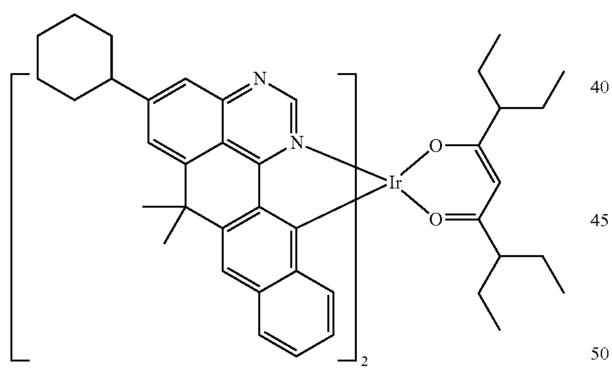
24
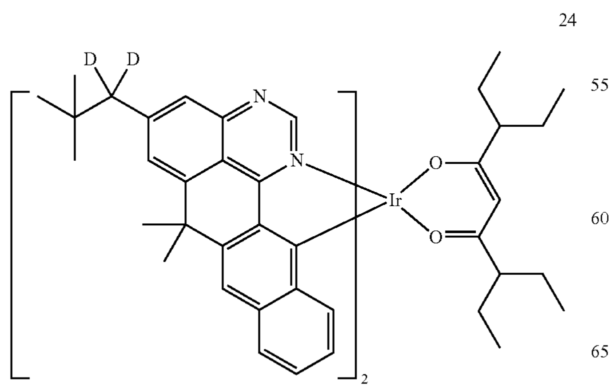
-continued
25
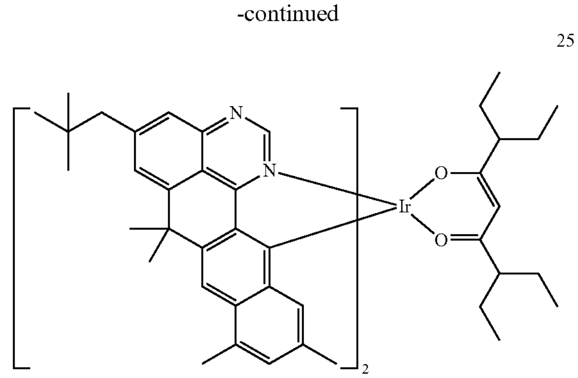
26
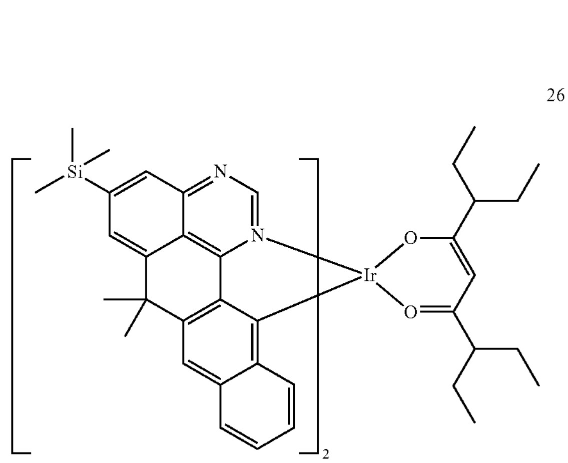
27
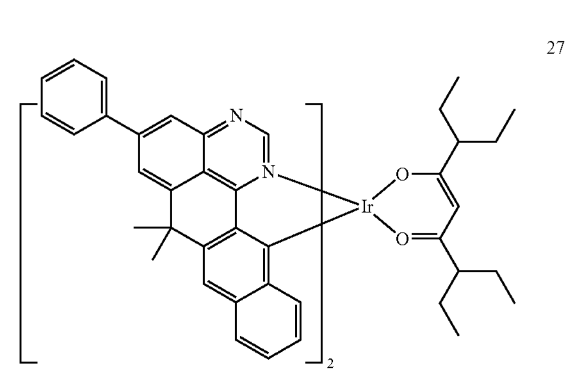
28
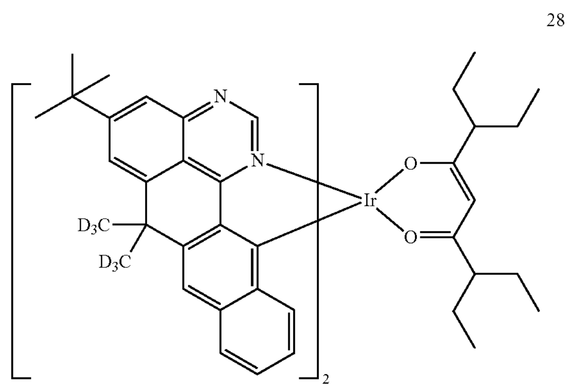

-continued
29
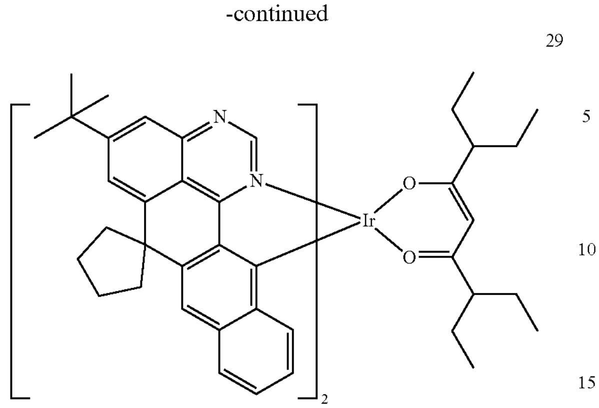
30
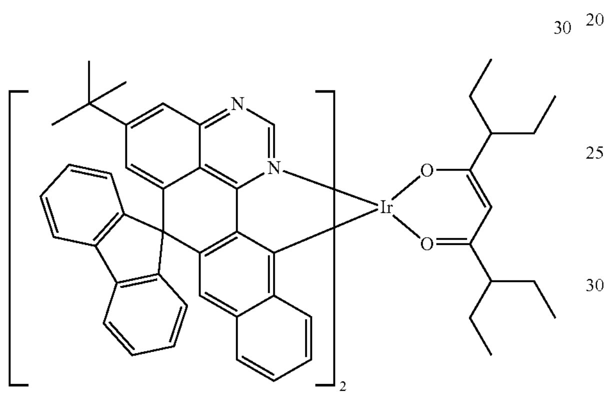
31
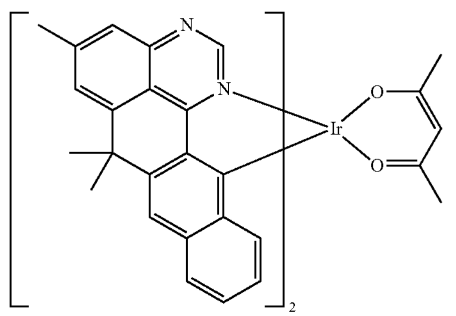
32
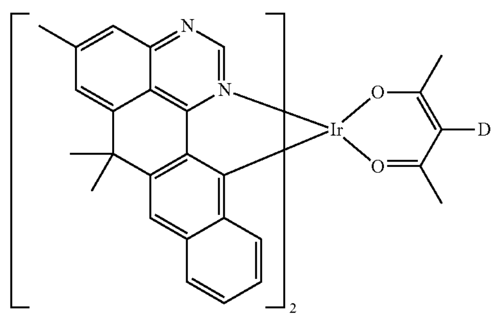
-continued
33
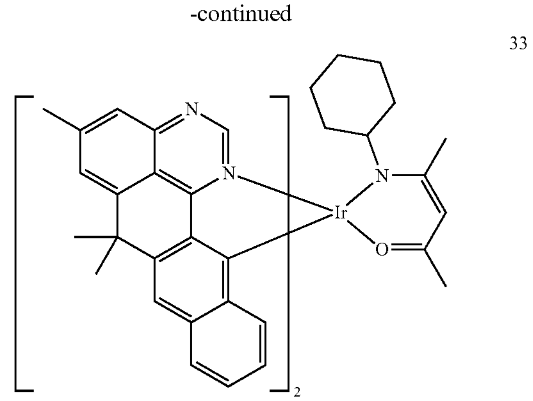
34
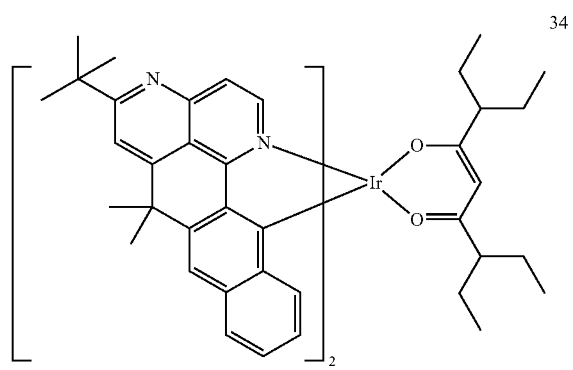
35
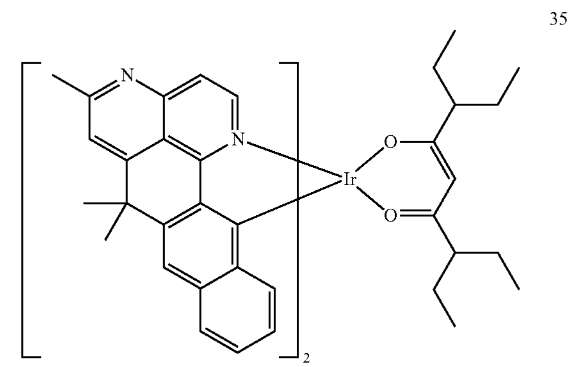
36
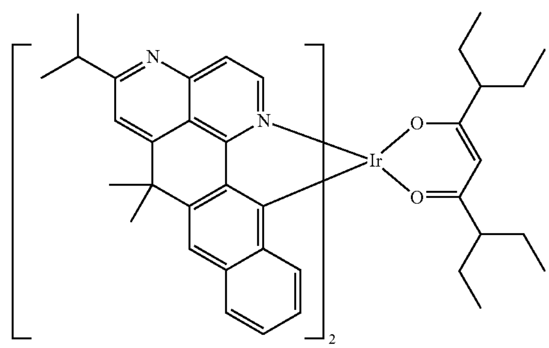

37
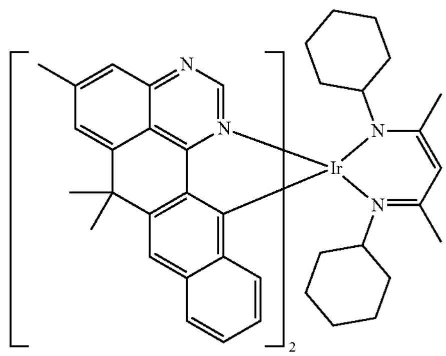
38
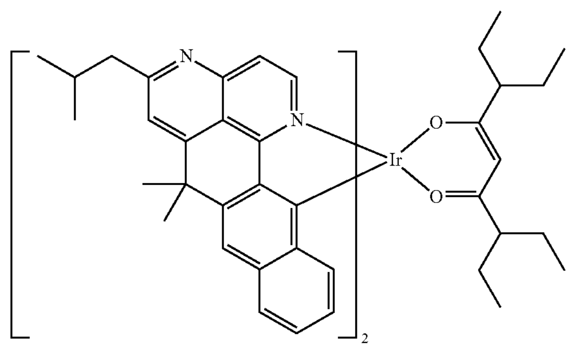
39
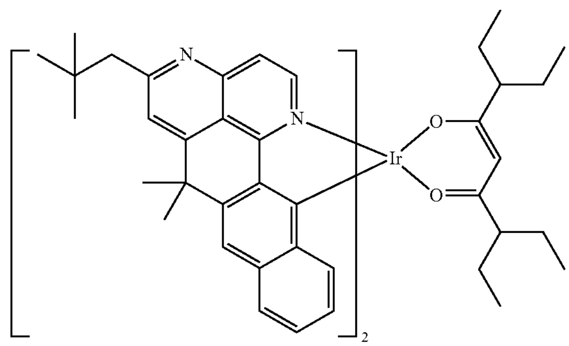
40
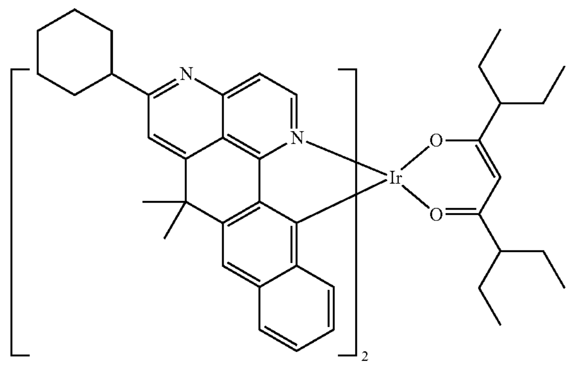
41
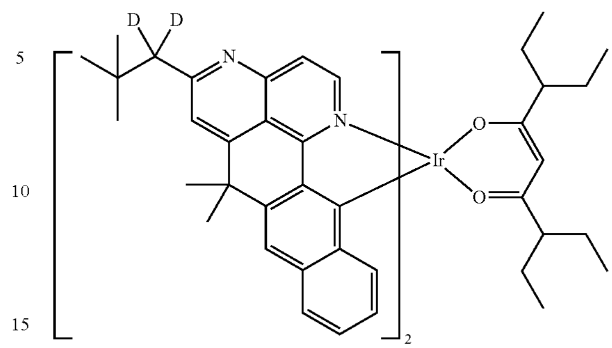
42
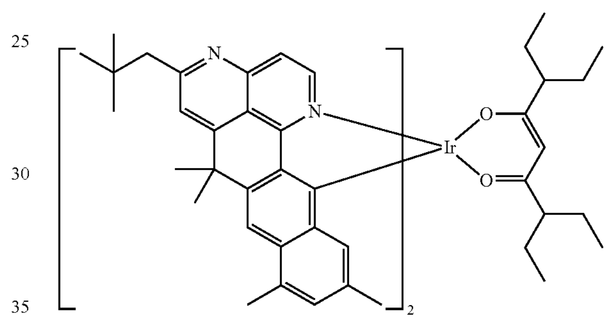
43
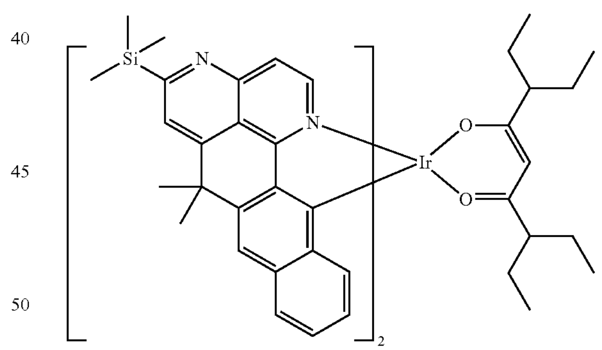
44
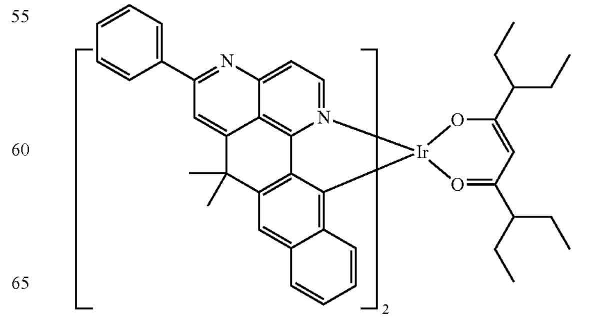

-continued
45 
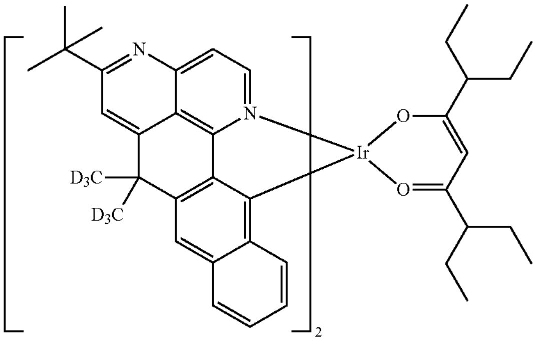
46 
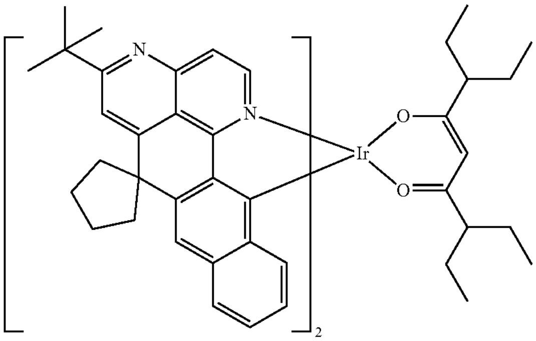
47 
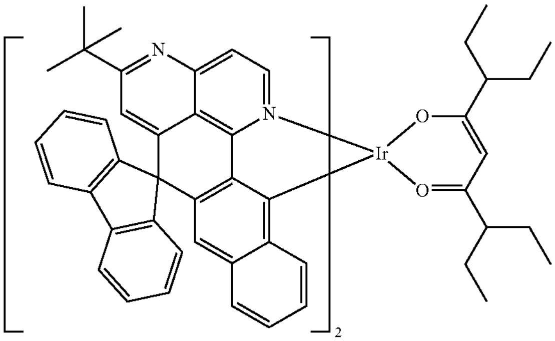
48 
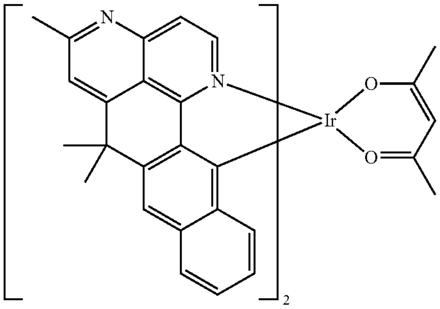
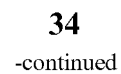
-continued
49 
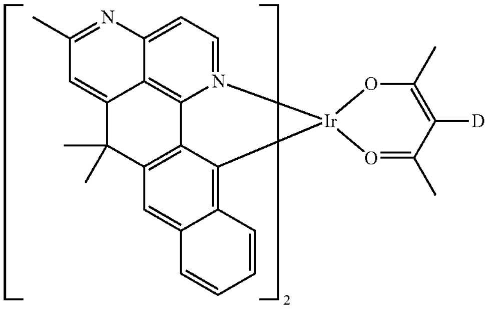
50 
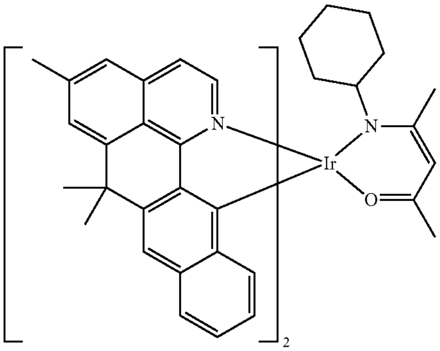
51 
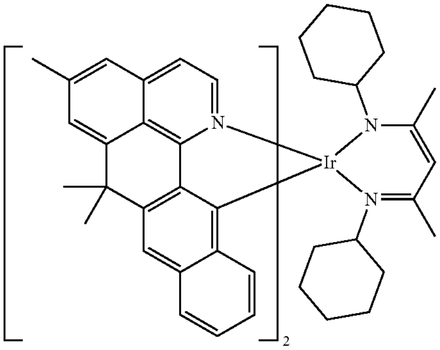
52
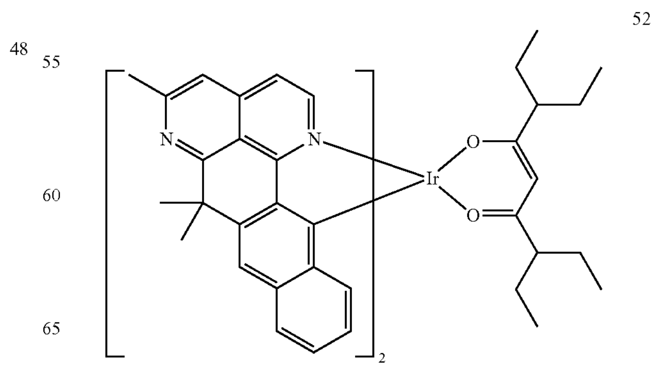

53
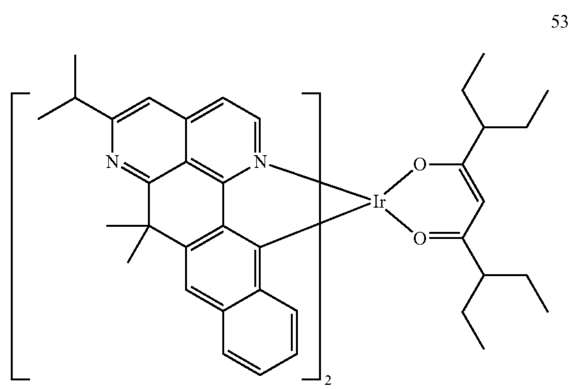
54
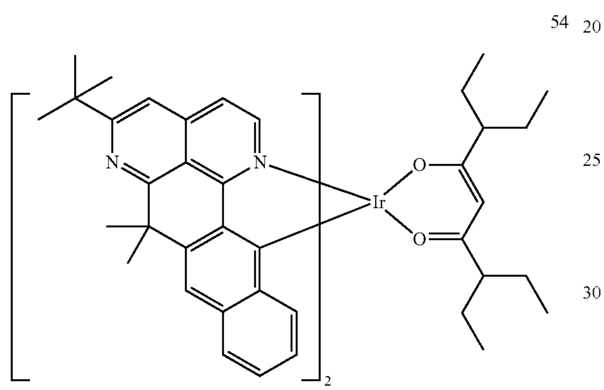
55
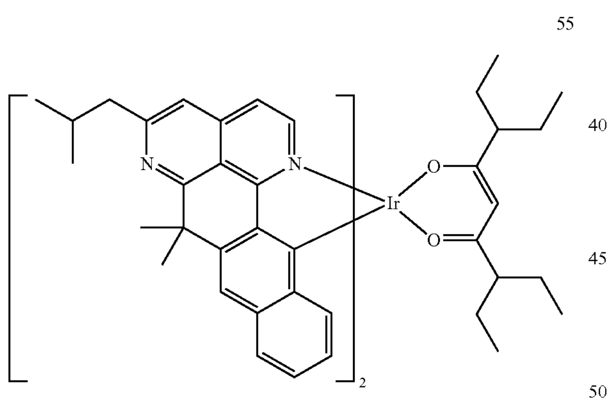
56
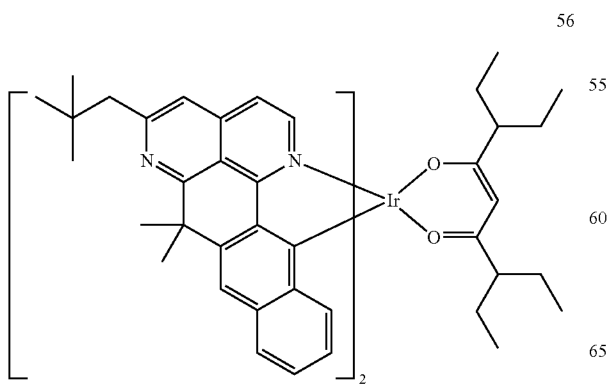
57
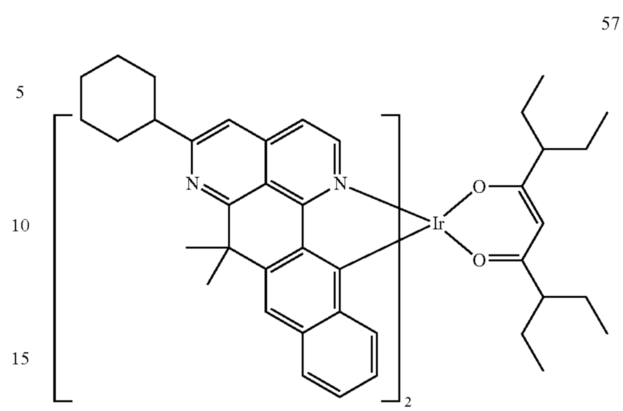
58
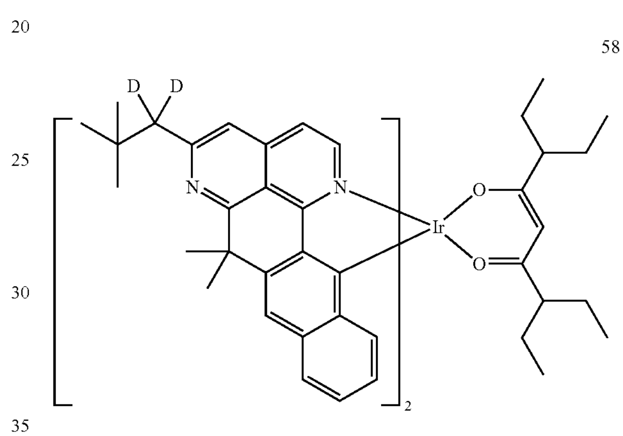
59
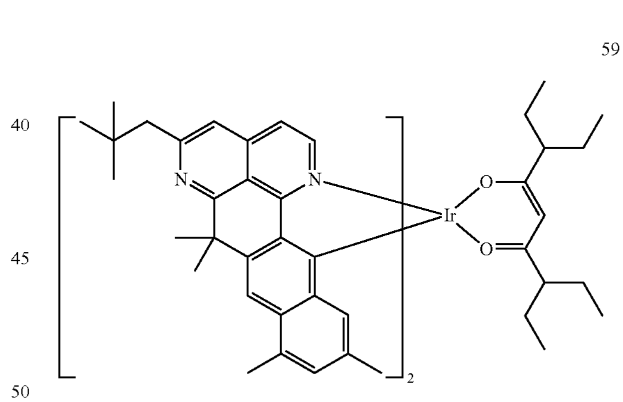
60
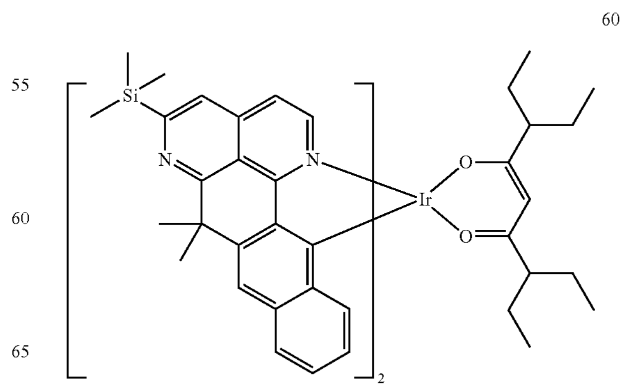

-continued
61
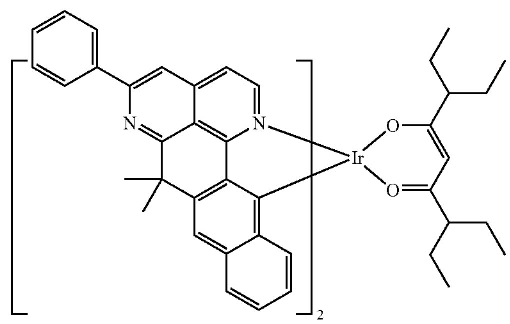
62
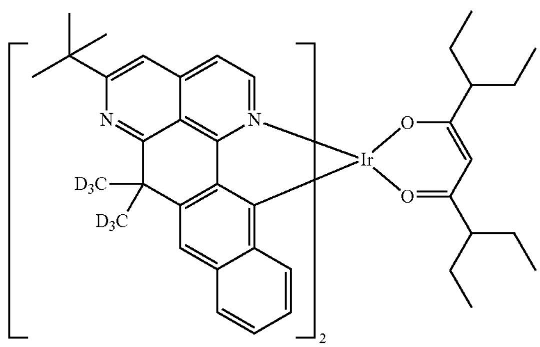
63
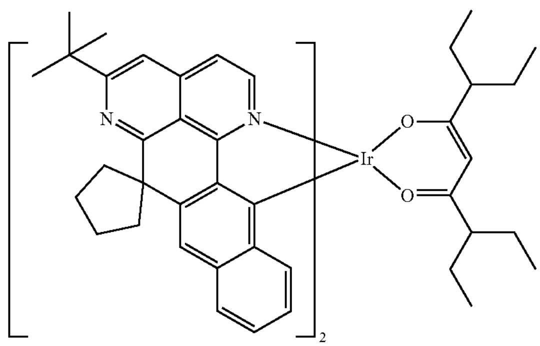
64
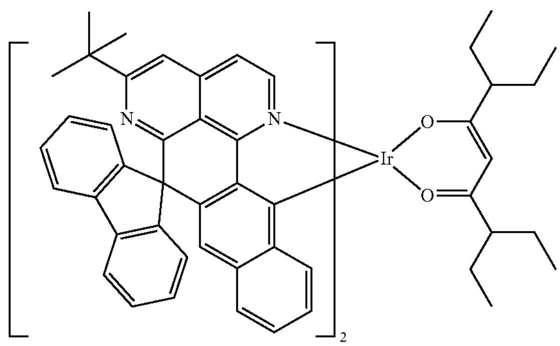
-continued
65
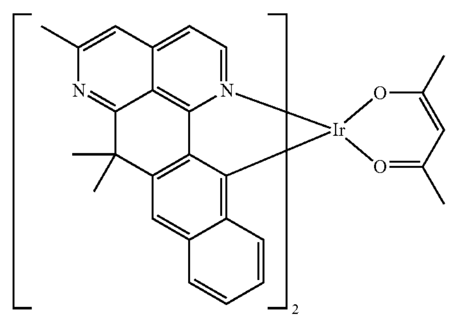
66
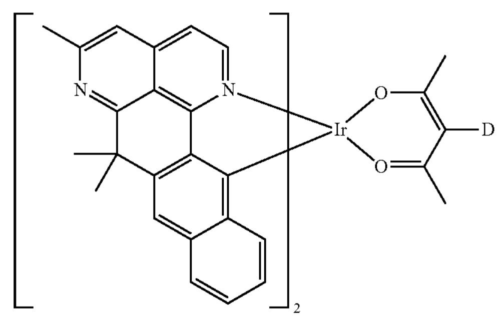
67
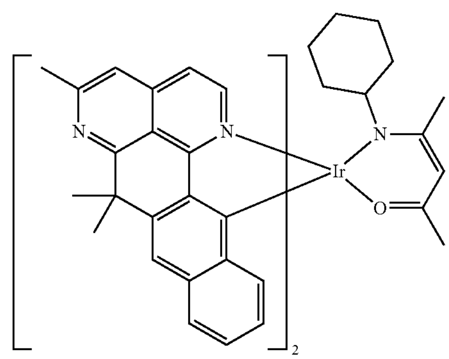
68
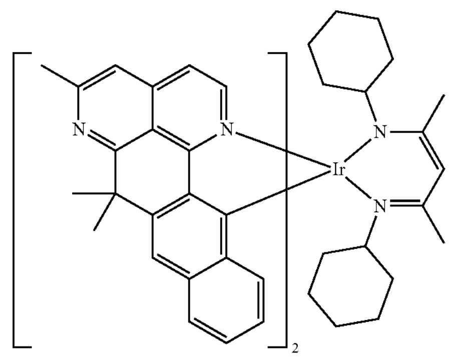

-continued
69
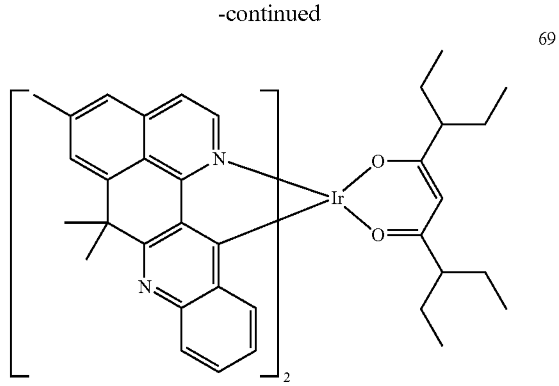
70
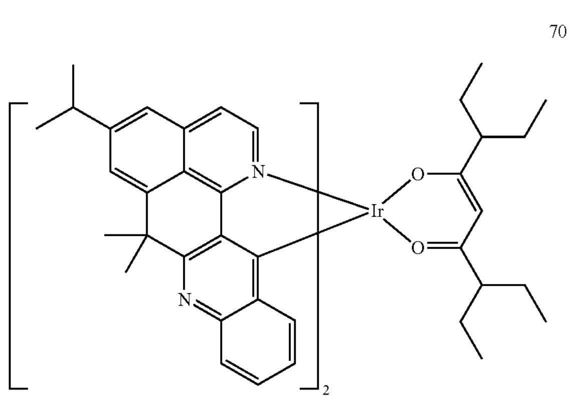
71
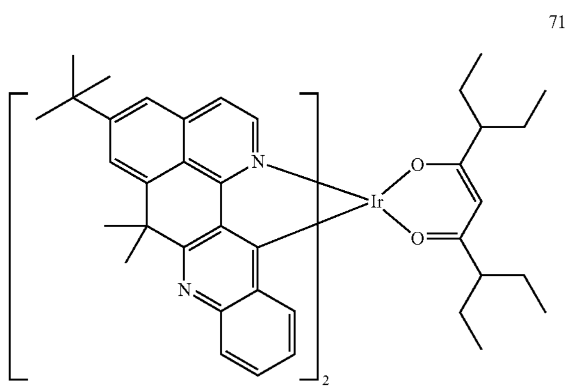
72
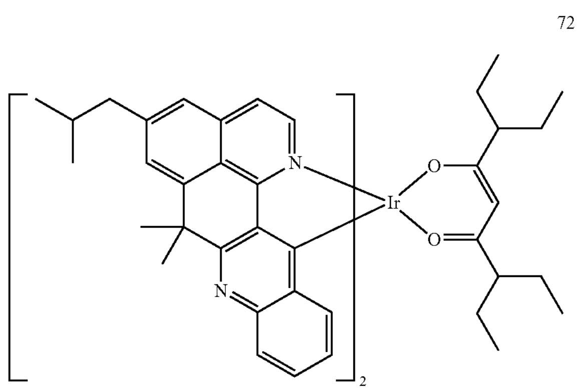
-continued
73
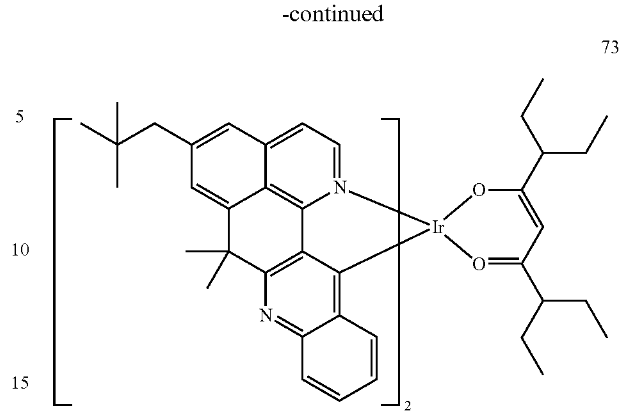
74
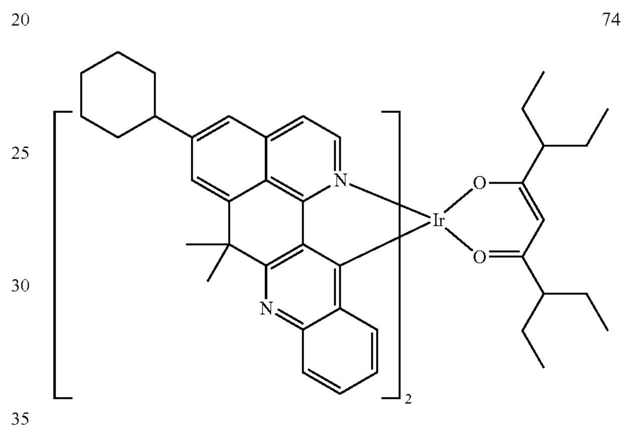
75
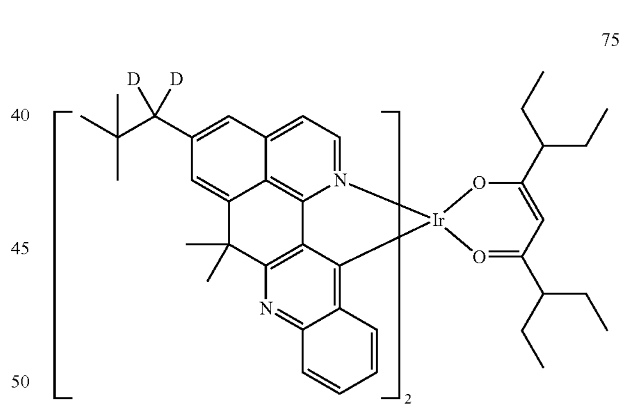
76
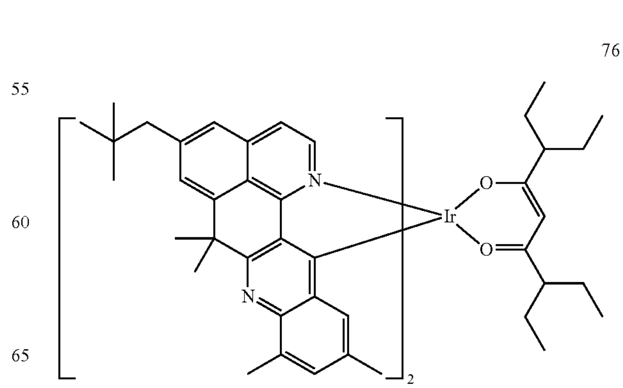

-continued
77
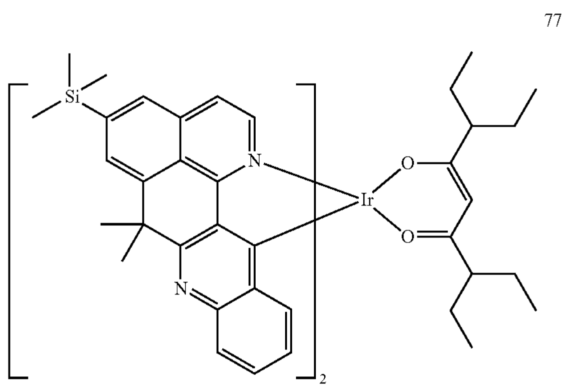
78
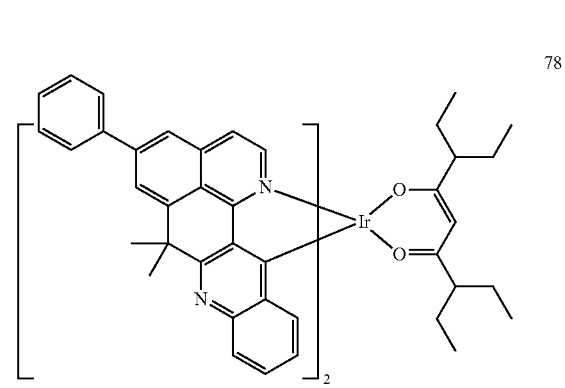
79
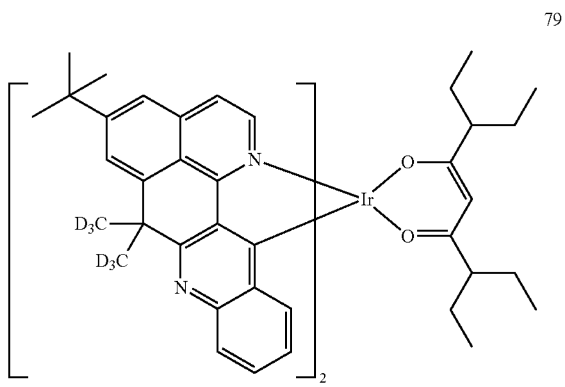
80
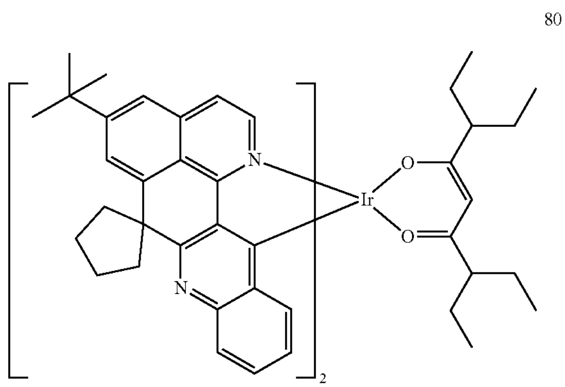
-continued
81
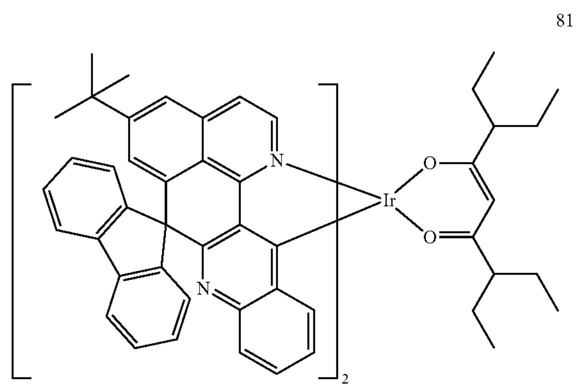
82
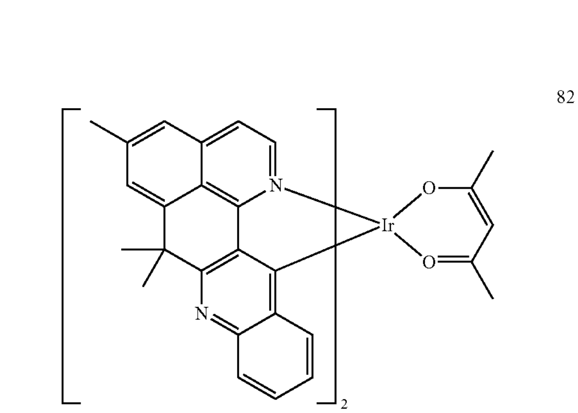
83
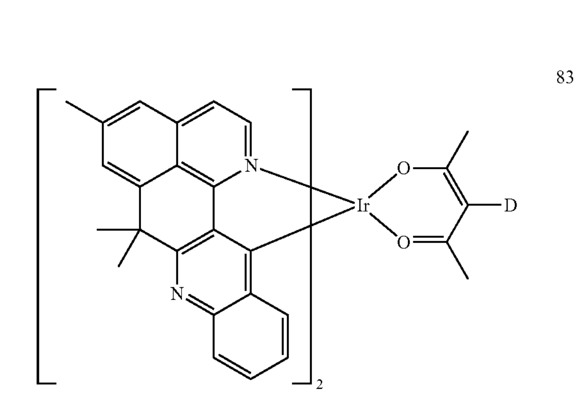
84
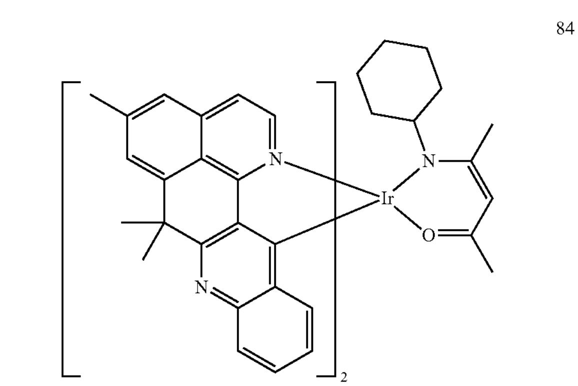

85
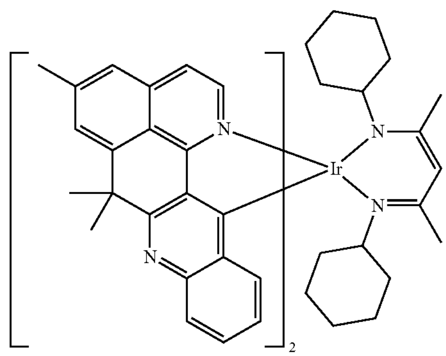
86
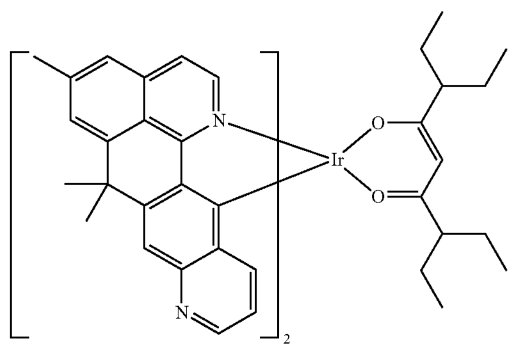
87
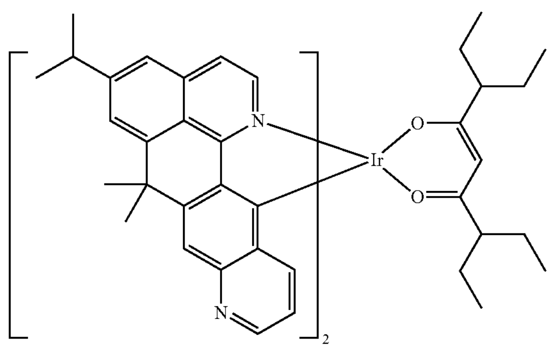
88
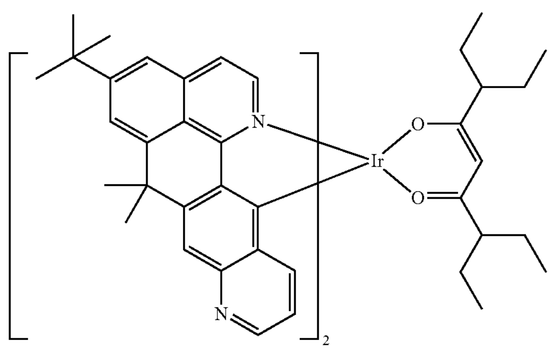
89
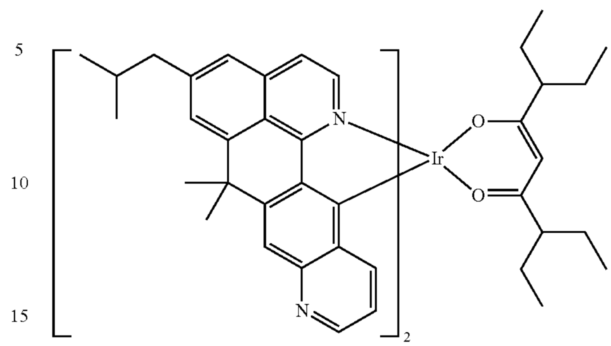
90
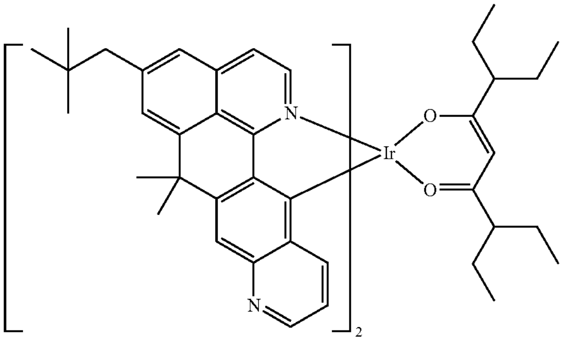
91
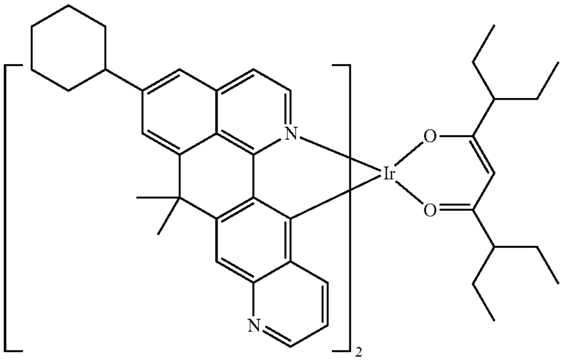
92
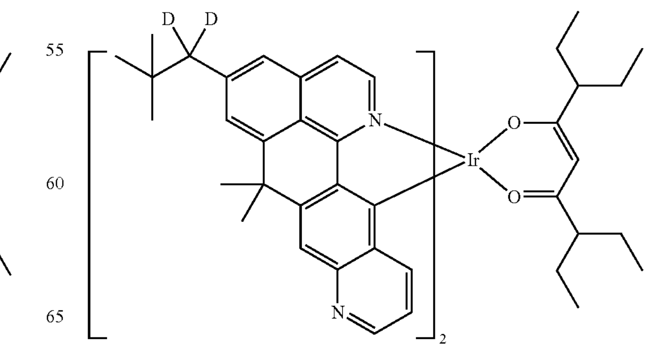

-continued
93
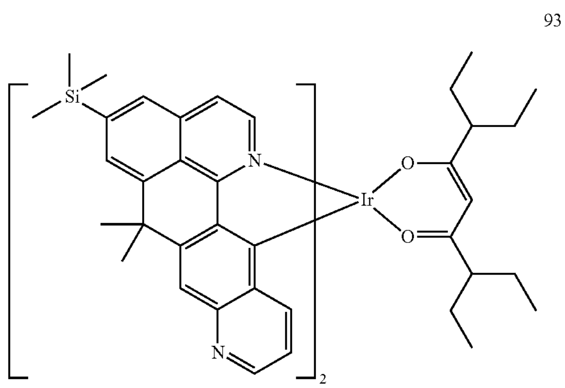
94
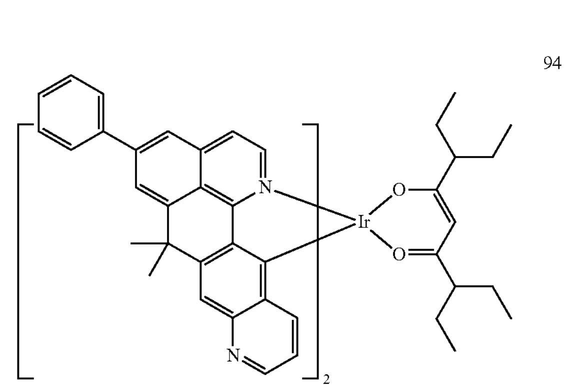
95
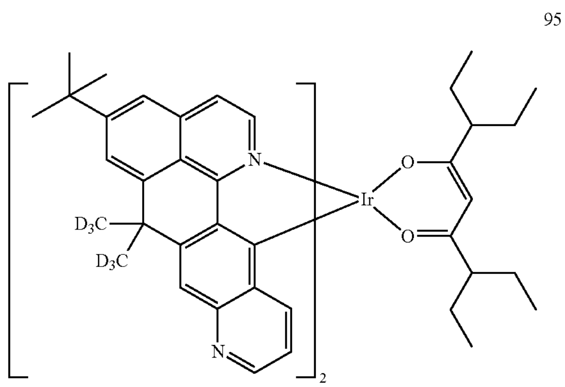
96
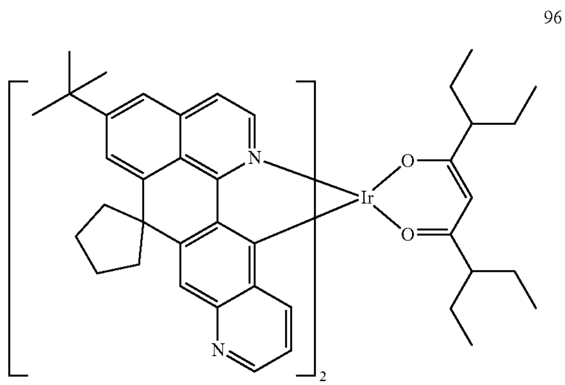
-continued
97
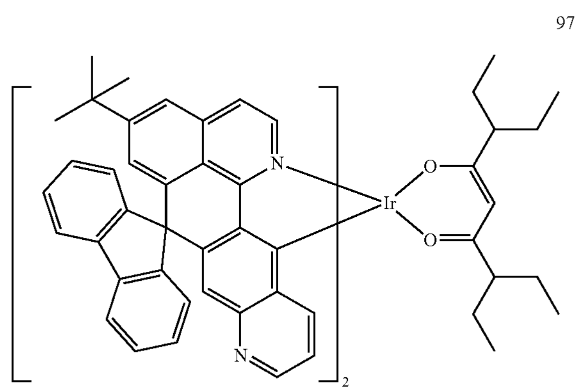
98
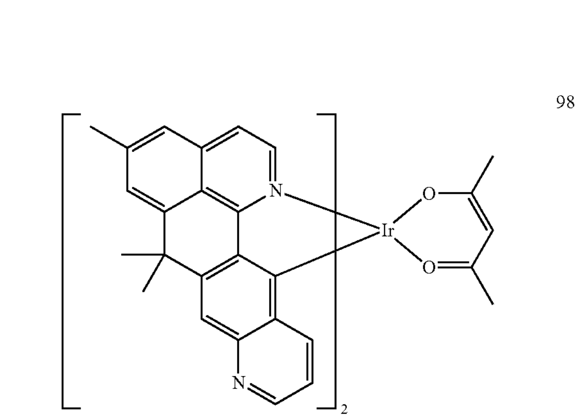
99
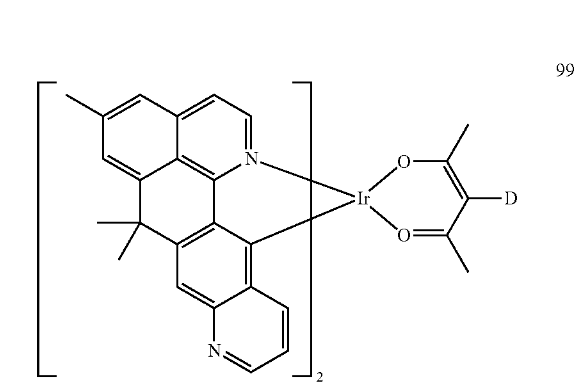
100
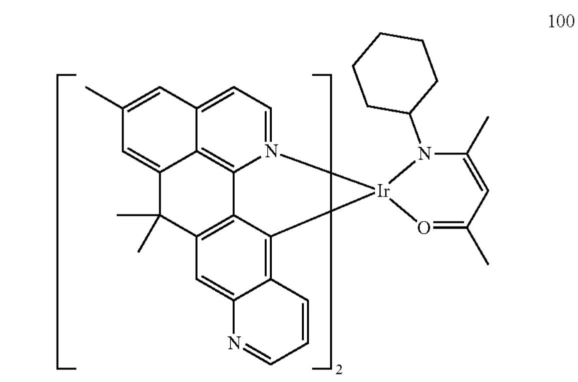

-continued
101
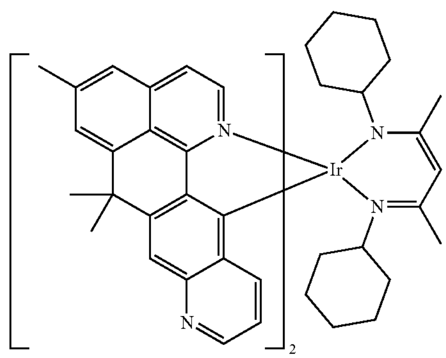
102
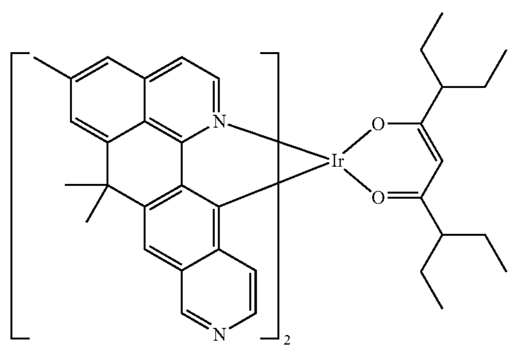
103
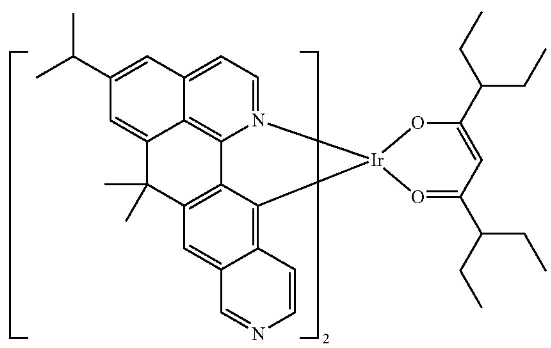
104
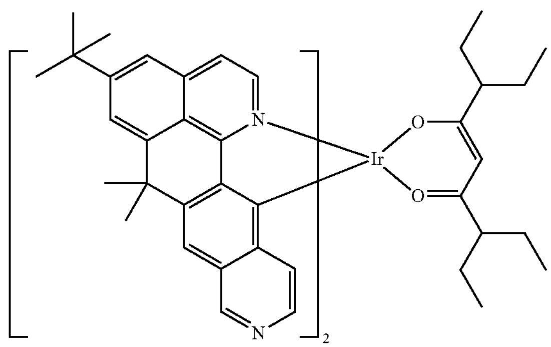
-continued
105
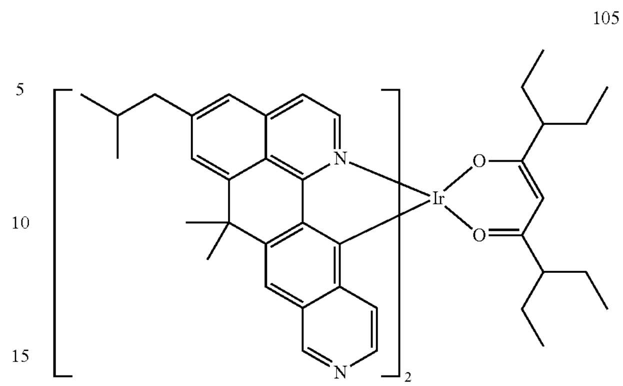
106
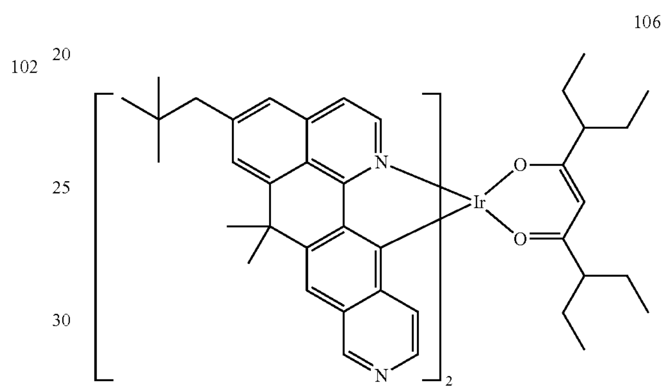
107
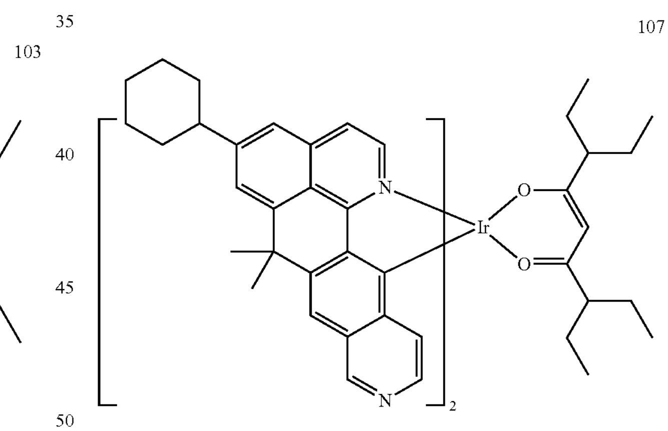
108
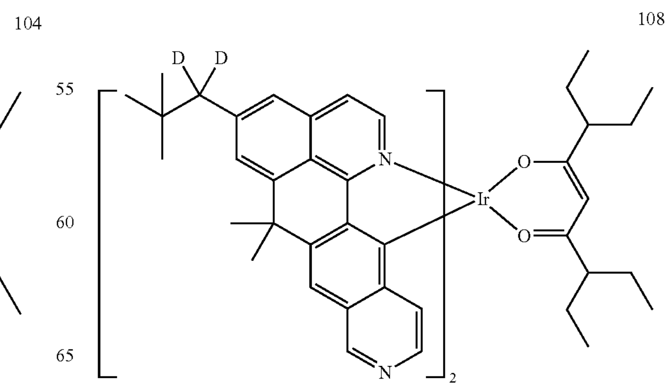

-continued
109
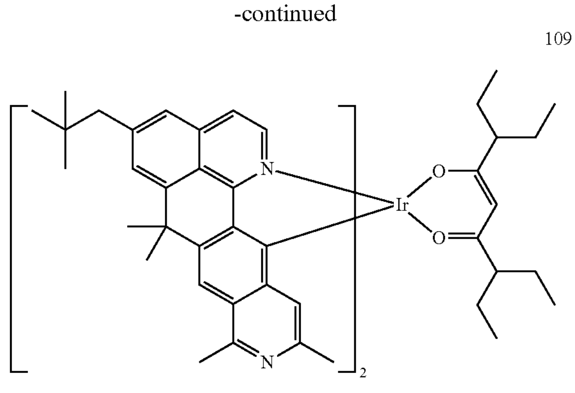
110
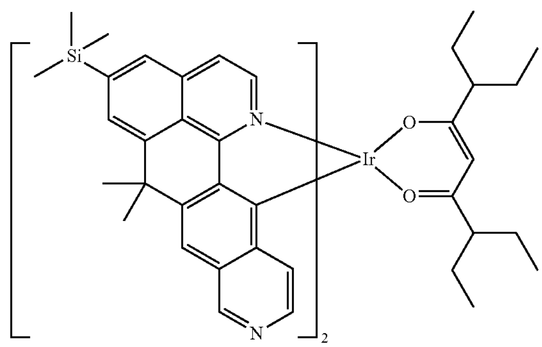
111
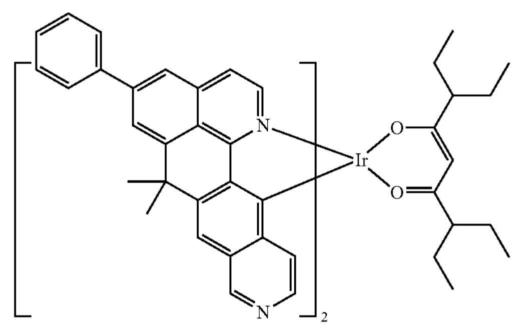
112
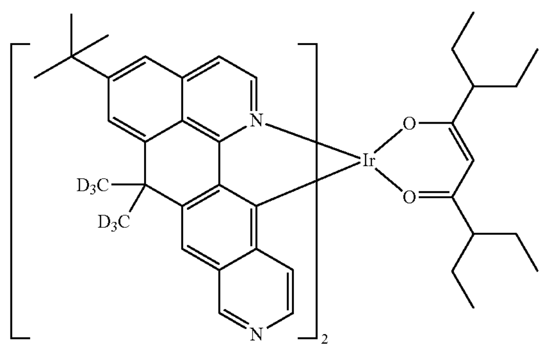
-continued
113
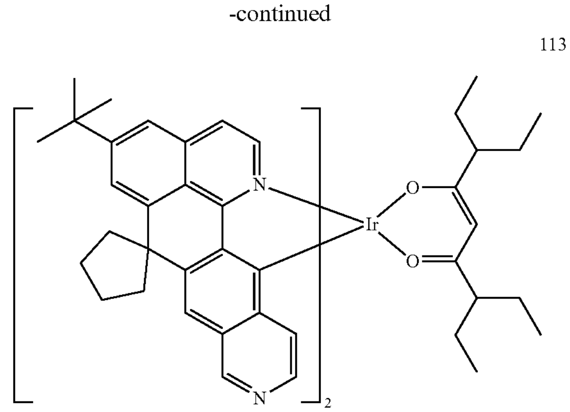
114
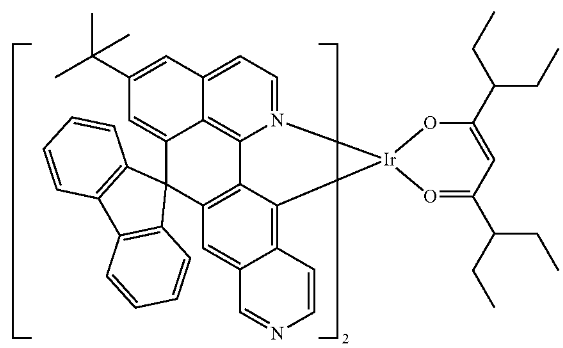
115
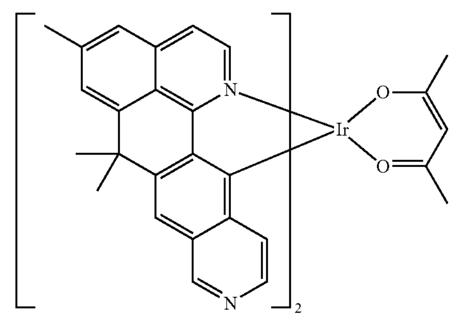
116
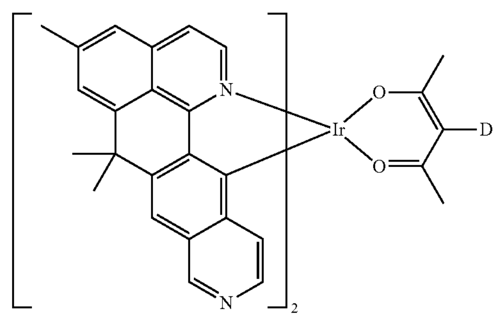

117
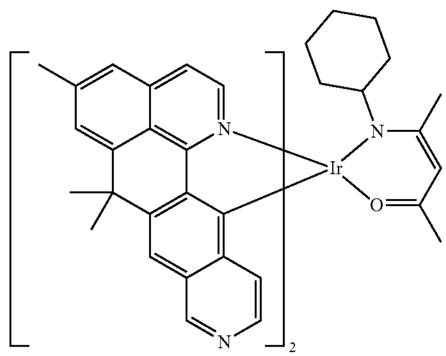
118
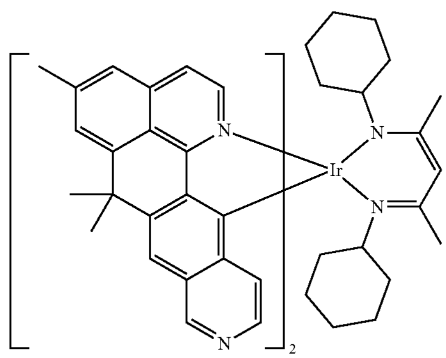
119
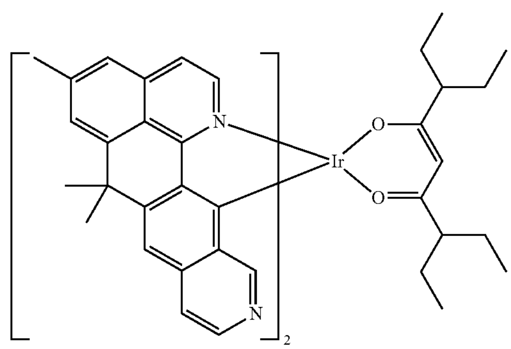
120
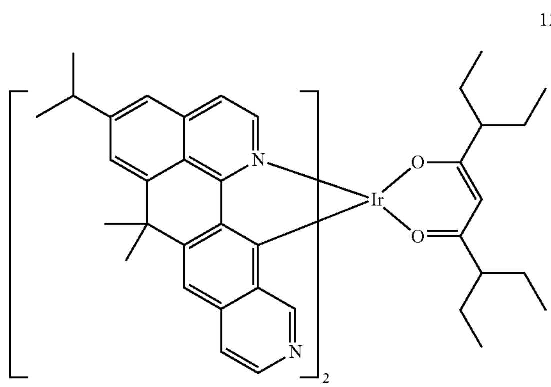
121
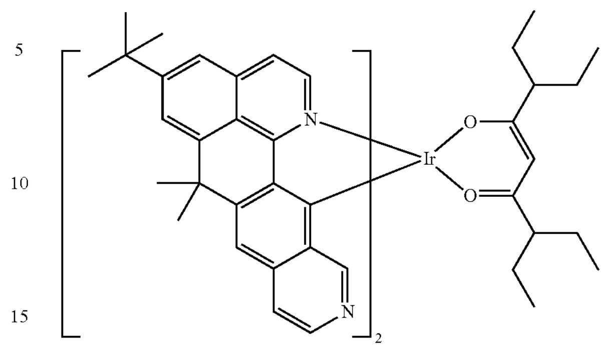
122
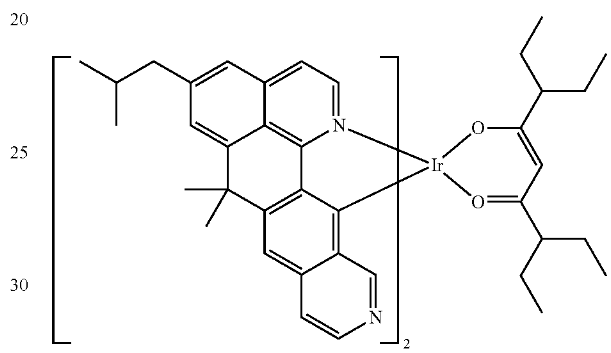
123
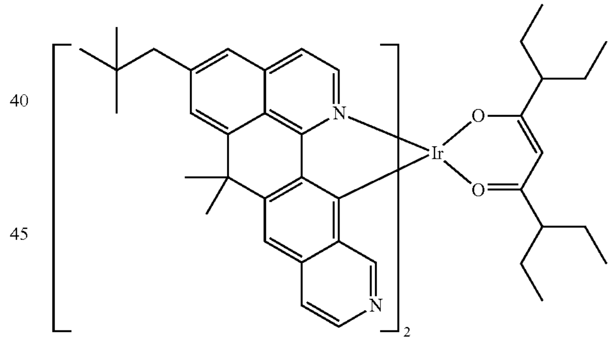
124
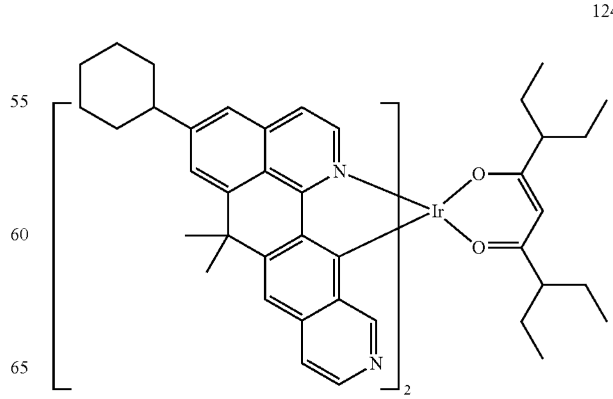

-continued
125
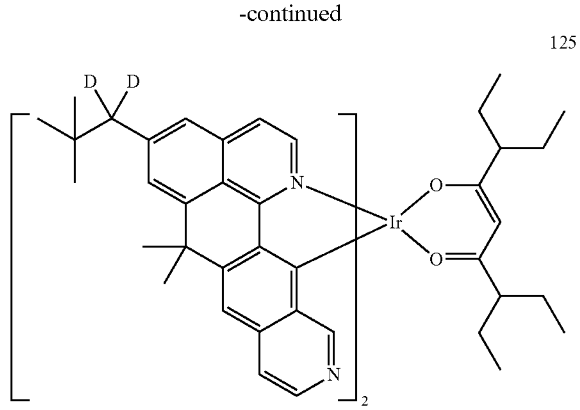
126
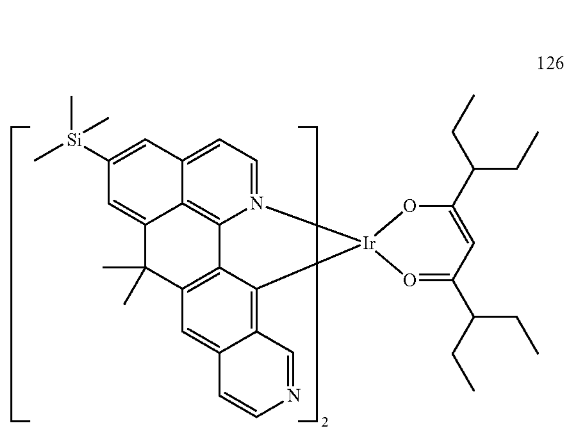
127
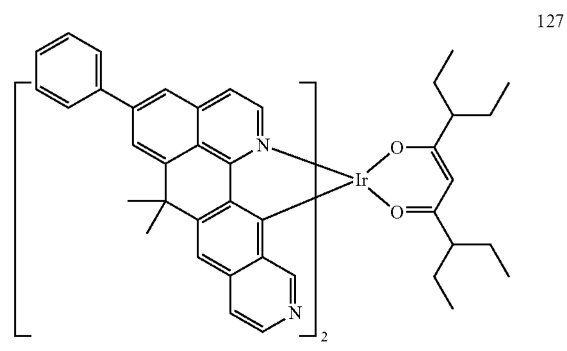
128
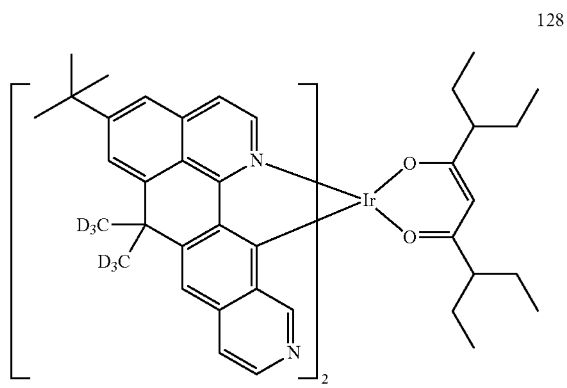
-continued
129
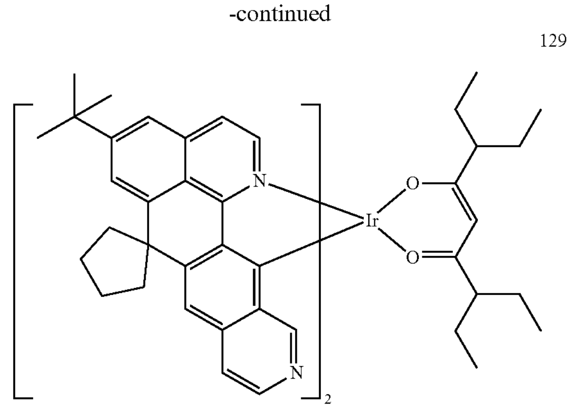
130
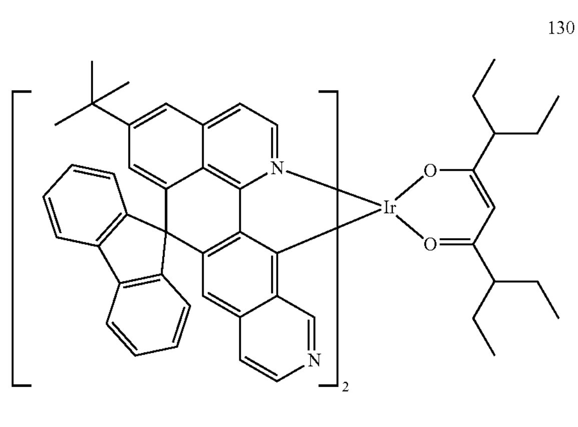
131
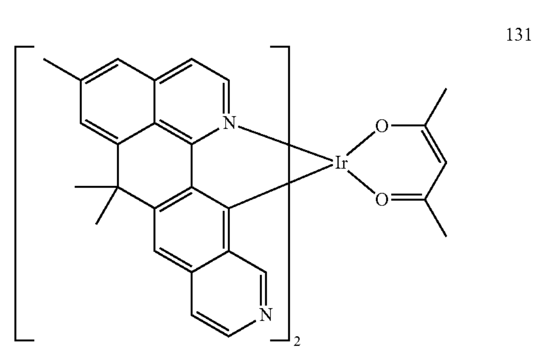
132
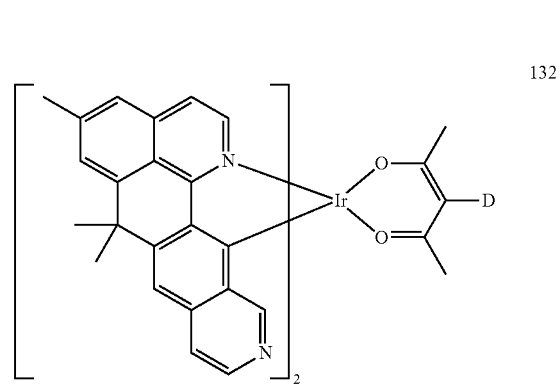

-continued
133
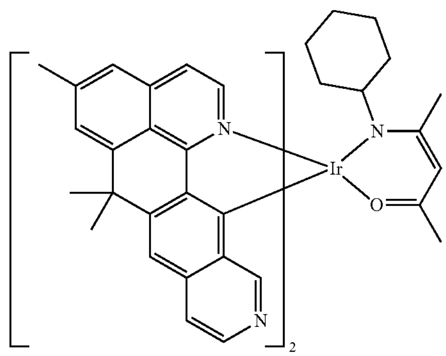
134
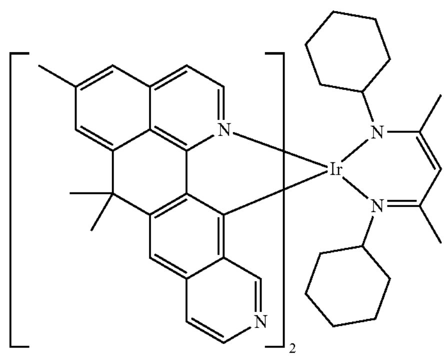
135
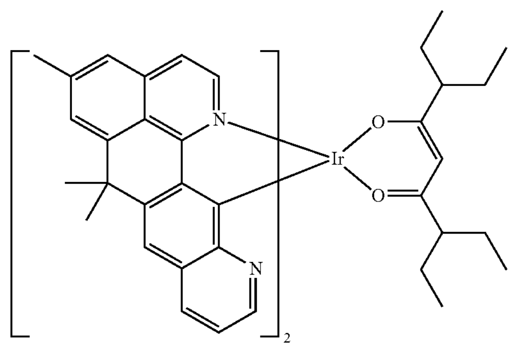
136
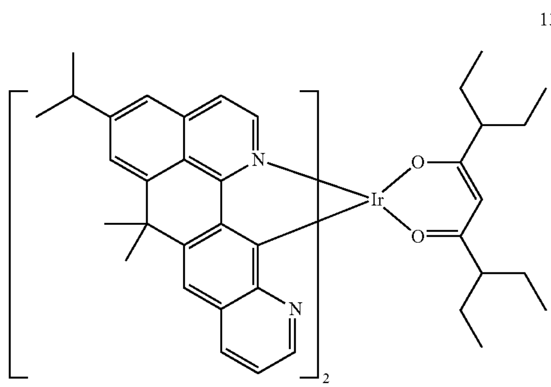
-continued
137
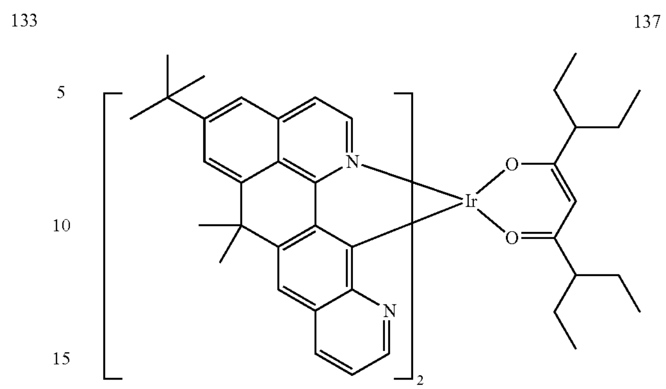
138
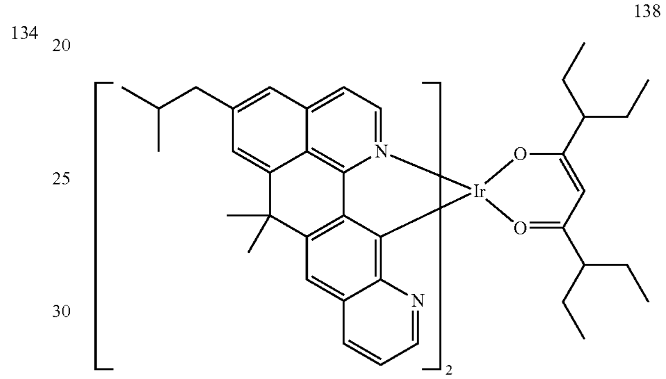
139
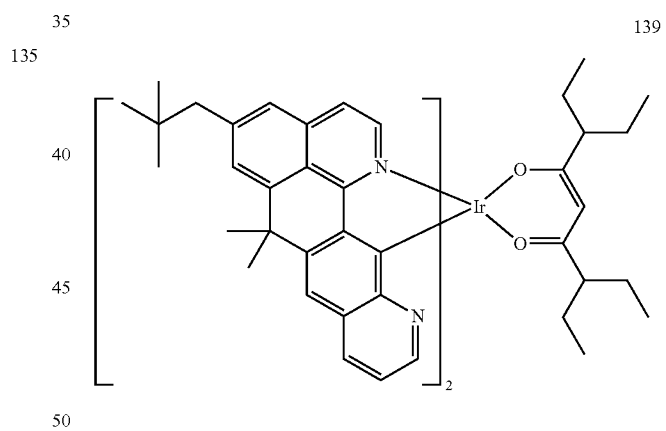
140
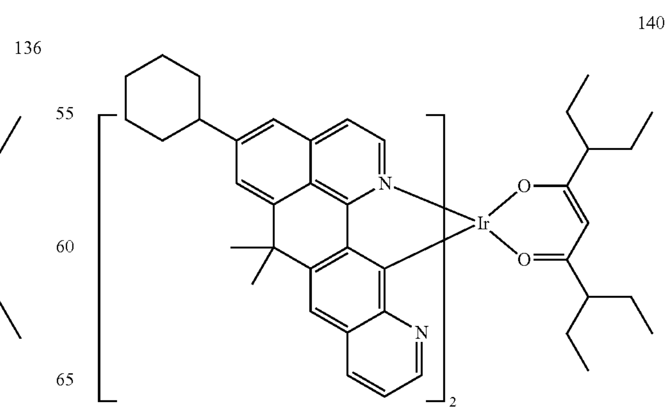

-continued
141
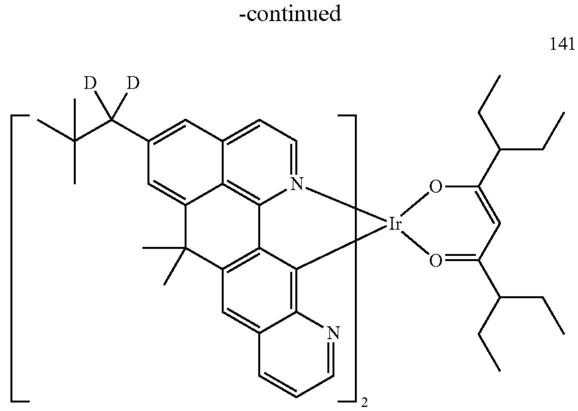
142
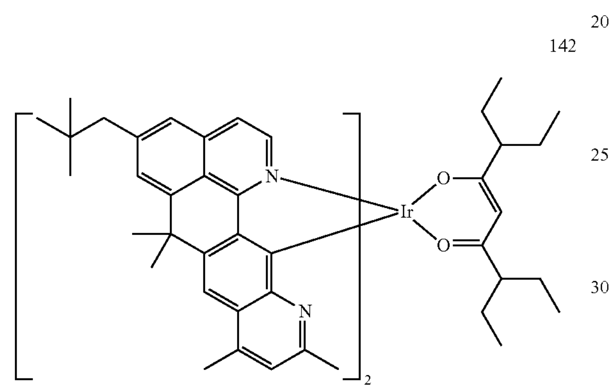
143
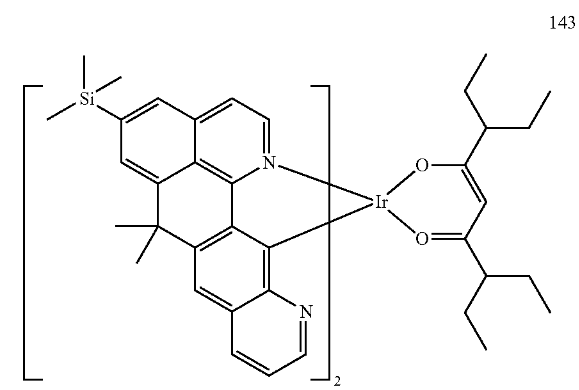
144
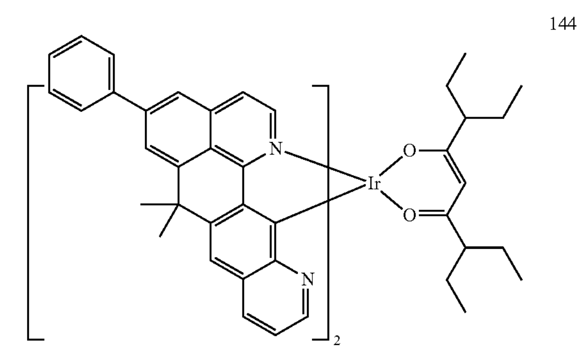
-continued
145
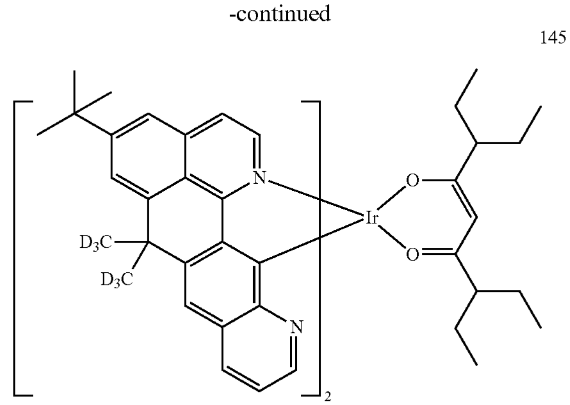
146
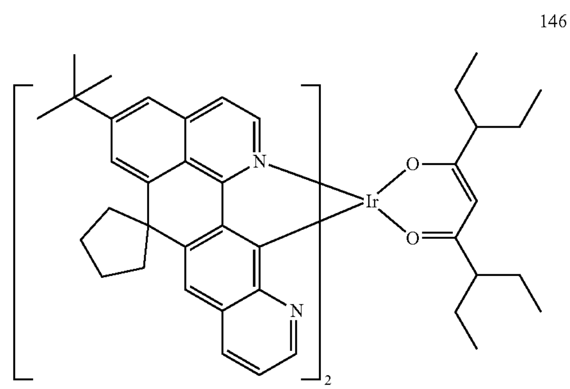
147
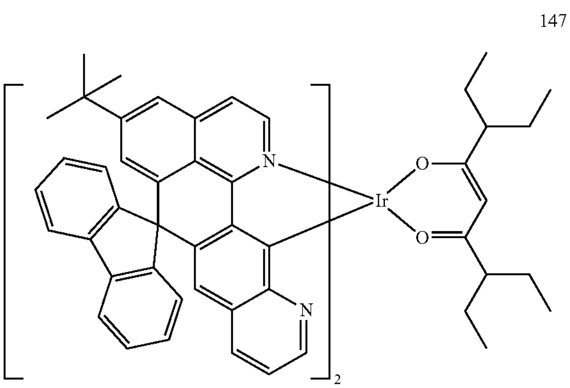
148
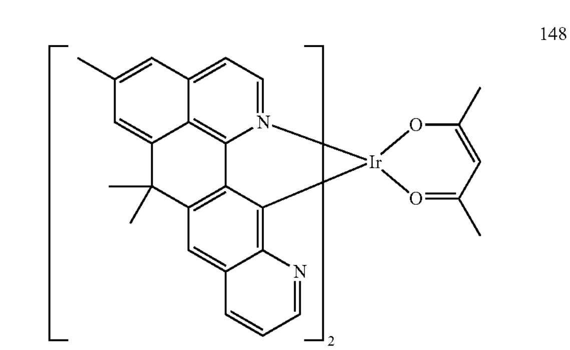

-continued
149
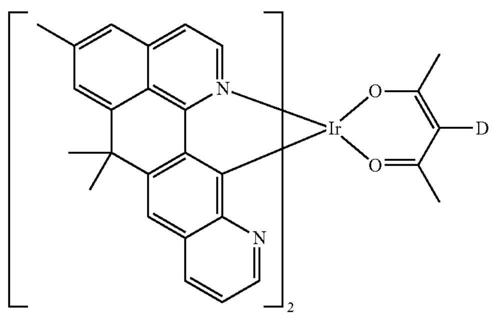
150
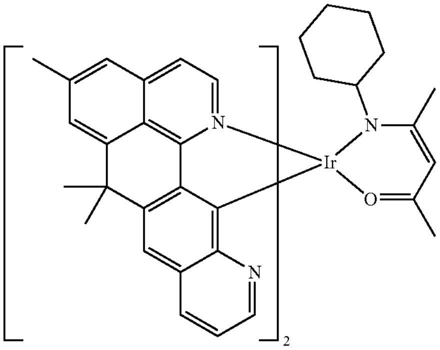
151
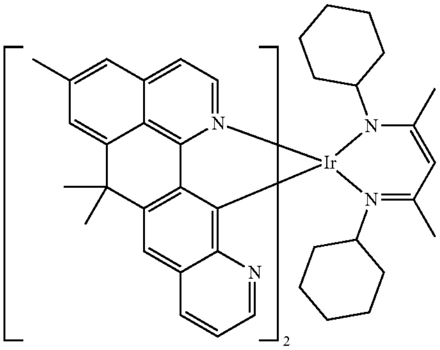
152
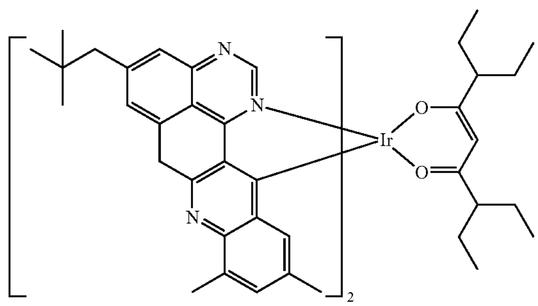
-continued
153
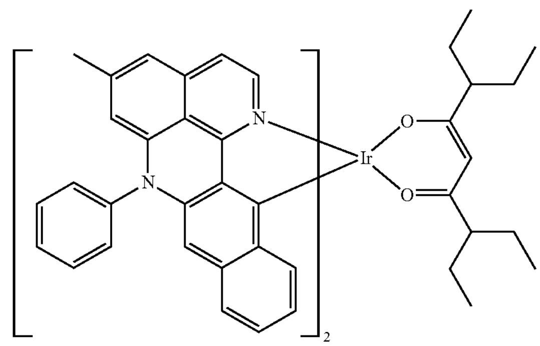
154
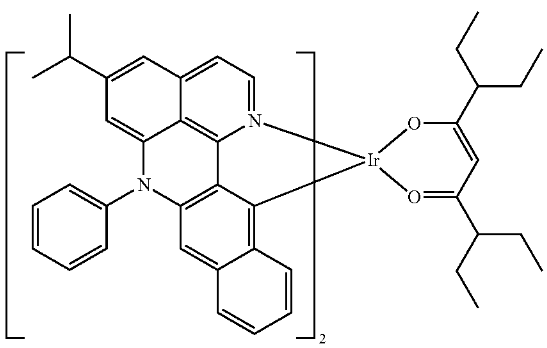
155
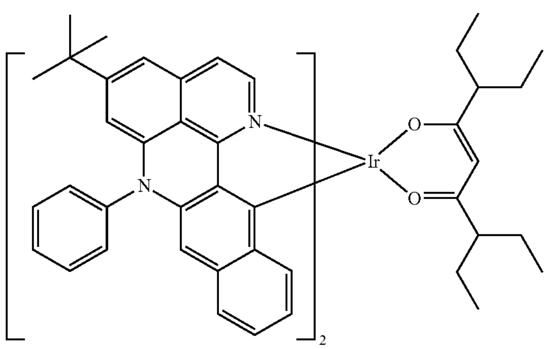
156
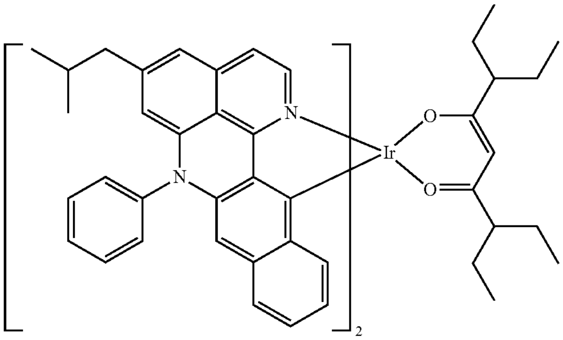

-continued
157
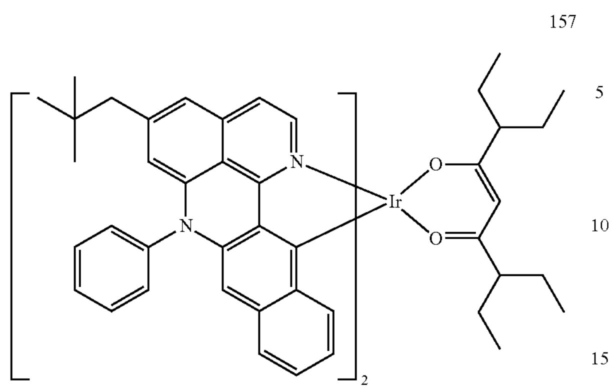
158
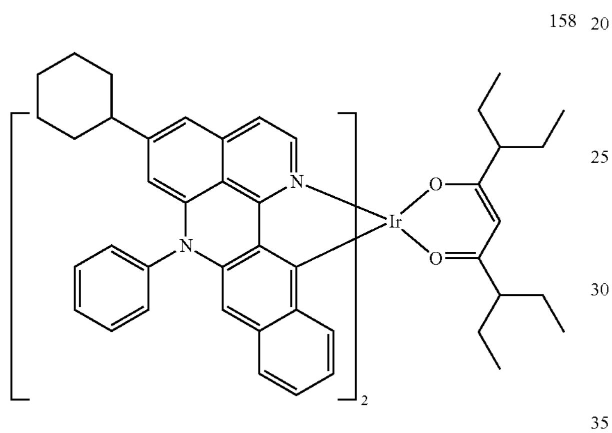
159
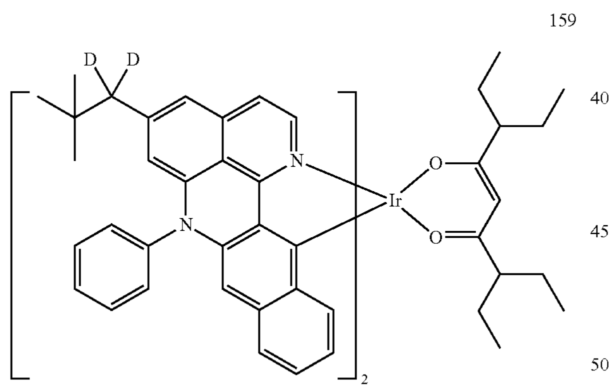
160
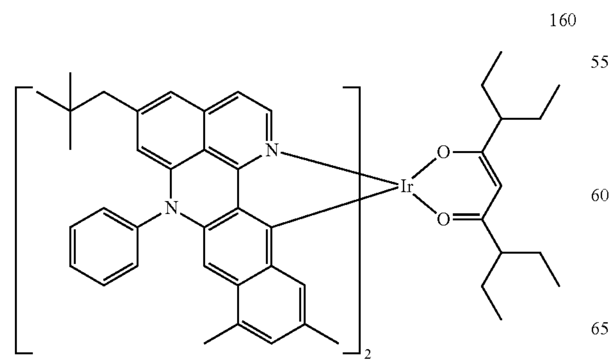
-continued
161
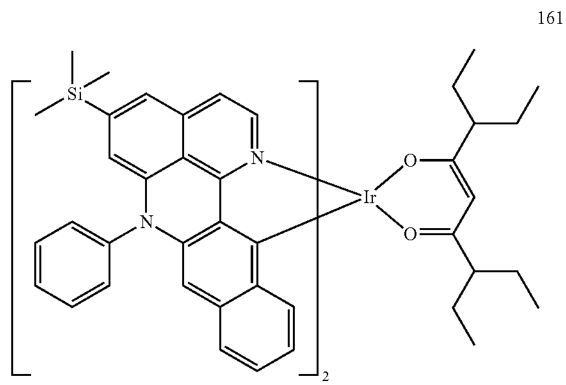
162
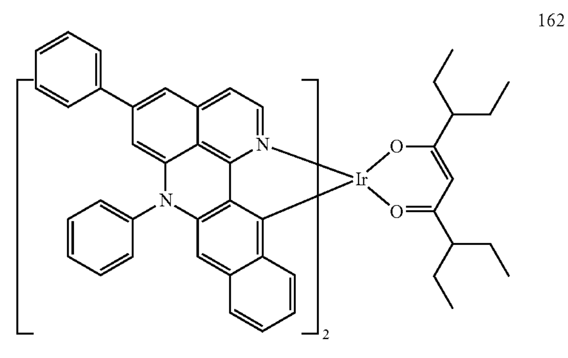
163
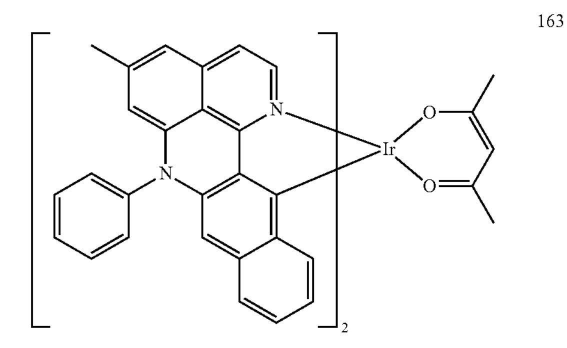
164
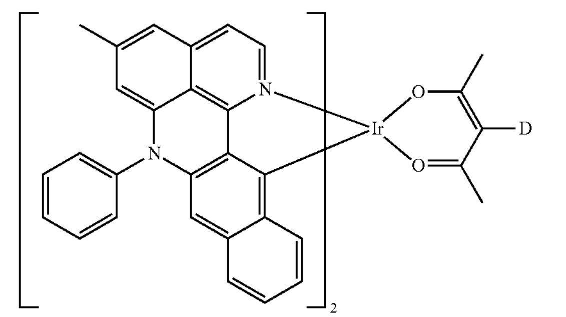

165
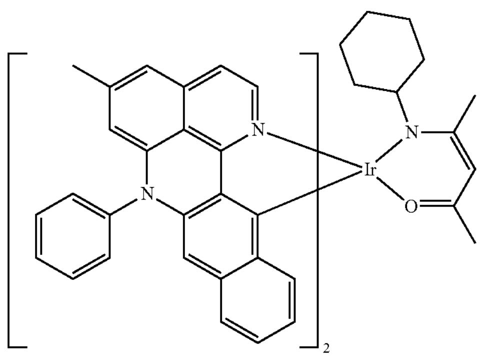
166
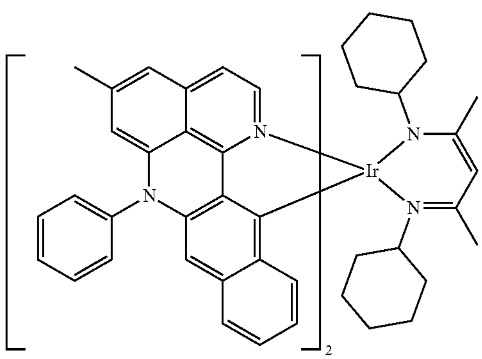
167
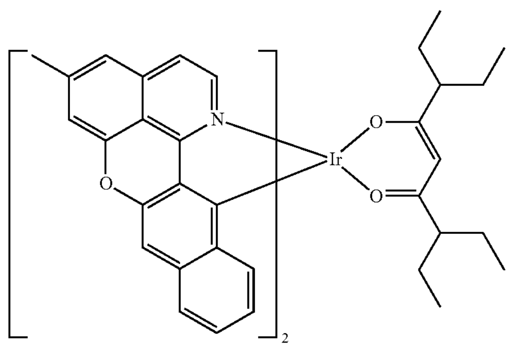
168
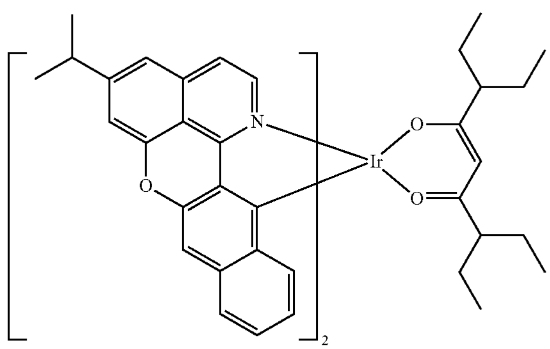
169
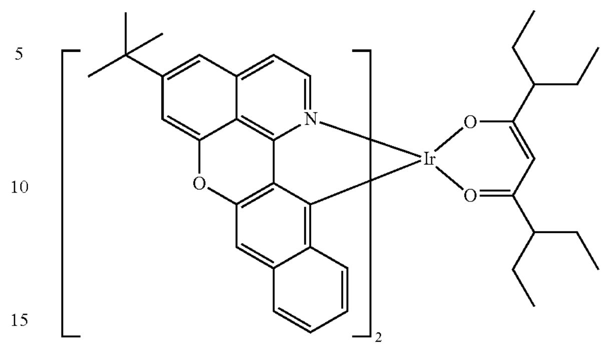
170
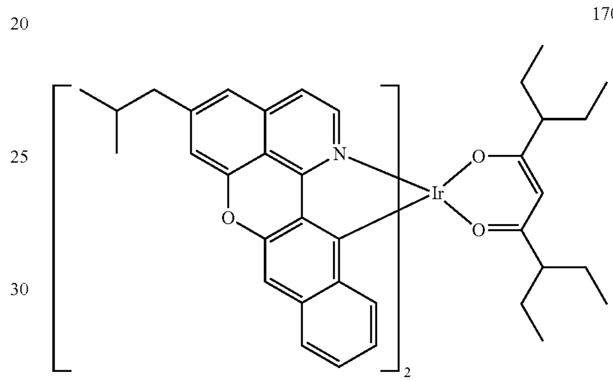
171
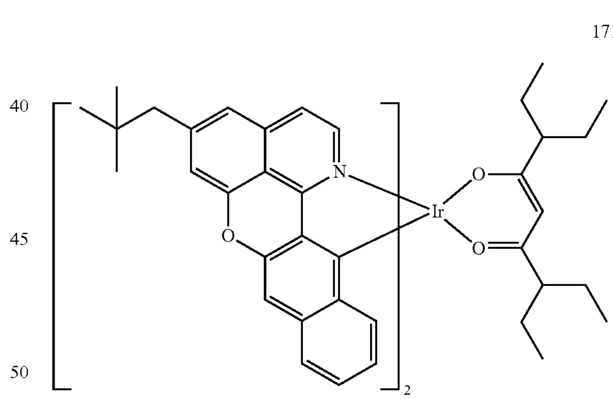
172
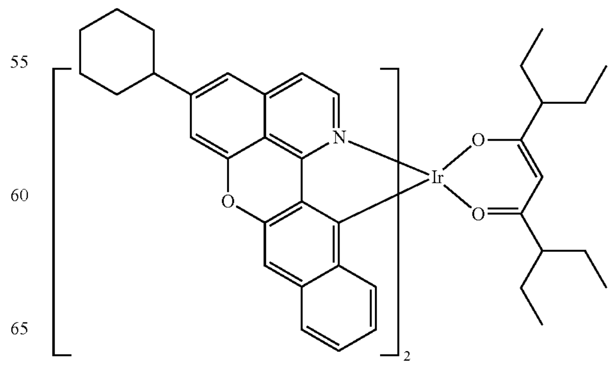

-continued
173
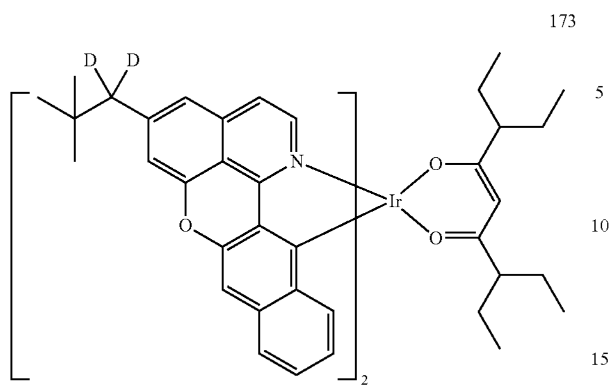
174
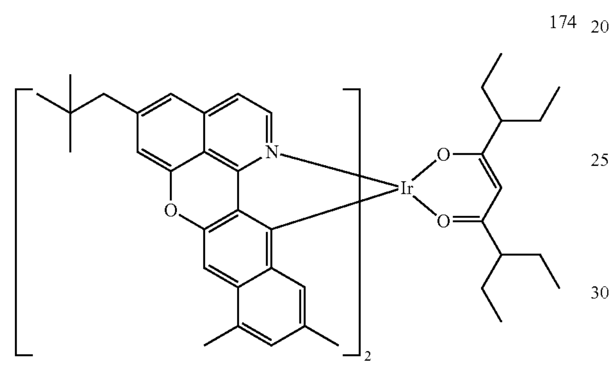
175
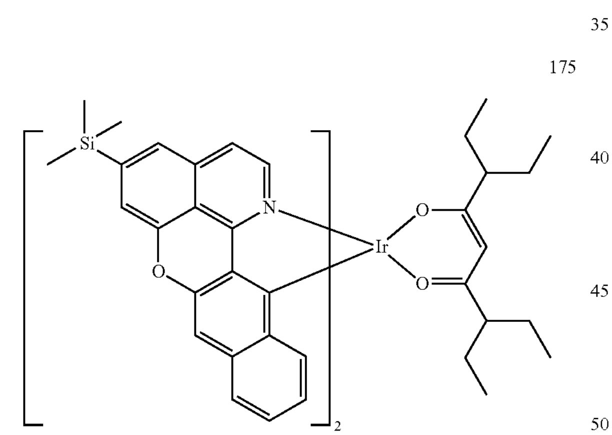
176
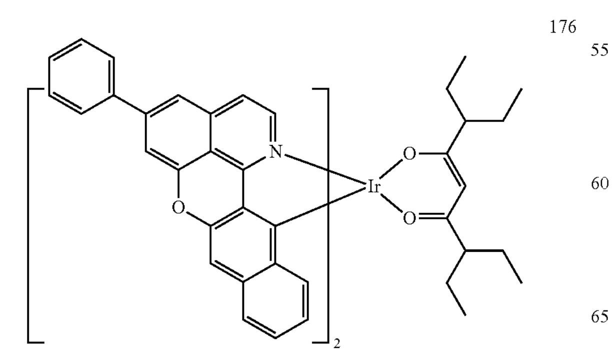
-continued
177
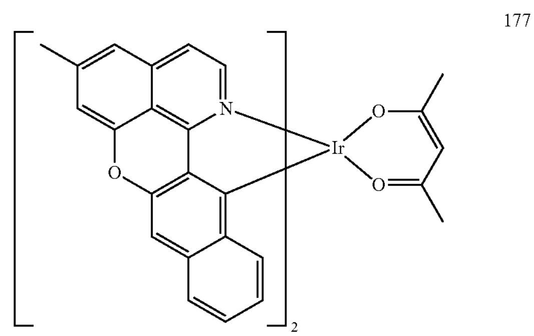
178
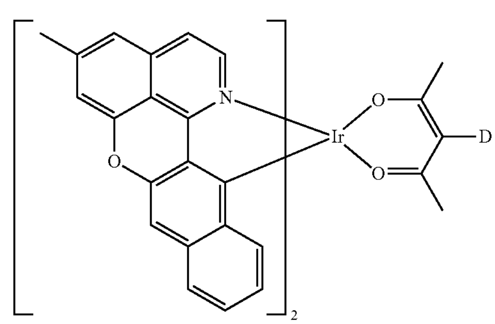
179
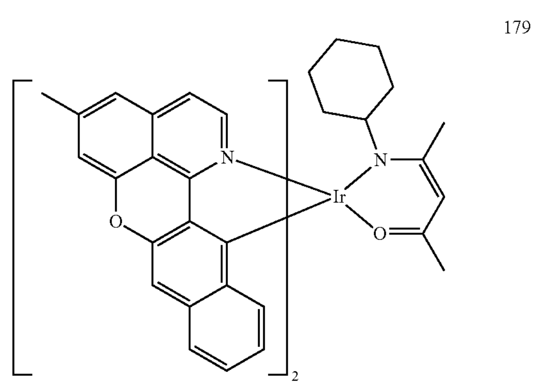
180
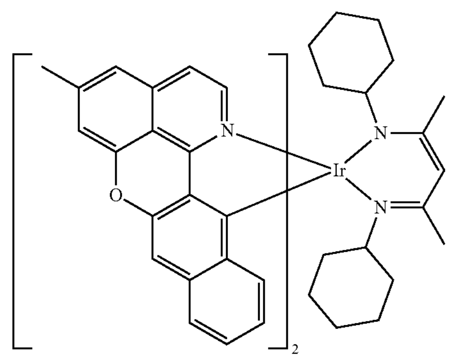

For example, the first compound 232 represented by Formula 1-9 can be one of the compounds in Formula 1-25.
[Formula 1-25]
181
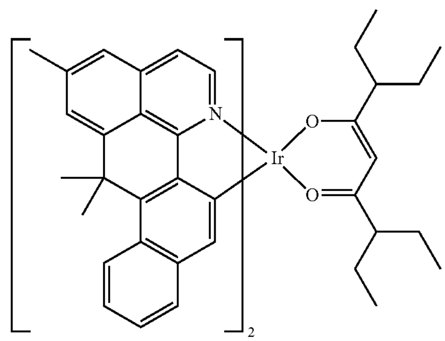
182
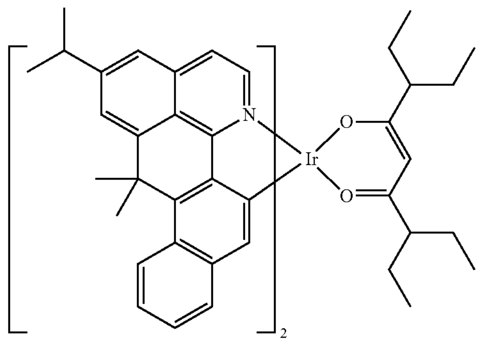
183
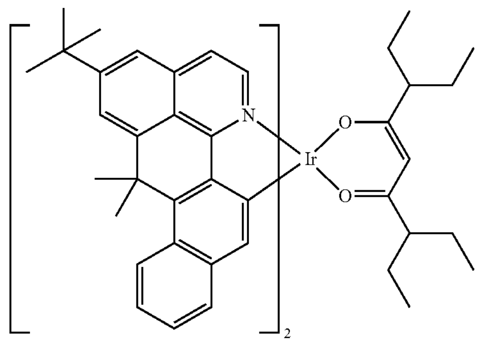
184
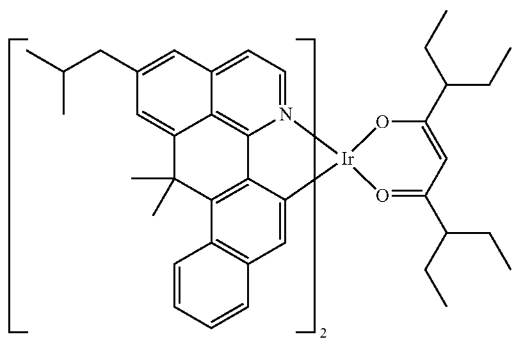
-continued
185
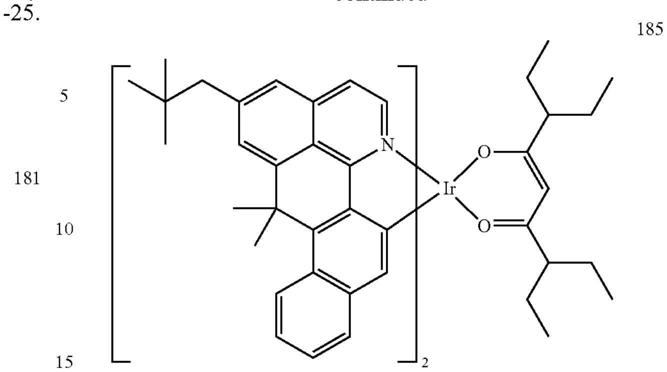
186
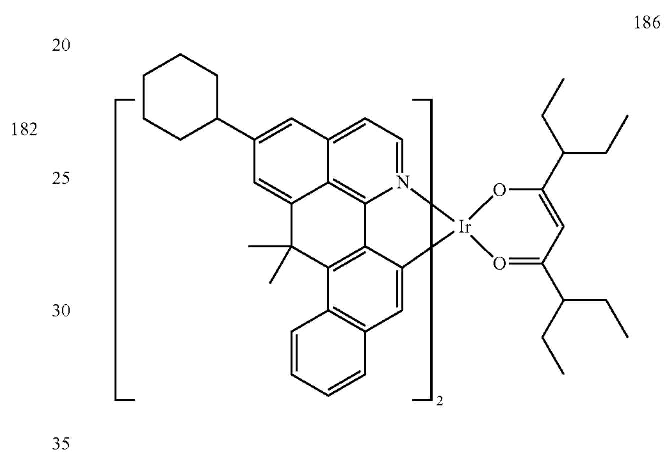
187
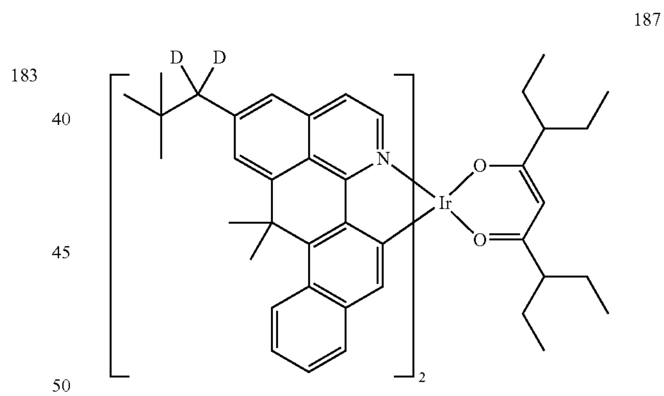
188
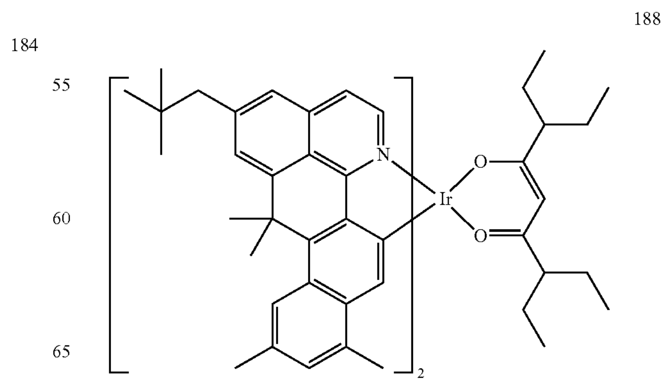

-continued
189
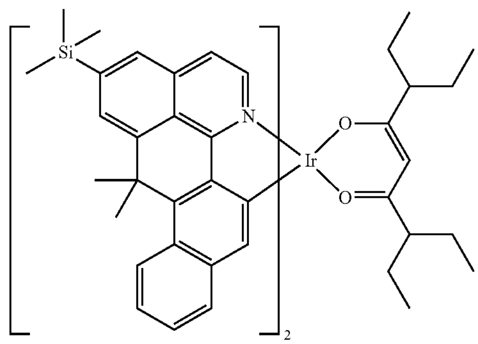
190
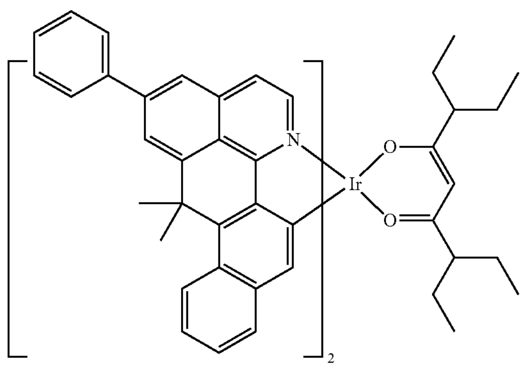
191
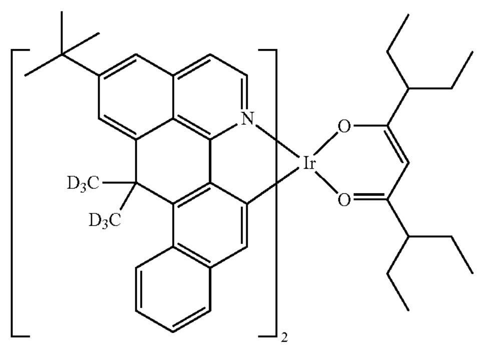
192
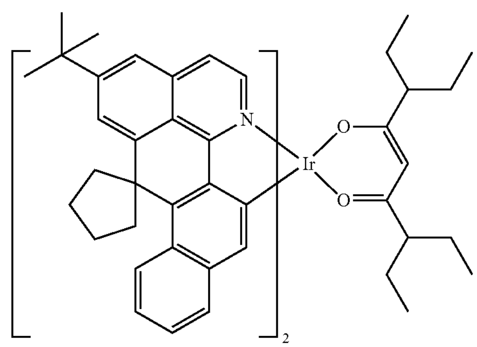
-continued
193
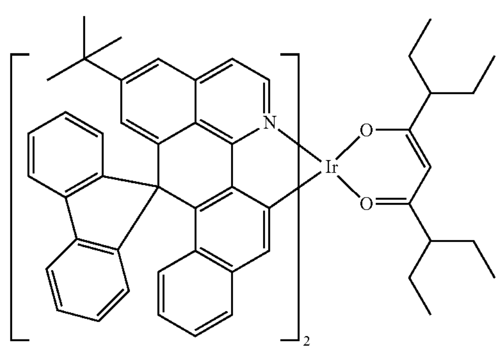
194
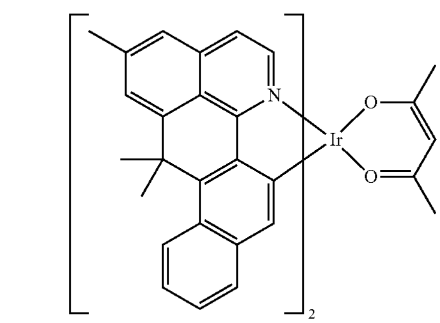
195
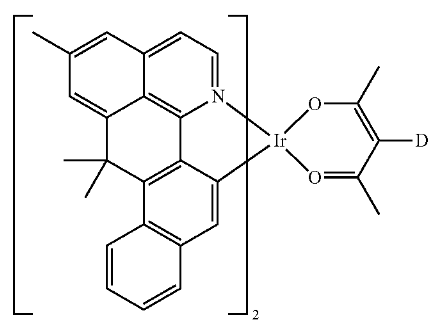
196
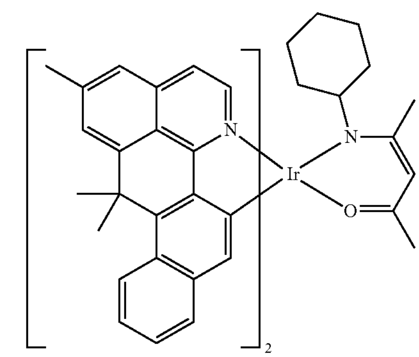

-continued
197
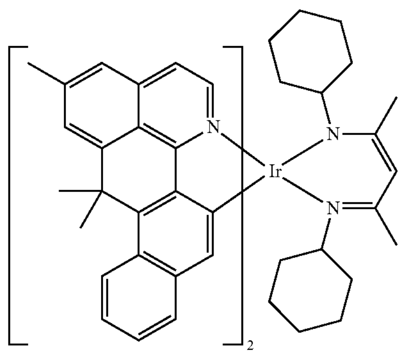
198
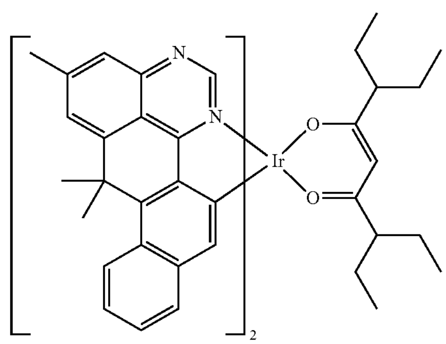
199
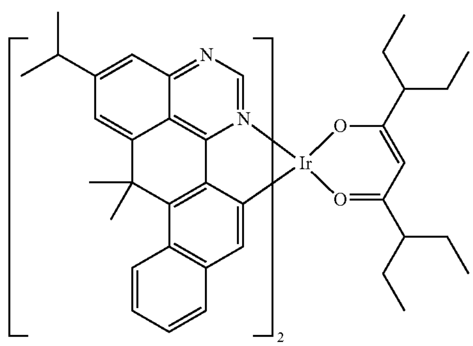
200
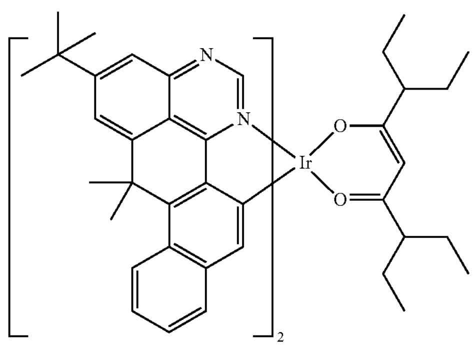
-continued
201
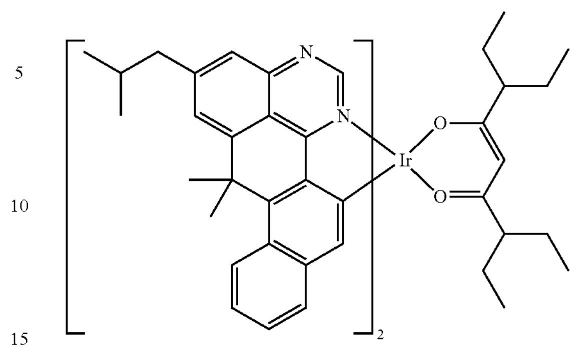
202
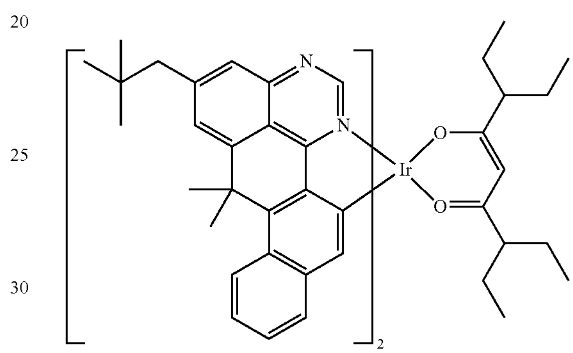
203
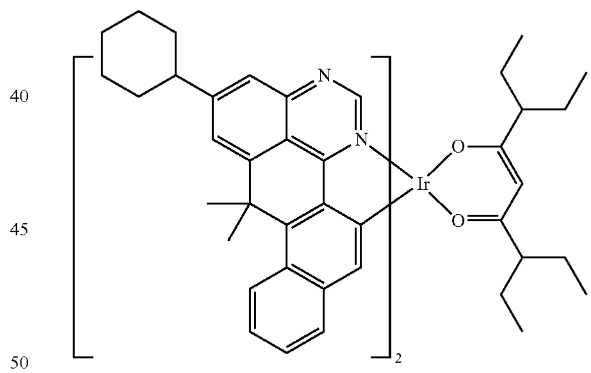
204
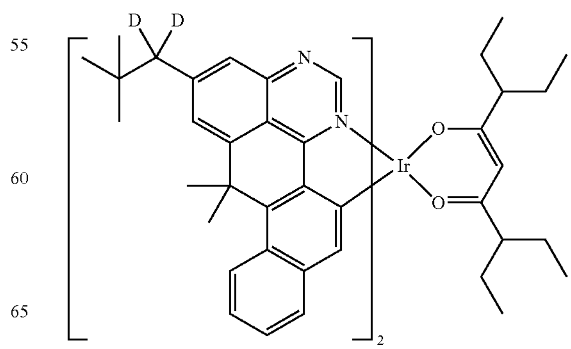

-continued
205
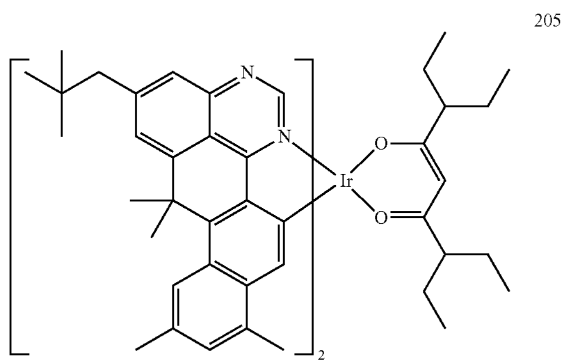
206
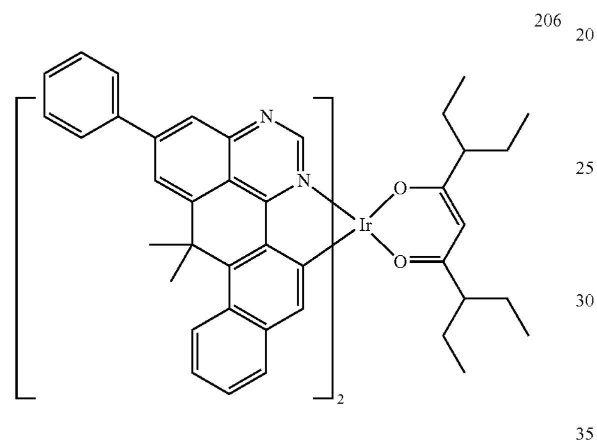
207
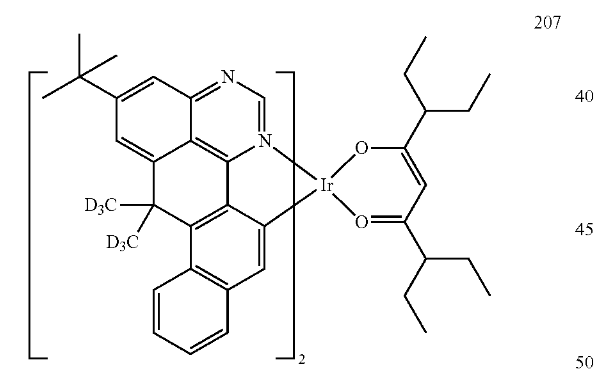
208
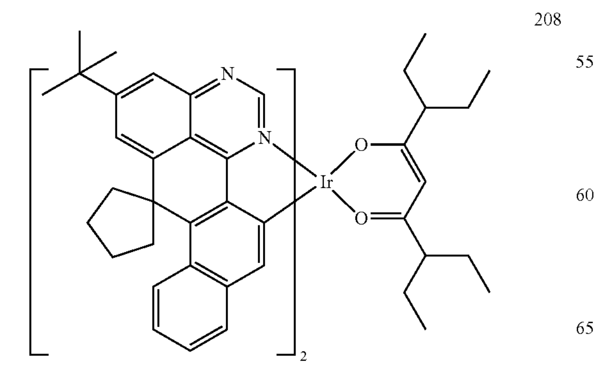
-continued
209
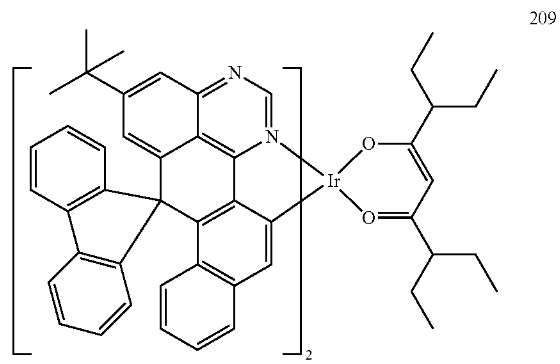
210
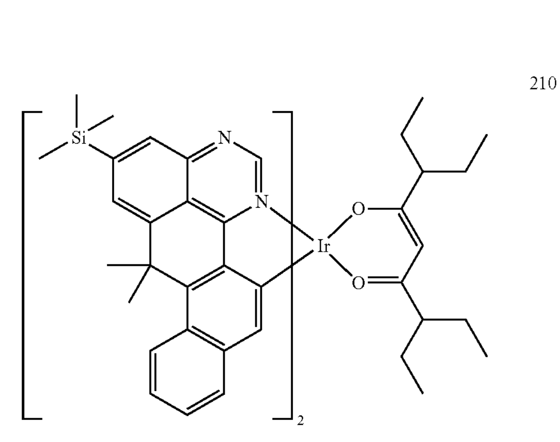
211
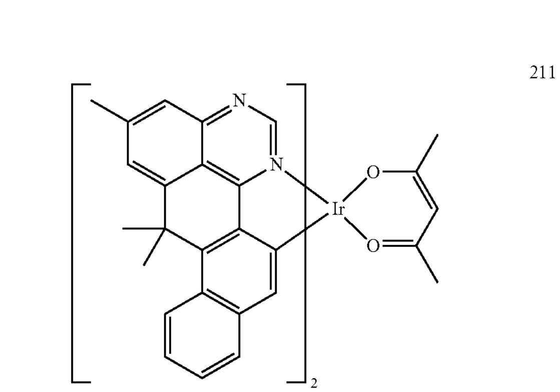
212
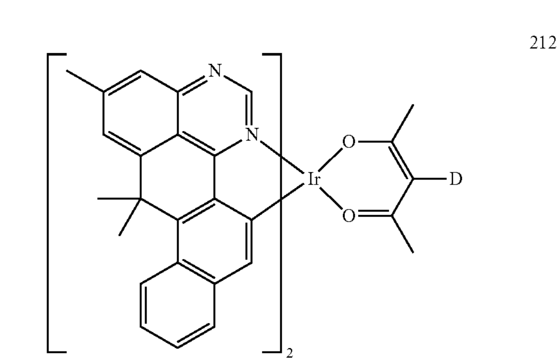

-continued
213
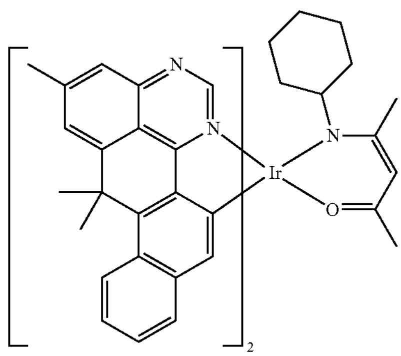
214
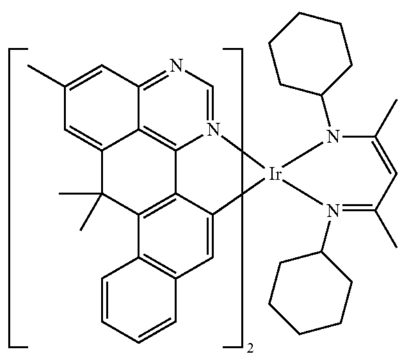
215
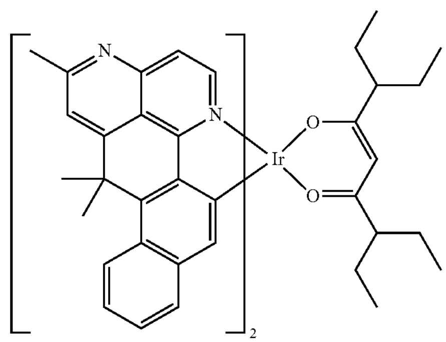
216
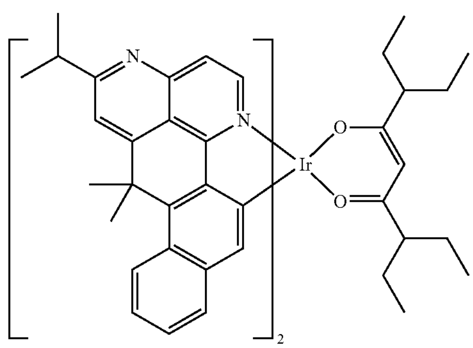
-continued
217
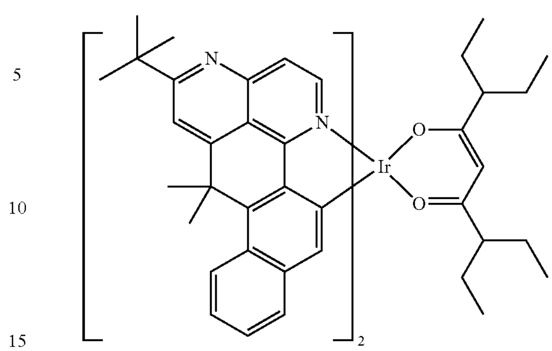
218
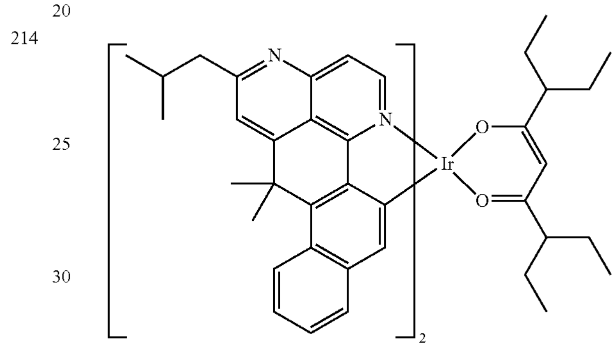
219
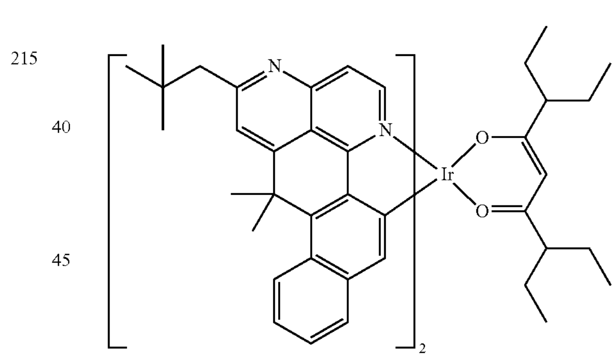
220
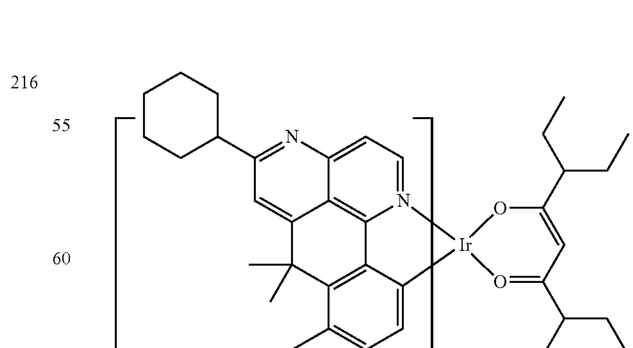
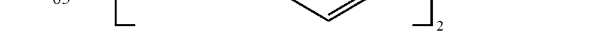

-continued
221
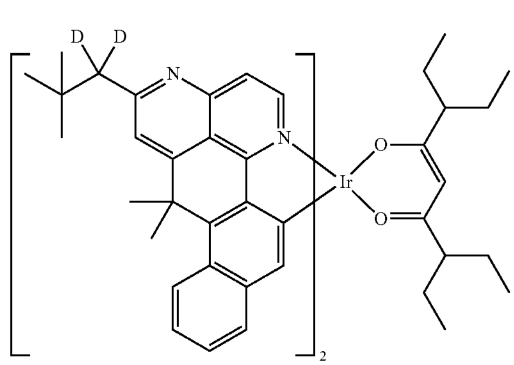
22
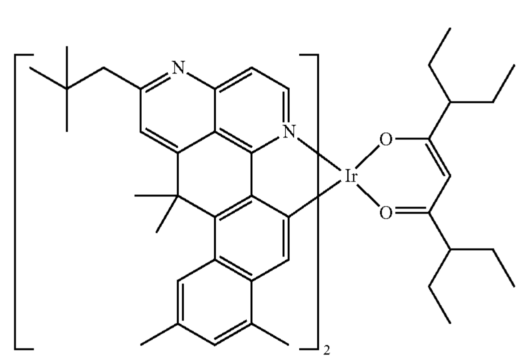
223
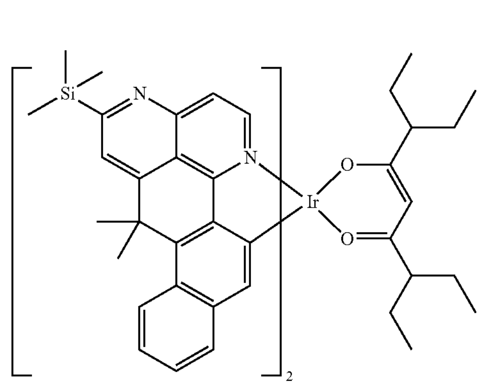
224
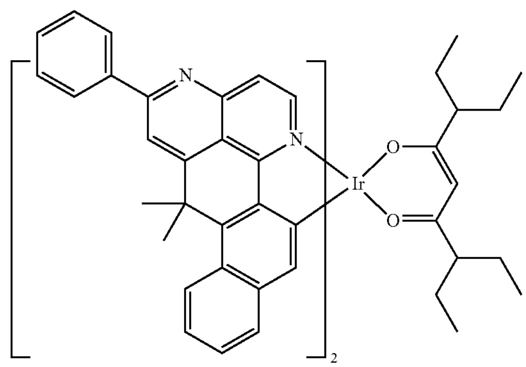
-continued
225
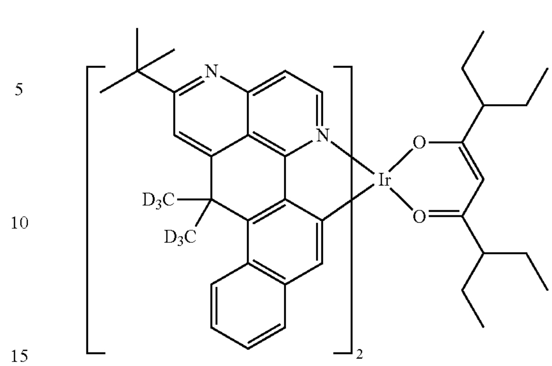
226
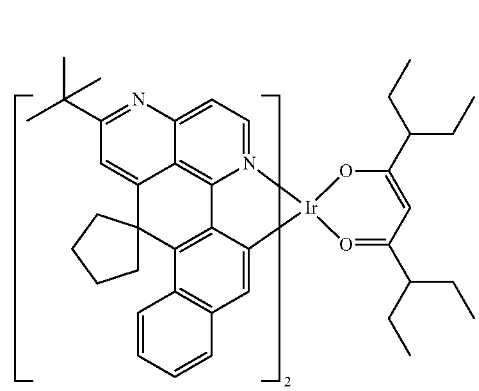
227
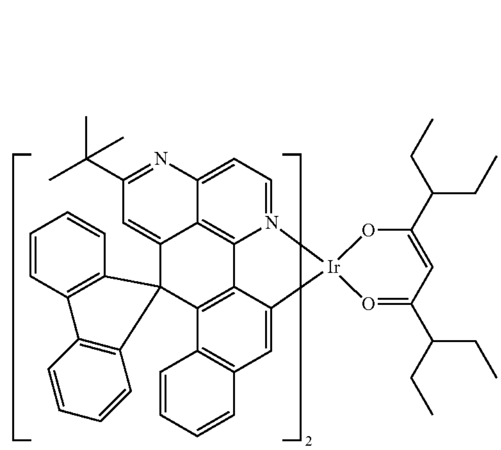
228
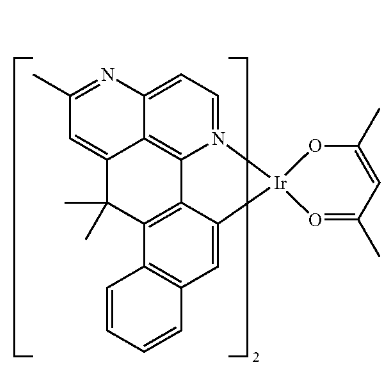

229
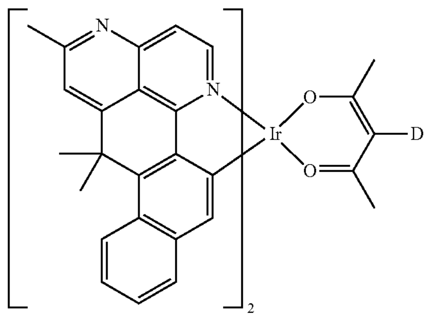
230
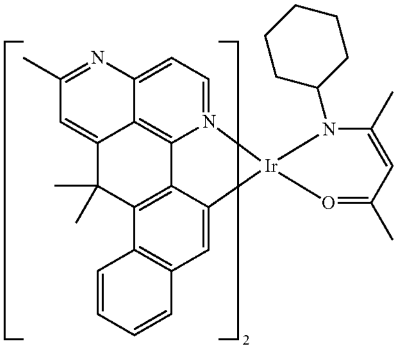
231
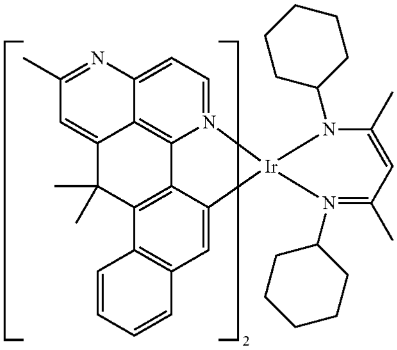
232
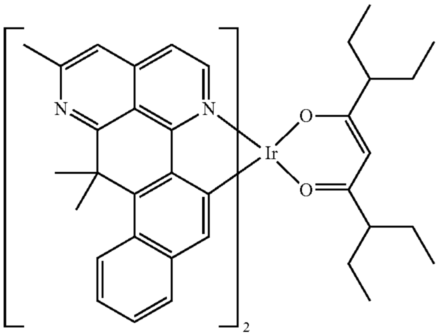
233
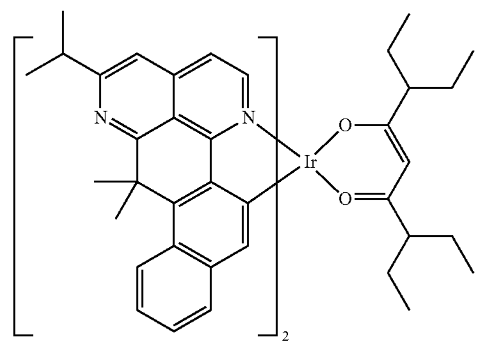
234
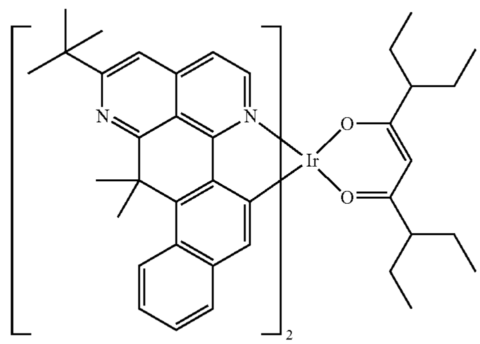
235
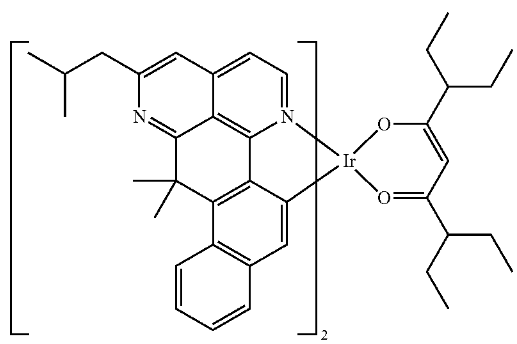
236
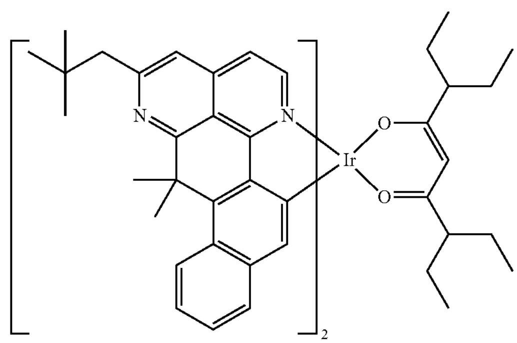

-continued
237
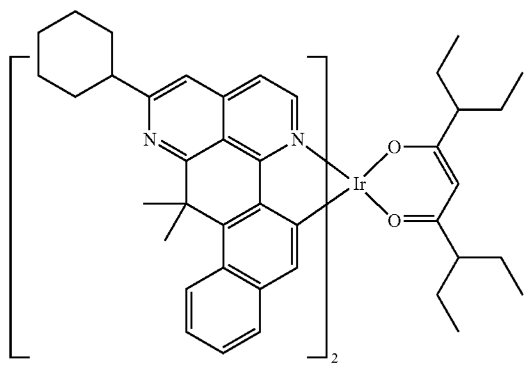
238
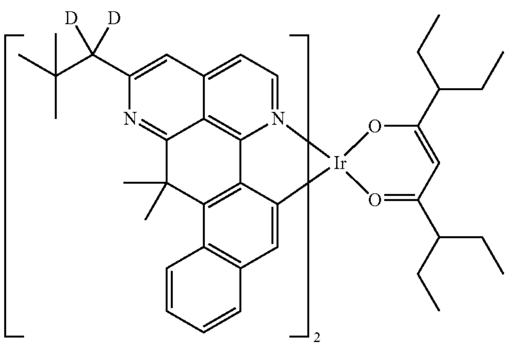
239
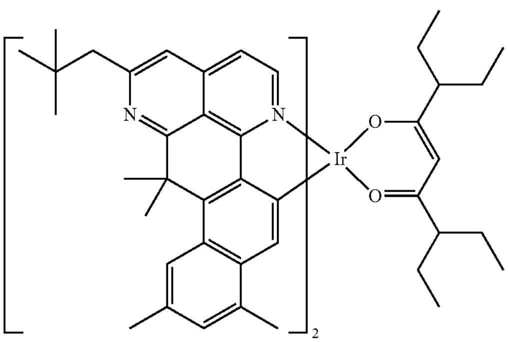
240
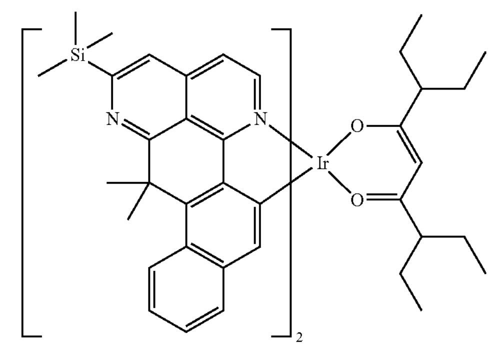
-continued
241
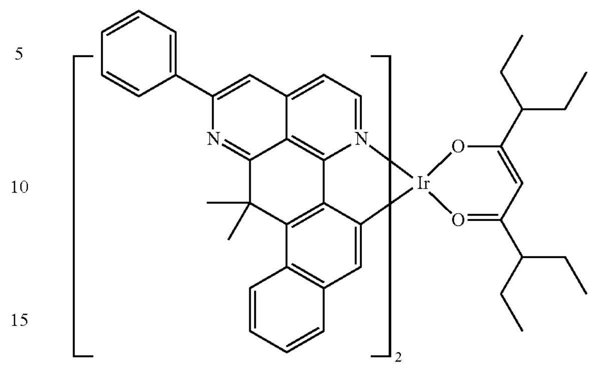
242
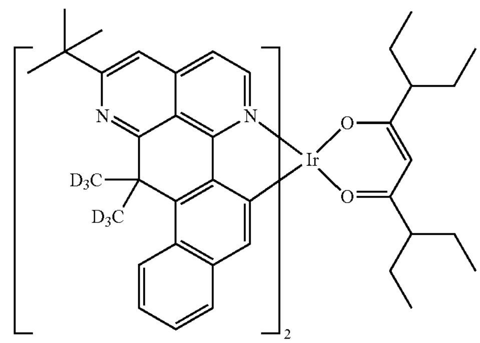
243
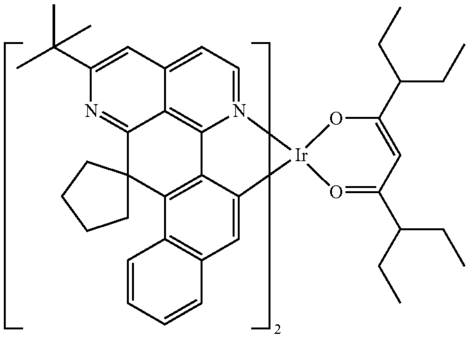
244
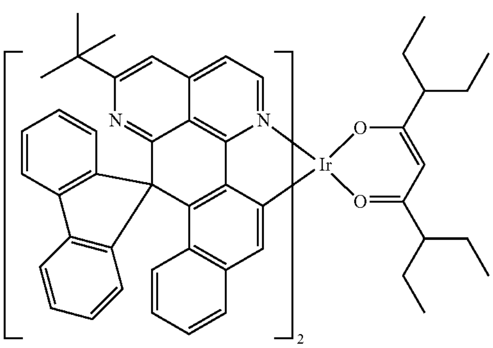

-continued
245
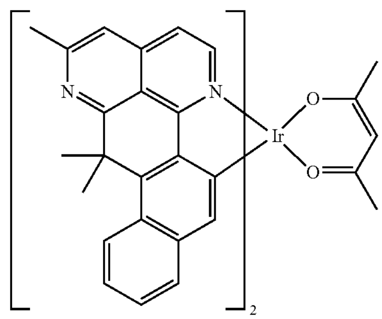
246
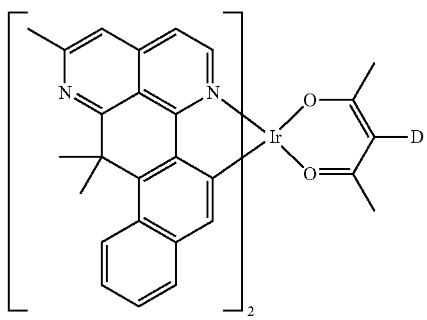
247
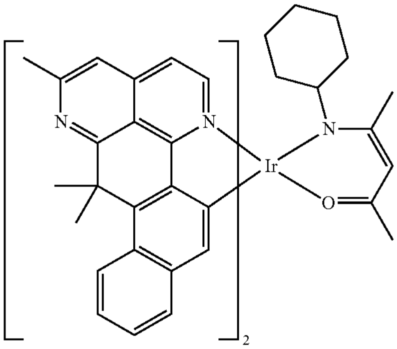
248
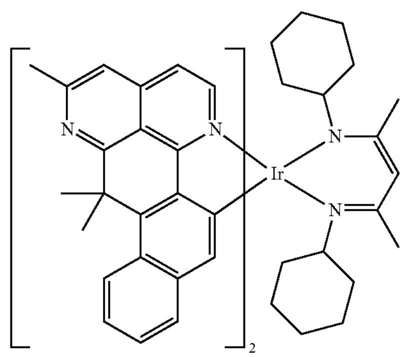
-continued
249
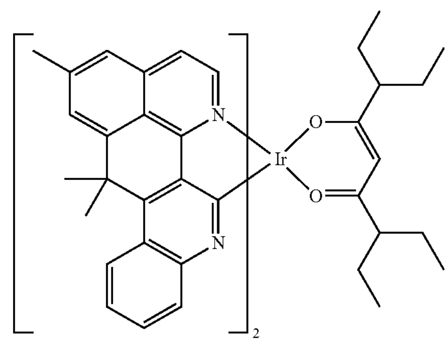
250
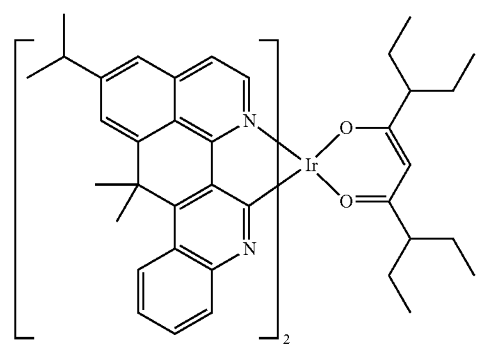
251
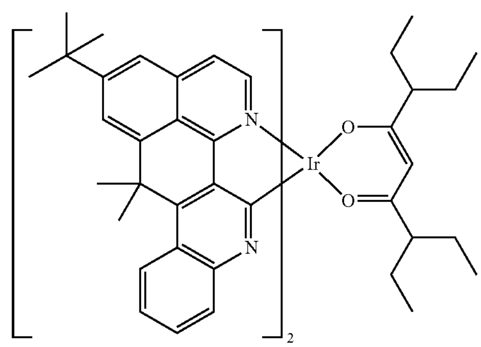
252
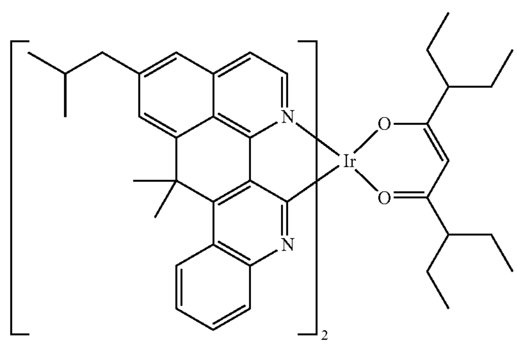

-continued
253
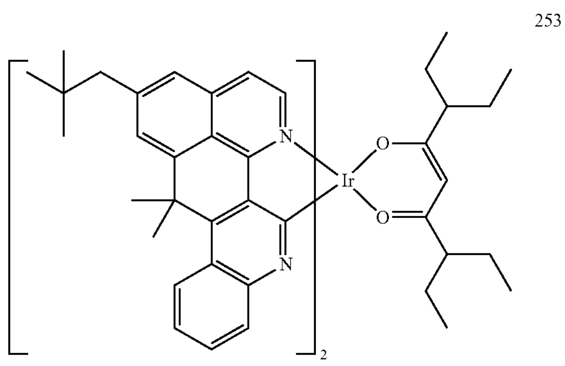
254
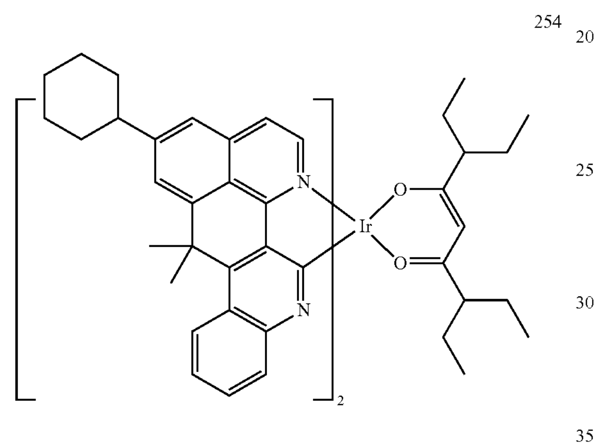
255
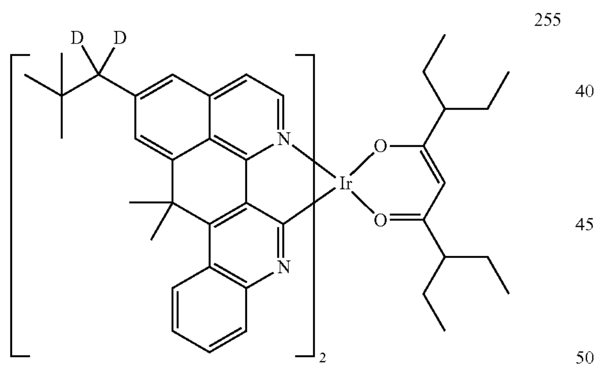
256
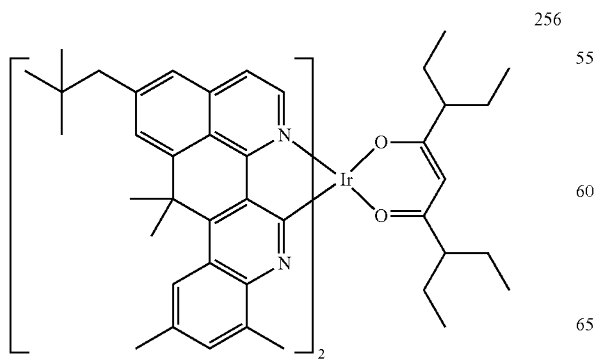
-continued
257
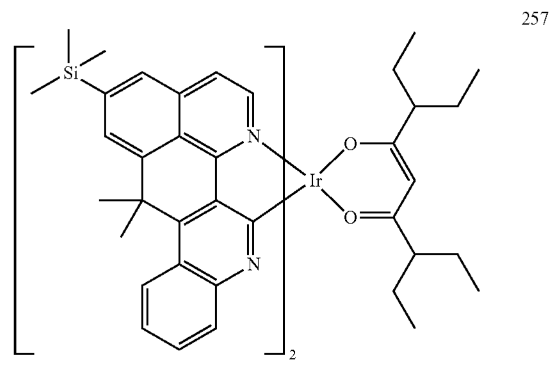
258
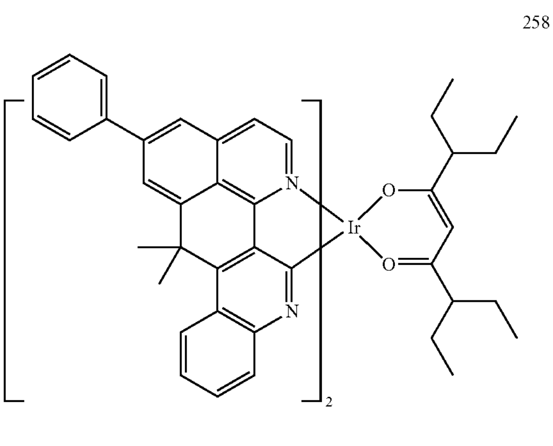
259
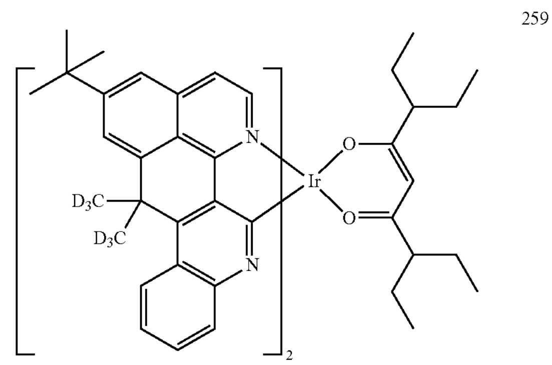
260
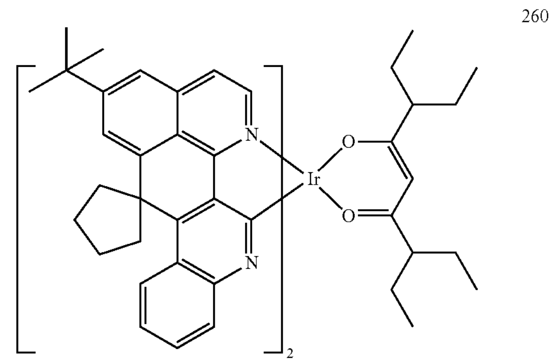

-continued
261
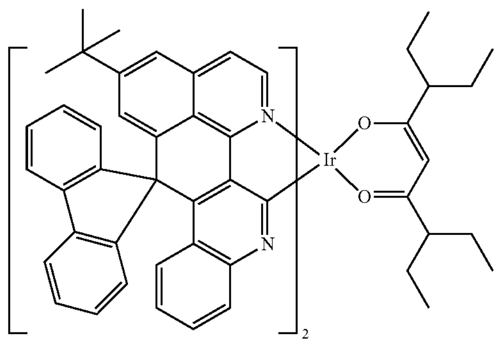
262
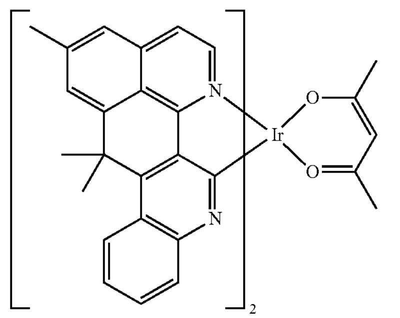
263
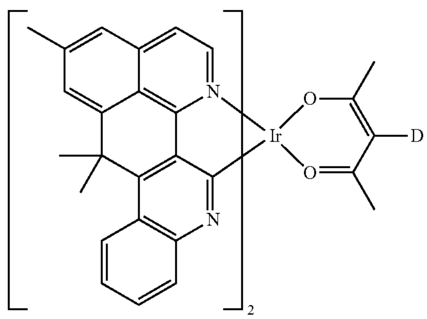
264
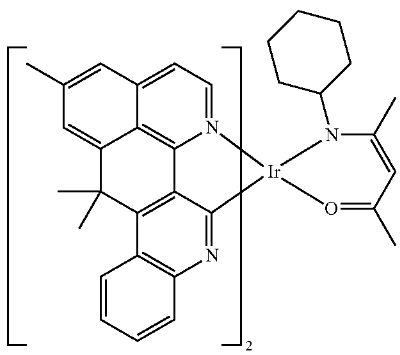
-continued
265
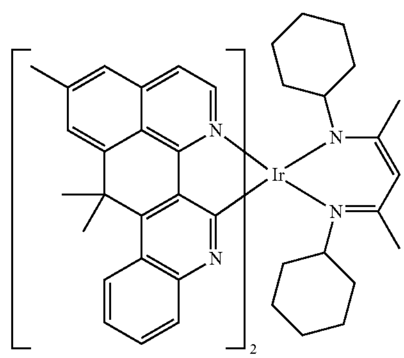
266
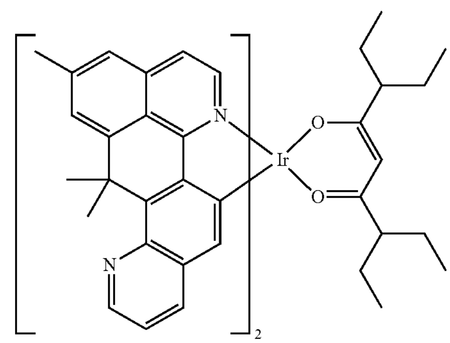
267
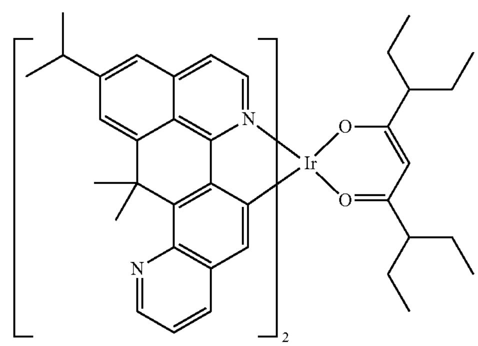
268
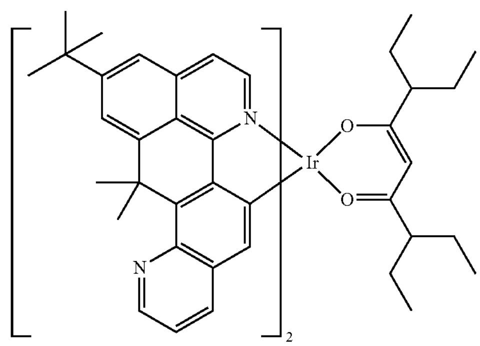

-continued
269
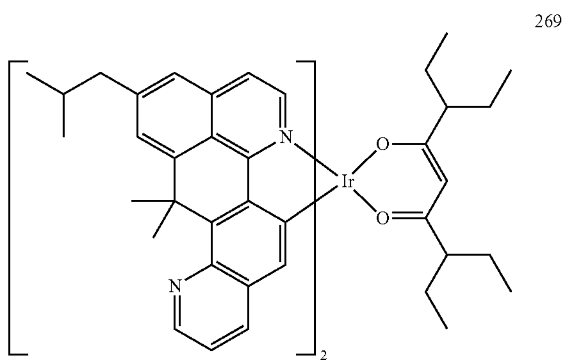
270
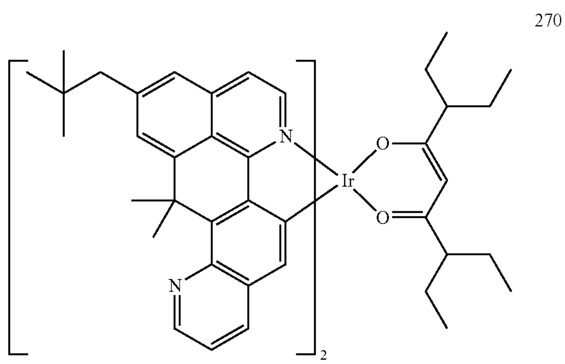
271
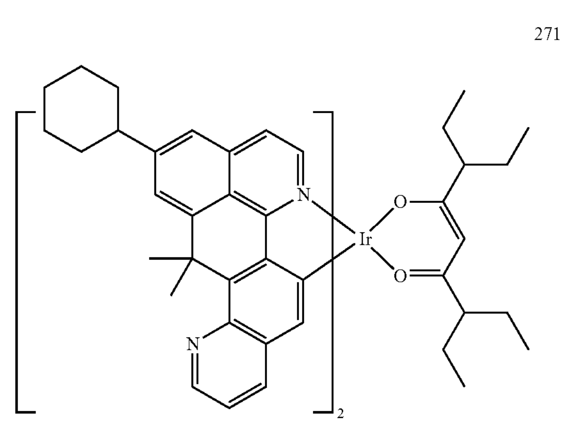
272
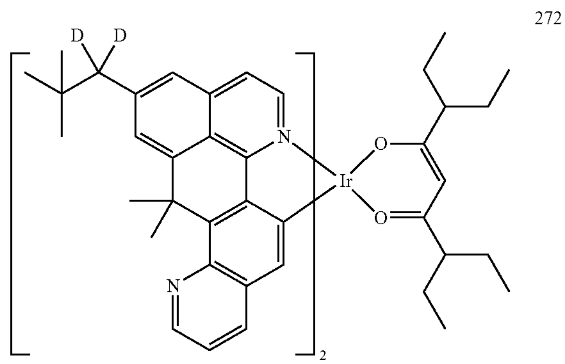
-continued
273
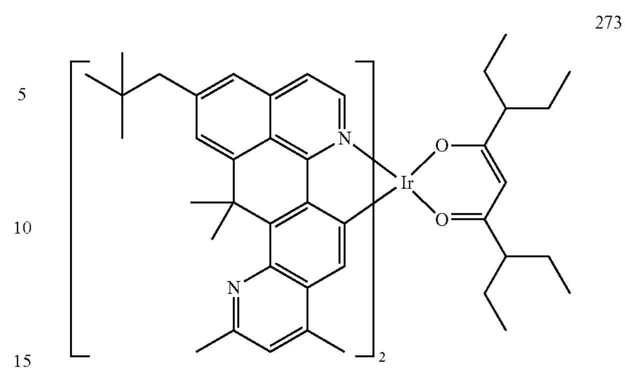
274
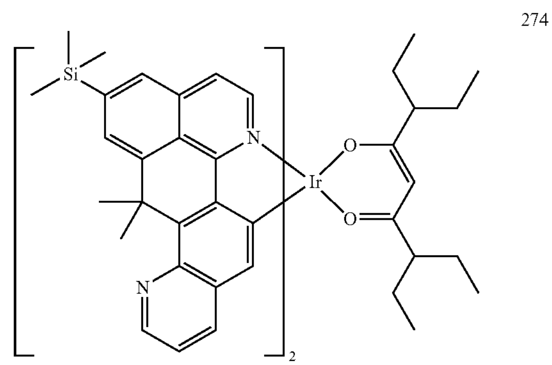
275
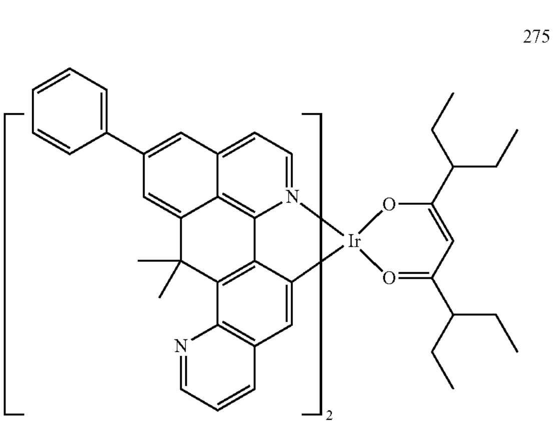
276
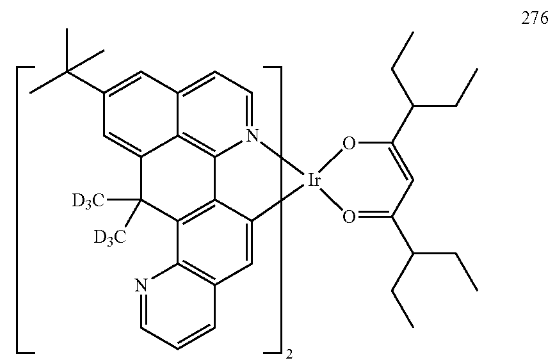

-continued
277
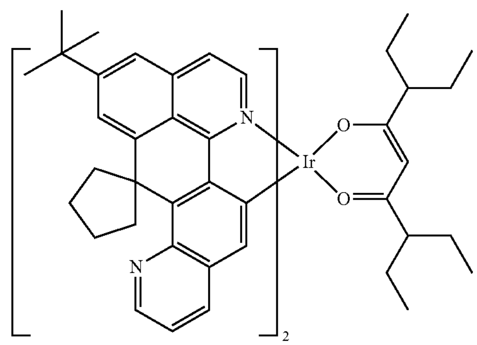
278
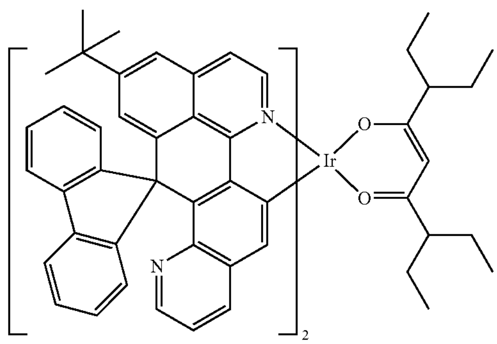
279
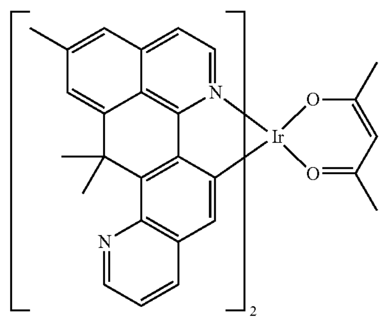
280
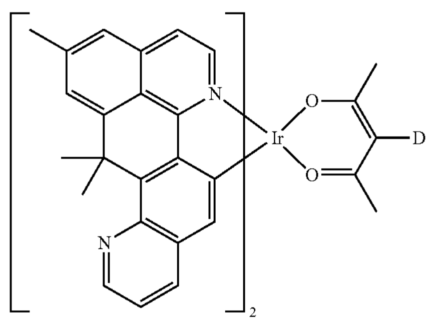
-continued
281
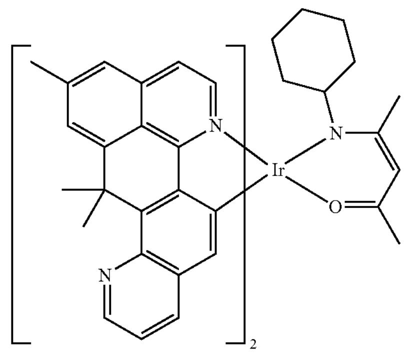
282
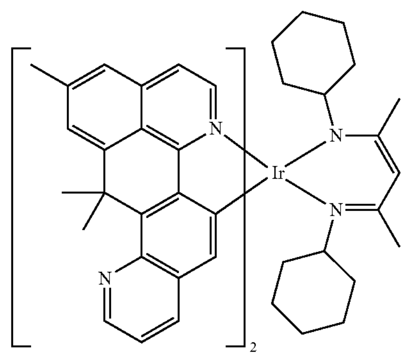
283
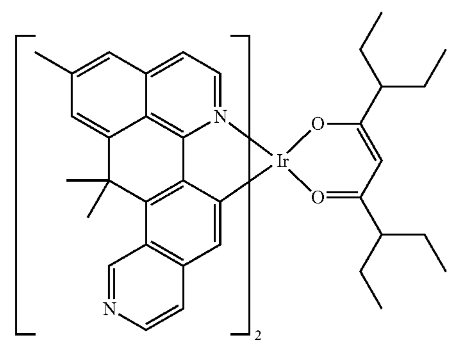
284
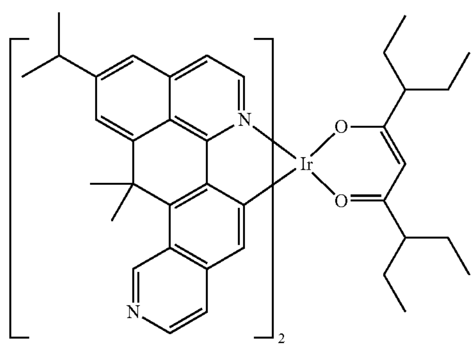

-continued
285
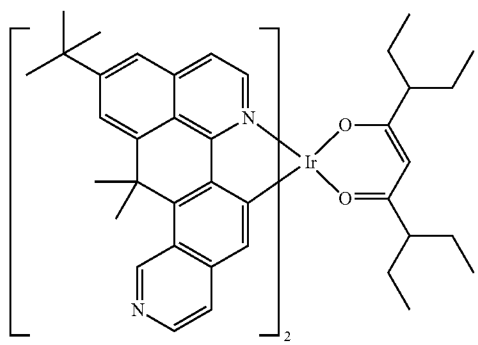
286
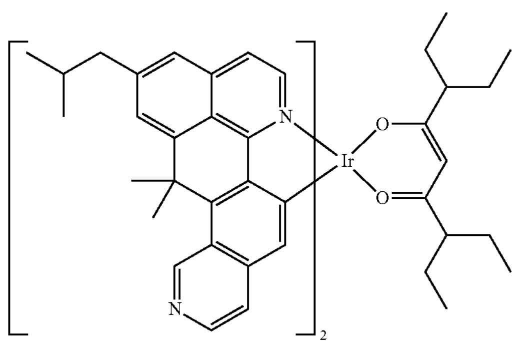
287
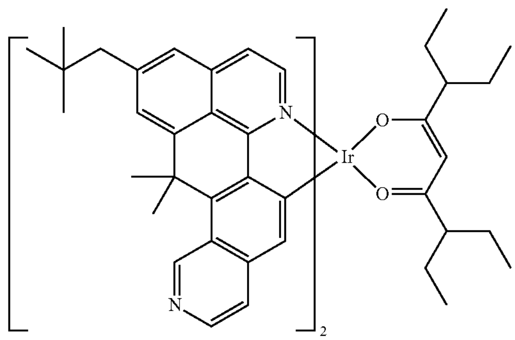
288
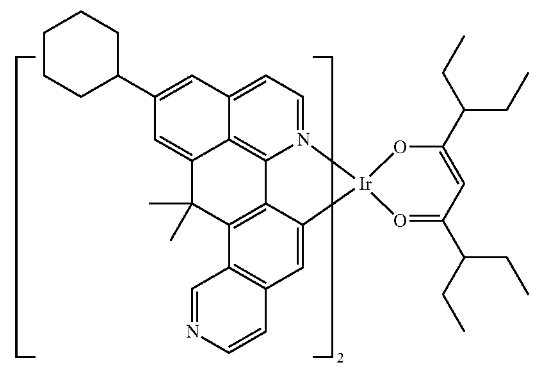
-continued
289
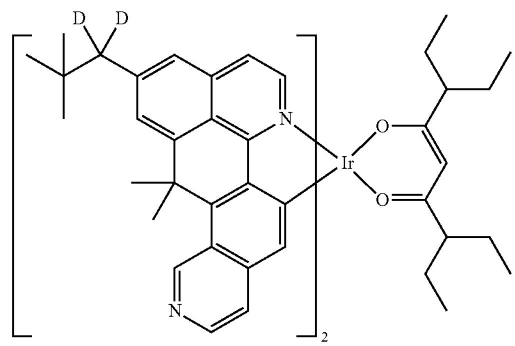
290
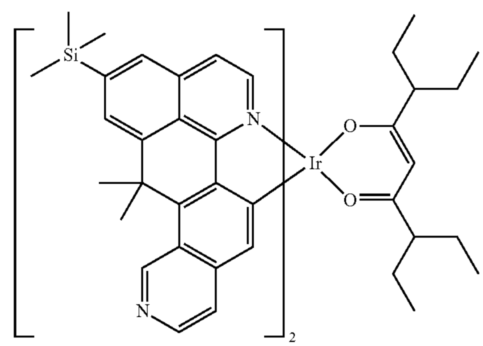
291
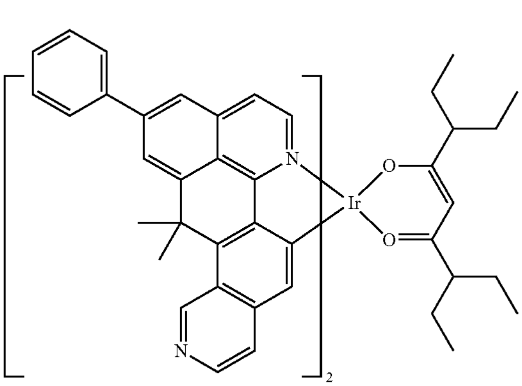
292
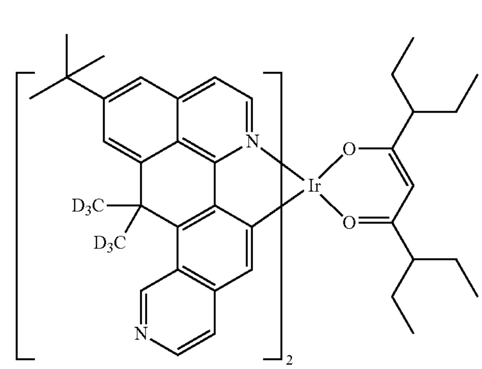

-continued
293
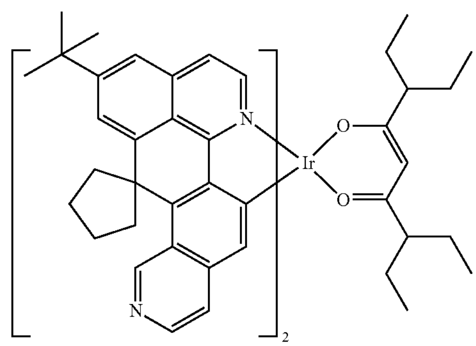
294
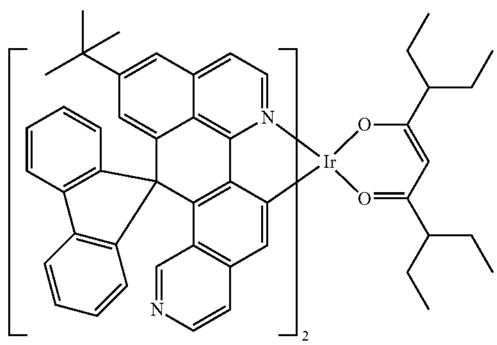
295
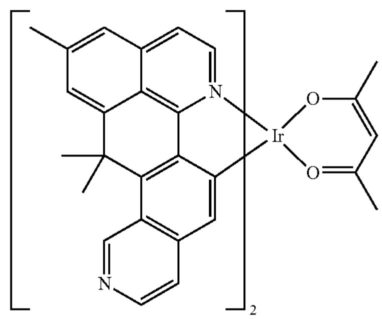
296
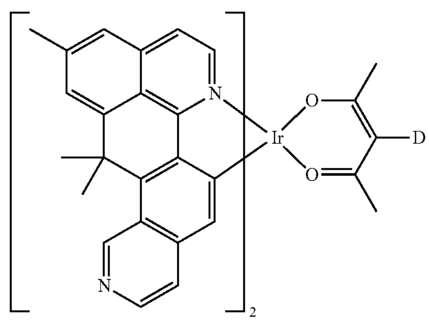
-continued
297
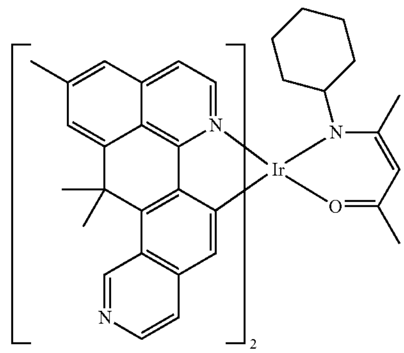
298
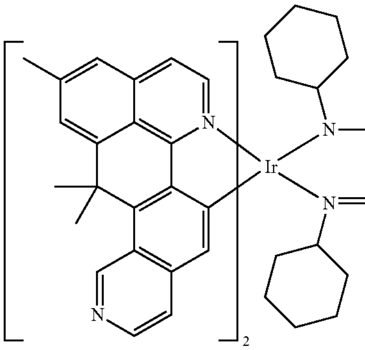
299
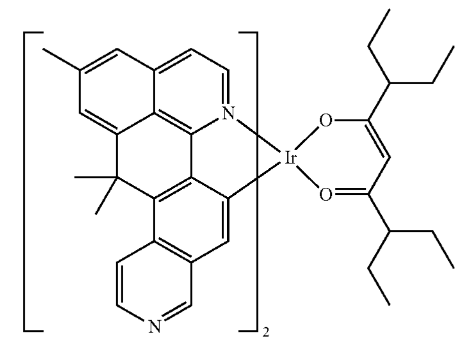
300
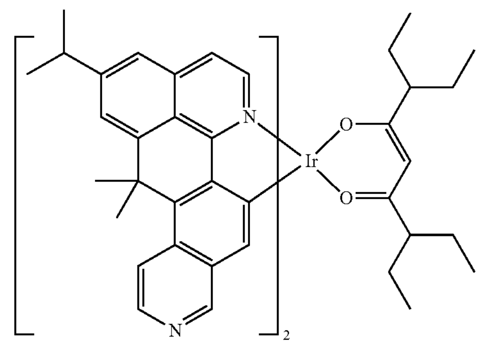

-continued
301
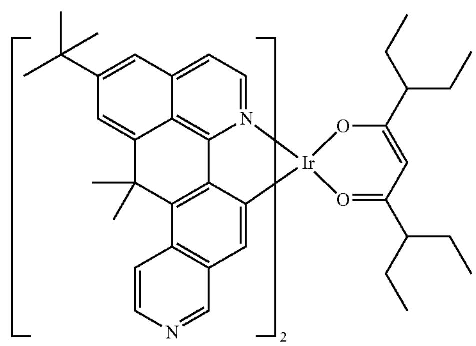
302
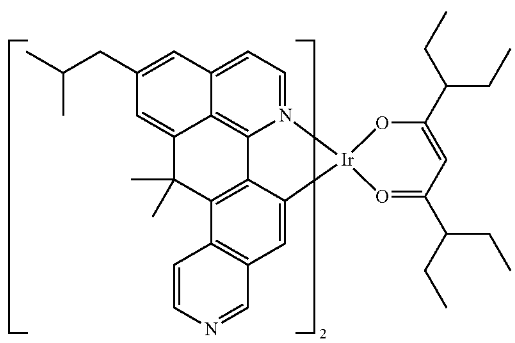
303
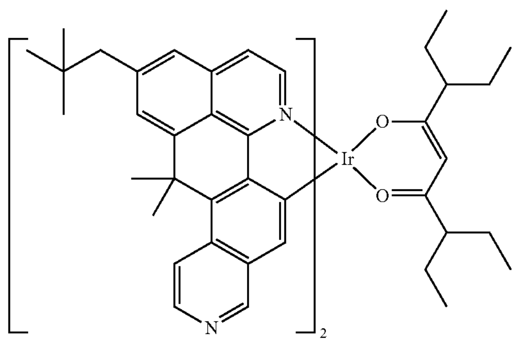
304
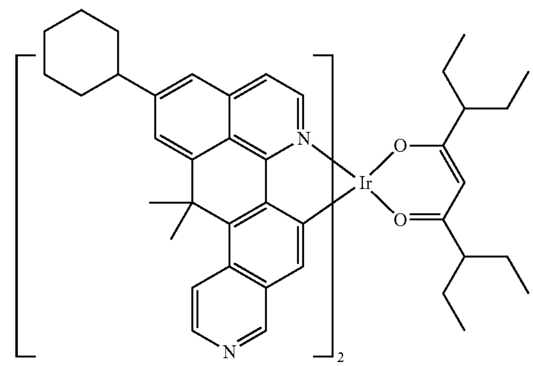
-continued
305
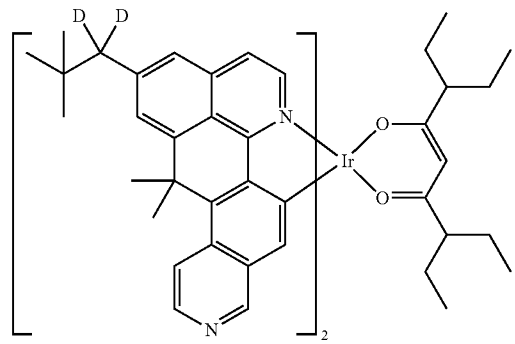
306
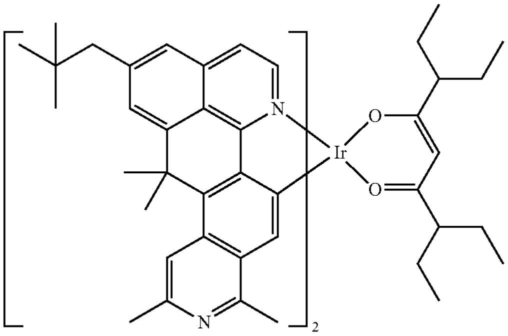
307
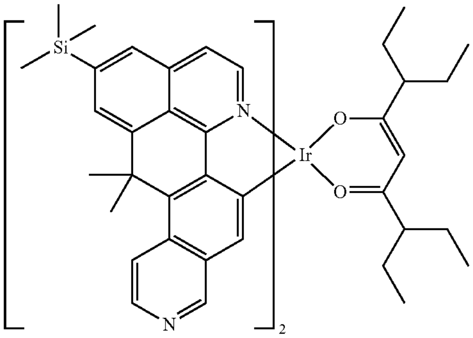
308
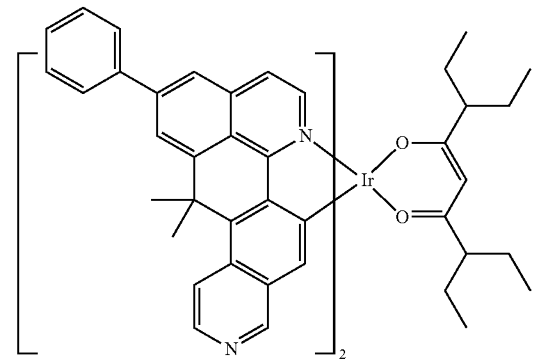

-continued
309
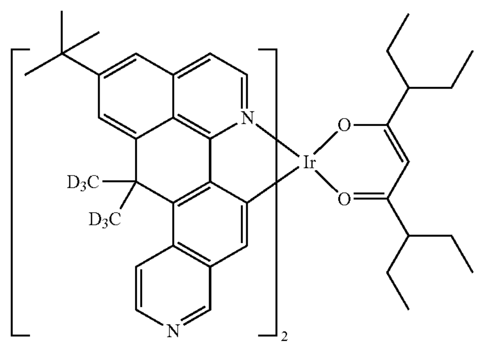
310
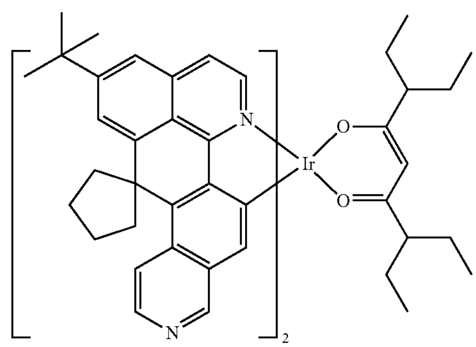
311
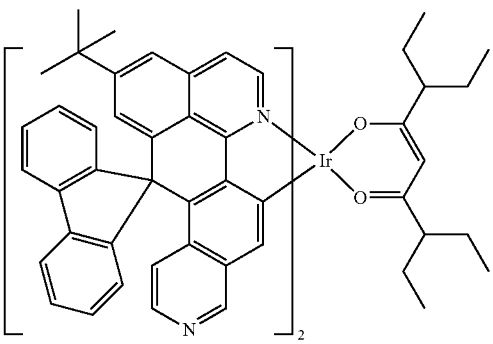
312
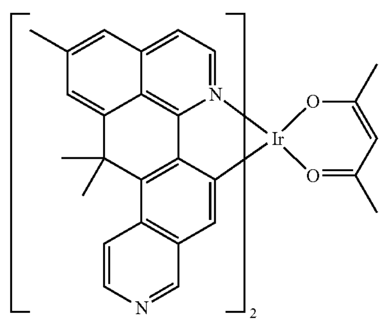
-continued
313
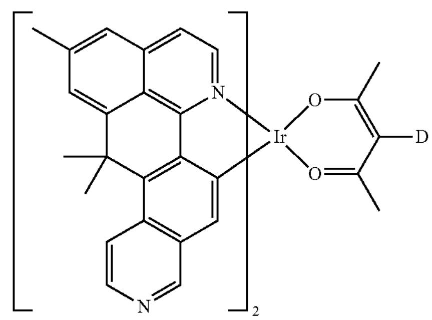
314
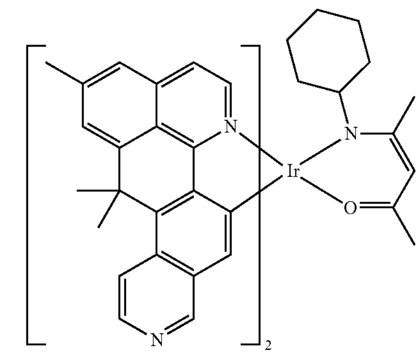
315
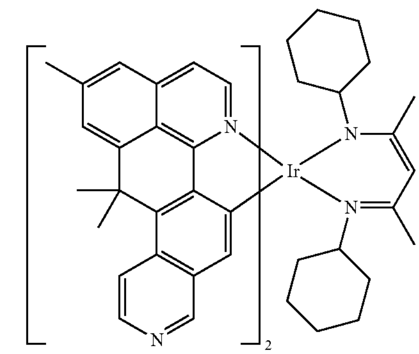
316
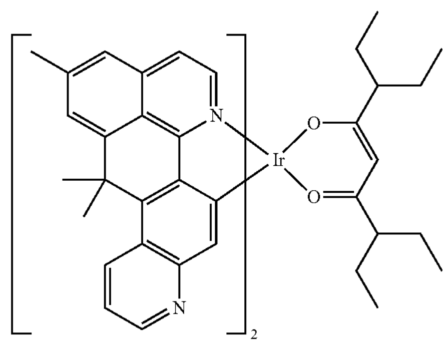

-continued
317
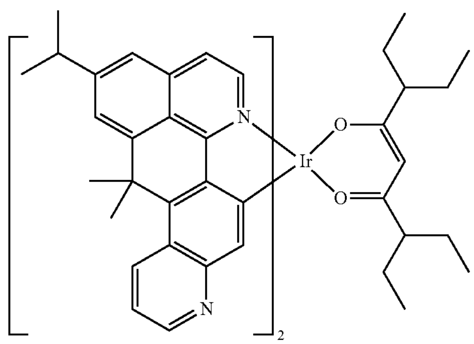
318
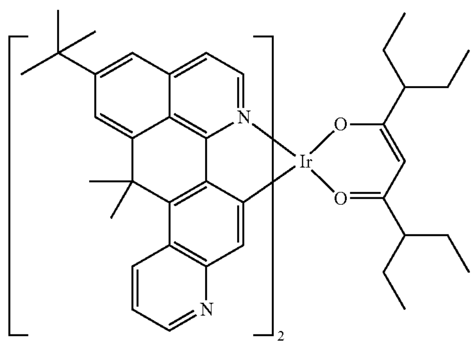
319
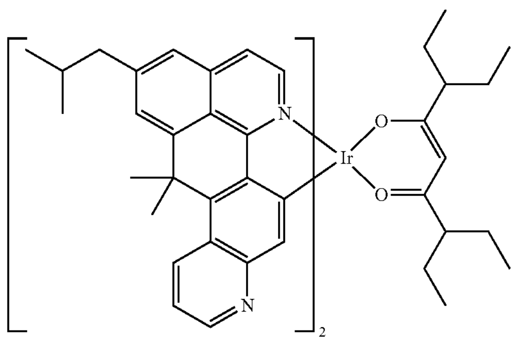
320
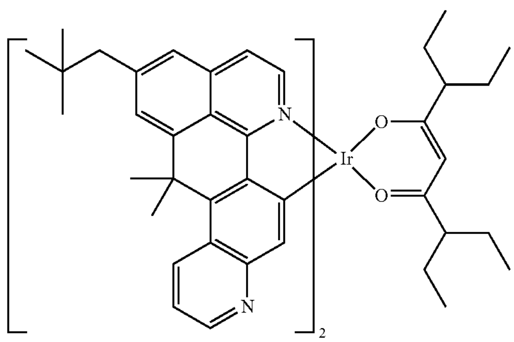
-continued
321
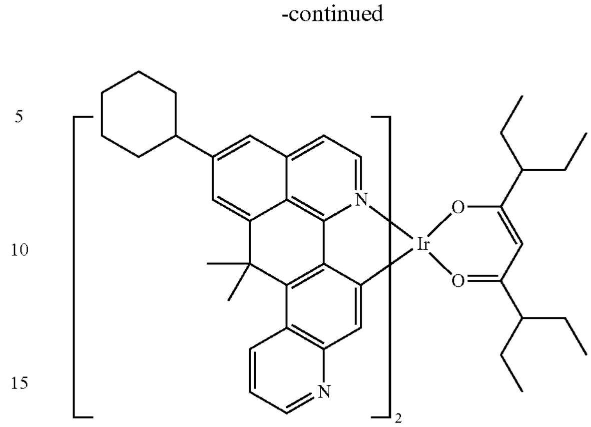
322
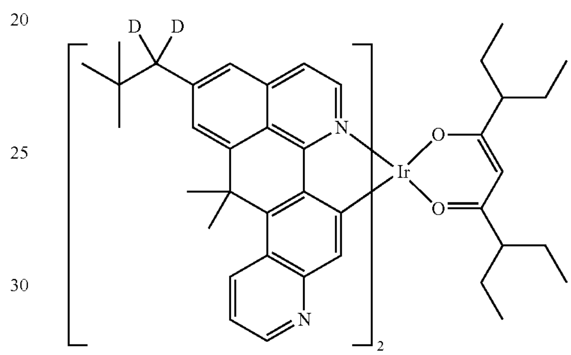
323
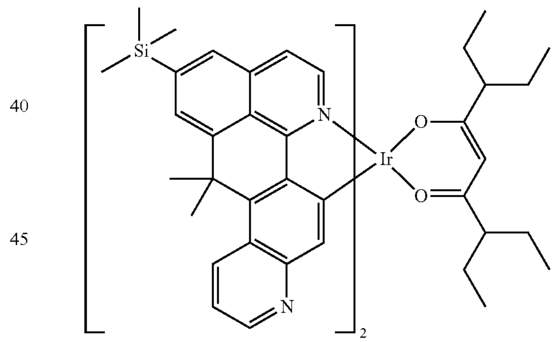
324
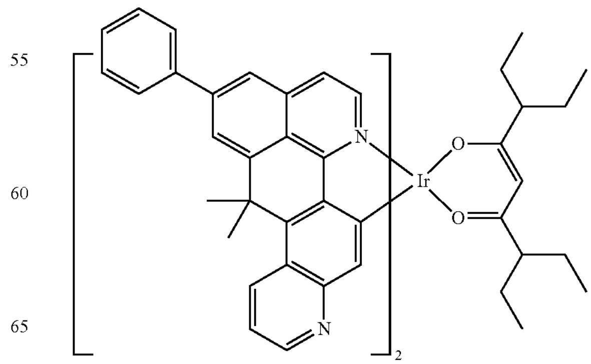

-continued
325
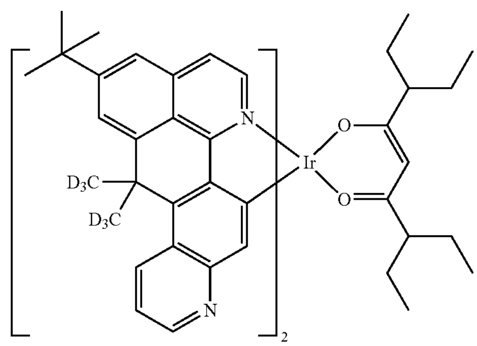
326
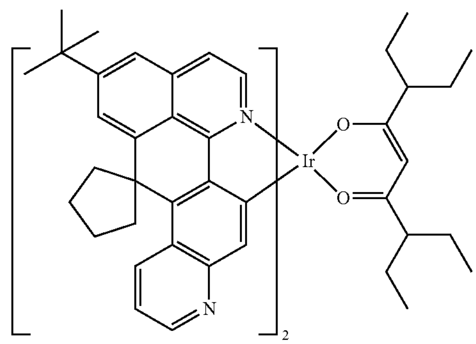
327
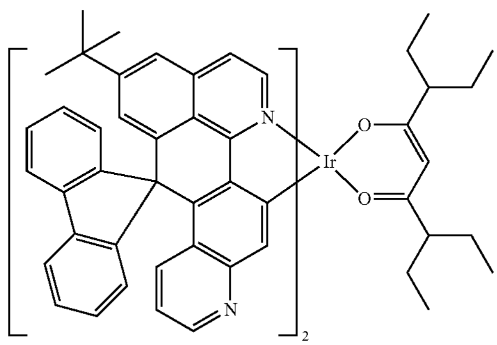
328
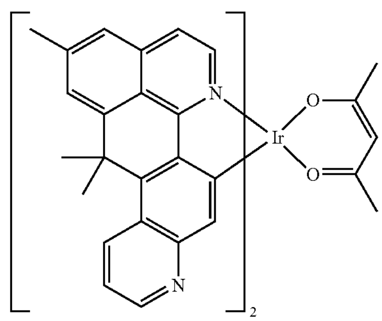
-continued
329
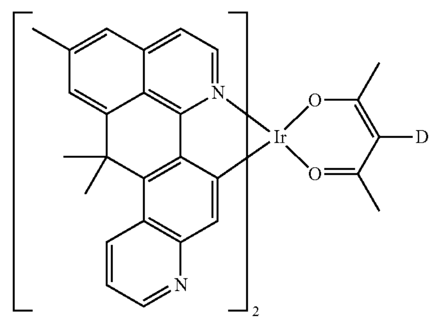
330
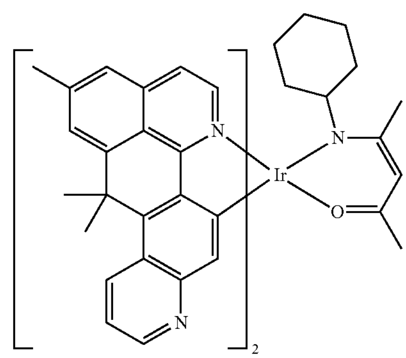
331
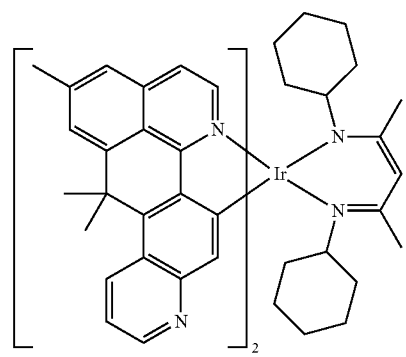
332
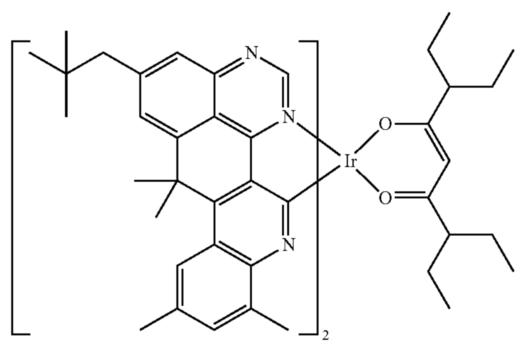

-continued
333
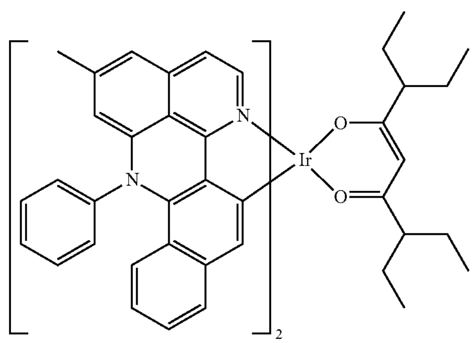
334
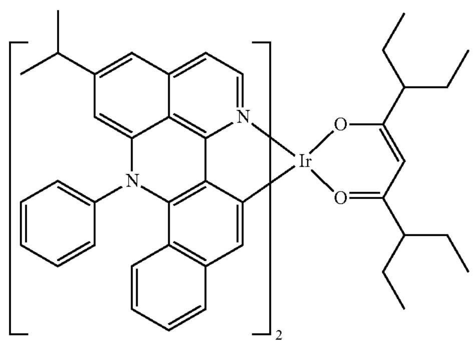
335
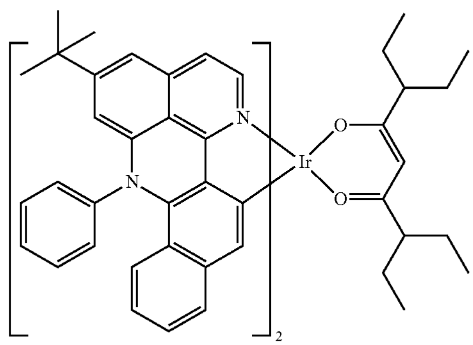
336
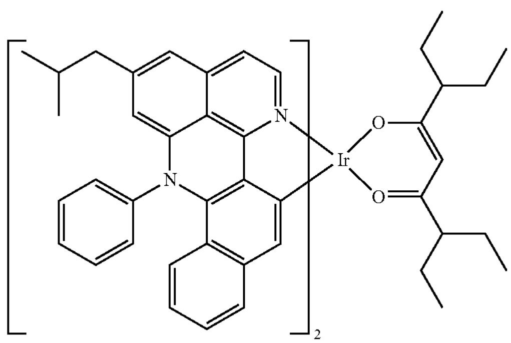
-continued
337
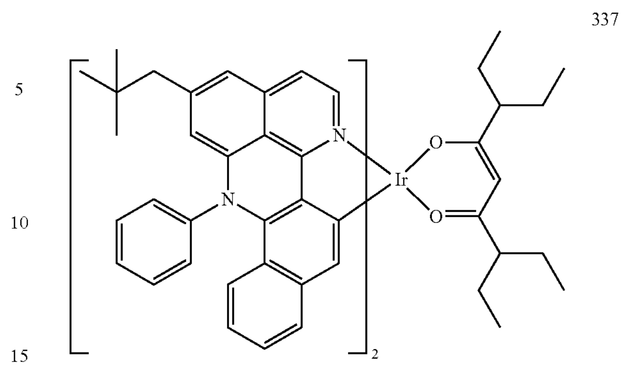
338
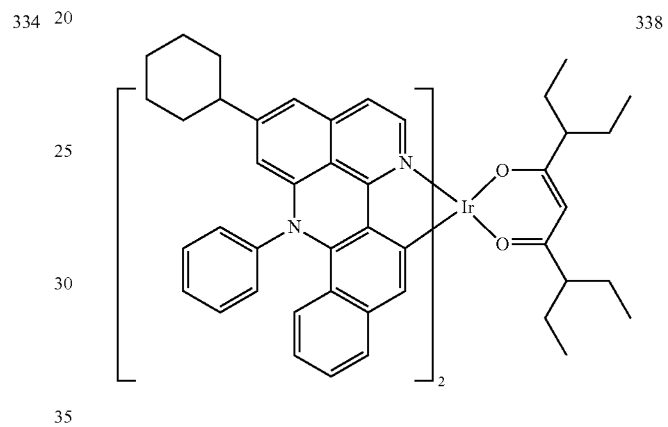
339
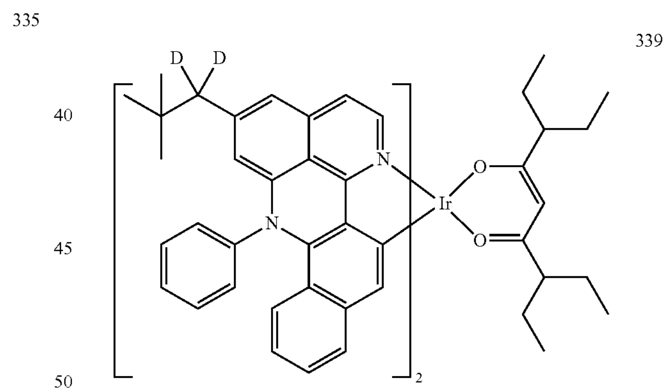
340
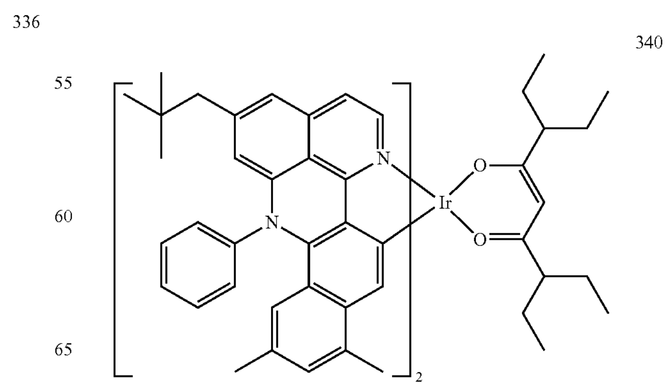

-continued
341
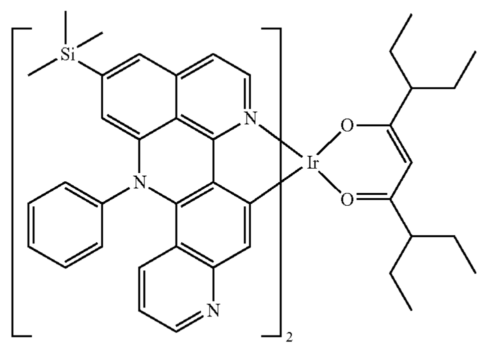
342
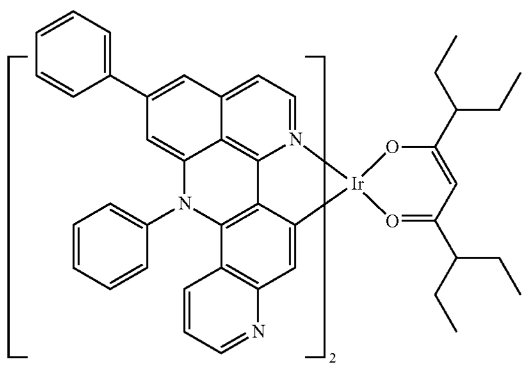
343
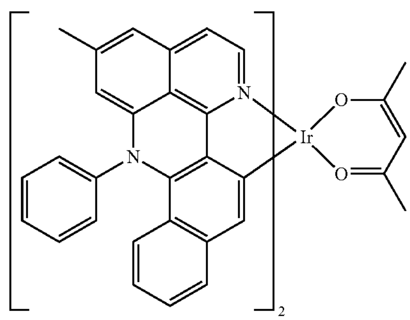
344
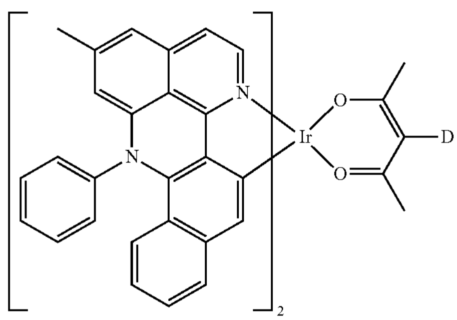
-continued
345
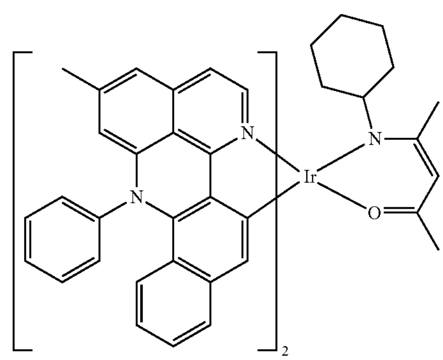
346
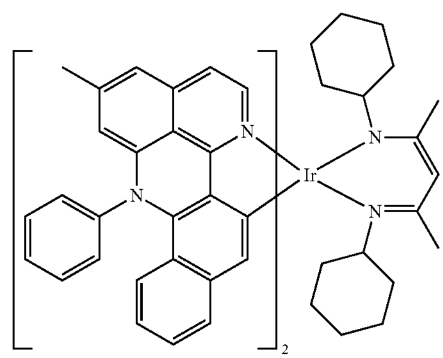
347
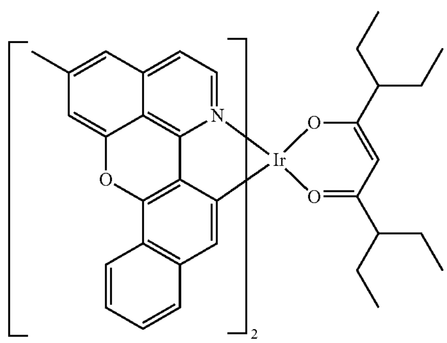
348
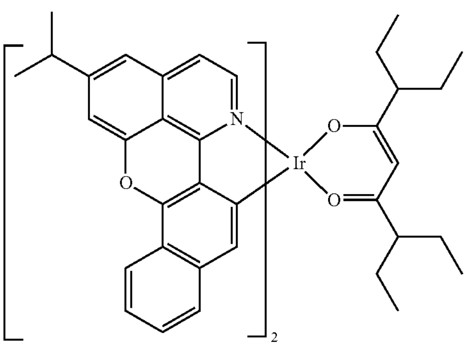

349
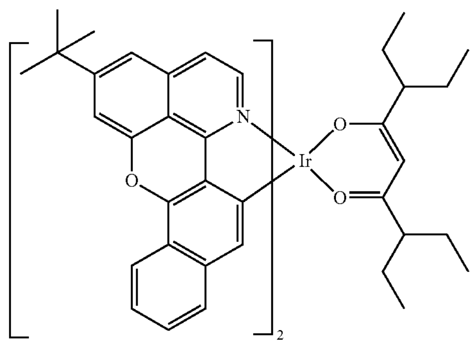
350
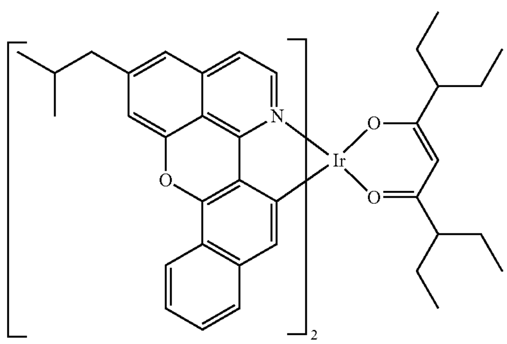
351
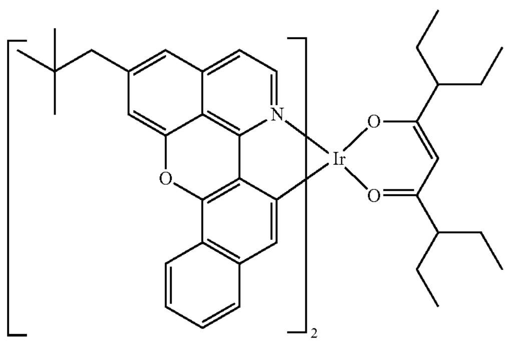
352
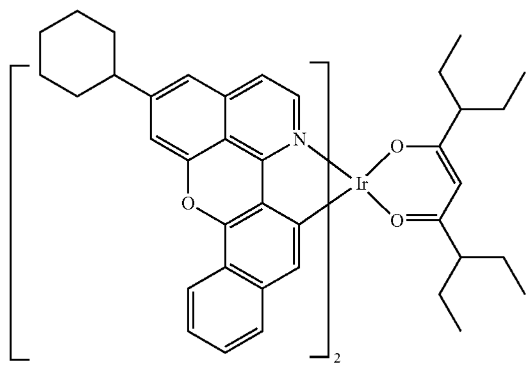
353
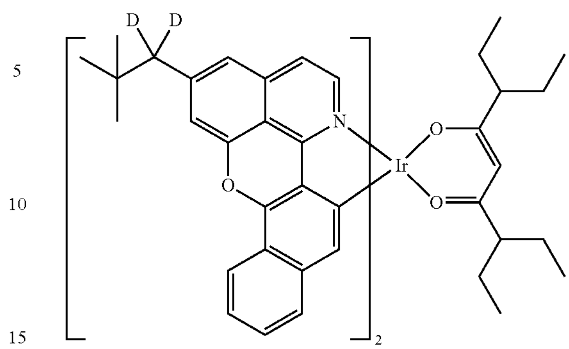
354
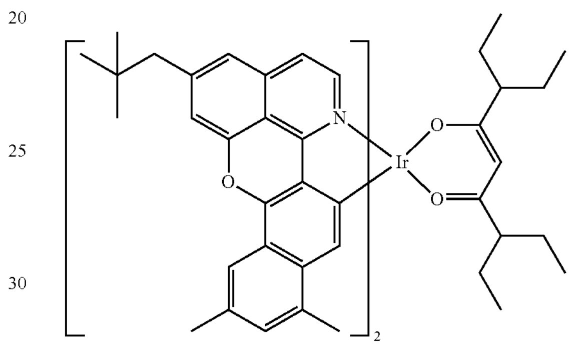
355
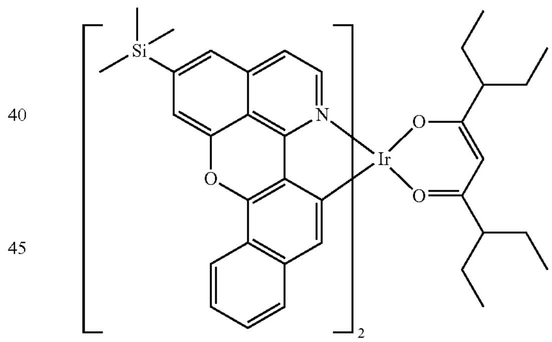
356
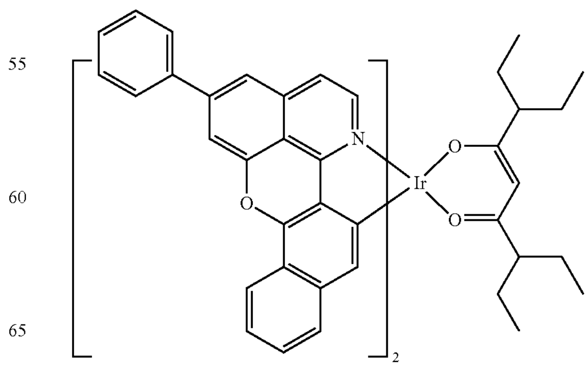

-continued
357
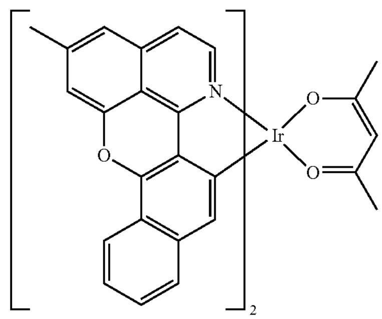
358
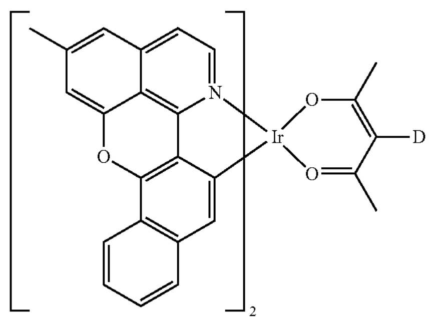
359
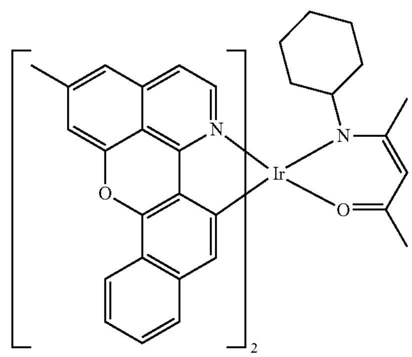
360
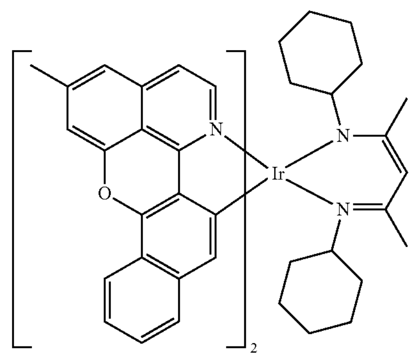
For example, the first compound 232 represented by Formula 1-10 can be one of the compounds in Formula 1-26.
[Formula 1-26]
361
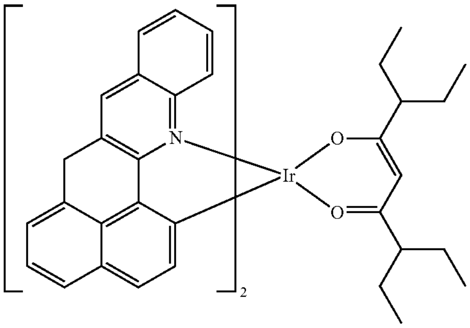
362
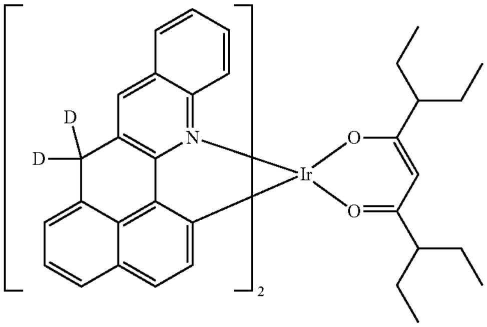
363
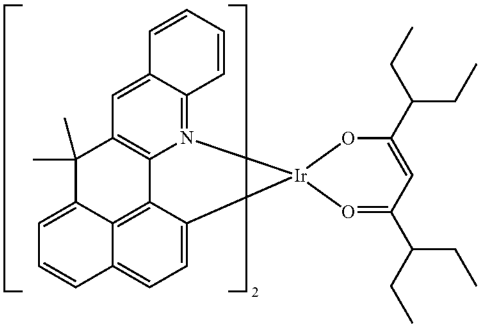
364
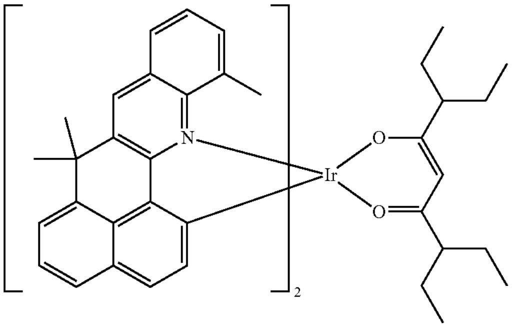

-continued
365
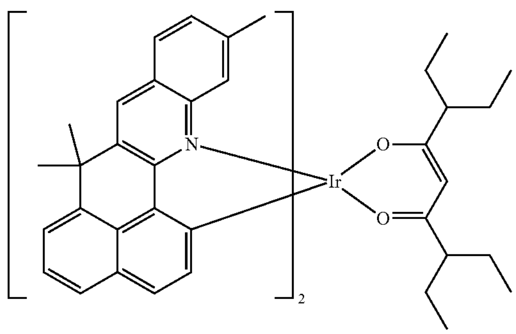
366
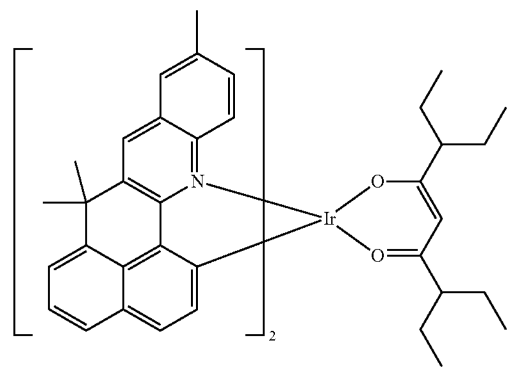
367
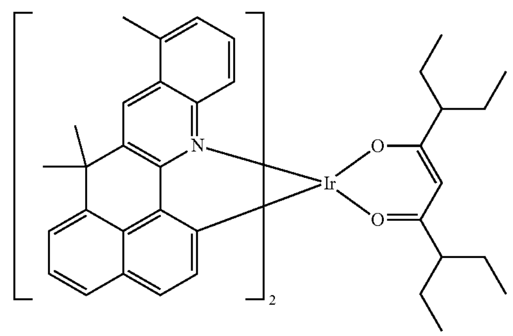
368
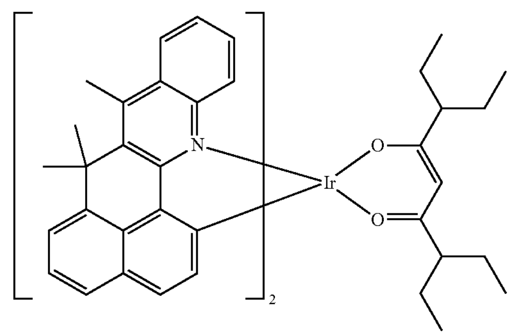
-continued
369
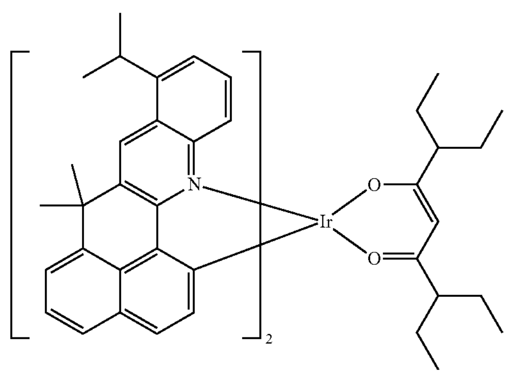
370
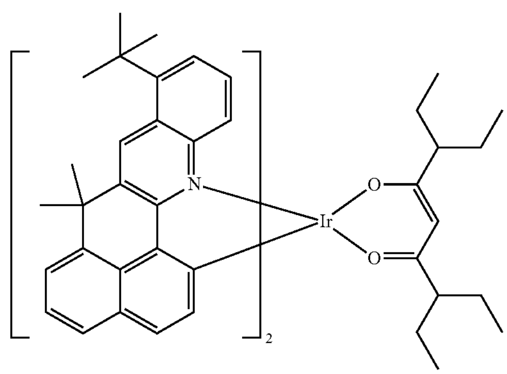
371
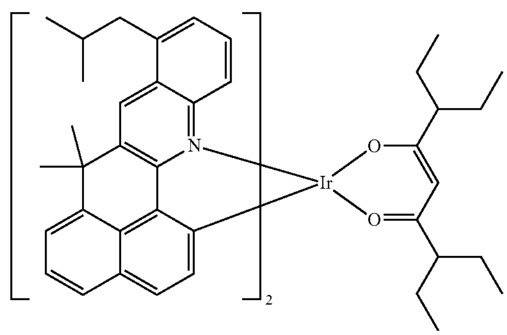
372
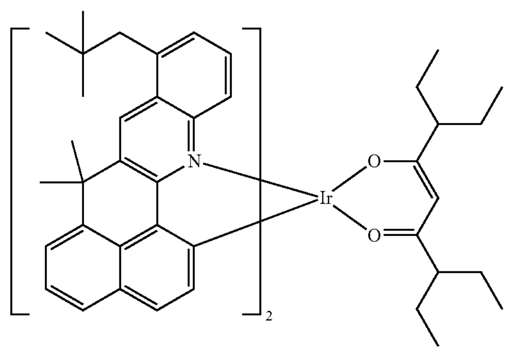

373
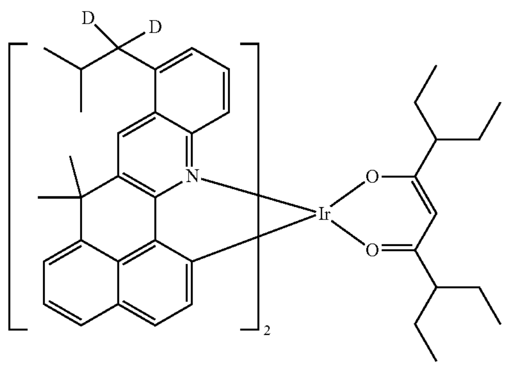
374
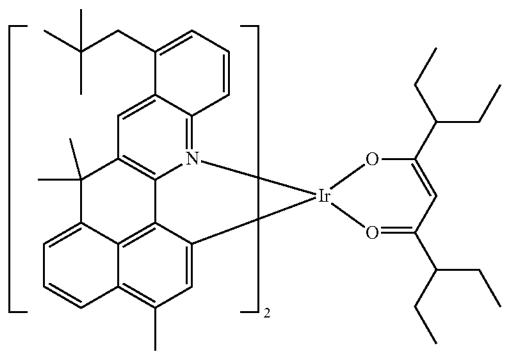
375
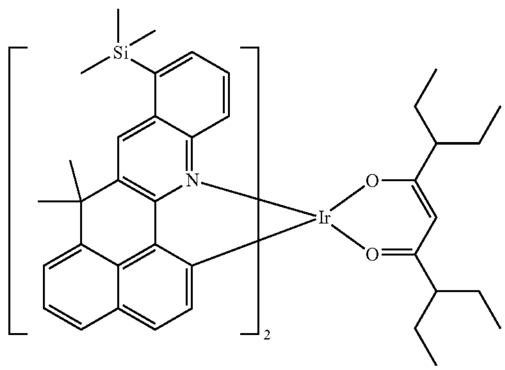
376
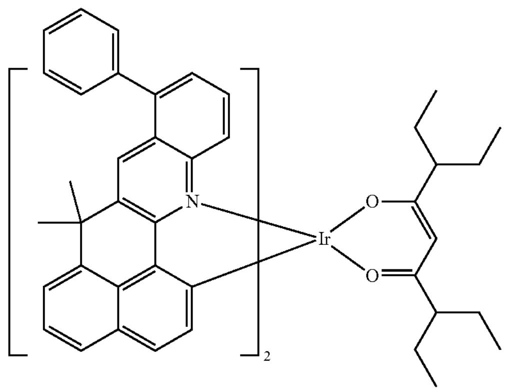
377
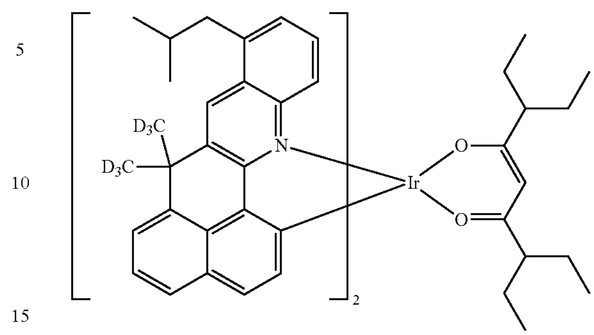
378
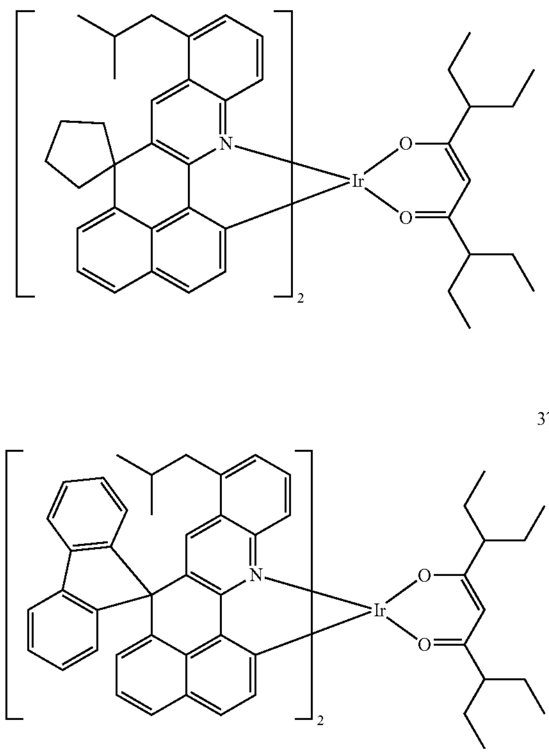
379
380
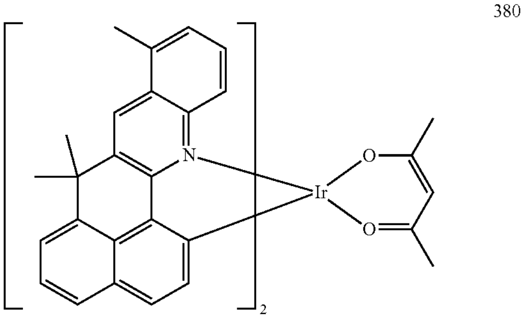

-continued
381
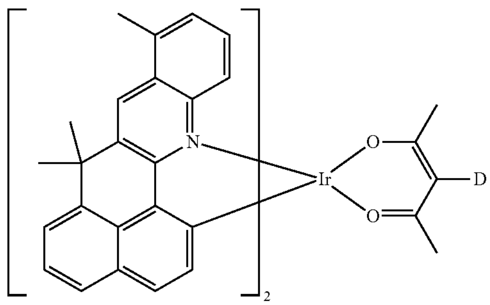
382
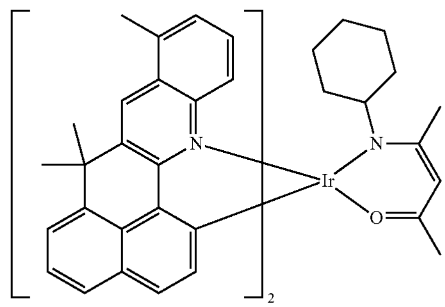
383
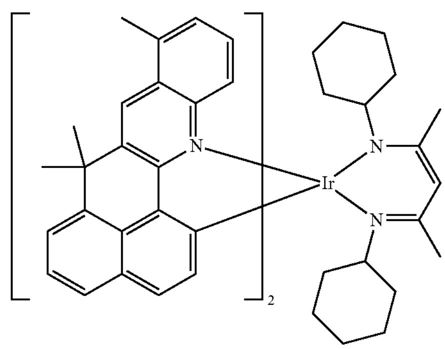
384
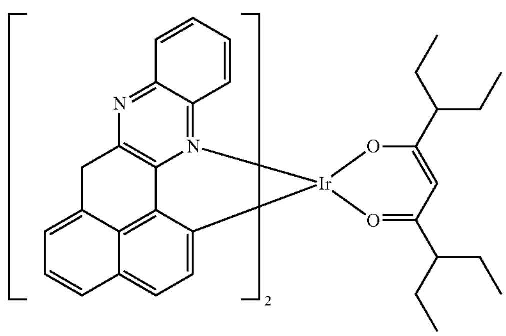
-continued
385
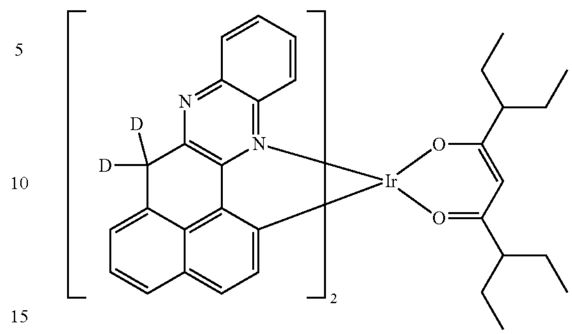
386
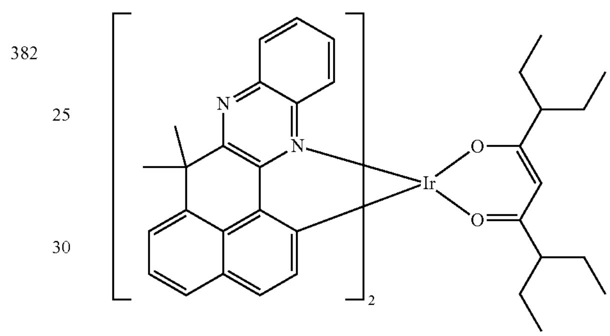
387
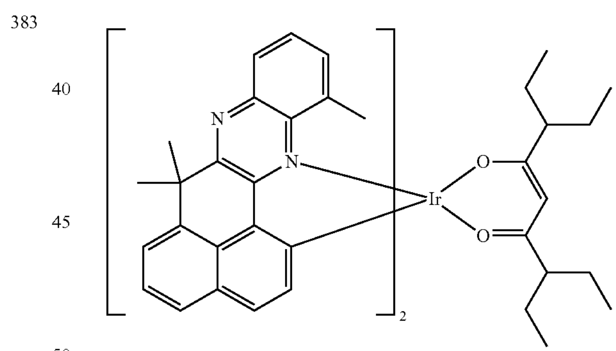
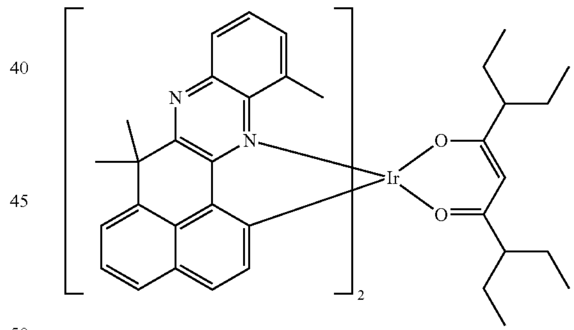
388
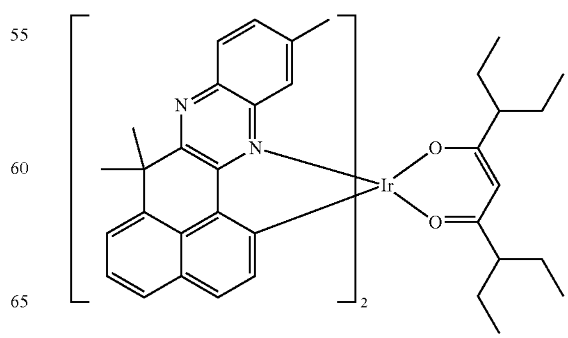

-continued
389
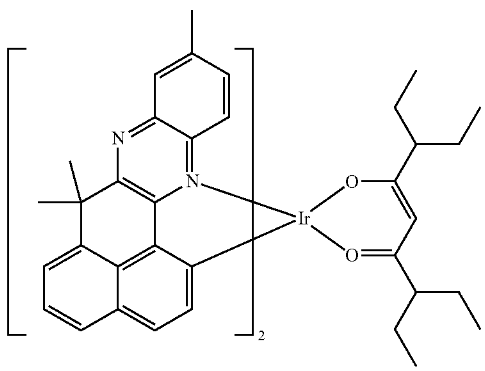
390
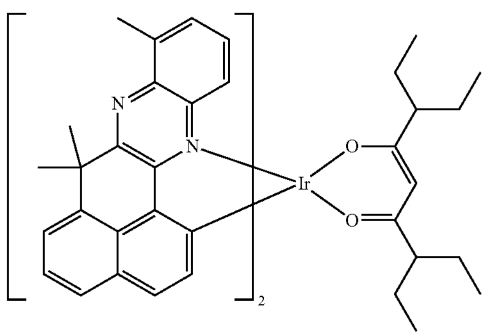
391
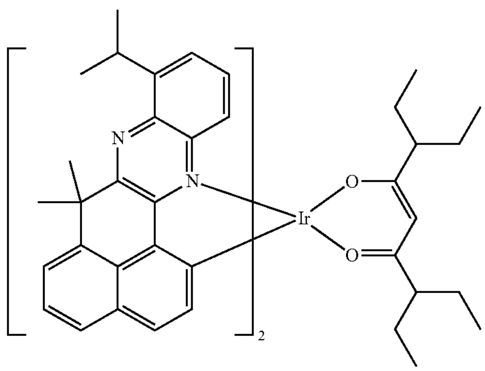
392
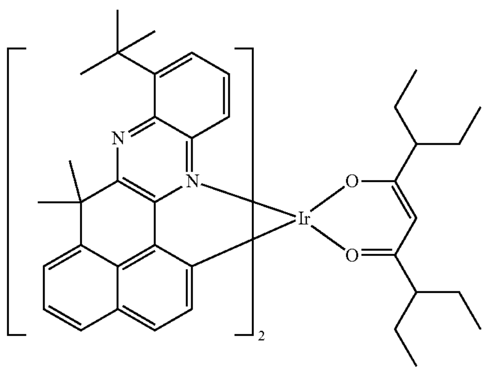
-continued
393
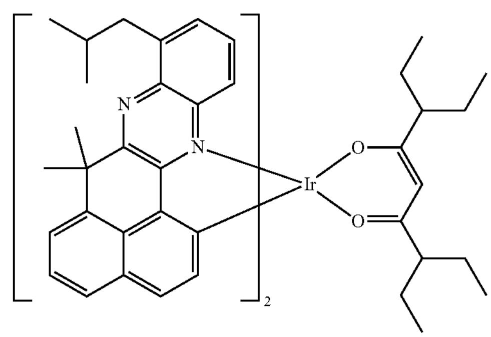
394
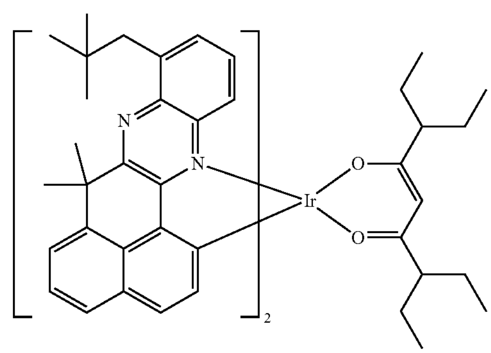
395
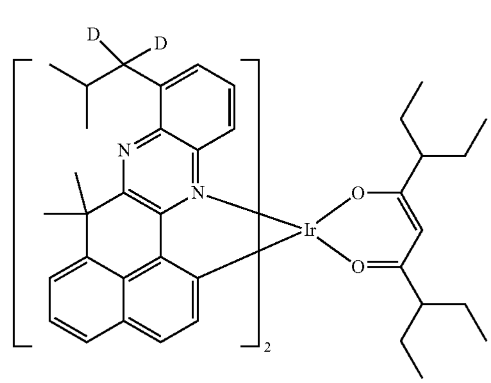
396
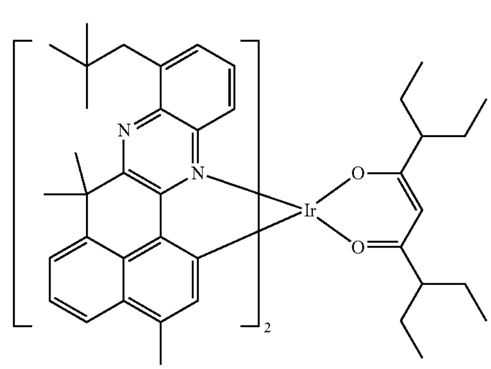

-continued
397
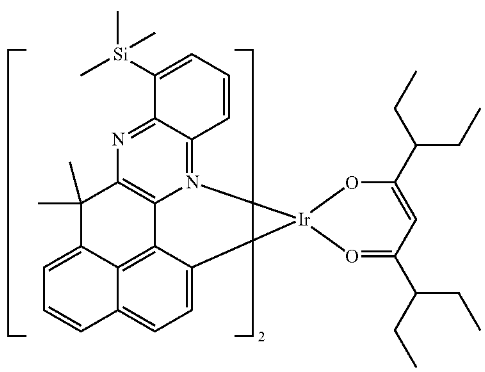
398
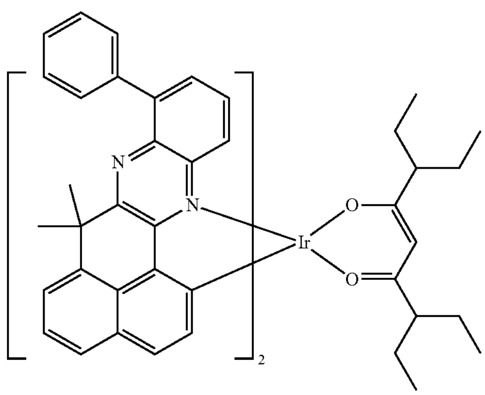
399
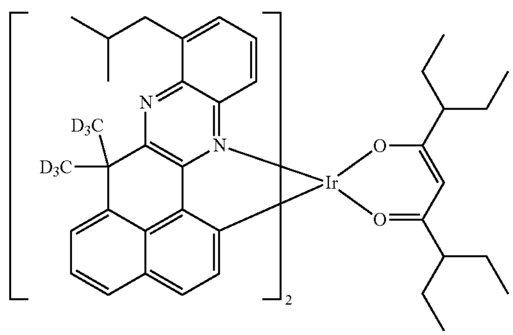
400
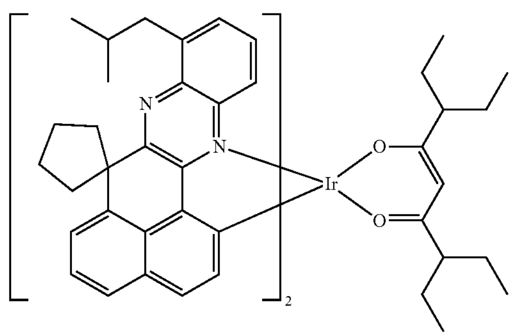
-continued
401
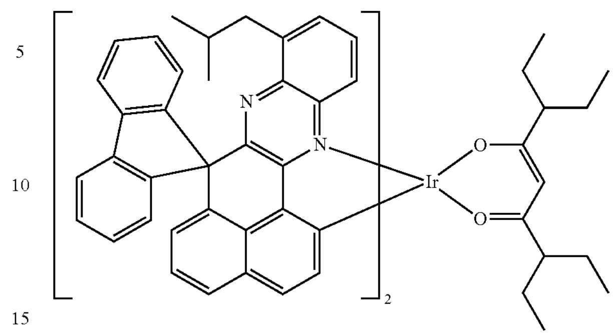
402
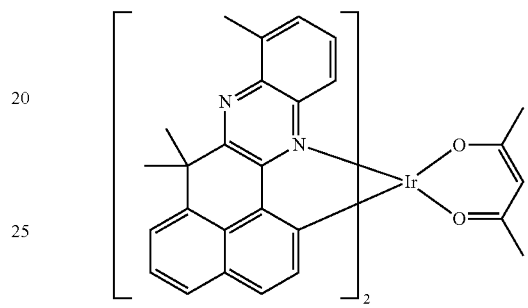
403
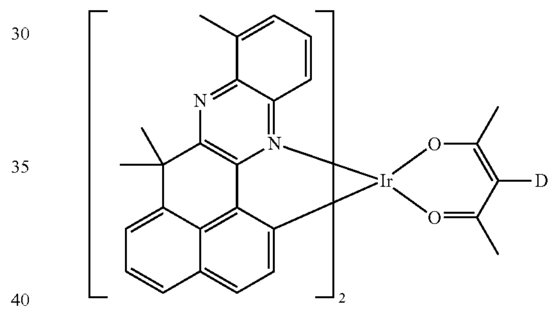
404
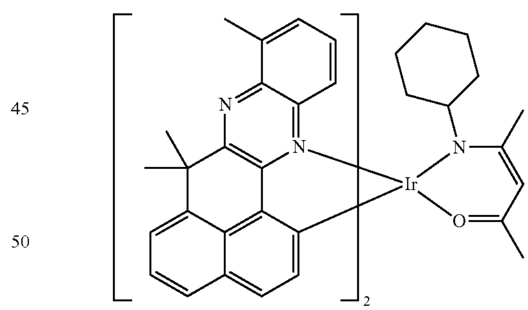
405
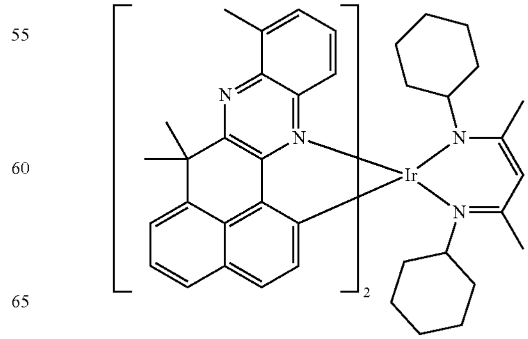

-continued
406
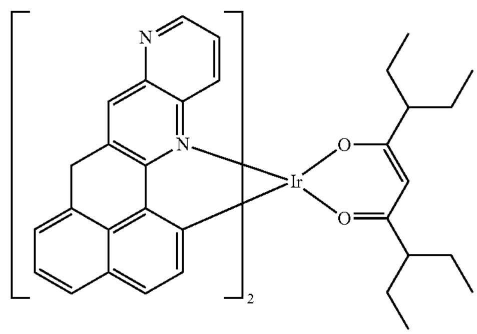
407
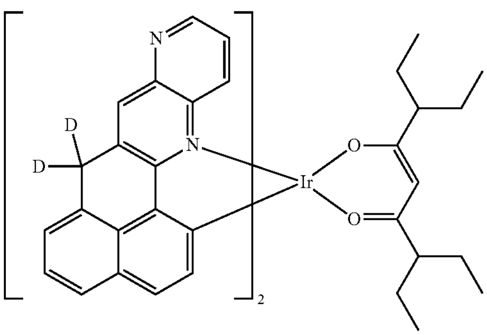
408
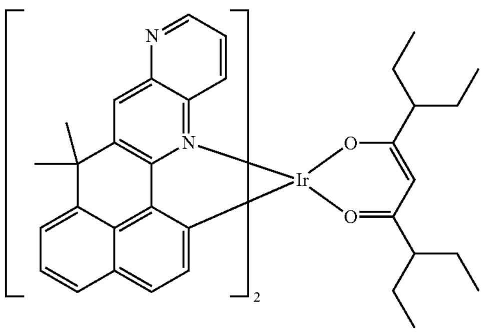
409
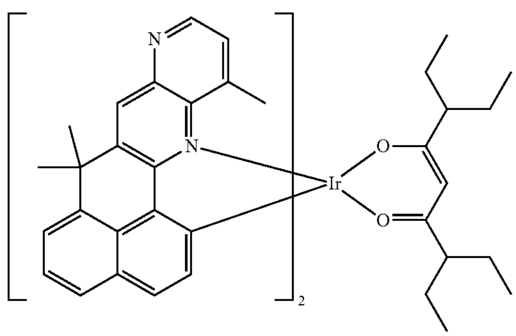
-continued
410
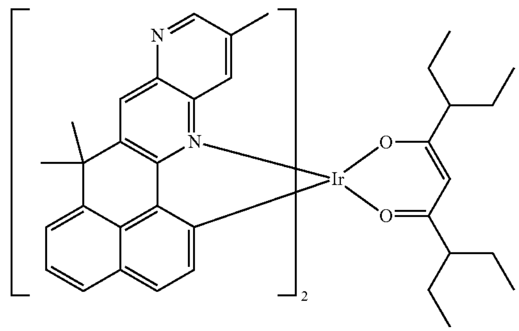
411
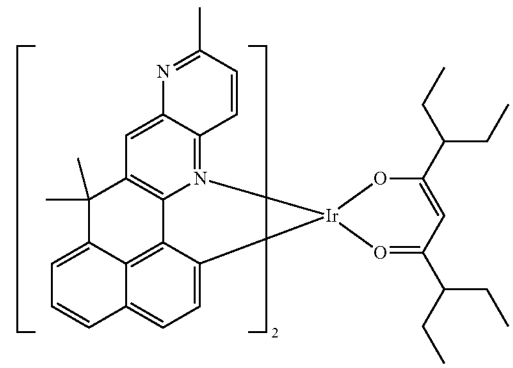
412
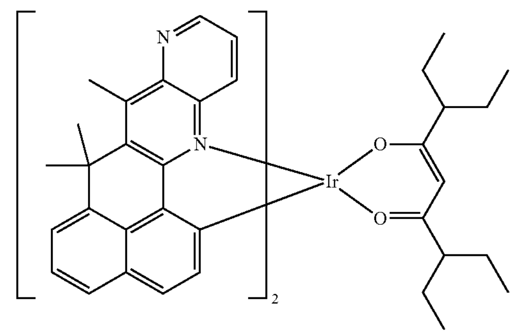
413
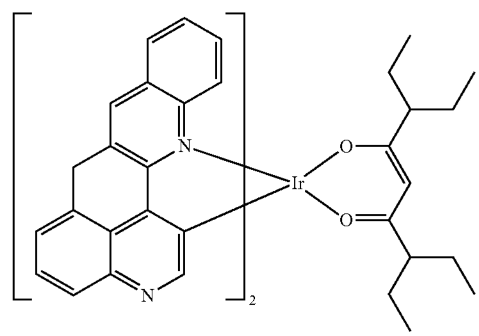

-continued
414
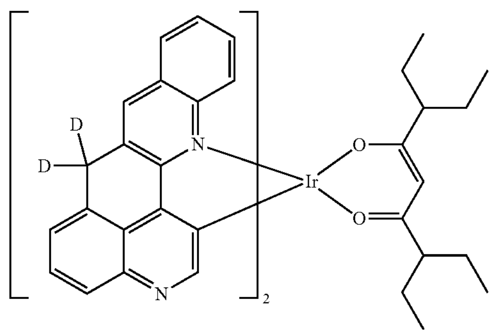
415
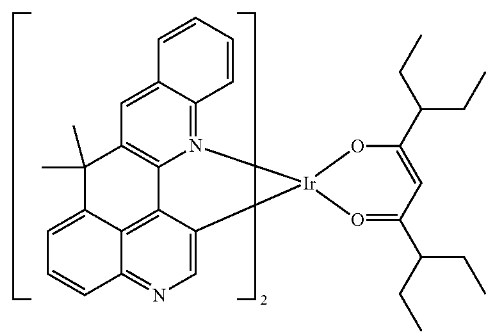
416
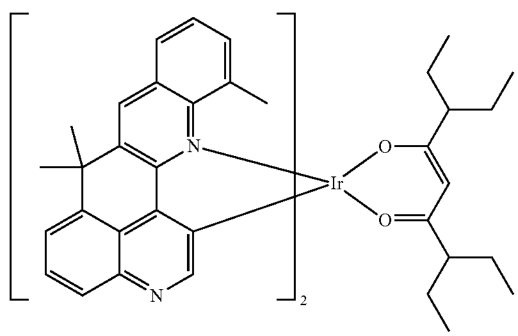
417
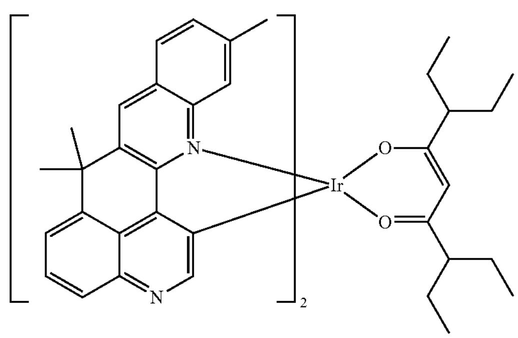
-continued
418
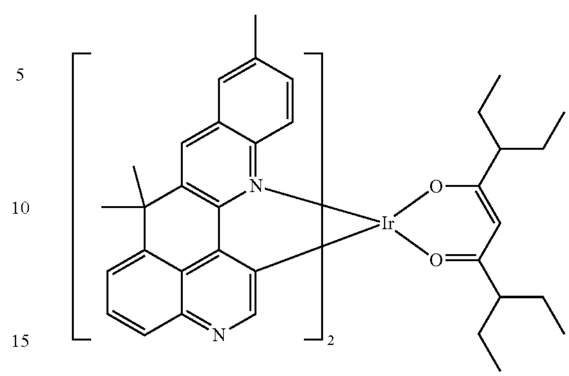
419
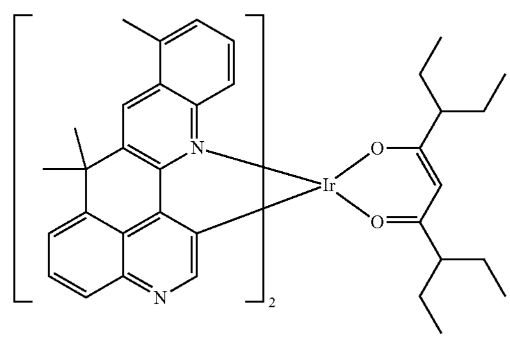
420
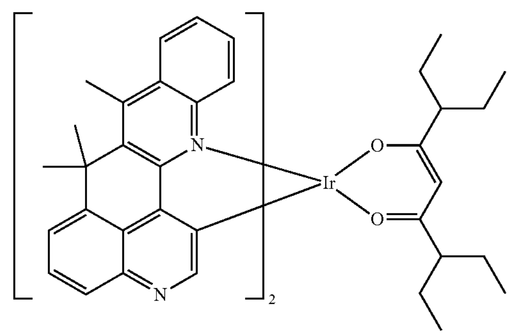
421
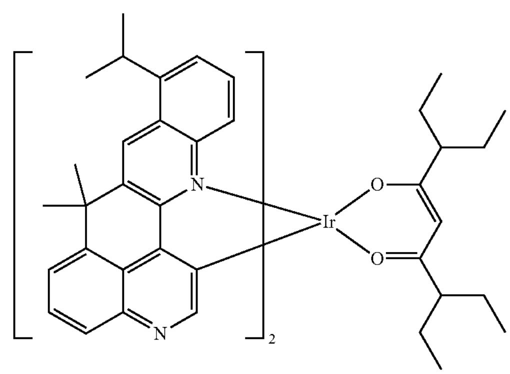

-continued
422
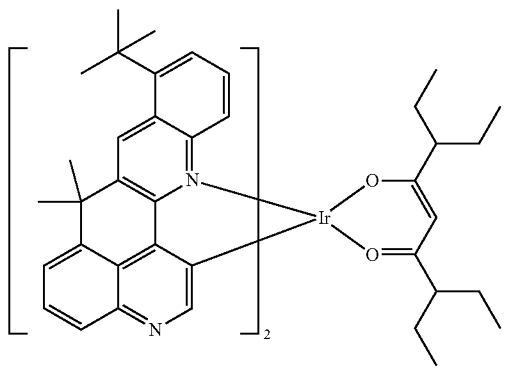
423
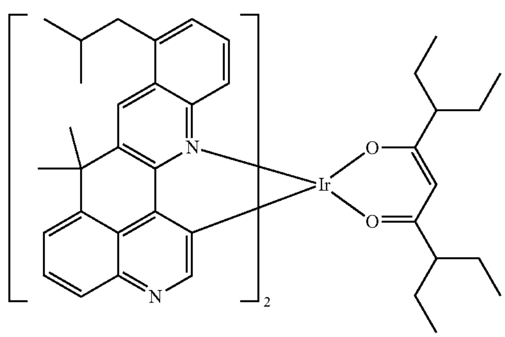
424
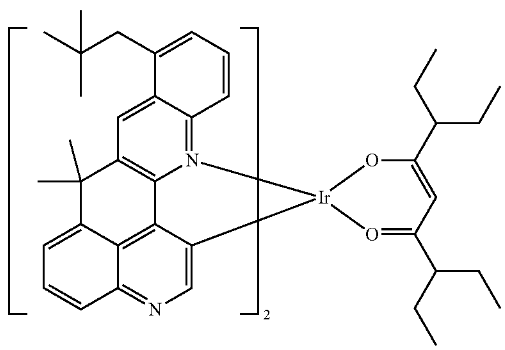
425
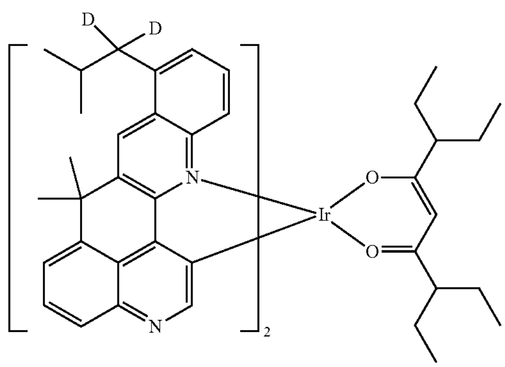
-continued
426
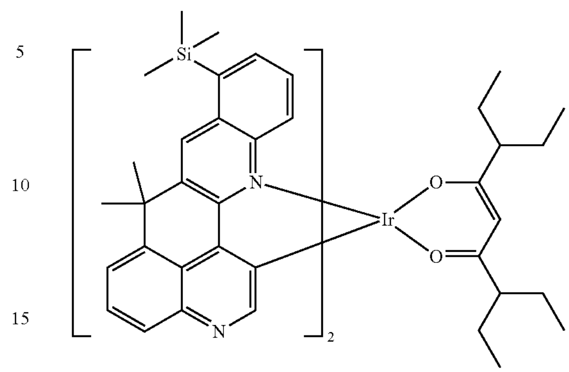
427
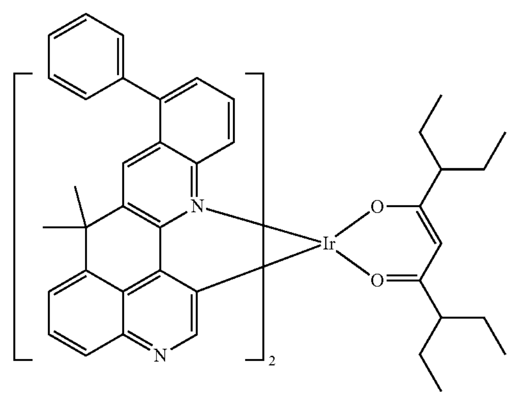
428
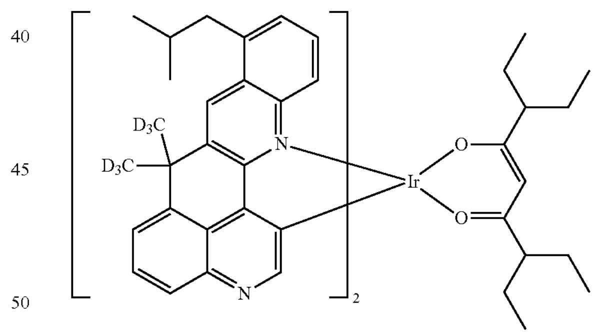
429
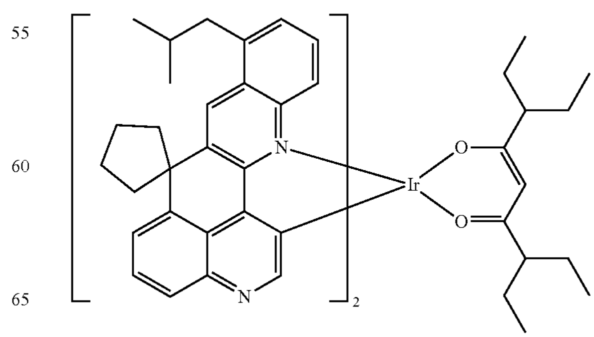

-continued
430
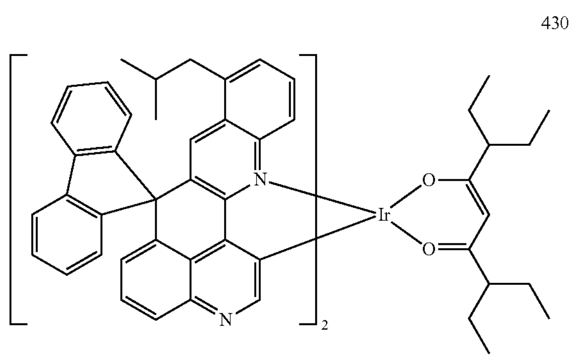
431
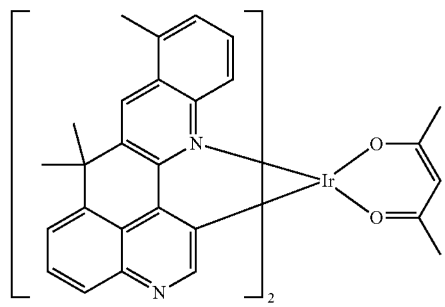
432
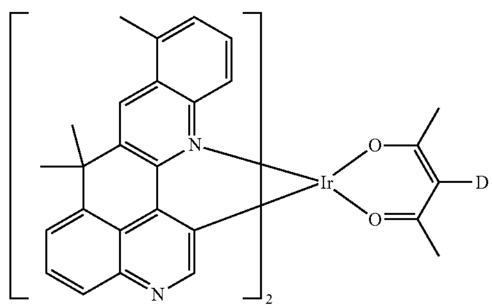
433
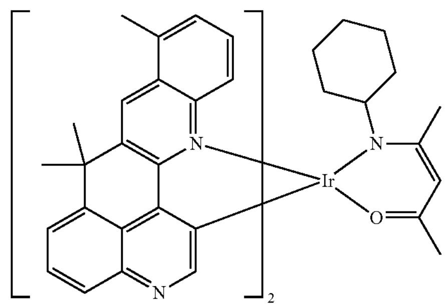
434
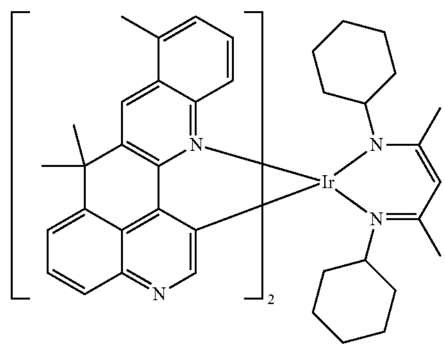
-continued
435
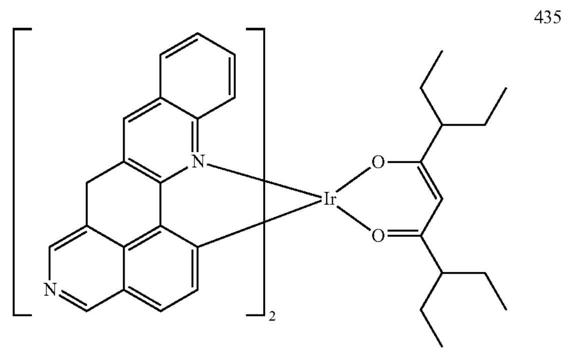
436
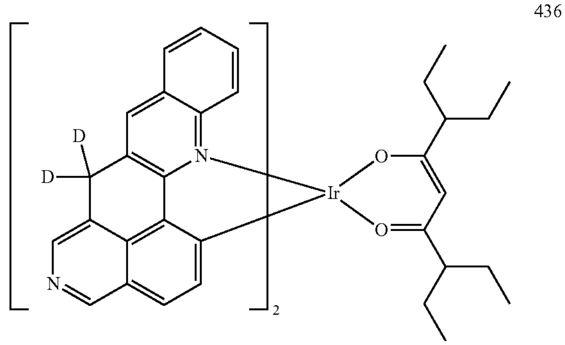
437
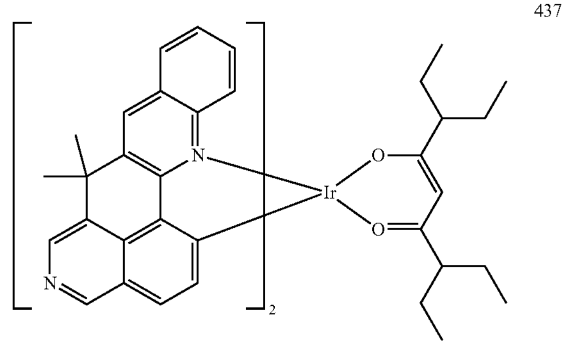
438
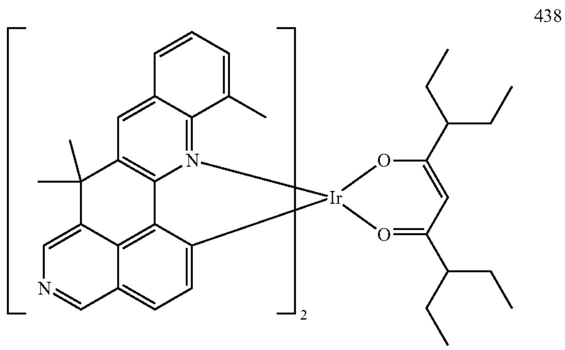

-continued
439
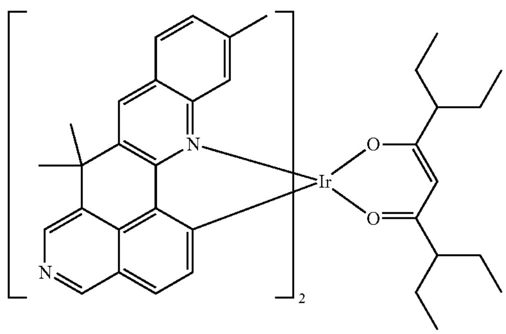
440
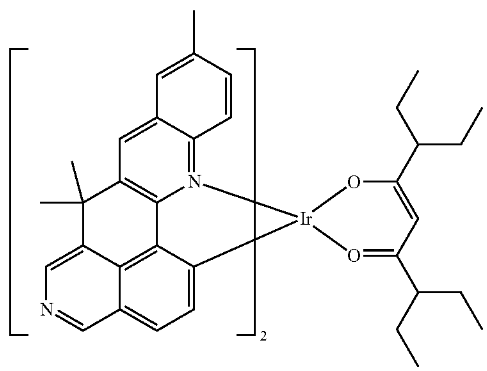
441
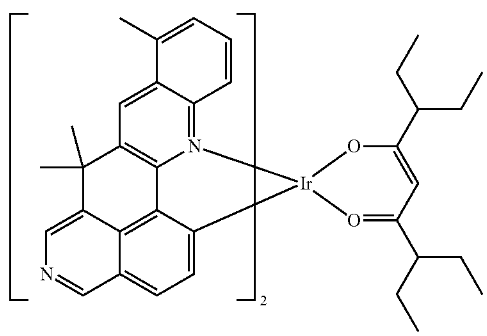
442
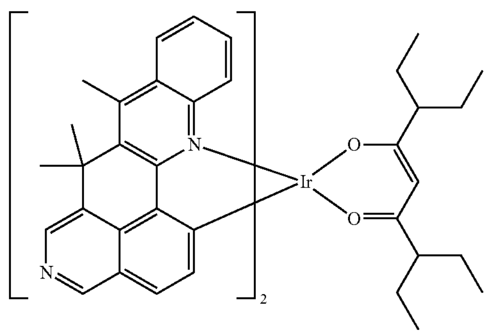
-continued
443
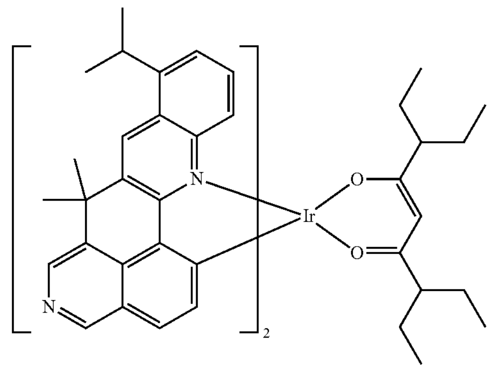
444
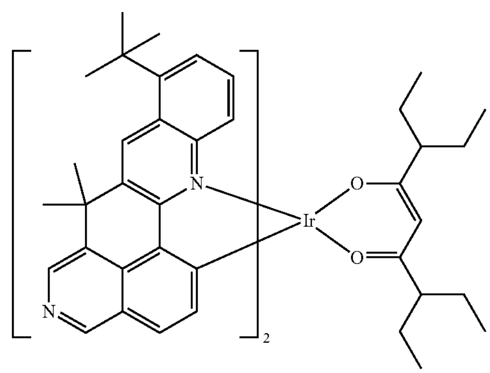
445
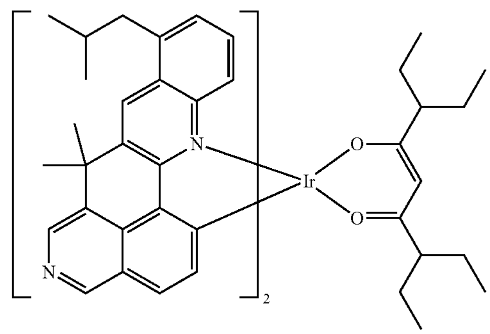
446
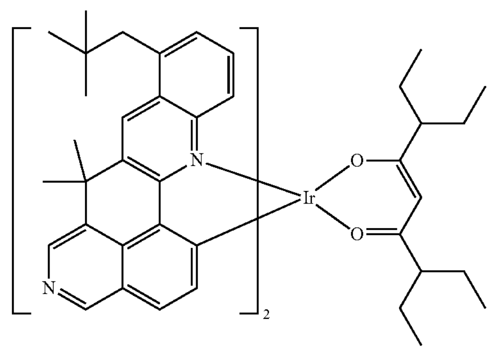

-continued
447
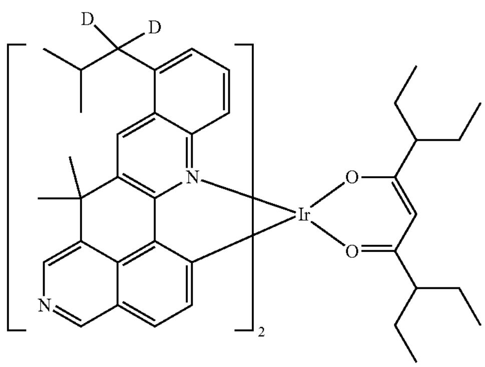
448
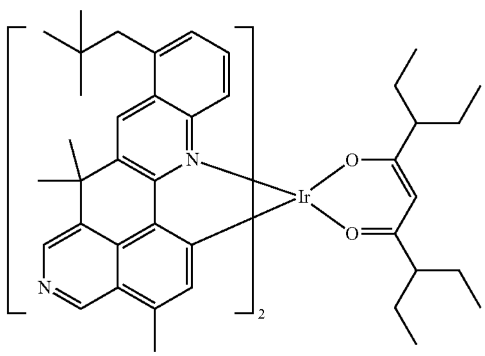
449
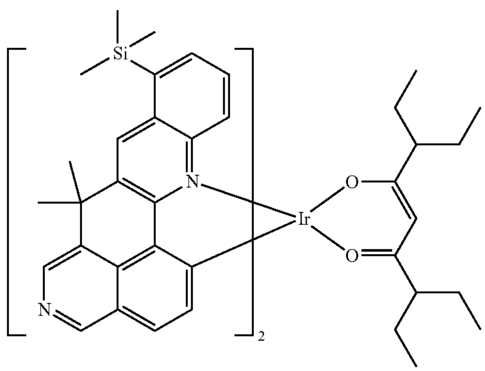
450
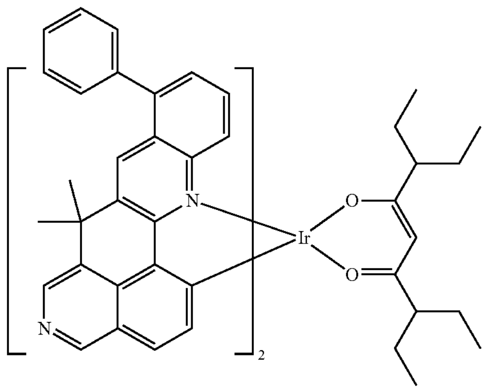
-continued
451
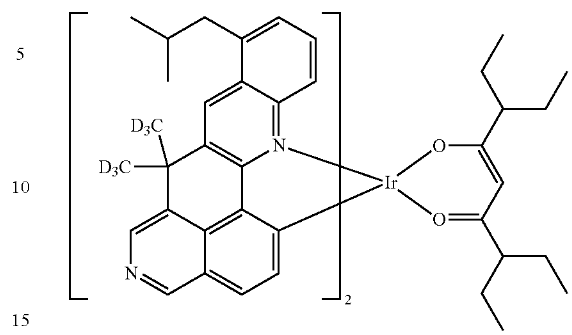
452
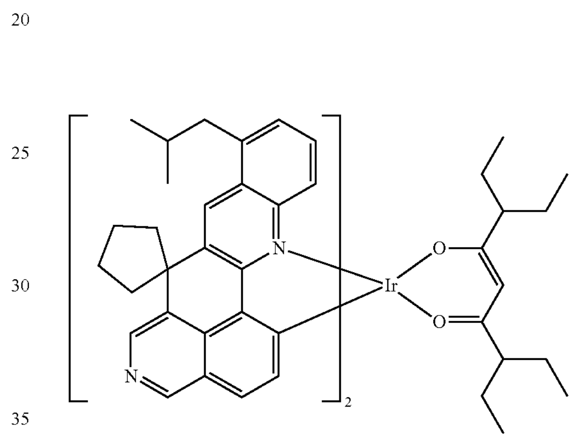
453
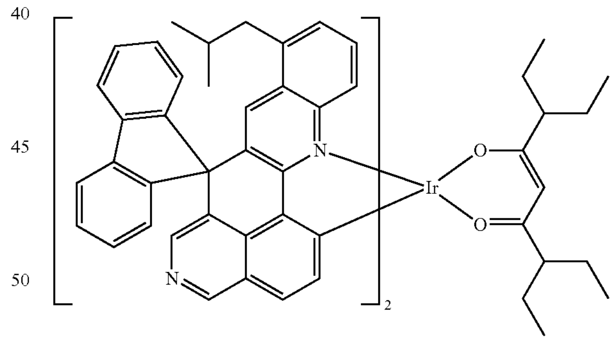
454
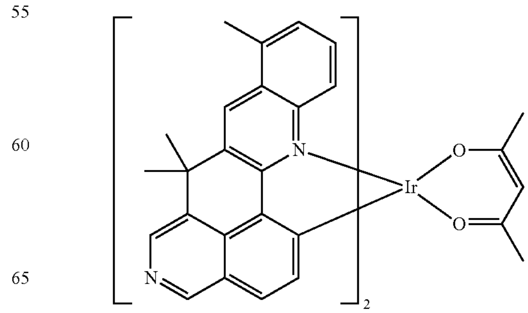

-continued
455
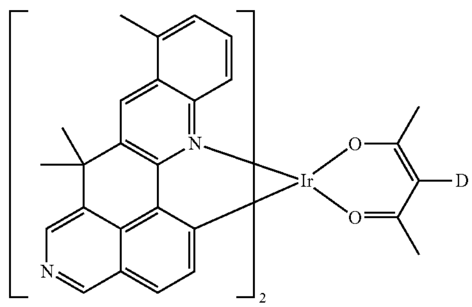
456
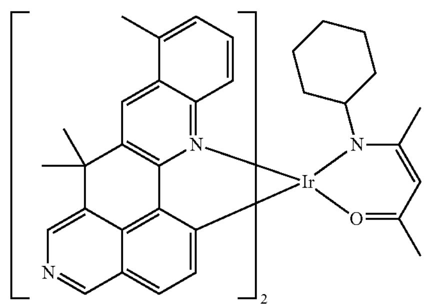
457
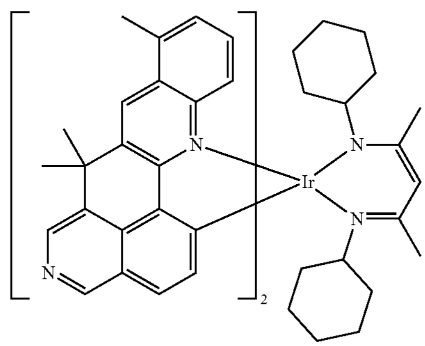
458
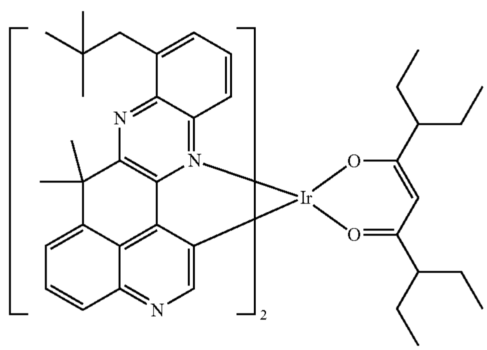
-continued
459
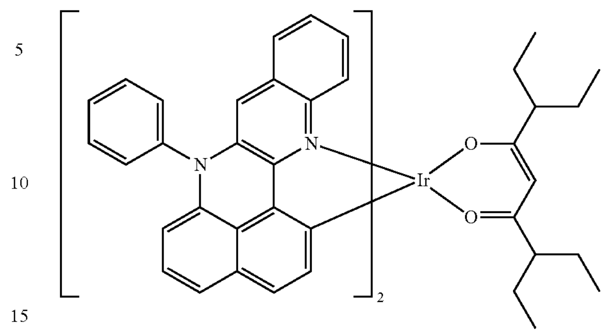
460
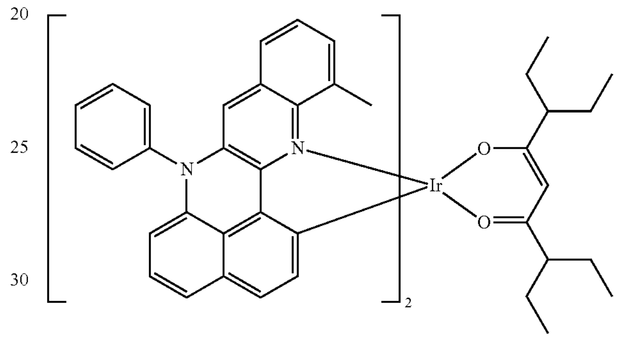
461
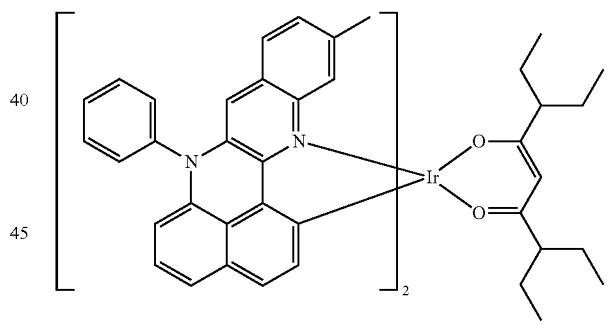
462
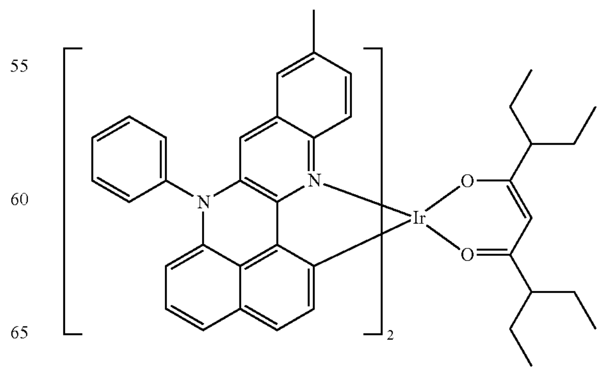

-continued
463
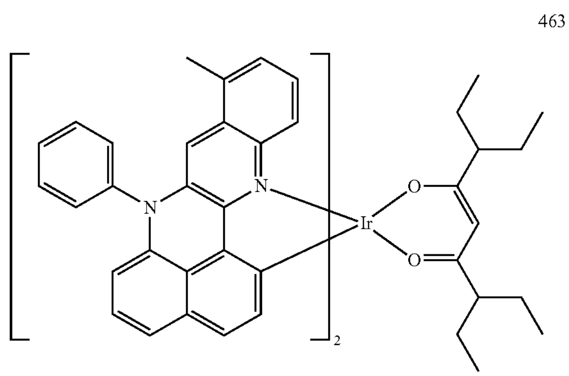
464
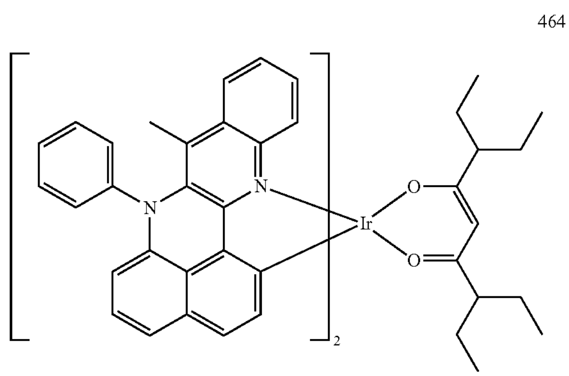
465
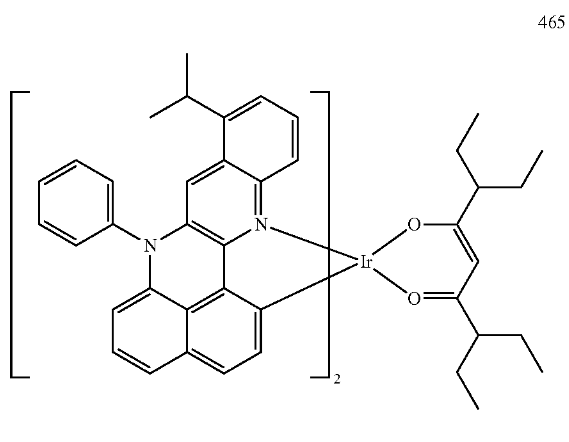
466
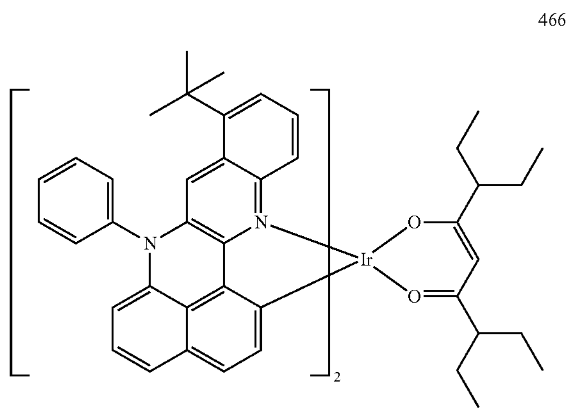
-continued
467
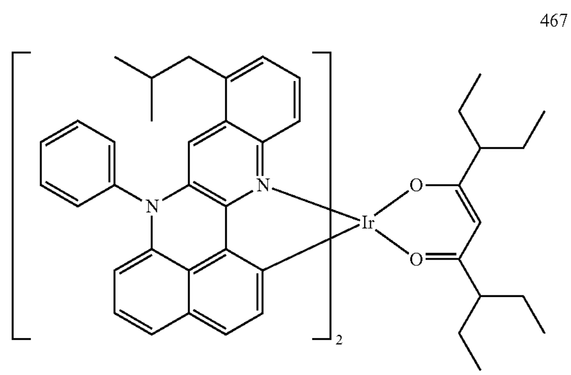
468
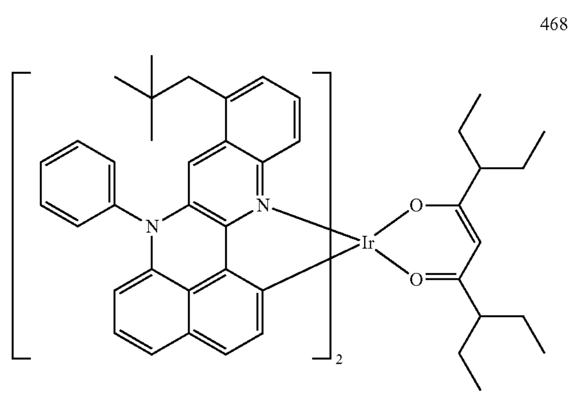
469
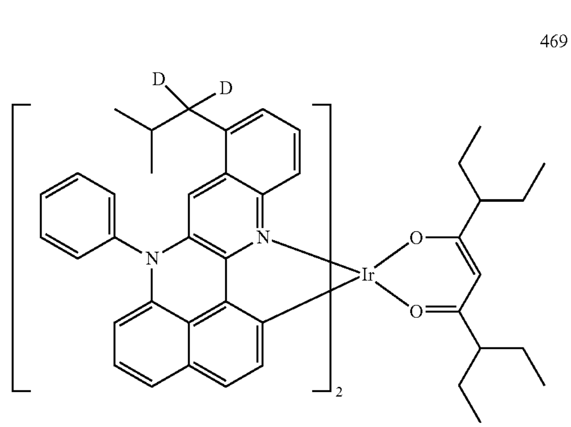
470
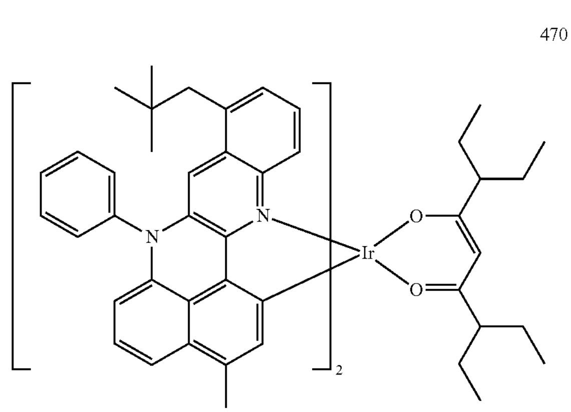

471
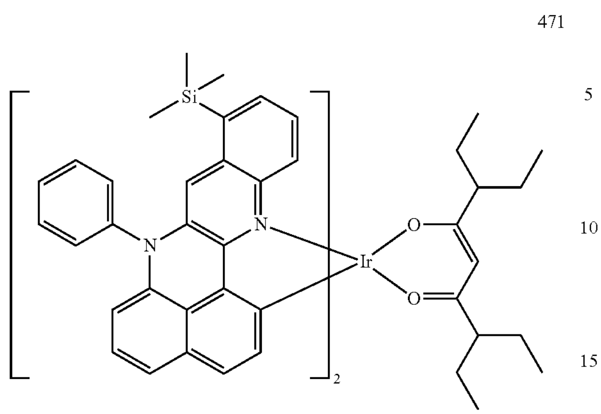
472
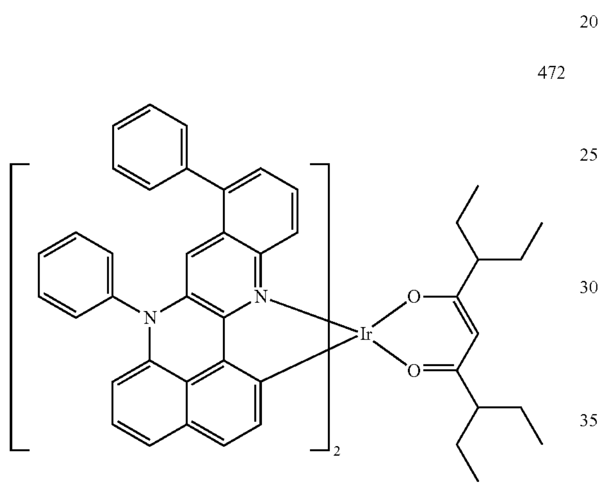
473
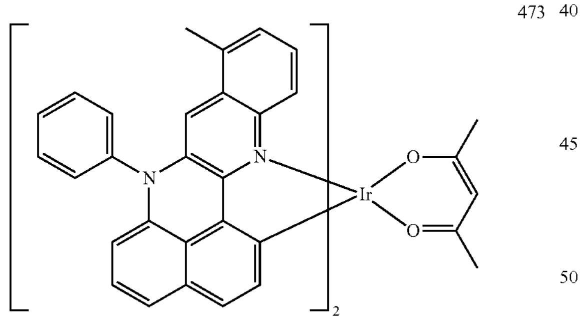
474
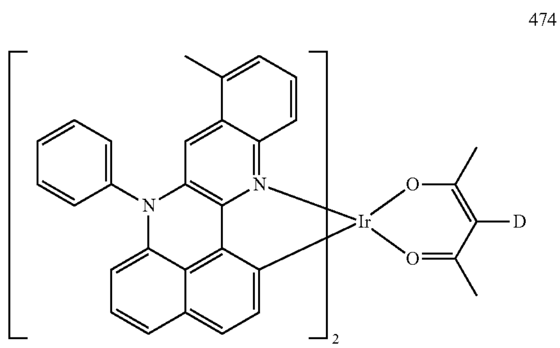
475
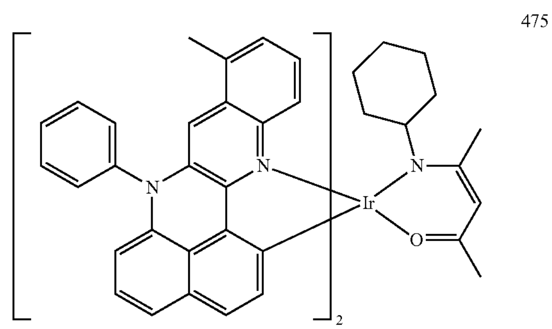
476
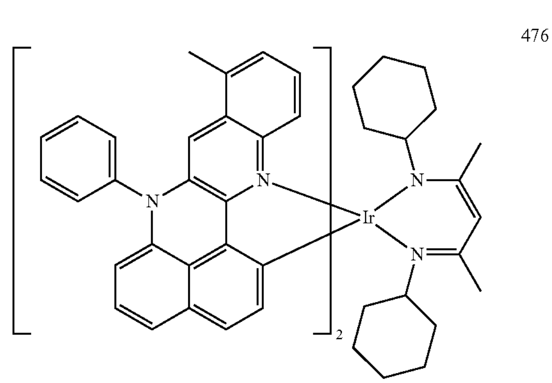
477
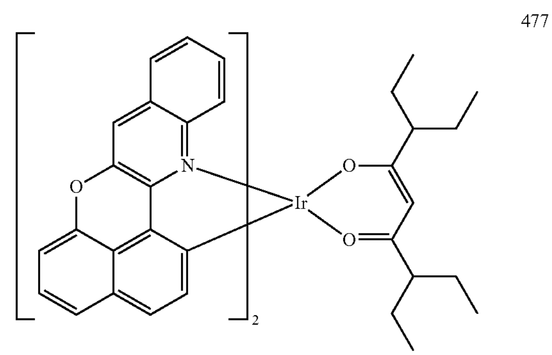
478
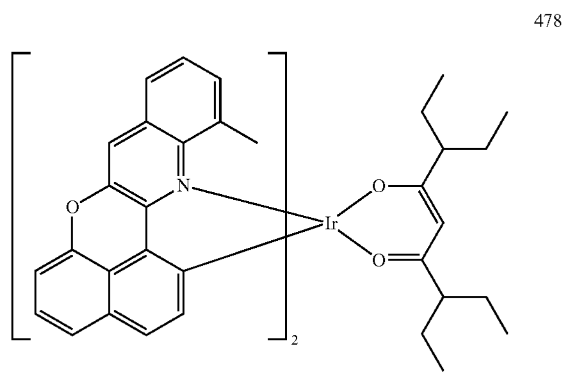

-continued
479
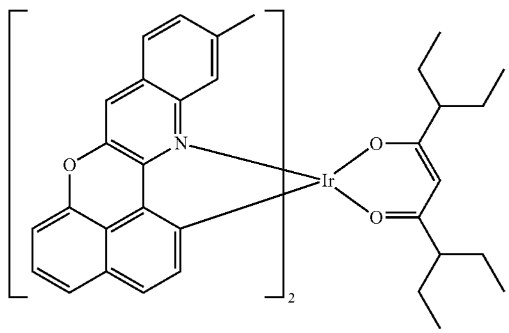
480
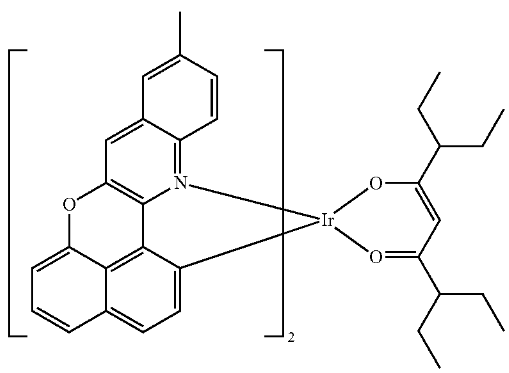
481
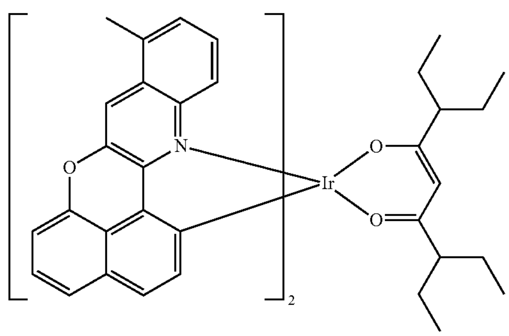
482
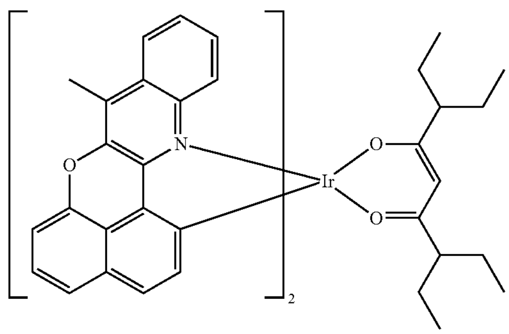
-continued
483
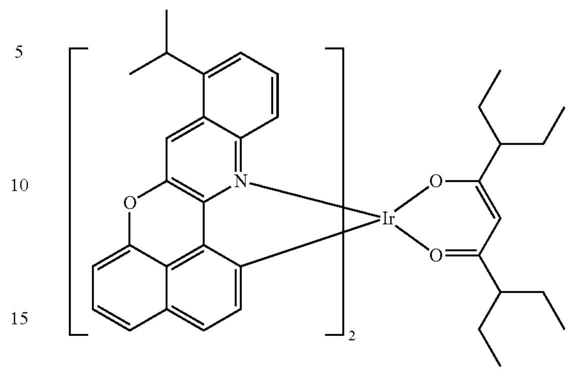
484
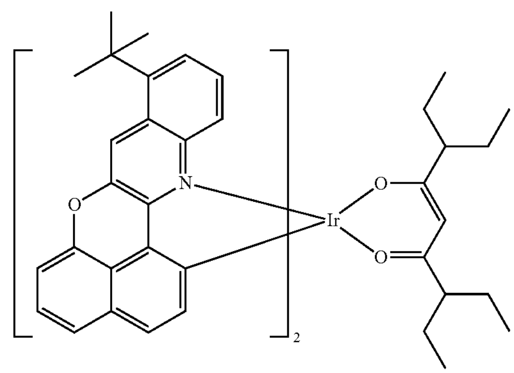
485
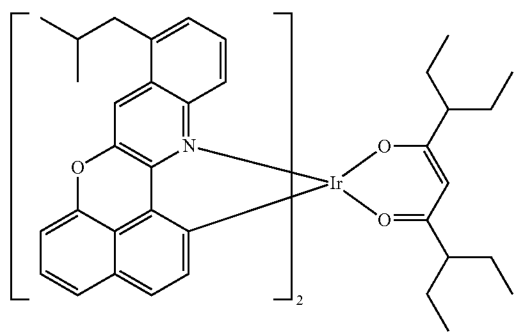
486
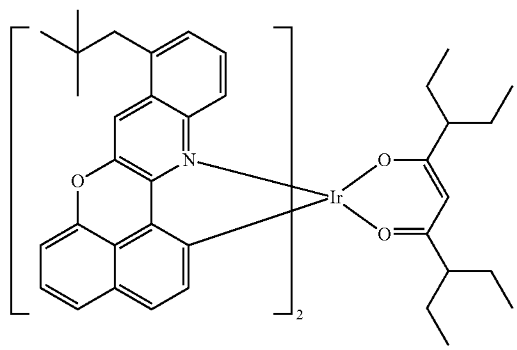

-continued
487
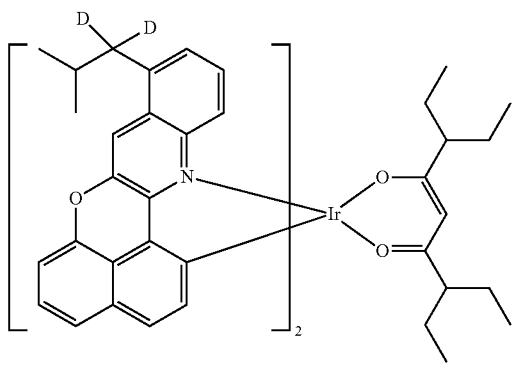
488
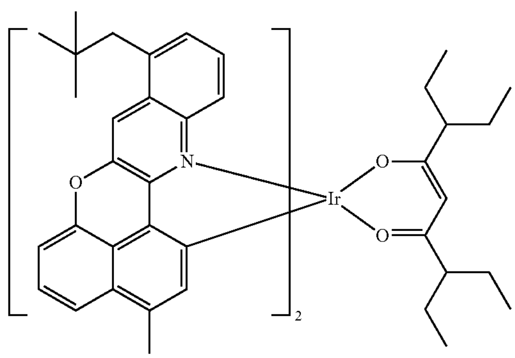
489
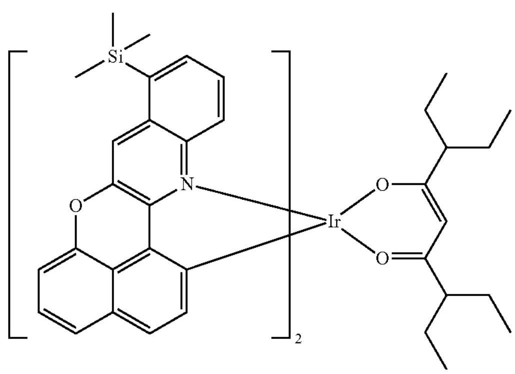
490
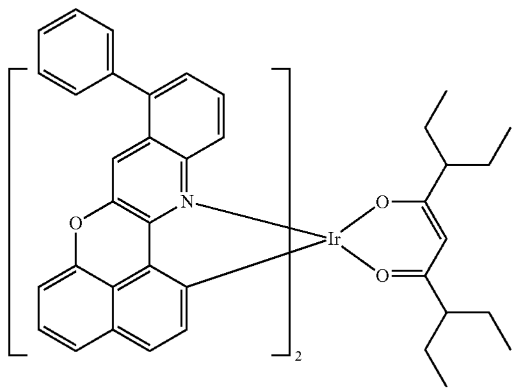
-continued
491
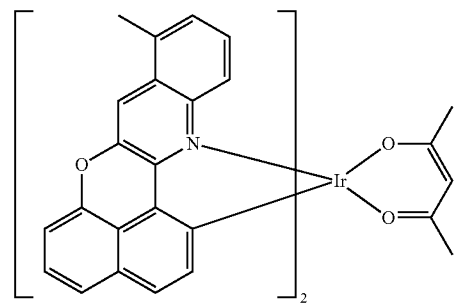
492
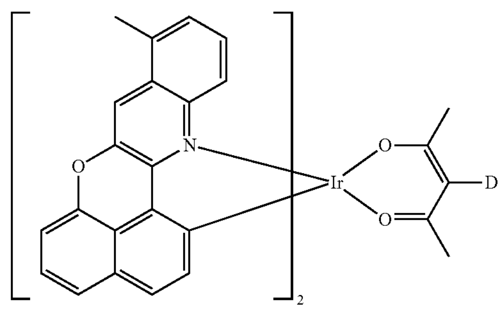
493
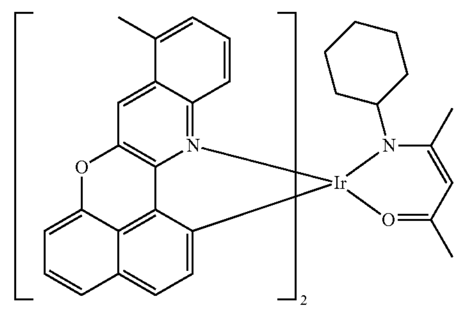
494
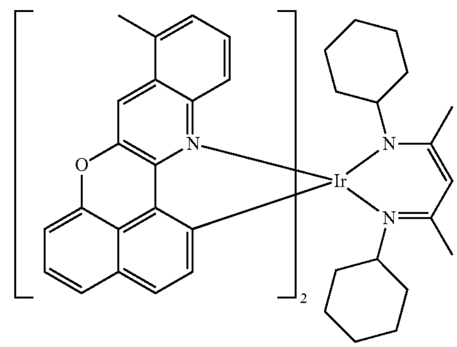
When Y4 in Formula 1-11 is an unsubstituted or substituted carbon atom, i.e., $CH_2$ or $CR^2R^3$, the first compound 232 can be one of the compounds in Formula 1-27.

-continued
[Formula 1-27]
495
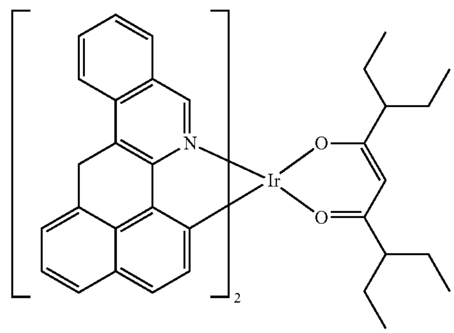
496
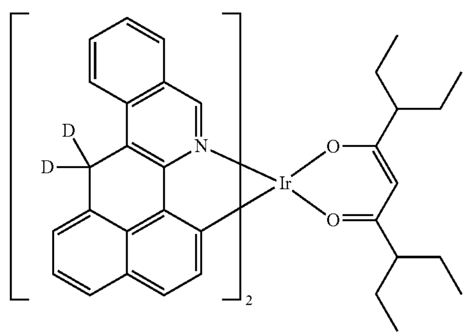
497
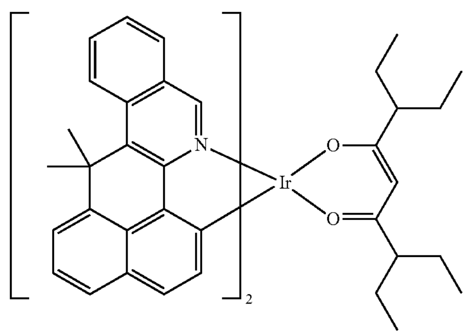
498
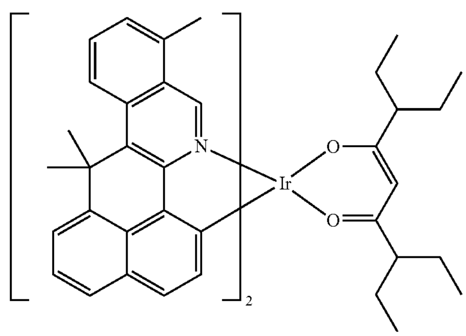
499
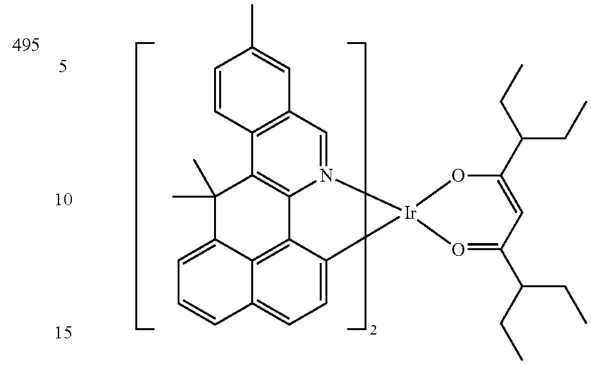
500
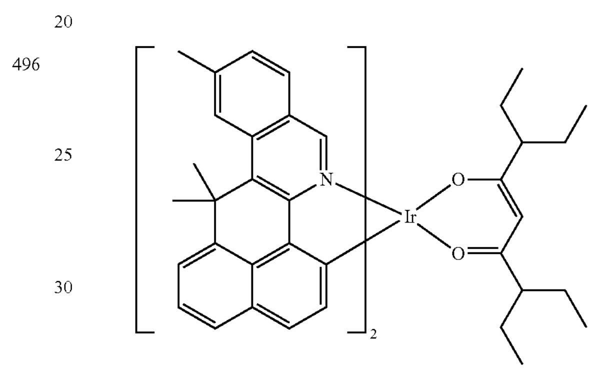
501
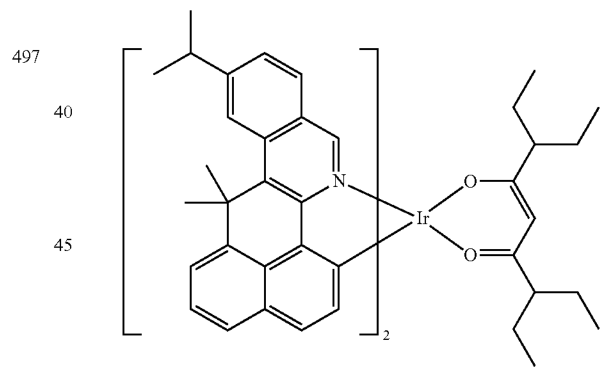
502
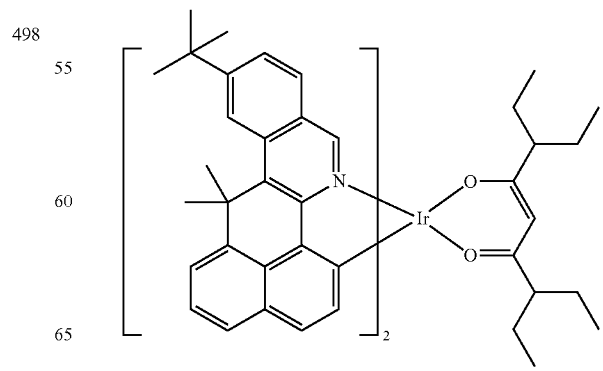

-continued
503
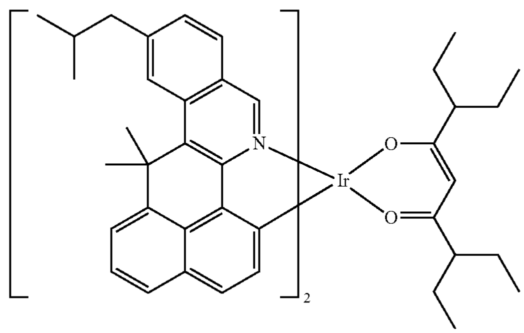
504
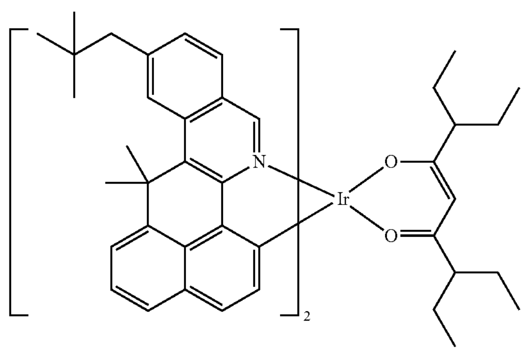
505
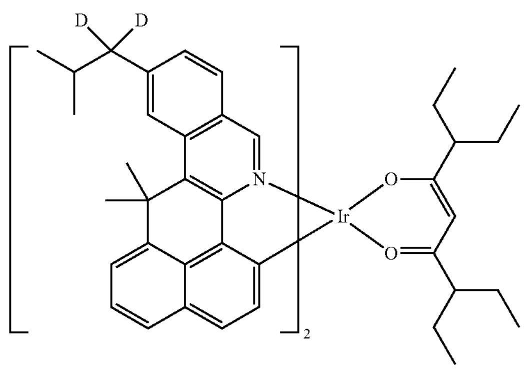
506
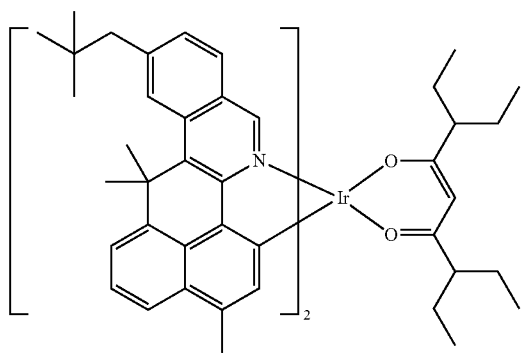
-continued
507
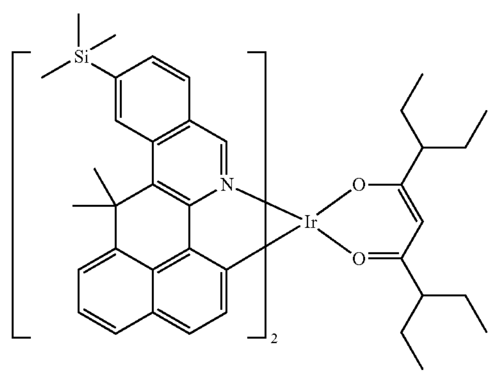
508
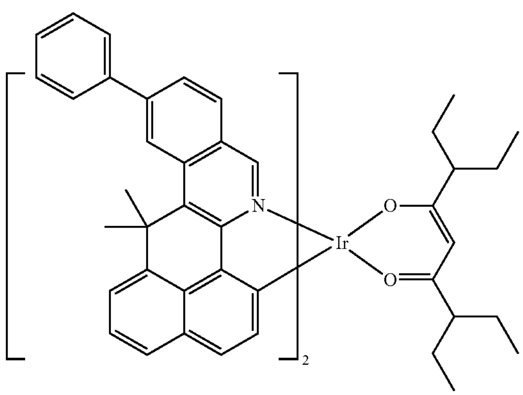
509
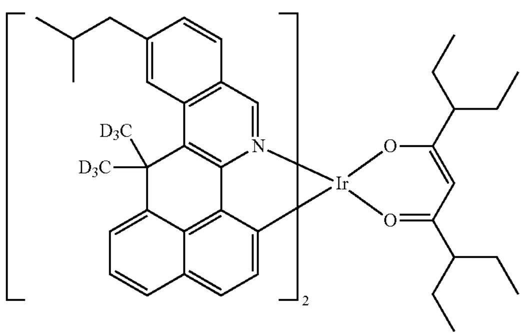
510
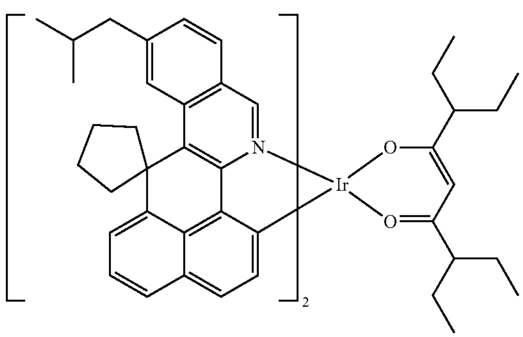

-continued
511
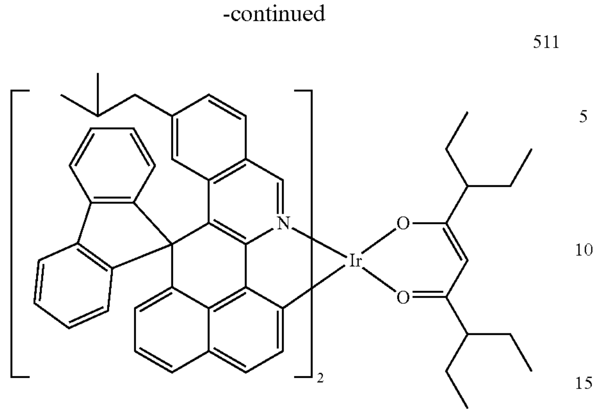
512
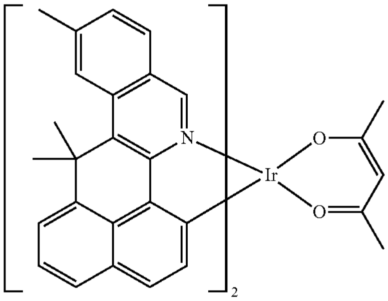
513
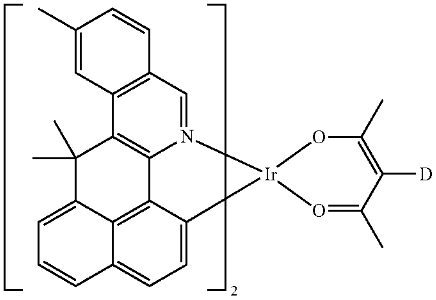
514
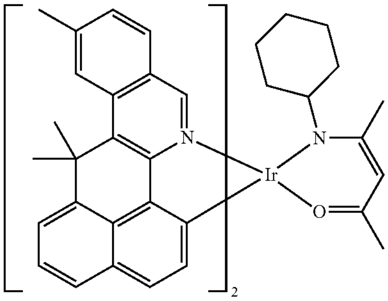
515
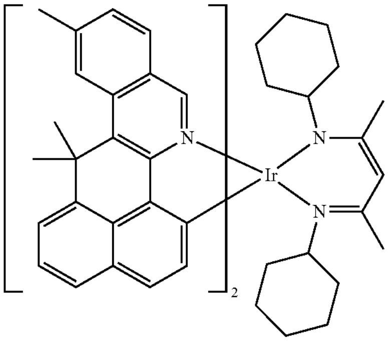
-continued
516
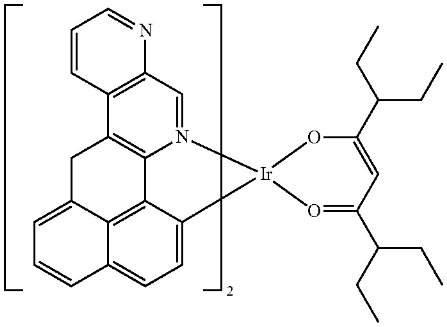
517
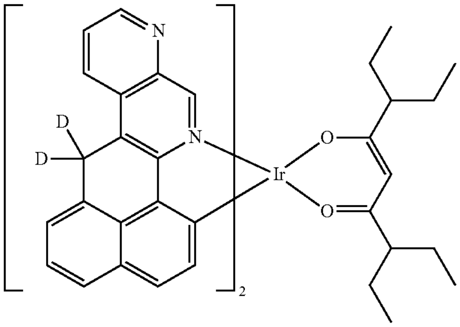
518
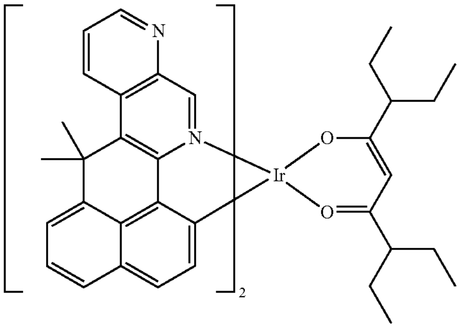
519
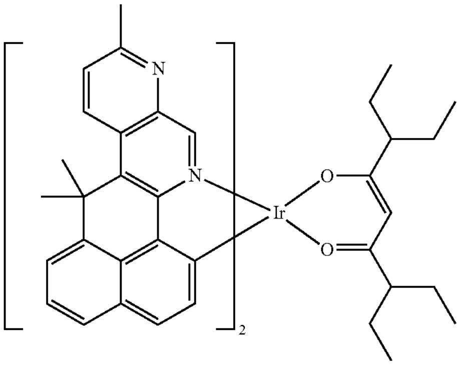

-continued
520
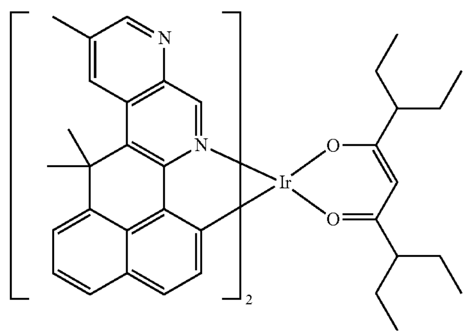
521
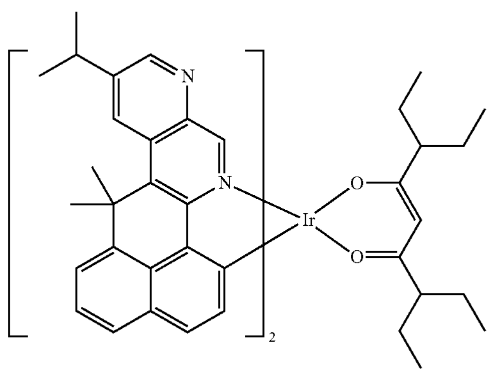
522
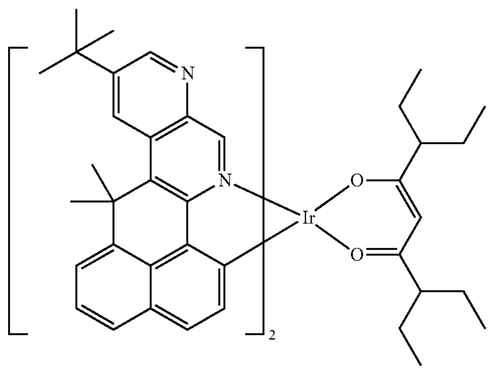
523
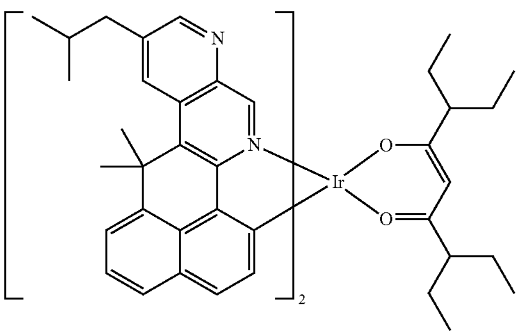
-continued
524
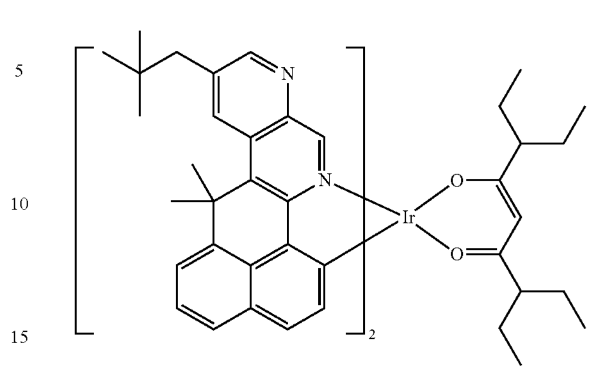
525
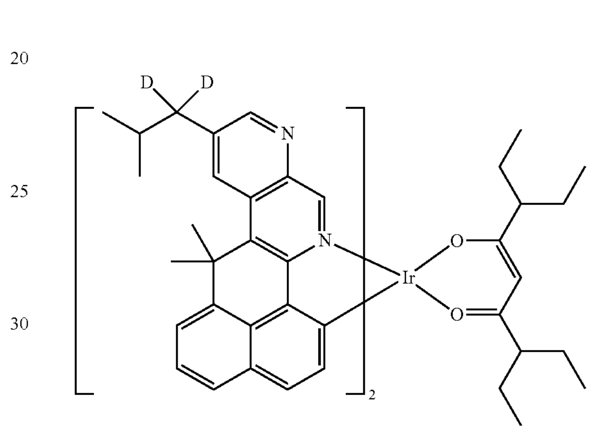
526
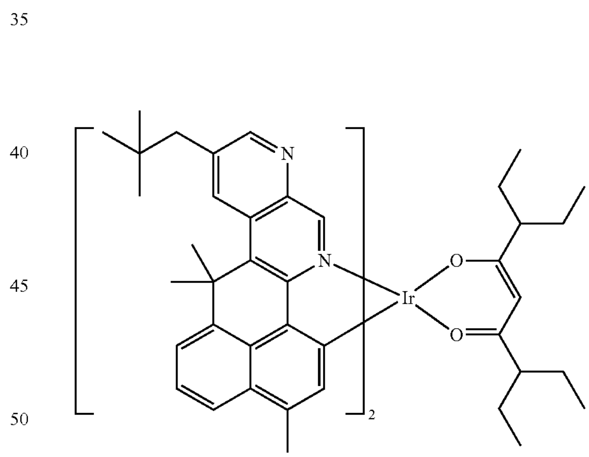
527
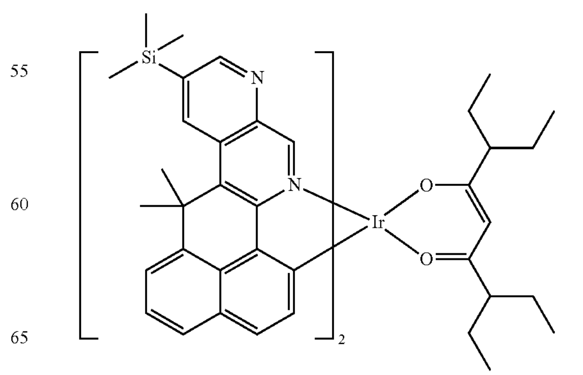

-continued
528
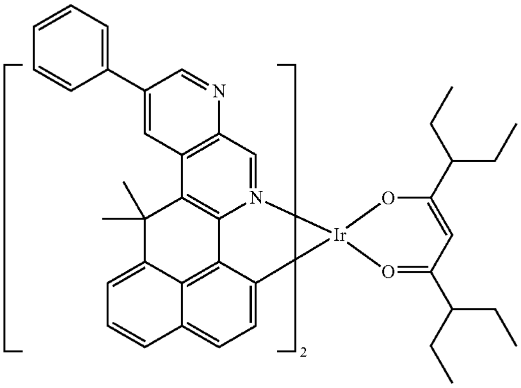
529
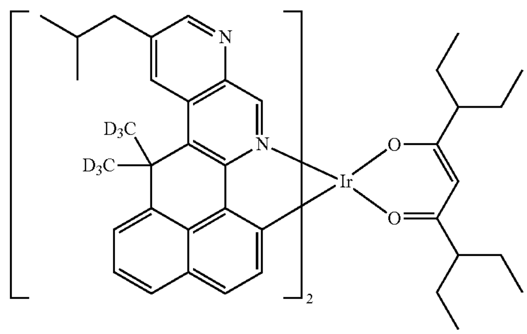
530
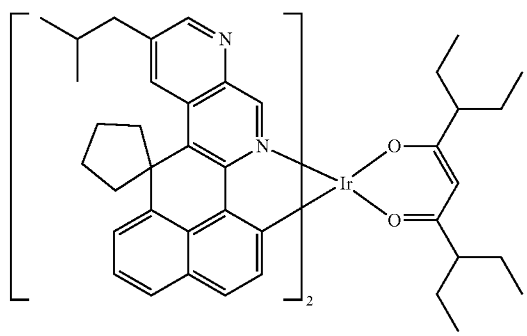
531
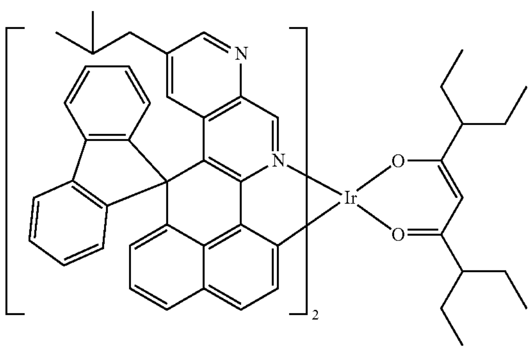
-continued
532
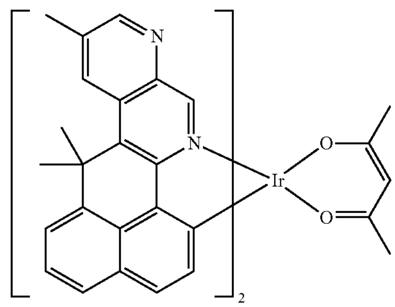
533
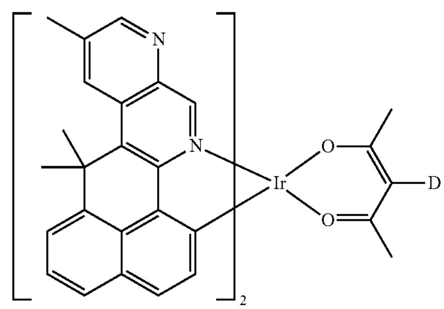
534
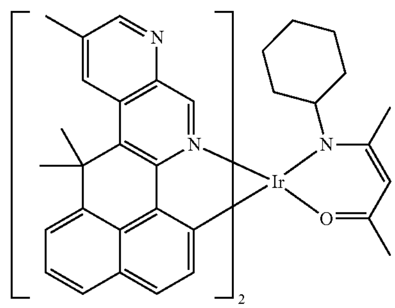
535
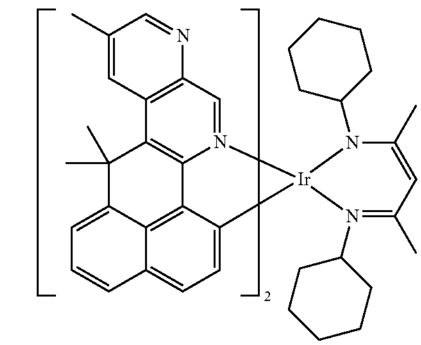
536
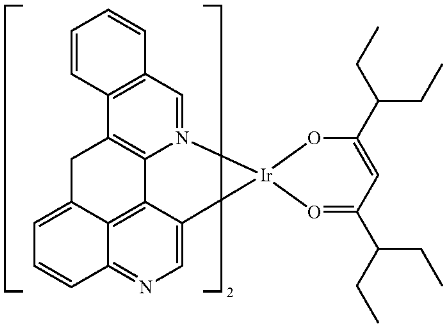

-continued
537
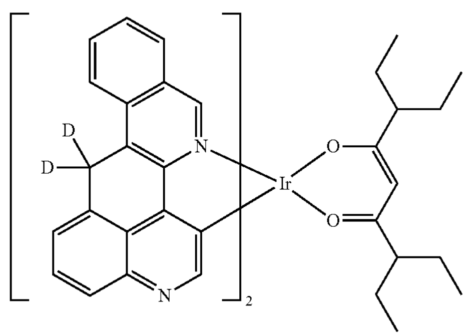
538
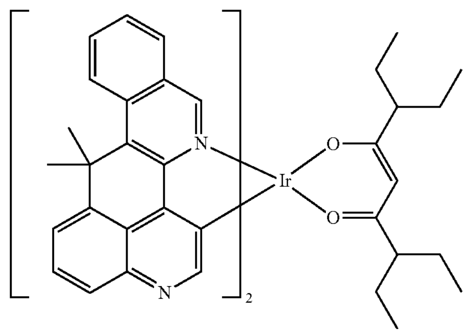
539
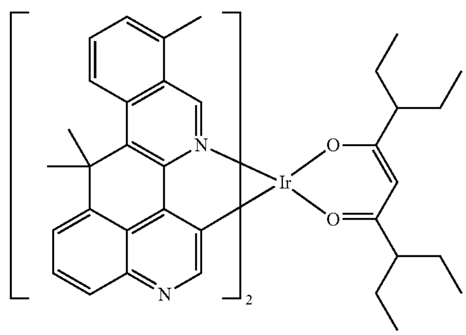
540
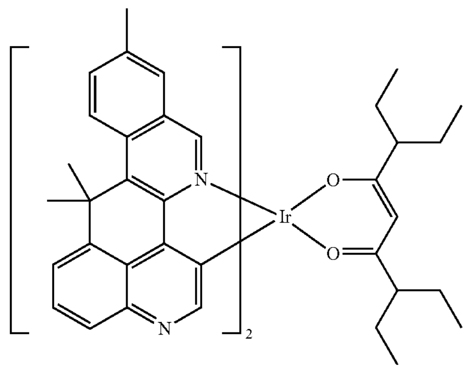
-continued
541
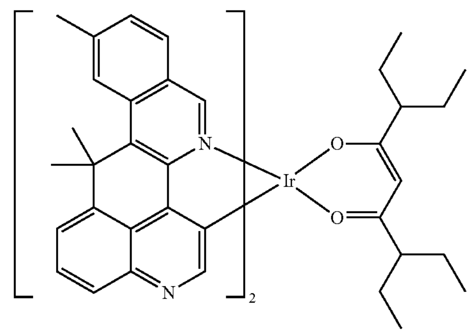
542
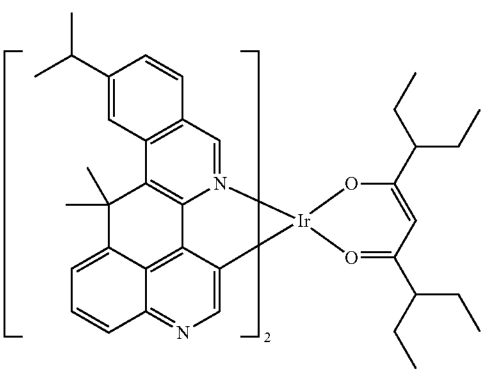
543
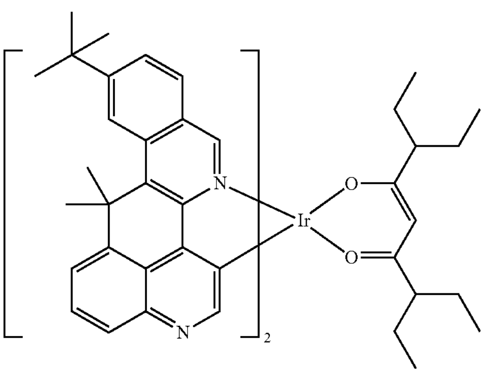
544
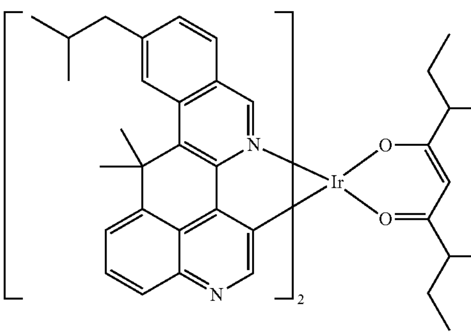

-continued
545
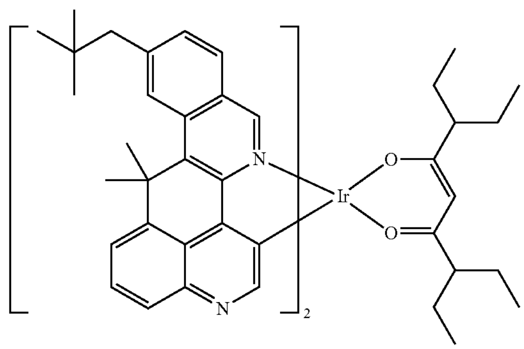
546
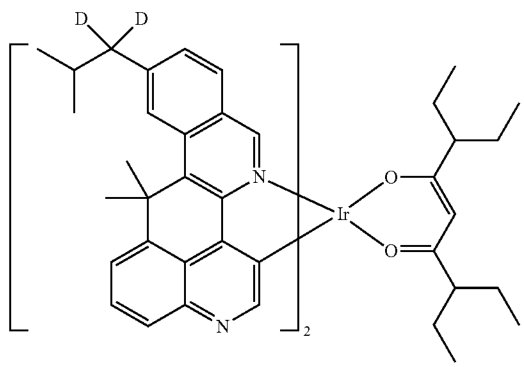
547
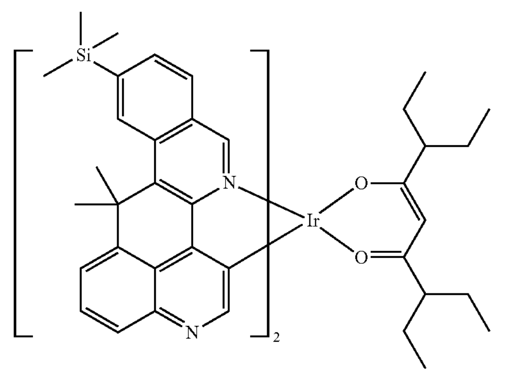
548
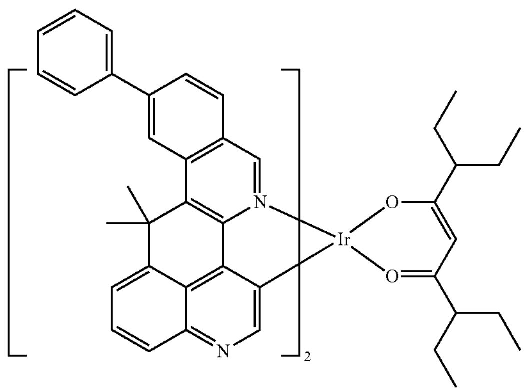
-continued
549
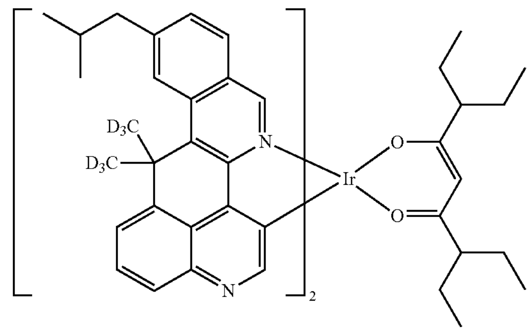
550
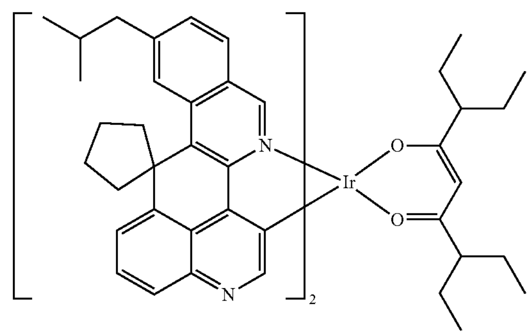
551
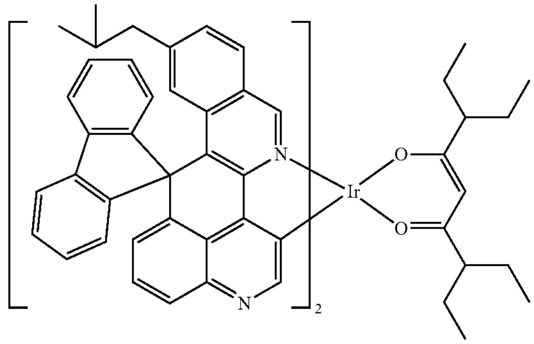
552
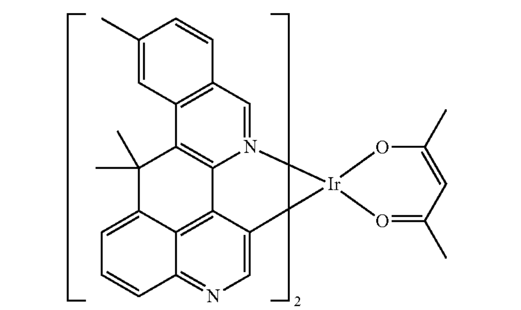

-continued
553
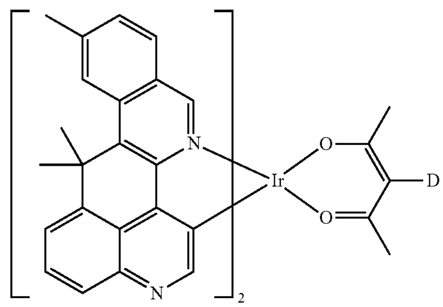
554
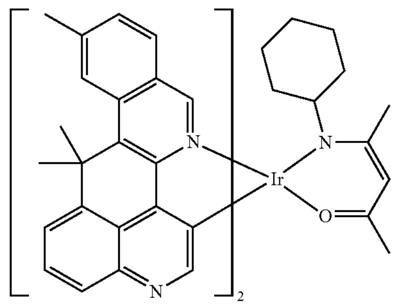
555
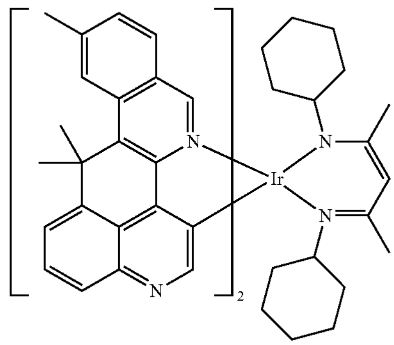
556
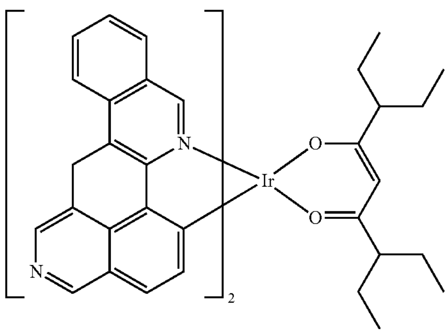
557
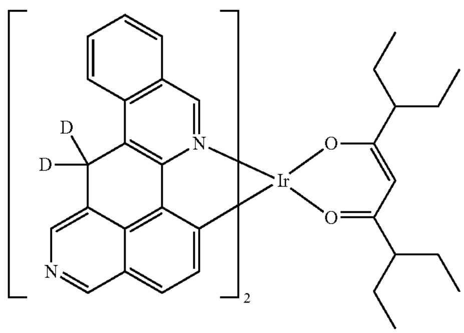
-continued
558
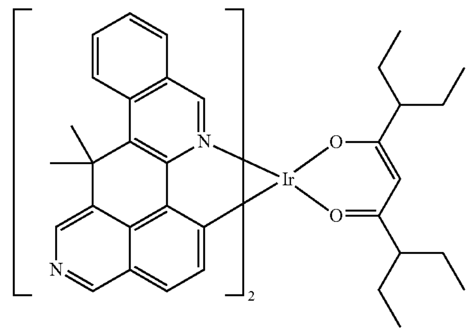
559
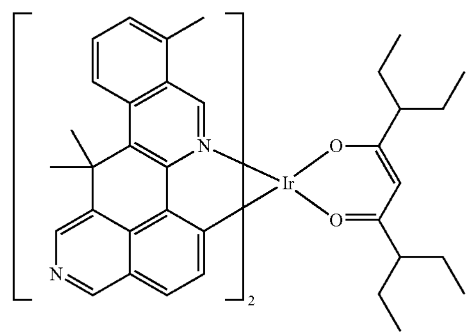
560
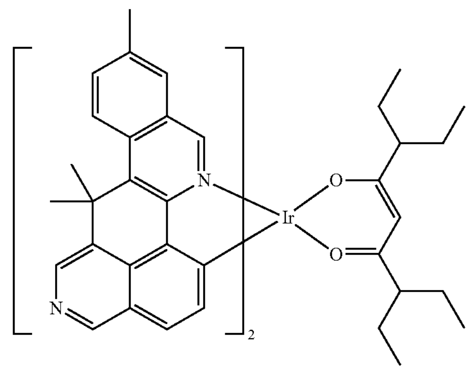
561
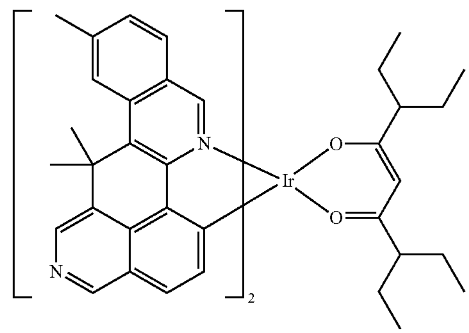

-continued
562
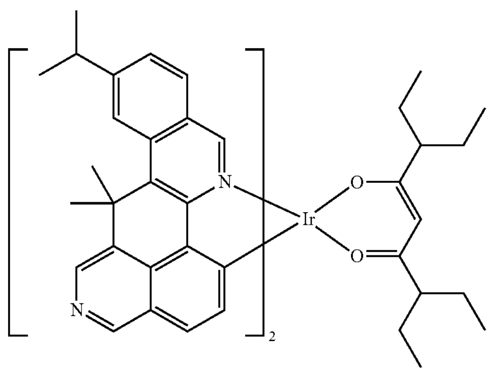
563
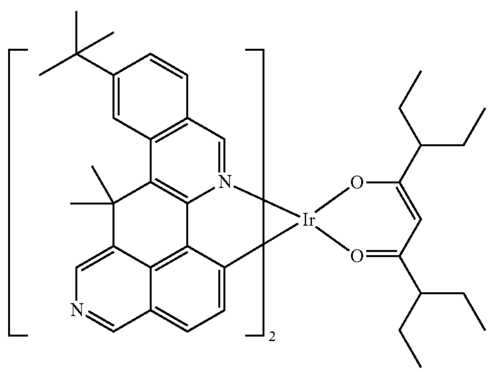
564
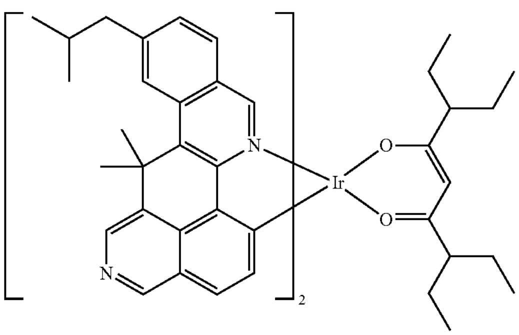
565
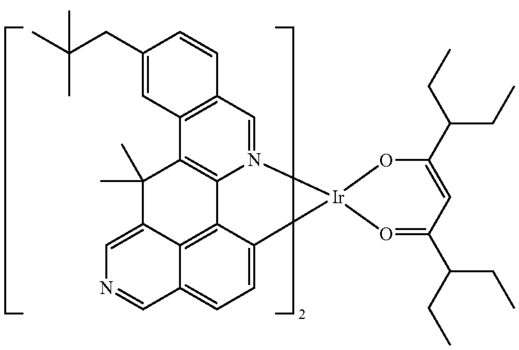
-continued
566
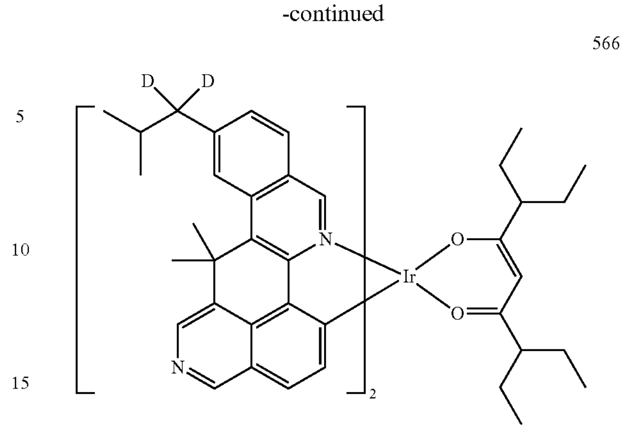
567
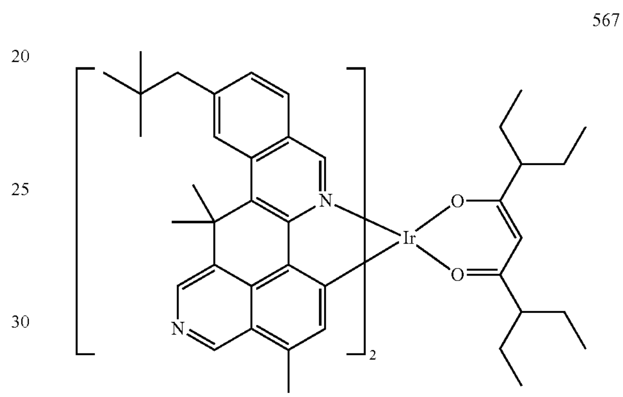
568
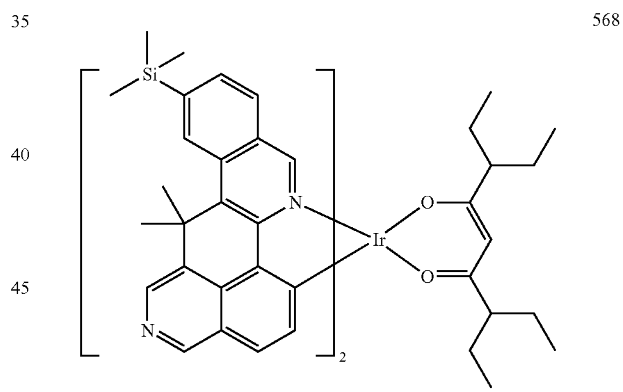
569
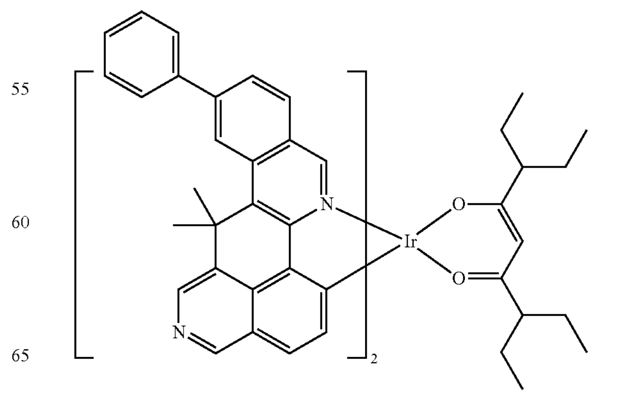

-continued
570
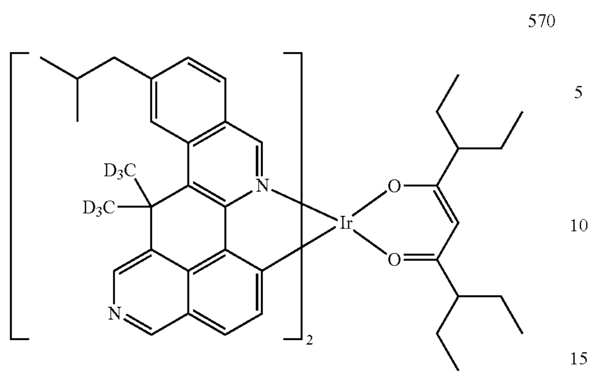
571
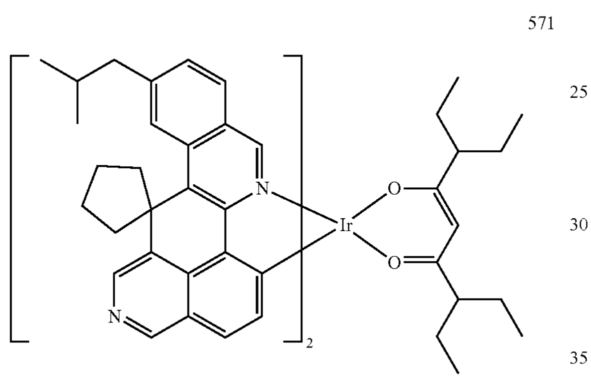
572
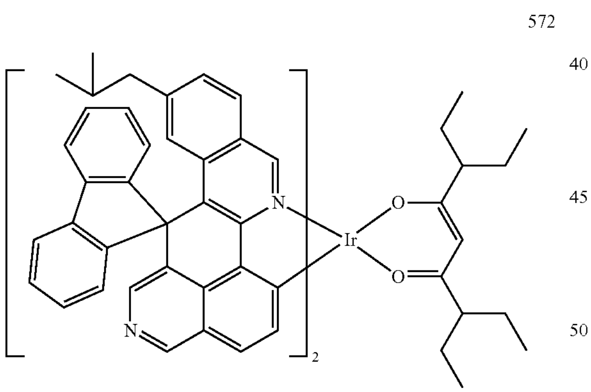
573
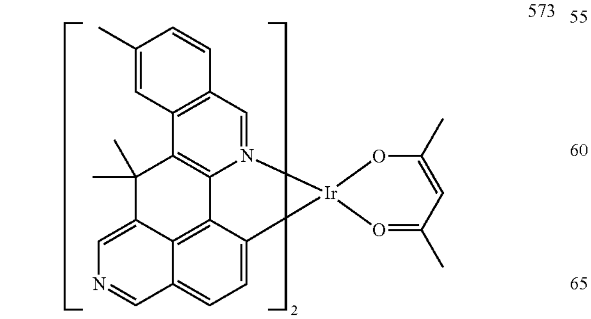
-continued
574
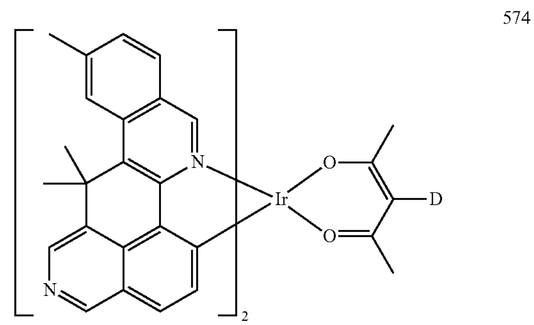
575
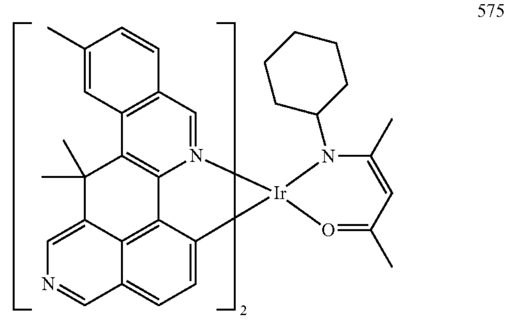
576
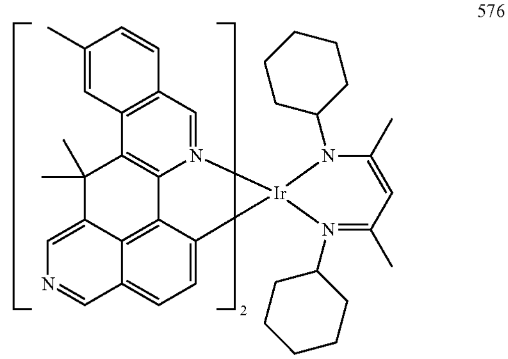
577
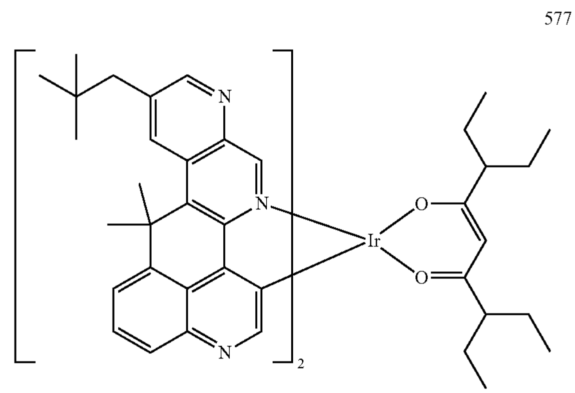
When Y4 in Formula 1-11 is an unsubstituted or substituted hetero atom, i.e., $NR^a$ or O, the first compound 232 can be one of the compounds in Formula 1-28.

-continued
[Formula 1-28]
578
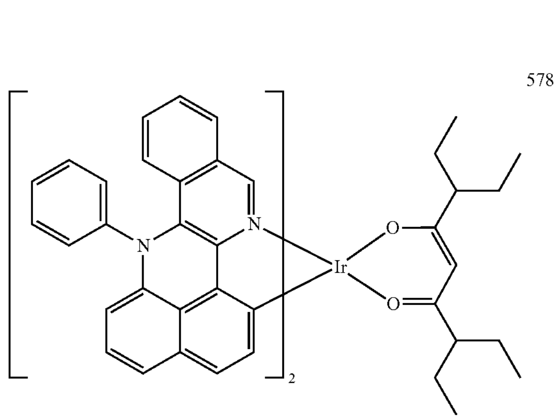
579
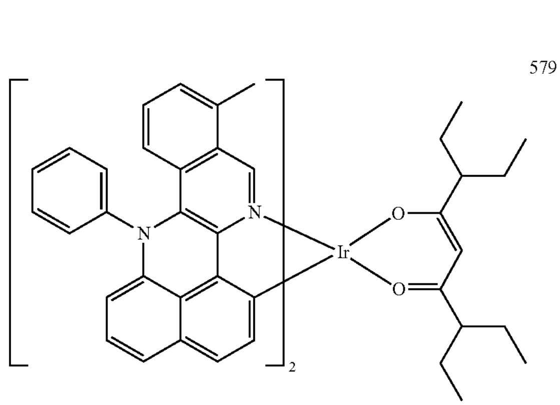
580
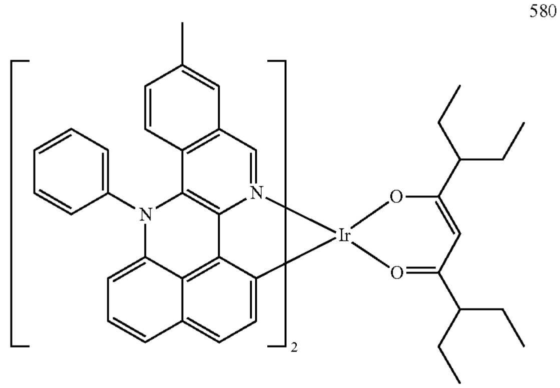
581
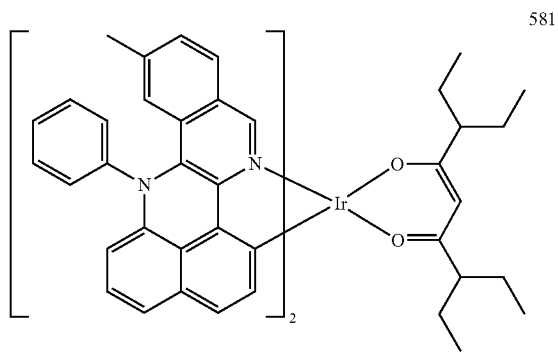
582
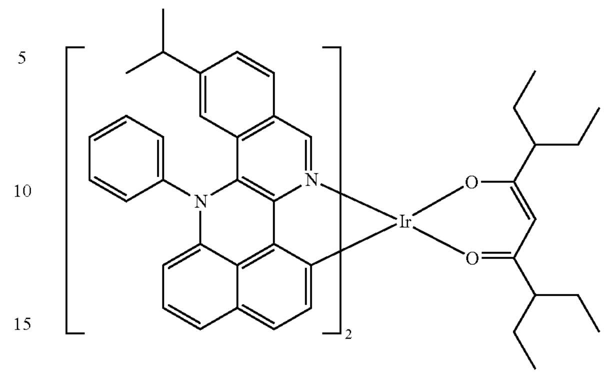
583
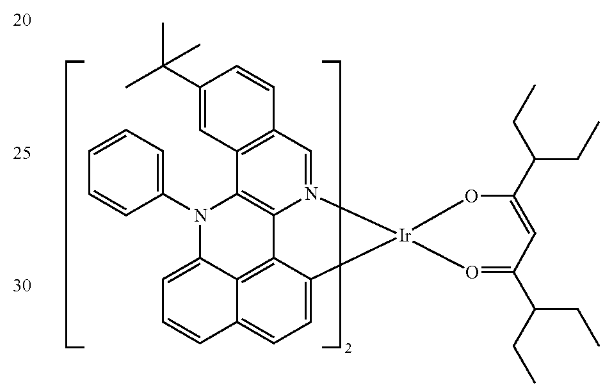
584
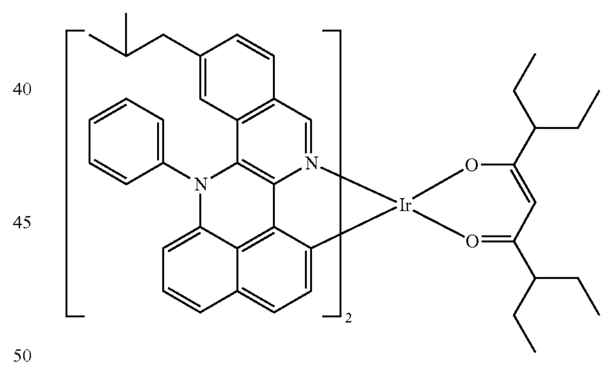
585
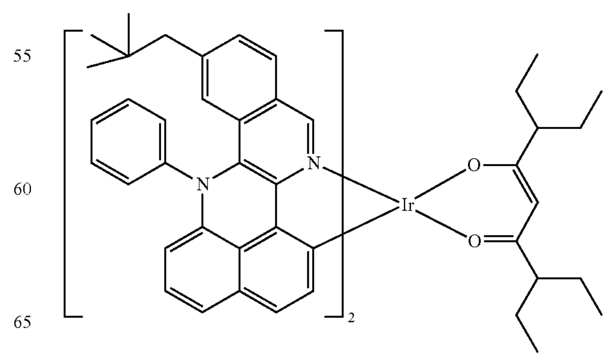

-continued
586
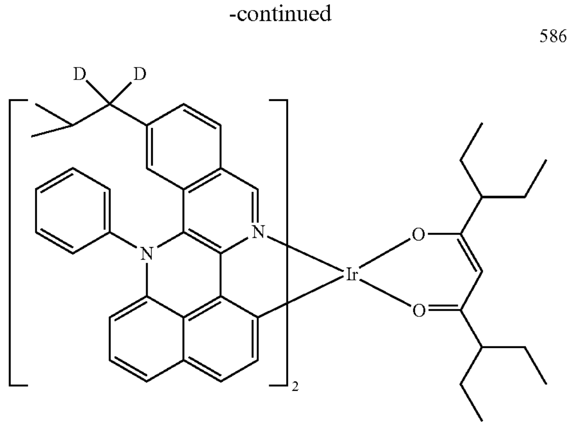
587
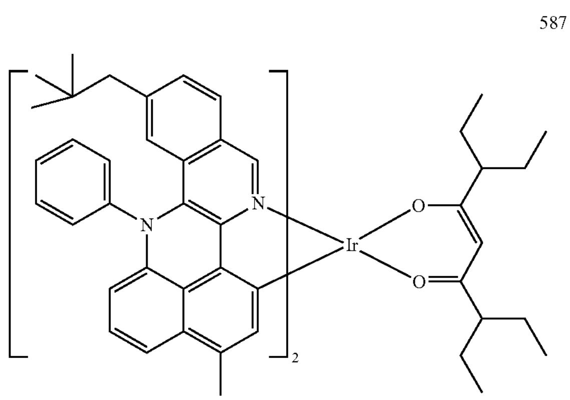
588
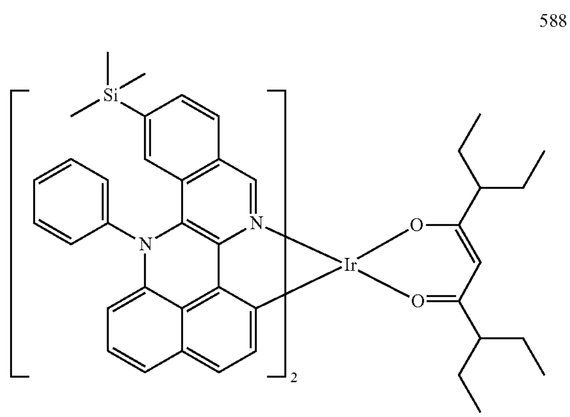
589
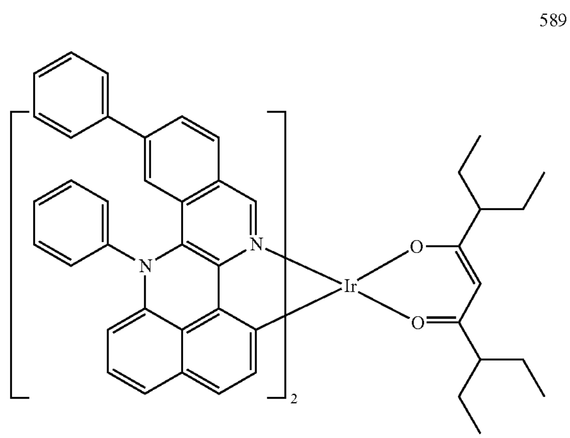
-continued
590
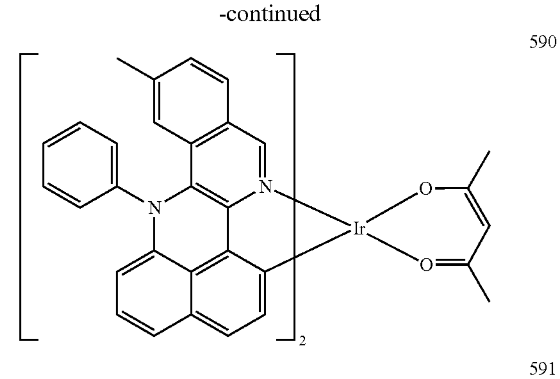
591
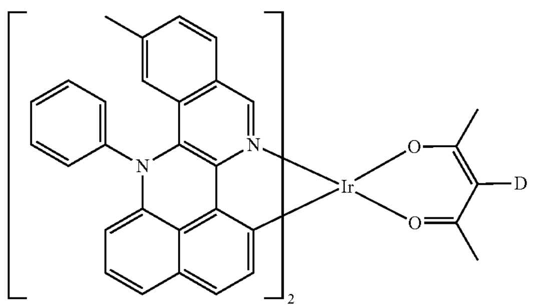
592
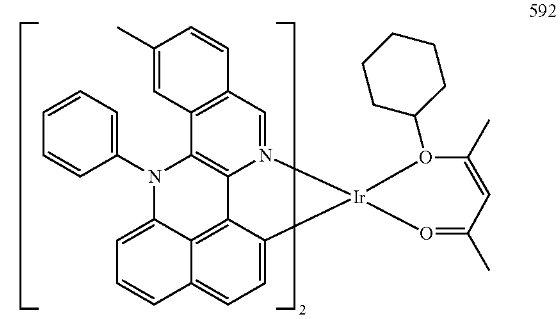
593
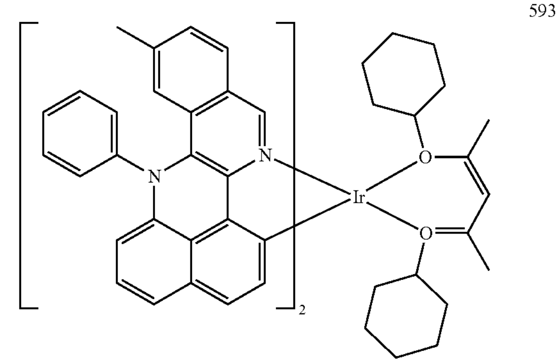
594
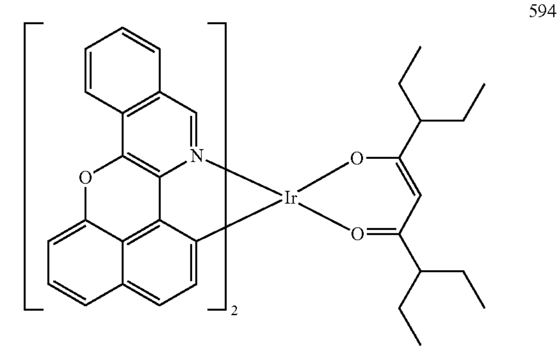

595
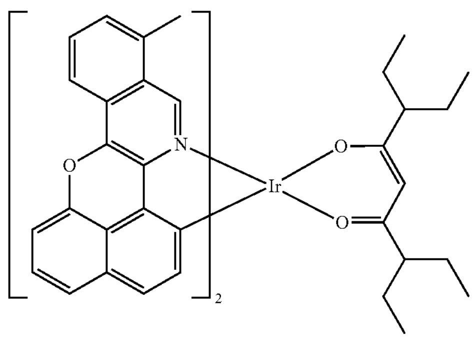
596
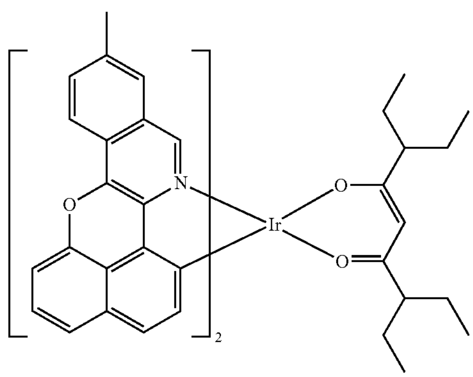
597
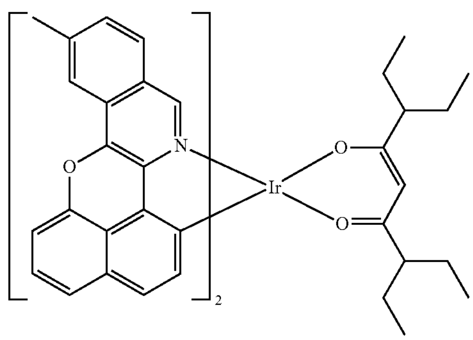
598
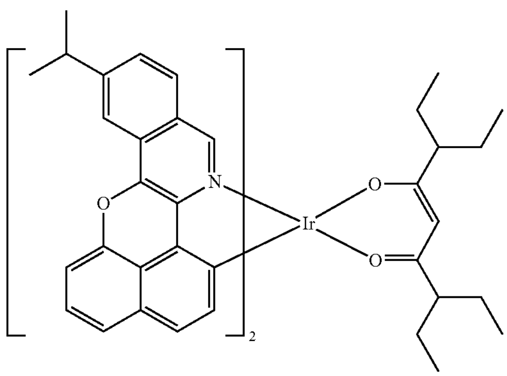
599
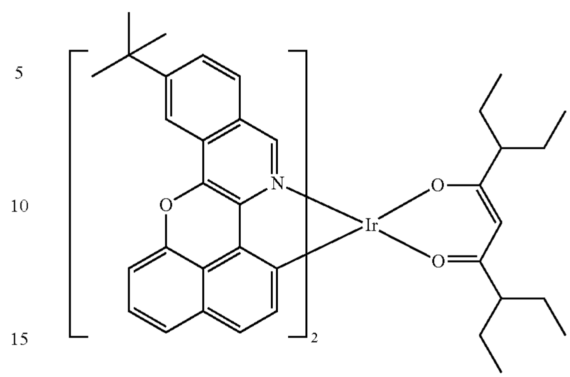
600
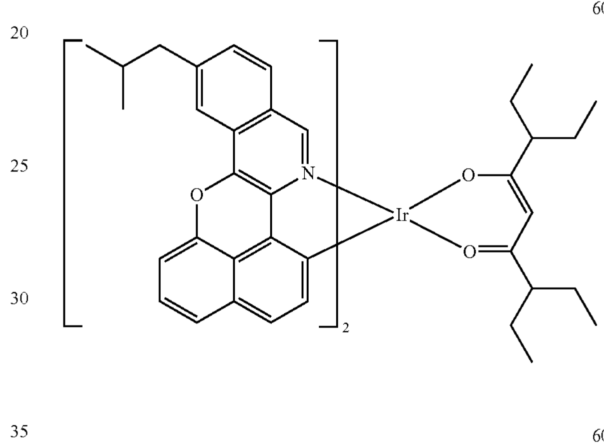
601
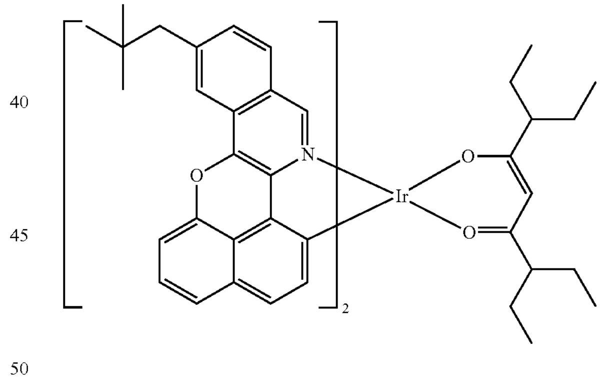
602
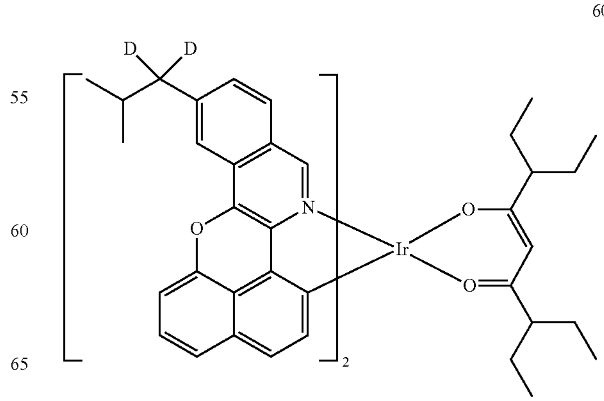

-continued
603
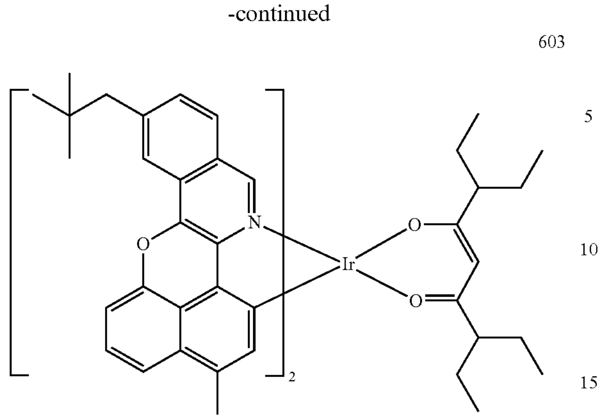
604
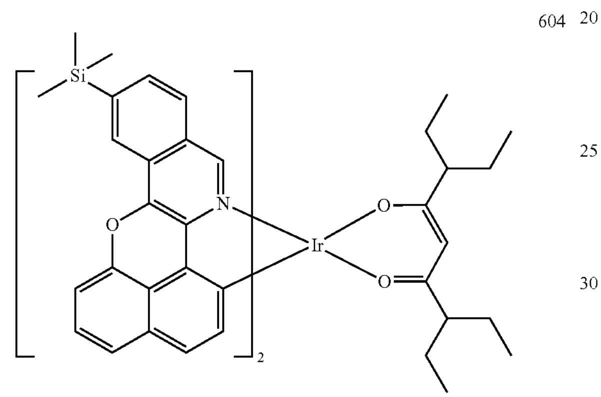
605
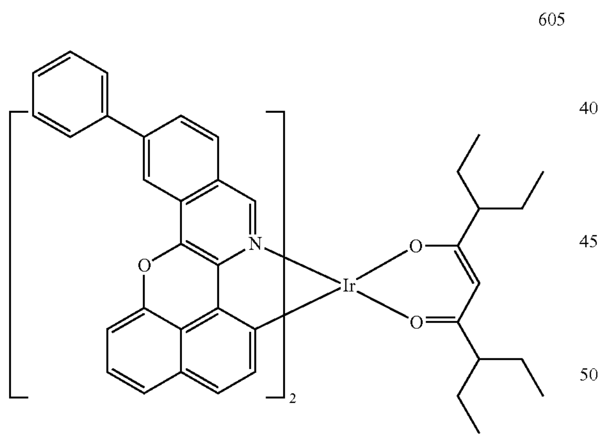
606
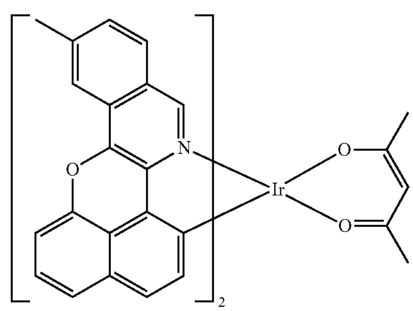
607
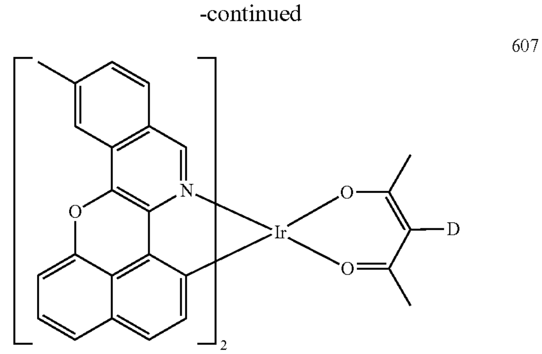
608
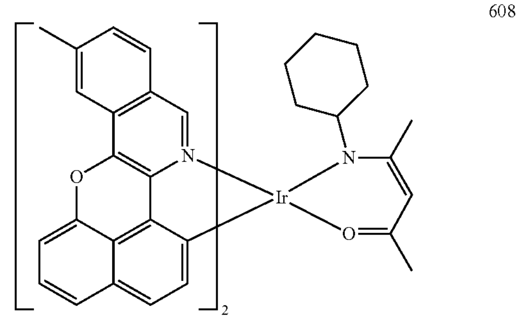
609
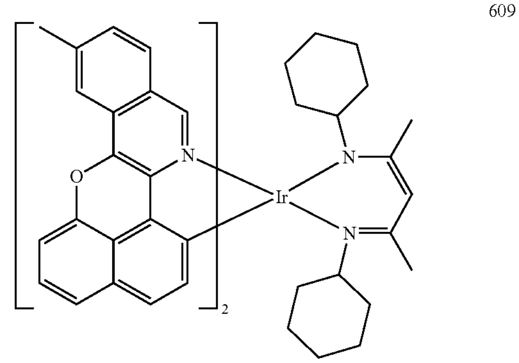
For example, the first compound 232 can be one of the compounds in Formula 1-29.
[Formula 1-29]
610
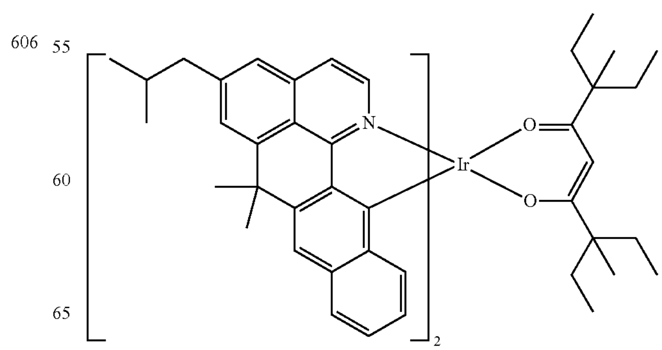

-continued
611
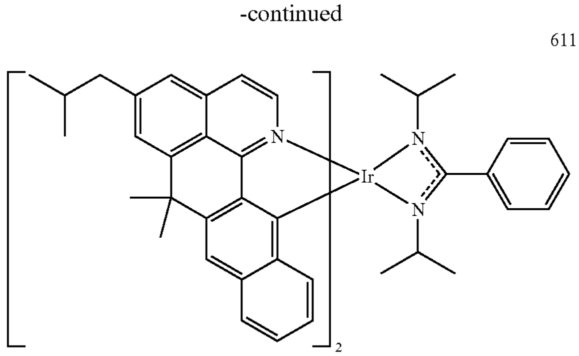
612
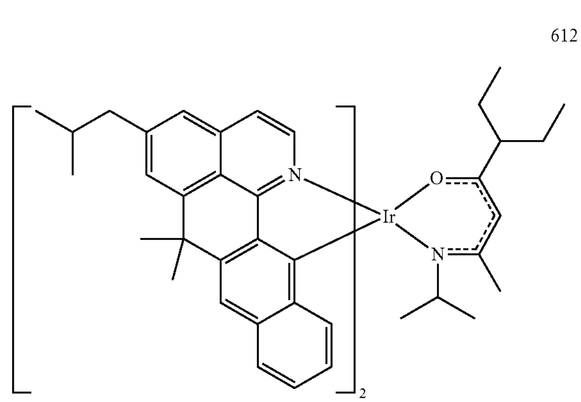
613
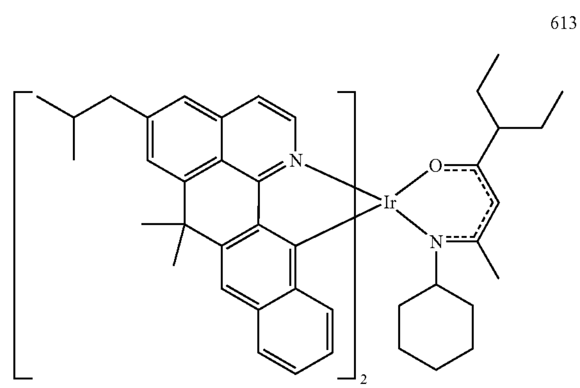
614
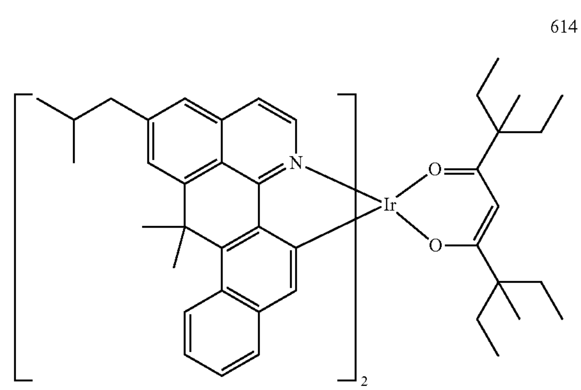
-continued
615
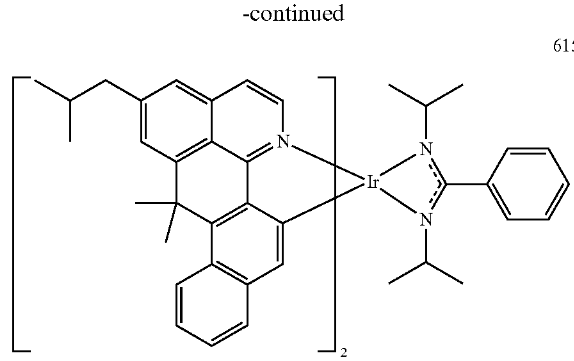
616
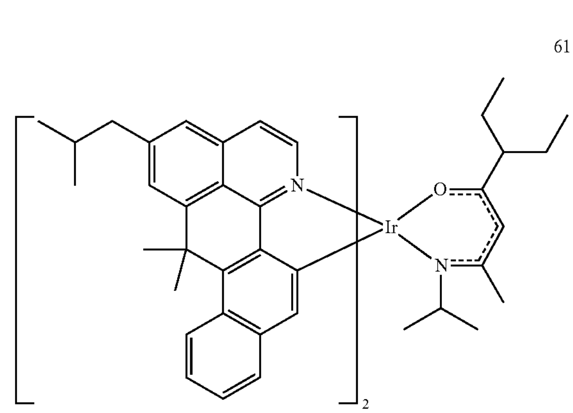
617
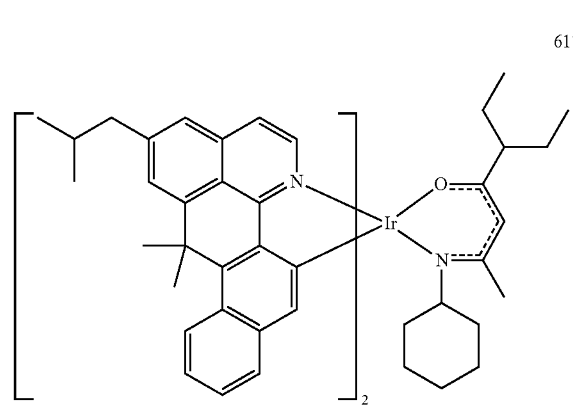
618
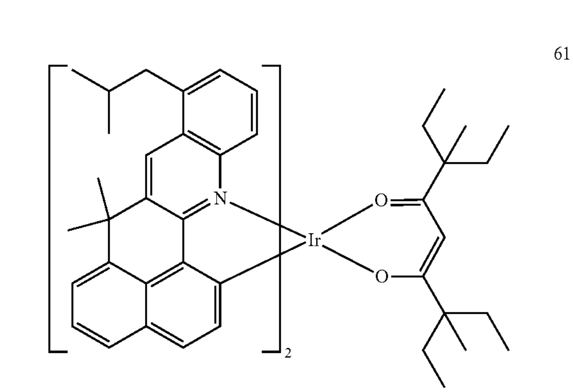

-continued

619

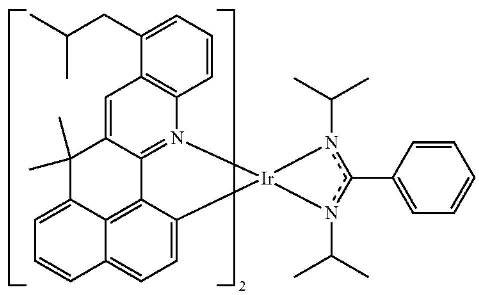

620

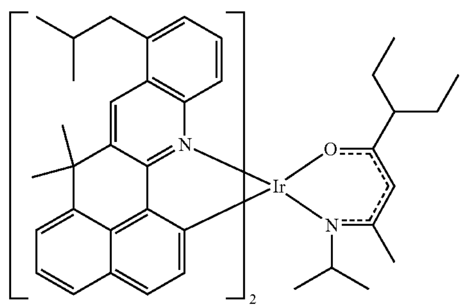

621

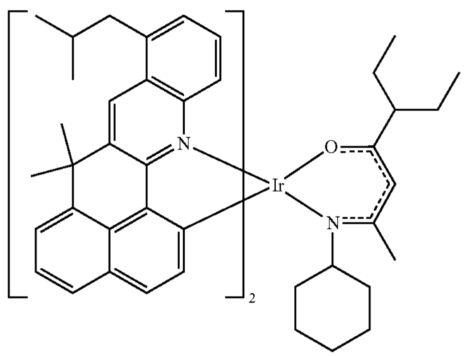

622

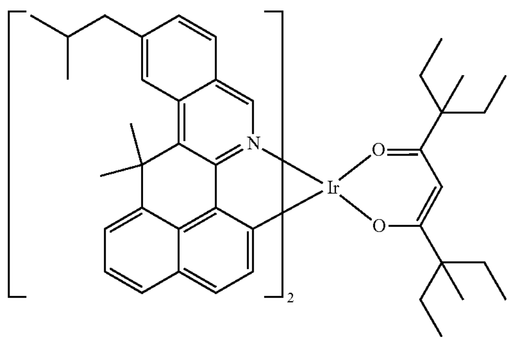

623

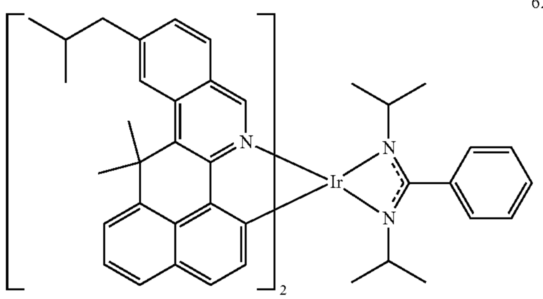

-continued

624

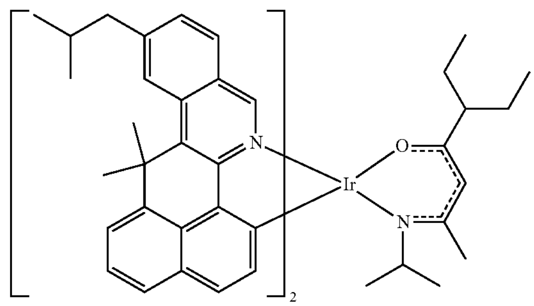

625

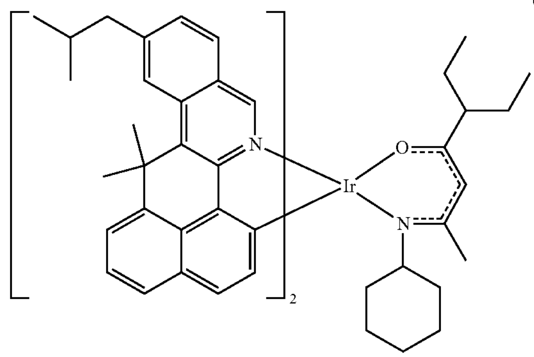

Synthesis Example 1: Synthesis of Compound 369 (Compound RD7 in Formula 8)

(1) Synthesis of Compound B-1

[Reaction Formula 1-1]

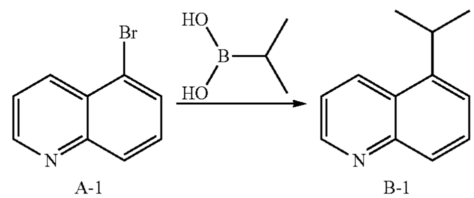

Compound A-1 (5-bromoquinoline, 50.0 g, 240.33 mmol), propan-2-ylboronic acid (42.25 g, 480.65 mmol), $Pd_2(dba)_3$ (tris(dibenzylideneacetone)dipalladium (0), 6.6 g, 3 mol %), SPhos (2-dicyclichexhylphosphino-2',6'-dimethoxybiphenyl, 9.9 g, 24.03 mmol), potassium phosphate monohydrate (276.71 g, 1.2 mol) and toluene (1000 mL) were put into a reaction vessel, and then the solution was stirred at 120° C. for 12 hours. After the reaction was complete, the solution was cooled down to a room temperature and the solution was extracted with ethyl acetate to remove the solvent. A crude product was purified with column chromatography (eluent: ethyl acetate and hexane) to give the compound B-1 (5-isopropylquinoline, 35.4 g, yield: 86%).

MS (m/z): 171.10

(2) Synthesis of Compound C-1

[Reaction Formula 1-2]

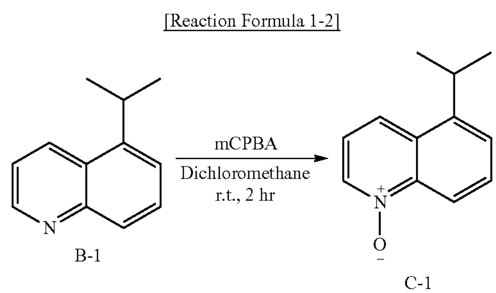

B-1

C-1

The compound B-1 (5-isopropylquinoline, 35.4 g, 206.73 mmol), mCBPA (3-chloroperbenzoic acid, 53.5 g, 310.09 mmol) and dichloromethane (500 mL) were put into a reaction vessel, and then the solution was stirred at room temperature for 3 hours. Sodium sulfite (80 g) was added into the solution, the organic layer was washed with water and then placed under reduced pressure to give the compound C-1 (27.5 g, yield: 71%).

MS (m/z): 187.10

(3) Synthesis of Compound D1

[Reaction Formula 1-3]

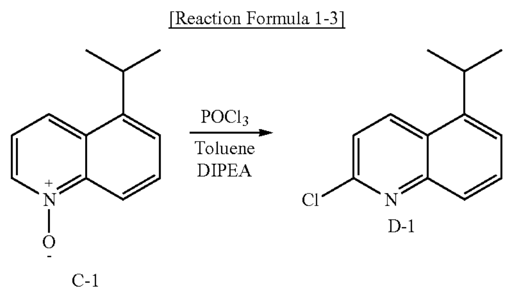

C-1

D-1

The compound C-1 (27.5 g, 146.87 mmol) dissolved in toluene (500 mL) was put into a reaction vessel, phosphoryl trichloride ($POCl_3$, 45.0 g, 293.74 mmol) and diisopropylethylamine (DIPEA, 38.0 g, 293.74 mmol) were added into the vessel, and then the solution was stirred at 120° C. for 4 hours. The reactants ware placed under reduced pressure to remove the solvent and extracted with dichloromethane, and then the organic layer was washed with water. Water was removed with $MgSO_4$, the crude product was filtered and then the solvent was removed. The crude product was purified with column chromatography to give the compound D-1 (2-chloro-5-isopropylquinoline, 11.8 g, yield: 39%).

MS (m/z); 205.07

(4) Synthesis of Compound F-1

[Reaction Formula 1-4]

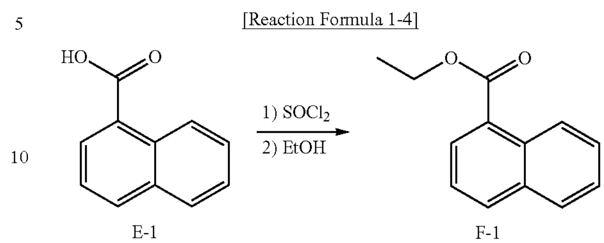

E-1

F-1

The compound E-1 (1-naphthoic acid, 50 g, 290.30 mmol) and $SOCl_2$ (200 mL) were put into a reaction vessel, the solution was refluxed for 4 hours, $SOCl_2$ was removed, ethanol (200 mL) was added, and then the solution was stirred at 70° C. for 7 hours. Water was added, the organic layer was extracted with ether, water was removed with $MgSO_4$ and then the solution was filtered. The solution was placed under reduced pressure to remove the solvent and to give the compound F-1 (ethyl-1-naphthoate, 53.2 g, yield: 90%).

MS (m/z): 200.08

(5) Synthesis of Compound G-1

[Reaction Formula 1-5]

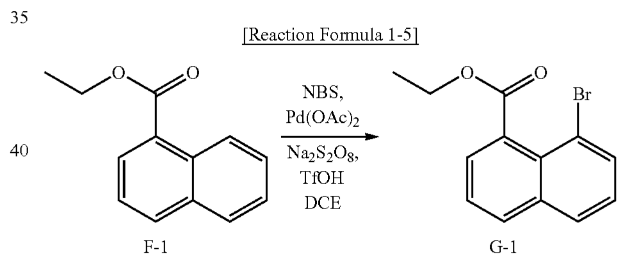

F-1

G-1

The compound F-1 (ethyl-1-naphthoate, 52.3 g, 261.20 mmol), NBS (N-bromosuccinimide, 51.14 g, 287.32 mmol), $Pd(Oac)_2$ (palladium(II)acetate, 0.6 g, 2.61 mmol), $Na_2S_2O_8$ (124.4 g, 522.40 mmol) and dichloromethane (500 mL) were put into a reaction vessel, TfOH (Trifluoromethanesulfonic acid, 19.6 g, 130.60 mmol) was added into the reaction vessel, and then the solution was stirred at 70° C. for 1 hour. The reactants were cooled to room temperature, the reaction was complete using $NaHCO_3$, and then was extracted with dichloromethane. Water in the organic layer was removed with $MgSO_4$, the solvent was removed, and then the crude product was purified with column chromatography (eluent: petroleum ether and ethyl acetate) to give the compound G-1 (ethyl-8-bromonaphthalene-1-carboxylate, 54.0 g, yield: 74%).

MS (m/z): 277.99

(6) Synthesis of Compound H-1

[Reaction Formula 1-6]

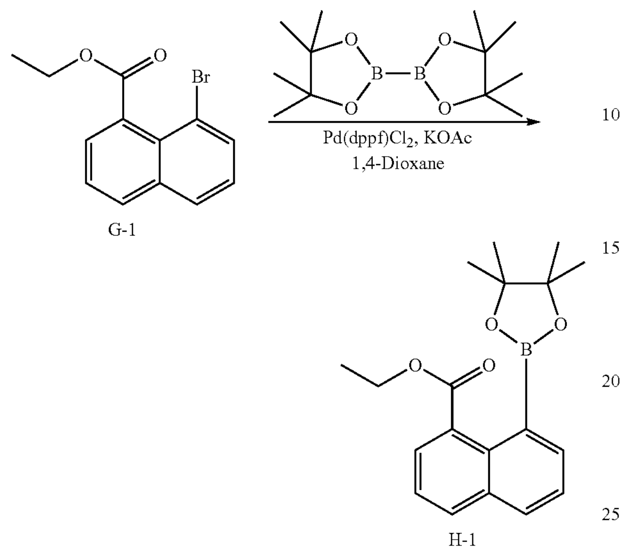

G-1

H-1

The compound G-1 (ethyl-8-bromonaphthalene-1-carboxylate, 54.0 g, 193.46 mmol), bis(pinacolato)diboron (58.6 g, 232.15 mmol), Pd(dppf)$Cl_2$ ([1,1'-bis(diphenylphosphino)ferrocene]dichloropalladium(II), 7.1 g, 9.67 mmol), KOAc (potassium acetate, 57.0 g, 580.37 mmol) and 1,4-dioxane (500 mL) were put into a reaction vessel, and then the solution was stirred at 100° C. for 4 hours. The reactants were cooled to room temperature, extracted with ethyl acetate, then water in the organic layer was removed with $MgSO_4$, and then the solution was filtered and placed under reduced pressure to remove the solvent. The crude product was purified with column chromatography (eluent: hexane and ethyl acetate) to give the compound H-1 (ethyl 8-(4,4,5,5-tetramethyl-1,3,2-dioxanborolan-2-yl)naphthalene-1-carboxylate, 54.3 g, yield: 86%).

MS (m/z): 326.17

(7) Synthesis of Compound I-1

[Reaction Formula 1-7]

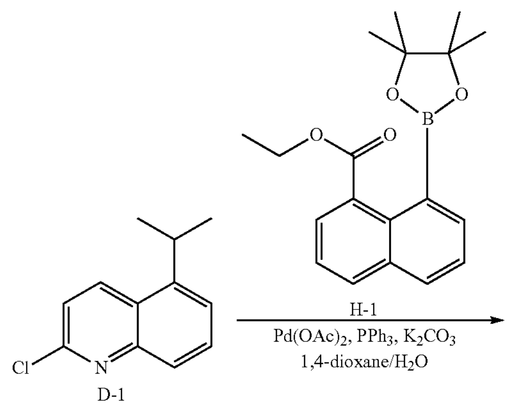

D-1

-continued

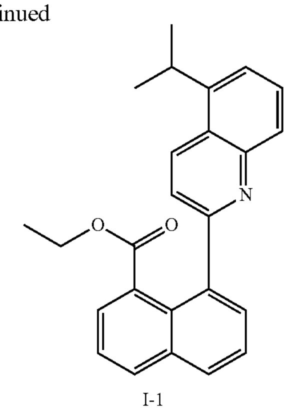

I-1

The compound D-1 (2-chloro-5-isopropylquinoline, 10 g, 48.62 mmol), the compound H-1 (ethyl 8-(4,4,5,5-tetramethyl-1,3,2-dioxanborolan-2-yl)naphthalene-1-caroboylate, 17.45 g, 53.48 mmol), Pd$(OAc)_2$ (0.5 g, 2.43 mmol), $PPh_3$ (chloro(tripphenylphosphine)[2-(2'-amino-1,1'-biphenyl)] palladium(II) (2.6 g, 9.72 mmol), $K_2CO_3$ (20.2 g, 145.86 mmol), 1,4-dioxane (100 mL) and water (100 mL) were put into a reaction vessel, and then the solution was stirred at 100° C. for 12 hours. The reactants ware cooled to room temperature and extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the compound I-1 (ethyl 8-(5-isopropylquinolin-2-yl)naphthalene-1-carboxylate, 13.5 g, yield: 75%).

MS (m/z): 369.17

(8) Synthesis of Compound J-1

[Reaction Formula 1-8]

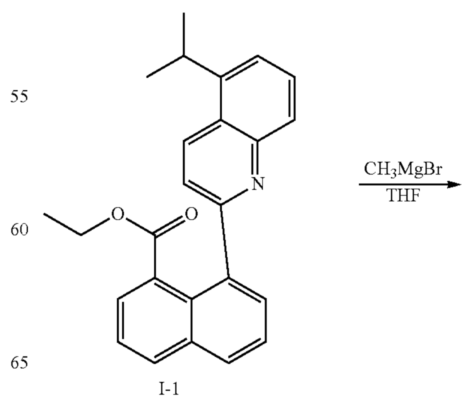

I-1

-continued

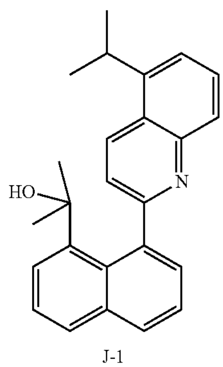

J-1

The compound I-1 (ethyl 8-(5-isopropylquinolin-2-yl) naphthalene-1-carboxylate, 13.5 g, 36.6 mmol) and THF (100 mL) were put into a reaction vessel and then $CH_3MgBr$ (21.8 g, 182.70 mmol) was added dropwise into the reaction vessel at 0° C. The solution was raised to room temperature, the reaction was complete after 12 hours, was extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the compound J-1 (2-(1-(5-isopropylquinolin-2-yl)naphthalene-8-yl)propan-2-ol, 6.9 g, yield: 53%).

MS (m/z): 355.19

(9) Synthesis of Compound K-1

[Reaction Formula 1-9]

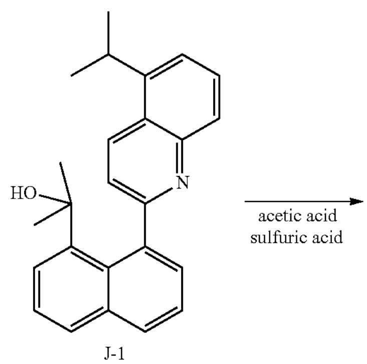

J-1

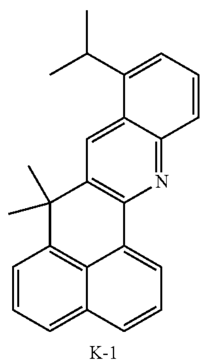

K-1

The compound J-1 (2-(1-(5-isopropylquinolin-2-yl)naphthalene-8-yl)propan-2-ol, 20 g, 56.26 mmol) and a mixed aqueous solution (200 mL) of acetic acid and sulfuric acid were put into a reaction vessel, and then the solution was refluxed for 16 hours. After the reaction was complete, the solution was cooled to room temperature, and then the reactants were added dropwise into sodium hydroxide aqueous solution with ice. The organic layer was extracted with dichloromethane and water was removed with $MgSO_4$. The solvent was removed and then the crude product was recrystallized with toluene and ethanol to give the compound K-1 (9-isopropyl-7,7-dimethyl-7H-naphtho[1,8-bc]acridine, 10.25 g, yield: 54%) of yellow solid.

MS (m/z): 337.18

(10) Synthesis of Compound L-1

[Reaction Formula 1-10]

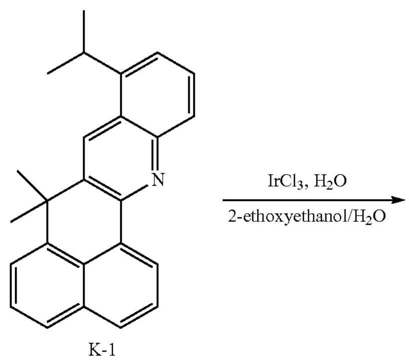

K-1

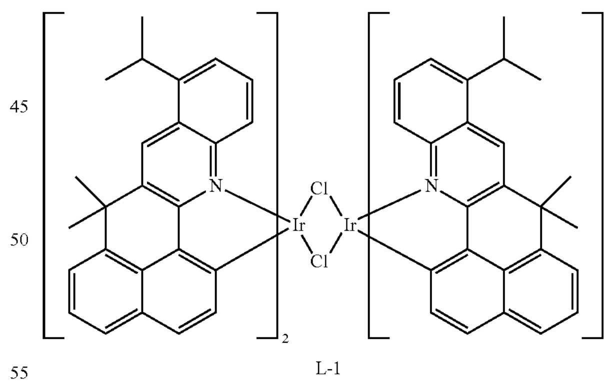

L-1

The compound K-1 (10.25 g, 30.37 mmol), 2-ethoxyethanol (200 mL) and distilled water (50 mL) were put into a reaction vessel, the solution was bubbled with nitrogen for 1 hour, $IrCl_3.H_2O$ (4.4 g, 13.81 mmol) was added into the reaction vessel, and then the solution was refluxed for 2 days. After the reaction was complete, the solution was cooled to room temperature, and then the obtained solid was filtered. The solid was washed with hexane and water and dried to give the compound L-1 (4.0 g, yield: 32%).

(11) Synthesis of Compound 369

[Reaction Formula 1-11]

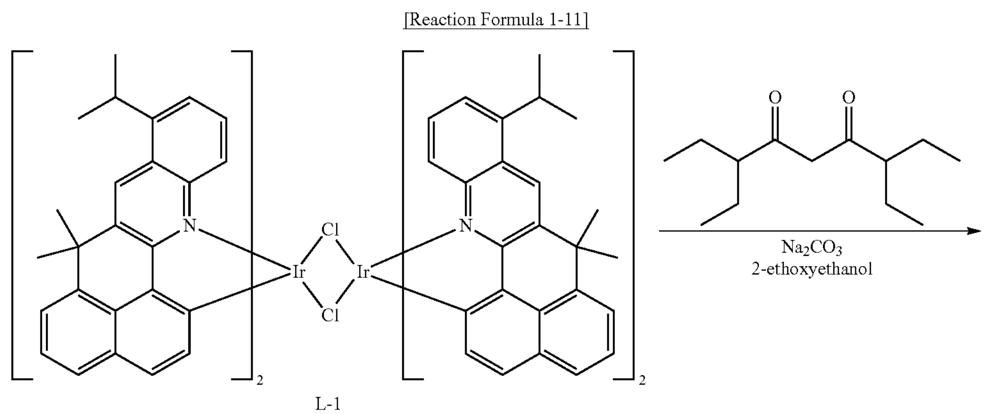

L-1

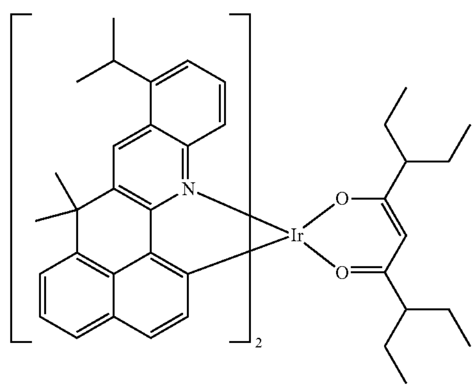

369

The compound L-1 (4.0 g, 2.21 mmol), 3,7-diethylnonane-4,6-dione (4.7 g, 22.09 mmol), $Na_2CO_3$ (4.7 g, 441.8 mmol) and 2-ethoxyethanol (100 mL) were put into a reaction vessel, and then the solution was stirred slowly for 24 hours. After the reaction was complete, dichloromethane was added into the reactants to dissolve product, and then the solution was filtered with celite. The solvent was removed, the solid was filtered using filter paper, then the filtered solid was put into isopropanol, and then the solution was stirred. The solution was filtered to remove isopropanol, and the solution was dried and recrystallized with dichloromethane and isopropanol. High purity of compound 369 (2.5 g, yield: 53%) was obtained using a sublimation purification instrument.

MS (m/z): 1076.48

Synthesis Example 2: Synthesis of Compound 2 (Compound RD5 in Formula 8)

(1) Synthesis of Compound C-2

[Reaction Formula 2-1]

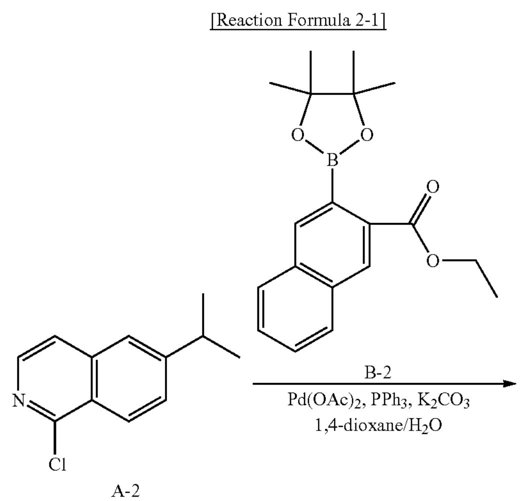

B-2

A-2

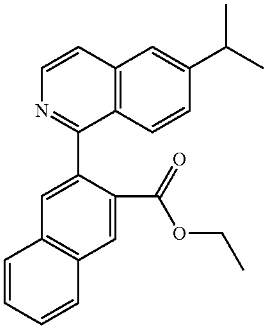

C-2

The compound C-2 (ethyl 3-6-(isopropylisoqunolin-1-yl)-naphthoate (14.4 g, yield: 80%) was obtained by repeating the synthesis process of the compound I-1 except that the compound A-2 (1-chloro-6-isopropylisoquinoline, 10 g, 48.62 mmol) and compound B-2 (ethyl 3-(4,4,5,5-tetramethyl-1,3,2-dioxanborolan-2-yl)-2-naphthoate (17.45 g, 53.50 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate, respectively.

MS (m/z): 369.17

(2) Synthesis of Compound D-2

[Reaction Formula 2-2]

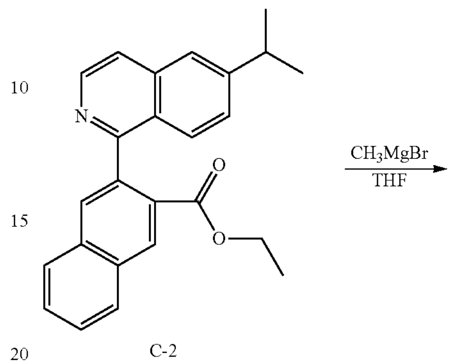

C-2

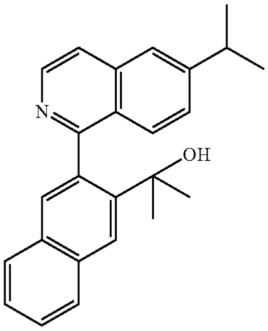

D-2

The compound D-2 (2-(3-(6-isopropylisoquinolin-1-yl) naphthalen-2-yl)propan-2-ol, 6.9 g, yield: 50%) was obtained by repeating the synthesis process of the compound J-1 except that the compound C-2 (ethyl 3-(6-isopropylisoquinolin-1-yl)-2-naphthoate, 14.4 g, 39.0 mmol) was used instead of the compound I-1 (ethyl 8-(5-isopropylquinolin-2-yl)naphthalene-1-caroboxylate, 13.5 g, 36.5 mmol).

MS (m/z): 355.19

(3) Synthesis of Compound E-2

[Reaction Formula 2-3]

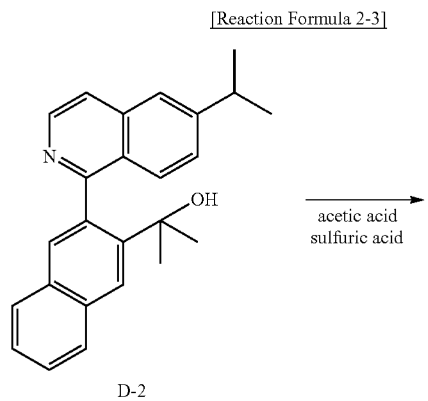

D-2

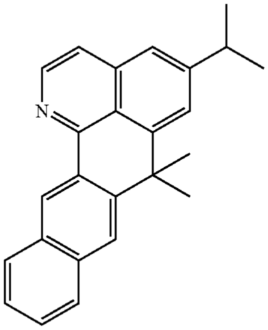

E-2

The compound E-2 (5-isopropyl-7,7-dimethyl-7H-benzo[de]naphtha[2,3-h]quinolone, 11.39 g, yield: 60%) was obtained by repeating the synthesis process of the Compound K-1 except that the compound D-2 (2-(3-(6-isopropylisoquinolin-1-yl)naphthalen-2-yl)propan-2-ol, 20 g, 56.26 mmol) was used instead of the compound J-1 (2-(1-(5-isopropylquinolin-2-yl)naphthalene-8-yl)propan-2-ol, 20 g, 56.26 mmol).

MS (m/z): 337.18

(4) Synthesis of Compound F-2

[Reaction Formula 2-4]

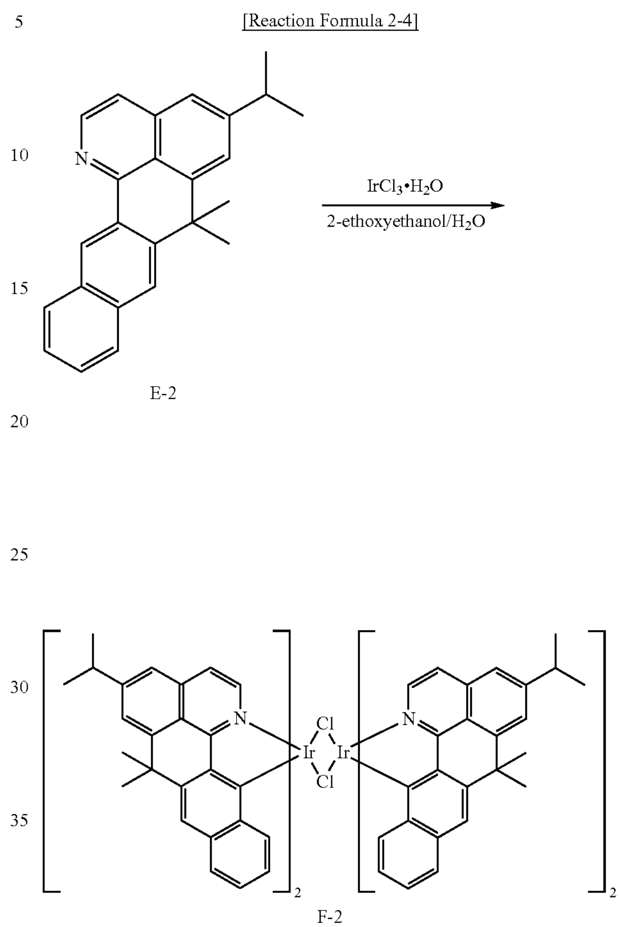

E-2

F-2

The compound F-2 (4.7 g, yield: 34%) was obtained by repeating the synthesis process of the Compound L-1 except that the compound E-2 (11.39 g, 33.76 mmol) was used instead of the compound K-1 (10.25 g, 30.37 mmol).

(5) Synthesis of Compound 2

[Reaction Formula 2-5]

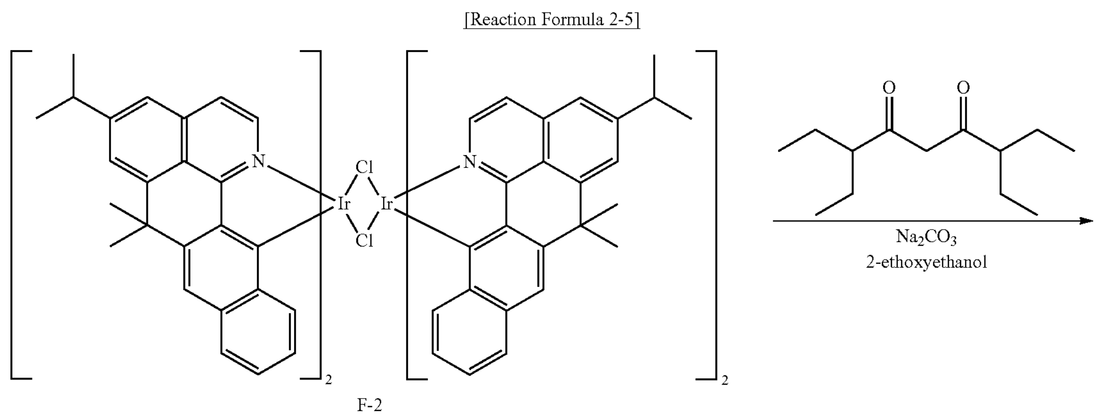

F-2

-continued

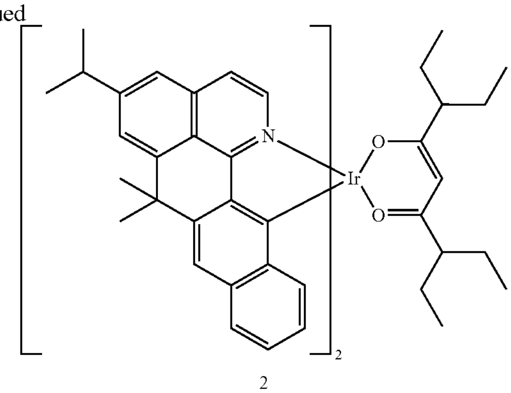

2

The compound 2 (3.2 g, yield: 57%) was obtained by repeating the synthesis process of compound 369 except that the Compound F-2 (4.7 g, 2.61 mmol) was used instead of the compound L-1 (4.0 g, 2.21 mmol).

MS (m/z): 1076.48

Synthesis Example 3: Synthesis of Compound 501 (Compound RD8 in Formula 8)

(1) Synthesis of Compound C-3

[Reaction Formula 3-1]

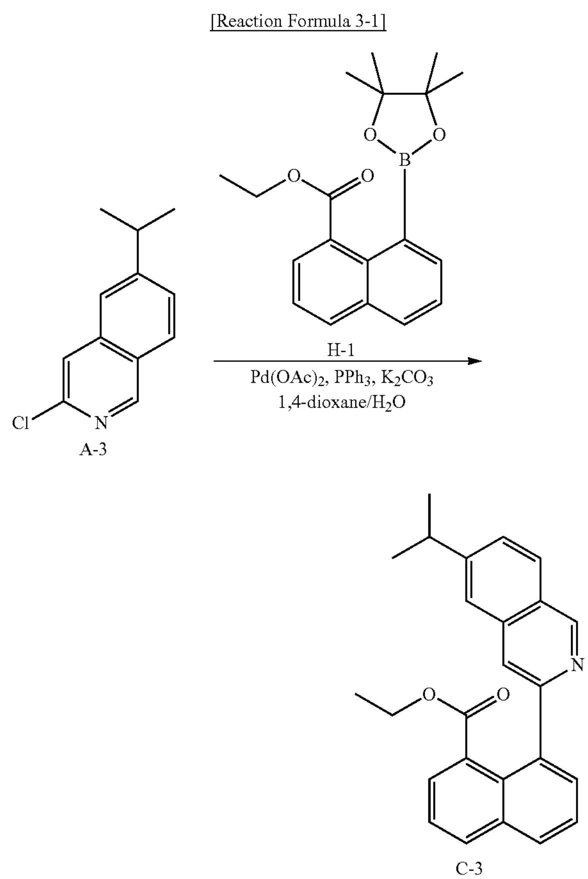

A-3

C-3

The compound C-3 (ethyl 8-6-(isopropylisoquinolin-3-yl)-naphthoate, 12.6 g, yield: 70%) was obtained by repeating the synthesis process of the compound I-1 except that the compound A-3 (3-chloro-6-isopropylisoquinoline, 10 g, 48.62 mmol) was used instead of the compound D-1 (2-chloro-5-isopropylquinoline, 10 g, 48.62 mmol).

MS (m/z): 369.17

(2) Synthesis of Compound D-3

[Reaction Formula 3-2]

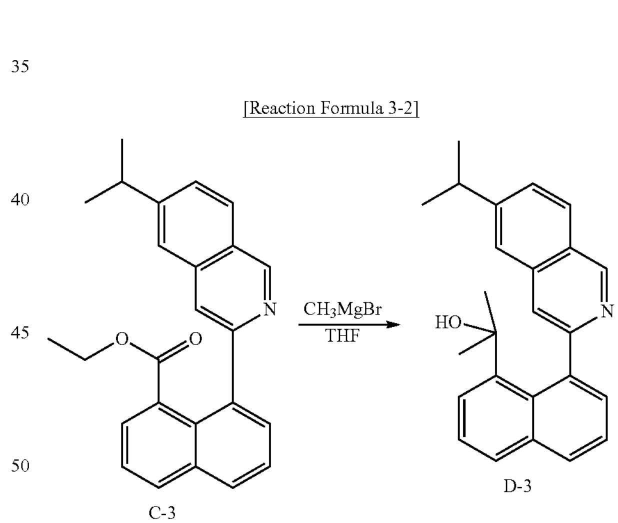

C-3

D-3

The compound D-3 (2-(8-(6-isopropylisoquinolin-3-yl) naphthalen-1-yl)propan-2-ol, 7.3 g, yield: 60%) was obtained by repeating the synthesis process of the Compound J-1 except that the compound C-3 (ethyl 8-(6-isopropylisoquinolin-3-yl)naphthoate, 12.6 g, 34.0 mmol) was used instead of the compound I-1 (ethyl 8-(5-isopropylquinolin-2-yl)naphthalene-1-caroboxylate, 13.5 g, 36.5 mmol).

MS (m/z): 355.19

(3) Synthesis of Compound E-3

[Reaction Formula 3-3]

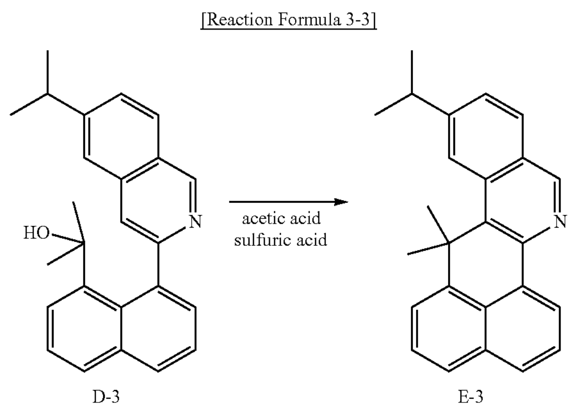

D-3 E-3

The compound E-3 (2-isopropyl-13,13-dimethyl-13H-naphtho[1,8-bc]phenanthridine, 4.3 g, yield: 62%) was obtained by repeating the synthesis process of the Compound K-1 except that the compound D-3 (2-(8-(6-isopropylisoquinolin-3-yl)naphthalen-1-yl)propan-2-ol, 7.3 g, 20.4 mmol) was used instead of the compound J-1 (2-(1-(5-isopropylquinolin-2-yl)naphthalene-8-yl)propan-2-ol, 20 g, 56.26 mmol).

MS (m/z): 337.18

(4) Synthesis of Compound F-3

[Reaction Formula 3-4]

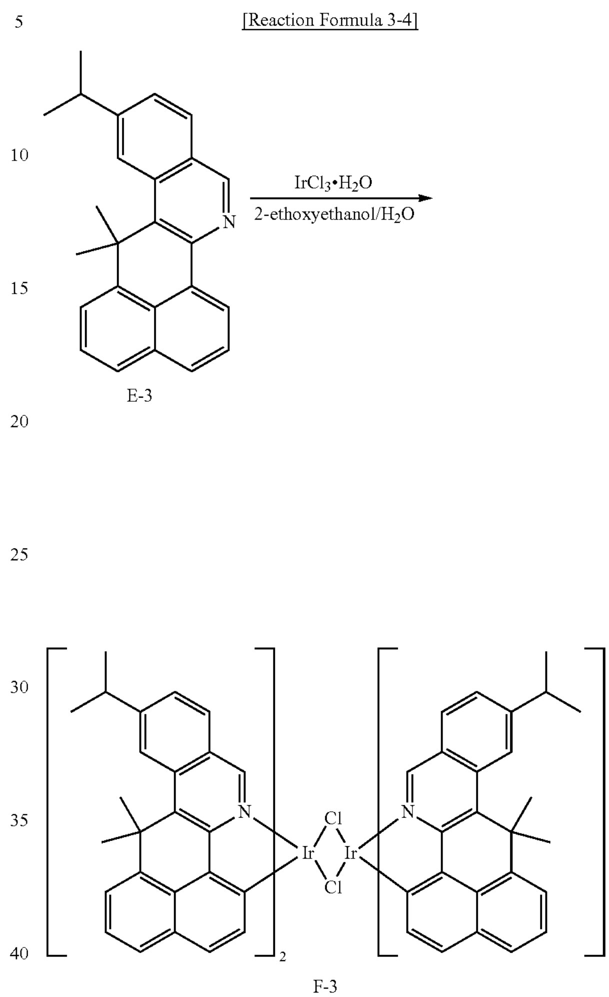

E-3

F-3

The compound F-3 (1.9 g, yield: 37%) was obtained by repeating the synthesis process of the compound L-1 except that the compound E-3 (2-isopropyl-13,13-dimethyl-13H-naphtho[1,8-bc]phenanthridine, 4.3 g, 12.6 mmol) was used instead of the compound K-1 (10.25 g, 30.37 mmol).

(5) Synthesis of Compound 501

[Reaction Formula 3-5]

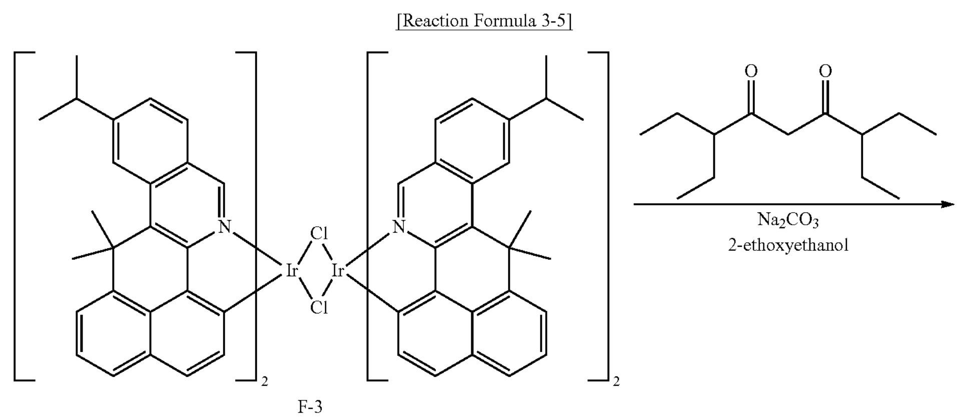

F-3

-continued

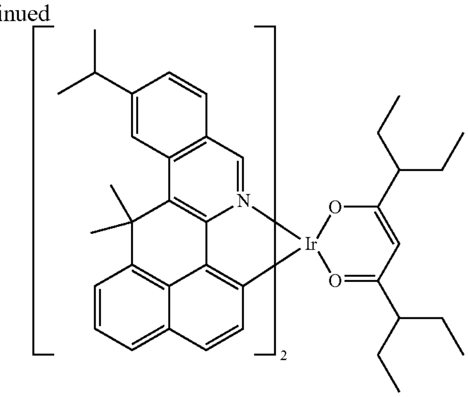

501

The compound 501 (1.4 g, yield: 60%) was obtained by repeating the synthesis process of compound 369 except that the compound F-3 (1.9 g, 1.07 mmol) was used instead of the compound L-1 (4.0 g, 2.21 mmol).

MS (m/z): 1076.48

Synthesis Example 4: Synthesis of Compound 182 (Compound RD6 in Formula 8)

(1) Synthesis of Compound C-4

[Reaction Formula 4-1]

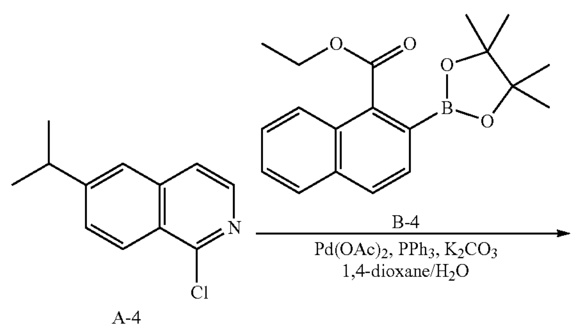

A-4

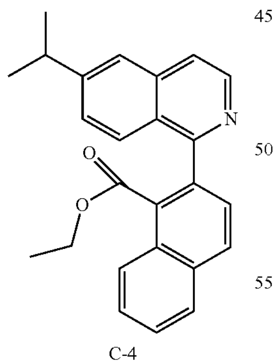

C-4

The compound C-4 (12.2 g, yield: 68%) was obtained by repeating the synthesis process of the compound I-1 except that the compound A-4 (10 g, 48.62 mmol) and the compound B-4 (17.45 g, 53.48 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 369.17

(2) Synthesis of Compound D-4

[Reaction Formula 4-2]

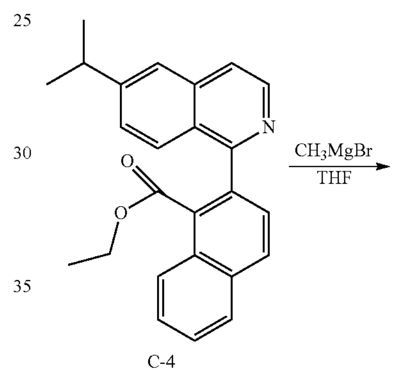

C-4

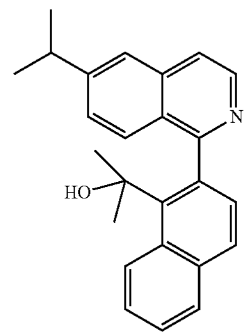

D-4

The compound D-4 (6.8 g, yield: 58%) was obtained by repeating the synthesis process of the compound J-1 except that the compound C-4 (12.2 g, 33.02 mmol) was used instead of the compound I-1 (ethyl 8-(5-isopropylquinolin-2-yl)naphthalene-1-caroboxylate, 13.5 g, 36.5 mmol).

MS (m/z): 355.19

(3) Synthesis of Compound E-4

[Reaction Formula 4-3]

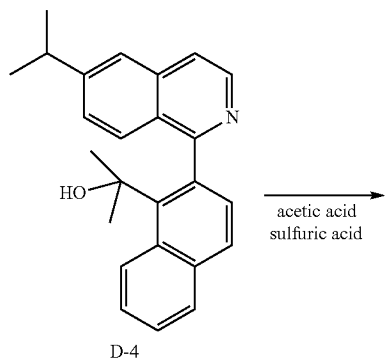

D-4

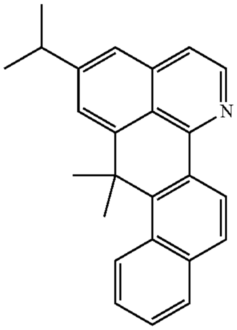

E-4

The compound E-4 (4.1 g, yield: 63%) was obtained by repeating the synthesis process of the compound K-1 except that the compound D-4 (6.8 g, 19.15 mmol) was used instead of the compound J-1 (2-(1-(5-isopropylquinolin-2-yl)naphthalene-8-yl)propan-2-ol, 20 g, 56.26 mmol).

MS (m/z): 337.18

(4) Synthesis of Compound F-4

[Reaction Formula 4-4]

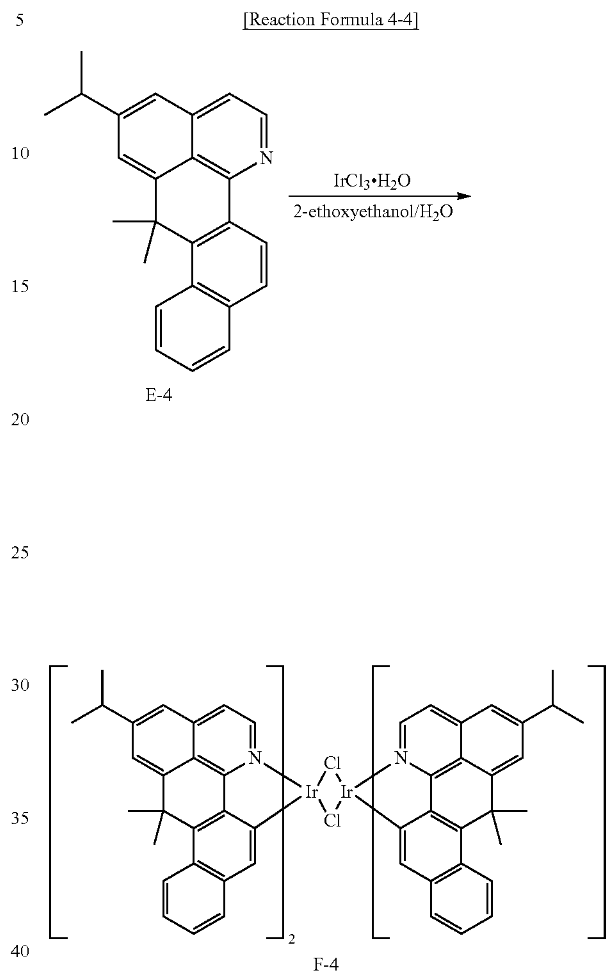

E-4

F-4

The compound F-4 (2.1 g, yield: 42%) was obtained by repeating the synthesis process of the compound L-1 except that the compound E-4 (4.1 g, 12.15 mmol) was used instead of the compound K-1 (10.25 g, 30.37 mmol).

(5) Synthesis of Compound 182

[Reaction Formula 4-5]

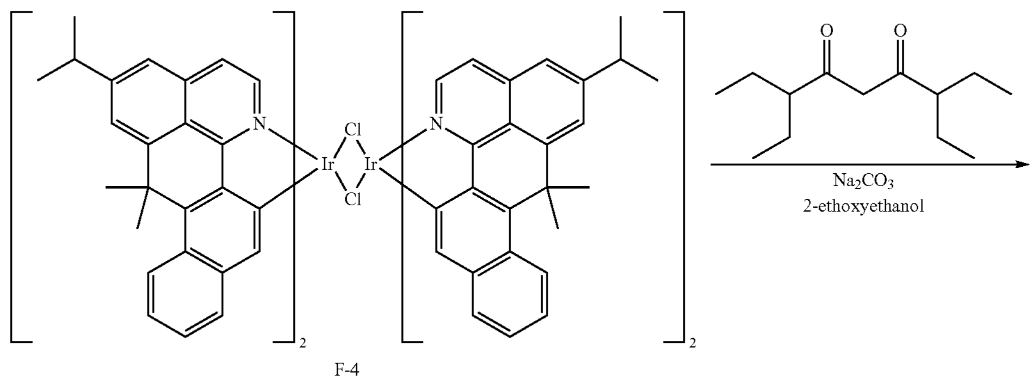

F-4

-continued

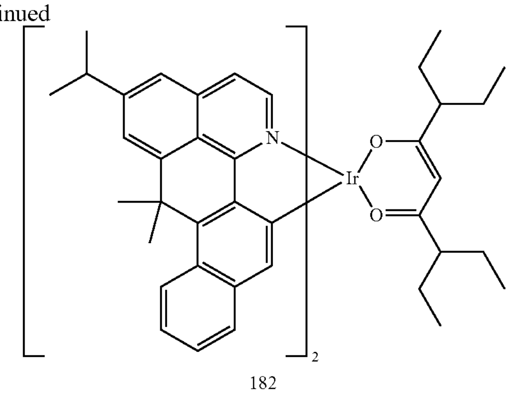

182

The compound 182 (1.1 g, yield: 57%) was obtained by repeating the synthesis process of compound 369 except that the compound F-4 (2.1 g, 1.17 mmol) was used instead of the compound L-1 (4.0 g, 2.21 mmol).

MS (m/z): 1076.48

Synthesis Example 5: Synthesis of Compound 154 (Compound RD9 in Formula 8)

(1) Synthesis of Compound C-5

[Reaction Formula 5-1]

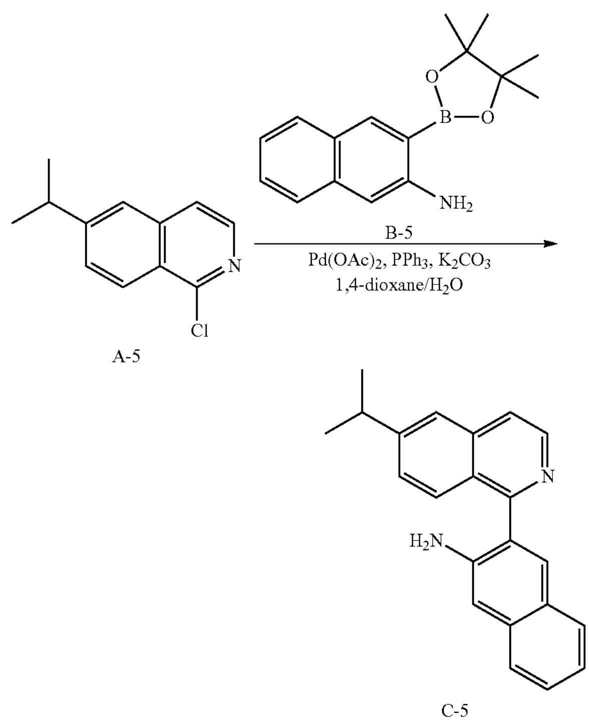

A-5

C-5

The compound C-5 (11.8 g, yield: 78%) was obtained by repeating the synthesis process of the compound I-1 except that the compound A-5 (10 g, 48.62 mmol) and the compound B-5 (14.4 g, 53.48 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 312.16

(2) Synthesis of Compound D-5

[Reaction Formula 5-2]

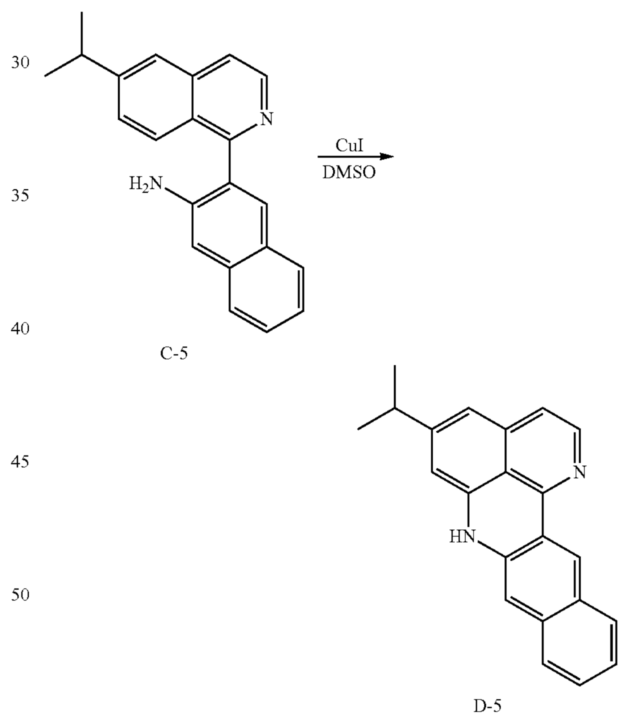

C-5

D-5

The compound C-5 (11.8 g, 37.75 mmol) and dimethylsulfoxide (DMSO) (200 mL) were put into a reaction vessel, then CuI (10.8 g, 56.66 mmol) was added into the reaction vessel, and then the solution was refluxed at 150° C. for 12 hours. After the reaction was complete, the solution was filtered, extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the compound D-5 (4.6 g, yield: 39%).

MS (m/z): 310.15

(3) Synthesis of Compound E-5

[Reaction Formula 5-3]

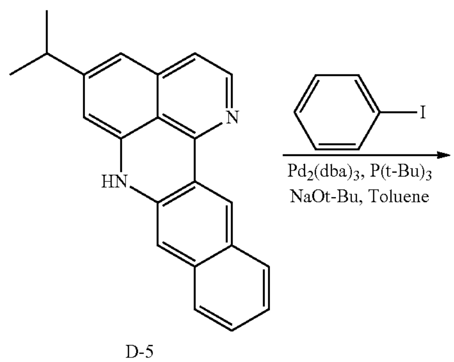

D-5

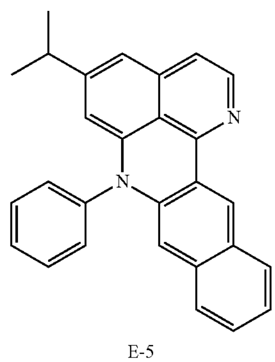

E-5

The compound D-5 (4.6 g, 14.82 mmol), 1-iodobenzene (3.3 g, 16.30 mmol) and toluene (200 mL) were put into a reaction vessel, then $Pd_2(dba)_3$ (0.7 g, 0.74 mmol), $P(t-Bu)_3$ (Tri-tert-butylphosphine, 0.3 g, 1.48 mmol) and NaOt-Bu (sodium tert-butoxide, 2.8 g, 29.64 mmol) were added into the reaction vessel, and then the solution was refluxed at 100° C. for 24 hours. After the reaction was complete, the solution was extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the compound E-5 (4.6 g, yield: 81%).

MS (m/z): 386.18

(4) Synthesis of Compound F-5

[Reaction Formula 5-4]

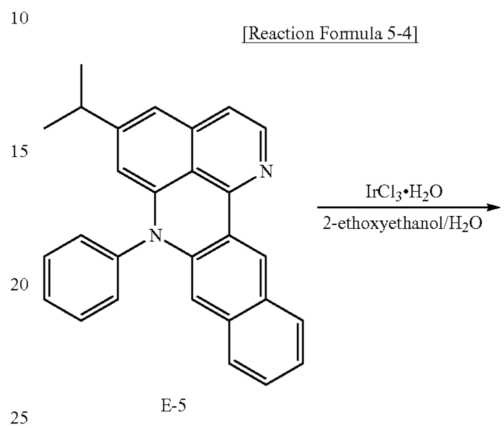

E-5

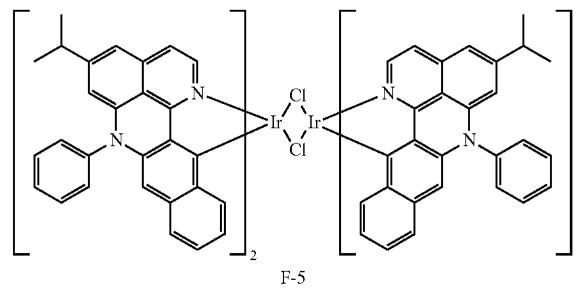

F-5

The compound F-5 (2.5 g, yield: 47%) was obtained by repeating the synthesis process of the compound L-1 except that the compound E-5 (4.6 g, 11.90 mmol) was used instead of the compound K-1 (10.25 g, 30.37 mmol).

(5) Synthesis of Compound 154

[Reaction Formula 5-5]

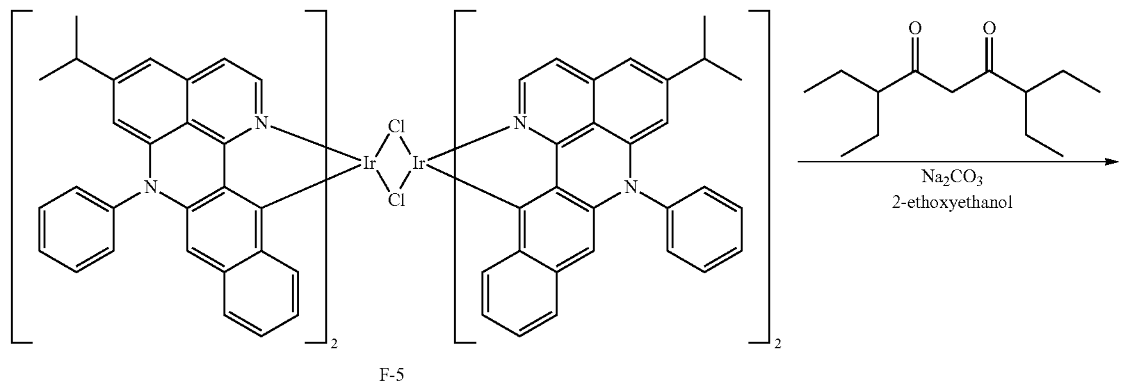

F-5

-continued

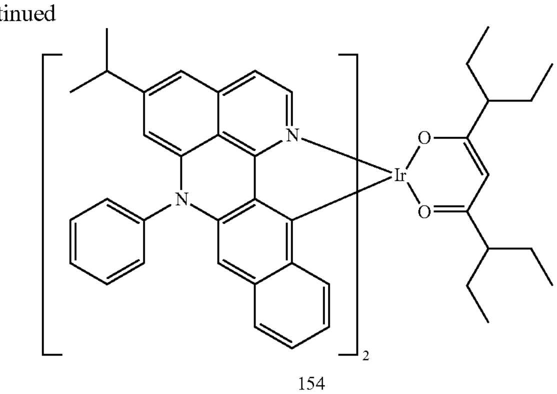

154

The compound 154 (1.4 g, yield: 46%) was obtained by repeating the synthesis process of compound 369 except that the compound F-5 (2.5 g, 1.25 mmol) was used instead of the compound L-1 (4.0 g, 2.21 mmol).

MS (m/z): 1174.47

Synthesis Example 6: Synthesis of Compound 334 (Compound RD10 in Formula 8)

(1) Synthesis of Compound C-6

[Reaction Formula 6-1]

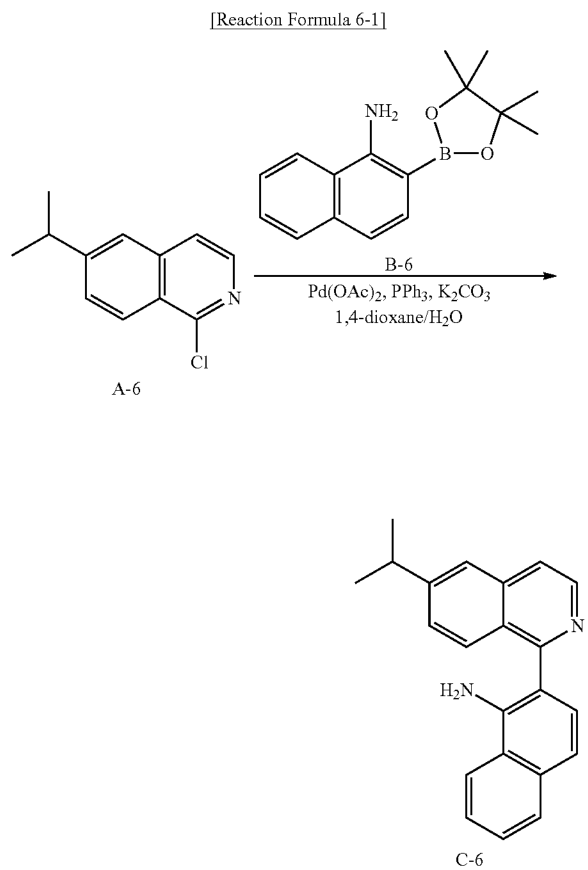

B-6

A-6

C-6

The compound C-6 (11.4 g, yield: 75%) was obtained by repeating the synthesis process of the compound I-1 except that the compound A-6 (10 g, 48.62 mmol) and the compound B-6 (14.4 g, 53.48 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 312.16

(2) Synthesis of Compound D-6

[Reaction Formula 6-2]

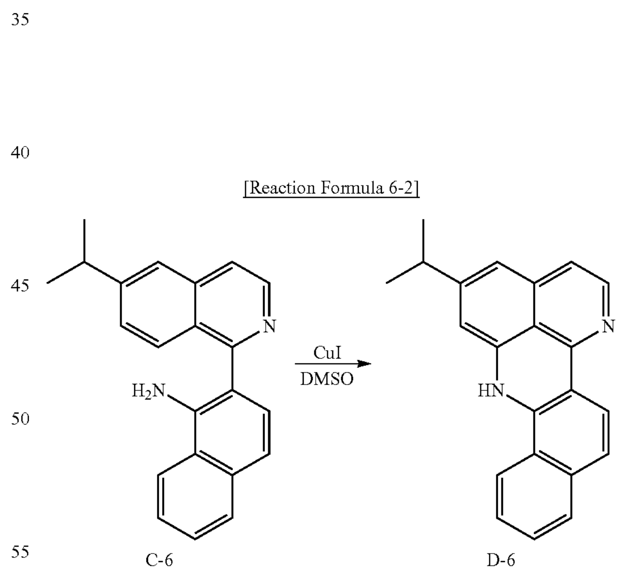

C-6

D-6

The compound D-6 (6.8 g, yield: 58%) was obtained by repeating the synthesis process of the compound D5 except that the compound C-6 (11.4 g, 35.49 mmol) was used instead of the compound C-5 (11.8 g, 37.77 mmol).

MS (m/z): 310.15

(3) Synthesis of Compound E-6

[Reaction Formula 6-3]

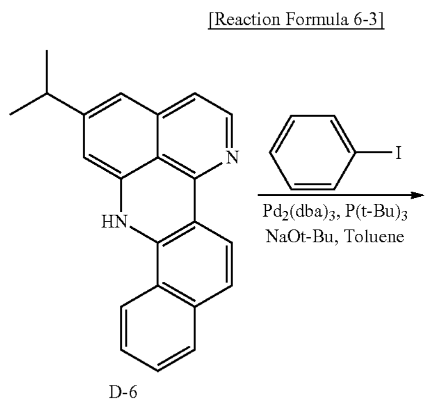

D-6

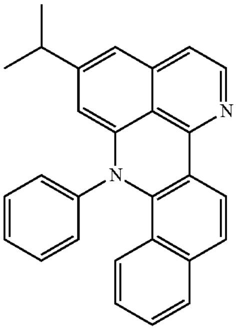

E-6

The compound E-6 (5.6 g, yield: 78%) was obtained by repeating the synthesis process of the compound E-5 except that the compound D-6 (5.8 g, 18.61 mmol) was used instead of the compound D-5 (4.6 g, 14.82 mmol).

MS (m/z): 386.18

(4) Synthesis of Compound F-6

[Reaction Formula 6-4]

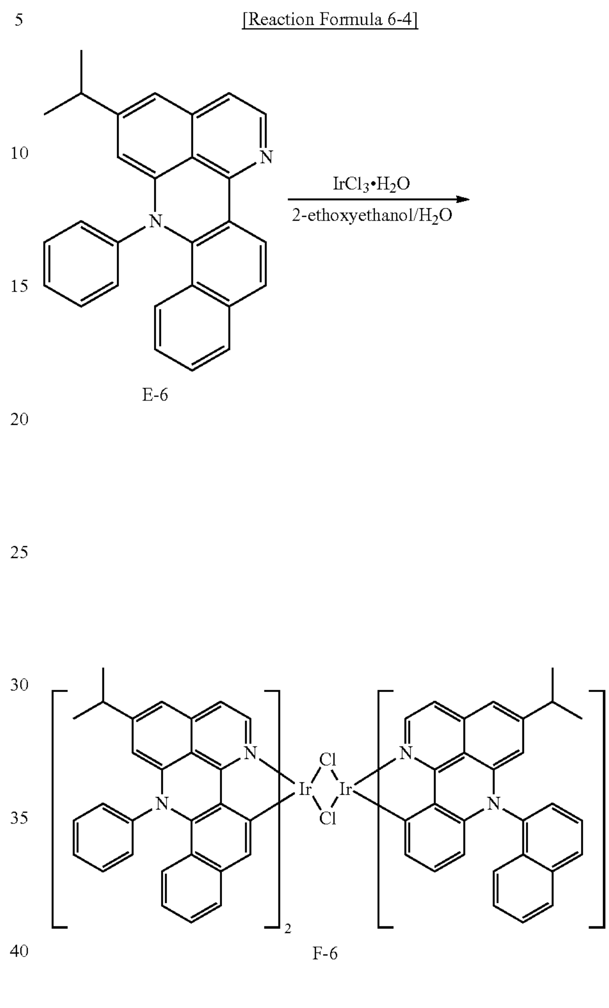

E-6

F-6

The compound F-6 (2.8 g, yield: 42%) was obtained by repeating the synthesis process of the compound L-1 except that the compound E-6 (5.6 g, 14.49 mmol) was used instead of the compound K-1 (10.25 g, 30.37 mmol).

(5) Synthesis of Compound 334

[Reaction Formula 6-5]

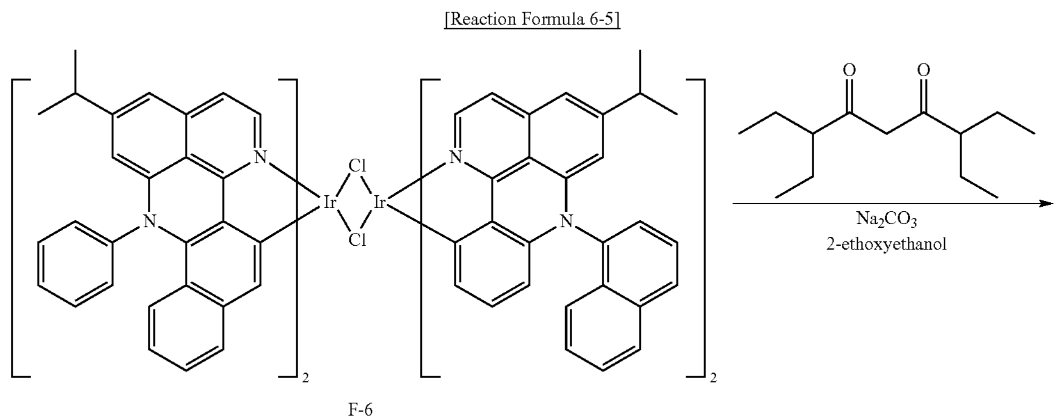

F-6

-continued

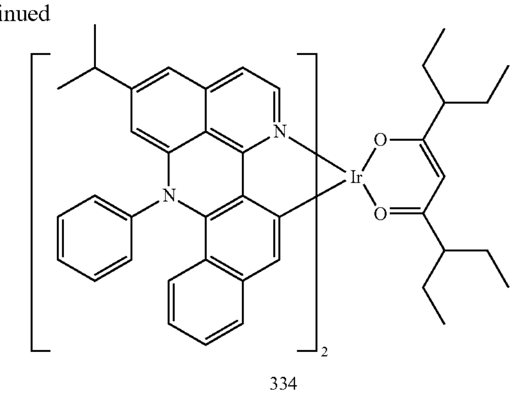

334

The compound 334 (2.0 g, yield: 61%) was obtained by repeating the synthesis process of compound 369 except that the compound F-6 (2.8 g, 1.38 mmol) was used instead of the compound L-1 (4.0 g, 2.21 mmol).

MS (m/z): 1174.47

Synthesis Example 7: Synthesis of Compound 465 (Compound RD11 in Formula 8)

(1) Synthesis of Compound C-7

[Reaction Formula 7-1]

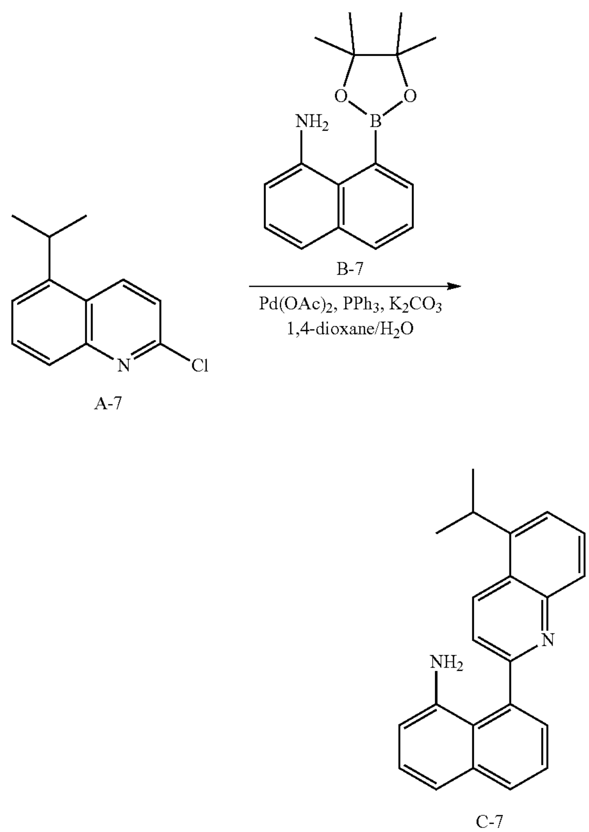

B-7

A-7

C-7

The compound C-7 (9.0 g, yield: 50%) was obtained by repeating the synthesis process of the compound I-1 except that the compound A-7 (10 g, 48.62 mmol) and the compound B-7 (14.4 g, 53.48 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 312.16

(2) Synthesis of Compound D-7

[Reaction Formula 7-2]

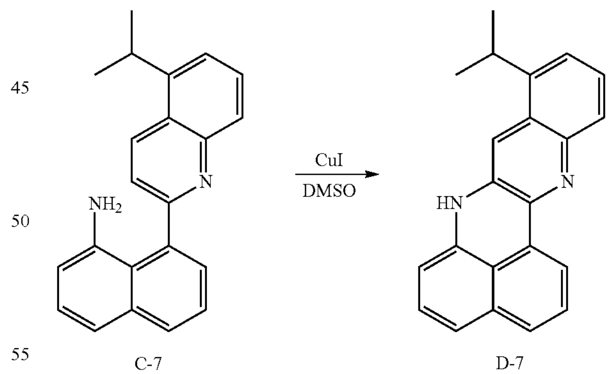

C-7

D-7

The compound D-7 (7.4 g, yield: 55%) was obtained by repeating the synthesis process of the compound D-5 except that the compound C-7 (9.0 g, 28.69 mmol) was used instead of the compound C-5 (11.8 g, 37.77 mmol).

MS (m/z): 310.15

(3) Synthesis of Compound E-7

[Reaction Formula 7-3]

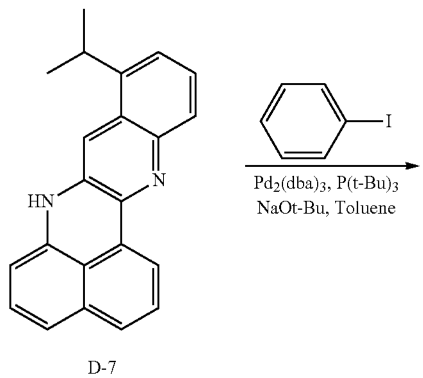

D-7

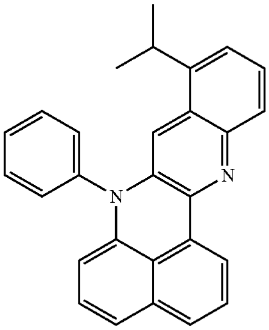

E-7

The compound E-7 (4.7 g, yield: 77%) was obtained by repeating the synthesis process of the compound E-5 except that the compound D-7 (4.9 g, 15.78 mmol) was used instead of the compound D-5 (4.6 g, 14.82 mmol).

MS (m/z): 386.18

(4) Synthesis of Compound F-7

[Reaction Formula 7-4]

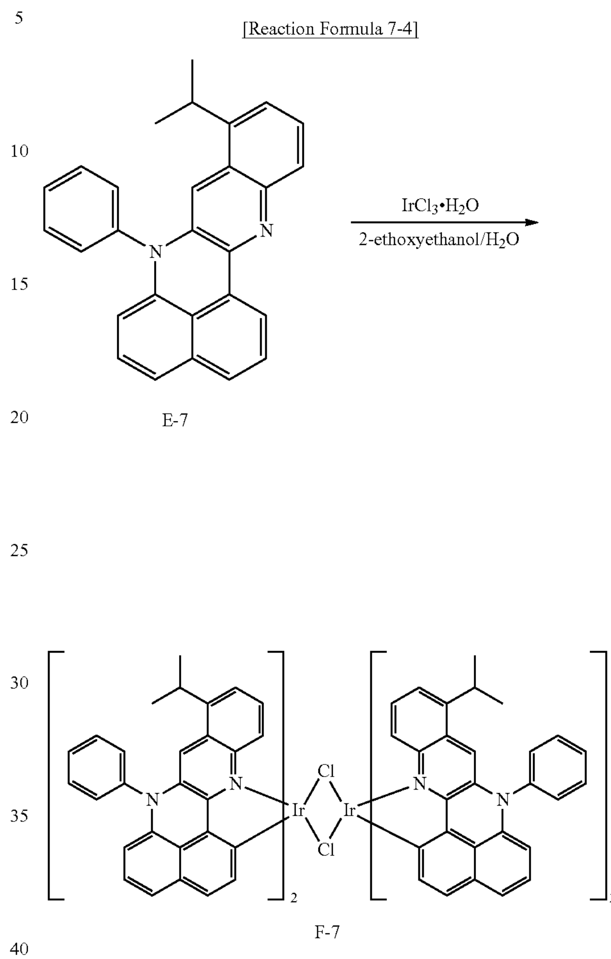

E-7

F-7

The compound F-7 (2.6 g, yield: 48%) was obtained by repeating the synthesis process of the compound L-1 except that the compound E-7 (4.7 g, 12.16 mmol) was used instead of the compound K-1 (10.25 g, 30.37 mmol).

(5) Synthesis of Compound 465

[Reaction Formula 7-5]

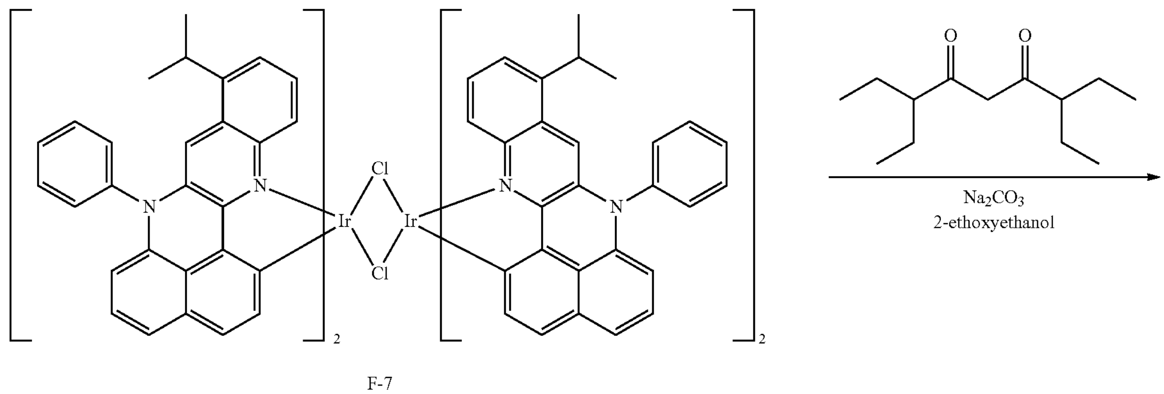

F-7

-continued

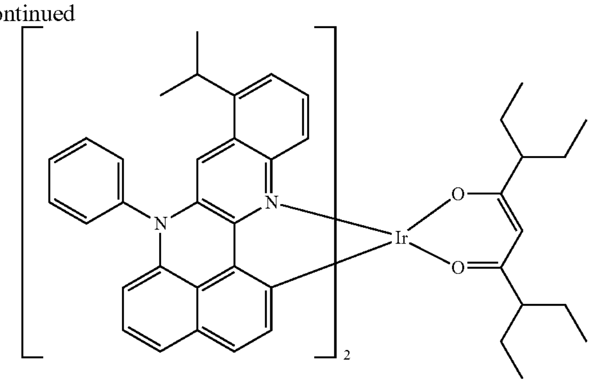

465

The compound 465 (2.0 g, yield: 64%) was obtained by repeating the synthesis process of compound 369 except that the compound F-7 (2.6 g, 1.33 mmol) was used instead of the compound L-1 (4.0 g, 2.21 mmol).

MS (m/z): 1174.47

Synthesis Example 8: Synthesis of Compound 582 (Compound RD12 in Formula 8)

(1) Synthesis of Compound C-8

[Reaction Formula 8-1]

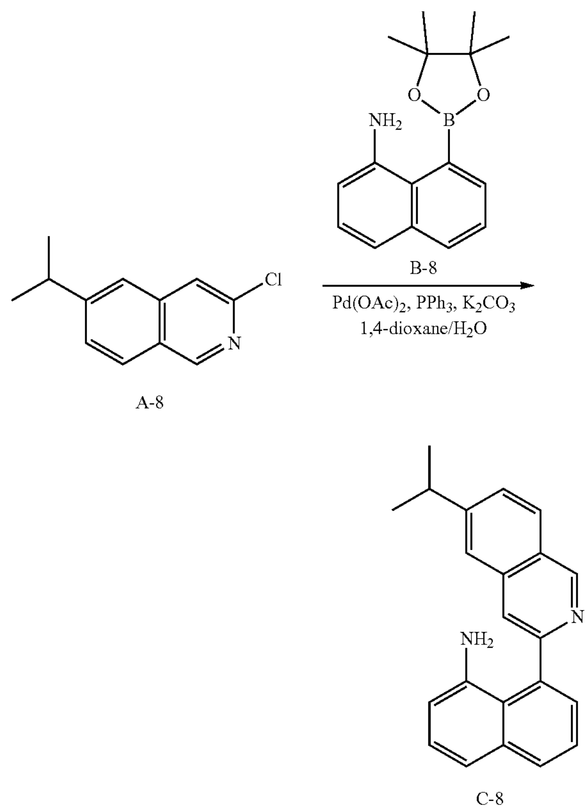

A-8

C-8

The compound C-8 (9.0 g, yield: 50%) was obtained by repeating the synthesis process of the compound I-1 except that the compound A-8 (10 g, 48.62 mmol) and the compound B-8 (14.4 g, 53.48 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 312.16

(2) Synthesis of Compound D-8

[Reaction Formula 8-2]

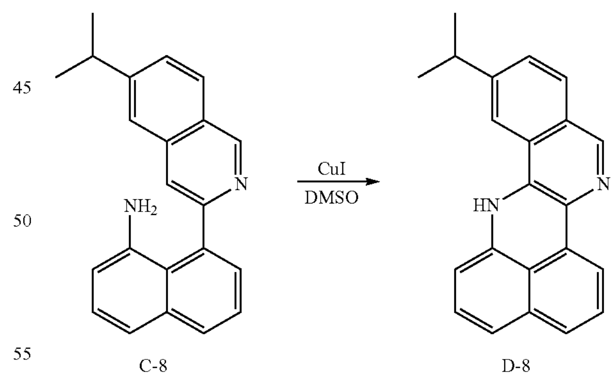

C-8 D-8

The compound D-8 (7.4 g, yield: 55%) was obtained by repeating the synthesis process of the compound D-5 except that the compound C-8 (10.0 g, 35.01 mmol) was used instead of the compound C-5 (11.8 g, 37.77 mmol).

MS (m/z): 310.15

(3) Synthesis of Compound E-8

[Reaction Formula 8-3]

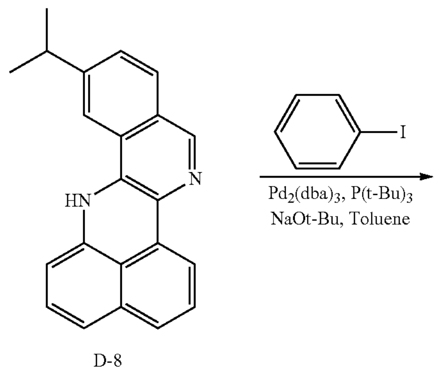

D-8

E-8

The compound E-8 (5.3 g, yield: 83%) was obtained by repeating the synthesis process of the compound E-5 except that the compound D-8 (5.1 g, 15.45 mmol) was used instead of the compound D-5 (4.6 g, 14.82 mmol).

MS (m/z): 386.18

(4) Synthesis of Compound F-8

[Reaction Formula 8-4]

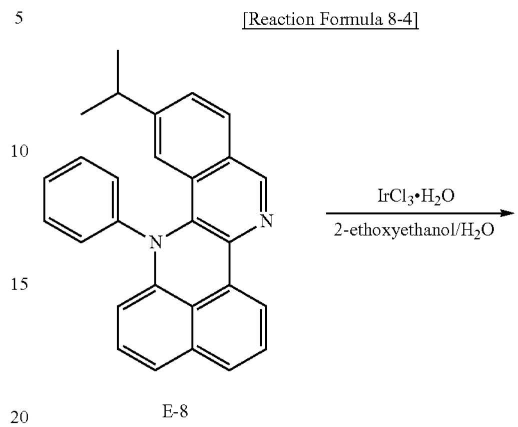

E-8

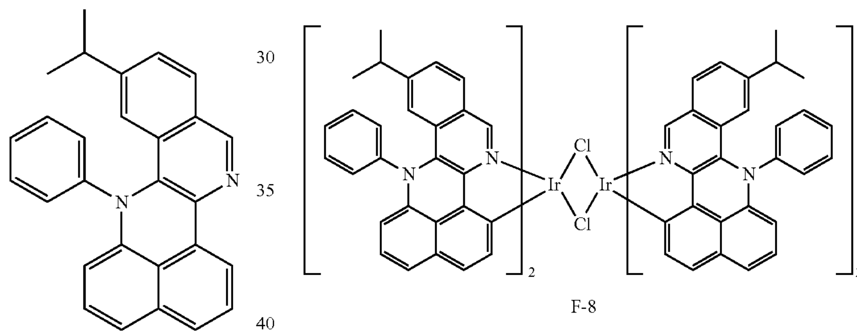

F-8

The compound F-8 (2.4 g, yield: 39%) was obtained by repeating the synthesis process of the compound L-1 except that the compound E-8 (5.3 g, 13.66 mmol) was used instead of the compound K-1 (10.25 g, 30.37 mmol).

(5) Synthesis of Compound 582

[Reaction Formula 8-5]

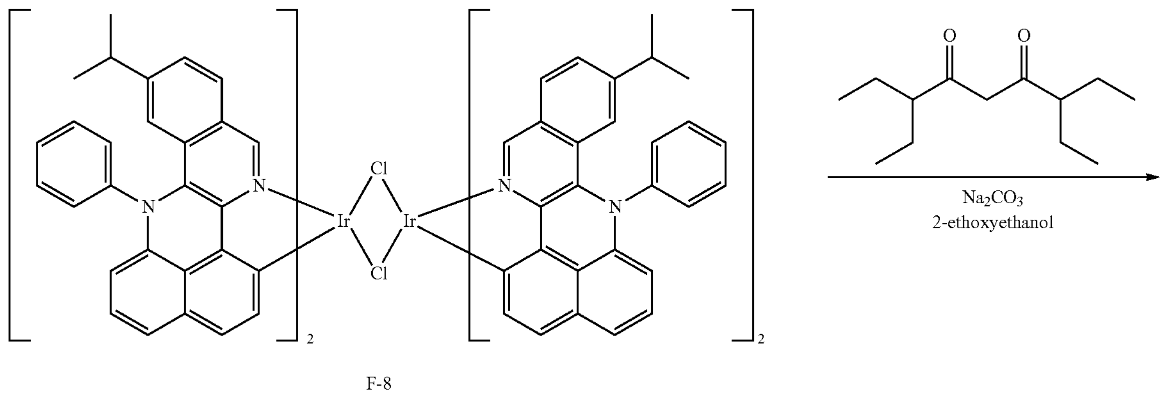

F-8

-continued

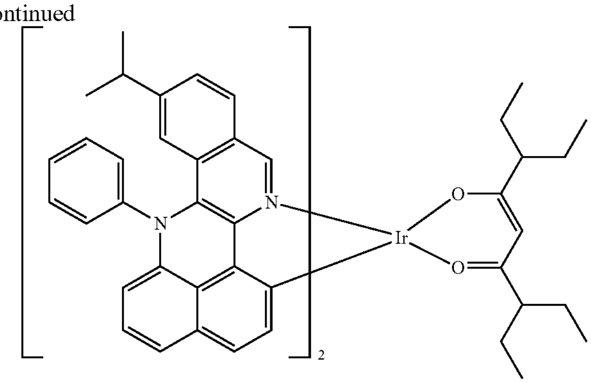

582

The compound 582 (1.8 g, yield: 64%) was obtained by repeating the synthesis process of $P_{GP}$-$9_3$, $C_3$ compound 369 except that the compound F-8 (2.4 g, 1.1 mmol) was used instead of the compound L-1 (4.0 g, 2.21 mmol).

MS (m/z): 1174.47

Synthesis Example 9: Synthesis of Compound 168 (Compound RD13 in Formula 8)

(1) Synthesis of Compound C-9

[Reaction Formula 9-1]

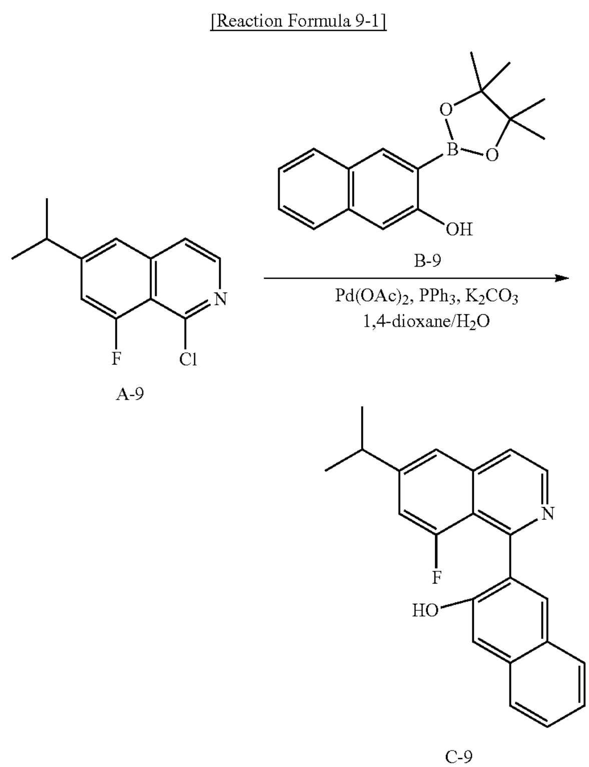

B-9

A-9

C-9

The compound C-9 (9.9 g, yield: 67%) was obtained by repeating the synthesis process of the compound I-1 except that the compound A-9 (10 g, 44.71 mmol) and the compound B-9 (13.3 g, 49.18 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 331.14

(2) Synthesis of Compound D-9

[Reaction Formula 9-2]

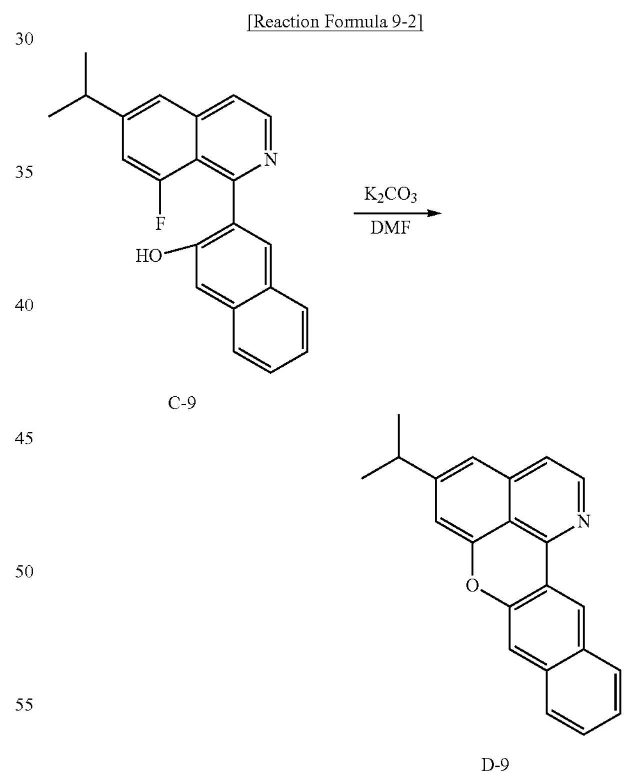

C-9

D-9

The compound C-9 (9.9 g, 29.88 mmol) and DMF (100 mL) were put into a reaction vessel, and the compound C-9 was dissolved in DMF, $K_2CO_3$ (12.4 g, 89.62 mmol) was added into the reaction vessel, and then the solution was stirred at 100° C. for 1 hour. After the reaction was complete, the solution was cooled to room temperature and then ethanol (100 mL) was added into the reaction vessel. After the mixture was distilled under reduced pressure, the reactants were recrystallized with chloroform/ethyl acetate to give the compound D-9 (4.9 g, yield: 53%).

MS (m/z): 311.13

(3) Synthesis of Compound E-9

[Reaction Formula 9-3]

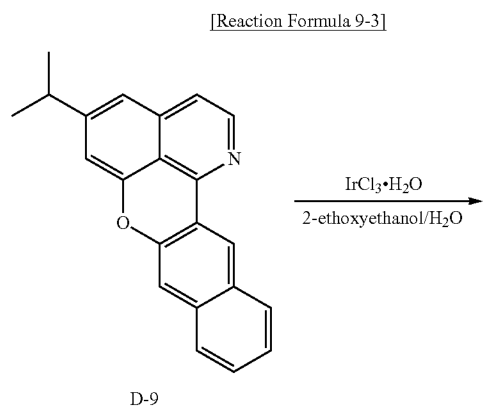

D-9

-continued

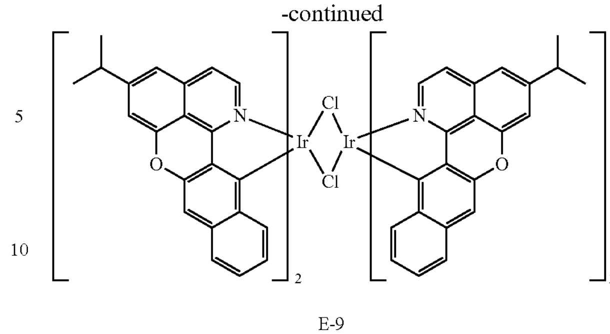

E-9

The compound E-9 (3.1 g, yield: 50%) was obtained by repeating the synthesis process of the compound L-1 except that the compound D-9 (4.9 g, 15.83 mmol) was used instead of the compound K-1 (10.25 g, 30.37 mmol).

(4) Synthesis of Compound 168

[Reaction Formula 9-4]

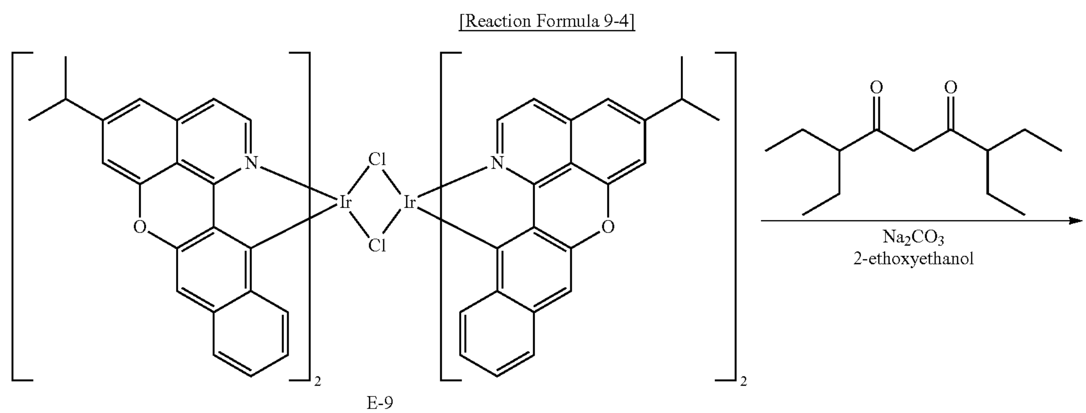

E-9

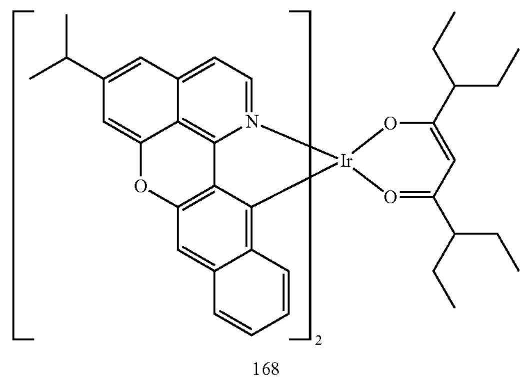

168

The compound 168 (2.0 g, yield: 54%) was obtained by repeating the synthesis process of compound 369 except that the compound E-9 (3.1 g, 1.80 mmol) was used instead of the Compound L-1 (4.0 g, 2.21 mmol).

MS (m/z): 1024.38

Synthesis Example 10: Synthesis of Compound 348 (Compound RD14 in Formula 8)

(1) Synthesis of Compound C-10

[Reaction Formula 10-1]

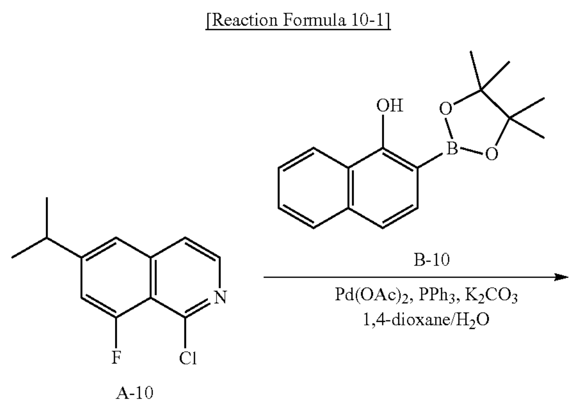

A-10

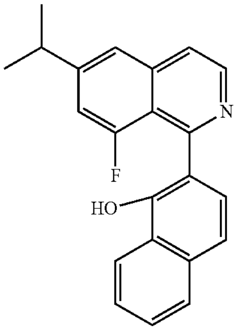

C-10

The compound C-10 (9.0 g, yield: 64%) was obtained by repeating the synthesis process of the compound I-1 except that the compound A-10 (10 g, 44.71 mmol) and the compound B-10 (13.3 g, 49.18 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 331.14

(2) Synthesis of Compound D-10

[Reaction Formula 10-2]

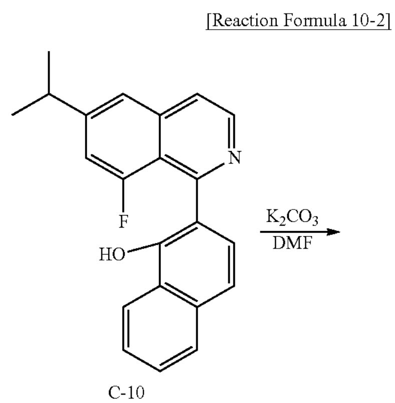

C-10

-continued

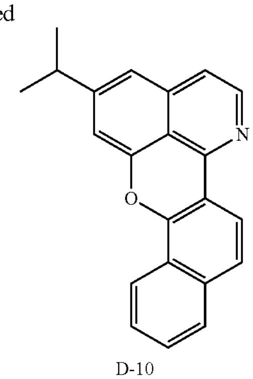

D-10

The compound D-10 (5.0 g, yield: 55%) was obtained by repeating the synthesis process of the compound D-9 except that the compound C-10 (9.6 g, 29.06 mmol) was used instead of the compound C-9 (9.9 g, 28.88 mmol).

MS (m/z): 311.13

(3) Synthesis of Compound E-10

[Reaction Formula 10-3]

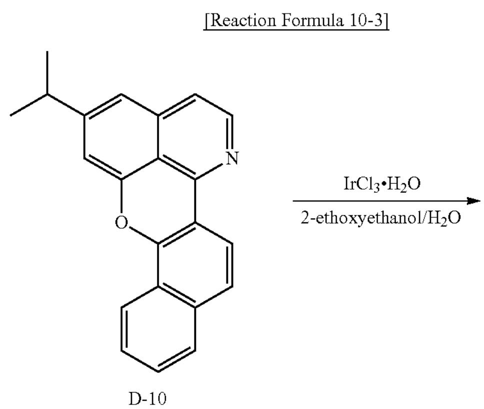

D-10

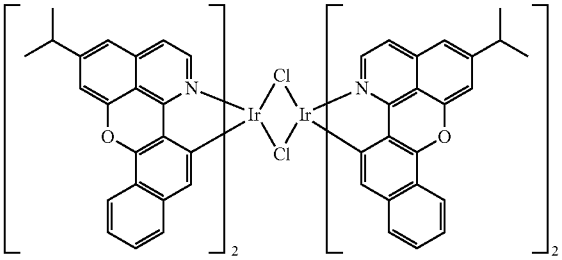

E-10

The compound E-10 (3.5 g, yield: 57%) was obtained by repeating the synthesis process of the compound L-1 except that the compound D-10 (5.0 g, 15.98 mmol) was used instead of the compound K-1 (10.25 g, 30.37 mmol).

(4) Synthesis of Compound 348

[Reaction Formula 10-4]

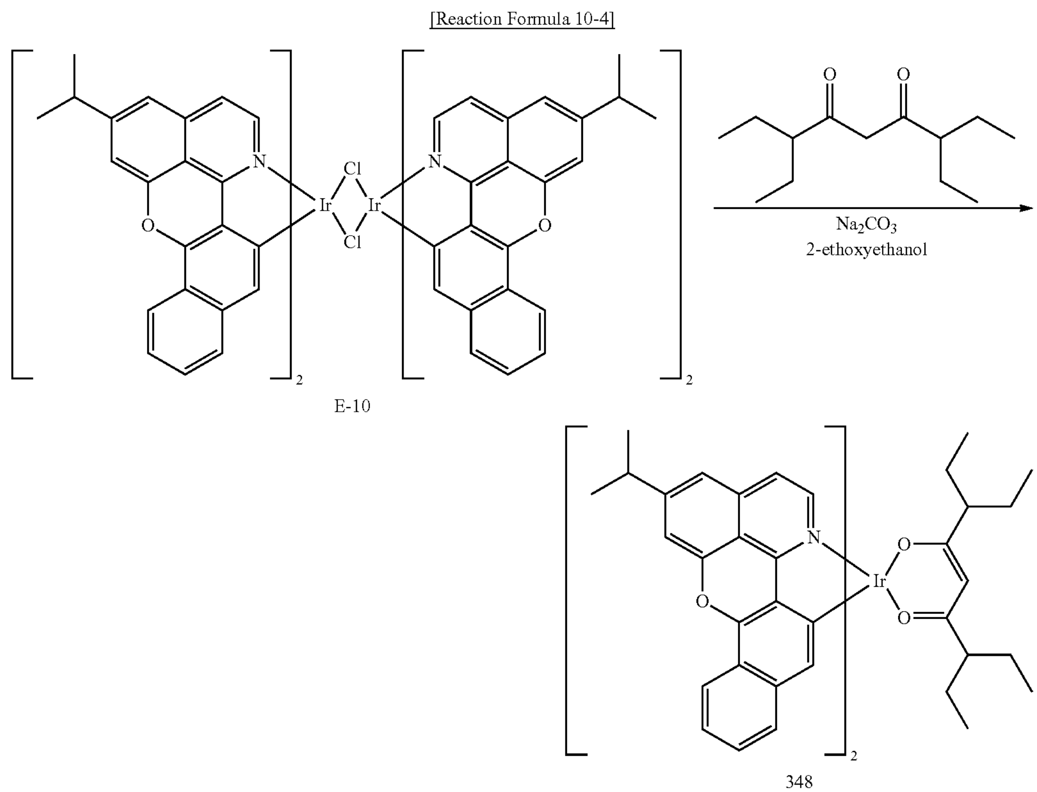

E-10

348

The compound 348 (1.8 g, yield: 43%) was obtained by repeating the synthesis process of compound 369 except that the compound E-10 (3.5 g, 2.07 mmol) was used instead of the compound L-1 (4.0 g, 2.21 mmol).

MS (m/z): 1024.38

Synthesis Example 11: Synthesis of Compound 483 (Compound RD15 in Formula 8)

(1) Synthesis of Compound C-11

[Reaction Formula 11-1]

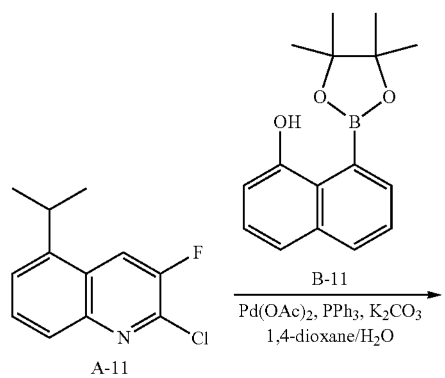

A-11

B-11

-continued

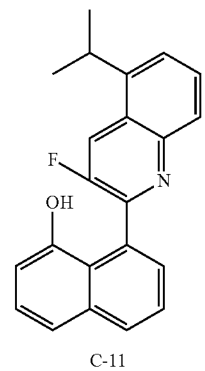

C-11

The compound C-11 (7.9 g, yield: 53%) was obtained by repeating the synthesis process of the compound I-1 except that the compound A-11 (10 g, 44.71 mmol) and the compound B-11 (13.3 g, 49.18 mmol) were used instead of the Compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 331.14

(2) Synthesis of Compound D-11

[Reaction Formula 11-2]

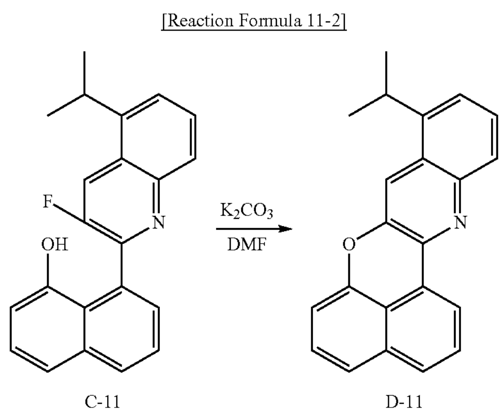

C-11 D-11

The compound D-11 (3.8 g, yield: 51%) was obtained by repeating the synthesis process of the compound D-9 except that the compound C-11 (7.9 g, 23.07 mmol) was used instead of the compound C-9 (9.9 g, 28.88 mmol).

MS (m/z): 311.13

(3) Synthesis of Compound E-11

[Reaction Formula 11-3]

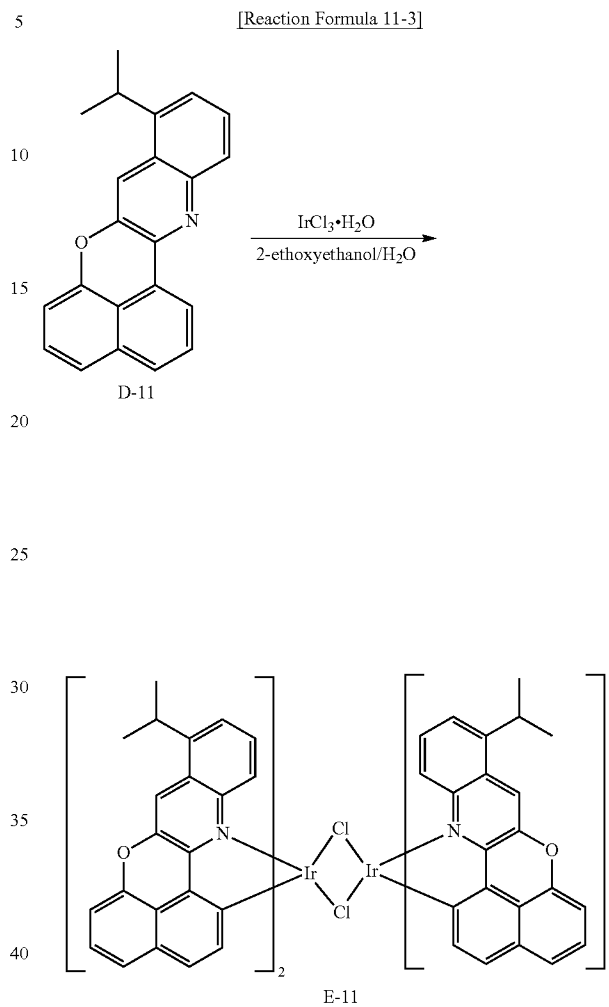

D-11

E-11

The compound E-11 (3.0 g, yield: 63%) was obtained by repeating the synthesis process of the compound L-1 except that the compound D-11 (3.8 g, 12.20 mmol) was used instead of the compound K-1 (10.25 g, 30.37 mmol).

(4) Synthesis of Compound 483

[Reaction Formula 11-4]

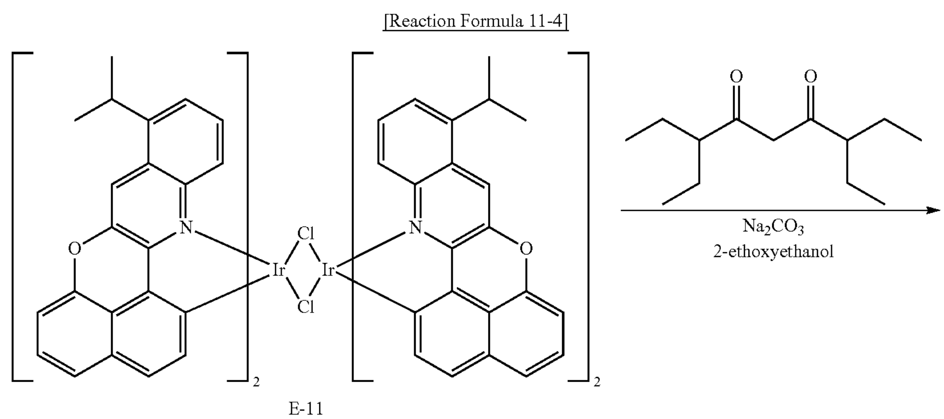

E-11

-continued

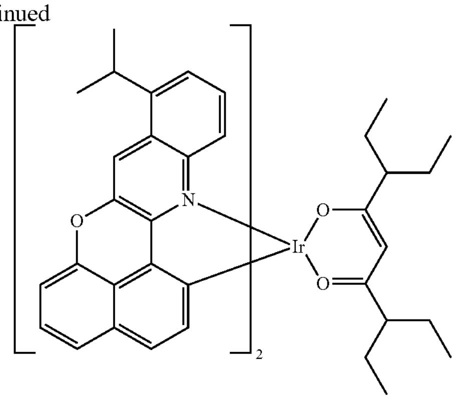

483

The compound 483 (1.6 g, yield: 44%) was obtained by repeating the synthesis process of compound 369 except that the compound E-11 (3.0 g, 1.75 mmol) was used instead of the compound L-1 (4.0 g, 2.21 mmol).

MS (m/z): 1024.38

Synthesis Example 12: Synthesis of Compound 598 (Compound RD16 in Formula 8)

(1) Synthesis of Compound C-12

[Reaction Formula 12-1]

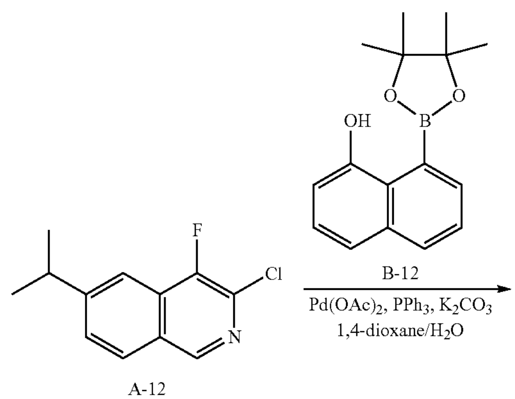

B-12

A-12

C-12

The compound C-12 (9.8 g, yield: 66%) was obtained by repeating the synthesis process of the compound I-1 except that the compound A-12 (10 g, 44.71 mmol) and the compound B-12 (13.3 g, 49.18 mmol) were used instead of the compound D-1 (2-chloro-5-isopropylquinoline, 10 g, 48.62 mmol) and the compound H-1 (ethyl 8-(4,4,5,5-tetramethyl-1,3,2-dioxanborolan-2-yl)naphthalene-1-carboxlate (17.45 g, 53.48 mmol), respectively.

MS (m/z): 331.14

(2) Synthesis of Compound D-12

[Reaction Formula 12-2]

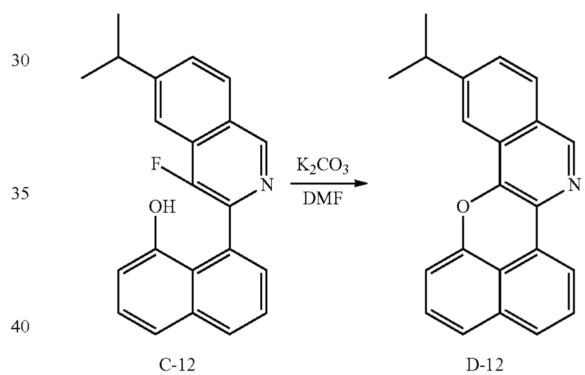

C-12 D-12

The compound D-12 (5.0 g, yield: 54%) was obtained by repeating the synthesis process of the compound D-9 except that the compound C-12 (9.8 g, 29.51 mmol) was used instead of the compound C-9 (9.9 g, 28.88 mmol).

MS (m/z): 311.13

(3) Synthesis of Compound E-12

[Reaction Formula 12-3]

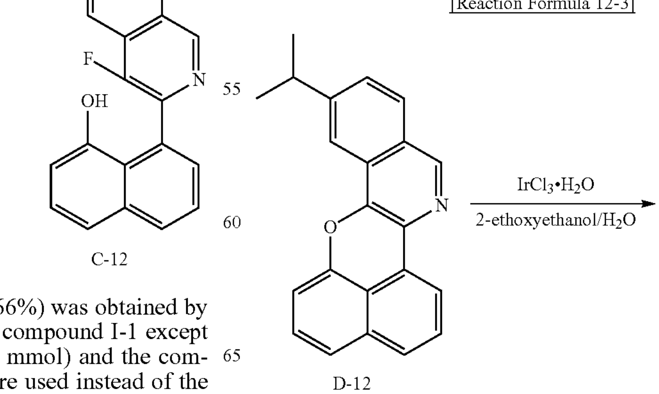

D-12

-continued
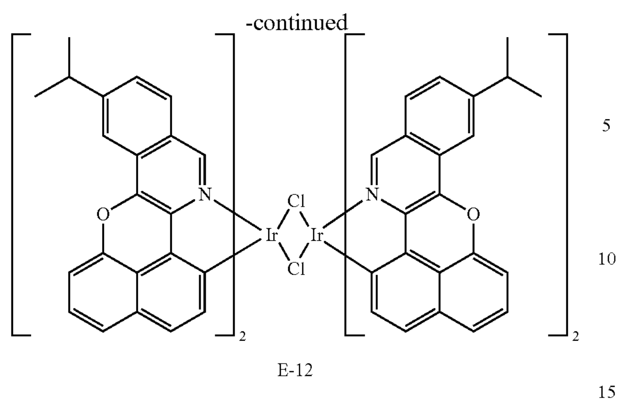
E-12
The compound E-12 (3.4 g, yield: 55%) was obtained by repeating the synthesis process of the compound L-1 except that the compound D-12 (5.0 g, 15.93 mmol) was used instead of the compound K-1 (10.25 g, 30.37 mmol).
(4) Synthesis of Compound 598
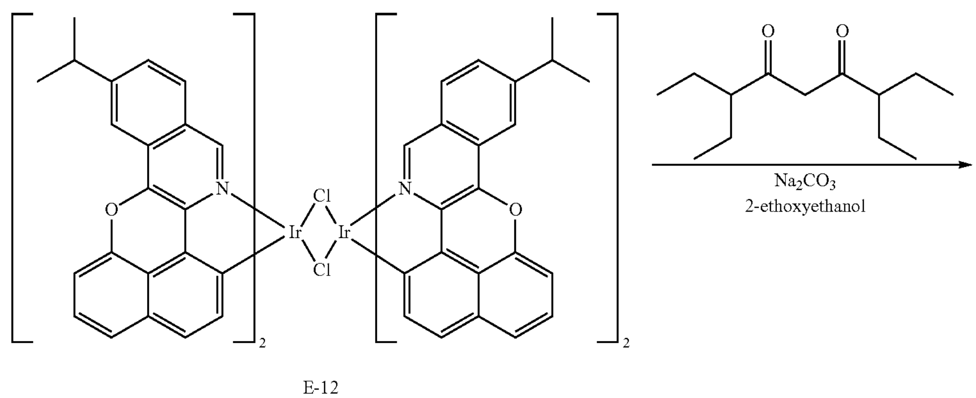
E-12
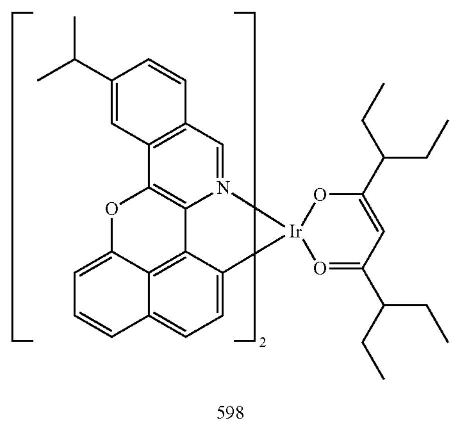
598
The compound 598 (1.6 g, yield: 39%) was obtained by repeating the synthesis process of compound 369 except that the compound E-12 (3.4 g, 1.99 mmol) was used instead of the compound L-1 (4.0 g, 2.21 mmol).
MS (m/z): 1024.38

Synthesis Example 13: Synthesis of Compound RD1 (Compound 4 in Formula 1-24)

(1) Synthesis of Compound B-1

[Reaction Formula 13-1]

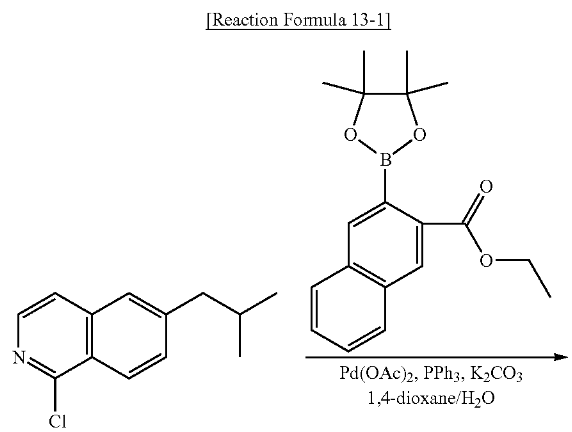

A-1

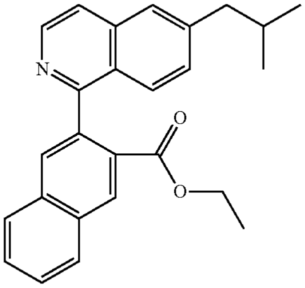

B-1

The compound A-1 (1-chloro-6-isobutylisoquinoline, 10 g, 45.51 mmol), ethyl 3-(4,4,5,5-tetramethyl-1,3,2-dioxaborolan-2-yl)-2-naphthoate (16.3 g, 50.06 mmol), Pd(Oac)$_2$ (0.51 g, 2.28 mmol), PPh$_3$ (2.39 g, 0.91 mmol), $K_2CO_3$ (18.9 g, 136.53 mmol), 1-4-dioxane (100 mL) and water (100 mL) were stirred at 100° C. for 12 hours. After cooling to room temperature, extraction was performed with ethyl acetate, and water in the organic layer was removed using $MgSO_4$. Then, the mixture was filtered under reduced pressure to remove the solvent. The mixture was wet-purified using hexane and ethyl acetate to obtain the compound B-1 (10 g, 26.07 mmol). (yield: 57%)

(2) Synthesis of Compound C-1

[Reaction Formula 13-2]

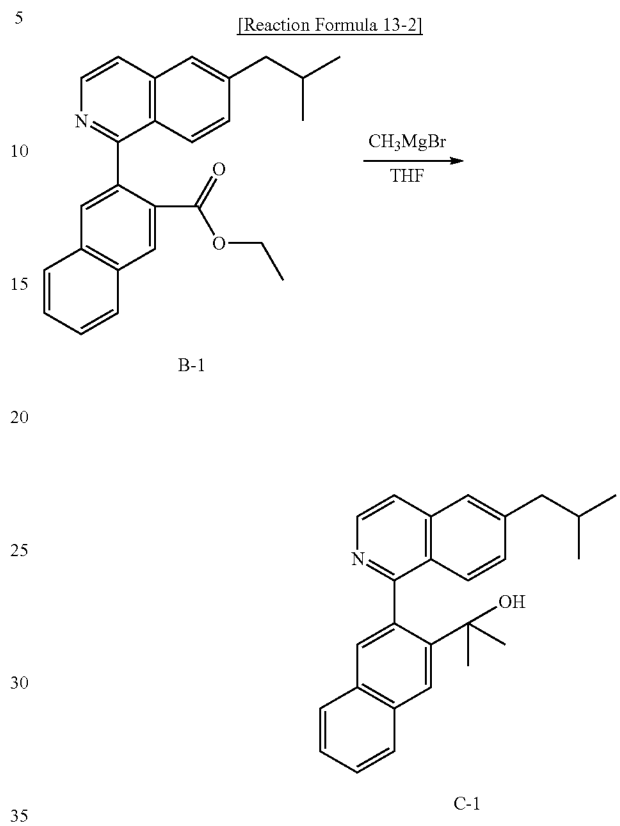

B-1

C-1

The compound B-1 (ethyl 3-(6-isobutylisoquinolin-1-yl)-2-naphthoate, 10 g, 26.07 mmol) and THF (100 mL) were added, and $CH_3MgBr$ (15.5 g, 130 mmol) was slowly added at 0° C. The temperature was raised to room temperature, and the reaction was terminated after 12 hours. The mixture was extracted with ethyl acetate, water in the organic layer was removed using $MgSO_4$, and the solvent was removed under reduced pressure. The mixture was wet-purified using hexane and ethyl acetate, and the compound C-1 (7 g, 18.94 mmol) was obtained. (yield: 73%)

(3) Synthesis of Compound D-1

[Reaction Formula 13-3]

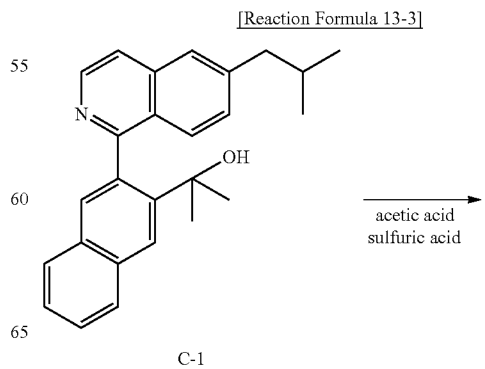

C-1

-continued

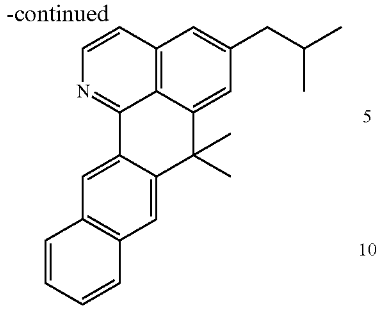

D-1

The compound C-1 (2-(3-(6-isobutylisoquinolin-1-yl) naphthalen-2-yl)propan-2-ol, 10 g, 27.06 mmol) was added to a mixed aqueous solution of acetic acid and sulfuric acid (200 mL), and the mixture was reflux and stirred for 16 hours. After completion of the reaction, the temperature was lowered to room temperature, and the reactant was slowly added to the sodium hydroxide aqueous solution. After extracting the organic layer using dichloromethane and removing water using $MgSO_4$, the organic solvent was removed under reduced pressure. The mixture was recrystallized using toluene and ethanol to obtain the compound D-1 (5 g, 14.22 mmol) in a yellow solid state. (yield: 53%)

(4) Synthesis of Compound E-1

[Reaction Formula 13-4]

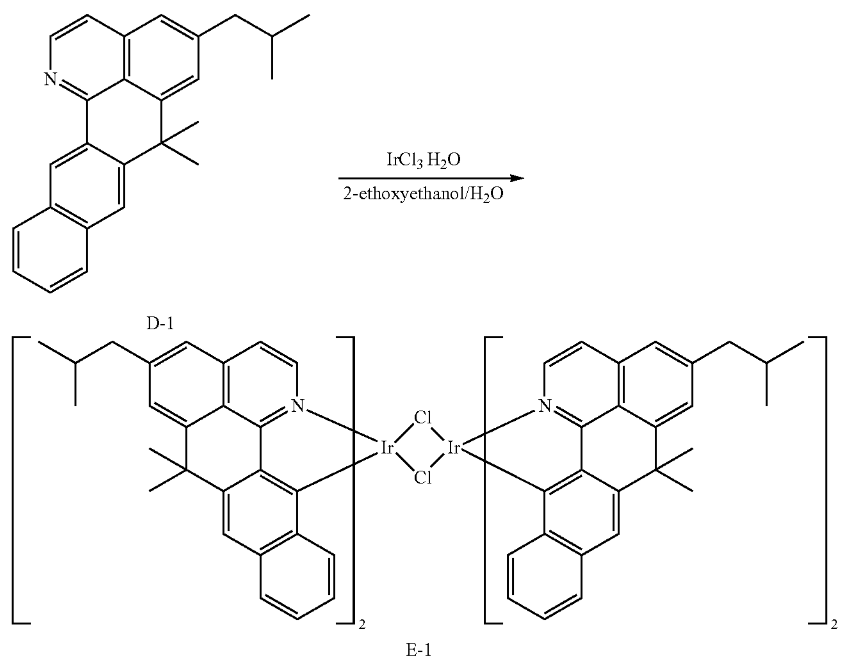

D-1

E-1

The compound D-1 (5-isobutyl-7,7-dimethyl-7H-benzo [de]naphtho[2,3-h]quinoline, 10 g, 28.45 mmol), 2-ethoxyethanol (200 mL) and distilled water (50 mL) were added, and nitrogen was injected to the mixture for 1 hour. IrCl3.H2O (4.5 g, 12.93 mmol) was put in the reaction vessel and refluxed for 2 days. After completion of the reaction, the temperature was lowered to room temperature and the resulting solid was filtered. After washing the solid with methanol and drying the solid, the compound E-1 (7.0 g, 6.05 mmol) was obtained. (yield: 21%)

(5) Synthesis of Compound RD1

[Reaction Formula 13-5]

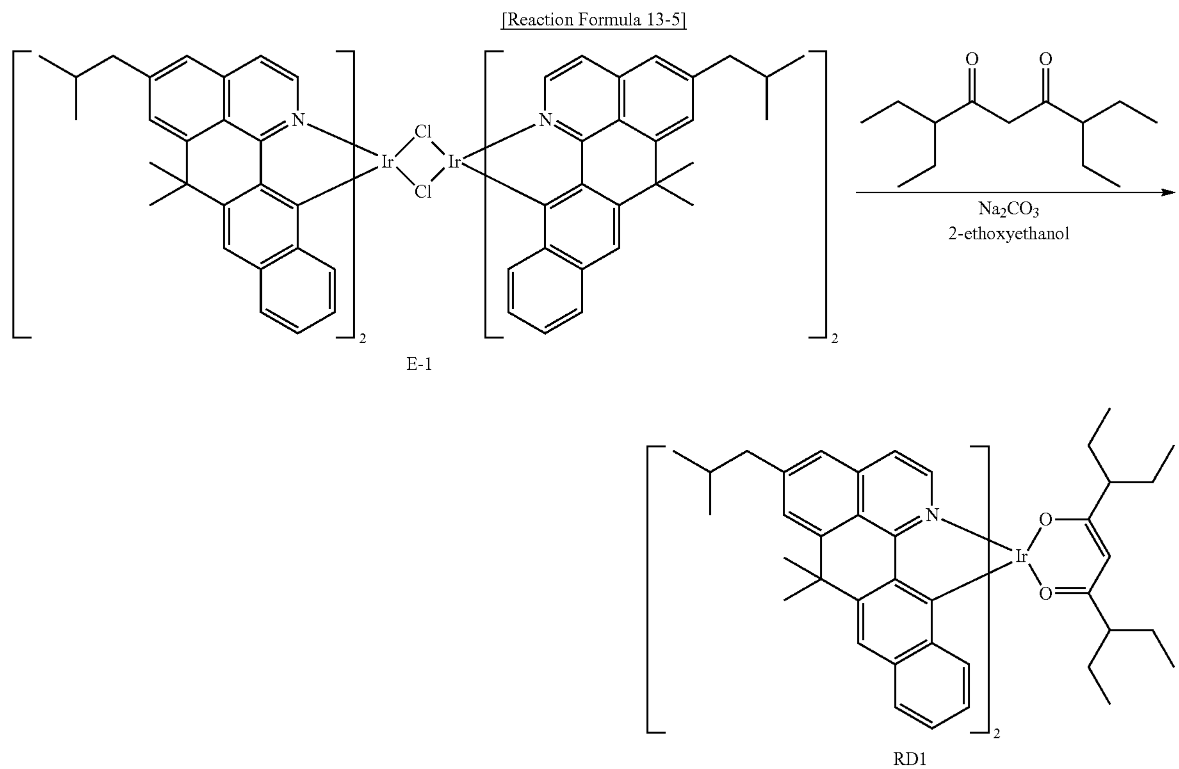

E-1

RD1

The compound E-1 (10 g, 8.64 mmol), 3,7-diethylnonane-4,6-dione (18.3 g, 86.4 mmol) and $Na_2CO_3$ (18.3 g, 172.8 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. Recrystallization and sublimation purification using dichloromethane and isopropanol were performed to obtain the compound RD1 with high purity (5 g, 4.53 mmol). (yield: 52%)

Synthesis Example 14: Synthesis of Compound RD2 (Compound 184 in Formula 1-25)

(1) Synthesis of Compound B-2

[Reaction Formula 14-1]

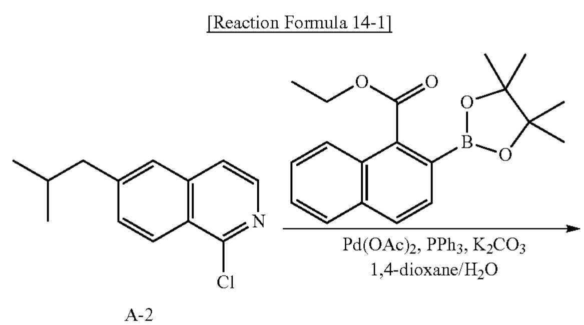

A-2

-continued

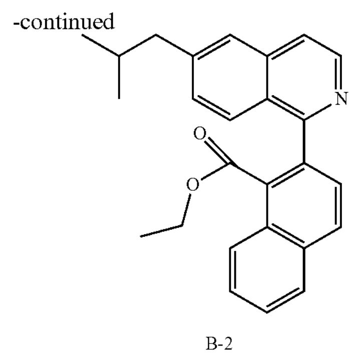

B-2

The compound A-2 (1-chloro-6-isobutylisoquinoline, 10 g, 45.51 mmol), ethyl 2-(4,4,5,5-tetramethyl-1,3,2-dioxaborolan-2-yl)-1-naphthoate (16.3 g, 50.06 mmol), $Pd(Oac)_2$ (0.51 g, 2.28 mmol), $PPh_3$ (2.39 g, 0.91 mmol), $K_2CO_3$ (18.9 g, 136.53 mmol), 1-4-dioxane (100 mL) and water (100 mL) were stirred at 100° C. for 12 hours. After cooling to room temperature, extraction was performed with ethyl acetate, and water in the organic layer was removed using $MgSO_4$. Then, the mixture was filtered under reduced pressure to remove the solvent. The mixture was wet-purified using hexane and ethyl acetate to obtain the compound B-2 (9 g, 23.47 mmol). (yield: 52%)

(2) Synthesis of Compound C-2

[Reaction Formula 14-2]

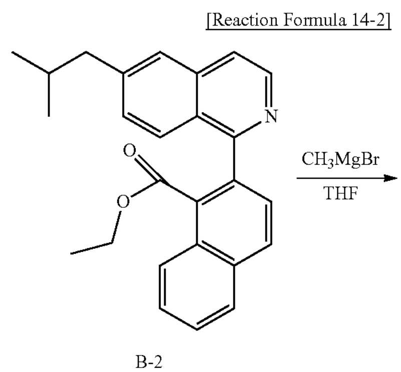

B-2

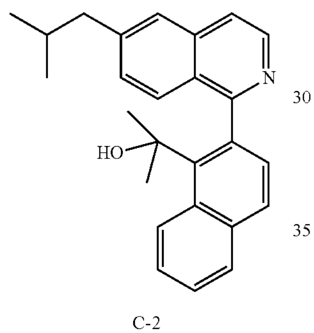

C-2

The compound B-2 (ethyl 2-(6-isobutylisoquinolin-1-yl)-1-naphthoate, 10 g, 26.07 mmol) and THF (100 mL) were added, and $CH_3MgBr$ (15.5 g, 130 mmol) was slowly added at 0° C. The temperature was raised to room temperature, and the reaction was terminated after 12 hours. The mixture was extracted with ethyl acetate, water in the organic layer was removed using $MgSO_4$, and the solvent was removed under reduced pressure. The mixture was wet-purified using hexane and ethyl acetate, and the compound C-2 (6 g, 16.23 mmol) was obtained. (yield: 62%)

(3) Synthesis of Compound D-2

[Reaction Formula 14-3]

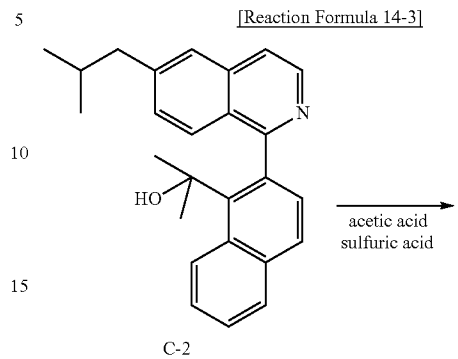

C-2

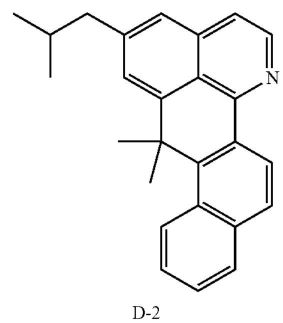

D-2

The compound C-2 (2-(2-(6-isobutylisoquinolin-1-yl)naphthalen-1-yl)propan-2-ol, 10 g, 27.06 mmol) was added to a mixed aqueous solution of acetic acid and sulfuric acid (200 mL), and the mixture was reflux and stirred for 16 hours. After completion of the reaction, the temperature was lowered to room temperature, and the reactant was slowly added to the sodium hydroxide aqueous solution. After extracting the organic layer using dichloromethane and removing water using $MgSO_4$, the organic solvent was removed under reduced pressure. The mixture was recrystallized using toluene and ethanol to obtain the compound D-2 (4 g, 11.38 mmol) in a yellow solid state. (yield: 42%)

(4) Synthesis of Compound E-2

[Reaction Formula 14-4]

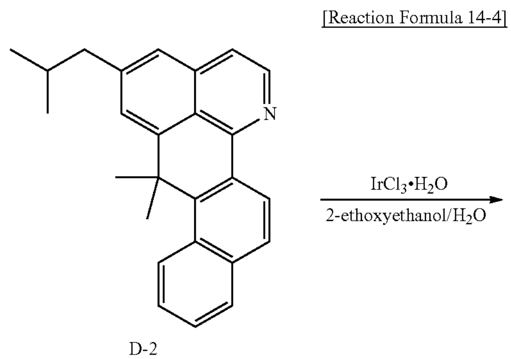

D-2

-continued

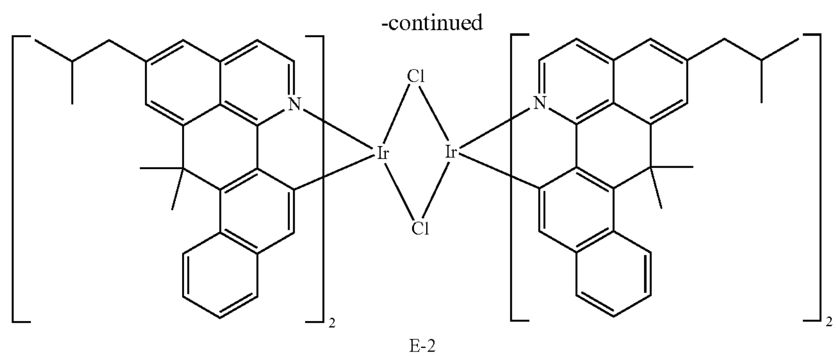

E-2

The compound D-2 (5-isobutyl-7,7-dimethyl-7H-benzo[de]naphtho[1,2-h]quinoline, 10 g, 28.45 mmol), 2-ethoxyethanol (200 mL) and distilled water (50 mL) were added, and nitrogen was injected to the mixture for 1 hour. IrCl3.H2O (4.5 g, 12.93 mmol) was put in the reaction vessel and refluxed for 2 days. After completion of the reaction, the temperature was lowered to room temperature and the resulting solid was filtered. After washing the solid with methanol and drying the solid, the compound E-2 (10 g, 8.65 mmol) was obtained. (yield: 30%)

(5) Synthesis of Compound RD2

[Reaction Formula 14-5]

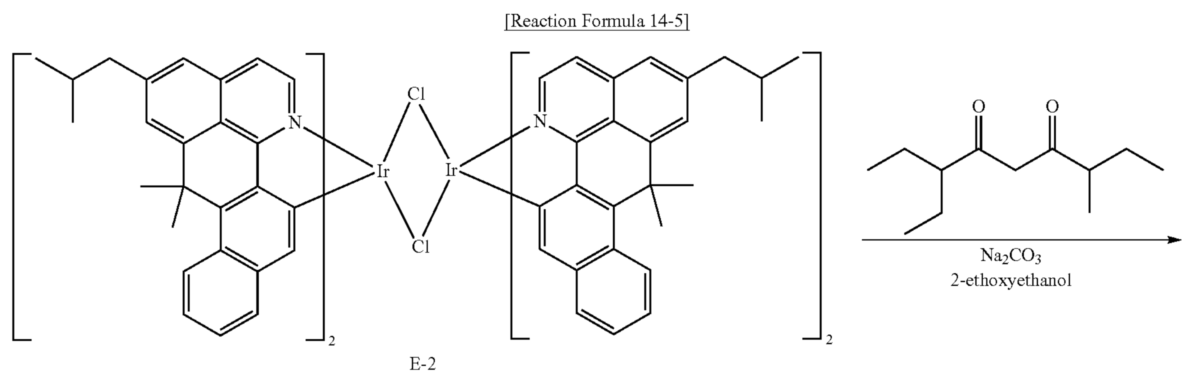

E-2

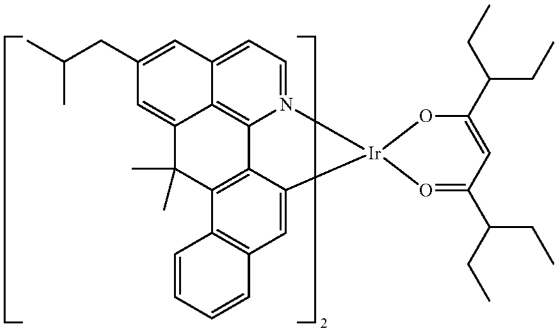

RD2

The compound E-2 (10 g, 8.64 mmol), 3,7-diethylnonane-4,6-dione (18.3 g, 86.4 mmol) and $Na_2CO_3$ (18.3 g, 172.8 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized and purified using dichloromethane and isopropanol to obtain the compound RD2 with high purity (4 g, 3.98 mmol). (yield: 46%)

Synthesis Example 15: Synthesis of Compound RD3 (Compound 371 in Formula 1-26)

(1) Synthesis of Compound B-3

[Reaction Formula 15-1]

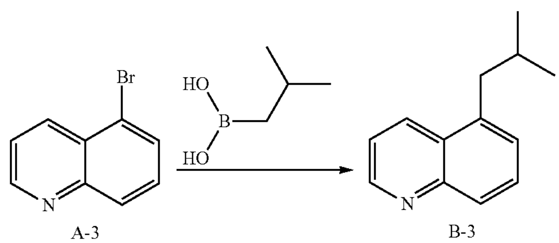

The compound A-3 (5-bromoquinoline, 50 g, 240.33 mmol), isobutylboronic acid (49 g, 480.65 mmol), $Pd_2(dba)_3$ (6.6 g, 3 mol %), Sphos (2-dicyclohexylphosphino-2',6'-dimethoxybiphenyl, 9.9 g, 24.03 mmol), potassium phosphate monohydrate (276.71 g, 1.2 mol) and toluene (1000 mL) were stirred at 120° C. for 12 hours. After completion of the reaction, the temperature was lowered, and the mixture was extracted with ethyl acetate. After the solvent was removed, the mixture was wet-purified using ethyl acetate and hexane to obtain the compound B-3 (35 g, 188.92 mmol). (yield: 79%)

(2) Synthesis of Compound C-3

[Reaction Formula 15-2]

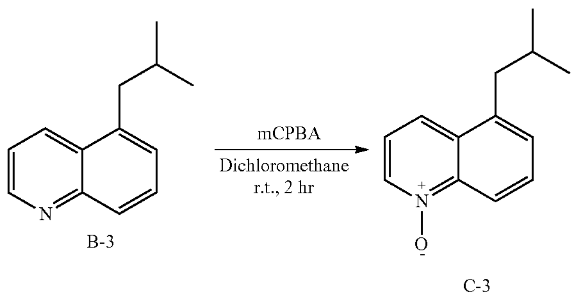

The compound B-3 (5-isobutylquinoline, 35 g, 188.92 mmol), 3-chloroperbenzoic acid (57 g, 283.38 mmol) and dichloromethane (500 mL) were stirred at room temperature for 3 hours. After completion of the reaction, sodium sulfite (80 g) was added into the mixture. The organic layer was extracted and the pressure was lowered so that the compound C-3 (27 g, 134.15 mmol) was obtained. (yield: 71%)

(3) Synthesis of Compound D-3

[Reaction Formula 15-3]

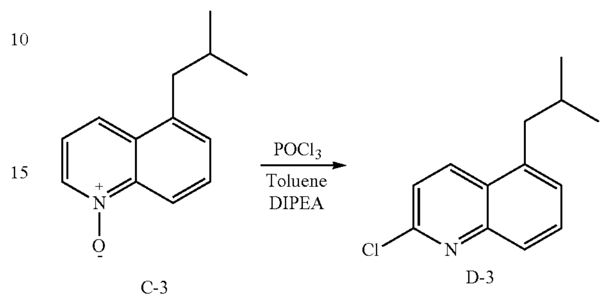

The compound C-3 (25 g, 124.22 mmol) and toluene (500 mL) were added, and phosphoryl trichloride (38.1 g, 248.44 mmol) and diisopropylethylamine (32.1 g, 248.44 mmol) were added into the mixture. The mixture was stirred at the temperature of 120° C. for 4 hours. After completion of the reaction, the mixture was extracted with dichloromethane, and the pressure was lowered. The mixture was filtered using $MgSO_4$ under reduced pressure, and the organic solvent was removed. The mixture was wet-purified to obtain the compound D-3 (30 g, 91.0 mmol). (yield: 73%)

(4) Synthesis of Compound E-3

[Reaction Formula 15-4]

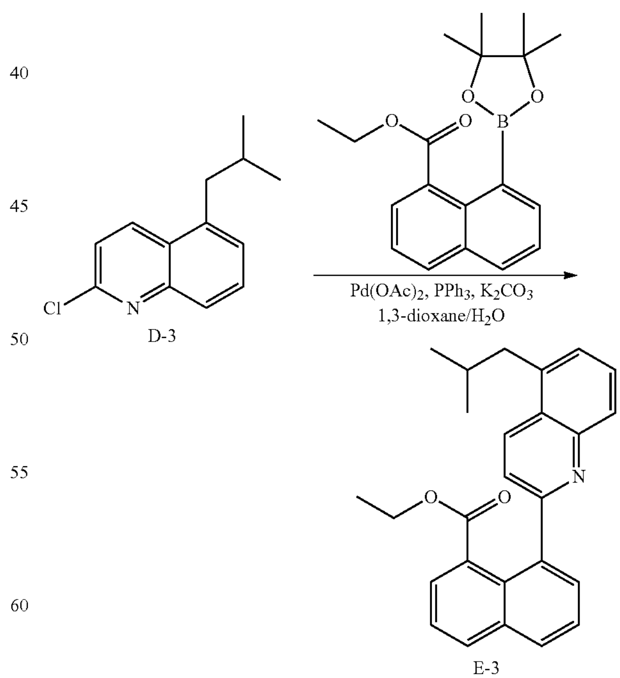

The compound D-3 (10 g, 45.51 mmol), ethyl 8-(4,4,5,5-tetramethyl-1,3,2-dioxaborolan-2-yl)naphthalene-1-carboxylate (16.33 g, 50.06 mmol), $Pd(Oac)_2$ (0.5 g, 2.28 mmol), $PPh_3$ (2.4 g, 9.10 mmol), $K_2CO_3$ (18.9 g, 136.53 mmol), 1,4-dioxane (100 mL) and water (100 mL)) were stirred at 100° C. for 12 hours. After completion of the reaction, the mixture was extracted with ethyl acetate, and water in the organic layer was removed using $MgSO_4$. The solvent was removed from the mixture by lowering the pressure. The mixture was wet-purified using hexane and ethyl acetate to obtain the compound E-3 (13 g, 33.90 mmol) was obtained. (yield: 74%)

(5) Synthesis of Compound F3

[Reaction Formula 15-5]

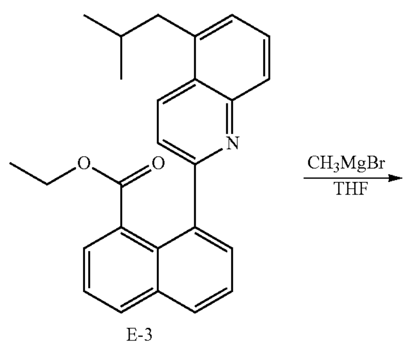

E-3

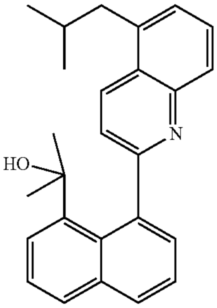

F-3

The compound E-3 (10 g, 26.07 mmol) and THF (100 mL) were added, and $CH_3MgBr$ (15.5 g, 130.35 mmol) was slowly added at 0° C. After the reaction proceeded at room temperature for 12 hours, the mixture was worked-up using ethyl acetate and $MgSO_4$. The mixture was wet-purified using hexane and ethyl acetate to obtain the compound F-3 (6 g, 16.24 mmol). (yield: 62%)

(5) Synthesis of Compound G3

[Reaction Formula 15-6]

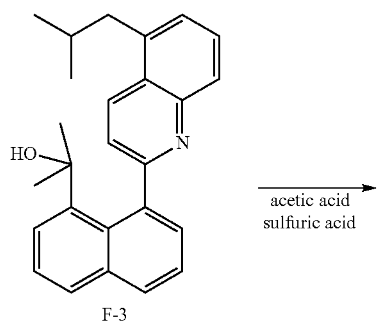

F-3

-continued

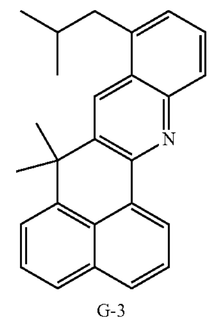

G-3

The compound F-3 (20 g, 54.12 mmol) and a mixed aqueous solution of acetic acid and sulfuric acid (200 mL) were added and refluxed for 16 hours. After completion of the reaction, the reactant was slowly added to a cold aqueous sodium hydroxide (cool sodium hydroxide) solution. After work-up using dichloromethane and $MgSO_4$, and the mixture was recrystallized using toluene and ethanol to obtain the compound G-3 (10 g, 28.45 mmol) in a yellow solid state. (yield: 53%)

(5) Synthesis of Compound H3

[Reaction Formula 15-7]

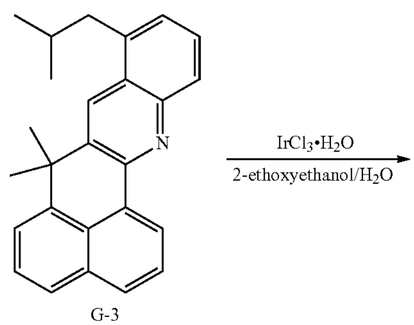

G-3

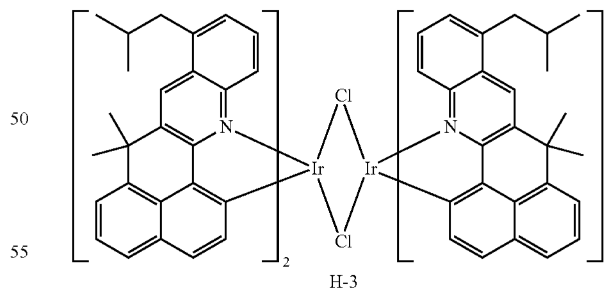

H-3

The compound G-3 (10 g, 28.45 mmol), 2-ethoxyethanol (200 mL) and distilled water (50 mL) were added, and nitrogen was bubbled for 1 hour. Then, $IrCl_3.H_2O$ (4.5 g, 14.22 mmol) was added to the reaction vessel, and the mixture was refluxed for 2 days. After completion of the reaction, the temperature was slowly lowered to room temperature and the resulting solid was filtered. The solid was washed with hexane and methanol and dried to obtain the compound H-3 (6.0 g, 5.19 mmol). (yield: 18%)

(5) Synthesis of Compound RD3

[Reaction Formula 15-8]

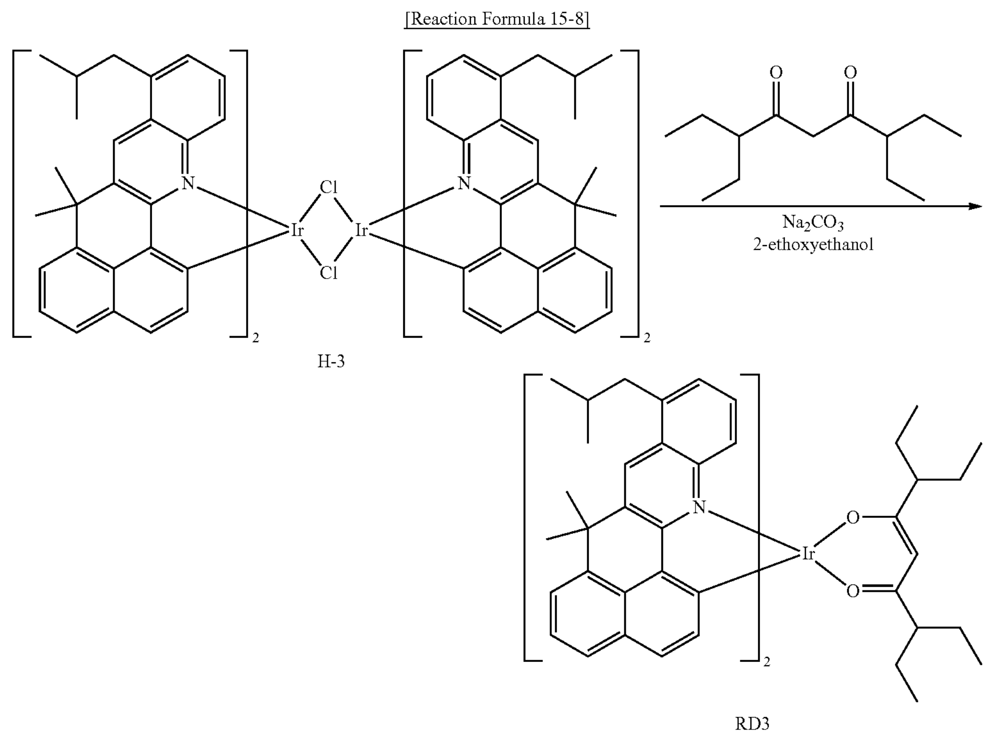

H-3

RD3

The compound H-3 (10 g, 8.64 mmol), 3,7-diethylnonane-4,6-dione (18.3 g, 86.4 mmol) and $Na_2CO_3$ (18.3 g, 172.8 mmol) was added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol, and the mixture was stirred. After stirring, the mixture was filtered, and the filtered solid was dried. The solid was recrystallized using dichloromethane and isopropanol and was purified to obtain the compound RD3 (4 g, 3.62 mmol) with high purity. (yield: 42%)

Synthesis Example 16: Synthesis of Compound RD4 (Compound 503 in Formula 1-27)

(1) Synthesis of Compound B-4

[Reaction Formula 16-1]

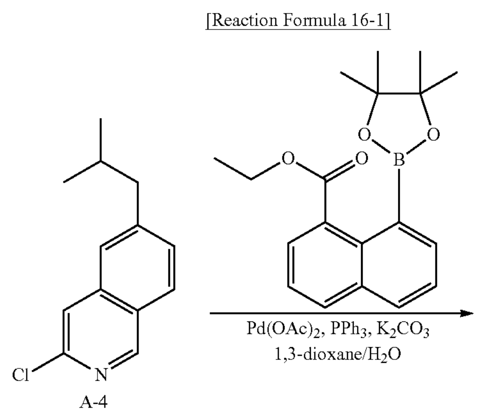

A-4

-continued

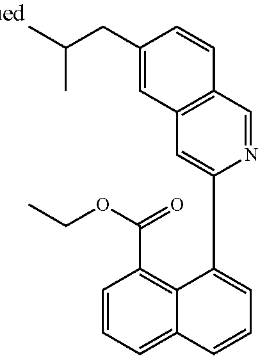

B-4

The compound A-4 (10 g, 45.51 mmol), ethyl 8-(4,4,5,5-tetramethyl-1,3,2-dioxaborolan-2-yl)naphthalene-1-carboxylate (16.33 g, 50.06 mmol), $Pd(Oac)_2$ (0.5 g, 2.28 mmol), $PPh_3$ (2.4 g, 9.10 mmol), $K_2CO_3$ (18.9 g, 136.53 mmol), 1,4-dioxane (100 mL) and water (100 mL) were stirred at 100° C. for 12 hours. After completion of the reaction, the mixture was extracted with ethyl acetate, and water in the organic layer was removed using $MgSO_4$. The solvent was removed from the mixture by lowering the pressure. The mixture was wet-purified using hexane and ethyl acetate to obtain the compound B-4 (13 g, 33.90 mmol). (yield: 74%)

(2) Synthesis of Compound C-4

[Reaction Formula 16-2]

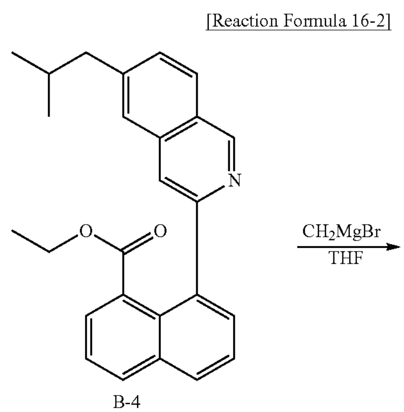

B-4

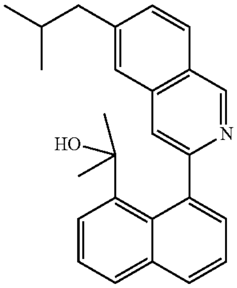

C-4

The compound B-4 (10 g, 26.07 mmol) and THF (100 mL) were added, and $CH_3MgBr$ (15.5 g, 130 mmol) was slowly added at 0° C. The reaction was proceeded for 12 hours, and the mixture was worked-up using ethyl acetate and $MgSO_4$. The mixture was wet-purified using hexane and ethyl acetate, and the compound C-4 (6 g, 16.24 mmol) was obtained. (yield: 62%) (3) Synthesis of compound D-4

[Reaction Formula 16-3]

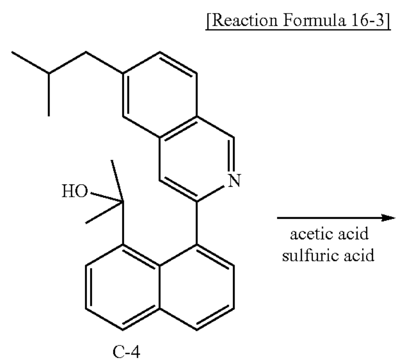

C-4

-continued

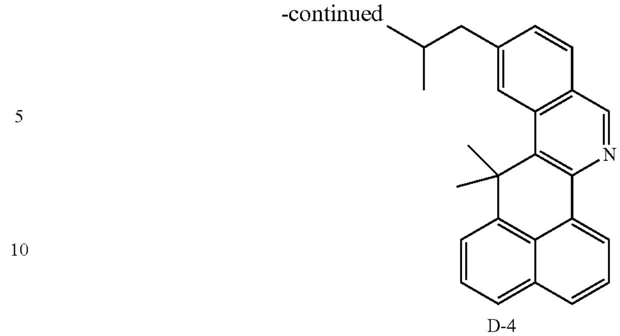

D-4

The compound C-4 (20 g, 54.12 mmol) was added to a mixed aqueous solution of acetic acid and sulfuric acid (200 mL), and the mixture was reflux for 16 hours. After completion of the reaction, a cold sodium hydroxide aqueous solution was slowly added into the mixture. The mixture was worked-up using dichloromethane and $MgSO_4$. The mixture was recrystallized using toluene and ethanol to obtain the compound D-4 (10 g, 28.45 mmol) in a yellow solid state. (yield: 53%)

(4) Synthesis of Compound E-4

[Reaction Formula 16-4]

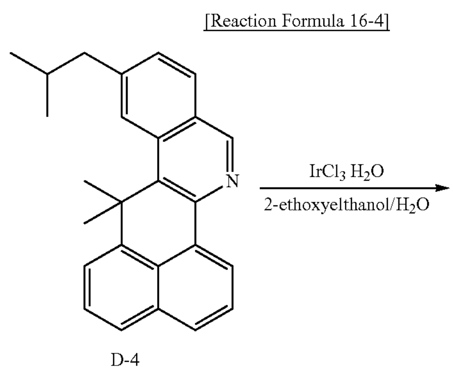

D-4

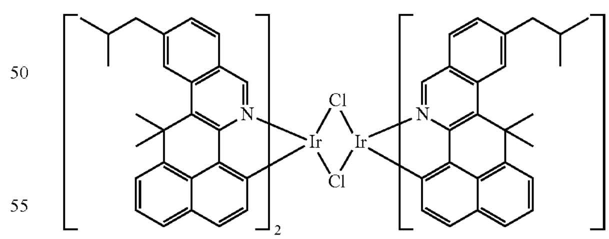

The compound D-4 (10 g, 28.45 mmol), 2-ethoxyethanol (200 mL) and distilled water (50 mL) were added, and nitrogen was injected to the mixture for 1 hour. IrCl3.$H_2O$ (4.5 g, 14.22 mmol) was put in the reaction vessel and refluxed for 2 days. After completion of the reaction, the temperature was slowly lowered to room temperature and the resulting solid was filtered. After washing the solid with methanol and drying the solid, the compound E-4 (6.0 g, 5.19 mmol) was obtained. (yield: 18%)

(5) Synthesis of Compound RD4

[Reaction Formula 16-5]

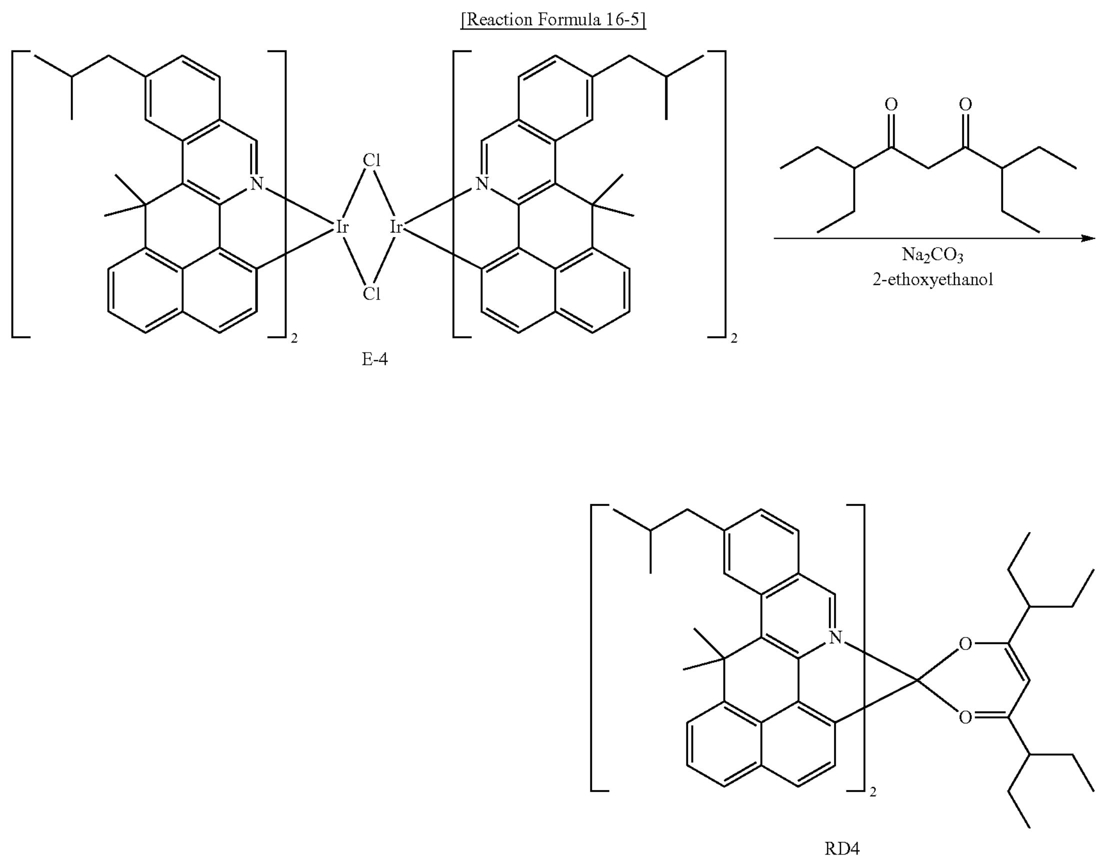

E-4

RD4

The compound E-4 (10 g, 8.64 mmol), 3,7-diethylnonane-4,6-dione (18.3 g, 86.4 mmol) and $Na_2CO_3$ (18.3 g, 172.8 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized and purified using dichloromethane and isopropanol to obtain the compound RD4 with high purity (4 g, 3.62 mmol). (yield: 42%)

Synthesis Example 17: Synthesis of Compound RD17 (Compound 610 in Formula 1-29)

[Reaction Formula 17]

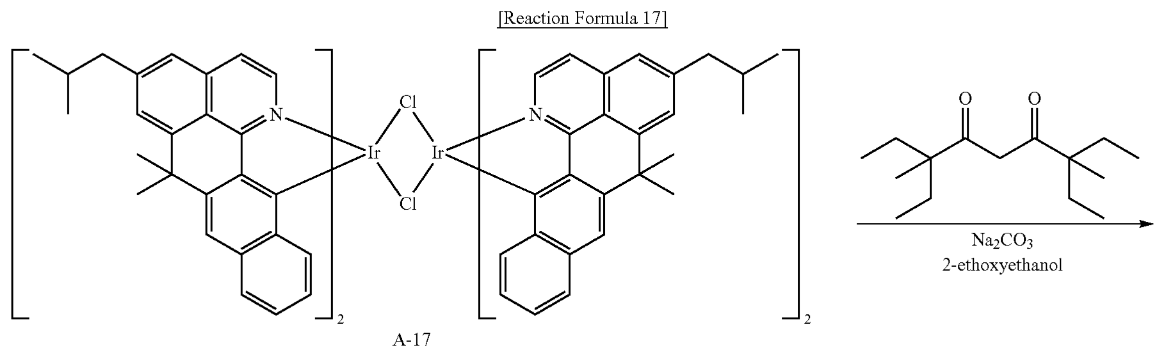

A-17

-continued

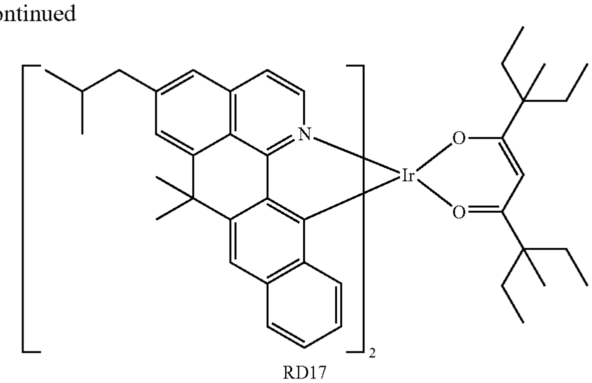

RD17

The compound A-17 (10 g, 5.38 mmol), 3,7-diethyl-3,7-dimethylnonane-4,6-dione (12.94 g, 53.84 mmol) and $Na_2CO_3$ (11.4 g, 107.7 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized using dichloromethane and isopropanol and purified to obtain the compound RD17 with high purity (3.8 g, 3.36 mmol). (yield: 42%)

Synthesis Example 18: Synthesis of Compound RD18 (Compound 611 in Formula 1-29)

[Reaction Formula 18]

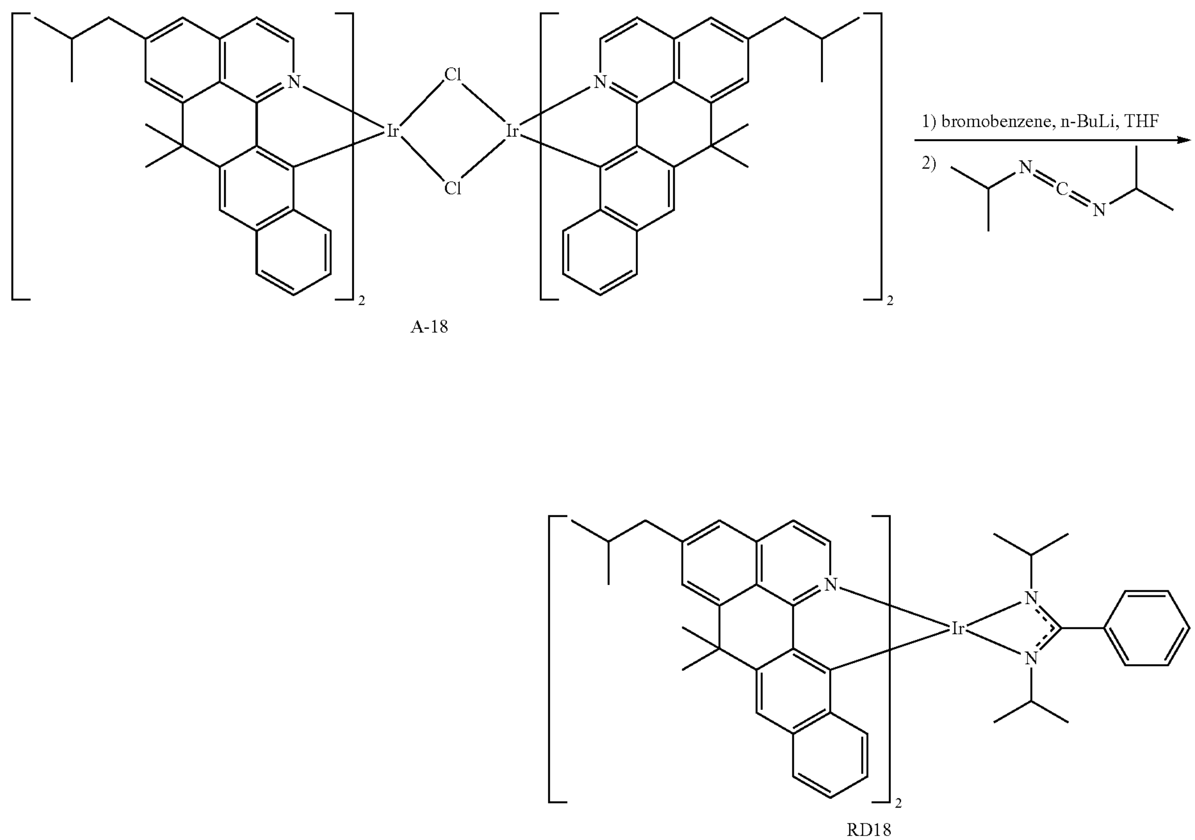

A-18

RD18

Under the nitrogen condition, bromobenzene (1.01 g, 6.46 mmol) and 50 ml of THF were put in a reaction vessel, and the temperature was lowered to −78° C. n-BuLi (2.6 ml, 2.5M in hexane) was slowly added into the mixture. After 30 minutes, while maintaining the temperature, N,N'-diisopropylcarbodiimide (0.82 g, 6.46 mmol) was slowly added, and the mixture was stirred for 30 minutes. The mixture was added to a reaction vessel, in which the compound A-18 (3 g, 1.62 mmol) was dissolved in 100 ml THF, and stirred at 80° C. for 8 hours. The temperature of the mixture was lowered to room temperature and volatile substances were removed. After the mixture was recrystallized using THF/pentane and dichloromethane/hexane, purification was performed to obtain the compound RD18 with high purity (2.3 g, 2.03 mmol).

Synthesis Example 19: Synthesis of Compound RD19 (Compound 612 in Formula 1-29)

[Reaction Formula 19]

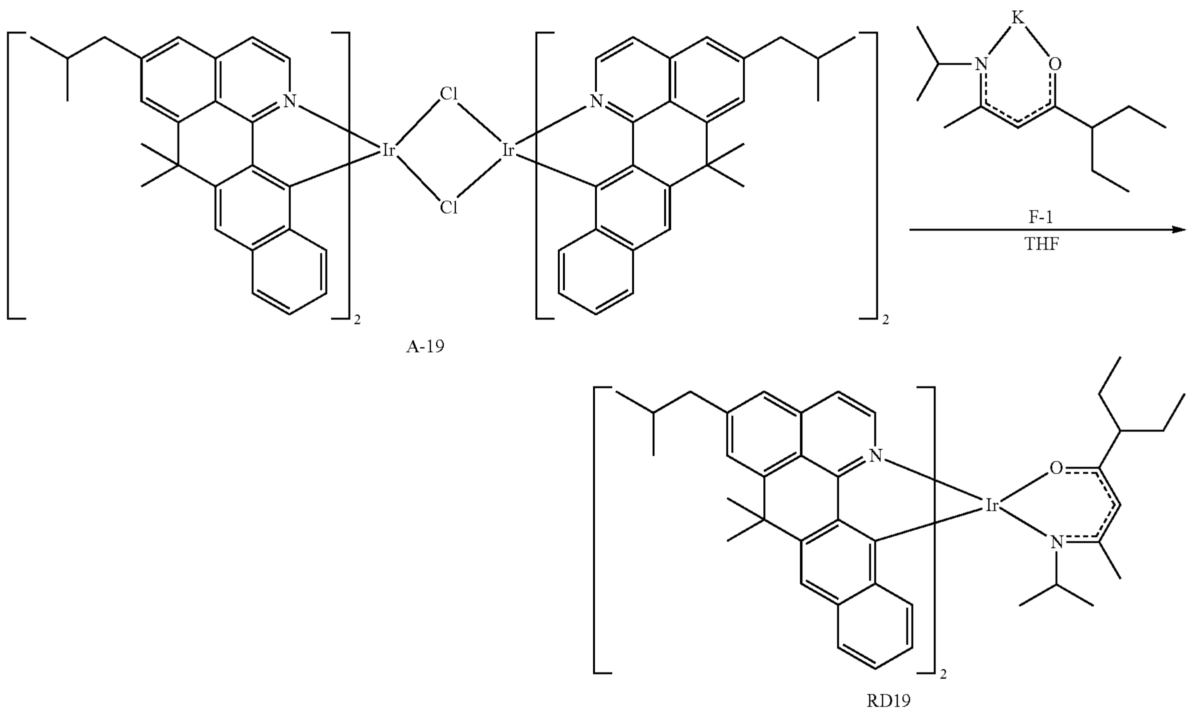

A-19

RD19

Under the nitrogen condition, the compound A-19 (3 g, 1.62 mmol) and THT (100 ml) were added in a reaction vessel, and the compound F-1 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD19 with high purity (1.1 g, 1.01 mmol).

Synthesis Example 20: Synthesis of Compound RD20 (Compound 613 in Formula 1-29)

[Reaction Formula 20]

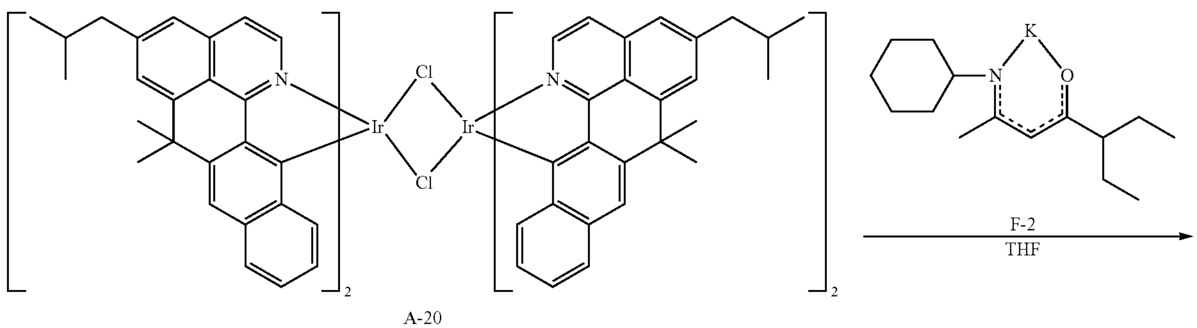

A-20

-continued

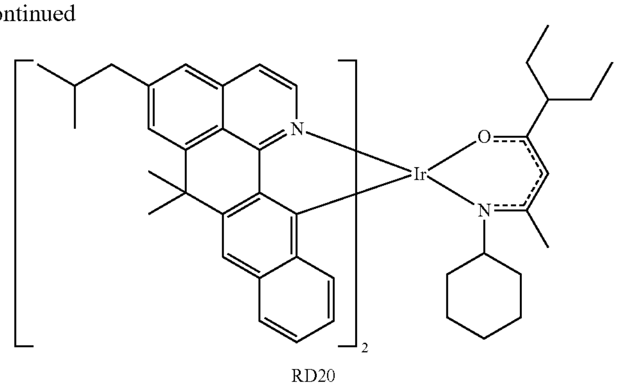

RD20

Under the nitrogen condition, the compound A-20 (3 g, 1.62 mmol) and THT (100 ml) were added in a reaction vessel, and the compound F-2 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD20 with high purity (0.9 g, 0.80 mmol).

Synthesis Example 21: Synthesis of Compound RD21 (Compound 614 in Formula 1-29)

[Reaction Formula 21]

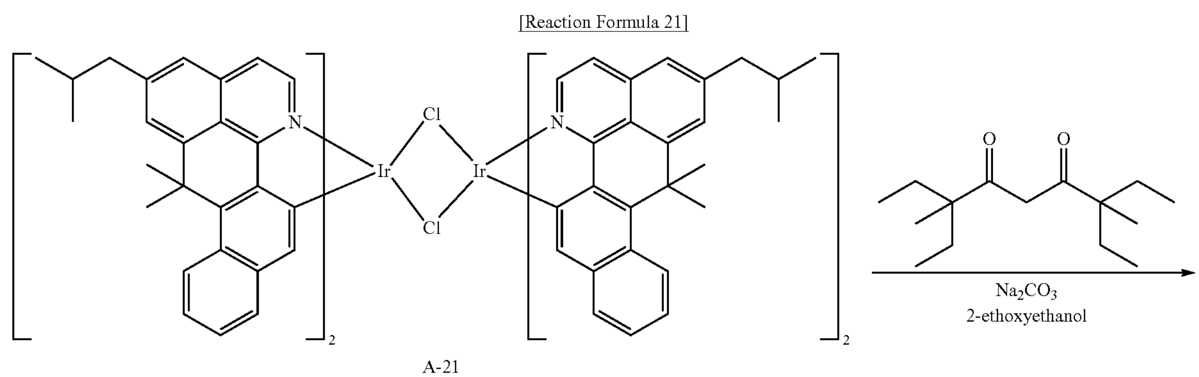

A-21

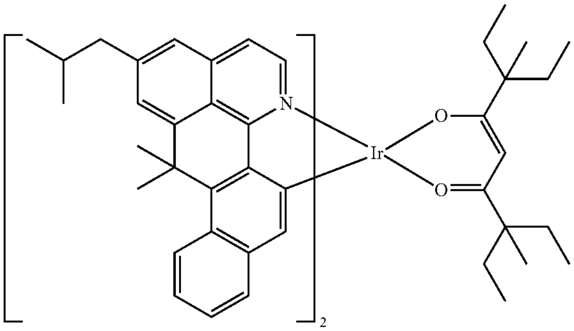

RD21

The compound A-21 (10 g, 5.38 mmol), 3,7-diethyl-3,7-dimethylnonane-4,6-dione (12.94 g, 53.84 mmol) and $Na_2CO_3$ (11.4 g, 107.7 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized using dichloromethane and isopropanol and purified to obtain the compound RD21 with high purity (3.4 g, 3.00 mmol).

Synthesis Example 22: Synthesis of Compound RD22 (Compound 615 in Formula 1-29)

[Reaction Formula 22]

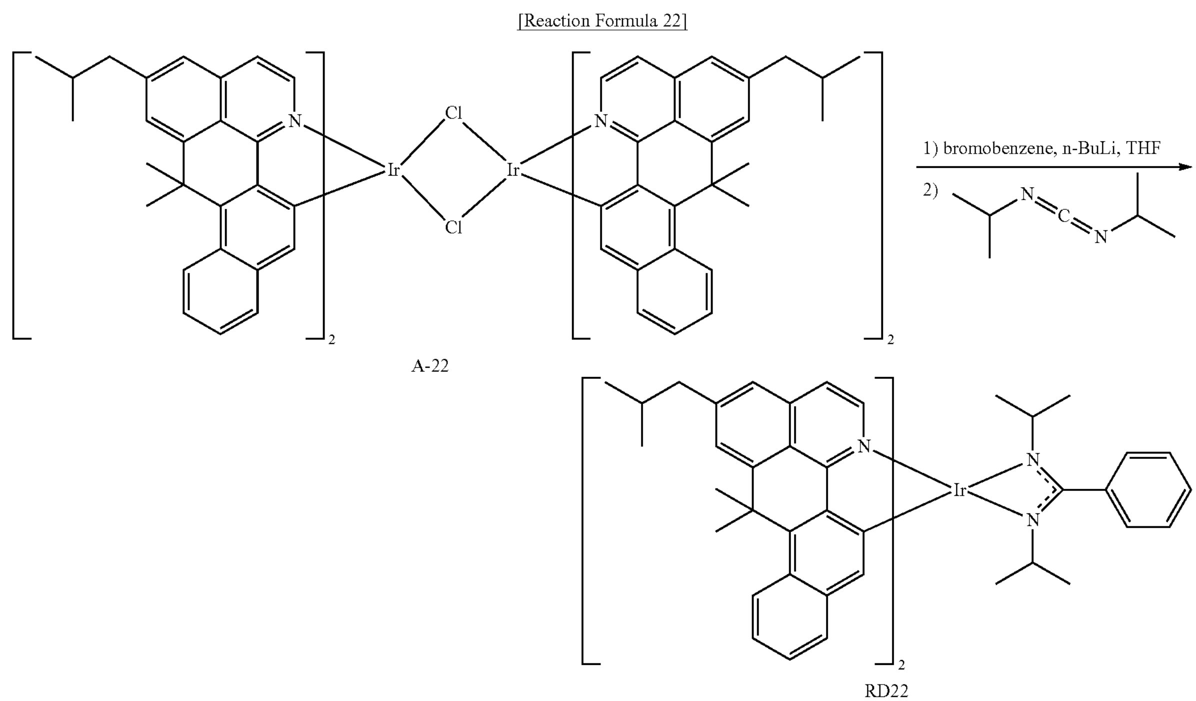

A-22

RD22

Under the nitrogen condition, bromobenzene (1.01 g, 6.46 mmol) and 50 ml of THF were put in a reaction vessel, and the temperature was lowered to −78° C. n-BuLi (2.6 ml, 2.5M in hexane) was slowly added into the mixture. After 30 minutes, while maintaining the temperature, N,N'-diisopropylcarbodiimide (0.82 g, 6.46 mmol) was slowly added, and the mixture was stirred for 30 minutes. The mixture was added to a reaction vessel, in which the compound A-22 (3 g, 1.62 mmol) was dissolved in 100 ml THF, and stirred at 80° C. for 8 hours. The temperature of the mixture was lowered to room temperature and volatile substances were removed. After the mixture was recrystallized using THF/pentane and dichloromethane/hexane, purification was performed to obtain the compound RD22 with high purity (2.0 g, 1.82 mmol).

Synthesis Example 23: Synthesis of Compound RD23 (Compound 616 in Formula 1-29)

[Reaction Formula 23]

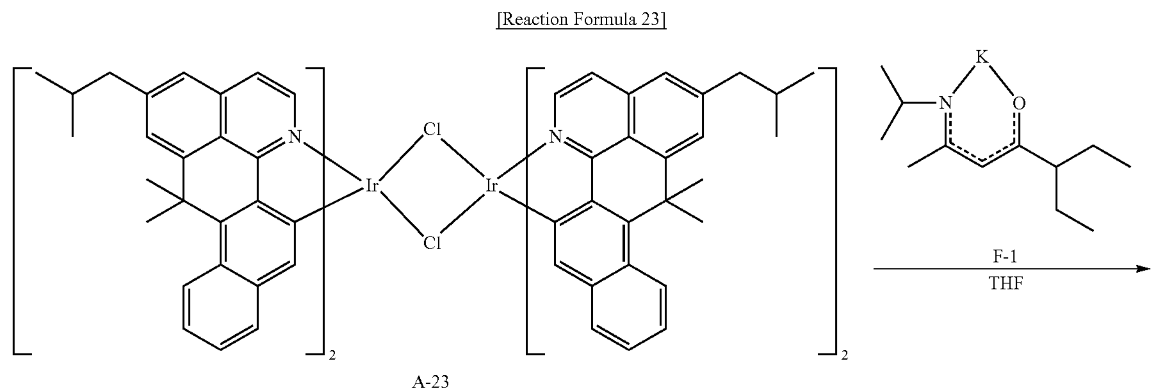

A-23

-continued

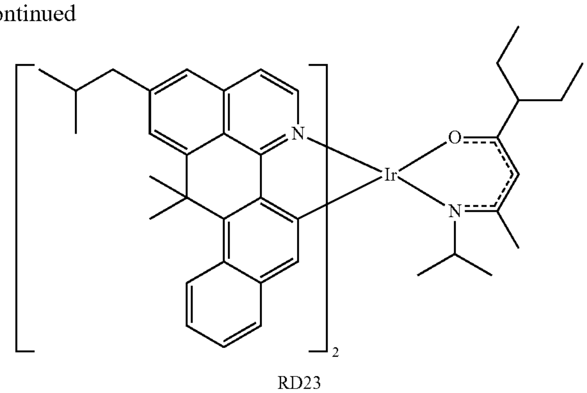

RD23

Under the nitrogen condition, the compound A-23 (3 g, 1.62 mmol) and THT (100 ml) were added in a reaction vessel, and the compound F-1 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD23 with high purity (2.5 g, 2.29 mmol).

Synthesis Example 24: Synthesis of compound RD24 (compound 617 in Formula 1-29)

[Reaction Formula 24]

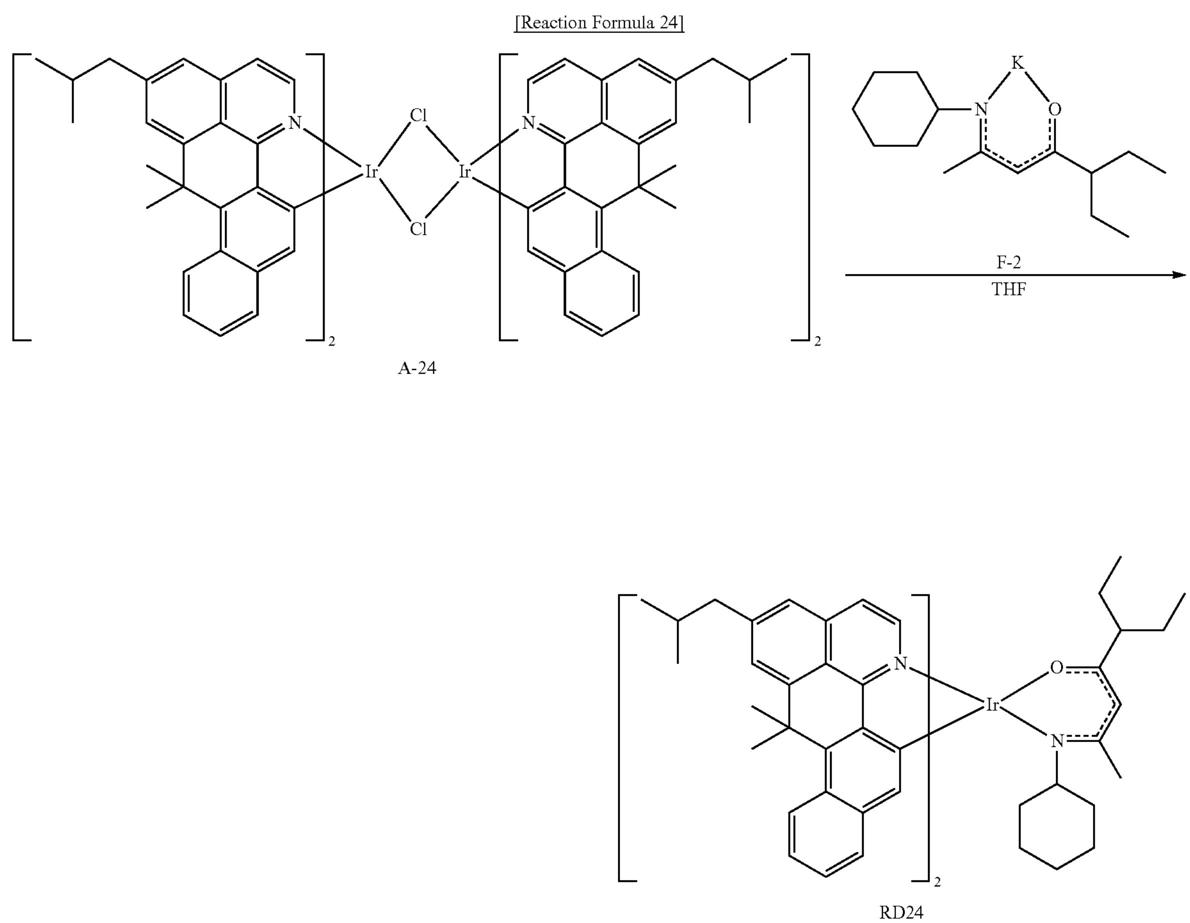

A-24

RD24

Under the nitrogen condition, the compound A-24 (3 g, 1.62 mmol) and THT (100 ml) were added in a reaction vessel, and the compound F-2 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD24 with high purity (2.2 g, 1.95 mmol).

Synthesis Example 25: Synthesis of Compound RD25 (Compound 618 in Formula 1-29)

[Reaction Formula 25]

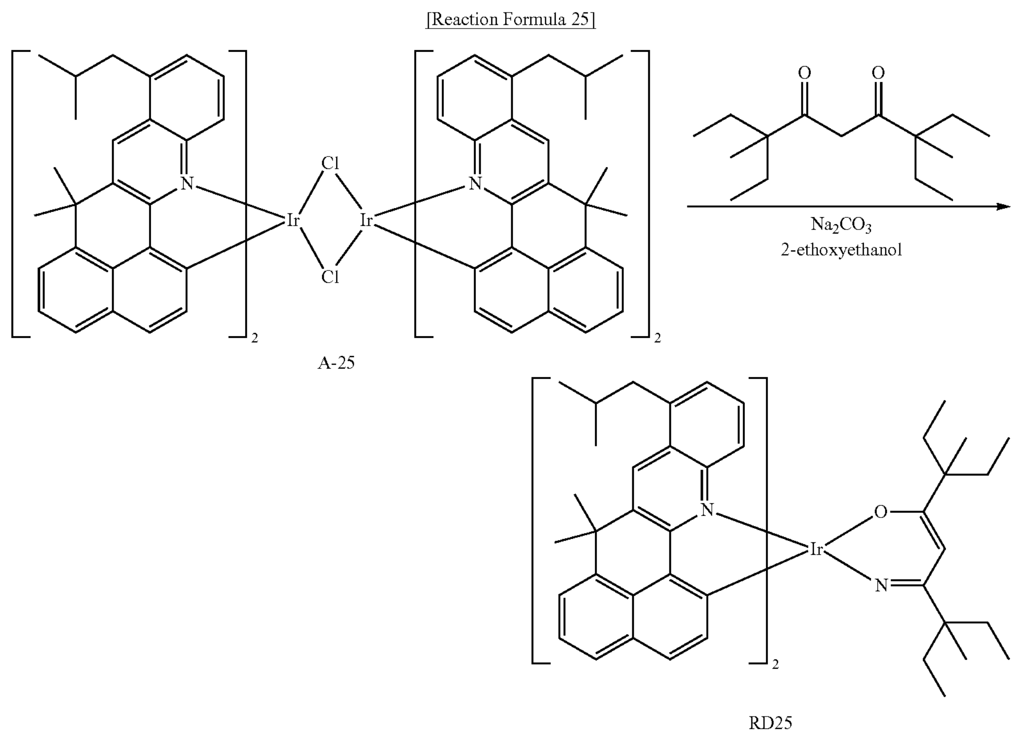

A-25

RD25

The compound A-25 (10 g, 5.38 mmol), 3,7-diethyl-3,7-dimethylnonane-4,6-dione (12.94 g, 53.84 mmol) and $Na_2CO_3$ (11.4 g, 107.7 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized using dichloromethane and isopropanol and purified to obtain the compound RD25 with high purity (3.3 g, 2.91 mmol).

Synthesis Example 26: Synthesis of Compound RD26 (Compound 619 in Formula 1-29)

[Reaction Formula 26]

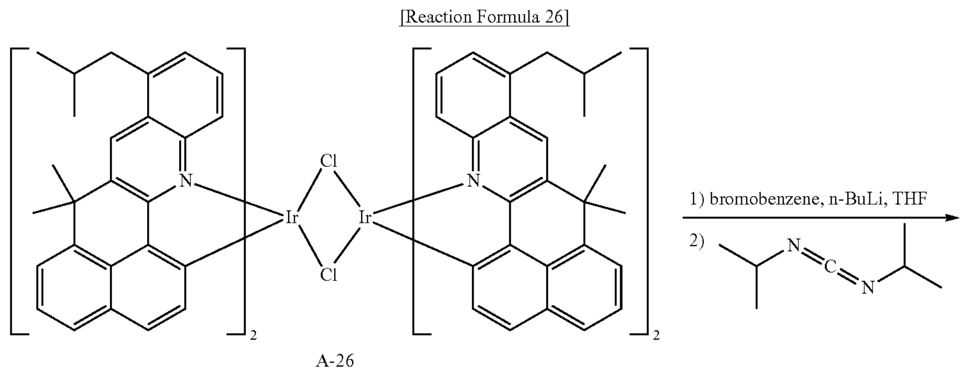

A-26

-continued

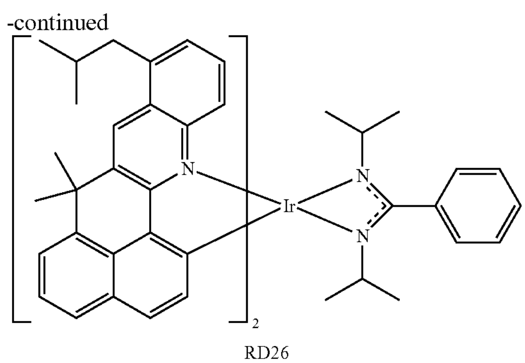

RD26

Under the nitrogen condition, bromobenzene (1.01 g, 6.46 mmol) and 50 ml of THF were put in a reaction vessel, and the temperature was lowered to −78° C. n-BuLi (2.6 ml, 2.5M in hexane) was slowly added into the mixture. After 30 minutes, while maintaining the temperature, N,N'-diisopropylcarbodiimide (0.82 g, 6.46 mmol) was slowly added, and the mixture was stirred for 30 minutes. The mixture was added to a reaction vessel, in which the compound A-26 (3 g, 1.62 mmol) was dissolved in 100 ml THF, and stirred at 80° C. for 8 hours. The temperature of the mixture was lowered to room temperature and volatile substances were removed. After the mixture was recrystallized using THF/pentane and dichloromethane/hexane, purification was performed to obtain the compound RD26 with high purity (2.1 g, 1.92 mmol).

Synthesis Example 27: Synthesis of Compound RD27 (Compound 620 in Formula 1-29)

[Reaction Formula 27]

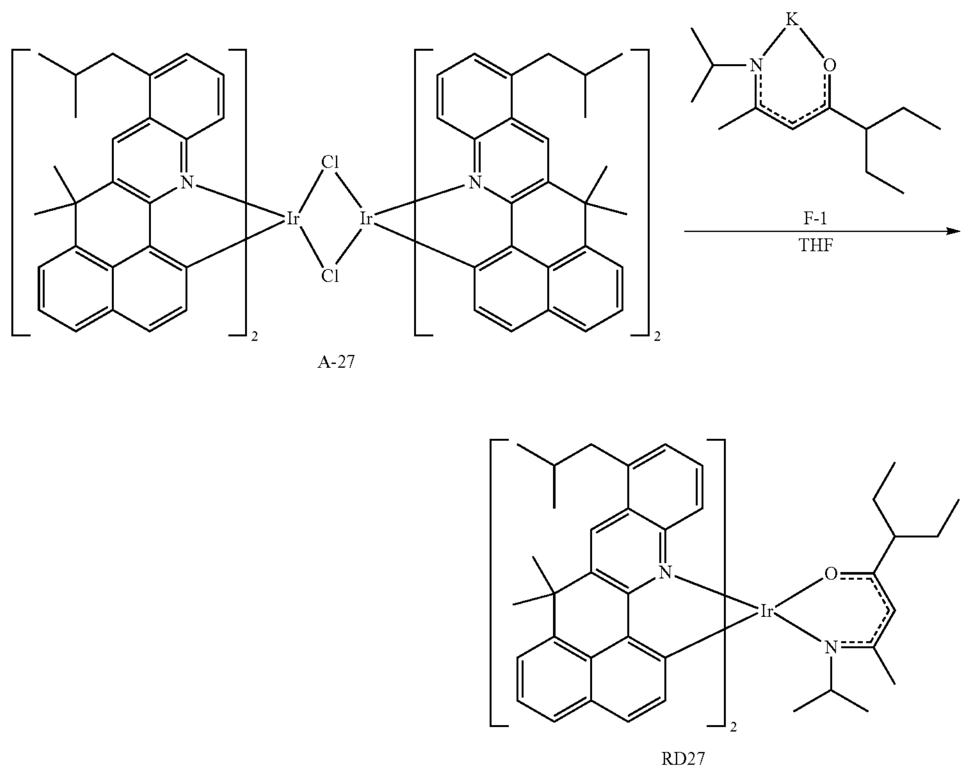

A-27

RD27

Under the nitrogen condition, the compound A-27 (3 g, 1.62 mmol) and THT (100 ml) were added in a reaction vessel, and the compound F-1 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD27 with high purity (2.2 g, 2.02 mmol).

Synthesis Example 28: Synthesis of Compound RD28 (Compound 621 in Formula 1-29)

[Reaction Formula 28]

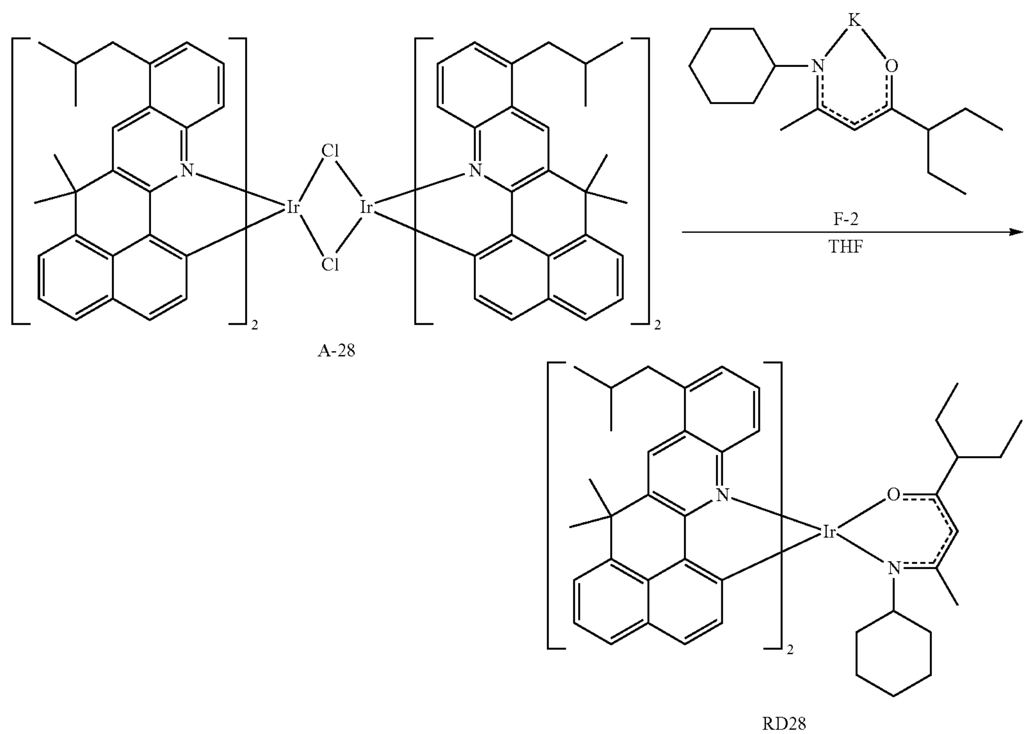

A-28

RD28

Under the nitrogen condition, the compound A-28 (3 g, 1.62 mmol) and THT (100 ml) were added in a reaction vessel, and the compound F-2 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD28 with high purity (1.9 g, 1.68 mmol).

Synthesis Example 29: Synthesis of Compound RD29 (Compound 622 in Formula 1-29)

[Reaction Formula 29]

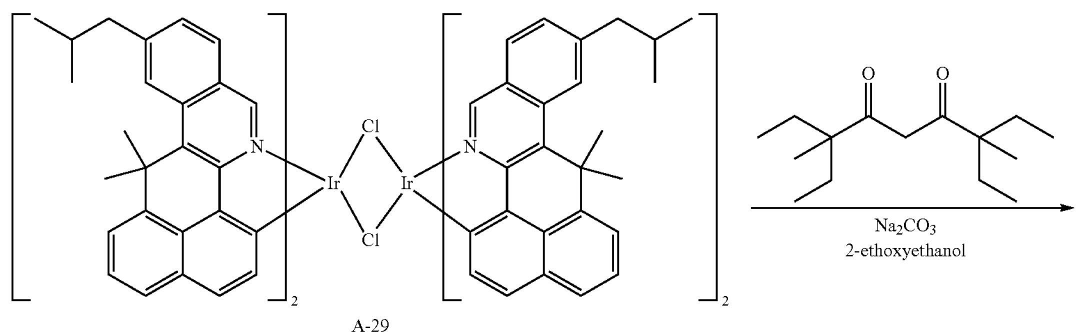

A-29

-continued

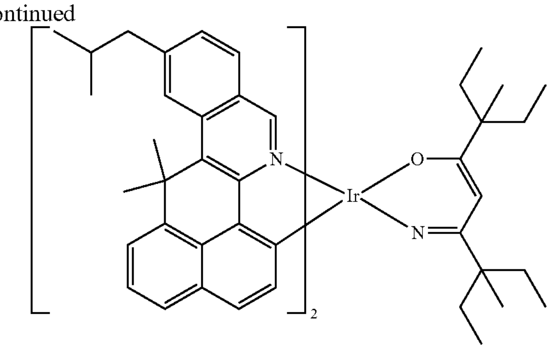

RD29

The compound A-29 (10 g, 5.38 mmol), 3,7-diethyl-3,7-dimethylnonane-4,6-dione (12.94 g, 53.84 mmol) and $Na_2CO_3$ (11.4 g, 107.7 mmol) were added and dissolved in 2-ethoxyethanol (100 mL). The mixture was slowly stirred for 24 hours. After completion of the reaction, the product was filtered using dichloromethane. After removing the solvent, the solid was filtered. The filtered solid was added to isopropanol and stirred, and then the filtered solid was dried. The mixture was recrystallized using dichloromethane and isopropanol and purified to obtain the compound RD29 with high purity (3.9 g, 3.44 mmol).

Synthesis Example 30: Synthesis of Compound RD30 (Compound 623 in Formula 1-29)

[Reaction Formula 30]

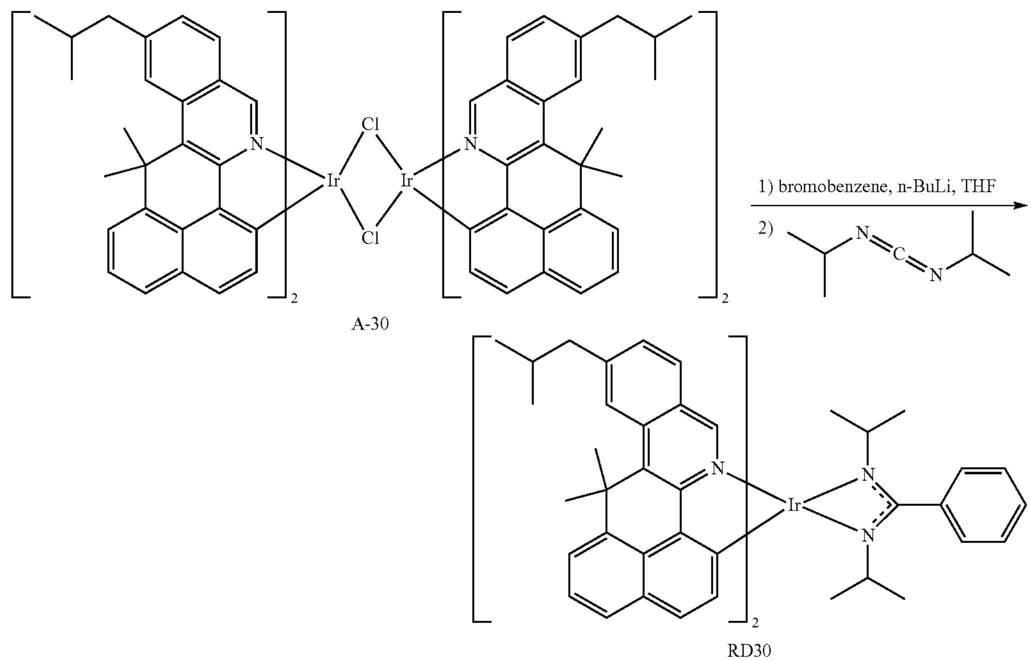

A-30

RD30

Under the nitrogen condition, bromobenzene (1.01 g, 6.46 mmol) and 50 ml of THF were put in a reaction vessel, and the temperature was lowered to −78° C. n-BuLi (2.6 ml, 2.5M in hexane) was slowly added into the mixture. After 30 minutes, while maintaining the temperature, N,N'-diisopropylcarbodiimide (0.82 g, 6.46 mmol) was slowly added, and the mixture was stirred for 30 minutes. The mixture was added to a reaction vessel, in which the compound A-30 (3 g, 1.62 mmol) was dissolved in 100 ml THF, and stirred at 80° C. for 8 hours. The temperature of the mixture was lowered to room temperature and volatile substances were removed. After the mixture was recrystallized using THF/pentane and dichloromethane/hexane, purification was performed to obtain the compound RD30 with high purity (2.7 g, 2.46 mmol).

Synthesis Example 31: Synthesis of compound RD31 (compound 624 in Formula 1-29)

[Reaction Formula 31]

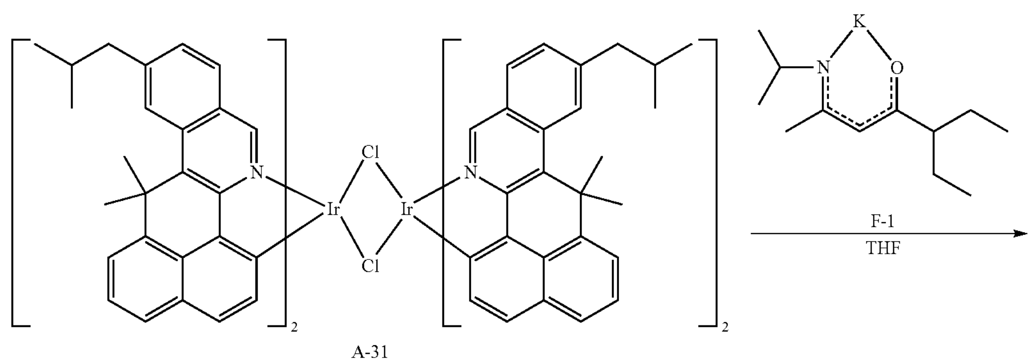

A-31

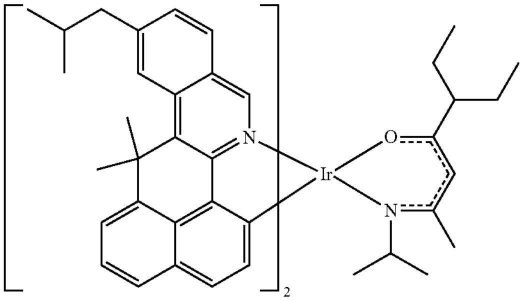

RD31

Under the nitrogen condition, the compound A-31 (3 g, 1.62 mmol) and THT (100 ml) were added in a reaction vessel, and the compound F-1 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD31 with high purity (2.0 g, 1.84 mmol).

Synthesis Example 32: Synthesis of Compound RD32 (Compound 625 in Formula 1-29)

[Reaction Formula 32]

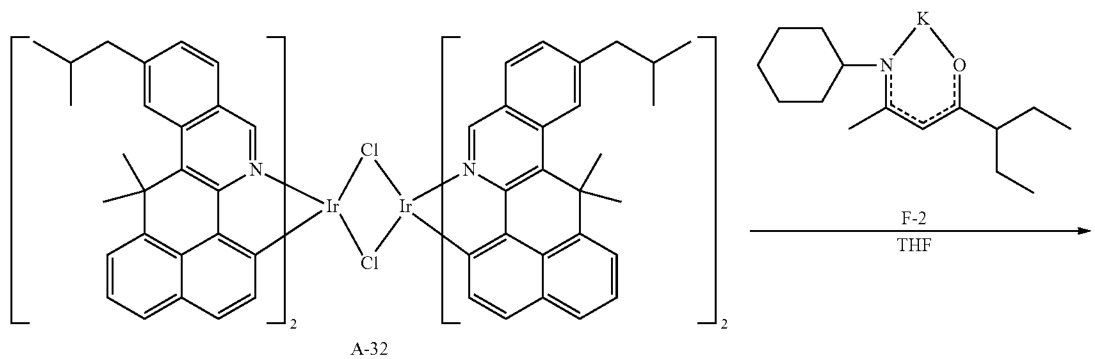

A-32

-continued

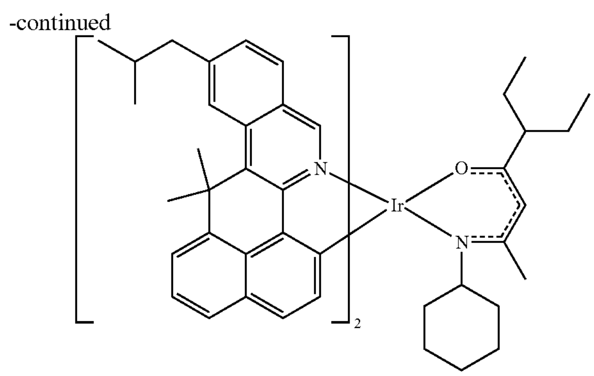

RD32

Under the nitrogen condition, the compound A-32 (3 g, 1.62 mmol) and THT (100 ml) were added in a reaction vessel, and the compound F-2 (0.8 g, 3.56 mmol) dissolved in THF was slowly added. The mixture was stirred at room temperature for 8 hours. The mixture was extracted using toluene, the solvent was removed, and diethyl ether was added to obtain a solid. The obtained solid was purified to obtain the compound RD32 with high purity (1.8 g, 1.59 mmol).

The second compound 234 has an excellent hole-dominant property (characteristic) and is represented by Formula 2-1.

[Formula 2-1]

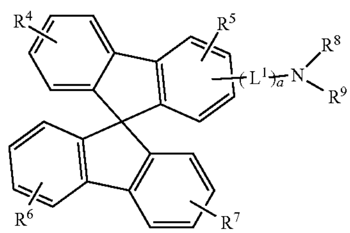

wherein each of $R^4$, $R^5$, $R^6$ and $R^7$ is independently selected from the group consisting of hydrogen, protium, deuterium, an unsubstituted or substituted $C_1$-$C_{20}$ alkyl group and an unsubstituted or substituted $C_6$-$C_{30}$ aryl group, each of $R^8$ and $R^9$ is independently selected from the group consisting of an unsubstituted or substituted $C_6$-$C_{30}$ aryl group and an unsubstituted or substituted $C_3$-$C_{30}$ heteroaryl group, $L^1$ is selected from the group consisting of an unsubstituted or substituted $C_6$-$C_{30}$ arylene group and an unsubstituted or substituted $C_3$-$C_{30}$ heteroarylene group, and a is 0 or 1.

For example, $R^4$, $R^5$, $R^6$ and $R^7$ may be same or different, and each of $R^4$, $R^5$, $R^6$ and $R^7$ may be independently selected from the group consisting of hydrogen, protium, tert-butyl and phenyl. $R^8$ and $R^9$ may be same or different, and each of $R^8$ and $R^9$ may be independently selected from the group consisting of phenyl unsubstituted or substituted with a $C_1$-$C_{20}$ alkyl group, a $C_6$-$C_{30}$ aryl group or a $C_3$-$C_{30}$ heteroaryl group, fluorenyl unsubstituted or substituted with a $C_1$-$C_{20}$ alkyl group or a $C_6$-$C_{30}$ aryl group (aromatic group), e.g., 9,9-dimethyl-9H-fluorenyl or 9,9-diphenyl-9H-fluorenyl, and dibenzofuranyl. $L^1$ may be phenylene.

In Formula 2-1, a linking position of L1 as a linker or an amine group can be specified. For example, Formula 2-1 can be represented by Formula 2-2 or Formula 2-3.

[Formula 2-2]

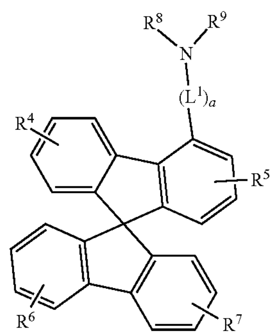

[Formula 2-3]

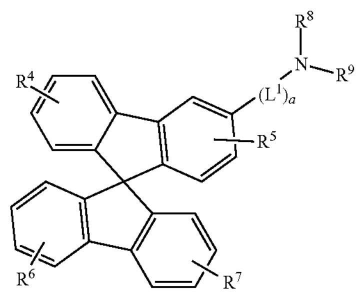

wherein each of $L^1$, a, $R^4$ to $R^9$ is same as defined in Formula 2-1.

For example, the second compound 234 can be one of the compounds in Formula 2-4.
[Formula 2-4]
RHH-1
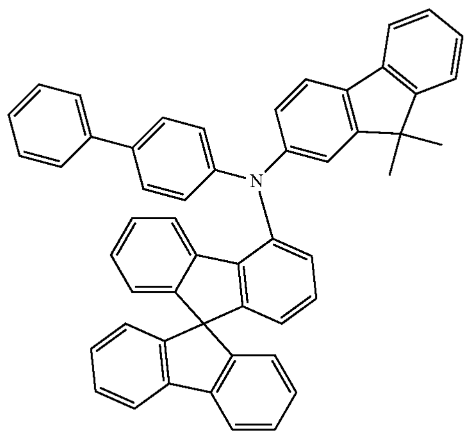
RHH-2
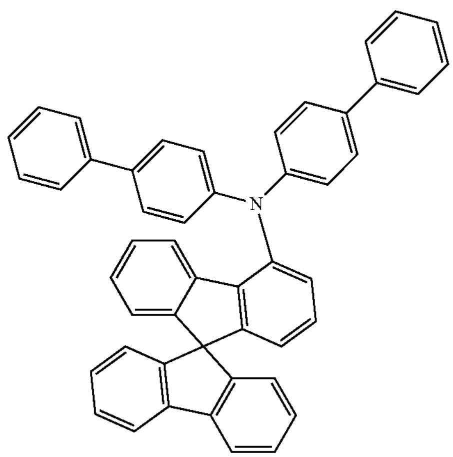
RHH-3
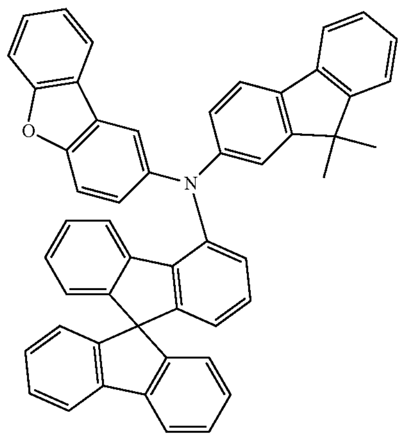
-continued
RHH-4
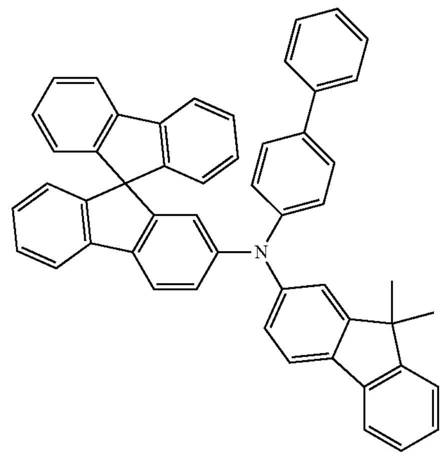
RHH-5
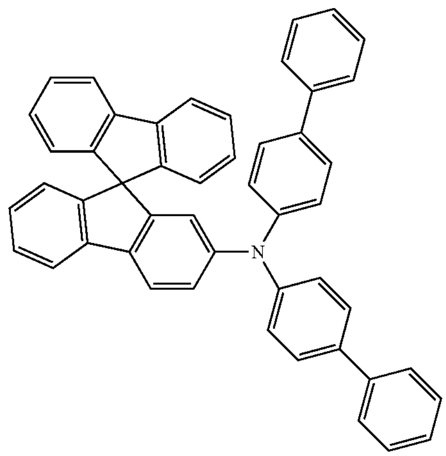
RHH-6
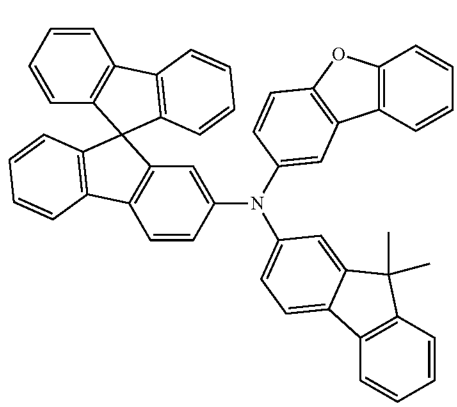

-continued
RHH-7
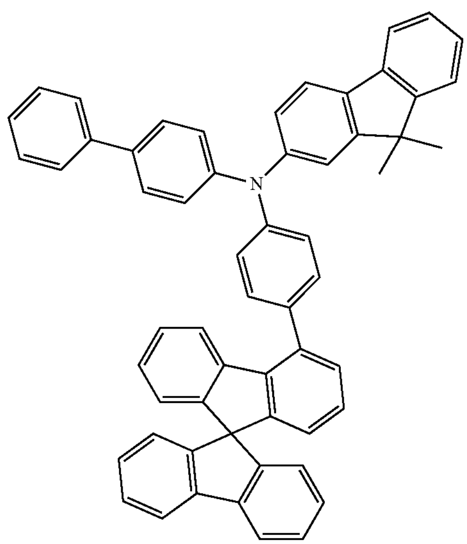
RHH-8
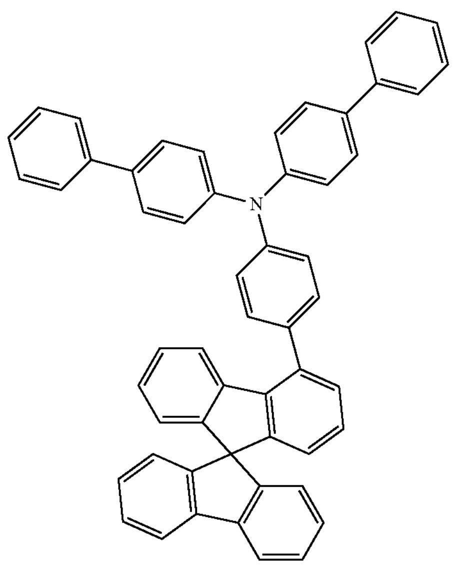
RHH-9
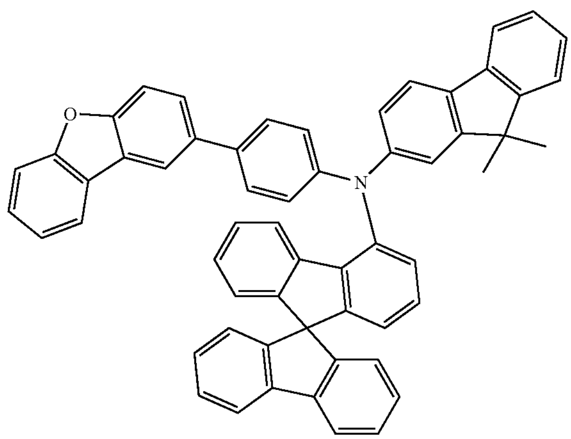
-continued
RHH-10
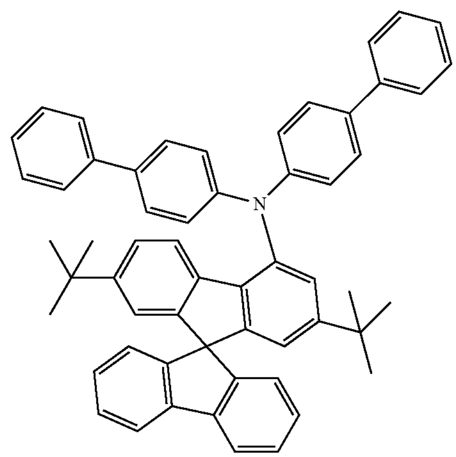
RHH-11
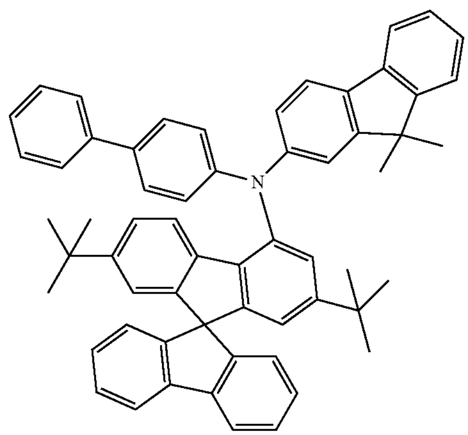
RHH-12
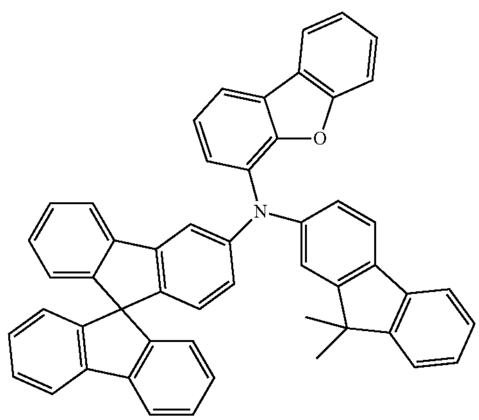

-continued
RHH-13
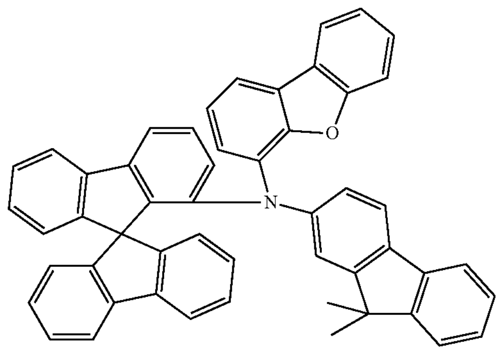
RHH-14
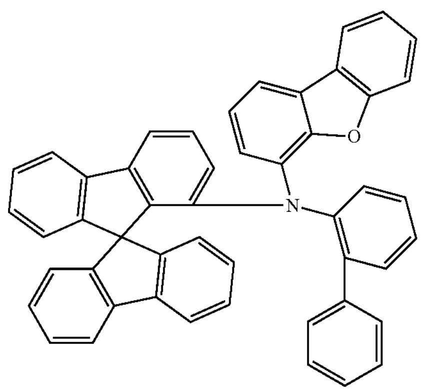
RHH-15
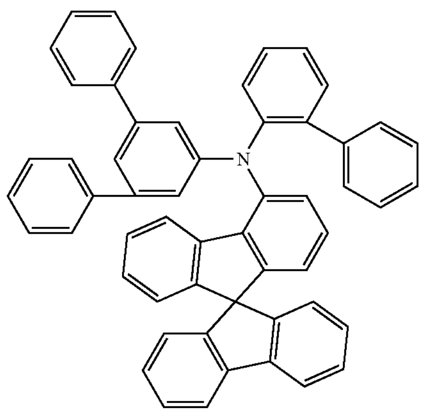
-continued
RHH-16
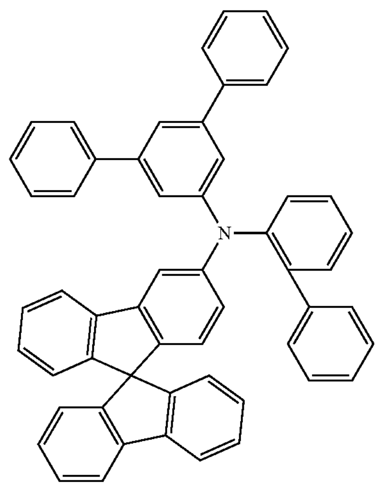
RHH-17
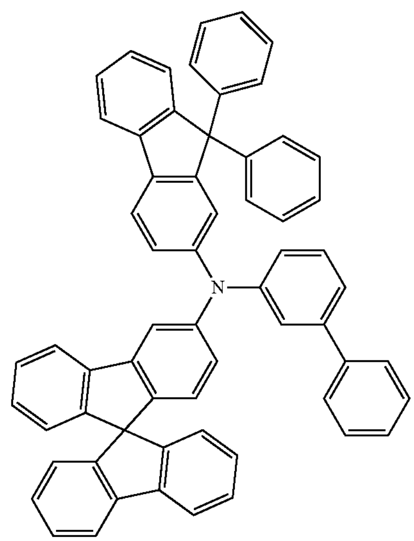
RHH-18
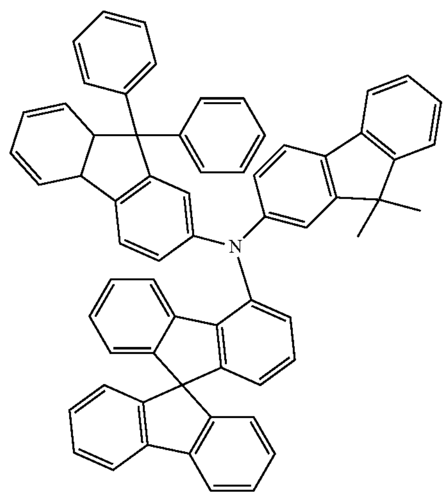

-continued
RHH-19
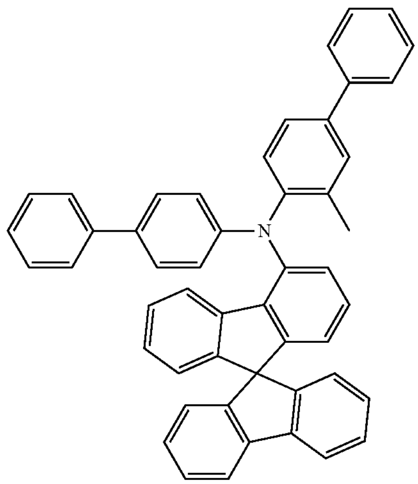
RHH-20
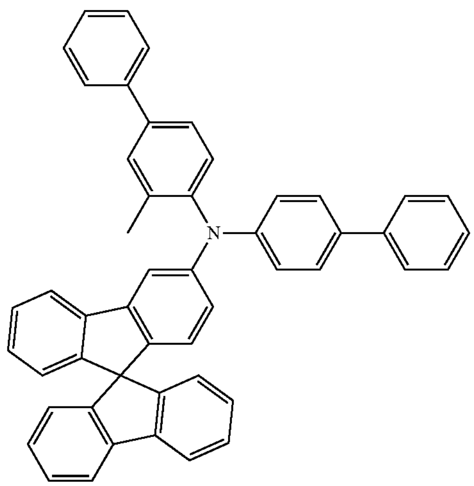
RHH-21
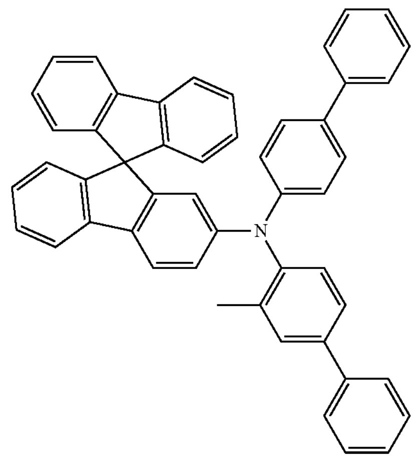
-continued
RHH-22
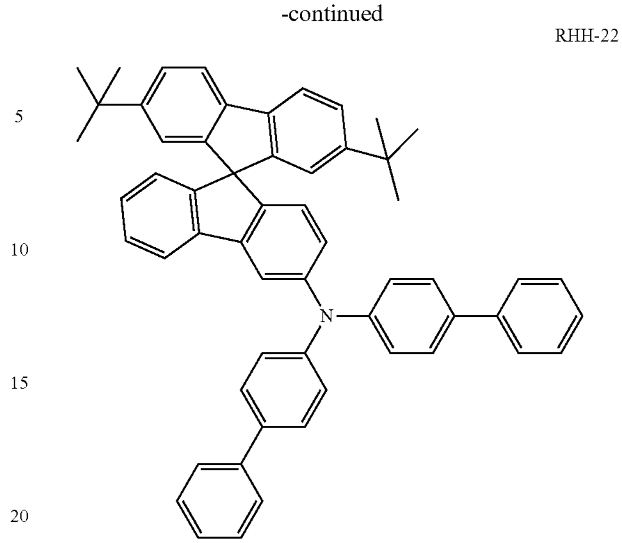
RHH-23
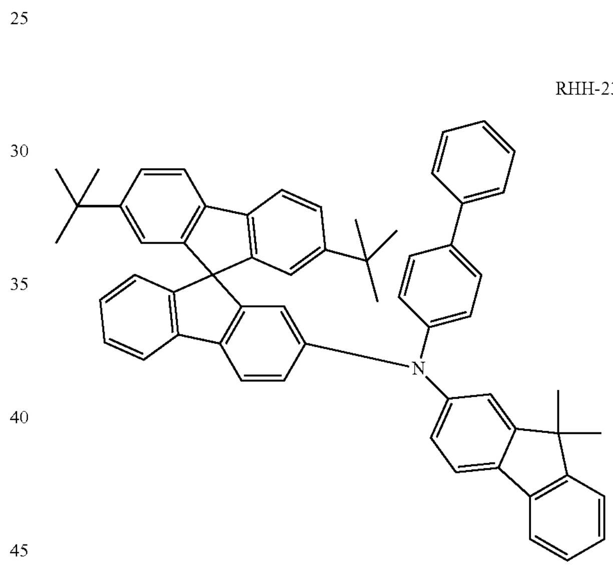
RHH-24
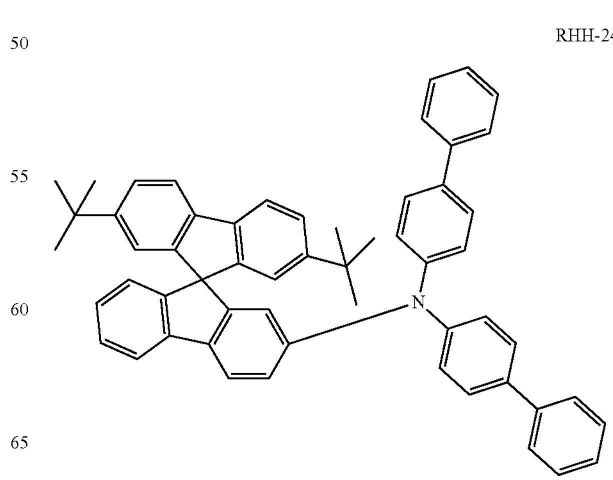

-continued
RHH-25
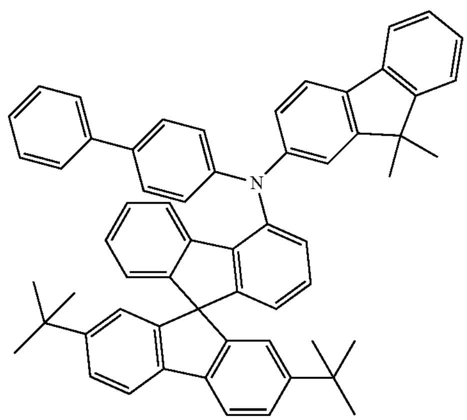
RHH-26
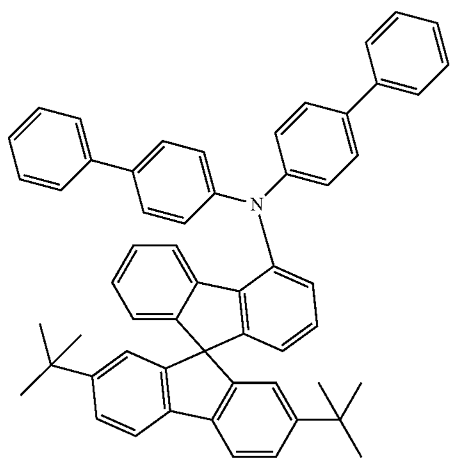
RHH-27
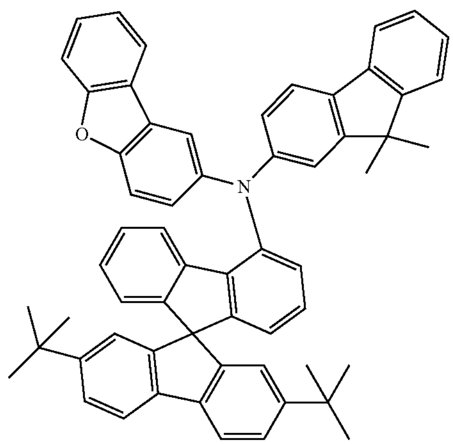
-continued
RHH-28
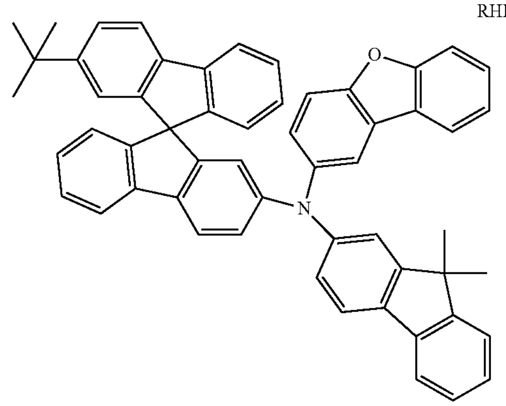
RHH-29
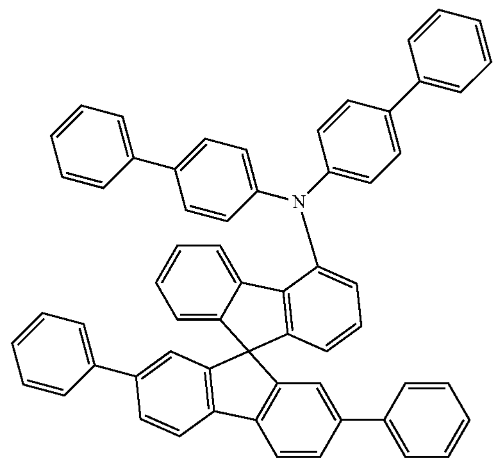
RHH-30
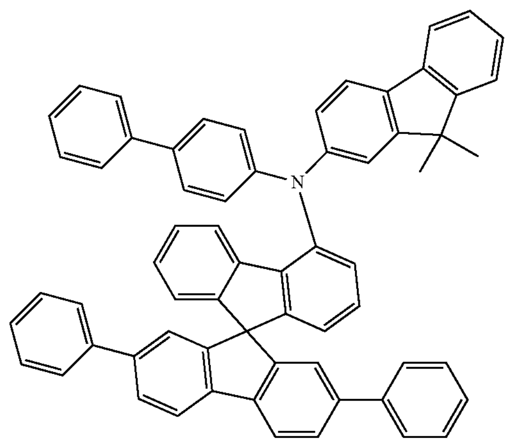

The third compound 236 has an excellent electron-dominant property (characteristic) and is represented by Formula 3-1.

[Formula 3-1]

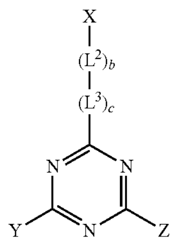

wherein each of X, Y and Z is independently selected from the group consisting of an unsubstituted or substituted $C_6$-$C_{30}$ aryl group and an unsubstituted or substituted $C_3$-$C_{30}$ heteroaryl group; each of $L^2$ and $L^3$ is independently selected from the group consisting of an unsubstituted or substituted $C_6$-$C_{30}$ arylene group and an unsubstituted or substituted $C_3$-$C_{30}$ heteroarylene group; and each of b and c is independently 0 or 1.

X, Y and Z can be same or different. The $C_6$-$C_{30}$ aryl group, the $C_3$-$C_{30}$ heteroaryl group, the $C_6$-$C_{30}$ arylene group and the $C_3$-$C_{30}$ heteroarylene group can be substituted with a $C_1$-$C_{10}$ alkyl group or a $C_6$-$C_{30}$ aryl group.

For example, each of X, Y and Z can be independently selected from the group consisting of dibenzofuranyl, phenyl, naphthyl, dibenzothiophenyl, benzocarbazolyl (naphtho benzofuran), phenyl benzocarbazolyl, naphthylphenyl, biphenyl, fluorenyl substituted with a $C_1$-$C_{10}$ alkyl group or a $C_6$-$C_{30}$ aryl group, e.g., 9,9-dimethyl-9H-fluorenyl or 9,9-diphenyl-9H-fluorenyl, triphenylenyl and phenanthrenyl, and each of $L^2$ and $L^3$ can be independently selected from the group consisting of phenylene, naphthylene and pyridylene.

For example, the third compound 236 of Formula 3-1 can be represented by Formula 3-2.

[Formula 3-2]

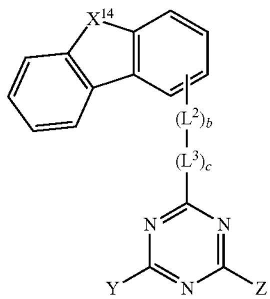

wherein $X^{14}$ is O or S;

each of Y and Z is independently selected from an unsubstituted or substituted $C_6$-$C_{30}$ aryl group;

each of $L^2$ and $L^3$ is independently selected from an unsubstituted or substituted $C_6$-$C_{30}$ arylene group; and each of b and c is independently 0 or 1.

Y and Z can be same or different. For example, each of Y and Z can be independently selected from phenyl and naphthyl.

$L^2$ and $L^3$ can be same or different. For example, $L^2$ and $L^3$ can be independently selected from phenylene and naphthylene. In addition, at least one of b and c can be 1.

In Formula 3-2, $L^2$ (or $L^3$) as a linker can be connected (linked, combined or joined) to a $1^{st}$ position of dibenzofuran moiety. Namely, the third compound 236 of Formula 3-2 can be represented by Formula 3-3.

[Formula 3-3]

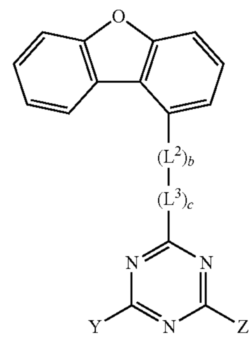

wherein each of Y and Z is independently selected from phenyl and naphthyl;

each of L2 and L3 is independently selected from phenylene and naphthylene; and each of b and c is independently 0 or 1.

Alternatively, in Formula 3-2, $X^{14}$ can be S, and $L^2$ (or $L^3$) as a linker can be connected to a $4^{th}$ position of dibenzothiophene moiety. Namely, the third compound 236 of Formula 3-2 can be represented by Formula 3-4.

[Formula 3-4]

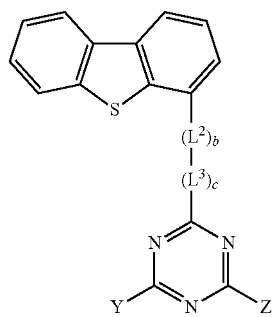

wherein each of Y and Z is independently selected from phenyl and naphthyl;

each of $L^2$ and $L^3$ is independently selected from phenylene and naphthylene; and each of b and c is 1.

Alternatively, the third compound 236 of Formula 3-1 can be represented by Formula 3-5.

[Formula 3-5]

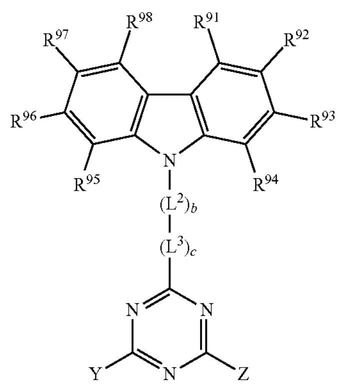

wherein each of Y and Z is independently selected from an unsubstituted or substituted $C_6$-$C_{30}$ aryl group;

each of $L^2$ and $L^3$ is independently selected from an unsubstituted or substituted $C_6$-$C_{30}$ arylene group and an unsubstituted or substituted $C_6$-$C_{30}$ heteroarylene group;

each of b and c is independently 0 or 1;

each of $R^{91}$ to $R^{98}$ is independently selected from the group consisting of hydrogen, an unsubstituted or substituted $C_1$-$C_{10}$ alkyl group and an unsubstituted or substituted $C_6$-$C_{30}$ aryl group;

optionally, adjacent two of $R^{91}$ to $R^{94}$, i.e., $R^9$1 and $R^{92}$, $R^{92}$ and $R^{93}$ or $R^{93}$ and $R^{94}$, form an unsubstituted or substituted $C_6$-$C_{30}$ aromatic ring.

Y and Z can be same or different. For example, each of Y and Z can be independently selected from phenyl, naphthyl and biphenyl. $L^2$ can be selected from phenylene, naphthylene and pyridylene. In addition, b can be 1, and c can be 0.

Adjacent two of $R^{91}$ to $R^{94}$ may further from an unsubstituted or substituted $C_6$-$C_{30}$ aromatic ring, and the other two of $R^{91}$ to $R^{94}$ may be hydrogen. $R^{95}$ to $R^{98}$ may be hydrogen. Alternatively, one of $R^{95}$ to $R^{98}$ may be a $C_6$-$C_{30}$ aryl group, e.g., phenyl, and the other three of $R^{95}$ to $R^{98}$ may be hydrogen.

For example, the third compound 236 can be one of the compounds in Formula 3-6.

[Formula 3-6]

REH-1

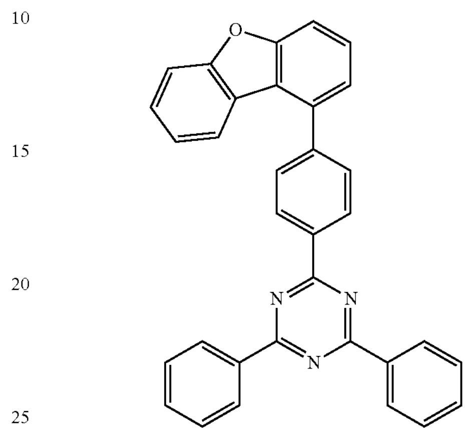

REH-2

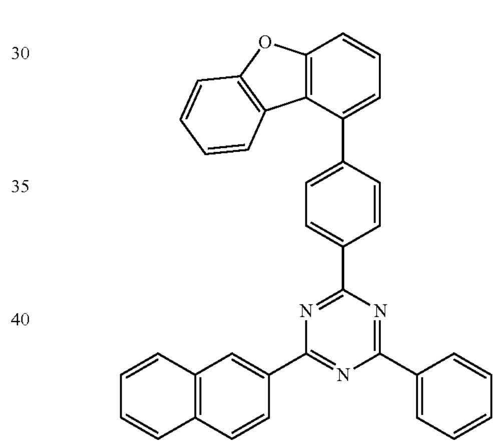

REH-3

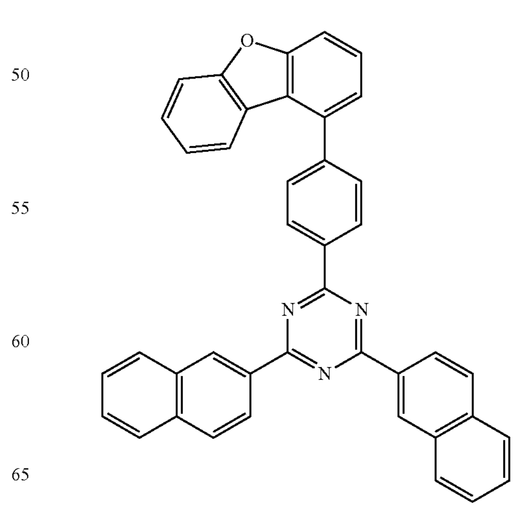

-continued
REH-4
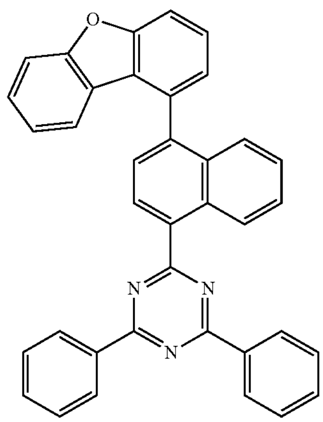
REH-5
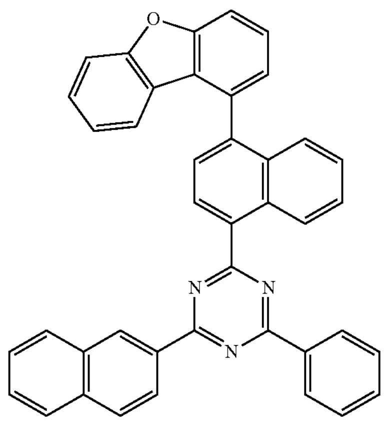
REH-6
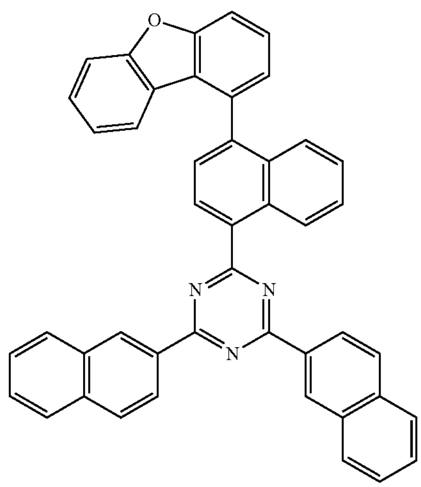
-continued
REH-7
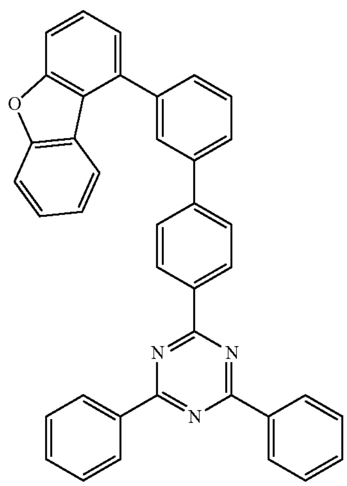
REH-8
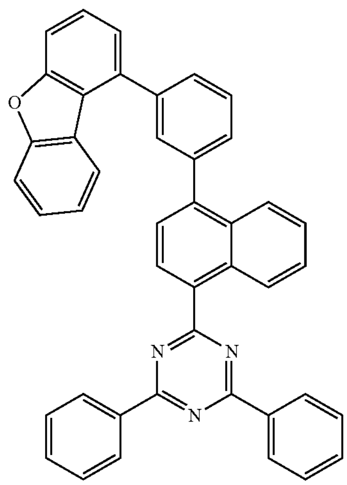
REH-9
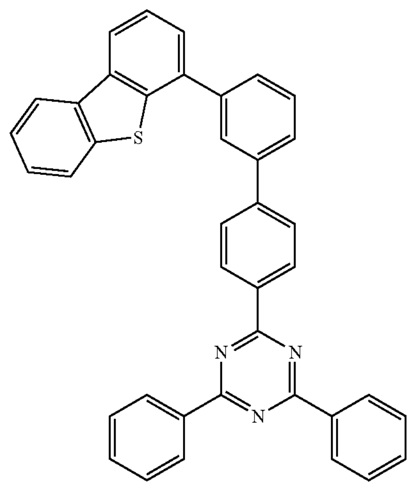

-continued
REH-10
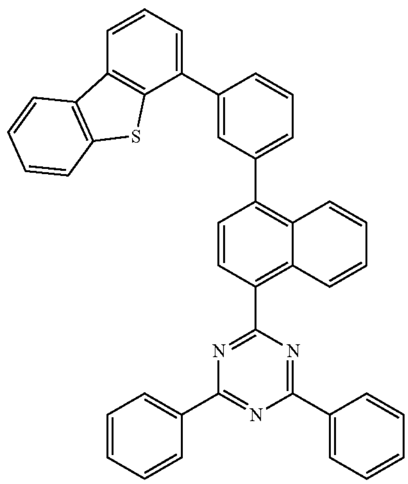
REH-11
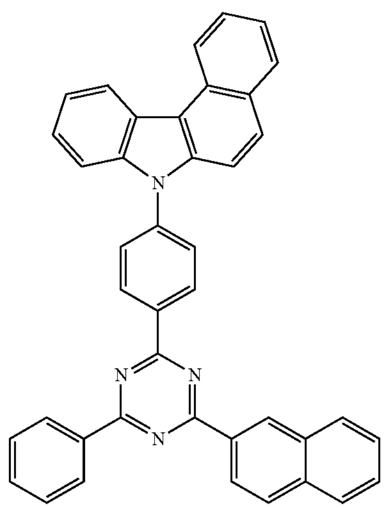
REH-12
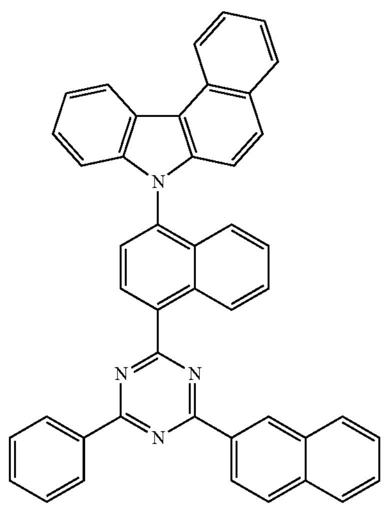
-continued
REH-13
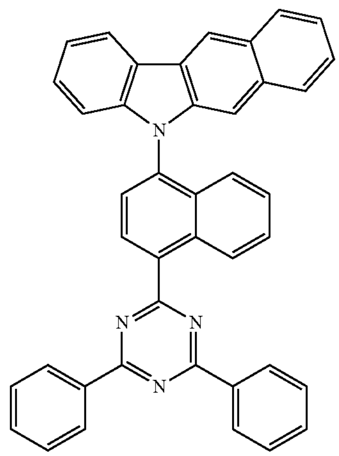
REH-14
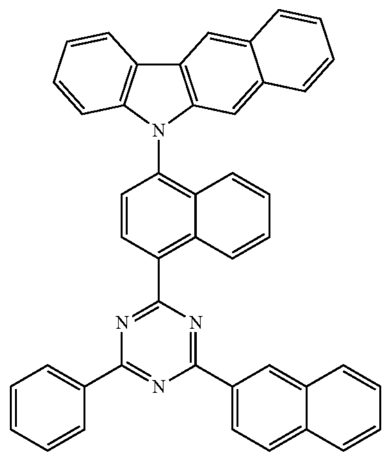
REH-15
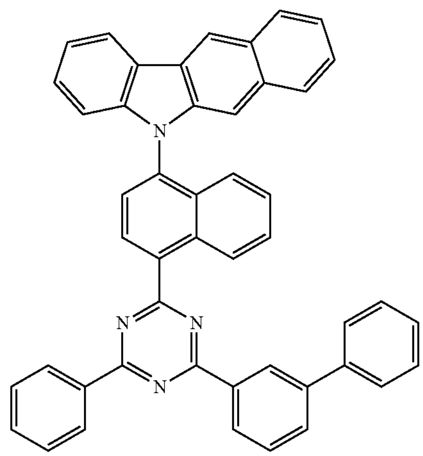

-continued
REH-16
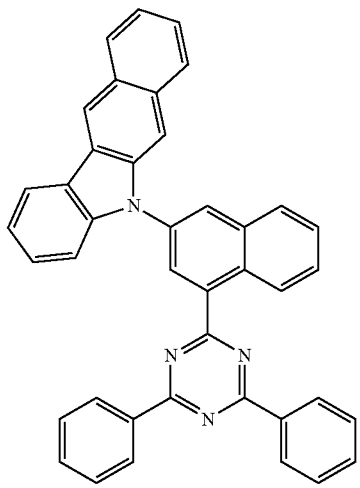
REH-17
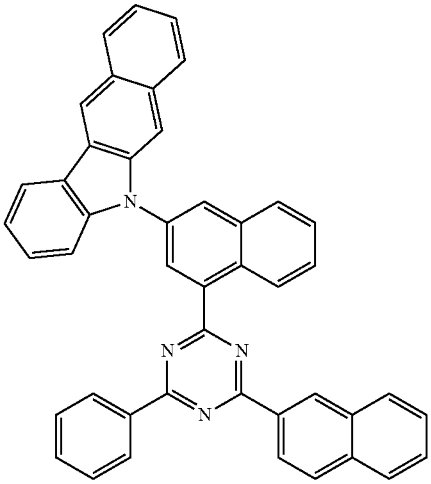
REH-18
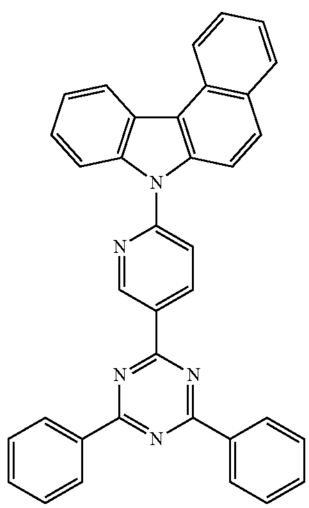
-continued
REH-19
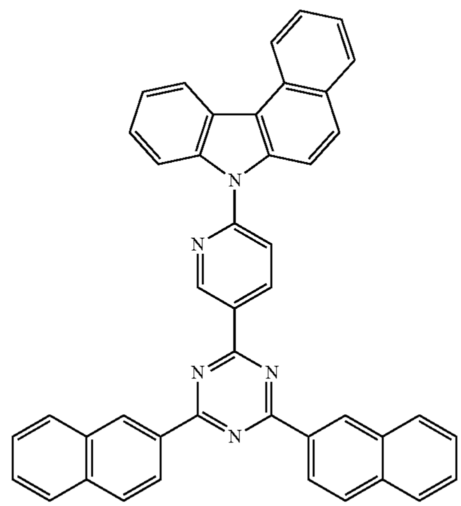
REH-20
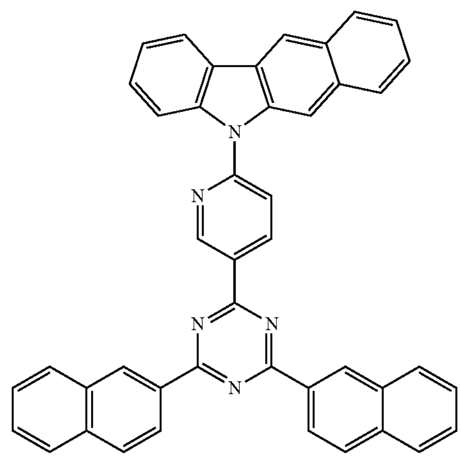
REH-21
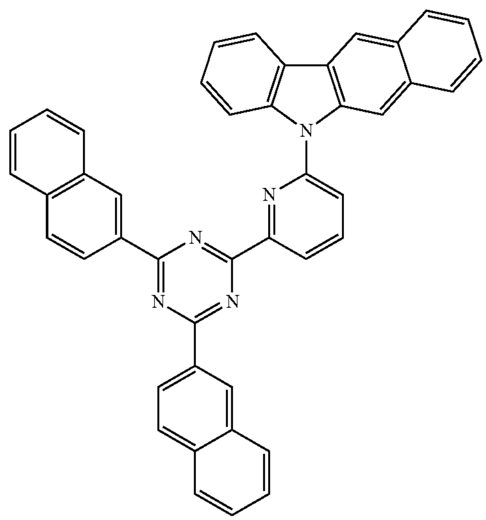

-continued
REH-22
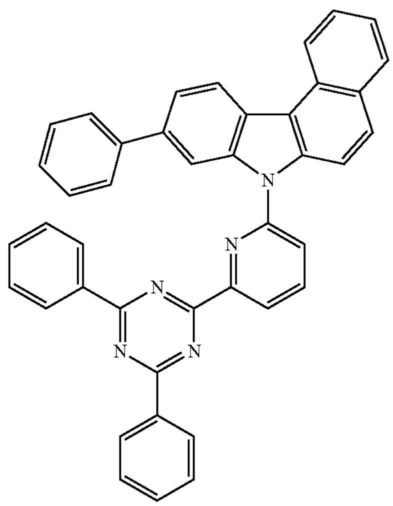
REH-23
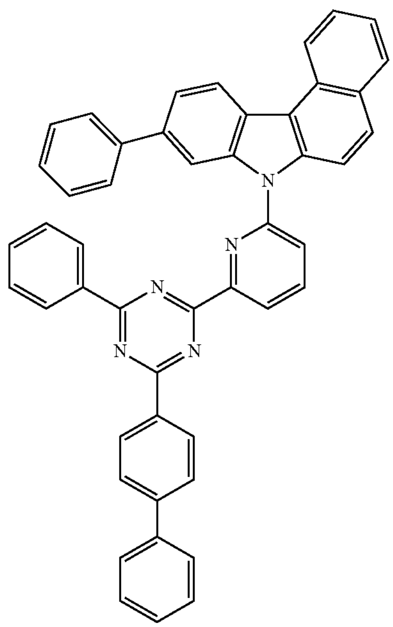
REH-24
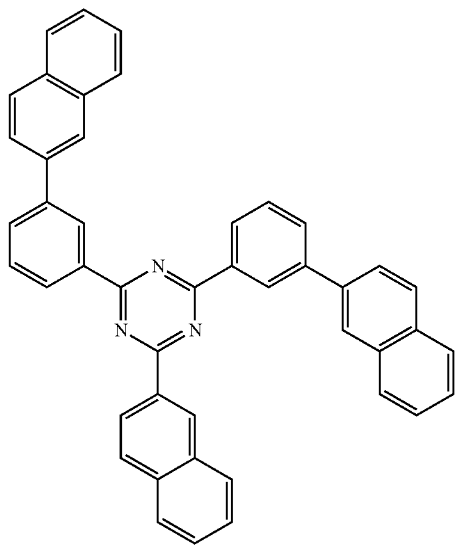
-continued
REH-25
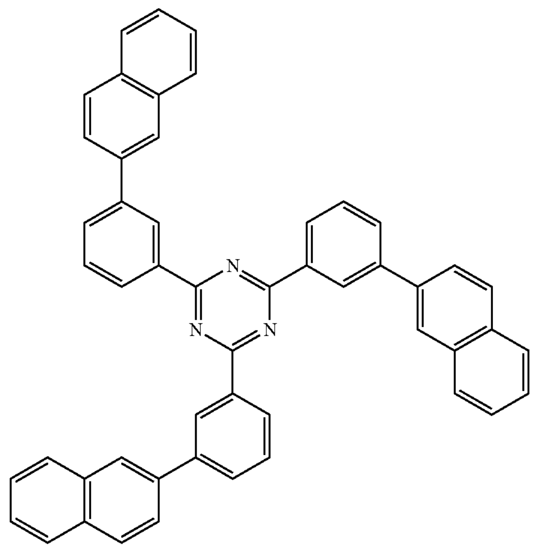
REH-26
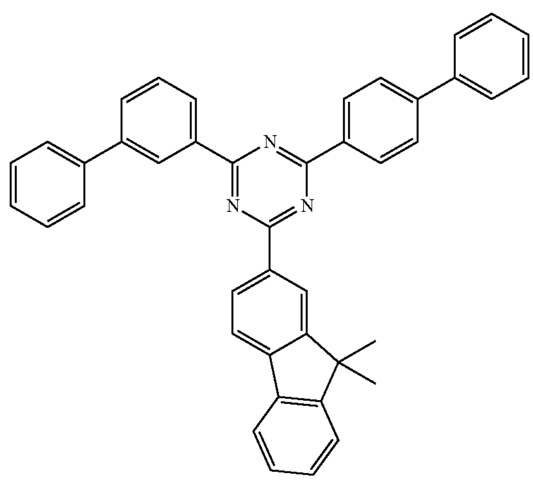
REH-27
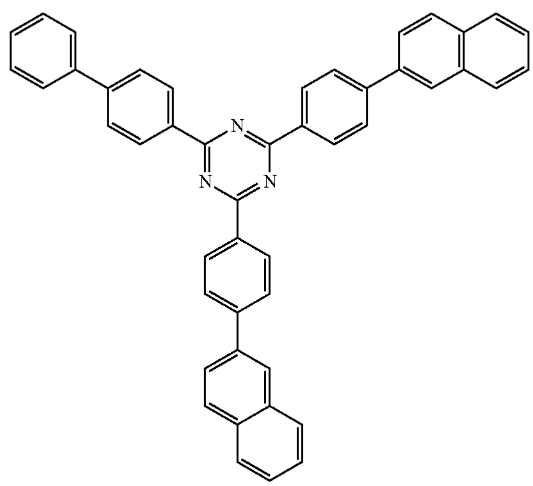

-continued

REH-28

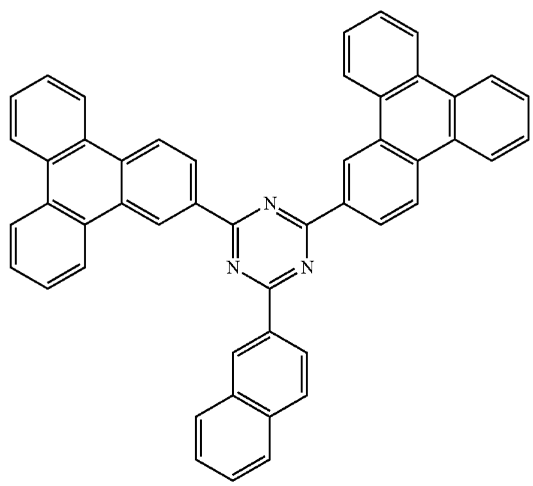

REH-29

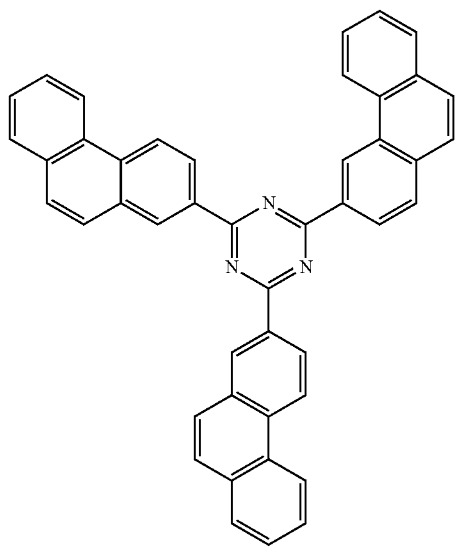

REH-30

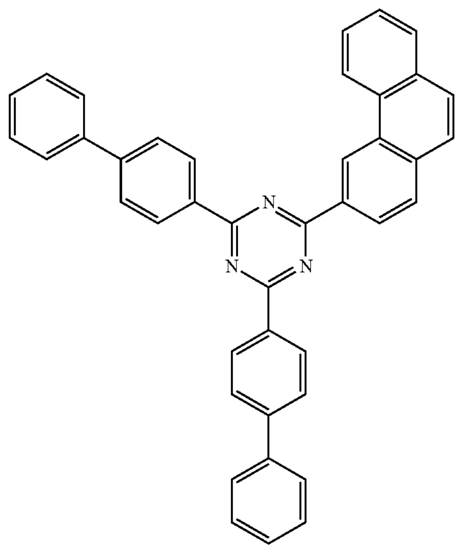

The HIL 210 is positioned between the first electrode 160 and the HTL 220. The HIL 210 can include at least one compound selected from the group consisting of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino)triphenylamine (1 T-NATA), 4,4',4"-tris(N-(naphthalene-2-yl)-N-phenyl-amino)triphenylamine (2 T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile(dipyrazino[2,3-f:2'3'-h]quinoxaline-2,3,6,7,10,11-hexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS), and N-(biphenyl-4-yl)-9,9-dimethyl-N-(4-(9-phenyl-9H-carbazol-3-yl)phenyl)-9H-fluoren-2-amine, but it is not limited thereto. The HIL 210 can have a thickness of 10 to 200 Å, preferably 50 to 150 Å.

The HTL 220 is positioned between the HIL 210 and the red EML 230. The HTL 220 can include at least one compound selected from the group consisting of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and a compound in Formula 4, but it is not limited thereto. The HTL 220 can have a thickness of 500 to 900 Å, preferably 600 to 800 Å.

[Formula 4]

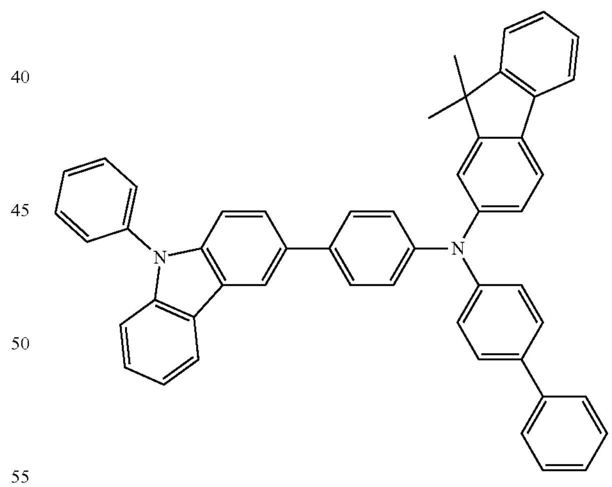

The ETL 240 is positioned between the red EML 230 and the second electrode 164 and includes at least one of an oxadiazole-based compound, a triazole-based compound, a phenanthroline-based compound, a benzoxazole-based compound, a benzothiazole-based compound, a benzimidazole-based compound, and a triazine-based compound. For example, the ETL 240 can include at least one compound selected from the group consisting of tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis (2-methyl-8-quinolinolato-N1,O8)-(1,1'-biphenyl-4-olato) aluminum (Balq), 4,7-diphenyl-1,10-phenanthroline (Bphen), 2,9-bis(naphthalene-2-yl)-4,7-diphenyl-1,10-phenanthroline (Nbphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(167arbazol-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline) (TPQ), and diphenyl-4-triphenylsilyl-phenylphosphine oxide (TSPO1), but it is not limited thereto. The ETL 240 can have a thickness of 100 to 500 Å, preferably 200 to 400 Å.

The EIL 250 is positioned between the ETL 240 and the second electrode 164. The EIL 250 at least one of an alkali halide compound, such as LiF, CsF, NaF, or $BaF_2$, and an organo-metallic compound, such as Liq, lithium benzoate, or sodium stearate, but it is not limited thereto. The EIL 250 can have a thickness of 1 to 20 Å, preferably 5 to 15 Å.

The EBL, which is positioned between the HTL 220 and the red EML 230 to block the electron transfer from the red EML 230 to the HTL 220, can include at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(168arbazole-9-yl)benzene (mCP), 3,3'-bis(N-carbazolyl)-1,1'-biphenyl (mCBP), CuPc, N,N'-bis[4-[bis(3-methylphenyl)amino]phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene), but it is not limited thereto.

The HBL, which is positioned between the ETL 240 and the red EML 230 to block the hole transfer from the red EML 230 to the ETL 240, can include the above material of the ETL 240. For example, the material of the HBL has a HOMO energy level being lower than a material of the red EML 230 and can be at least one compound selected from the group consisting of BCP, Balq, Alq3, PBD, spiro-PBD, Liq, bis-4,6-(3,5-di-3-pyridylphenyl)-2-methylpyrimidine (B3PYMPM), bis[2-(diphenylphosphino)phenyl]ether oxide (DPEPO), 9-(6-9H-carbazol-9-yl)pyridine-3-yl)-9H-3,9'-bicarbazole, and TSPO1, but it is not limited thereto.

As illustrated above, the OLED D1 is positioned in the red pixel region, and the red EML 230 of the OLED D1 includes the first compound 232, which is represented by Formula 1-1, being a dopant, the second compound 234, which is represented by Formula 2-1, being a first host or a p-type host and the third compound 236, which is represented by Formula 3-1, being a second host or an n-type host. As a result, in the OLED D1, the driving voltage is decreased, and the luminous efficiency and the luminous lifespan is increased.

Figure 4:
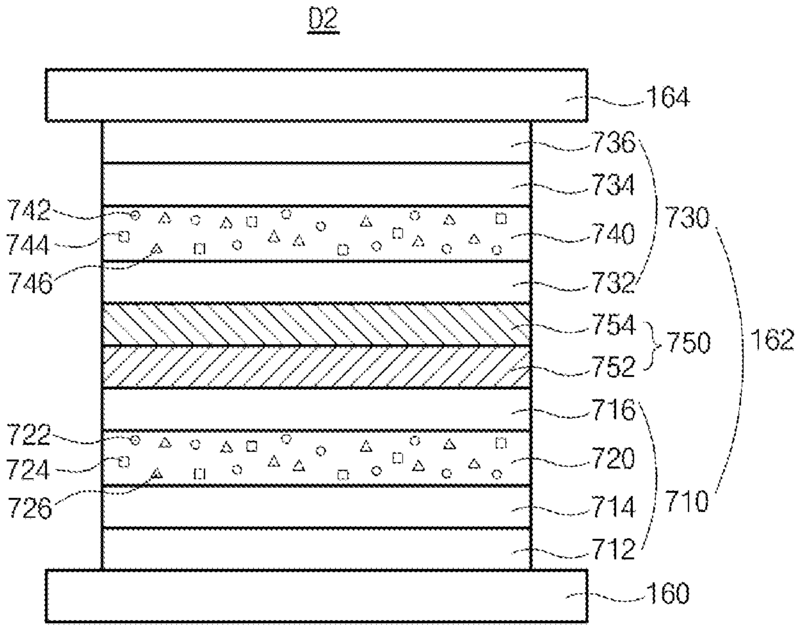
FIG. 4 is a cross-sectional view illustrating an OLED according to a third embodiment of the present disclosure.

FIG. 4 is a cross-sectional view illustrating an OLED according to a third embodiment of the present disclosure.

As shown in FIG. 4, the OLED D2 includes first and second electrodes 160 and 164 facing each other and the organic emitting layer 162 therebetween. The organic emitting layer 162 includes a first emitting part 710 including a first red EML 720 and a second emitting part 730 including a second red EML 740. In addition, the organic emitting layer 162 can further include a charge generation layer (CGL) 750 between the first and second emitting parts 710 and 730.

For example, the first electrode 160 can include a transparent conductive material, e.g., ITO or IZO, and the second electrode 164 can include one of Al, Mg, Ag, AlMg and MgAg.

The CGL 750 is positioned between the first and second emitting parts 710 and 730 so that the first emitting part 710, the CGL 750 and the second emitting part 730 are sequentially stacked on the first electrode 160. Namely, the first emitting part 710 is positioned between the first electrode 160 and the CGL 750, and the second emitting part 730 is positioned between the second electrode 164 and the CGL 750.

As illustrated below, the first emitting part 710 includes the first red EML 720. The first red EML 720 includes a first compound 722 as a red dopant (e.g., a red emitter), a second compound 724 as a p-type host (e.g., a first host) and a third compound 726 as an n-type host (e.g., a second host). In the first red EML 720, the first compound 722 is represented by Formula 1-1, the second compound 724 is represented by Formula 2-1, and the third compound 726 is represented by Formula 3-1.

The first red EML 720 can have a thickness of 100 to 400 Å, e.g., 200 to 400 Å, but it is not limited thereto.

In the first red EML 720, each of the second and third compounds 724 and 726 can have a weight % being greater than the first compound 722. For example, in the first red EML 720, the first compound 722 can have a weight % of 1 to 20, e.g., 5 to 15.

In addition, in the first red EML 720, a ratio of the weight % between the second compound 724 and the third compound 726 can be 1:3 to 3:1. For example, in the first red EML 720, the second and third compounds 724 and 726 can have the same weight %.

The first emitting part 710 can further include at least one of a first HTL 714 under the first red EML 720 and a first ETL 716 on or over the first red EML 720. Namely, the first HTL 714 is disposed between the first red EML 720 and the first electrode 160, and the first ETL 716 is disposed between the first red EML 720 and the CGL 750.

In addition, the first emitting part 710 can further include an HIL 712 between the first electrode 160 and the first HTL 714.

As illustrated below, the second emitting part 730 includes the second red EML 740. The second red EML 740 includes a first compound 742, e.g., a fourth compound, as a red dopant (e.g., a red emitter), a second compound 744, e.g., a fifth compound, as a p-type host (e.g., a first host) and a third compound 726, e.g., a sixth compound, as an n-type host (e.g., a second host). In the second red EML 740, the first compound 742 is represented by Formula 1-1, the second compound 744 is represented by Formula 2-1, and the third compound 746 is represented by Formula 3-1.

The second red EML 740 can have a thickness of 100 to 400 Å, e.g., 200 to 400 Å, but it is not limited thereto.

In the second red EML 740, each of the second and third compounds 744 and 746 can have a weight % being greater than the first compound 742. For example, in the second red EML 740, the first compound 742 can have a weight % of 1 to 20, e.g., 5 to 15.

In addition, in the second red EML 740, a ratio of the weight % between the second compound 744 and the third compound 746 can be 1:3 to 3:1. For example, in the second red EML 740, the second and third compounds 744 and 746 can have the same weight %.

The first compound 742 in the second red EML 740 and the first compound 722 in the first red EML 720 can be same or different. The second compound 744 in the second red EML 740 and the second compound 724 in the first red EML 720 can be same or different. The third compound 746 in the second red EML 740 and the third compound 726 in the first red EML 720 can be same or different.

The second emitting part 730 can further include at least one of a second HTL 732 under the second red EML 740 and a second ETL 734 on or over the second red EML 740. Namely, the second HTL 732 is disposed between the second red EML 740 and the CGL 750, and the second ETL 734 is disposed between the second red EML 740 and the second electrode 164.

In addition, the second emitting part 730 can further include an EIL 736 between the second ETL 734 and the second electrode 164.

The CGL 750 is positioned between the first and second emitting parts 710 and 730. Namely, the first and second emitting parts 710 and 730 are connected to each other through the CGL 750. The CGL 750 can be a P-N junction type CGL of an N-type CGL 752 and a P-type CGL 754.

The N-type CGL 752 is positioned between the first ETL 716 and the second HTL 732, and the P-type CGL 754 is positioned between the N-type CGL 752 and the second HTL 732.

In the OLED D2, at least one of the first and second red EMLs 720 and 740 includes a first compound, e.g., a red dopant, represented by Formula 1-1, a second compound, e.g., a p-type host, represented by Formula 2-1 and a third compound, e.g., an n-type host, represented by Formula 3-1. As a result, the OLED D2 has advantages in the driving voltage, the luminous efficiency and the luminous lifespan.

Figure 5:
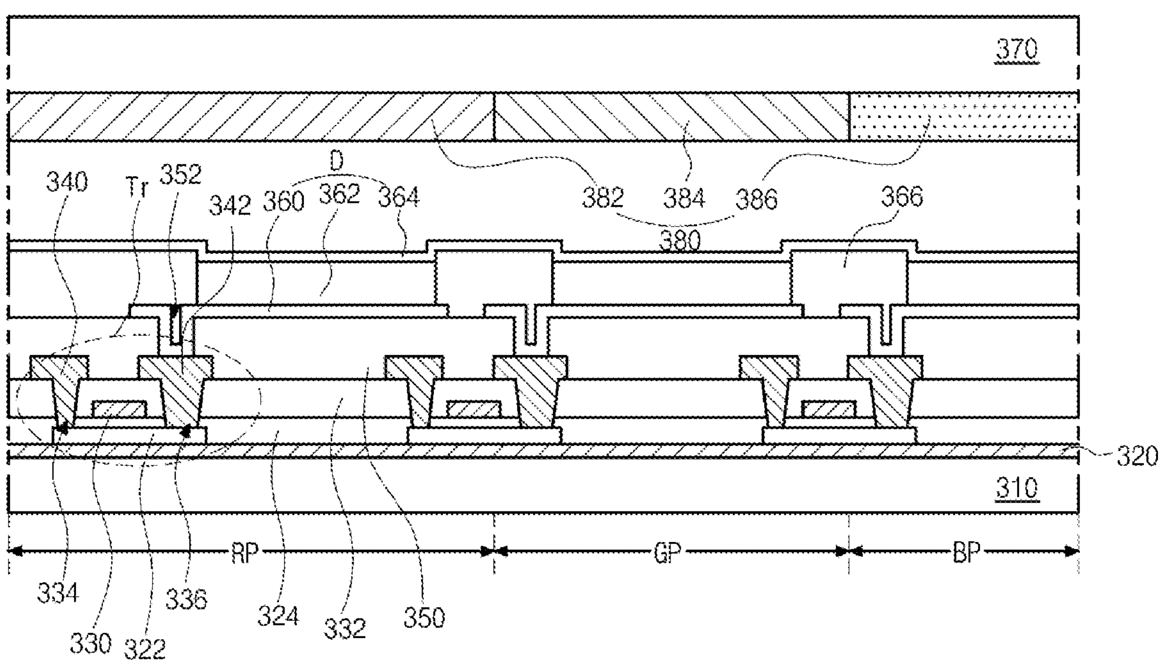
FIG. 5 is a cross-sectional view illustrating an organic light emitting display device according to a fourth embodiment of the present disclosure.

FIG. 5 is a cross-sectional view illustrating an organic light emitting display device according to a fourth embodiment of the present disclosure.

As shown in FIG. 5, the organic light emitting display device 300 includes a first substrate 310, where a red pixel region RP, a green pixel region GP and a blue pixel region BP are defined, a second substrate 370 facing the first substrate 310, an OLED D, which is positioned between the first and second substrates 310 and 370 and providing white emission, and a color filter layer 380 between the OLED D and the second substrate 370.

Each of the first and second substrates 310 and 370 can be a glass substrate or a flexible substrate. For example, each of the first and second substrates 310 and 370 can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 320 is formed on the substrate, and the TFT Tr corresponding to each of the red, green and blue pixel regions RP, GP and BP is formed on the buffer layer 320. The buffer layer 320 can be omitted.

A semiconductor layer 322 is formed on the buffer layer 320. The semiconductor layer 322 can include an oxide semiconductor material or polycrystalline silicon.

A gate insulating layer 324 is formed on the semiconductor layer 322. The gate insulating layer 324 can be formed of an inorganic insulating material such as silicon oxide or silicon nitride.

A gate electrode 330, which is formed of a conductive material, e.g., metal, is formed on the gate insulating layer 324 to correspond to a center of the semiconductor layer 322.

An interlayer insulating layer 332, which is formed of an insulating material, is formed on the gate electrode 330. The interlayer insulating layer 332 can be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

A source electrode 340 and a drain electrode 342, which are formed of a conductive material, e.g., metal, are formed on the interlayer insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr. The TFT Tr serves as a driving element. Namely, the TFT Tr can correspond to the driving TFT Td (of FIG. 1).

The gate line and the data line cross each other to define the pixel, and the switching TFT is formed to be connected to the gate and data lines. The switching TFT is connected to the TFT Tr as the driving element.

In addition, the power line, which can be formed to be parallel to and spaced apart from one of the gate and data lines, and the storage capacitor for maintaining the voltage of the gate electrode of the TFT Tr in one frame can be further formed.

A planarization layer 350, which includes a drain contact hole 352 exposing the drain electrode 342 of the TFT Tr, is formed to cover the TFT Tr.

A first electrode 360, which is connected to the drain electrode 342 of the TFT Tr through the drain contact hole 352, is separately formed in each pixel region and on the planarization layer 350. The first electrode 360 can be an anode and can be formed of a conductive material, e.g., a transparent conductive oxide (TCO), having a relatively high work function. The first electrode 360 can further include a reflection electrode or a reflection layer. For example, the reflection electrode or the reflective layer can include Ag or aluminum-palladium-copper (APC). In a top-emission type organic light emitting display device 300, the first electrode 360 can have a structure of ITO/Ag/ITO or ITO/APC/ITO.

A bank layer 366 is formed on the planarization layer 350 to cover an edge of the first electrode 360. Namely, the bank layer 366 is positioned at a boundary of the pixel and exposes a center of the first electrode 360 in the pixel. Since the OLED D emits the white light in the red, green and blue pixel regions RP, GP and BP, the organic emitting layer 362 can be formed as a common layer in the red, green and blue pixel regions RP, GP and BP without separation. The bank layer 366 can be formed to prevent a current leakage at an edge of the first electrode 360 and can be omitted.

An organic emitting layer 362 is formed on the first electrode 360. As illustrated below, the organic emitting layer 362 includes at least two emitting parts, and each emitting part includes at least one EML. As a result, the OLED D emits the white light.

At least one of the emitting parts includes a first compound, e.g., a red dopant, represented by Formula 1-1, a second compound, e.g., a p-type host or a first host, represented by Formula 2-1 and a third compound, e.g., an n-type host or a second host, represented by Formula 3-1 to emit the red light.

A second electrode 364 is formed over the substrate 310 where the organic emitting layer 362 is formed.

In the organic light emitting display device 300, since the light emitted from the organic emitting layer 362 is incident to the color filter layer 380 through the second electrode 364, the second electrode 364 has a thin profile for transmitting the light.

The first electrode 360, the organic emitting layer 362 and the second electrode 364 constitute the OLED D.

The color filter layer 380 is positioned over the OLED D and includes a red color filter 382, a green color filter 384 and a blue color filter 386 respectively corresponding to the red, green and blue pixel regions RP, GP and BP. The red color filter 382 can include at least one of red dye and red pigment, the green color filter 384 can include at least one of green dye and green pigment, and the blue color filter 386 can include at least one of blue dye and blue pigment.

The color filter layer 380 can be attached to the OLED D by using an adhesive layer. Alternatively, the color filter layer 380 can be formed directly on the OLED D.

An encapsulation film can be formed to prevent penetration of moisture into the OLED D. For example, the encapsulation film can include a first inorganic insulating layer, an organic insulating layer and a second inorganic insulating layer sequentially stacked, but it is not limited thereto. The encapsulation film can be omitted.

A polarization plate for reducing an ambient light reflection can be disposed over the top-emission type OLED D. For example, the polarization plate can be a circular polarization plate.

In the OLED of FIG. 5, the first and second electrodes 360 and 364 are a reflection electrode and a transparent (or semi-transparent) electrode, respectively, and the color filter layer 380 is disposed over the OLED D. Alternatively, when the first and second electrodes 360 and 364 are a transparent (or semi-transparent) electrode and a reflection electrode, respectively, the color filter layer 380 can be disposed between the OLED D and the first substrate 310.

A color conversion layer can be formed between the OLED D and the color filter layer 380. The color conversion layer can include a red color conversion layer, a green color conversion layer and a blue color conversion layer respectively corresponding to the red, green and blue pixel regions RP, GP and BP. The white light from the OLED D is converted into the red light, the green light and the blue light by the red, green and blue color conversion layer, respectively. For example, the color conversion layer can include a quantum dot. Accordingly, the color purity of the organic light emitting display device 300 can be further improved.

The color conversion layer can be included instead of the color filter layer 380.

As described above, in the organic light emitting display device 300, the OLED D in the red, green and blue pixel regions RP, GP and BP emits the white light, and the white light from the organic light emitting diode D passes through the red color filter 382, the green color filter 384 and the blue color filter 386. As a result, the red light, the green light and the blue light are provided from the red pixel region RP, the green pixel region GP and the blue pixel region BP, respectively.

In FIG. 5, the OLED D emitting the white light is used for a display device. Alternatively, the OLED D can be formed on an entire surface of a substrate without at least one of the driving element and the color filter layer to be used for a lightening device. The display device and the lightening device each including the OLED D of the present disclosure can be referred to as an organic light emitting device.

Figure 6:
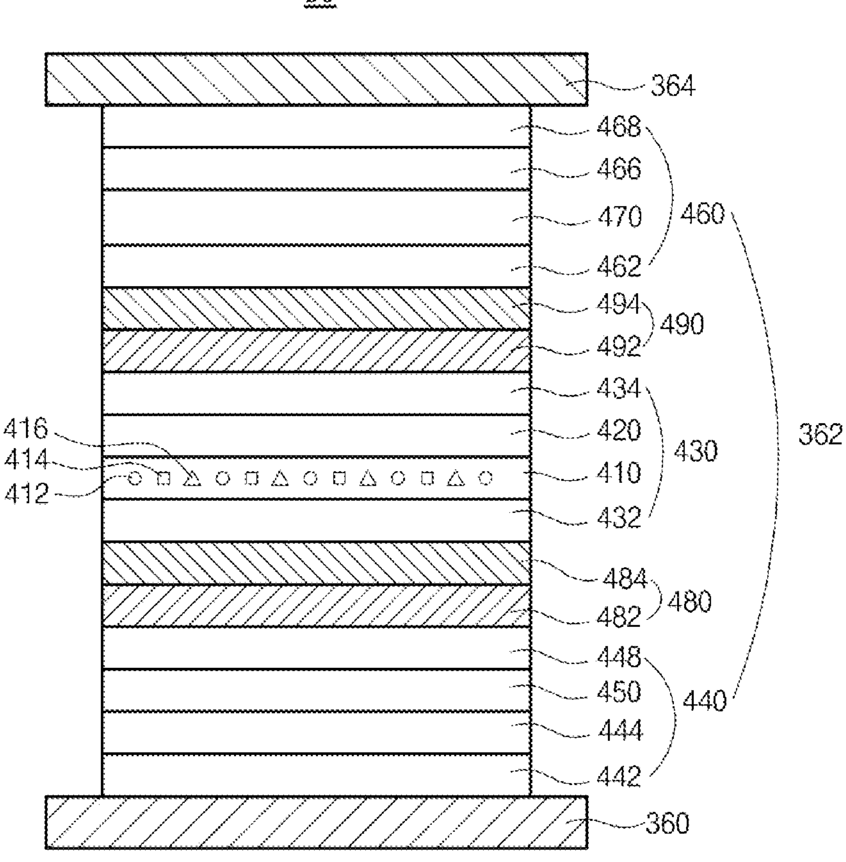
FIG. 6 is a cross-sectional view illustrating an OLED according to a fifth embodiment of the present disclosure.

FIG. 6 is a cross-sectional view illustrating an OLED according to a fifth embodiment of the present disclosure.

As shown in FIG. 6, in the OLED D3, the organic emitting layer 362 includes a first emitting part 430 including a red EML 410, a second emitting part 440 including a first blue EML 450 and a third emitting part 460 including a third blue EML 470. In addition, the organic emitting layer 362 can further include a first CGL 480 between the first and second emitting parts 430 and 440 and a second CGL 490 between the first and third emitting part 430 and 460. In addition, the first emitting part 430 can further include a green EML 420.

The first electrode 360 is an anode, and the second electrode 364 is a cathode. One of the first and second electrodes 360 and 364 can be a transparent (semitransparent) electrode, and the other one of the first and second electrodes 360 and 364 can be a reflective electrode.

The second emitting part 440 is positioned between the first electrode 360 and the first emitting part 430, and the third emitting part 460 is positioned between the first emitting part 430 and the second electrode 364. In addition, the second emitting part 440 is positioned between the first electrode 360 and the first CGL 480, and the third emitting part 460 is positioned between the second CGL 490 and the second electrode 364. Namely, the second emitting part 440, the first CGL 480, the first emitting part 430, the second CGL 460 and the third emitting part 460 are sequentially stacked on the first electrode 360.

In the first emitting part 430, the green EML 420 is positioned on the red EML 410.

The first emitting part 430 can further include at least one of a first HTL 432 under the red EML 410 and a first ETL 434 over the red EML 410. When the first emitting part 430 includes the green EML 420, the first ETL 434 is positioned on the green EML 420.

The second emitting part 440 can further include at least one of a second HTL 444 under the first blue EML 450 and a second ETL 448 on the first blue EML 450. In addition, the second emitting part 440 can further include an HIL 442 between the first electrode 360 and the first HTL 444.

The second emitting part 440 can further include at least one of a first EBL between the second HTL 444 and the first blue EML 450 and a first HBL between the first blue EML 450 and the second ETL 448.

The third emitting part 460 can further include at least one of a third HTL 462 under the second blue EML 470 and a third ETL 466 on the second blue EML 470. In addition, the third emitting part 460 can further include an EIL 468 between the second electrode 364 and the third ETL 466.

The third emitting part 460 can further include at least one of a first EBL between the third HTL 462 and the second blue EML 470 and a first HBL between the second blue EML 470 and the third ETL 466.

For example, the HIL 442 can include at least one of MTDATA, NATA, 4,4',4"-tris(N-(naphthalene-1-yl)-N-phenyl-amino)triphenylamine 1T-NATA, 2T-NATA, CuPc, TCTA, NPB, HAT-CN, TDAPB, PEDOT/PSS and N-(biphenyl-4-yl)-9,9-dimethyl-N-(4-(9-phenyl-9H-carbazol-3-yl)phenyl)-9H-fluoren-2-amine.

Each of the first to third HTLs 432, 444 and 464 can include at least one of TPD, NPB, CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and the compound in Formula 4.

Each of the first to third ETLs 434, 448 and 466 can include at least one of Alq3, PBD, spiro-PBD, Liq, TPBi, BAlq, Bphen, NBphen, BCP, TAZ, NTAZ, TpPyPB, TmPP-PyTz, PFNBr, TPQ, and TSPO1.

The EIL 468 can include at least one of an alkali halide compound, such as LiF, CsF, NaF, or $BaF_2$, and an organo-metallic compound, such as Liq, lithium benzoate, or sodium stearate.

The first CGL 480 is positioned between the first and second emitting parts 430 and 440, and the second CGL 490 is positioned between the first and third emitting parts 430 and 460. Namely, the first and second emitting parts 430 and 440 is connected to each other by the first CGL 480, and the first and third emitting parts 430 and 460 is connected to each other by the second CGL 490. The first CGL 480 can be a P-N junction type CGL of an N-type CGL 482 and a P-type CGL 484, and the second CGL 490 can be a P-N junction type CGL of an N-type CGL 492 and a P-type CGL 494.

In the first CGL 480, the N-type CGL 482 is positioned between the first HTL 432 and the second ETL 448, and the P-type CGL 484 is positioned between the N-type CGL 482 and the first HTL 432.

In the second CGL 490, the N-type CGL 492 is positioned between the first ETL 434 and the third HTL 462, and the P-type CGL 494 is positioned between the N-type CGL 492 and the third HTL 462.

Each of the N-type CGL 482 of the first CGL 480 and the N-type CGL 492 of the second CGL 490 can be an organic layer doped with an alkali metal, e.g., Li, Na, K or Cs, and/or an alkali earth metal, e.g., Mg, Sr, Ba or Ra. For example, each of the N-type CGL 482 of the first CGL 480 and the N-type CGL 492 of the second CGL 490 can include an organic material, e.g., 4,7-dipheny-1,10-phenanthroline (Bphen) or MTDATA, as a host, and the alkali metal and/or the alkali earth metal as a dopant can be doped with a weight % of about 0.01 to 30.

Each of the P-type CGL 484 of the first CGL 480 and the P-type CGL 494 of the second CGL 490 can include at least one of an inorganic material, which is selected from the group consisting of tungsten oxide (WOx), molybdenum oxide (MoOx), beryllium oxide (Be2O3), vanadium oxide (V2O5) and their combination, and an organic material, which is selected from the group consisting of NPD, HAT-CN, F4TCNQ, TPD, N,N,N',N'-tetranaphthyl-benzidine (TNB), TCTA, N,N'-dioctyl-3,4,9,10-perylenedicarboximide (PTCDI-C8) and their combination.

The red EML 410 includes a first compound 412 as a red dopant (e.g., a red emitter), a second compound 414 as a p-type host (e.g., a first host) and a third compound 416 as an n-type host (e.g., a second host). In the red EML 410, the first compound 412 is represented by Formula 1-1, the second compound 414 is represented by Formula 2-1, and the third compound 416 is represented by Formula 3-1.

In the red EML 410, each of the second and third compounds 414 and 416 can have a weight % being greater than the first compound 412. For example, in the red EML 410, the first compound 412 can have a weight % of 1 to 20, e.g., 5 to 15.

In addition, in the red EML 410, a ratio of the weight % between the second compound 414 and the third compound 416 can be 1:3 to 3:1. For example, in the red EML 410, the second and third compounds 414 and 416 can have the same weight %.

In the first emitting part 410, the green EML 420 includes a green host and a green dopant. The green dopant can be one of a phosphorescent compound, a fluorescent compound and a delayed fluorescent compound. For example, in the green EML 420, the host ' can be 178arbazoleis(carbazol-9-yl)biphenyl (CBP), and the green dopant can be fac tris(2-phenylpyridine)iridium Ir(ppy)3 or tris(8-hydroxyquinolino)aluminum (Alq3).

The first blue EML 450 in the second emitting part 440 includes a first blue host and a first blue dopant, and the second blue EML 470 in the third emitting part 460 includes a second blue host and a second blue dopant.

For example, each of the first and second blue hosts can be independently selected from the group consisting of mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), bis(2-methylphenyl)diphenylsilane (UGH-1), 1,4-bis(triphenylsilyl)benzene (UGH-2), 1,3-bis(triphenylsilyl)benzene (UGH-3), 9,9-spiorobifluoren-2-yl-diphenyl-phosphine oxide (SPPO1) and 9,9'-(5-(triphenylsilyl)-1,3-phenylene)bis(9H-carbazole) (SimCP).

For example, each of the first and second blue dopants can be independently selected from the group consisting of perylene, 4,4'-bis[4-(di-p-tolylamino)styryl]biphenyl (DPAVBi), 4-(di-p-tolylamino)-4-4'-[(di-p-tolylamino)styryl]stilbene (DPAVB), 4,4'-bis[4-(diphenylamino)styryl]biphenyl (BDAVBi), 2,7-bis(4-diphenylamino)styryl)-9,9-spirofluorene (spiro-DPVBi), [1,4-bis[2-[4-[N,N-di(p-tolyl)amino]phenyl]vinyl] benzene (DSB), 1-4-di-[4-(N,N-diphenyl)amino]styryl-benzene (DSA), 2,5,8,11-tetra-tetr-butylperylene (TBPe), bis(2-hydroxylphenyl)-pyridine)beryllium (Bepp2), 9-(9-Phenylcarbazole-3-yl)-10-(naphthalene-1-yl)anthracene (PCAN), mer-tris(1-phenyl-3-methylimidazolin-2-ylidene-C,C(2)'iridium(III) (mer-Ir(pmi)3), fac-Tris(1,3-diphenyl-benzimidazolin-2-ylidene-C,C(2)'iridium(III) (fac-Ir(dpbic)3), bis(3,4,5-trifluoro-2-(2-pyridyl)phenyl-(2-carboxypyridyl)iridium(III) (Ir(tfpd)2pic), tris(2-(4,6-difluorophenyl)pyridine))iridium(III) (Ir(Fppy)3) and bis[2-(4,6-difluorophenyl)pyridinato-C2,N](picolinato)iridium(III) (FIrpic).

In an exemplary aspect, each of the first and second blue EMLs 450 and 470 can include an anthracene derivative as a blue host and a boron derivative as a blue dopant.

As illustrated above, the OLED D3 of the present disclosure includes the first emitting part 430 including the red EML 410 and the green EML 420, the second emitting part 440 including the first blue EML 450 and the third emitting part 460 including the second blue EML 470. As a result, the OLED D3 emits the white light.

In addition, the red EML 410 includes the first compound 412, which is represented by Formula 1-1, as a red dopant, the second compound 414, which is represented by Formula 2-1, as a first host or a p-type host, and the third compound 416, which is represented by Formula 3-1, as a second host or an n-type host. As a result, the OLED D3 has advantages in the driving voltage, the luminous efficiency and the luminous lifespan.

Figure 7:
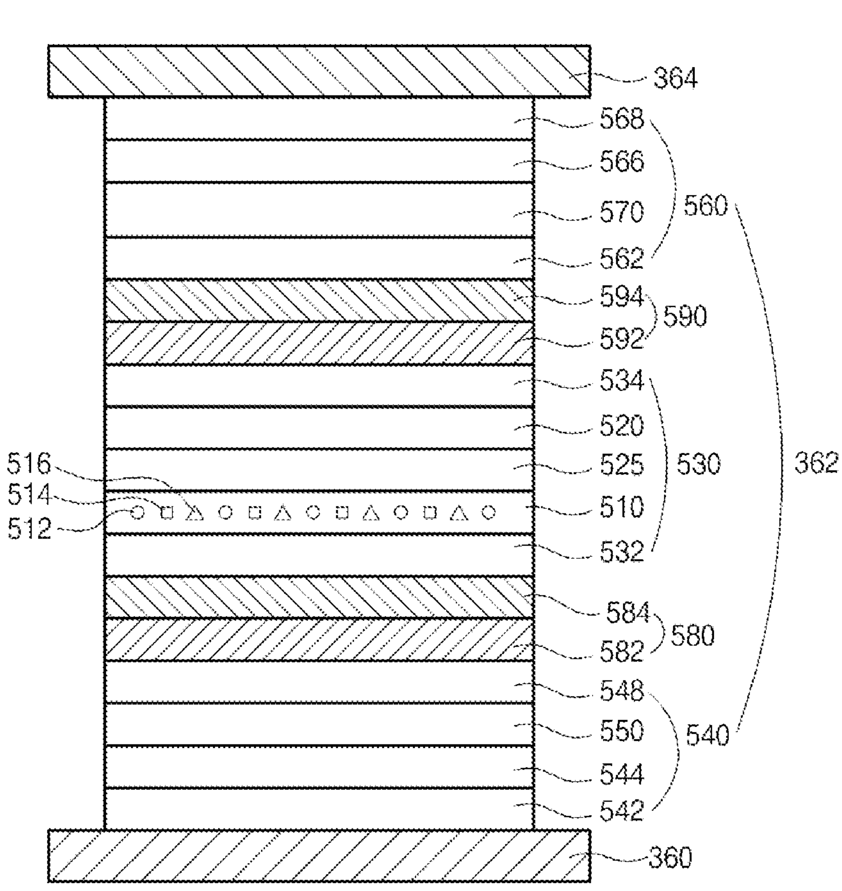
FIG. 7 is a cross-sectional view illustrating an OLED according to a sixth embodiment of the present disclosure.

FIG. 7 is a cross-sectional view illustrating an OLED according to a sixth embodiment of the present disclosure.

As shown in FIG. 7, in the OLED D4, the organic emitting layer 362 includes a first emitting part 530 including a red EML 510 and green EML 520 and a yellow-green EML 525, a second emitting part 540 including a first blue EML 550 and a third emitting part 560 including a third blue EML 570. In addition, the organic emitting layer 362 can further include a first CGL 580 between the first and second emitting parts 530 and 540 and a second CGL 590 between the first and third emitting part 530 and 560.

The first electrode 360 is an anode, and the second electrode 364 is a cathode. One of the first and second electrodes 360 and 364 can be a transparent (semitransparent) electrode, and the other one of the first and second electrodes 360 and 364 can be a reflective electrode.

The second emitting part 540 is positioned between the first electrode 360 and the first emitting part 530, and the third emitting part 560 is positioned between the first emitting part 530 and the second electrode 364. In addition, the second emitting part 540 is positioned between the first electrode 360 and the first CGL 580, and the third emitting part 560 is positioned between the second CGL 590 and the second electrode 364. Namely, the second emitting part 540, the first CGL 580, the first emitting part 530, the second CGL 560 and the third emitting part 560 are sequentially stacked on the first electrode 360.

In the first emitting part 530, the yellow-green EML 525 is positioned between the red EML 510 and the green EML 520. Namely, the red EML 510, the yellow-green EML 525 and the green EML 520 are sequentially stacked so that the first emitting part 530 includes an EML having a triple-layered structure.

The first emitting part 530 can further include at least one of a first HTL 532 under the red EML 510 and a first ETL 534 over the red EML 510.

The second emitting part 540 can further include at least one of a second HTL 544 under the first blue EML 550 and a second ETL 548 on the first blue EML 550. In addition, the second emitting part 540 can further include an HIL 542 between the first electrode 360 and the first HTL 544.

The second emitting part 540 can further include at least one of a first EBL between the second HTL 544 and the first blue EML 550 and a first HBL between the first blue EML 550 and the second ETL 548.

The third emitting part 560 can further include at least one of a third HTL 562 under the second blue EML 570 and a third ETL 566 on the second blue EML 570. In addition, the third emitting part 560 can further include an EIL 568 between the second electrode 364 and the third ETL 566.

The third emitting part 560 can further include at least one of a first EBL between the third HTL 562 and the second blue EML 570 and a first HBL between the second blue EML 570 and the third ETL 566.

For example, the HIL 542 can include at least one of MTDATA, NATA, 4,4',4"-tris(N-(naphthalene-1-yl)-N-phenyl-amino)triphenylamine 1T-NATA, 2T-NATA, CuPc, TCTA, NPB, HAT-CN, TDAPB, PEDOT/PSS and N-(biphenyl-4-yl)-9,9-dimethyl-N-(4-(9-phenyl-9H-carbazol-3-yl)phenyl)-9H-fluoren-2-amine.

Each of the first to third HTLs 532, 544 and 564 can include at least one of TPD, NPB, CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and the compound in Formula 4.

Each of the first to third ETLs 534, 548 and 566 can include at least one of Alq3, PBD, spiro-PBD, Liq, TpBi, BAlq, Bphen, NBphen, BCP, TAZ, NTAZ, TpPyPB, TmPPPyTz, PFNBr, TPQ, and TSPO1.

The EIL 568 can include at least one of an alkali halide compound, such as LiF, CsF, NaF, or $BaF_2$, and an organometallic compound, such as Liq, lithium benzoate, or sodium stearate.

The first CGL 580 is positioned between the first and second emitting parts 530 and 540, and the second CGL 590 is positioned between the first and third emitting parts 530 and 560.

Namely, the first and second emitting parts 530 and 540 is connected to each other by the first CGL 580, and the first and third emitting parts 530 and 560 is connected to each other by the second CGL 590. The first CGL 580 can be a P-N junction type CGL of an N-type CGL 582 and a P-type CGL 584, and the second CGL 590 can be a P-N junction type CGL of an N-type CGL 592 and a P-type CGL 594.

In the first CGL 580, the N-type CGL 582 is positioned between the first HTL 532 and the second ETL 548, and the P-type CGL 584 is positioned between the N-type CGL 582 and the first HTL 532.

In the second CGL 590, the N-type CGL 592 is positioned between the first ETL 534 and the third HTL 562, and the P-type CGL 594 is positioned between the N-type CGL 592 and the third HTL 562.

Each of the N-type CGL 582 of the first CGL 580 and the N-type CGL 592 of the second CGL 590 can be an organic layer doped with an alkali metal, e.g., Li, Na, K or Cs, and/or an alkali earth metal, e.g., Mg, Sr, Ba or Ra. For example, each of the N-type CGL 582 of the first CGL 580 and the N-type CGL 592 of the second CGL 590 can include an organic material, e.g., 4,7-dipheny-1,10-phenanthroline (Bphen) or MTDATA, as a host, and the alkali metal and/or the alkali earth metal as a dopant can be doped with a weight % of about 0.01 to 30.

Each of the P-type CGL 584 of the first CGL 580 and the P-type CGL 594 of the second CGL 590 can include at least one of an inorganic material, which is selected from the group consisting of tungsten oxide (WOx), molybdenum oxide (MoOx), beryllium oxide (Be2O3), vanadium oxide (V2O5) and their combination, and an organic material, which is selected from the group consisting of NPD, HAT-CN, F4TCNQ, TPD, N,N,N',N'-tetranaphthyl-benzidine (TNB), TCTA, N,N'-dioctyl-3,4,9,10-perylenedicarboximide (PTCDI-C8) and their combination.

The red EML 510 includes a first compound 512 as a red dopant (e.g., a red emitter), a second compound 514 as a p-type host (e.g., a first host) and a third compound 516 as an n-type host (e.g., a second host). In the red EML 510, the first compound 512 is represented by Formula 1-1, the second compound 514 is represented by Formula 2-1, and the third compound 516 is represented by Formula 3-1.

In the red EML 510, each of the second and third compounds 514 and 516 can have a weight % being greater than the first compound 512. For example, in the red EML 510, the first compound 512 can have a weight % of 1 to 20, e.g., 5 to 15.

In addition, in the red EML 510, a ratio of the weight % between the second compound 514 and the third compound 516 can be 1:3 to 3:1. For example, in the red EML 510, the second and third compounds 514 and 516 can have the same weight %.

In the first emitting part 510, the green EML 520 includes a green host and a green dopant. The green dopant can be one of a phosphorescent compound, a fluorescent compound and a delayed fluorescent compound. In addition, in the first emitting part 510, the yellow-green EML 525 includes a yellow-green host and a yellow-green dopant. The yellow-green dopant can be one of a phosphorescent compound, a fluorescent compound and a delayed fluorescent compound.

The first blue EML 550 in the second emitting part 540 includes a first blue host and a first blue dopant, and the second blue EML 570 in the third emitting part 560 includes a second blue host and a second blue dopant.

For example, each of the first and second blue hosts can be independently selected from the group consisting of mCP, mCP-CN, mCBP, CBP-CN, mCPPO1 Ph-mCP, TSPO1, CzBPCb, UGH-1, UGH-2, UGH-3, SPPO1 and SimCP.

For example, each of the first and second blue dopants can be independently selected from the group consisting of perylene, DPAVBi, DPAVB, BDAVBi, spiro-DPVBi, DSB, DSA, TBPe, Bepp2, PCAN, mer-Ir(pmi)3, fac-Ir(dpbic)3, Ir(tfpd)2pic, Ir(Fppy)3 and FIrpic.

In an exemplary aspect, each of the first and second blue EMLs 550 and 570 can include an anthracene derivative as a blue host and a boron derivative as a blue dopant.

As illustrated above, the OLED D4 of the present disclosure includes the first emitting part 530 including the red EML 510, the green EML 520 and the yellow-green EML 525, the second emitting part 540 including the first blue EML 550 and the third emitting part 560 including the second blue EML 570. As a result, the OLED D4 emits the white light.

In addition, the red EML 510 includes the first compound 512, which is represented by Formula 1-1, as a red dopant, the second compound 514, which is represented by Formula 2-1, as a first host or a p-type host, and the third compound 516, which is represented by Formula 3-1, as a second host or an n-type host. As a result, the OLED D4 has advantages in the driving voltage, the luminous efficiency and the luminous lifespan.

Figure 8:
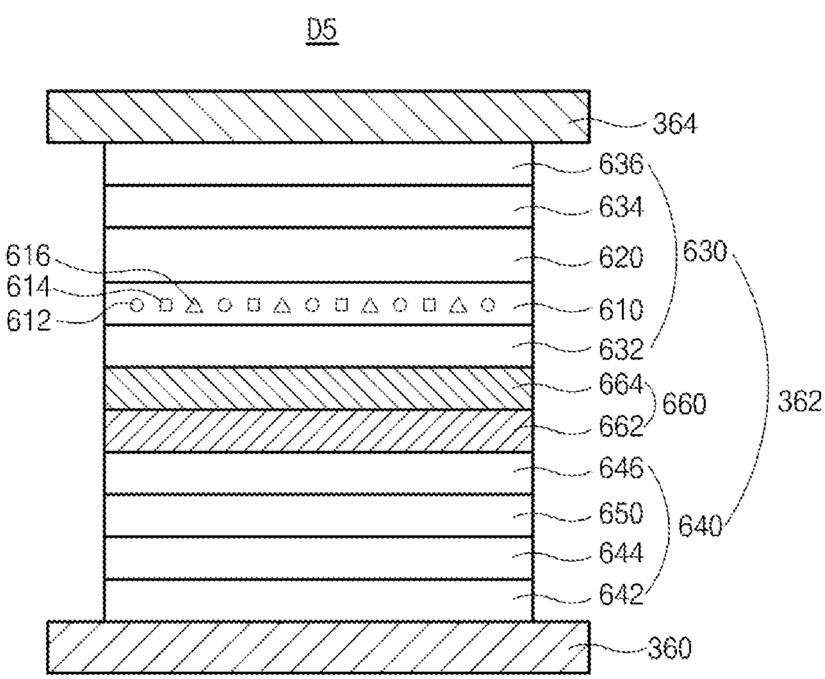
FIG. 8 is a cross-sectional view illustrating an OLED according to a seventh embodiment of the present disclosure.

FIG. 8 is a cross-sectional view illustrating an OLED according to a seventh embodiment of the present disclosure.

As shown in FIG. 8, in the OLED D5, the organic emitting layer 362 includes a first emitting part 630 including a red EML 610 and a green EML 620 and a second emitting part 640 including a blue EML 650. In addition, the organic emitting layer 362 can further include a CGL 660 between the first and second emitting parts 630 and 640.

The first electrode 360 is an anode, and the second electrode 364 is a cathode. One of the first and second electrodes 360 and 364 can be a transparent (semitransparent) electrode, and the other one of the first and second electrodes 360 and 364 can be a reflective electrode.

The first emitting part 630 is positioned between the CGL 660 and the second electrode 364, and the second emitting part 640 is positioned between the CGL 660 and the first electrode 360. Alternatively, the first emitting part 630 can be positioned between the CGL 660 and the first electrode 360, and the second emitting part 640 can be positioned between the CGL 660 and the second electrode 364.

In the first emitting part 630, the green EML 620 is positioned on the red EML 610.

The first emitting part 630 can further include at least one of a first HTL 632 under the red EML 610 and a first ETL 634 over the red EML 610. When the first emitting part 630 includes the green EML 620, the first ETL 634 is positioned on the green EML 620. In addition, the first emitting part 630 can further include an EIL 636 between the first ETL 634 and the second electrode 364.

The second emitting part 640 can further include at least one of a second HTL 644 under the blue EML 650 and a second ETL 646 on the blue EML 650. In addition, the second emitting part 640 can further include an HIL 642 between the first electrode 360 and the first HTL 644.

For example, the HIL 642 can include at least one of MTDATA, NATA, 4,4',4"-tris(N-(naphthalene-1-yl)-N-phenyl-amino)triphenylamine 1T-NATA, 2T-NATA, CuPc, TCTA, NPB, HAT-CN, TDAPB, PEDOT/PSS and N-(biphenyl-4-yl)-9,9-dimethyl-N-(4-(9-phenyl-9H-carbazol-3-yl)phenyl)-9H-fluoren-2-amine.

Each of the first and second HTLs 632 and 644 can include at least one of TPD, NPB, CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and the compound in Formula 4.

Each of the first and second ETLs 634 and 646 can include at least one of Alq3, PBD, spiro-PBD, Liq, TpBi, BAlq, Bphen, NBphen, BCP, TAZ, NTAZ, TpPyPB, TmPPPyTz, PFNBr, TPQ, and TSPO1.

The EIL 636 can include at least one of an alkali halide compound, such as LiF, CsF, NaF, or $BaF_2$, and an organometallic compound, such as Liq, lithium benzoate, or sodium stearate.

The CGL 660 is positioned between the first and second emitting parts 630 and 640. Namely, the first and second emitting parts 630 and 640 is connected to each other by the CGL 660.

The CGL 660 can be a P-N junction type CGL of an N-type CGL 662 and a P-type CGL 664.

In the CGL 660, the N-type CGL 662 is positioned between the first HTL 632 and the second ETL 646, and the P-type CGL 664 is positioned between the N-type CGL 662 and the first HTL 632.

The N-type CGL 662 can be an organic layer doped with an alkali metal, e.g., Li, Na, K or Cs, and/or an alkali earth metal, e.g., Mg, Sr, Ba or Ra. For example, the N-type CGL 662 can include an organic material, e.g., 4,7-dipheny-1,10-phenanthroline (Bphen) or MTDATA, as a host, and the alkali metal and/or the alkali earth metal as a dopant can be doped with a weight % of about 0.01 to 30.

The P-type CGL 664 can include at least one of an inorganic material, which is selected from the group consisting of tungsten oxide (WOx), molybdenum oxide (MoOx), beryllium oxide (Be2O3), vanadium oxide (V2O5) and their combination, and an organic material, which is selected from the group consisting of NPD, HAT-CN, F4TCNQ, TPD, N,N,N',N'-tetranaphthyl-benzidine (TNB), TCTA, N,N'-dioctyl-3,4,9,10-perylenedicarboximide (PTCDI-$C_8$) and their combination.

The red EML 610 includes a first compound 612 as a red dopant (e.g., a red emitter), a second compound 614 as a p-type host (e.g., a first host) and a third compound 616 as an n-type host (e.g., a second host). In the red EML 610, the first compound 612 is represented by Formula 1-1, the second compound 614 is represented by Formula 2-1, and the third compound 616 is represented by Formula 3-1.

In the red EML 610, each of the second and third compounds 614 and 616 can have a weight % being greater than the first compound 612. For example, in the red EML 610, the first compound 612 can have a weight % of 1 to 20, e.g., 5 to 15.

In addition, in the red EML 610, a ratio of the weight % between the second compound 614 and the third compound 616 can be 1:3 to 3:1. For example, in the red EML 610, the second and third compounds 614 and 616 can have the same weight %.

In the first emitting part 610, the green EML 620 includes a green host and a green dopant. The green dopant can be one of a phosphorescent compound, a fluorescent compound and a delayed fluorescent compound.

The blue EML 650 in the second emitting part 640 includes a blue host and a blue dopant.

For example, the blue host can be selected from the group consisting of mCP, mCP-CN, mCBP, CBP-CN, mCPPO1 Ph-mCP, TSPO1, CzBPCb, UGH-1, UGH-2, UGH-3, SPPO1 and SimCP, a and the blue dopant can be selected from the group consisting of perylene, DPAVBi, DPAVB, BDAVBi, spiro-DPVBi, DSB, DSA, TBPe, Bepp2, PCAN, mer-Ir(pmi)3, fac-Ir(dpbic)3, Ir(tfpd)2pic, Ir(Fppy)3 and FIrpic.

In an exemplary aspect, the blue EML 650 can include an anthracene derivative as a blue host and a boron derivative as a blue dopant.

As illustrated above, the OLED D5 of the present disclosure includes the first emitting part 630 including the red EML 610 and the green EML 620 and the second emitting part 640 including the blue EML 650. As a result, the OLED D5 emits the white light.

In addition, the red EML 610 includes the first compound 612, which is represented by Formula 1-1, as a red dopant, the second compound 614, which is represented by Formula 2-1, as a first host or a p-type host, and the third compound 616, which is represented by Formula 3-1, as a second host or an n-type host. As a result, the OLED D5 has advantages in the driving voltage, the luminous efficiency and the luminous lifespan.

[OLED]

The anode (ITO), the HIL (HATCN (the compound in Formula 5), 100 Å), the HTL (the compound in Formula 4, 700 Å), the EML (host and dopant (10 wt. %), 300 Å), the ETL (Alq3, 300 Å), the EIL (LiF, 10 Å) and the cathode (Al, 1000 Å) was sequentially deposited. An encapsulation film is formed by using an UV curable epoxy and a moisture getter to form the OLED.

[Formula 5]

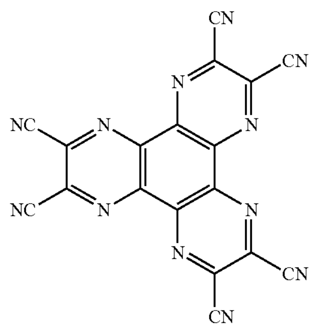

[Formula 6]

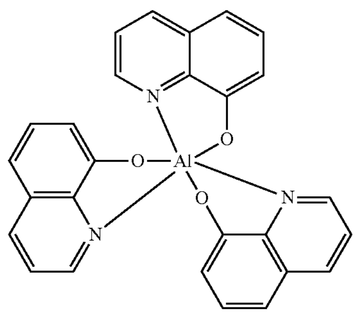

[Formula 7]

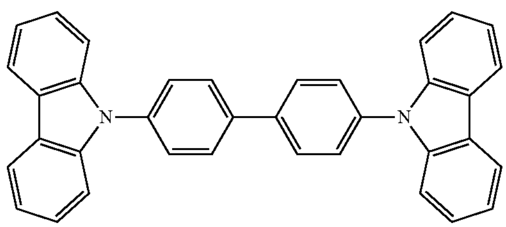

-continued

[Formula 8]

RD1

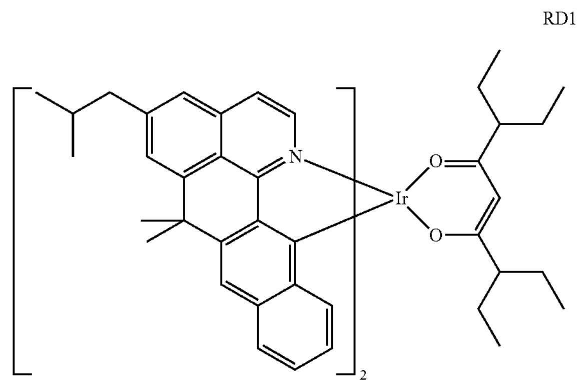

RD2

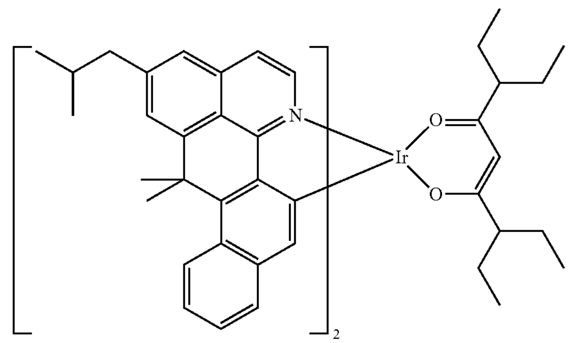

RD3

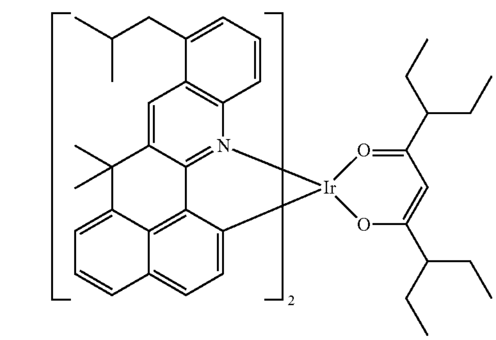

RD4

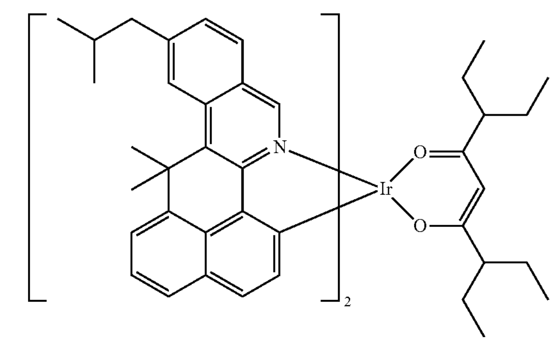

-continued
RD5
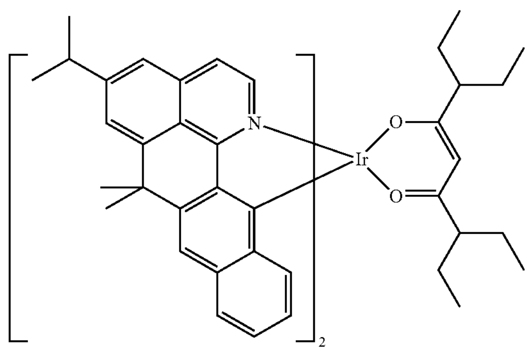
RD6
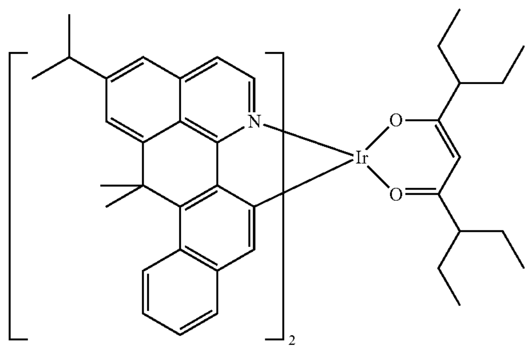
RD7
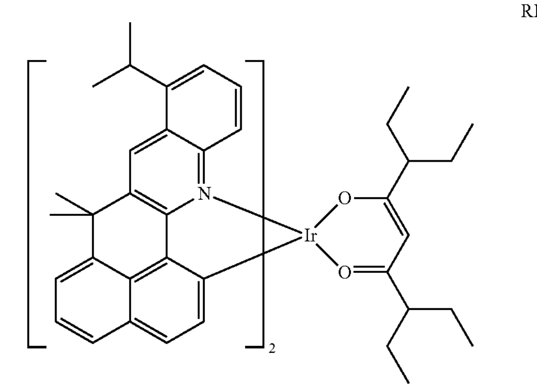
RD8
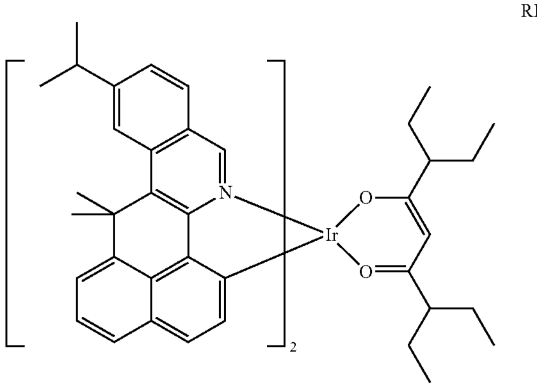
-continued
RD9
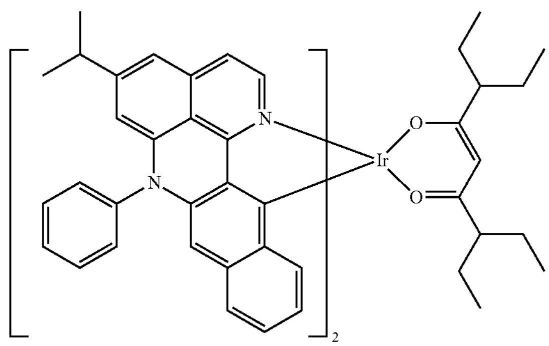
RD10
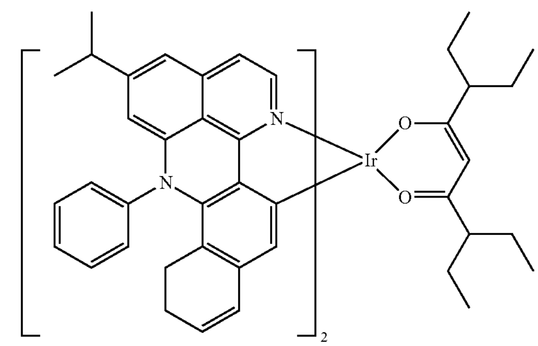
RD11
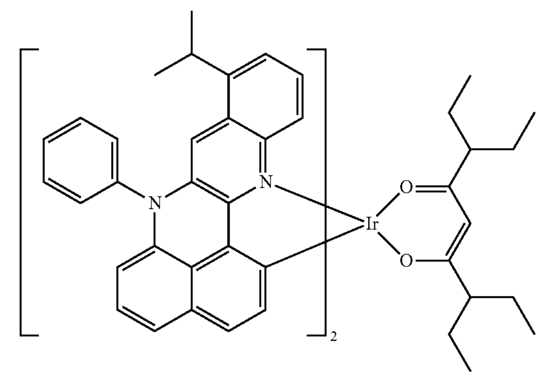
RD12
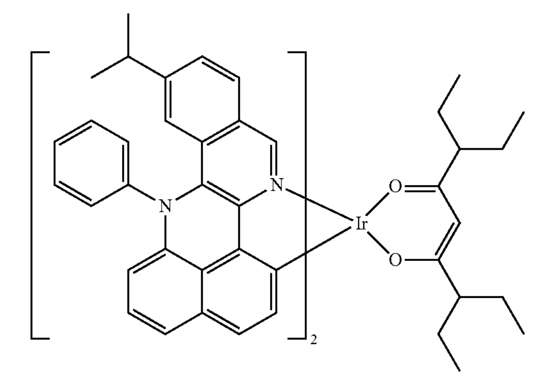

-continued
RD13
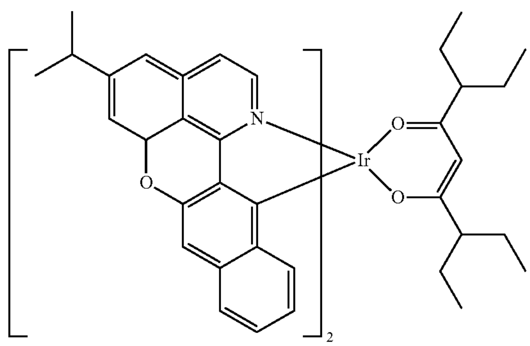
RD14
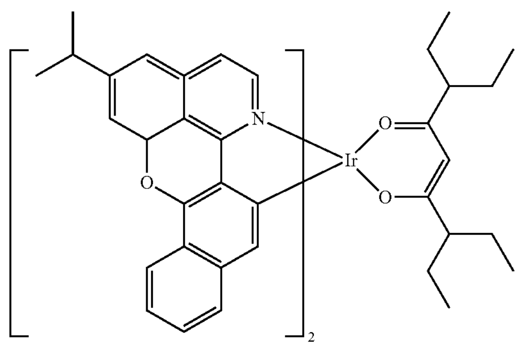
RD15
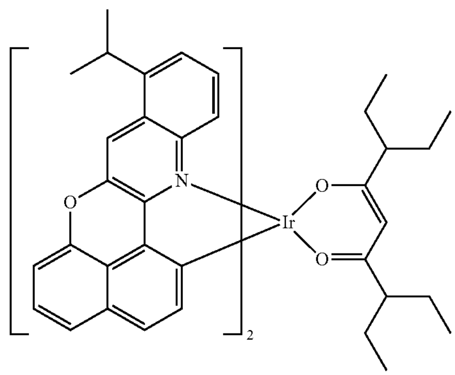
RD16
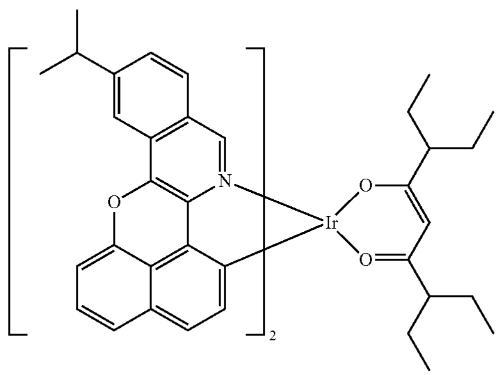
-continued
RD17
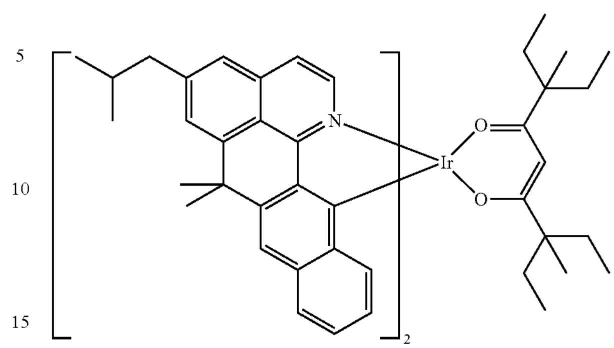
RD18
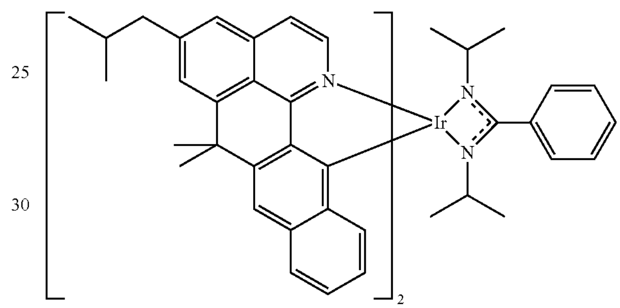
RD19
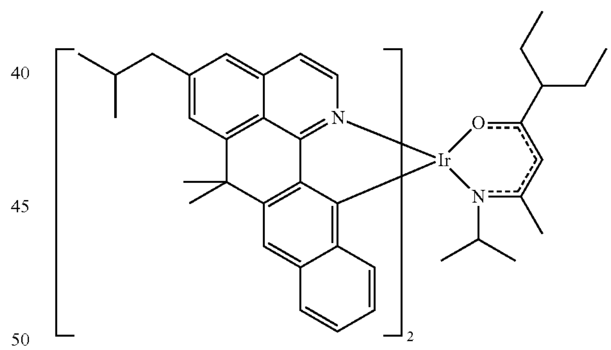
RD20
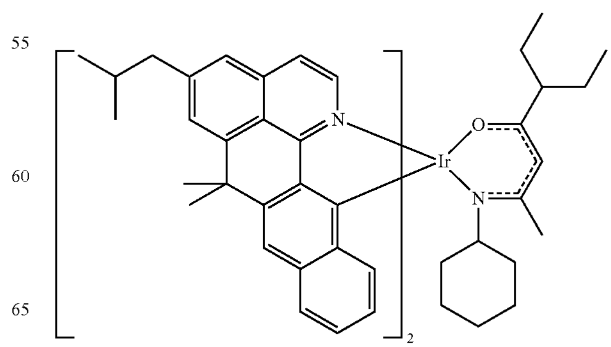

-continued
RD21
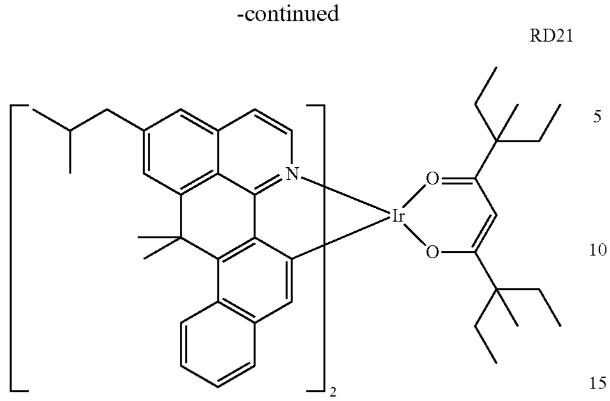
RD22
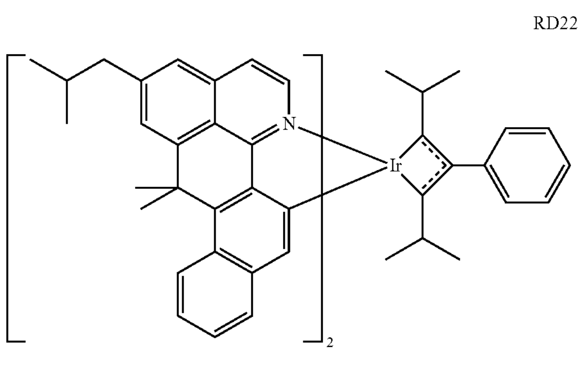
RD23
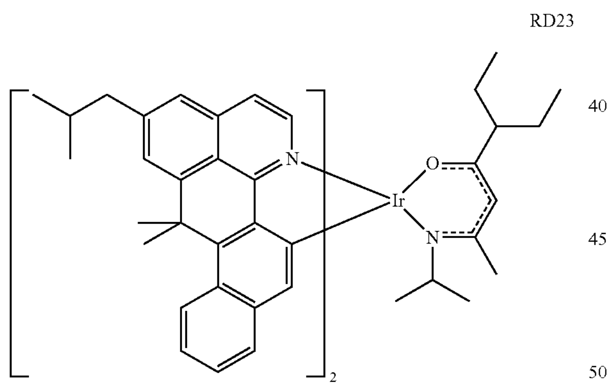
RD24
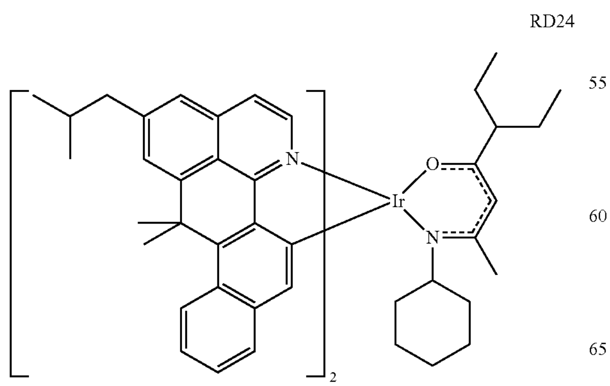
-continued
RD25
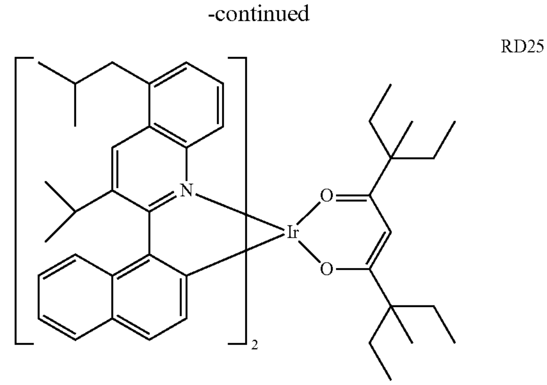
RD26
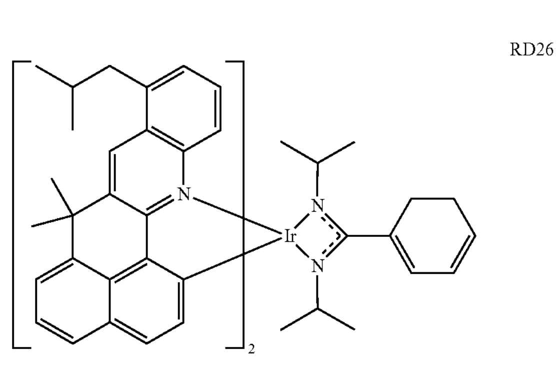
RD27
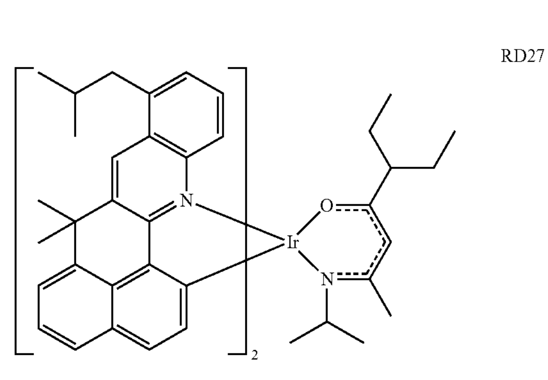
RD28
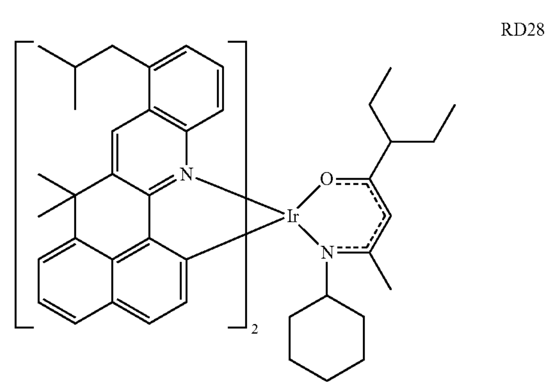

-continued

RD29

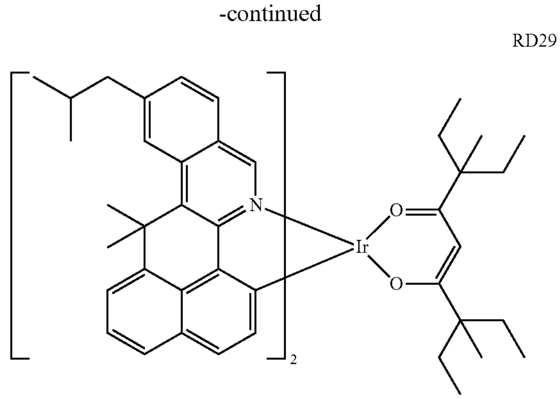

RD30

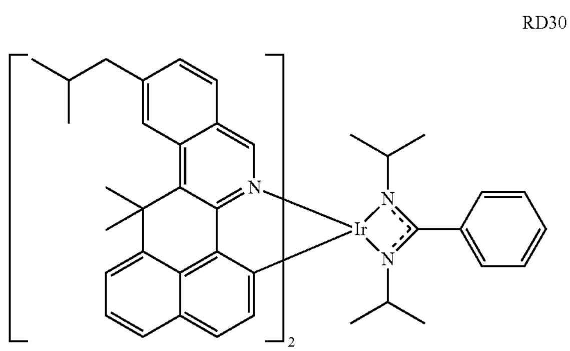

RD31

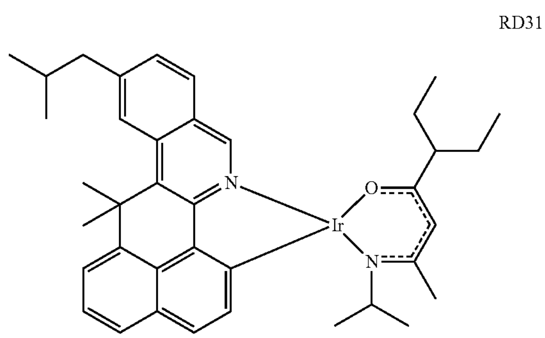

RD32

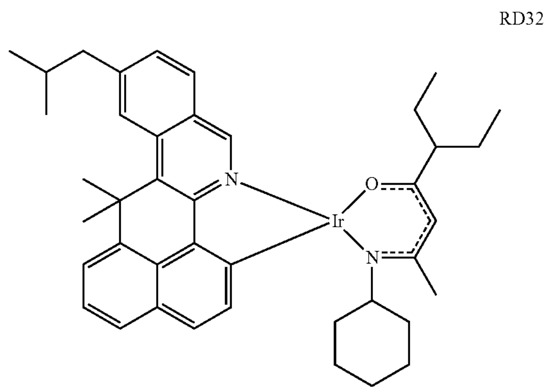

1. Comparative Example 1 (Ref1)

The compound RD1 in Formula 8 and the compound (CBP) in Formula 7 are used as the dopant and host, respectively, to form the EML.

2. Examples (1) Examples 1 to 6 (Ex1 to Ex6)

The compound RD1 in Formula 8 as the dopant, the compound RHH-2 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(2) Examples 7 to 12 (Ex7 to Ex12)

The compound RD1 in Formula 8 as the dopant, the compound RHH-4 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(3) Examples 13 to 18 (Ex13 to Ex18)

The compound RD1 in Formula 8 as the dopant, the compound RHH-6 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(4) Examples 19 to 24 (Ex19 to Ex24)

The compound RD1 in Formula 8 as the dopant, the compound RHH-10 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(5) Examples 25 to 30 (Ex25 to Ex30)

The compound RD1 in Formula 8 as the dopant, the compound RHH-28 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(6) Examples 31 to 36 (Ex31 to Ex36)

The compound RD1 in Formula 8 as the dopant, the compound RHH-30 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 1 and Examples 1 to 36 are measured and listed in Tables 1 and 2. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 1

| | EML | | | | EQE | LT95 |
|---|---|---|---|---|---|---|
| | Dopant | Host | | V | (%) | (%) |
| Ref1 | RD1 | CBP | | 4.28 | 100 | 100 |
| Ex1 | RD1 | RHH-2 | REH-1 | 4.13 | 118 | 135 |
| Ex2 | RD1 | RHH-2 | REH-6 | 4.14 | 122 | 140 |
| Ex3 | RD1 | RHH-2 | REH-12 | 4.11 | 113 | 122 |
| Ex4 | RD1 | RHH-2 | REH-20 | 4.10 | 110 | 125 |
| Ex5 | RD1 | RHH-2 | REH-22 | 4.10 | 110 | 123 |
| Ex6 | RD1 | RHH-2 | REH-28 | 4.12 | 112 | 125 |
| Ex7 | RD1 | RHH-4 | REH-1 | 4.12 | 115 | 135 |
| Ex8 | RD1 | RHH-4 | REH-6 | 4.11 | 124 | 138 |
| Ex9 | RD1 | RHH-4 | REH-12 | 4.10 | 115 | 125 |
| Ex10 | RD1 | RHH-4 | REH-20 | 4.09 | 113 | 128 |
| Ex11 | RD1 | RHH-4 | REH-22 | 4.09 | 112 | 124 |
| Ex12 | RD1 | RHH-4 | REH-28 | 4.10 | 115 | 123 |
| Ex13 | RD1 | RHH-6 | REH-1 | 4.14 | 115 | 133 |
| Ex14 | RD1 | RHH-6 | REH-6 | 4.15 | 118 | 130 |
| Ex15 | RD1 | RHH-6 | REH-12 | 4.10 | 112 | 120 |
| Ex16 | RD1 | RHH-6 | REH-20 | 4.12 | 110 | 123 |
| Ex17 | RD1 | RHH-6 | REH-22 | 4.12 | 113 | 125 |
| Ex18 | RD1 | RHH-6 | REH-28 | 4.11 | 112 | 120 |

TABLE 2

| | EML | | | | EQE | LT95 |
|---|---|---|---|---|---|---|
| | Dopant | Host | | V | (%) | (%) |
| Ref1 | RD1 | CBP | | 4.28 | 100 | 100 |
| Ex19 | RD1 | RHH-10 | REH-1 | 4.12 | 122 | 140 |
| Ex20 | RD1 | RHH-10 | REH-6 | 4.10 | 123 | 139 |
| Ex21 | RD1 | RHH-10 | REH-12 | 4.09 | 114 | 125 |
| Ex22 | RD1 | RHH-10 | REH-20 | 4.05 | 113 | 127 |
| Ex23 | RD1 | RHH-10 | REH-22 | 4.07 | 114 | 124 |
| Ex24 | RD1 | RHH-10 | REH-28 | 4.09 | 115 | 128 |
| Ex25 | RD1 | RHH-28 | REH-1 | 4.10 | 125 | 138 |
| Ex26 | RD1 | RHH-28 | REH-6 | 4.13 | 119 | 130 |
| Ex27 | RD1 | RHH-28 | REH-12 | 4.10 | 115 | 123 |
| Ex28 | RD1 | RHH-28 | REH-20 | 4.06 | 115 | 127 |
| Ex29 | RD1 | RHH-28 | REH-22 | 4.05 | 114 | 125 |
| Ex30 | RD1 | RHH-28 | REH-28 | 4.08 | 116 | 126 |
| Ex31 | RD1 | RHH-28 | REH-1 | 4.10 | 121 | 136 |
| Ex32 | RD1 | RHH-30 | REH-6 | 4.11 | 120 | 133 |
| Ex33 | RD1 | RHH-30 | REH-12 | 4.08 | 115 | 125 |
| Ex34 | RD1 | RHH-30 | REH-20 | 4.07 | 111 | 123 |
| Ex35 | RD1 | RHH-30 | REH-22 | 4.06 | 112 | 126 |
| Ex36 | RD1 | RHH-30 | REH-28 | 4.08 | 116 | 124 |

As shown in Tables 1 and 2, in comparison to the OLED of Ref1, in which the red EML includes the compound RD1 as a dopant and CBP as a host, the OLED of Ex1 to Ex36, in which the red EML includes the compound RD1 as a dopant, the compounds RHH-2, RHH-4, RHH-6, RHH-10, RHH-28 and RHH-30 as a first host, and the compounds REH-1, REH-6, REH-12, REH-20, REH-22 and REH-28 as a second host, has advantages in the driving voltage, the luminous efficiency and the luminous lifespan.

3. Comparative Example 2 (Ref2)

The compound RD2 in Formula 8 and the compound (CBP) in Formula 7 are used as the dopant and host, respectively, to form the EML.

4. Examples (1) Examples 37 to 42 (Ex37 to Ex42)

The compound RD2 in Formula 8 as the dopant, the compound RHH-2 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(2) Examples 43 to 48 (Ex43 to Ex48)

The compound RD2 in Formula 8 as the dopant, the compound RHH-4 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(3) Examples 49 to 54 (Ex49 to Ex54)

The compound RD2 in Formula 8 as the dopant, the compound RHH-6 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(4) Examples 55 to 60 (Ex55 to Ex60)

The compound RD2 in Formula 8 as the dopant, the compound RHH-10 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(5) Examples 61 to 66 (Ex61 to Ex66)

The compound RD2 in Formula 8 as the dopant, the compound RHH-28 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(6) Examples 67 to 72 (Ex67 to Ex72)

The compound RD2 in Formula 8 as the dopant, the compound RHH-30 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 2 and Examples 37 to 72 are measured and listed in Tables 3 and 4. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 3

| | EML | | | | EQE | LT95 |
|---|---|---|---|---|---|---|
| | Dopant | Host | | V | (%) | (%) |
| Ref2 | RD2 | CBP | | 4.30 | 100 | 100 |
| Ex37 | RD2 | RHH-2 | REH-1 | 4.15 | 117 | 135 |
| Ex38 | RD2 | RHH-2 | REH-6 | 4.16 | 125 | 138 |
| Ex39 | RD2 | RHH-2 | REH-12 | 4.10 | 114 | 125 |
| Ex40 | RD2 | RHH-2 | REH-20 | 4.09 | 115 | 123 |
| Ex41 | RD2 | RHH-2 | REH-22 | 4.11 | 112 | 124 |
| Ex42 | RD2 | RHH-2 | REH-28 | 4.10 | 113 | 122 |
| Ex43 | RD2 | RHH-4 | REH-1 | 4.15 | 116 | 130 |

TABLE 3-continued

| | EML | | | | EQE | LT95 |
|---|---|---|---|---|---|---|
| | Dopant | Host | | V | (%) | (%) |
| Ex44 | RD2 | RHH-4 | REH-6 | 4.13 | 126 | 137 |
| Ex45 | RD2 | RHH-4 | REH-12 | 4.09 | 114 | 122 |
| Ex46 | RD2 | RHH-4 | REH-20 | 4.08 | 111 | 120 |
| Ex47 | RD2 | RHH-4 | REH-22 | 4.06 | 113 | 124 |
| Ex48 | RD2 | RHH-4 | REH-28 | 4.07 | 115 | 122 |
| Ex49 | RD2 | RHH-6 | REH-1 | 4.13 | 116 | 130 |
| Ex50 | RD2 | RHH-6 | REH-6 | 4.13 | 118 | 129 |
| Ex51 | RD2 | RHH-6 | REH-12 | 4.10 | 115 | 121 |
| Ex52 | RD2 | RHH-6 | REH-20 | 4.09 | 112 | 122 |
| Ex53 | RD2 | RHH-6 | REH-22 | 4.08 | 111 | 123 |
| Ex54 | RD2 | RHH-6 | REH-28 | 4.09 | 113 | 123 |

TABLE 4

| | EML | | | | EQE | LT95 |
|---|---|---|---|---|---|---|
| | Dopant | Host | | V | (%) | (%) |
| Ref2 | RD2 | CBP | | 4.30 | 100 | 100 |
| Ex55 | RD2 | RHH-10 | REH-1 | 4.13 | 125 | 138 |
| Ex56 | RD2 | RHH-10 | REH-6 | 4.15 | 122 | 135 |
| Ex57 | RD2 | RHH-10 | REH-12 | 4.08 | 115 | 127 |
| Ex58 | RD2 | RHH-10 | REH-20 | 4.07 | 113 | 124 |
| Ex59 | RD2 | RHH-10 | REH-22 | 4.06 | 114 | 125 |
| Ex60 | RD2 | RHH-10 | REH-28 | 4.05 | 114 | 126 |
| Ex61 | RD2 | RHH-28 | REH-1 | 4.09 | 123 | 133 |
| Ex62 | RD2 | RHH-28 | REH-6 | 4.11 | 122 | 132 |
| Ex63 | RD2 | RHH-28 | REH-12 | 4.09 | 119 | 125 |
| Ex64 | RD2 | RHH-28 | REH-20 | 4.08 | 116 | 128 |
| Ex65 | RD2 | RHH-28 | REH-22 | 4.06 | 115 | 126 |
| Ex66 | RD2 | RHH-28 | REH-28 | 4.07 | 114 | 127 |
| Ex67 | RD2 | RHH-28 | REH-1 | 4.11 | 123 | 135 |
| Ex68 | RD2 | RHH-30 | REH-6 | 4.11 | 121 | 131 |
| Ex69 | RD2 | RHH-30 | REH-12 | 4.10 | 116 | 123 |
| Ex70 | RD2 | RHH-30 | REH-20 | 4.06 | 115 | 122 |
| Ex71 | RD2 | RHH-30 | REH-22 | 4.08 | 113 | 122 |
| Ex72 | RD2 | RHH-30 | REH-28 | 4.07 | 114 | 120 |

As shown in Tables 3 and 4, in comparison to the OLED of Ref2, in which the red EML includes the compound RD2 as a dopant and CBP as a host, the OLED of Ex37 to Ex72, in which the red EML includes the compound RD2 as a dopant, the compounds RHH-2, RHH-4, RHH-6, RHH-10, RHH-28 and RHH-30 as a first host, and the compounds REH-1, REH-6, REH-12, REH-20, REH-22 and REH-28 as a second host, has advantages in the driving voltage, the luminous efficiency and the luminous lifespan.

5. Comparative Example 3 (Ref3)

The compound RD3 in Formula 8 and the compound (CBP) in Formula 7 are used as the dopant and host, respectively, to form the EML.

6. Examples (1) Examples 73 to 78 (Ex73 to Ex78)

The compound RD3 in Formula 8 as the dopant, the compound RHH-2 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(2) Examples 79 to 84 (Ex79 to Ex84)

The compound RD3 in Formula 8 as the dopant, the compound RHH-4 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(3) Examples 85 to 90 (Ex85 to Ex90)

The compound RD3 in Formula 8 as the dopant, the compound RHH-6 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(4) Examples 91 to 96 (Ex91 to Ex96)

The compound RD3 in Formula 8 as the dopant, the compound RHH-10 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(5) Examples 97 to 102 (Ex97 to Ex102)

The compound RD3 in Formula 8 as the dopant, the compound RHH-28 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(6) Examples 103 to 108 (Ex103 to Ex108)

The compound RD3 in Formula 8 as the dopant, the compound RHH-30 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 3 and Examples 73 to 108 are measured and listed in Tables 5 and 6. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 5

| | EML | | | | EQE | LT95 |
|---|---|---|---|---|---|---|
| | Dopant | Host | | V | (%) | (%) |
| Ref3 | RD3 | CBP | | 4.29 | 100 | 100 |
| Ex73 | RD3 | RHH-2 | REH-1 | 4.13 | 118 | 134 |
| Ex74 | RD3 | RHH-2 | REH-6 | 4.14 | 117 | 135 |
| Ex75 | RD3 | RHH-2 | REH-12 | 4.10 | 113 | 126 |
| Ex76 | RD3 | RHH-2 | REH-20 | 4.09 | 114 | 123 |
| Ex77 | RD3 | RHH-2 | REH-22 | 4.08 | 112 | 122 |
| Ex78 | RD3 | RHH-2 | REH-28 | 4.07 | 113 | 123 |
| Ex79 | RD3 | RHH-4 | REH-1 | 4.15 | 120 | 134 |
| Ex80 | RD3 | RHH-4 | REH-6 | 4.16 | 119 | 130 |
| Ex81 | RD3 | RHH-4 | REH-12 | 4.11 | 114 | 126 |
| Ex82 | RD3 | RHH-4 | REH-20 | 4.10 | 113 | 125 |
| Ex83 | RD3 | RHH-4 | REH-22 | 4.09 | 114 | 123 |
| Ex84 | RD3 | RHH-4 | REH-28 | 4.07 | 112 | 124 |
| Ex85 | RD3 | RHH-6 | REH-1 | 4.14 | 119 | 132 |
| Ex86 | RD3 | RHH-6 | REH-6 | 4.15 | 121 | 131 |
| Ex87 | RD3 | RHH-6 | REH-12 | 4.11 | 116 | 127 |
| Ex88 | RD3 | RHH-6 | REH-20 | 4.12 | 117 | 126 |

TABLE 5-continued

| | EML | | | | EQE | LT95 |
|---|---|---|---|---|---|---|
| | Dopant | Host | | V | (%) | (%) |
| Ex89 | RD3 | RHH-6 | REH-22 | 4.11 | 116 | 126 |
| Ex90 | RD3 | RHH-6 | REH-28 | 4.10 | 118 | 124 |

TABLE 6

| | EML | | | | EQE | LT95 |
|---|---|---|---|---|---|---|
| | Dopant | Host | | V | (%) | (%) |
| Ref3 | RD3 | CBP | | 4.29 | 100 | 100 |
| Ex91 | RD3 | RHH-10 | REH-1 | 4.10 | 127 | 135 |
| Ex92 | RD3 | RHH-10 | REH-6 | 4.12 | 125 | 132 |
| Ex93 | RD3 | RHH-10 | REH-12 | 4.09 | 116 | 125 |
| Ex94 | RD3 | RHH-10 | REH-20 | 4.08 | 117 | 126 |
| Ex95 | RD3 | RHH-10 | REH-22 | 4.07 | 115 | 127 |
| Ex96 | RD3 | RHH-10 | REH-28 | 4.07 | 116 | 128 |
| Ex97 | RD3 | RHH-28 | REH-1 | 4.10 | 126 | 130 |
| Ex98 | RD3 | RHH-28 | REH-6 | 4.11 | 124 | 132 |
| Ex99 | RD3 | RHH-28 | REH-12 | 4.10 | 121 | 129 |
| Ex100 | RD3 | RHH-28 | REH-20 | 4.09 | 119 | 131 |
| Ex101 | RD3 | RHH-28 | REH-22 | 4.08 | 117 | 129 |
| Ex102 | RD3 | RHH-28 | REH-28 | 4.07 | 117 | 128 |
| Ex103 | RD3 | RHH-28 | REH-1 | 4.12 | 123 | 129 |
| Ex104 | RD3 | RHH-30 | REH-6 | 4.11 | 122 | 127 |
| Ex105 | RD3 | RHH-30 | REH-12 | 4.10 | 118 | 123 |
| Ex106 | RD3 | RHH-30 | REH-20 | 4.08 | 116 | 127 |
| Ex107 | RD3 | RHH-30 | REH-22 | 4.09 | 117 | 125 |
| Ex108 | RD3 | RHH-30 | REH-28 | 4.08 | 116 | 124 |

As shown in Tables 5 and 6, in comparison to the OLED of Ref3, in which the red EML includes the compound RD3 as a dopant and CBP as a host, the OLED of Ex73 to Ex108, in which the red EML includes the compound RD3 as a dopant, the compounds RHH-2, RHH-4, RHH-6, RHH-10, RHH-28 and RHH-30 as a first host, and the compounds REH-1, REH-6, REH-12, REH-20, REH-22 and REH-28 as a second host, has advantages in the driving voltage, the luminous efficiency and the luminous lifespan.

7. Comparative Example 4 (Ref4)

The compound RD4 in Formula 8 and the compound (CBP) in Formula 7 are used as the dopant and host, respectively, to form the EML.

8. Examples (1) Examples 109 to 114 (Ex109 to Ex114)

The compound RD4 in Formula 8 as the dopant, the compound RHH-2 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(2) Examples 115 to 120 (Ex115 to Ex120)

The compound RD4 in Formula 8 as the dopant, the compound RHH-4 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(3) Examples 121 to 126 (Ex121 to Ex126)

The compound RD4 in Formula 8 as the dopant, the compound RHH-6 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(4) Examples 127 to 132 (Ex127 to Ex132)

The compound RD4 in Formula 8 as the dopant, the compound RHH-10 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(5) Examples 133 to 138 (Ex133 to Ex138)

The compound RD4 in Formula 8 as the dopant, the compound RHH-28 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

(6) Examples 139 to 144 (Ex139 to Ex144)

The compound RD4 in Formula 8 as the dopant, the compound RHH-30 in Formula 2-4 as a first host, and the compounds REH-1, REH-6, REH-12, REH-20, REH-22 and REH-28 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 4 and Examples 109 to 144 are measured and listed in Tables 7 and 8. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 7

| | EML | | | | EQE | LT95 |
|---|---|---|---|---|---|---|
| | Dopant | Host | | V | (%) | (%) |
| Ref4 | RD4 | CBP | | 4.28 | 100 | 100 |
| Ex109 | RD4 | RHH-2 | REH-1 | 4.15 | 123 | 135 |
| Ex110 | RD4 | RHH-2 | REH-6 | 4.16 | 121 | 139 |
| Ex111 | RD4 | RHH-2 | REH-12 | 4.15 | 119 | 132 |
| Ex112 | RD4 | RHH-2 | REH-20 | 4.14 | 118 | 128 |
| Ex113 | RD4 | RHH-2 | REH-22 | 4.13 | 116 | 127 |
| Ex114 | RD4 | RHH-2 | REH-28 | 4.13 | 115 | 124 |
| Ex115 | RD4 | RHH-4 | REH-1 | 4.14 | 119 | 128 |
| Ex116 | RD4 | RHH-4 | REH-6 | 4.15 | 118 | 129 |
| Ex117 | RD4 | RHH-4 | REH-12 | 4.11 | 116 | 123 |
| Ex118 | RD4 | RHH-4 | REH-20 | 4.11 | 115 | 125 |
| Ex119 | RD4 | RHH-4 | REH-22 | 4.12 | 114 | 122 |
| Ex120 | RD4 | RHH-4 | REH-28 | 4.10 | 114 | 123 |
| Ex121 | RD4 | RHH-6 | REH-1 | 4.12 | 118 | 125 |
| Ex122 | RD4 | RHH-6 | REH-6 | 4.11 | 117 | 124 |
| Ex123 | RD4 | RHH-6 | REH-12 | 4.10 | 116 | 120 |
| Ex124 | RD4 | RHH-6 | REH-20 | 4.09 | 114 | 118 |
| Ex125 | RD4 | RHH-6 | REH-22 | 4.08 | 115 | 118 |
| Ex126 | RD4 | RHH-6 | REH-28 | 4.11 | 116 | 116 |

TABLE 8

| | EML | | | | EQE | LT95 |
|---|---|---|---|---|---|---|
| | Dopant | Host | | V | (%) | (%) |
| Ref4 | RD4 | CBP | | 4.28 | 100 | 100 |
| Ex127 | RD4 | RHH-10 | REH-1 | 4.12 | 129 | 130 |
| Ex128 | RD4 | RHH-10 | REH-6 | 4.11 | 126 | 129 |
| Ex129 | RD4 | RHH-10 | REH-12 | 4.08 | 119 | 125 |
| Ex130 | RD4 | RHH-10 | REH-20 | 4.09 | 117 | 120 |
| Ex131 | RD4 | RHH-10 | REH-22 | 4.06 | 115 | 119 |
| Ex132 | RD4 | RHH-10 | REH-28 | 4.07 | 114 | 118 |
| Ex133 | RD4 | RHH-28 | REH-1 | 4.09 | 124 | 125 |
| Ex134 | RD4 | RHH-28 | REH-6 | 4.10 | 125 | 126 |
| Ex135 | RD4 | RHH-28 | REH-12 | 4.11 | 122 | 121 |
| Ex136 | RD4 | RHH-28 | REH-20 | 4.08 | 119 | 120 |
| Ex137 | RD4 | RHH-28 | REH-22 | 4.07 | 117 | 120 |
| Ex138 | RD4 | RHH-28 | REH-28 | 4.08 | 117 | 118 |
| Ex139 | RD4 | RHH-28 | REH-1 | 4.11 | 119 | 125 |
| Ex140 | RD4 | RHH-30 | REH-6 | 4.12 | 120 | 123 |
| Ex141 | RD4 | RHH-30 | REH-12 | 4.09 | 118 | 118 |
| Ex142 | RD4 | RHH-30 | REH-20 | 4.08 | 117 | 119 |
| Ex143 | RD4 | RHH-30 | REH-22 | 4.08 | 116 | 118 |
| Ex144 | RD4 | RHH-30 | REH-28 | 4.07 | 115 | 117 |

As shown in Tables 7 and 8, in comparison to the OLED of Ref4, in which the red EML includes the compound RD4 as a dopant and CBP as a host, the OLED of Ex109 to Ex144, in which the red EML includes the compound RD4 as a dopant, the compounds RHH-2, RHH-4, RHH-6, RHH-10, RHH-28 and RHH-30 as a first host, and the compounds REH-1, REH-6, REH-12, REH-20, REH-22 and REH-28 as a second host, has advantages in the driving voltage, the luminous efficiency and the luminous lifespan.

9. Comparative Example 5 (Ref5)

The compound RD5 in Formula 8 and the compound (CBP) in Formula 7 are used as the dopant and host, respectively, to form the EML.

10. Examples (1) Examples 145 and 146 (Ex145 and Ex146)

The compound RD5 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 147 and 148 (Ex147 and Ex148)

The compound RD5 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 149 and 150 (Ex149 and Ex150)

The compound RD5 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 151 and 152 (Ex151 and Ex152)

The compound RD5 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 153 and 154 (Ex153 and Ex154)

The compound RD5 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 155 and 156 (Ex155 and Ex156)

The compound RD5 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 5 and Examples 145 to 156 are measured and listed in Table 9. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 9500 of the lifespan) was measured at 40° C. under 40 $mA/cm^2$ condition.

TABLE 9

| | EML | | | | EQE | LT95 |
|---|---|---|---|---|---|---|
| | Dopant | Host | | V | (%) | (%) |
| Ref5 | RD5 | CBP | | 4.28 | 100 | 100 |
| Ex145 | RD5 | RHH-2 | REH-6 | 4.13 | 119 | 135 |
| Ex146 | RD5 | RHH-2 | REH-12 | 4.11 | 121 | 134 |
| Ex147 | RD5 | RHH-4 | REH-6 | 4.09 | 116 | 137 |
| Ex148 | RD5 | RHH-4 | REH-12 | 4.11 | 119 | 136 |
| Ex149 | RD5 | RHH-6 | REH-6 | 4.11 | 117 | 130 |
| Ex150 | RD5 | RHH-6 | REH-12 | 4.13 | 118 | 127 |
| Ex151 | RD5 | RHH-10 | REH-6 | 4.11 | 122 | 130 |
| Ex152 | RD5 | RHH-10 | REH-12 | 4.14 | 119 | 125 |
| Ex153 | RD5 | RHH-28 | REH-6 | 4.12 | 118 | 130 |
| Ex154 | RD5 | RHH-28 | REH-12 | 4.11 | 117 | 120 |
| Ex155 | RD5 | RHH-30 | REH-6 | 4.11 | 119 | 125 |
| Ex156 | RD5 | RHH-30 | REH-12 | 4.13 | 119 | 123 |

As shown in Table 9, in comparison to the OLED of Ref5, in which the red EML includes the compound RD5 as a dopant and CBP as a host, the OLED of Ex145 to Ex156, in which the red EML includes the compound RD5 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

11. Comparative Example 6 (Ref6)

The compound RD6 in Formula 8 and the compound (CBP) in Formula 7 are used as the dopant and host, respectively, to form the EML.

12. Examples (1) Examples 157 and 158 (Ex157 and Ex158)

The compound RD6 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 159 and 160 (Ex159 and Ex160)

The compound RD6 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 161 and 162 (Ex161 and Ex162)

The compound RD6 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 163 and 164 (Ex163 and Ex164)

The compound RD6 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 165 and 166 (Ex165 and Ex166)

The compound RD6 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 167 and 168 (Ex167 and Ex168)

The compound RD6 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 6 and Examples 157 to 168 are measured and listed in Table 10. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 10

| | EML | | | | EQE | LT95 |
|---|---|---|---|---|---|---|
| | Dopant | Host | | V | (%) | (%) |
| Ref6 | RD6 | CBP | | 4.32 | 100 | 100 |
| Ex157 | RD6 | RHH-2 | REH-6 | 4.19 | 118 | 138 |
| Ex158 | RD6 | RHH-2 | REH-12 | 4.18 | 117 | 128 |
| Ex159 | RD6 | RHH-4 | REH-6 | 4.20 | 119 | 140 |
| Ex160 | RD6 | RHH-4 | REH-12 | 4.13 | 117 | 130 |
| Ex161 | RD6 | RHH-6 | REH-6 | 4.14 | 116 | 128 |
| Ex162 | RD6 | RHH-6 | REH-12 | 4.12 | 117 | 130 |
| Ex163 | RD6 | RHH-10 | REH-6 | 4.10 | 125 | 135 |
| Ex164 | RD6 | RHH-10 | REH-12 | 4.13 | 121 | 137 |
| Ex165 | RD6 | RHH-28 | REH-6 | 4.15 | 121 | 129 |
| Ex166 | RD6 | RHH-28 | REH-12 | 4.12 | 119 | 128 |
| Ex167 | RD6 | RHH-30 | REH-6 | 4.11 | 121 | 129 |
| Ex168 | RD6 | RHH-30 | REH-12 | 4.13 | 121 | 126 |

As shown in Table 10, in comparison to the OLED of Ref6, in which the red EML includes the compound RD6 as a dopant and CBP as a host, the OLED of Ex157 to Ex168, in which the red EML includes the compound RD6 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

13. Comparative Example 7 (Ref7)

The compound RD7 in Formula 8 and the compound (CBP) in Formula 7 are used as the dopant and host, respectively, to form the EML.

14. Examples (1) Examples 169 and 170 (Ex169 and Ex170)

The compound RD7 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 171 and 172 (Ex171 and Ex172)

The compound RD7 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 173 and 174 (Ex173 and Ex174)

The compound RD7 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 175 and 176 (Ex175 and Ex176)

The compound RD7 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 177 and 178 (Ex177 and Ex178)

The compound RD7 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 179 and 180 (Ex179 and Ex180)

The compound RD7 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 7 and Examples 169 to 180 are measured and listed in Table 11. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 11

| | EML | | | | EQE | LT95 |
|---|---|---|---|---|---|---|
| | Dopant | Host | | V | (%) | (%) |
| Ref7 | RD7 | CBP | | 4.29 | 100 | 100 |
| Ex169 | RD7 | RHH-2 | REH-6 | 4.17 | 119 | 136 |
| Ex170 | RD7 | RHH-2 | REH-12 | 4.19 | 119 | 133 |
| Ex171 | RD7 | RHH-4 | REH-6 | 4.16 | 117 | 131 |
| Ex172 | RD7 | RHH-4 | REH-12 | 4.17 | 116 | 132 |
| Ex173 | RD7 | RHH-6 | REH-6 | 4.18 | 114 | 131 |
| Ex174 | RD7 | RHH-6 | REH-12 | 4.15 | 117 | 129 |
| Ex175 | RD7 | RHH-10 | REH-6 | 4.16 | 120 | 135 |
| Ex176 | RD7 | RHH-10 | REH-12 | 4.15 | 121 | 134 |
| Ex177 | RD7 | RHH-28 | REH-6 | 4.13 | 122 | 133 |
| Ex178 | RD7 | RHH-28 | REH-12 | 4.13 | 120 | 132 |
| Ex179 | RD7 | RHH-30 | REH-6 | 4.12 | 120 | 129 |
| Ex180 | RD7 | RHH-30 | REH-12 | 4.14 | 119 | 128 |

As shown in Table 11, in comparison to the OLED of Ref7, in which the red EML includes the compound RD7 as a dopant and CBP as a host, the OLED of Ex169 to Ex180, in which the red EML includes the compound RD7 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

15. Comparative Example 8 (Ref8)

The compound RD8 in Formula 8 and the compound (CBP) in Formula 7 are used as the dopant and host, respectively, to form the EML.

16. Examples (1) Examples 181 and 182 (Ex181 and Ex182)

The compound RD8 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 183 and 184 (Ex183 and Ex184)

The compound RD8 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 185 and 186 (Ex185 and Ex186)

The compound RD8 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 187 and 188 (Ex187 and Ex188)

The compound RD8 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 189 and 190 (Ex189 and Ex190)

The compound RD8 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 191 and 192 (Ex191 and Ex192)

The compound RD8 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 8 and Examples 181 to 192 are measured and listed in Table 12. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 9500 of the lifespan) was measured at 40° C. under 40 $mA/cm^2$ condition.

TABLE 12

| | EML | | | | EQE | LT95 |
|---|---|---|---|---|---|---|
| | Dopant | Host | | V | (%) | (%) |
| Ref8 | RD8 | CBP | | 4.27 | 100 | 100 |
| Ex181 | RD8 | RHH-2 | REH-6 | 4.17 | 121 | 137 |
| Ex182 | RD8 | RHH-2 | REH-12 | 4.14 | 117 | 132 |
| Ex183 | RD8 | RHH-4 | REH-6 | 4.16 | 119 | 134 |
| Ex184 | RD8 | RHH-4 | REH-12 | 4.18 | 116 | 129 |
| Ex185 | RD8 | RHH-6 | REH-6 | 4.16 | 115 | 128 |
| Ex186 | RD8 | RHH-6 | REH-12 | 4.15 | 117 | 129 |
| Ex187 | RD8 | RHH-10 | REH-6 | 4.13 | 116 | 130 |
| Ex188 | RD8 | RHH-10 | REH-12 | 4.14 | 121 | 126 |
| Ex189 | RD8 | RHH-28 | REH-6 | 4.13 | 119 | 128 |
| Ex190 | RD8 | RHH-28 | REH-12 | 4.16 | 121 | 125 |
| Ex191 | RD8 | RHH-30 | REH-6 | 4.15 | 117 | 123 |
| Ex192 | RD8 | RHH-30 | REH-12 | 4.14 | 119 | 120 |

As shown in Table 12, in comparison to the OLED of Ref8, in which the red EML includes the compound RD8 as a dopant and CBP as a host, the OLED of Ex181 to Ex192, in which the red EML includes the compound RD8 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

17. Comparative Example 9 (Ref9)

The compound RD9 in Formula 8 and the compound (CBP) in Formula 7 are used as the dopant and host, respectively, to form the EML.

18. Examples (1) Examples 193 and 194 (Ex193 and Ex194)

The compound RD9 in Formula 8 as the dopant, the compound RHH-3 in Formula 2-4 as a first host, and the compounds REH-6 and REH-12 in Formula 3-6 as a second dopant are used to form the EML. (first host:second host=1:1 (weight %))

(2) Examples 195 and 196 (Ex195 and Ex196)

The compound RD9 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 197 and 198 (Ex197 and Ex198)

The compound RD9 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 199 and 200 (Ex199 and Ex200)

The compound RD9 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 201 and 202 (Ex201 and Ex202)

The compound RD9 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 203 and 203 (Ex204 and Ex204)

The compound RD9 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 9 and Examples 193 to 204 are measured and listed in Table 13. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 95% of the lifespan) was measured at 40° C. under 40 $mA/cm^2$ condition.

TABLE 13

| | EML | | | | EQE | LT95 |
|---|---|---|---|---|---|---|
| | Dopant | Host | | V | (%) | (%) |
| Ref9 | RD9 | CBP | | 4.29 | 100 | 100 |
| Ex193 | RD9 | RHH-2 | REH-6 | 4.18 | 121 | 135 |
| Ex194 | RD9 | RHH-2 | REH-12 | 4.15 | 118 | 130 |
| Ex195 | RD9 | RHH-4 | REH-6 | 4.19 | 120 | 137 |
| Ex196 | RD9 | RHH-4 | REH-12 | 4.17 | 118 | 124 |
| Ex197 | RD9 | RHH-6 | REH-6 | 4.16 | 115 | 123 |
| Ex198 | RD9 | RHH-6 | REH-12 | 4.16 | 116 | 127 |
| Ex199 | RD9 | RHH-10 | REH-6 | 4.17 | 117 | 130 |
| Ex200 | RD9 | RHH-10 | REH-12 | 4.16 | 119 | 128 |
| Ex201 | RD9 | RHH-28 | REH-6 | 4.15 | 115 | 126 |
| Ex202 | RD9 | RHH-28 | REH-12 | 4.16 | 118 | 125 |
| Ex203 | RD9 | RHH-30 | REH-6 | 4.17 | 116 | 124 |
| Ex204 | RD9 | RHH-30 | REH-12 | 4.19 | 117 | 122 |

As shown in Table 13, in comparison to the OLED of Ref9, in which the red EML includes the compound RD9 as a dopant and CBP as a host, the OLED of Ex193 to Ex204, in which the red EML includes the compound RD9 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

19. Comparative Example 10 (Ref10)

The compound RD10 in Formula 8 and the compound (CBP) in Formula 7 are used as the dopant and host, respectively, to form the EML.

20. Examples (1) Examples 205 and 206 (Ex205 and Ex206)

The compound RD10 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 207 and 208 (Ex207 and Ex208)

The compound RD10 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 209 and 210 (Ex209 and Ex210)

The compound RD10 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 211 and 212 (Ex211 and Ex212)

The compound RD10 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 213 and 214 (Ex213 and Ex214)

The compound RD10 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 215 and 216 (Ex215 and Ex216)

The compound RD10 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 10 and Examples 205 to 216 are measured and listed in Table 14. The properties of the OLED were measured at the room temperature using a current source (KEITHLEY) and a photometer (PR 650). The driving voltage and the external quantum efficiency were measured under the condition of a current density of 10 mA/$cm^2$, and the lifespan (the time to reach 9500 of the lifespan) was measured at 40° C. under 40 mA/$cm^2$ condition.

TABLE 14

| | EML | | | | EQE | LT95 |
|---|---|---|---|---|---|---|
| | Dopant | Host | | V | (%) | (%) |
| Ref10 | RD10 | CBP | | 4.33 | 100 | 100 |
| Ex205 | RD10 | RHH-2 | REH-6 | 4.21 | 120 | 132 |
| Ex206 | RD10 | RHH-2 | REH-12 | 4.19 | 118 | 128 |
| Ex207 | RD10 | RHH-4 | REH-6 | 4.18 | 119 | 134 |
| Ex208 | RD10 | RHH-4 | REH-12 | 4.20 | 115 | 125 |
| Ex209 | RD10 | RHH-6 | REH-6 | 4.18 | 114 | 128 |
| Ex210 | RD10 | RHH-6 | REH-12 | 4.17 | 116 | 126 |
| Ex211 | RD10 | RHH-10 | REH-6 | 4.19 | 118 | 130 |
| Ex212 | RD10 | RHH-10 | REH-12 | 4.18 | 120 | 127 |
| Ex213 | RD10 | RHH-28 | REH-6 | 4.16 | 118 | 125 |
| Ex214 | RD10 | RHH-28 | REH-12 | 4.18 | 120 | 125 |
| Ex215 | RD10 | RHH-30 | REH-6 | 4.19 | 115 | 126 |
| Ex216 | RD10 | RHH-30 | REH-12 | 4.20 | 117 | 128 |

As shown in Table 14, in comparison to the OLED of Ref10, in which the red EML includes the compound RD10 as a dopant and CBP as a host, the OLED of Ex205 to Ex216, in which the red EML includes the compound RD10 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

21. Comparative Example 11 (Ref11)

The compound RD11 in Formula 8 and the compound (CBP) in Formula 7 are used as the dopant and host, respectively, to form the EML.

22. Examples (1) Examples 217 and 218 (Ex217 and Ex218)

The compound RD11 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 219 and 220 (Ex219 and Ex220)

The compound RD11 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 221 and 222 (Ex221 and Ex222)

The compound RD11 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 223 and 224 (Ex223 and Ex224)

The compound RD11 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 225 and 226 (Ex225 and Ex226)

The compound RD11 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 227 and 228 (Ex227 and Ex228)

The compound RD11 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 11 and Examples 217 to 228 are measured and listed in Table 15. The properties of the OLED were measured at the room temperature using a current source (KEITHLEY) and a photometer (PR 650). The driving voltage and the external quantum efficiency were measured under the condition of a current density of 10 mA/$cm^2$, and the lifespan (the time to reach 95% of the lifespan) was measured at 40° C. under 40 mA/$cm^2$ condition.

TABLE 15

| | EML | | | | EQE | LT95 |
|---|---|---|---|---|---|---|
| | Dopant | Host | | V | (%) | (%) |
| Ref11 | RD11 | CBP | | 4.29 | 100 | 100 |
| Ex217 | RD11 | RHH-2 | REH-6 | 4.21 | 121 | 130 |
| Ex218 | RD11 | RHH-2 | REH-12 | 4.19 | 119 | 129 |
| Ex219 | RD11 | RHH-4 | REH-6 | 4.20 | 117 | 132 |
| Ex220 | RD11 | RHH-4 | REH-12 | 4.21 | 116 | 123 |
| Ex221 | RD11 | RHH-6 | REH-6 | 4.19 | 116 | 121 |
| Ex222 | RD11 | RHH-6 | REH-12 | 4.17 | 117 | 125 |
| Ex223 | RD11 | RHH-10 | REH-6 | 4.15 | 119 | 129 |

TABLE 15-continued

| | EML | | | | EQE | LT95 |
|---|---|---|---|---|---|---|
| | Dopant | Host | | V | (%) | (%) |
| Ex224 | RD11 | RHH-10 | REH-12 | 4.18 | 119 | 127 |
| Ex225 | RD11 | RHH-28 | REH-6 | 4.17 | 117 | 126 |
| Ex226 | RD11 | RHH-28 | REH-12 | 4.19 | 119 | 129 |
| Ex227 | RD11 | RHH-30 | REH-6 | 4.19 | 117 | 129 |
| Ex228 | RD11 | RHH-30 | REH-12 | 4.20 | 119 | 125 |

As shown in Table 15, in comparison to the OLED of Ref11, in which the red EML includes the compound RD11 as a dopant and CBP as a host, the OLED of Ex217 to Ex228, in which the red EML includes the compound RD11 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

23. Comparative Example 12 (Ref12)

The compound RD12 in Formula 8 and the compound (CBP) in Formula 7 are used as the dopant and host, respectively, to form the EML.

24. Examples (1) Examples 229 and 230 (Ex229 and Ex230)

The compound RD12 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 231 and 232 (Ex231 and Ex232)

The compound RD12 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 233 and 234 (Ex233 and Ex234)

The compound RD12 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 235 and 236 (Ex235 and Ex236)

The compound RD12 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 237 and 238 (Ex237 and Ex238)

The compound RD12 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 239 and 240 (Ex239 and Ex240)

The compound RD12 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 12 and Examples 229 to 240 are measured and listed in Table 16. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 95% of the lifespan) was measured at 40° C. under 40 mA/cm$^2$ condition.

TABLE 16

| | EML | | | | EQE | LT95 |
|---|---|---|---|---|---|---|
| | Dopant | Host | | V | (%) | (%) |
| Ref12 | RD12 | CBP | | 4.31 | 100 | 100 |
| Ex229 | RD12 | RHH-2 | REH-6 | 4.21 | 117 | 132 |
| Ex230 | RD12 | RHH-2 | REH-12 | 4.19 | 118 | 127 |
| Ex231 | RD12 | RHH-4 | REH-6 | 4.20 | 116 | 125 |
| Ex232 | RD12 | RHH-4 | REH-12 | 4.23 | 115 | 122 |
| Ex233 | RD12 | RHH-6 | REH-6 | 4.21 | 115 | 123 |
| Ex234 | RD12 | RHH-6 | REH-12 | 4.17 | 116 | 125 |
| Ex235 | RD12 | RHH-10 | REH-6 | 4.15 | 120 | 129 |
| Ex236 | RD12 | RHH-10 | REH-12 | 4.19 | 119 | 127 |
| Ex237 | RD12 | RHH-28 | REH-6 | 4.17 | 117 | 121 |
| Ex238 | RD12 | RHH-28 | REH-12 | 4.19 | 121 | 124 |
| Ex239 | RD12 | RHH-30 | REH-6 | 4.19 | 117 | 123 |
| Ex240 | RD12 | RHH-30 | REH-12 | 4.21 | 119 | 121 |

As shown in Table 16, in comparison to the OLED of Ref12, in which the red EML includes the compound RD12 as a dopant and CBP as a host, the OLED of Ex229 to Ex240, in which the red EML includes the compound RD12 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

25. Comparative Example 13 (Ref13)

The compound RD13 in Formula 8 and the compound (CBP) in Formula 7 are used as the dopant and host, respectively, to form the EML.

26. Examples (1) Examples 241 and 242 (Ex241 and Ex242)

The compound RD13 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 243 and 244 (Ex243 and Ex244)

The compound RD13 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 245 and 246 (Ex245 and Ex246)

The compound RD13 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 247 and 248 (Ex247 and Ex248)

The compound RD13 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 249 and 250 (Ex249 and Ex250)

The compound RD13 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 251 and 252 (Ex251 and Ex252)

The compound RD13 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 13 and Examples 241 to 252 are measured and listed in Table 17. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 95% of the lifespan) was measured at 40° C. under 40 mA/cm$^2$ condition.

TABLE 17

| | EML | | | | EQE | LT95 |
|---|---|---|---|---|---|---|
| | Dopant | Host | | V | (%) | (%) |
| Ref13 | RD13 | CBP | | 4.25 | 100 | 100 |
| Ex241 | RD13 | RHH-2 | REH-6 | 4.17 | 119 | 131 |
| Ex242 | RD13 | RHH-2 | REH-12 | 4.15 | 117 | 121 |
| Ex243 | RD13 | RHH-4 | REH-6 | 4.13 | 118 | 125 |
| Ex244 | RD13 | RHH-4 | REH-12 | 4.15 | 114 | 124 |
| Ex245 | RD13 | RHH-6 | REH-6 | 4.13 | 114 | 121 |
| Ex246 | RD13 | RHH-6 | REH-12 | 4.11 | 114 | 125 |
| Ex247 | RD13 | RHH-10 | REH-6 | 4.13 | 119 | 131 |
| Ex248 | RD13 | RHH-10 | REH-12 | 4.15 | 121 | 126 |
| Ex249 | RD13 | RHH-28 | REH-6 | 4.11 | 119 | 125 |
| Ex250 | RD13 | RHH-28 | REH-12 | 4.13 | 121 | 127 |
| Ex251 | RD13 | RHH-30 | REH-6 | 4.15 | 115 | 128 |
| Ex252 | RD13 | RHH-30 | REH-12 | 4.17 | 117 | 123 |

As shown in Table 17, in comparison to the OLED of Ref13, in which the red EML includes the compound RD13 as a dopant and CBP as a host, the OLED of Ex241 to Ex252, in which the red EML includes the compound RD13 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

27. Comparative Example 14 (Ref14)

The compound RD14 in Formula 8 and the compound (CBP) in Formula 7 are used as the dopant and host, respectively, to form the EML.

28. Examples (1) Examples 253 and 254 (Ex253 and Ex254)

The compound RD14 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 255 and 256 (Ex255 and Ex256)

The compound RD14 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 257 and 258 (Ex257 and Ex258)

The compound RD14 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 259 and 260 (Ex259 and Ex260)

The compound RD14 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 261 and 262 (Ex261 and Ex262)

The compound RD14 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 263 and 264 (Ex263 and Ex264)

The compound RD14 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 14 and Examples 253 to 264 are measured and listed in Table 18. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 95% of the lifespan) was measured at 40° C. under 40 mA/cm$^2$ condition.

TABLE 18

| | EML | | | | EQE | LT95 |
|---|---|---|---|---|---|---|
| | Dopant | Host | | V | (%) | (%) |
| Ref14 | RD14 | CBP | | 4.26 | 100 | 100 |
| Ex253 | RD14 | RHH-2 | REH-6 | 4.12 | 116 | 121 |
| Ex254 | RD14 | RHH-2 | REH-12 | 4.09 | 115 | 123 |
| Ex255 | RD14 | RHH-4 | REH-6 | 4.09 | 115 | 119 |
| Ex256 | RD14 | RHH-4 | REH-12 | 4.11 | 111 | 117 |
| Ex257 | RD14 | RHH-6 | REH-6 | 4.09 | 111 | 118 |
| Ex258 | RD14 | RHH-6 | REH-12 | 4.07 | 114 | 121 |
| Ex259 | RD14 | RHH-10 | REH-6 | 4.07 | 116 | 123 |
| Ex260 | RD14 | RHH-10 | REH-12 | 4.09 | 119 | 119 |
| Ex261 | RD14 | RHH-28 | REH-6 | 4.07 | 116 | 119 |
| Ex262 | RD14 | RHH-28 | REH-12 | 4.09 | 117 | 121 |
| Ex263 | RD14 | RHH-30 | REH-6 | 4.07 | 115 | 121 |
| Ex264 | RD14 | RHH-30 | REH-12 | 4.11 | 113 | 117 |

As shown in Table 18, in comparison to the OLED of Ref14, in which the red EML includes the compound RD14 as a dopant and CBP as a host, the OLED of Ex253 to Ex264, in which the red EML includes the compound RD14 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

29. Comparative Example 15 (Ref15)

The compound RD15 in Formula 8 and the compound (CBP) in Formula 7 are used as the dopant and host, respectively, to form the EML.

30. Examples (1) Examples 265 and 266 (Ex265 and Ex266)

The compound RD15 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 267 and 268 (Ex267 and Ex268)

The compound RD15 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 269 and 270 (Ex269 and Ex270)

The compound RD15 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 271 and 272 (Ex271 and Ex272)

The compound RD15 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 273 and 274 (Ex273 and Ex274)

The compound RD15 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 275 and 276 (Ex275 and Ex276)

The compound RD15 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 15 and Examples 265 to 276 are measured and listed in Table 19. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 95% of the lifespan) was measured at 40° C. under 40 mA/cm$^2$ condition.

TABLE 19

| | EML | | | | EQE | LT95 |
|---|---|---|---|---|---|---|
| | Dopant | Host | | V | (%) | (%) |
| Ref15 | RD15 | CBP | | 4.19 | 100 | 100 |
| Ex265 | RD15 | RHH-2 | REH-6 | 4.11 | 111 | 123 |
| Ex266 | RD15 | RHH-2 | REH-12 | 4.09 | 109 | 119 |
| Ex267 | RD15 | RHH-4 | REH-6 | 4.10 | 107 | 117 |
| Ex268 | RD15 | RHH-4 | REH-12 | 4.11 | 106 | 115 |
| Ex269 | RD15 | RHH-6 | REH-6 | 4.09 | 106 | 113 |
| Ex270 | RD15 | RHH-6 | REH-12 | 4.07 | 107 | 117 |
| Ex271 | RD15 | RHH-10 | REH-6 | 4.05 | 111 | 121 |
| Ex272 | RD15 | RHH-10 | REH-12 | 4.08 | 111 | 119 |
| Ex273 | RD15 | RHH-28 | REH-6 | 4.07 | 107 | 119 |
| Ex274 | RD15 | RHH-28 | REH-12 | 4.09 | 109 | 121 |
| Ex275 | RD15 | RHH-30 | REH-6 | 4.09 | 107 | 121 |
| Ex276 | RD15 | RHH-30 | REH-12 | 4.11 | 109 | 117 |

As shown in Table 19, in comparison to the OLED of Ref15, in which the red EML includes the compound RD15 as a dopant and CBP as a host, the OLED of Ex265 to Ex276, in which the red EML includes the compound RD15 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

31. Comparative Example 16 (Ref16)

The compound RD16 in Formula 8 and the compound (CBP) in Formula 7 are used as the dopant and host, respectively, to form the EML.

32. Examples (1) Examples 277 and 278 (Ex277 and Ex278)

The compound RD16 in Formula 8 as the dopant, the compound RHH-2 in Formula 2-4 as a first host, and the compounds REH-6 and REH-12 in Formula 3-6 as a second dopant are used to form the EML. (first host:second host=1:1 (weight %))

(2) Examples 279 and 280 (Ex279 and Ex280)

The compound RD16 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(3) Examples 281 and 282 (Ex281 and Ex282)

The compound RD16 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(4) Examples 283 and 284 (Ex283 and Ex284)

The compound RD16 in Formula 8 as the dopant, the compound RHH-10 in Formula 2-4 as a first host, and the compounds REH-6 and REH-12 in Formula 3-6 as a second dopant are used to form the EML. (first host:second host=1:1 (weight %))

(5) Examples 285 and 286 (Ex285 and Ex286)

The compound RD16 in Formula 8 as the dopant, the compound RHH-28 in Formula 2-4 as a first host, and the compounds REH-6 and REH-12 in Formula 3-6 as a second dopant are used to form the EML. (first host:second host=1:1 (weight %))

(6) Examples 287 and 288 (Ex287 and Ex288)

The compound RD16 in Formula 8 as the dopant, the compound RHH-30 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Example 16 and Examples 277 to 288 are measured and listed in Table 20. The properties of the OLED were measured at the room temperature using a current source (KEITHLEY) and a photometer (PR 650). The driving voltage and the external quantum efficiency were measured under the condition of a current density of 10 mA/$cm^2$, and the lifespan (the time to reach 95% of the lifespan) was measured at 40° C. under 40 mA/$cm^2$ condition.

TABLE 20

| | EML | | | | EQE | LT95 |
|---|---|---|---|---|---|---|
| | Dopant | Host | | V | (%) | (%) |
| Ref16 | RD16 | CBP | | 4.21 | 100 | 100 |
| Ex277 | RD16 | RHH-2 | REH-6 | 4.11 | 107 | 122 |
| Ex278 | RD16 | RHH-2 | REH-12 | 4.09 | 107 | 117 |
| Ex279 | RD16 | RHH-4 | REH-6 | 4.11 | 106 | 113 |
| Ex280 | RD16 | RHH-4 | REH-12 | 4.13 | 105 | 114 |
| Ex281 | RD16 | RHH-6 | REH-6 | 4.11 | 105 | 115 |
| Ex282 | RD16 | RHH-6 | REH-12 | 4.07 | 105 | 117 |
| Ex283 | RD16 | RHH-10 | REH-6 | 4.05 | 110 | 119 |
| Ex284 | RD16 | RHH-10 | REH-12 | 4.09 | 109 | 117 |
| Ex285 | RD16 | RHH-28 | REH-6 | 4.07 | 115 | 111 |
| Ex286 | RD16 | RHH-28 | REH-12 | 4.09 | 113 | 116 |
| Ex287 | RD16 | RHH-30 | REH-6 | 4.09 | 107 | 115 |
| Ex288 | RD16 | RHH-30 | REH-12 | 4.11 | 109 | 113 |

As shown in Table 20, in comparison to the OLED of Ref16, in which the red EML includes the compound RD16 as a dopant and CBP as a host, the OLED of Ex277 to Ex288, in which the red EML includes the compound RD16 as a dopant, the compounds RHH-2, RHH-4, RHH-6, RHH-10, RHH-28 and RHH-30 as a first host, and the compounds REH-6 and REH-12 as a second host, has advantages in the driving voltage, the luminous efficiency and the luminous lifespan.

33. Comparative Examples 17 to 20 (Ref17 to Ref20)

The compounds RD17, RD18, RD19 and RD20 in Formula 8 as the dopant and the compound (CBP) in Formula 7 as the host are used to form the EML.

34. Examples (1) Examples 289 and 290 (Ex289 and Ex290)

The compound RD17 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(2) Examples 291 and 292 (Ex291 and Ex292)

The compound RD17 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(3) Examples 293 and 294 (Ex293 and Ex294)

The compound RD18 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(4) Examples 295 and 296 (Ex295 and Ex296)

The compound RD18 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(5) Examples 297 and 298 (Ex297 and Ex298)

The compound RD19 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(6) Examples 299 and 300 (Ex299 and Ex300)

The compound RD19 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(7) Examples 301 and 302 (Ex301 and Ex302)

The compound RD20 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(8) Examples 303 and 304 (Ex303 and Ex304)

The compound RD20 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Examples 17 to 20 and Examples 289 to 304 are measured and listed in Table 21. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 9500 of the lifespan) was measured at 40° C. under 40 mA/cm$^2$ condition.

TABLE 21

| | EML | | | | EQE | LT95 |
|---|---|---|---|---|---|---|
| | Dopant | Host | | V | (%) | (%) |
| Ref17 | RD17 | CBP | | 4.26 | 100 | 100 |
| Ex289 | RD17 | RHH-4 | REH-6 | 4.11 | 127 | 135 |
| Ex290 | RD17 | RHH-4 | REH-12 | 4.12 | 123 | 128 |
| Ex291 | RD17 | RHH-6 | REH-6 | 4.12 | 120 | 125 |
| Ex292 | RD17 | RHH-6 | REH-12 | 4.13 | 120 | 122 |
| Ref18 | RD18 | CBP | | 4.25 | 100 | 100 |
| Ex293 | RD18 | RHH-4 | REH-6 | 4.12 | 130 | 133 |
| Ex294 | RD18 | RHH-4 | REH-12 | 4.14 | 127 | 126 |
| Ex295 | RD18 | RHH-6 | REH-6 | 4.12 | 124 | 128 |
| Ex296 | RD18 | RHH-6 | REH-12 | 4.11 | 123 | 126 |
| Ref19 | RD19 | CBP | | 4.23 | 100 | 100 |
| Ex297 | RD19 | RHH-4 | REH-6 | 4.12 | 130 | 131 |
| Ex298 | RD19 | RHH-4 | REH-12 | 4.11 | 128 | 127 |
| Ex299 | RD19 | RHH-6 | REH-6 | 4.12 | 127 | 127 |
| Ex300 | RD19 | RHH-6 | REH-12 | 4.11 | 124 | 124 |
| Ref20 | RD20 | CBP | | 4.26 | 100 | 100 |
| Ex301 | RD20 | RHH-4 | REH-6 | 4.13 | 133 | 131 |
| Ex302 | RD20 | RHH-4 | REH-12 | 4.12 | 131 | 129 |
| Ex303 | RD20 | RHH-6 | REH-6 | 4.11 | 129 | 127 |
| Ex304 | RD20 | RHH-6 | REH-12 | 4.12 | 129 | 125 |

As shown in Table 21, in comparison to the OLED of Ref17, in which the red EML includes the compound RD17 as a dopant and CBP as a host, the OLED of Ex289 to Ex292, in which the red EML includes the compound RD17 as a dopant, the compounds RHH-4 and RHH-6 as a first host, and the compounds REH-6 and REH-12 as a second host, has advantages in the driving voltage, the luminous efficiency and the luminous lifespan.

In addition, in comparison to the OLED of Ref18, in which the red EML includes the compound RD18 as a dopant and CBP as a host, the OLED of Ex293 to Ex296, in which the red EML includes the compound RD18 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref19, in which the red EML includes the compound RD19 as a dopant and CBP as a host, the OLED of Ex297 to Ex300, in which the red EML includes the compound RD19 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref20, in which the red EML includes the compound RD20 as a dopant and CBP as a host, the OLED of Ex301 to Ex304, in which the red EML includes the compound RD20 as a dopant, the compounds RHH-4 and RHH-6 as a first host, and the compounds REH-6 and REH-12 as a second host, has advantages in the driving voltage, the luminous efficiency and the luminous lifespan.

35. Comparative Examples 21 to 24 (Ref21 to Ref24)

The compounds RD21, RD22, RD23 and RD24 in Formula 8 as the dopant and the compound (CBP) in Formula 7 as the host are used to form the EML.

36. Examples (1) Examples 305 and 306 (Ex305 and Ex306)

The compound RD21 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(2) Examples 307 and 308 (Ex307 and Ex308)

The compound RD21 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(3) Examples 309 and 310 (Ex309 and Ex310)

The compound RD22 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(4) Examples 311 and 312 (Ex311 and Ex312)

The compound RD22 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(5) Examples 313 and 314 (Ex313 and Ex314)

The compound RD23 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(6) Examples 315 and 316 (Ex315 and Ex316)

The compound RD23 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(7) Examples 317 and 318 (Ex317 and Ex318)

The compound RD24 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(8) Examples 319 and 320 (Ex319 and Ex320)

The compound RD24 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Examples 21 to 24 and Examples 305 to 320 are measured and listed in Table 22. The properties of the OLED were measured at the room temperature using a current source (KEITHLEY) and a photometer (PR 650). The driving voltage and the external quantum efficiency were measured under the condition of a current density of 10 mA/$cm^2$, and the lifespan (the time to reach 95% of the lifespan) was measured at 40° C. under 40 mA/$cm^2$ condition.

TABLE 22

| | EML | | | | EQE | LT95 |
|---|---|---|---|---|---|---|
| | Dopant | Host | | V | (%) | (%) |
| Ref21 | RD21 | CBP | | 4.29 | 100 | 100 |
| Ex305 | RD21 | RHH-4 | REH-6 | 4.19 | 127 | 140 |
| Ex306 | RD21 | RHH-4 | REH-12 | 4.18 | 124 | 129 |
| Ex307 | RD21 | RHH-6 | REH-6 | 4.20 | 125 | 132 |
| Ex308 | RD21 | RHH-6 | REH-12 | 4.17 | 121 | 138 |
| Ref22 | RD22 | CBP | | 4.27 | 100 | 100 |
| Ex309 | RD22 | RHH-4 | REH-6 | 4.17 | 131 | 135 |
| Ex310 | RD22 | RHH-4 | REH-12 | 4.15 | 127 | 132 |
| Ex311 | RD22 | RHH-6 | REH-6 | 4.19 | 128 | 134 |
| Ex312 | RD22 | RHH-6 | REH-12 | 4.15 | 124 | 127 |
| Ref23 | RD23 | CBP | | 4.25 | 100 | 100 |
| Ex313 | RD23 | RHH-4 | REH-6 | 4.19 | 132 | 134 |
| Ex314 | RD23 | RHH-4 | REH-12 | 4.17 | 128 | 133 |
| Ex315 | RD23 | RHH-6 | REH-6 | 4.15 | 129 | 131 |
| Ex316 | RD23 | RHH-6 | REH-12 | 4.17 | 127 | 129 |
| Ref24 | RD24 | CBP | | 4.26 | 100 | 100 |
| Ex317 | RD24 | RHH-4 | REH-6 | 4.17 | 131 | 133 |
| Ex318 | RD24 | RHH-4 | REH-12 | 4.15 | 130 | 132 |

TABLE 22-continued

| | EML | | | | EQE | LT95 |
|---|---|---|---|---|---|---|
| | Dopant | Host | | V | (%) | (%) |
| Ex319 | RD24 | RHH-6 | REH-6 | 4.14 | 128 | 131 |
| Ex320 | RD24 | RHH-6 | REH-12 | 4.15 | 129 | 129 |

As shown in Table 22, in comparison to the OLED of Ref21, in which the red EML includes the compound RD21 as a dopant and CBP as a host, the OLED of Ex305 to Ex308, in which the red EML includes the compound RD21 as a dopant, the compounds RHH-4 and RHH-6 as a first host, and the compounds REH-6 and REH-12 as a second host, has advantages in the driving voltage, the luminous efficiency and the luminous lifespan.

In addition, in comparison to the OLED of Ref22, in which the red EML includes the compound RD22 as a dopant and CBP as a host, the OLED of Ex309 to Ex312, in which the red EML includes the compound RD22 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref23, in which the red EML includes the compound RD23 as a dopant and CBP as a host, the OLED of Ex313 to Ex316, in which the red EML includes the compound RD23 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref24, in which the red EML includes the compound RD24 as a dopant and CBP as a host, the OLED of Ex317 to Ex320, in which the red EML includes the compound RD24 as a dopant, the compounds RHH-4 and RHH-6 as a first host, and the compounds REH-6 and REH-12 as a second host, has advantages in the driving voltage, the luminous efficiency and the luminous lifespan.

37. Comparative Examples 25 to 28 (Ref25 to Ref28)

The compounds RD25, RD26, RD27 and RD28 in Formula 8 as the dopant and the compound (CBP) in Formula 7 as the host are used to form the EML.

38. Examples (1) Examples 321 and 322 (Ex321 and Ex322)

The compound RD25 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(2) Examples 323 and 324 (Ex323 and Ex324)

The compound RD25 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(3) Examples 325 and 326 (Ex325 and Ex326)

The compound RD26 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(4) Examples 327 and 328 (Ex327 and Ex328)

The compound RD26 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(5) Examples 329 and 330 (Ex329 and Ex330)

The compound RD27 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(6) Examples 331 and 332 (Ex331 and Ex332)

The compound RD27 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(7) Examples 333 and 334 (Ex333 and Ex334)

The compound RD28 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(8) Examples 335 and 336 (Ex335 and Ex336)

The compound RD28 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

The properties, i.e., the driving voltage (V), the external quantum efficiency (EQE) and the lifespan (LT95), of the OLEDs manufactured in Comparative Examples 25 to 28 and Examples 321 to 336 are measured and listed in Table 23. The properties of the OLED were measured at the room temperature using a current source (KEITHLEY) and a photometer (PR 650). The driving voltage and the external quantum efficiency were measured under the condition of a current density of 10 mA/cm$^2$, and the lifespan (the time to reach 9500 of the lifespan) was measured at 40° C. under 40 mA/cm$^2$ condition.

TABLE 23

| | EML | | | | EQE | LT95 |
|---|---|---|---|---|---|---|
| | Dopant | Host | | V | (%) | (%) |
| Ref25 | RD25 | CBP | | 4.24 | 100 | 100 |
| Ex321 | RD25 | RHH-4 | REH-6 | 4.15 | 124 | 129 |
| Ex322 | RD25 | RHH-4 | REH-12 | 4.15 | 125 | 129 |
| Ex323 | RD25 | RHH-6 | REH-6 | 4.13 | 125 | 119 |
| Ex324 | RD25 | RHH-6 | REH-12 | 4.13 | 123 | 119 |
| Ref26 | RD26 | CBP | | 4.25 | 100 | 100 |
| Ex325 | RD26 | RHH-4 | REH-6 | 4.17 | 125 | 127 |
| Ex326 | RD26 | RHH-4 | REH-12 | 4.15 | 127 | 127 |
| Ex327 | RD26 | RHH-6 | REH-6 | 4.15 | 127 | 117 |
| Ex328 | RD26 | RHH-6 | REH-12 | 4.14 | 125 | 119 |
| Ref27 | RD27 | CBP | | 4.24 | 100 | 100 |
| Ex329 | RD27 | RHH-4 | REH-6 | 4.17 | 125 | 127 |
| Ex330 | RD27 | RHH-4 | REH-12 | 4.15 | 128 | 126 |
| Ex331 | RD27 | RHH-6 | REH-6 | 4.14 | 129 | 125 |
| Ex332 | RD27 | RHH-6 | REH-12 | 4.15 | 127 | 125 |
| Ref28 | RD28 | CBP | | 4.26 | 100 | 100 |
| Ex333 | RD28 | RHH-4 | REH-6 | 4.19 | 127 | 125 |
| Ex334 | RD28 | RHH-4 | REH-12 | 4.17 | 126 | 127 |
| Ex335 | RD28 | RHH-6 | REH-6 | 4.17 | 128 | 127 |
| Ex336 | RD28 | RHH-6 | REH-12 | 4.16 | 129 | 124 |

As shown in Table 23, in comparison to the OLED of Ref25, in which the red EML includes the compound RD25 as a dopant and CBP as a host, the OLED of Ex321 to Ex324, in which the red EML includes the compound RD25 as a dopant, the compounds RHH-4 and RHH-6 as a first host, and the compounds REH-6 and REH-12 as a second host, has advantages in the driving voltage, the luminous efficiency and the luminous lifespan.

In addition, in comparison to the OLED of Ref26, in which the red EML includes the compound RD26 as a dopant and CBP as a host, the OLED of Ex325 to Ex328, in which the red EML includes the compound RD26 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref27, in which the red EML includes the compound RD27 as a dopant and CBP as a host, the OLED of Ex329 to Ex332, in which the red EML includes the compound RD27 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref28, in which the red EML includes the compound RD28 as a dopant and CBP as a host, the OLED of Ex333 to Ex336, in which the red EML includes the compound RD28 as a dopant, the compounds RHH-4 and RHH-6 as a first host, and the compounds REH-6 and REH-12 as a second host, has advantages in the driving voltage, the luminous efficiency and the luminous lifespan.

39. Comparative Examples 29 to 32 (Ref29 to Ref32)

The compounds RD29, RD30, RD31 and RD32 in Formula 8 as the dopant and the compound (CBP) in Formula 7 as the host are used to form the EML.

40. Examples (1) Examples 337 and 338 (Ex337 and Ex338)

The compound RD29 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(2) Examples 339 and 340 (Ex339 and Ex340)

The compound RD29 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(3) Examples 341 and 342 (Ex341 and Ex342)

The compound RD30 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(4) Examples 343 and 344 (Ex343 and Ex344)

The compound RD30 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(5) Examples 345 and 346 (Ex345 and Ex346)

The compound RD31 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(6) Examples 347 and 348 (Ex347 and Ex348)

The compound RD31 in Formula 8 as the dopant, the compound RHH-6 in Formula 2-4 as a first host, and the compounds REH-6 and REH-12 in Formula 3-6 as a second dopant are used to form the EML. (first host:second host=1:1 (weight %))

(7) Examples 349 and 350 (Ex349 and Ex350)

The compound RD32 in Formula 8 as the dopant, the compound RHH-4 in Formula 2-4 as a first host, and the compounds REH-6 and REH-12 in Formula 3-6 as a second dopant are used to form the EML. (first host:second host=1:1 (weight %))

(8) Examples 351 and 352 (Ex351 and Ex352)

The compound RD32 in Formula 8 as the dopant, the compound RHH-6 in Formula 2-4 as a first host, and the compounds REH-6 and REH-12 in Formula 3-6 as a second dopant are used to form the EML. (first host:second host=0:1 (weight %))

The properties, i.e., the driving voltage (V), the external quantum efficiency (EQE) and the lifespan (LT95), of the OLEDs manufactured in Comparative Examples 29 to 32 and Examples 337 to 352 are measured and listed in Table 24. The properties of the OLED were measured at the room temperature using a current source (KEITHLEY) and a photometer (PR 650). The driving voltage and the external quantum efficiency were measured under the condition of a current density of 10 $mA/cm^2$, and the lifespan (the time to reach 9500 of the lifespan) was measured at 40° C. under 40 $mA/cm^2$ condition.

TABLE 24

| | EML | | | | EQE | LT95 |
|---|---|---|---|---|---|---|
| | Dopant | Host | | V | (%) | (%) |
| Ref29 | RD29 | CBP | | 4.27 | 100 | 100 |
| Ex337 | RD29 | RHH-4 | REH-6 | 4.19 | 124 | 133 |
| Ex338 | RD29 | RHH-4 | REH-12 | 4.17 | 127 | 129 |
| Ex339 | RD29 | RHH-6 | REH-6 | 4.16 | 124 | 124 |
| Ex340 | RD29 | RHH-6 | REH-12 | 4.17 | 124 | 127 |
| Ref30 | RD30 | CBP | | 4.25 | 100 | 100 |
| Ex341 | RD30 | RHH-4 | REH-6 | 4.17 | 125 | 131 |
| Ex342 | RD30 | RHH-4 | REH-12 | 4.15 | 129 | 127 |
| Ex343 | RD30 | RHH-6 | REH-6 | 4.15 | 127 | 121 |
| Ex344 | RD30 | RHH-6 | REH-12 | 4.18 | 127 | 122 |
| Ref31 | RD31 | CBP | | 4.25 | 100 | 100 |
| Ex345 | RD31 | RHH-4 | REH-6 | 4.14 | 127 | 129 |
| Ex346 | RD31 | RHH-4 | REH-12 | 4.15 | 125 | 124 |
| Ex347 | RD31 | RHH-6 | REH-6 | 4.13 | 128 | 123 |
| Ex348 | RD31 | RHH-6 | REH-12 | 4.14 | 124 | 124 |
| Ref32 | RD32 | CBP | | 4.24 | 100 | 100 |
| Ex349 | RD32 | RHH-4 | REH-6 | 4.15 | 126 | 127 |
| Ex350 | RD32 | RHH-4 | REH-12 | 4.17 | 124 | 123 |
| Ex351 | RD32 | RHH-6 | REH-6 | 4.14 | 127 | 124 |
| Ex352 | RD32 | RHH-6 | REH-12 | 4.15 | 125 | 124 |

As shown in Table 24, in comparison to the OLED of Ref29, in which the red EML includes the compound RD29 as a dopant and CBP as a host, the OLED of Ex337 to Ex340, in which the red EML includes the compound RD29 as a dopant, the compounds RHH-4 and RHH-6 as a first host, and the compounds REH-6 and REH-12 as a second host, has advantages in the driving voltage, the luminous efficiency and the luminous lifespan.

In addition, in comparison to the OLED of Ref30, in which the red EML includes the compound RD30 as a dopant and CBP as a host, the OLED of Ex341 to Ex344, in which the red EML includes the compound RD30 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref31, in which the red EML includes the compound RD31 as a dopant and CBP as a host, the OLED of Ex345 to Ex348, in which the red EML includes the compound RD31 as a dopant, the compounds RHH-4 and RHH-6 as a first host, and the compounds REH-6 and REH-12 as a second host, has advantages in the driving voltage, the luminous efficiency and the luminous lifespan.

In comparison to the OLED of Ref32, in which the red EML includes the compound RD32 as a dopant and CBP as a host, the OLED of Ex349 to Ex352, in which the red EML includes the compound RD32 as a dopant, the compounds RHH-4 and RHH-6 as a first host, and the compounds REH-6 and REH-12 as a second host, has advantages in the driving voltage, the luminous efficiency and the luminous lifespan.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An organic light emitting diode, comprising:

a first electrode;

a second electrode facing the first electrode; and a first emitting part including a first red emitting material layer and positioned between the first and second electrodes, wherein the first red emitting material layer includes a first compound, a second compound and a third compound, wherein the first compound is represented by Formula 1-1:

[Formula 1-1]

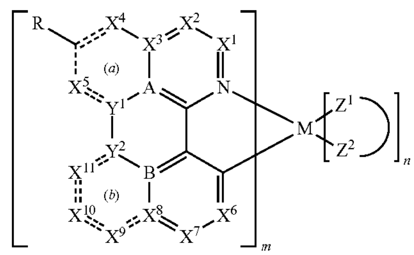

wherein in Formula 1-1:

M is molybdenum (Mo), tungsten (W), rhenium (Re), ruthenium (Ru), osmium (Os), rhodium (Rh), iridium (Ir), palladium (Pd), platinum (Pt) or silver (Ag);

each of A and B is a carbon atom;

R is an unsubstituted or substituted $C_1$-$C_{20}$ alkyl group, an unsubstituted or substituted $C_1$-$C_{20}$ alkyl silyl group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

each of $X^1$ to $X^{11}$ is independently a carbon atom, $CR^1$ or N;

only one of: a ring (a) with $X^3$-$X^5$, $Y^1$ and A; or a ring (b) with $X^8$-$X^{11}$, $Y^2$ and B is formed; and if the ring (a) is formed, each of $X^3$ and $Y^1$ is a carbon atom, $X^6$ and $X^7$ or $X^7$ and $X^8$ forms an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group;

if the ring (b) is forms, each of $X^8$ and $Y^2$ is a carbon atom, $X^1$ and $X^2$ or $X^2$ and $X^3$ forms an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent $R^1$, and/or $R^2$ and $R^3$ form an unsubstituted or substituted $C_3$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

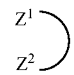

is an auxiliary ligand;

m is an integer of 1 to 3;

n is an integer of 0 to 2; and m+n is an oxidation number of M, wherein the second compound is represented by Formula 2-1:

[Formula 2-1]

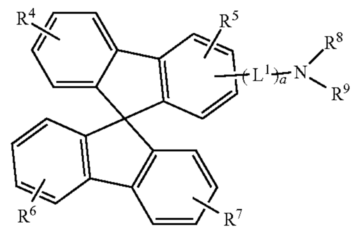

wherein in Formula 2-1:

each of $R^4$, $R^5$, $R^6$ and $R^7$ is independently selected from the group consisting of hydrogen, protium, deuterium, an unsubstituted or substituted $C_1$-$C_{20}$ alkyl group and an unsubstituted or substituted $C_6$-$C_{30}$ aryl group, each of $R^8$ and $R^9$ is independently selected from the group consisting of an unsubstituted or substituted $C_6$-$C_{30}$ aryl group and an unsubstituted or substituted $C_3$-$C_{30}$ heteroaryl group, $L^1$ is selected from the group consisting of an unsubstituted or substituted $C_6$-$C_{30}$ arylene group and an unsubstituted or substituted $C_3$-$C_{30}$ heteroarylene group, and a is 0 or 1, wherein the third compound is represented by Formula 3-1:

[Formula 3-1]

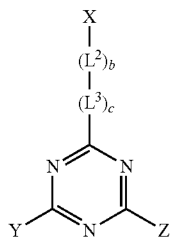

wherein in Formula 3-1:

each of X, Y and Z is independently selected from the group consisting of an unsubstituted or substituted $C_6$-$C_{30}$ aryl group and an unsubstituted or substituted $C_3$-$C_{30}$ heteroaryl group;

each of $L^2$ and $L^3$ is independently selected from the group consisting of an unsubstituted or substituted $C_6$-$C_{30}$ arylene group and an unsubstituted or substituted $C_3$-$C_{30}$ heteroarylene group; and each of b and c is independently 0 or 1.

2. The organic light emitting diode of claim 1, wherein Formula 1-1 is represented by Formula 1-2:

[Formula 1-2]

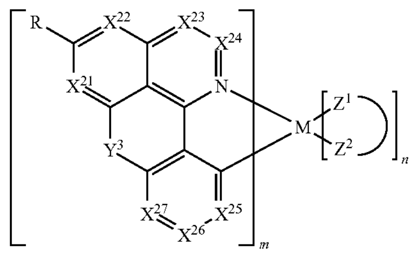

wherein each of $X^{21}$ to $X^{27}$ is independently $CR^1$ or N, wherein $Y^3$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, and wherein each of M, R,

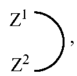

m, n, $R^1$ to $R^3$ and $R^a$ is same as defined in Formula 1-1.

3. The organic light emitting diode of claim 1, wherein Formula 1-1 is represented by Formula 1-3:

[Formula 1-3]

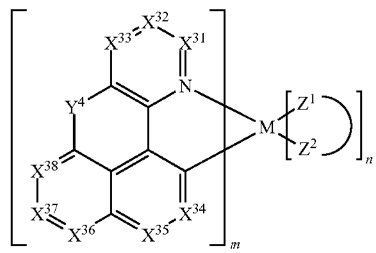

wherein each of $X^{31}$ to $X^{38}$ is independently $CR^1$ or N, wherein $Y^4$ is $BR^2$, $CR^2R^3$, C═O, $SiR^2R^3$, $GeR^2R^3$, $PR^2$, P═O, O, S, $SO_2$, Se, $SeO_2$, Te, $TeO_2$, or $NR^a$, and wherein each of M,

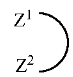

m, n, $R^1$ to $R^3$ and $R^a$ is same as defined in Formula 1-1.

4. The organic light emitting diode of claim 2, wherein Formula 1-2 is represented by Formula 1-4 or Formula 1-5:

[Formula 1-4]

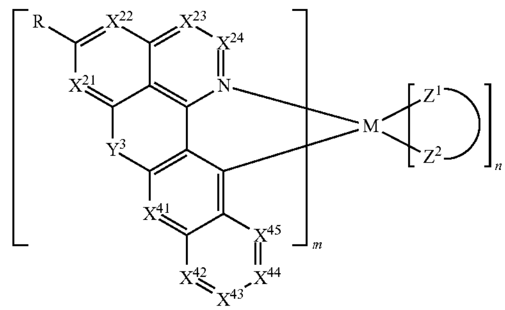

[Formula 1-5]

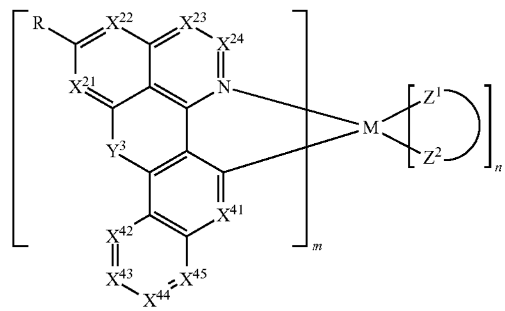

wherein each of $X^{41}$ to $X^{45}$ is independently $CR^1$ or N, and wherein each of M, R,

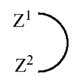

m, n and $R^1$ to $R^3$ is same as defined in Formula 1-1, and $X^{21}$ to $X^{24}$ and $Y^3$ is same as defined in Formula 1-2.

5. The organic light emitting diode of claim 3, wherein Formula 1-3 is represented by Formula 1-6 or Formula 1-7:

[Formula 1-6]

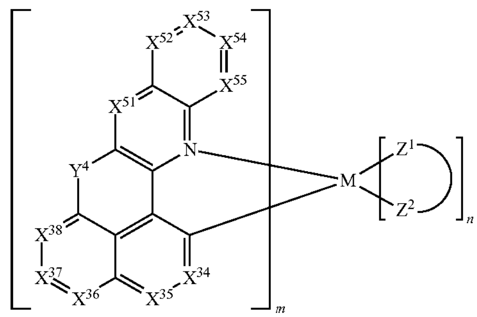

[Formula 1-7]

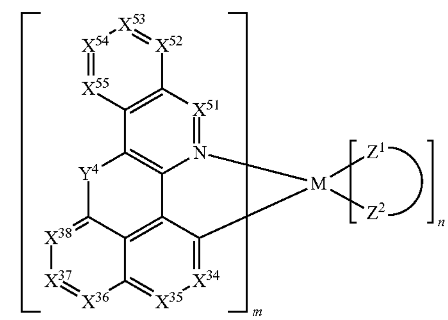

wherein each of $X^{51}$ to $X^{55}$ is independently $CR^1$ or N, and wherein each of M,

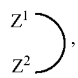

m, n, $R^1$ to $R^3$ is same as defined in Formula 1-1, and each of $X^{34}$ to $X^{38}$ and $Y^4$ is same as defined in Formula 1-3.

6. The organic light emitting diode of claim 1, wherein Formula 1-1 is represented by one of Formula 1-8 to Formula 1-11:

[Formula 1-8]

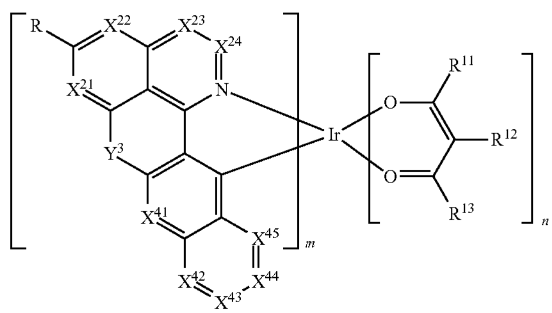

-continued

[Formula 1-9]

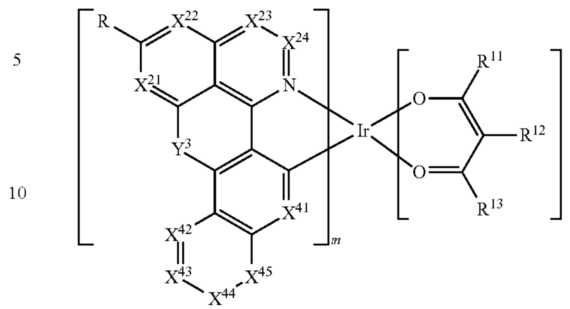

[Formula 1-10]

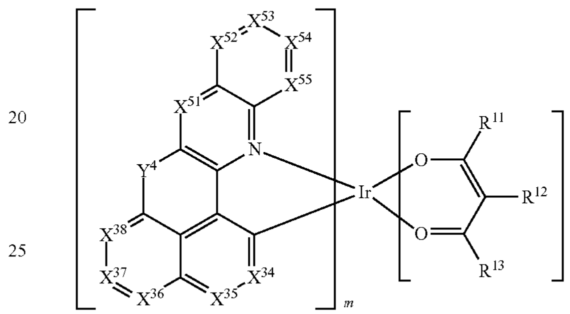

[Formula 1-11]

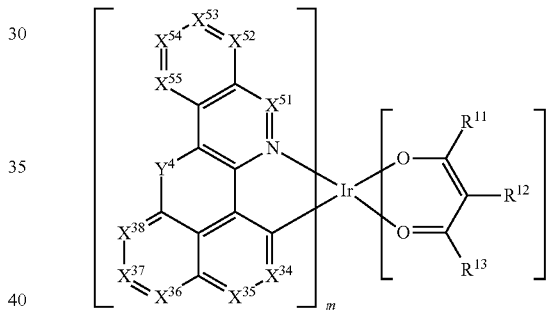

wherein R in Formulas 1-8 and 1-9 is same as defined in Formula 1-1, wherein each of $X^{21}$ to $X^{24}$, $X^{34}$ to $X^{38}$, $X^{41}$ to $X^{45}$ and $X^{51}$ to $X^{55}$ is independently $CR^1$ or N, wherein each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$, wherein each of $R^1$ to $R^3$ and $R^a$ is same as defined in Formula 1-1, wherein each of $R^{11}$ to $R^{13}$ is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group, wherein m is an integer of 1 to 3, and n is an integer of 0 to 2, and wherein m+n is 3.

7. The organic light emitting diode of claim 1, wherein Formula 1-1 is represented by one of Formula 1-12 to Formula 1-15:

[Formula 1-12]

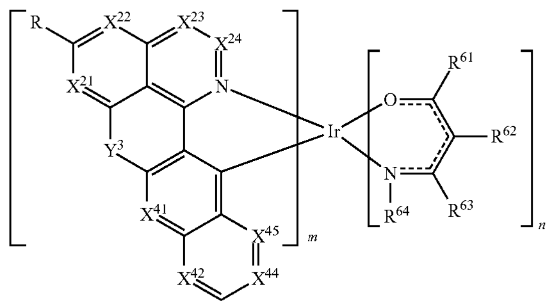

[Formula 1-13]

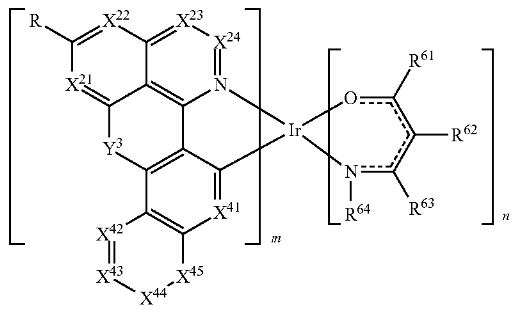

[Formula 1-14]

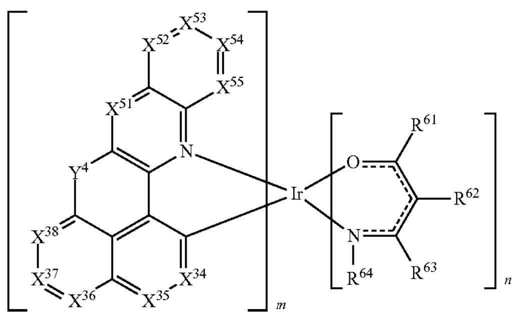

[Formula 1-15]

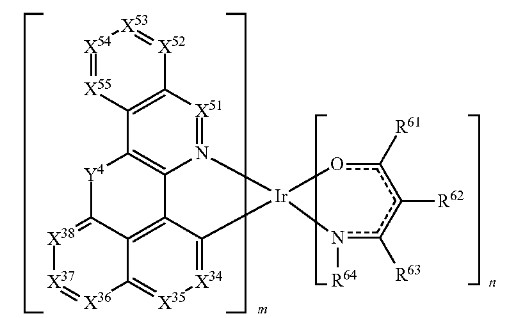

wherein R in Formulas 1-12 and 1-13 is same as defined in Formula 1-1, wherein each of $X^{21}$ to $X^{24}$, $X^{34}$ to $X^{38}$, $X^{41}$ to $X^{45}$ and $X^{51}$ to $X^{55}$ is independently $CR^1$ or N, wherein each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$, wherein each of $R^1$ to $R^3$ and $R^a$ is same as defined in Formula 1-1, wherein each of $R^{61}$ to $R^{64}$ is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group, wherein m is an integer of 1 to 3, and n is an integer of 0 to 2, and wherein m+n is 3.

8. The organic light emitting diode of claim 1, wherein Formula 1-1 is represented by one of Formula 1-16 to Formula 1-19:

[Formula 1-16]

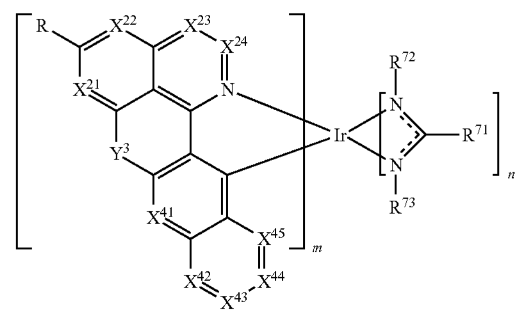

[Formula 1-17]

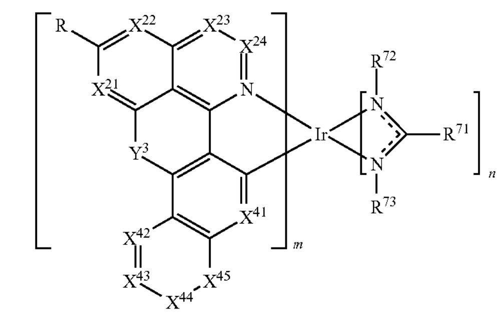

-continued

[Formula 1-18]

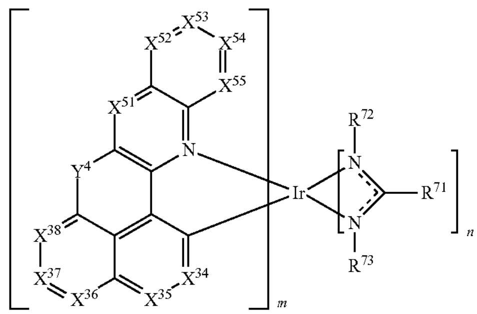

[Formula 1-19]

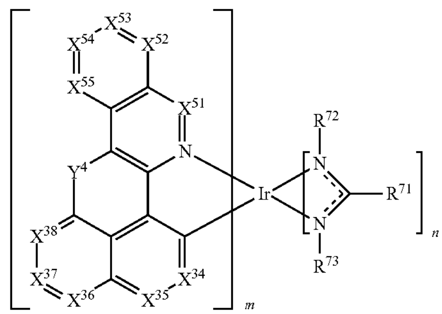

wherein R in Formulas 1-16 and 1-17 is same as defined in Formula 1-1, wherein each of $X^{21}$ to $X^{24}$, $X^{34}$ to $X^{38}$, $X^{41}$ to $X^{45}$ and $X^{51}$ to $X^{55}$ is independently $CR^1$ or N, wherein each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$, wherein each of $R^1$ to $R^3$ and $R^a$ is same as defined in Formula 1-1, wherein each of $R^{71}$ to $R^{73}$ is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group, wherein m is an integer of 1 to 3, and n is an integer of 0 to 2, and wherein m+n is 3.

9. The organic light emitting diode of claim 1, wherein Formula 1-1 is represented by one of Formula 1-20 to Formula 1-23:

[Formula 1-20]

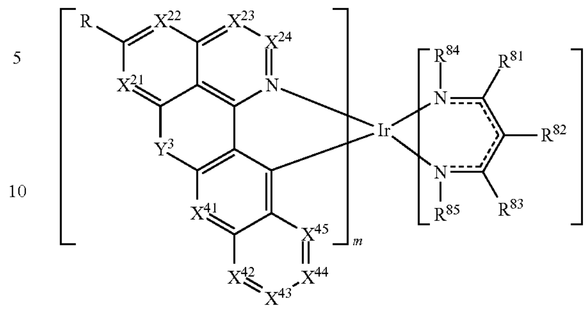

[Formula 1-21]

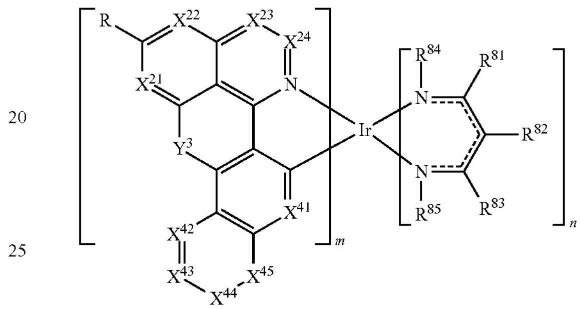

[Formula 1-22]

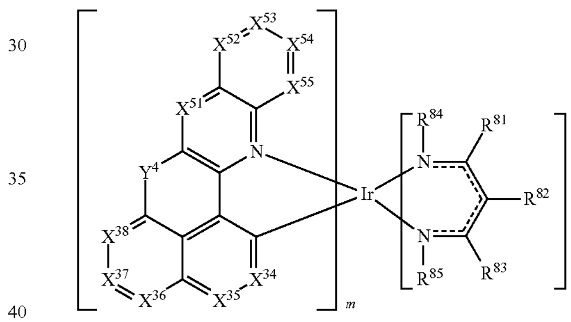

[Formula 1-23]

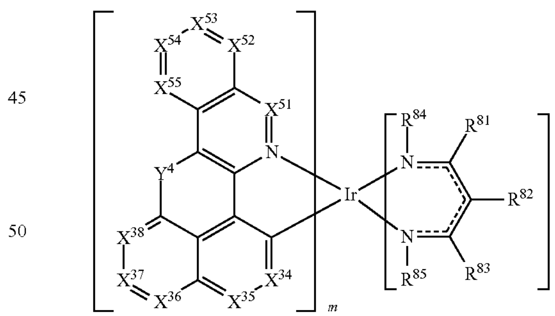

wherein R in Formulas 1-20 and 1-21 is same as defined in Formula 1-1, wherein each of $X^{21}$ to $X^{24}$, $X^{34}$ to $X^{38}$, $X^{41}$ to $X^{45}$ and $X^{51}$ to $X^{55}$ is independently $CR^1$ or N, wherein each of $Y^3$ and $Y^4$ is independently $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$, wherein each of $R^1$ to $R^3$ and $R^a$ is same as defined in Formula 1-1, wherein each of $R^{81}$ to $R^{85}$ in Formulas 1-20 to 1-23 is independently selected from the group consisting of hydrogen, protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_3$-$C_{30}$ alicyclic group, an unsubstituted or substituted $C_3$-$C_{30}$ hetero alicyclic group, an unsubstituted or substituted $C_6$-$C_{30}$ aromatic group and an unsubstituted or substituted $C_3$-$C_{30}$ hetero aromatic group, wherein m is an integer of 1 to 3, and n is an integer of 0 to 2, and wherein m+n is 3.

10. The organic light emitting diode of claim 1, wherein the first compound is one of the following compounds:

RD1

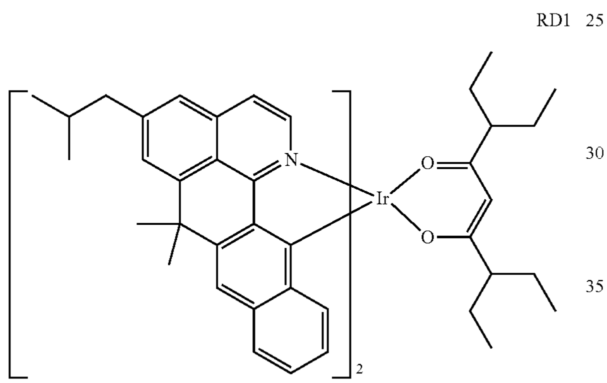

RD2

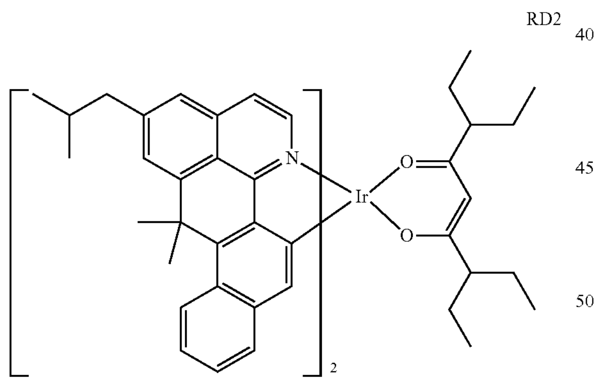

RD3

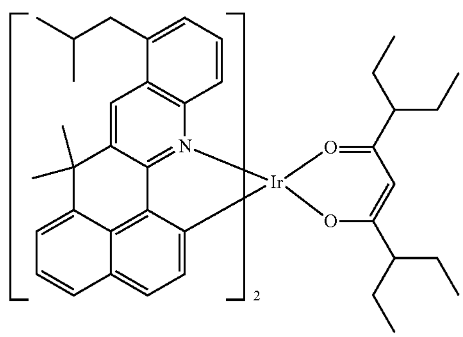

-continued

RD4

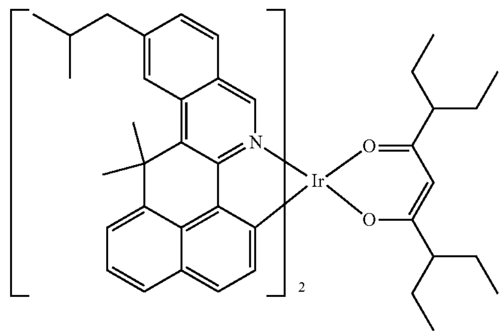

RD5

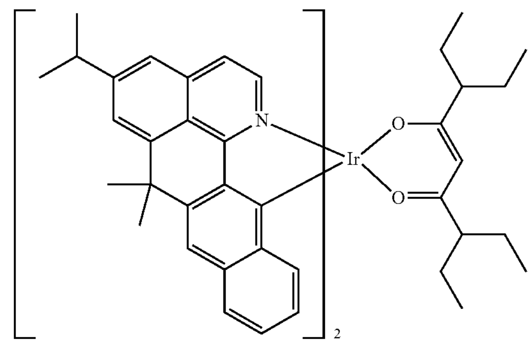

RD6

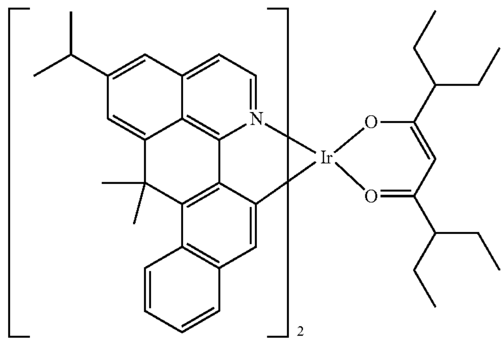

RD7

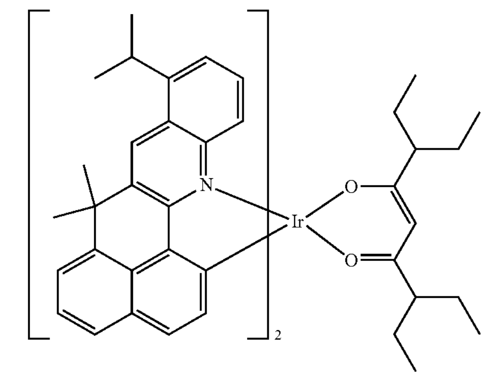

-continued
RD8
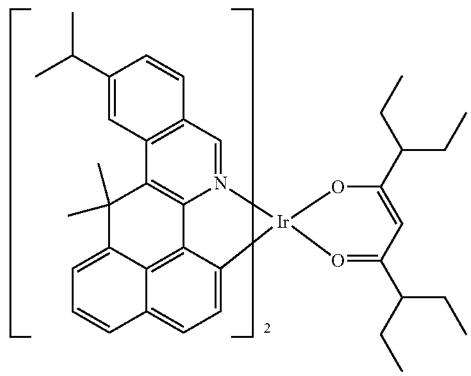
RD9
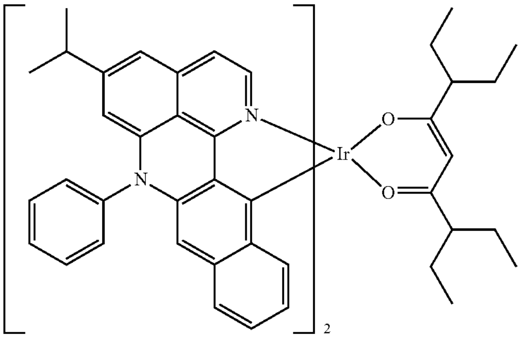
RD10
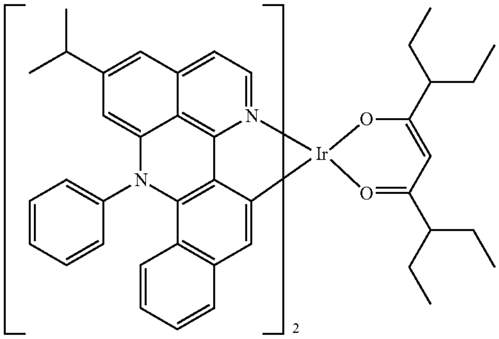
RD11
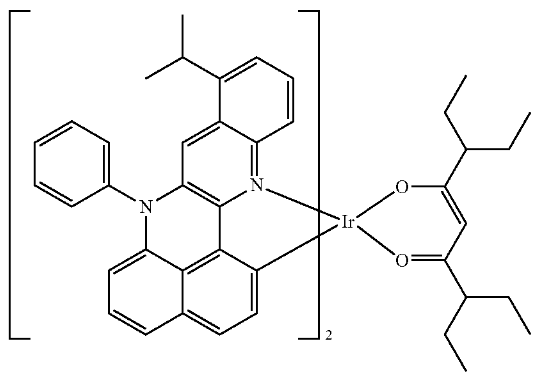
-continued
RD12
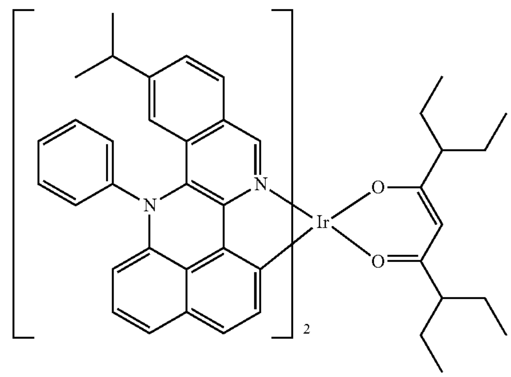
RD13
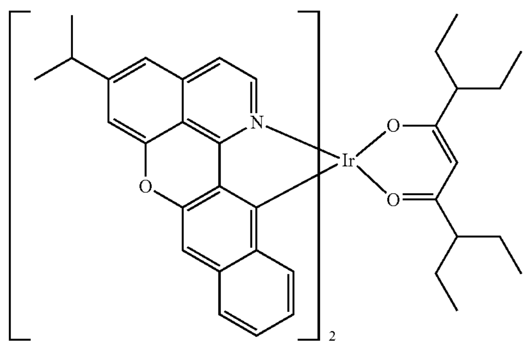
RD14
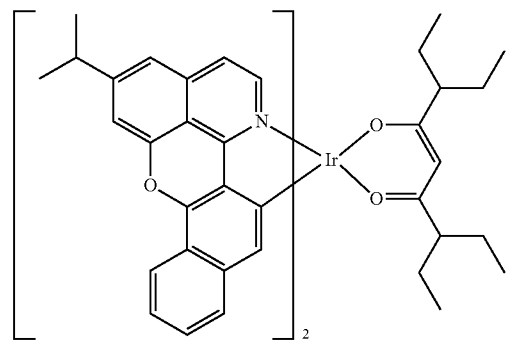
RD15
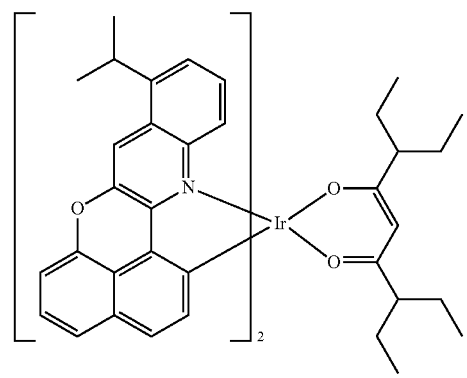

-continued
RD16
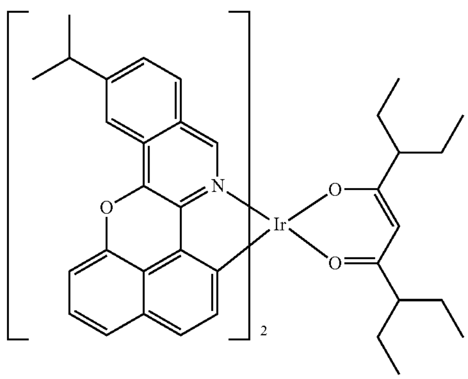
RD17
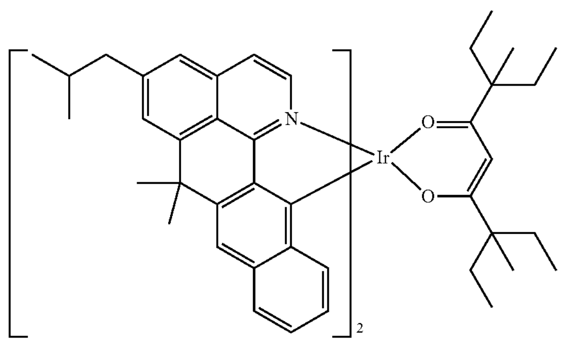
RD18
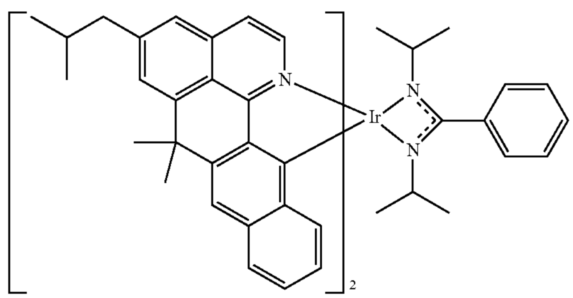
RD19
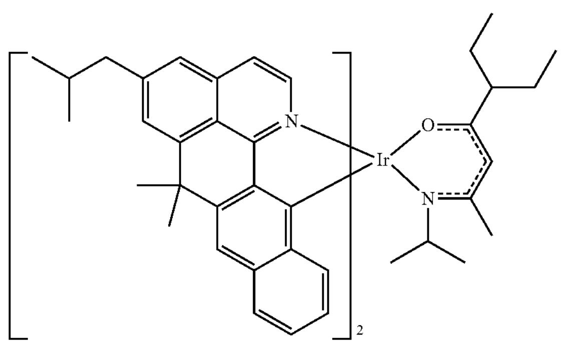
-continued
RD20
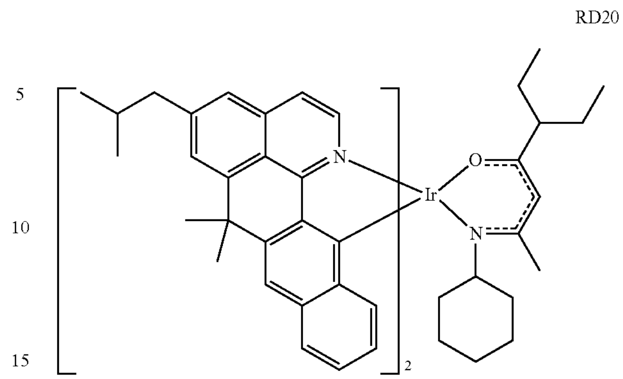
RD21
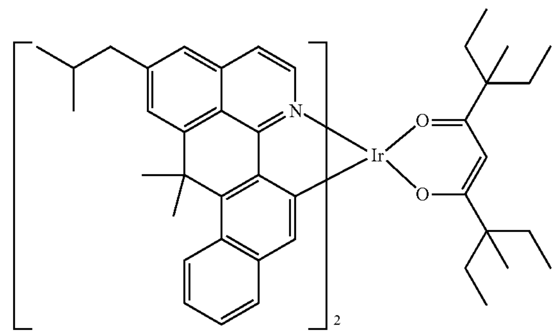
RD22
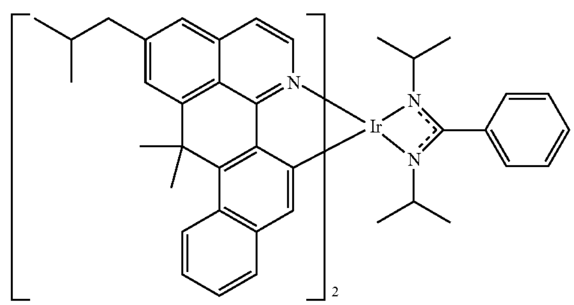
RD23
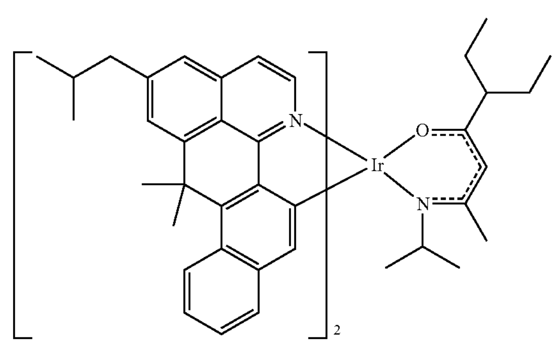

-continued
RD24
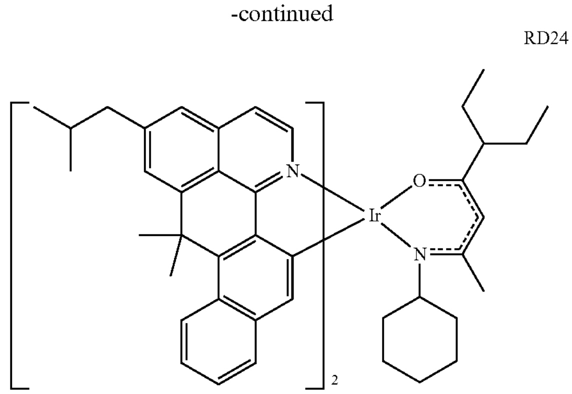
RD25
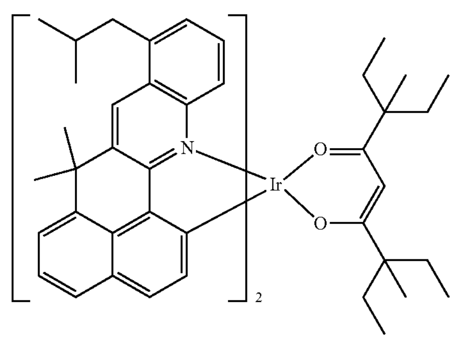
RD26
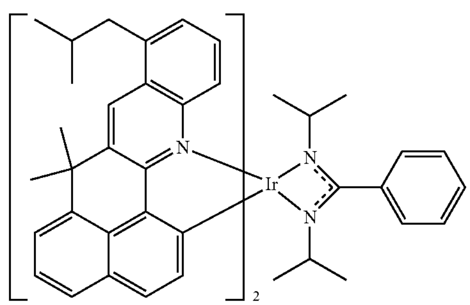
RD27
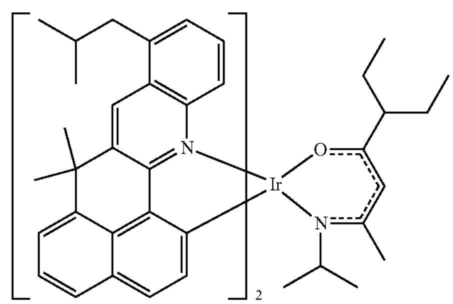
-continued
RD28
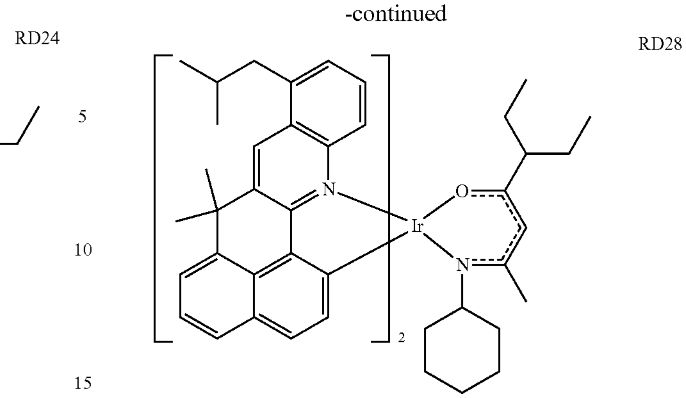
RD29
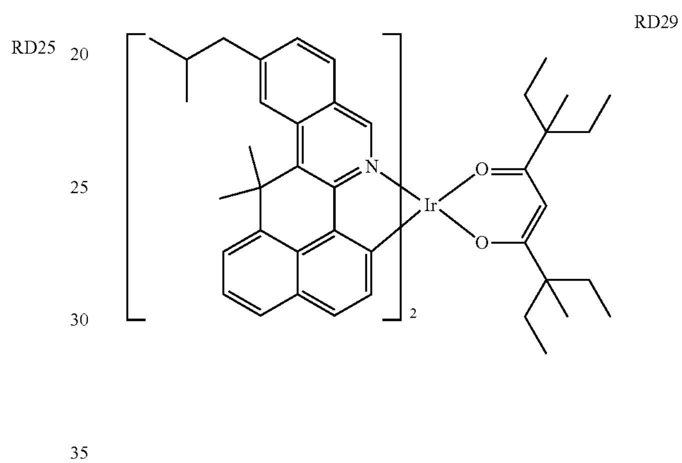
RD30
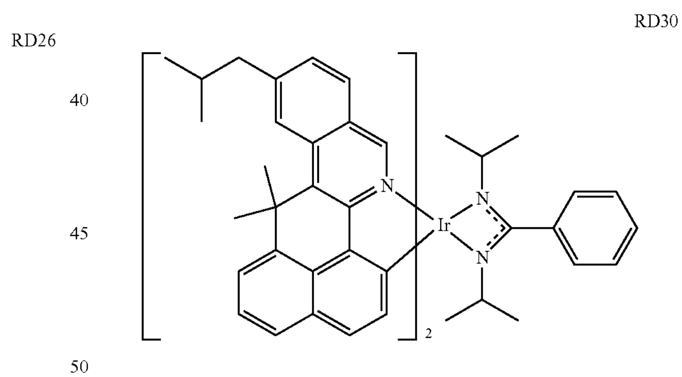
RD31
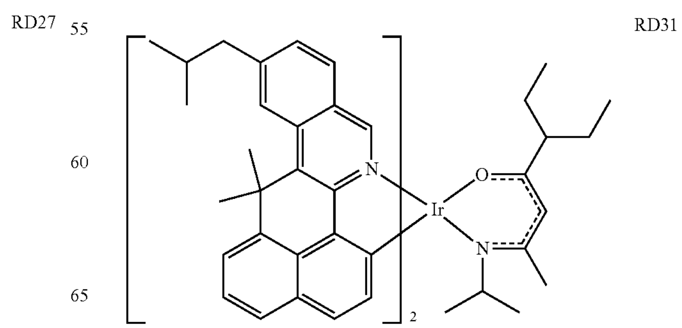

-continued
RD32
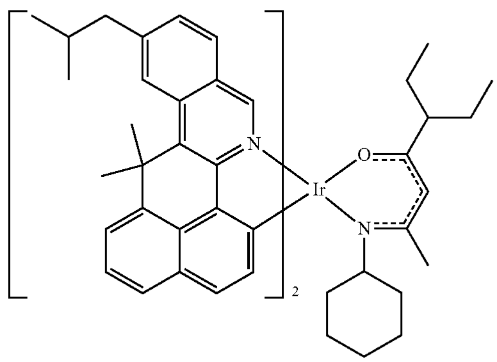
11. The organic light emitting diode of claim 1, wherein Formula 2-1 is represented by Formula 2-2 or Formula 2-3:
[Formula 2-2]
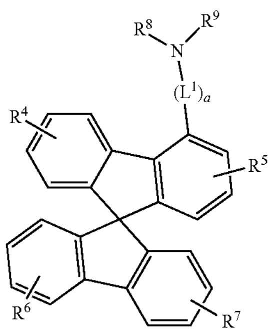
[Formula 2-3]
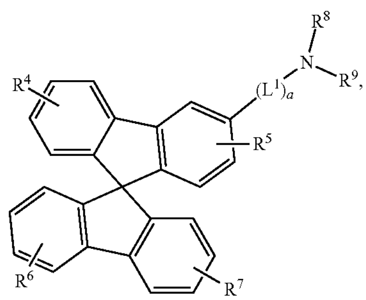
wherein each of $L^1$, a, $R^4$ to $R^9$ is same as defined in Formula 2-1.
12. The organic light emitting diode of claim 1, wherein the second compound is one of the following compounds:
RHH-1
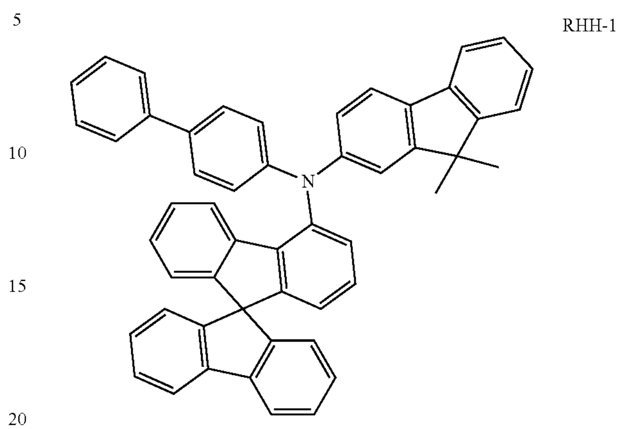
RHH-2
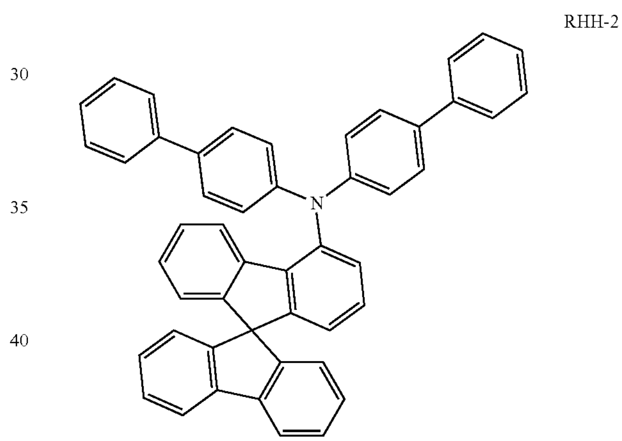
RHH-3
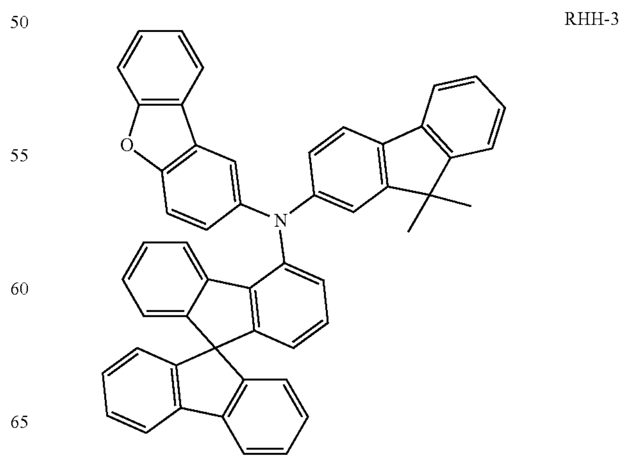

-continued
RHH-4
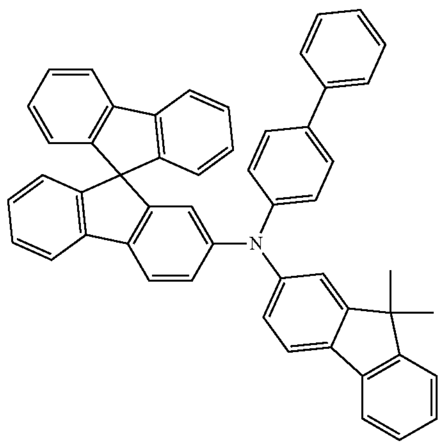
RHH-5
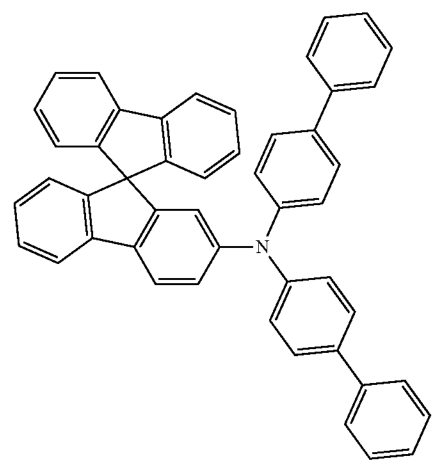
RHH-6
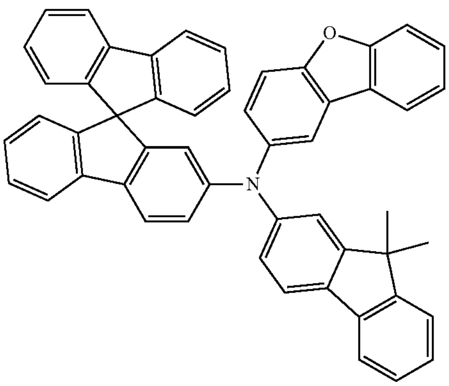
-continued
RHH-7
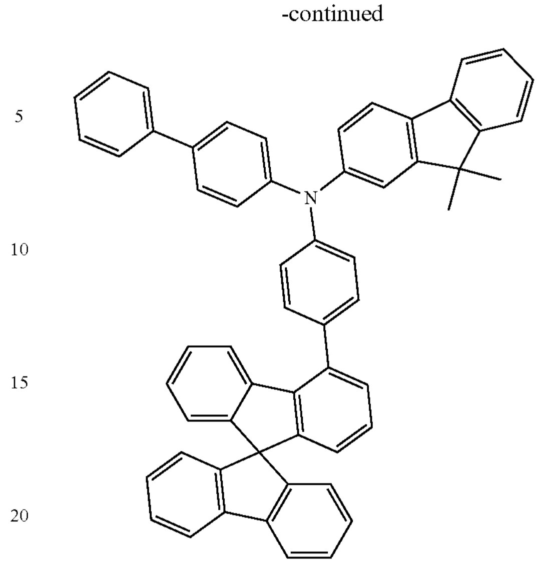
RHH-8
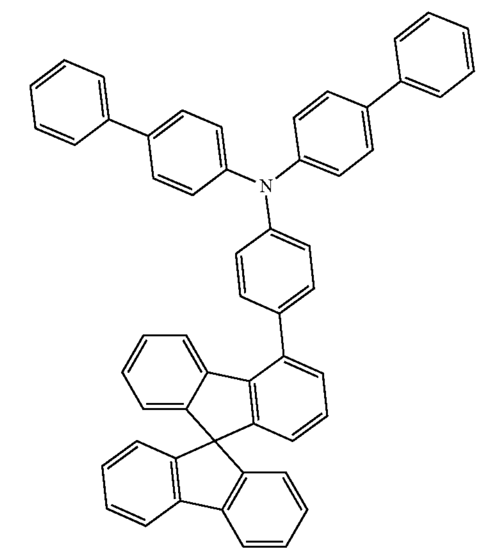
RHH-9
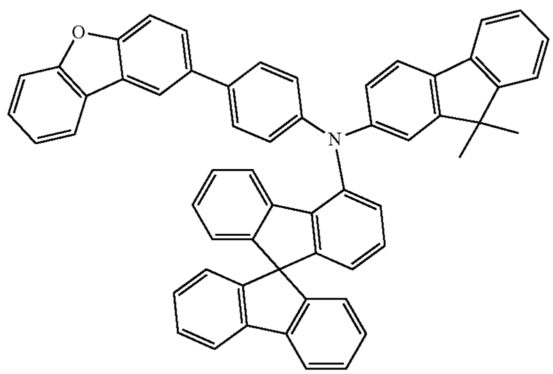

-continued
RHH-10
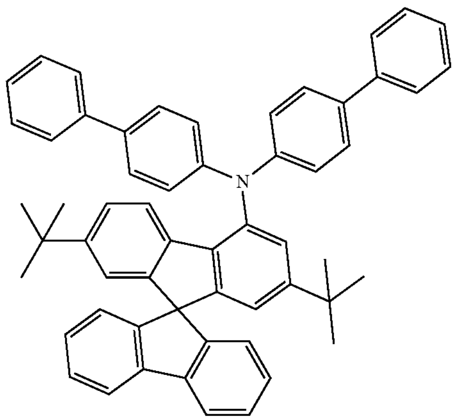
RHH-11
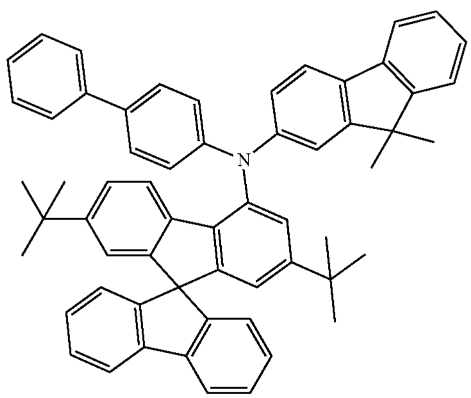
RHH-12
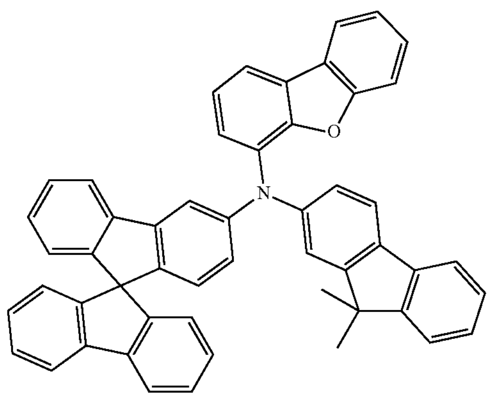
RHH-13
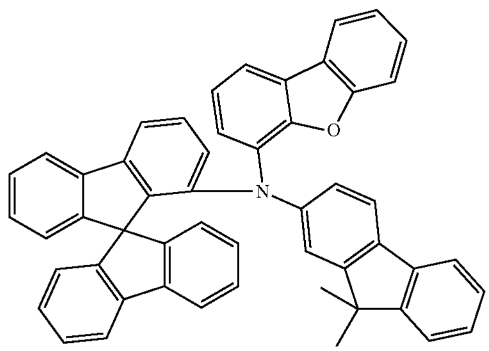
-continued
RHH-14
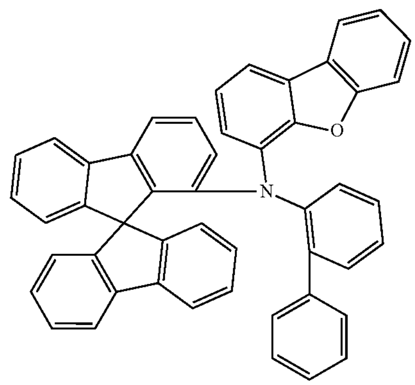
RHH-15
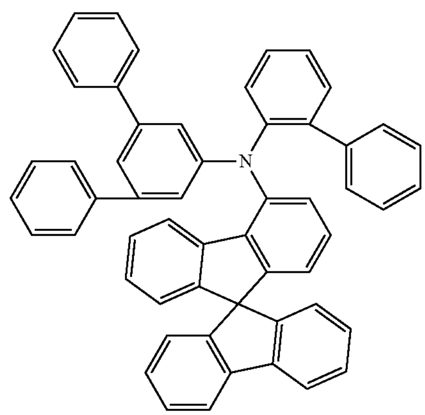
RHH-16
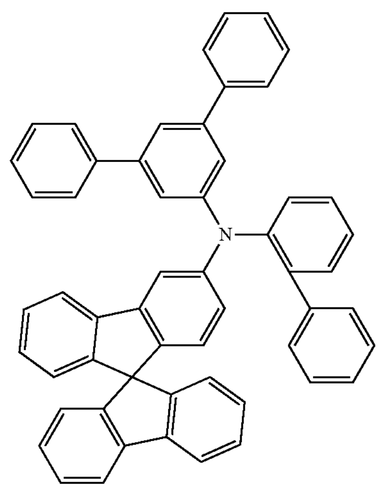

-continued
RHH-17
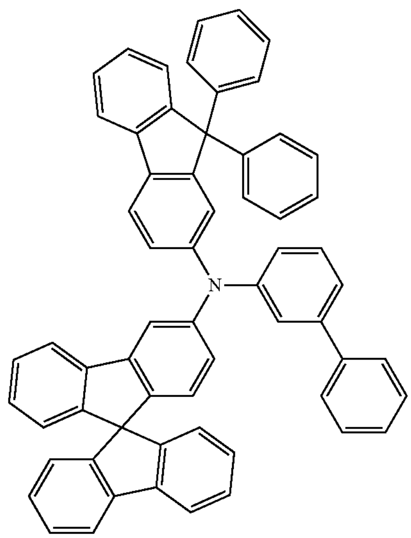
RHH-18
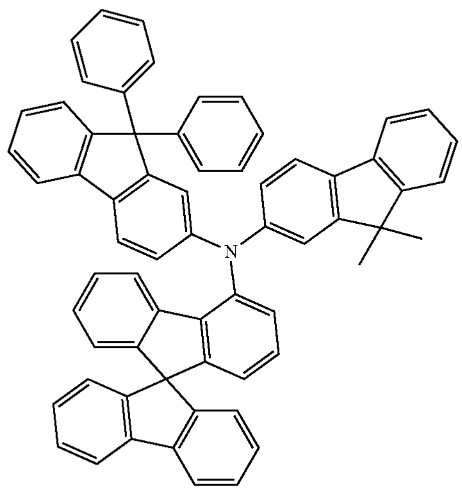
RHH-19
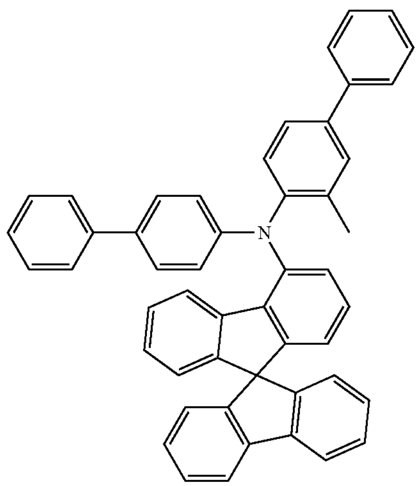
-continued
RHH-20
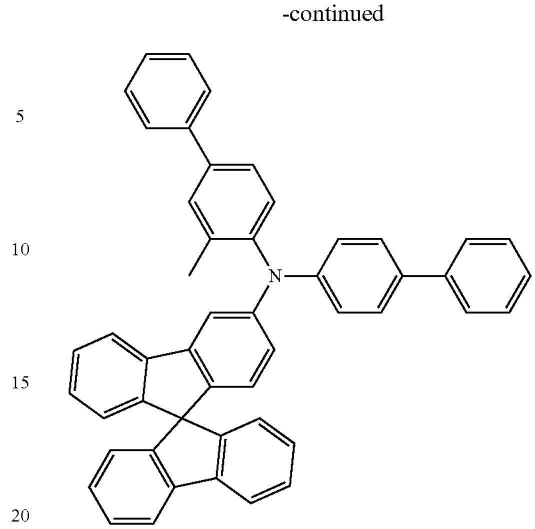
RHH-21
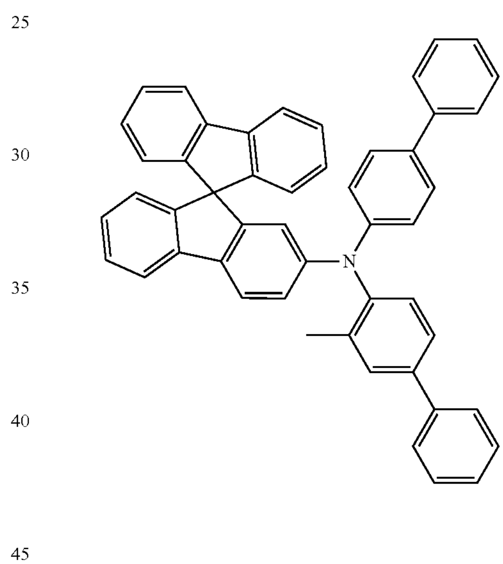
RHH-22
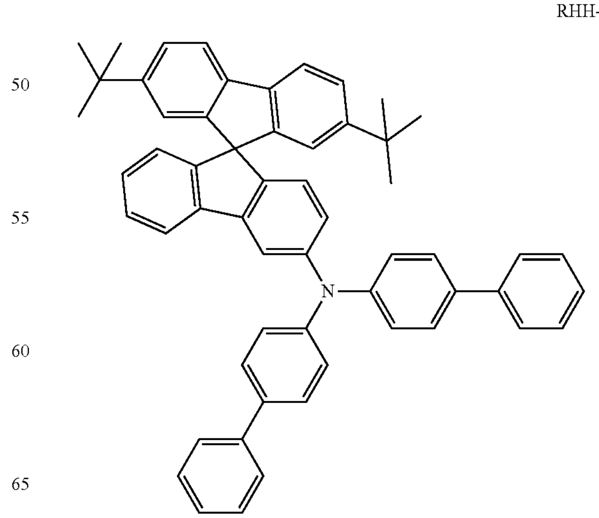

-continued
RHH-23
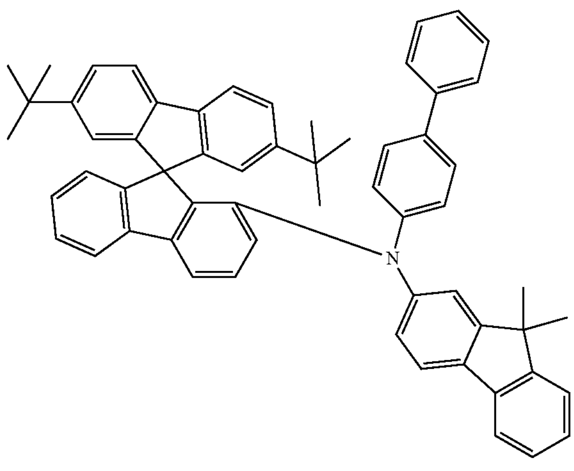
RHH-24
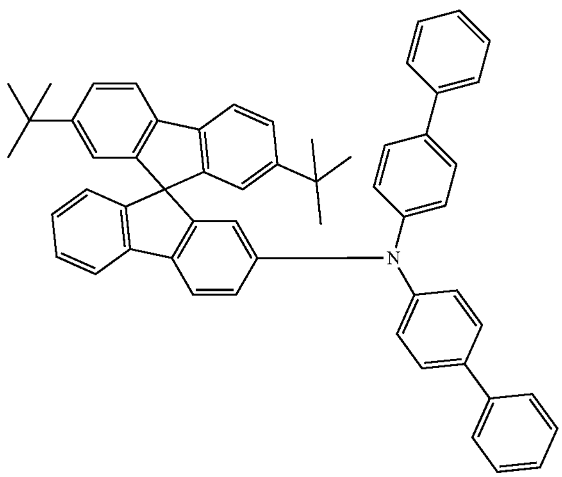
RHH-20
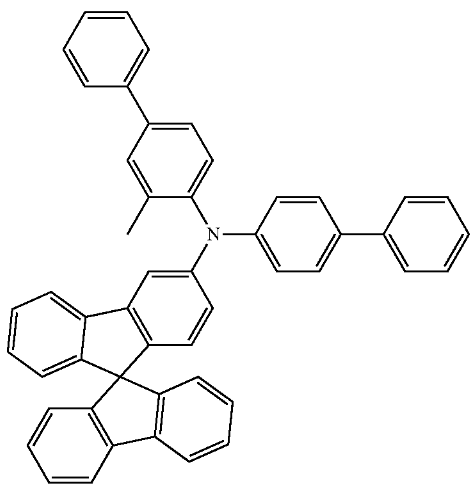
-continued
RHH-25
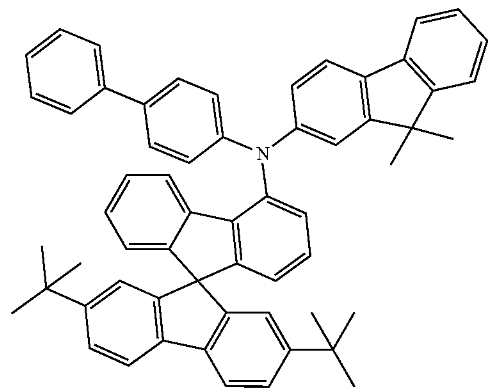
RHH-26
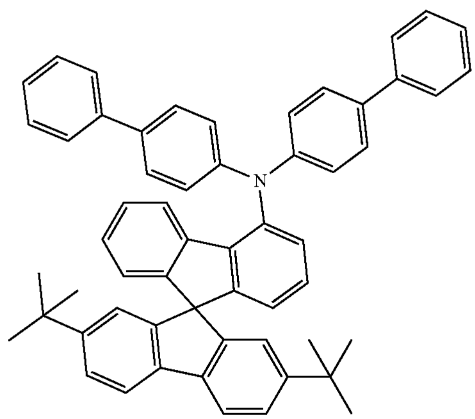
RHH-27
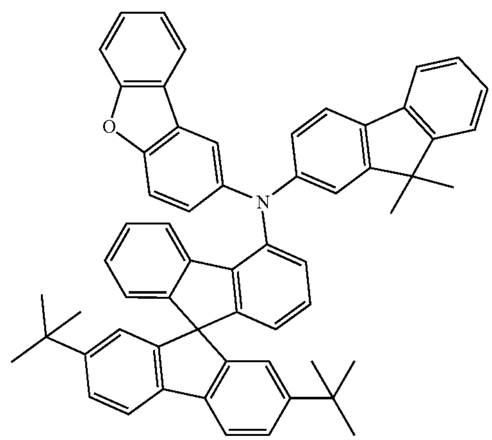

-continued

RHH-28

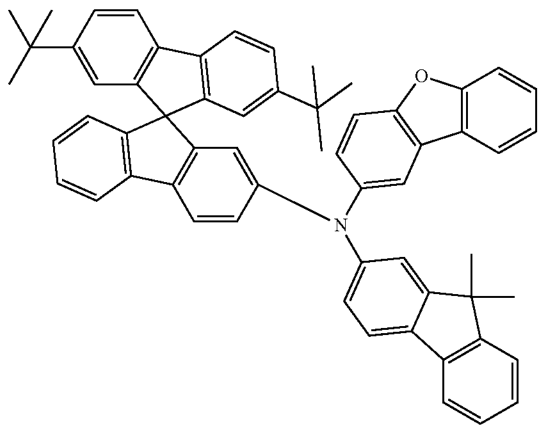

RHH-29

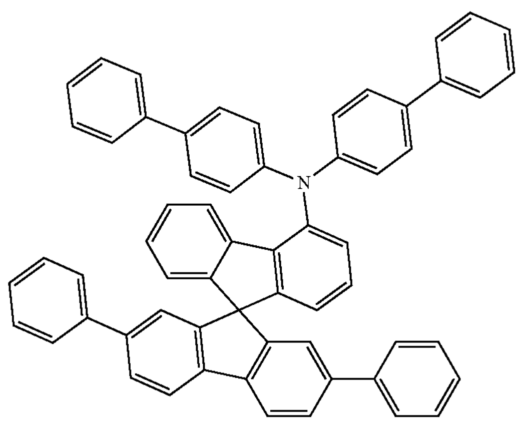

RHH-30

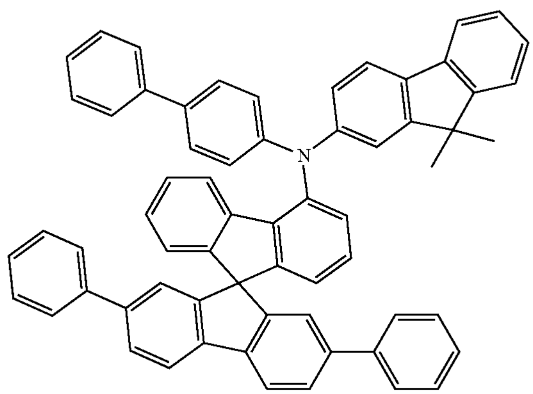

13. The organic light emitting diode of claim 1, wherein Formula 3-1 is represented by Formula 3-2:

[Formula 3-2]

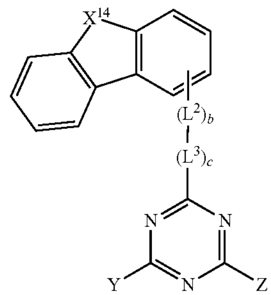

wherein $X^{14}$ is O or S;

each of Y and Z is independently selected from an unsubstituted or substituted $C_6$-$C_{30}$ aryl group;

each of $L^2$ and $L^3$ is independently selected from an unsubstituted or substituted $C_6$-$C_{30}$ arylene group; and each of b and c is independently 0 or 1.

14. The organic light emitting diode of claim 13, wherein Formula 3-2 is represented by Formula 3-3:

[Formula 3-3]

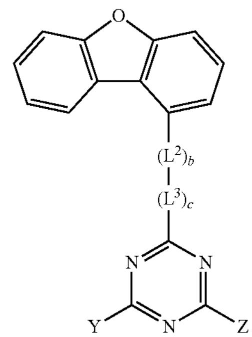

wherein each of Y and Z is independently selected from phenyl and naphthyl;

each of $L^2$ and $L^3$ is independently selected from phenylene and naphthylene; and each of b and c is independently 0 or 1.

15. The organic light emitting diode of claim 13, wherein Formula 3-2 is represented by Formula 3-4:

[Formula 3-4]

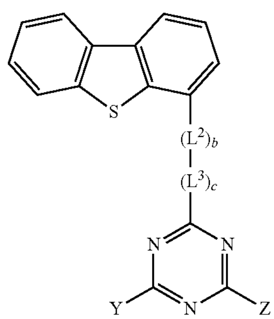

wherein each of Y and Z is independently selected from phenyl and naphthyl;

each of L2 and L3 is independently selected from phenylene and naphthylene; and each of b and c is 1.

16. The organic light emitting diode of claim 1, wherein Formula 3-1 is represented by Formula 3-5:

[Formula 3-5]

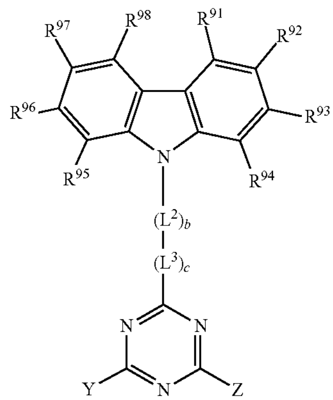

wherein each of Y and Z is independently selected from an unsubstituted or substituted $C_6$-$C_{30}$ aryl group;

each of $L^2$ and $L^3$ is independently selected from an unsubstituted or substituted $C_6$-$C_{30}$ arylene group and an unsubstituted or substituted $C_6$-$C_{30}$ heteroarylene group;

each of b and c is independently 0 or 1;

each of $R^{91}$ to $R^{98}$ is independently selected from the group consisting of hydrogen, an unsubstituted or substituted $C_1$-$C_{10}$ alkyl group and an unsubstituted or substituted $C_6$-$C_{30}$ aryl group;

optionally, $R^{91}$ and $R^{92}$, $R^{92}$ and $R^{93}$ or $R^{93}$ and $R^{94}$ form an unsubstituted or substituted $C_6$-$C_{30}$ aromatic ring.

17. The organic light emitting diode of claim 1, wherein the third compound is one of the following compounds:

REH-1

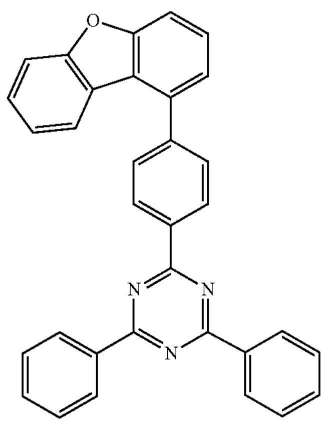

-continued

REH-2

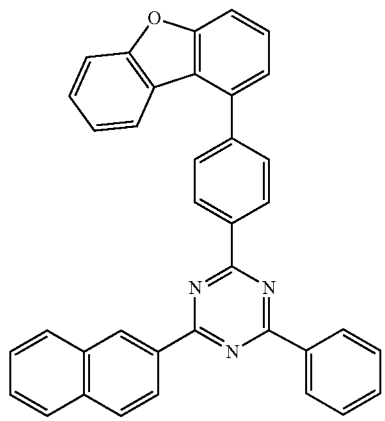

REH-3

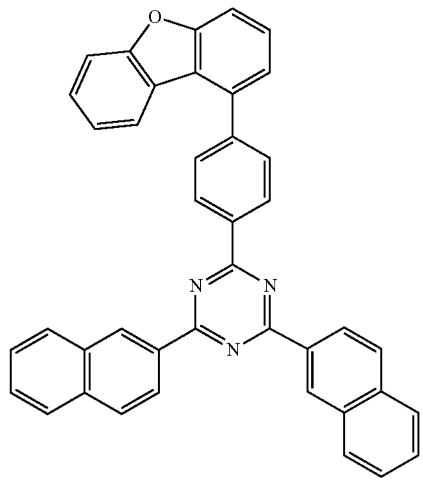

REH-4

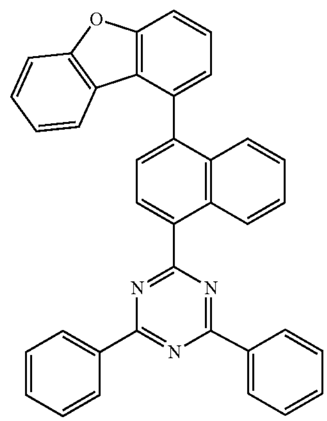

-continued
REH-5
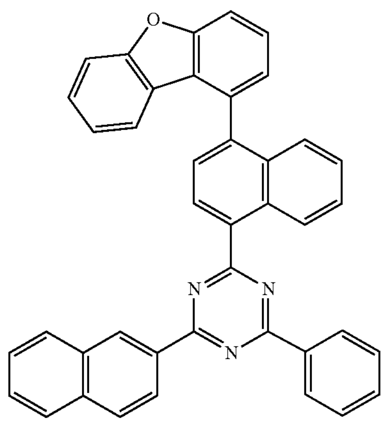
REH-6
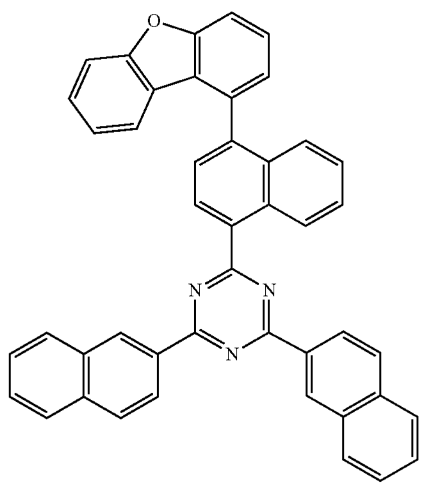
REH-7
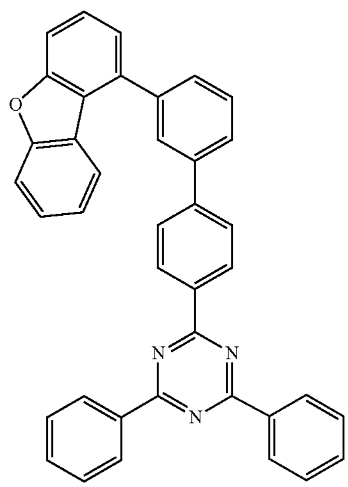
-continued
REH-8
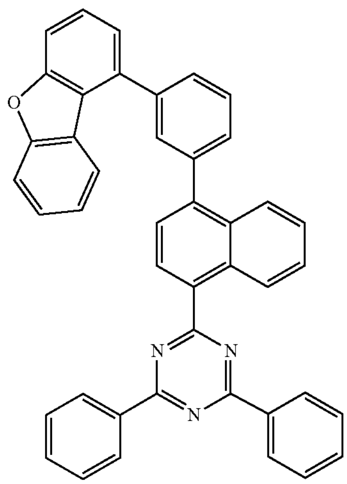
REH-9
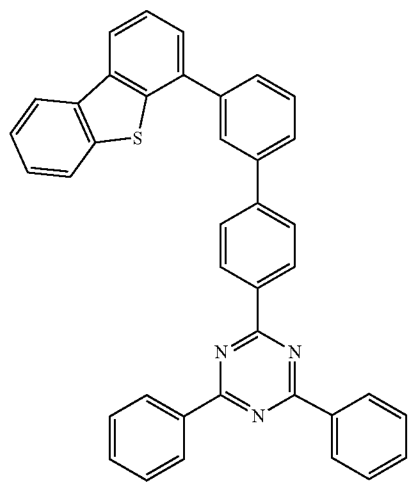
REH-10
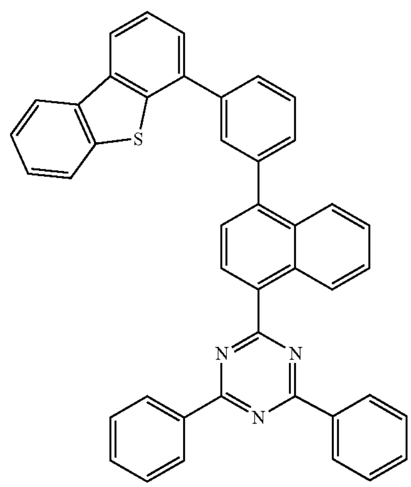

-continued
REH-11
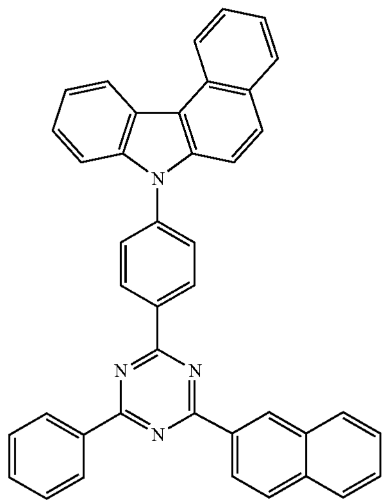
REH-12
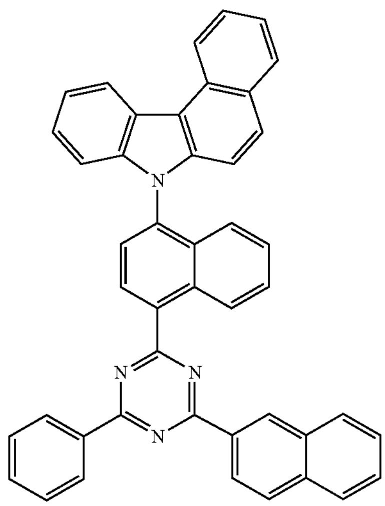
REH-13
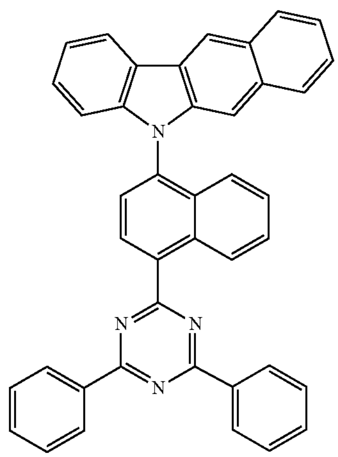
-continued
REH-14
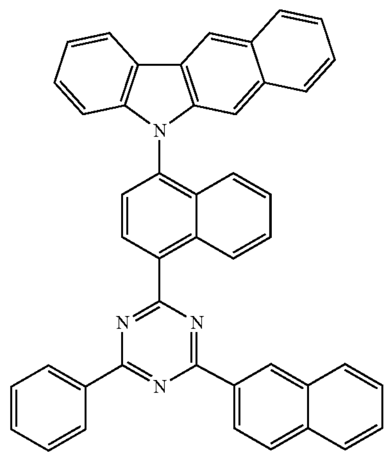
REH-15
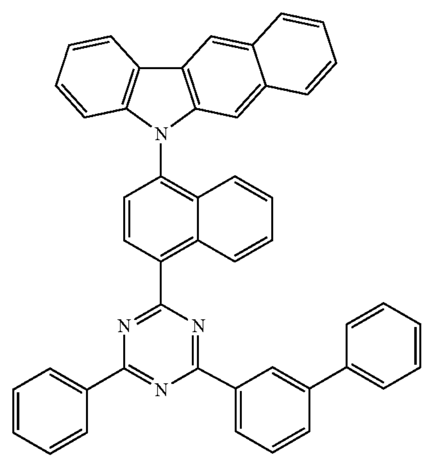
REH-16
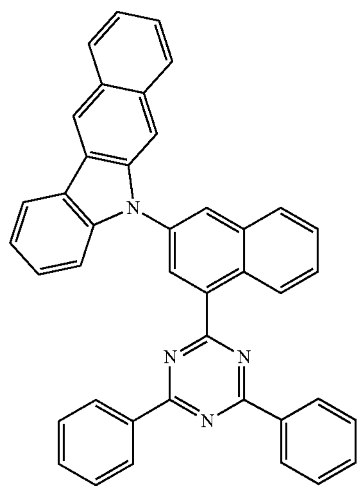

-continued
REH-17
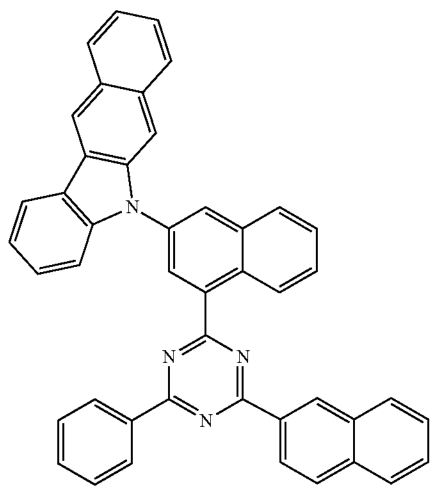
REH-18
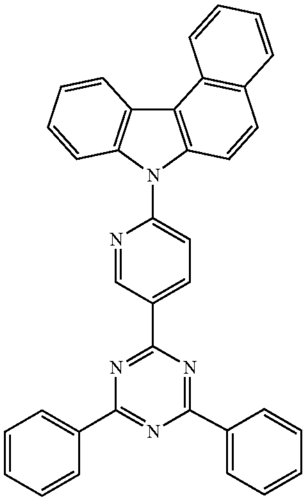
REH-19
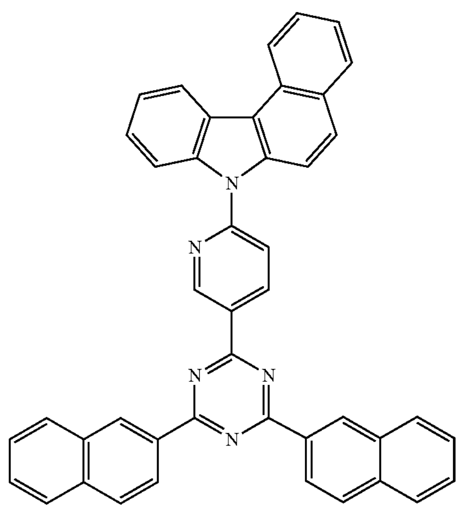
-continued
REH-20
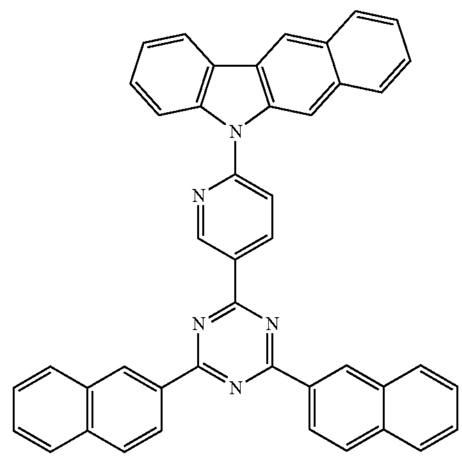
REH-21
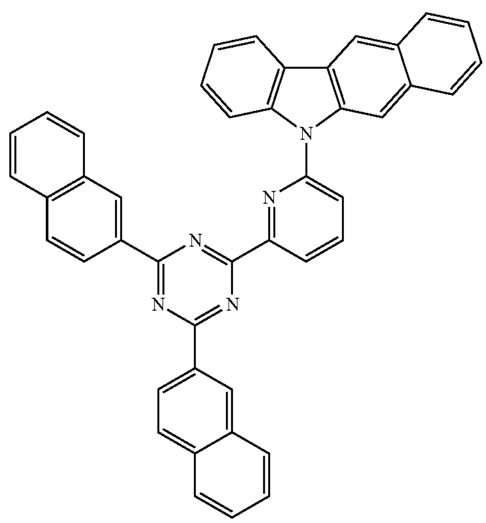
REH-22
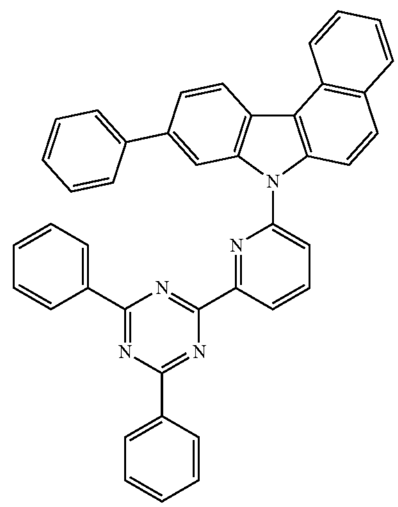

-continued
REH-23
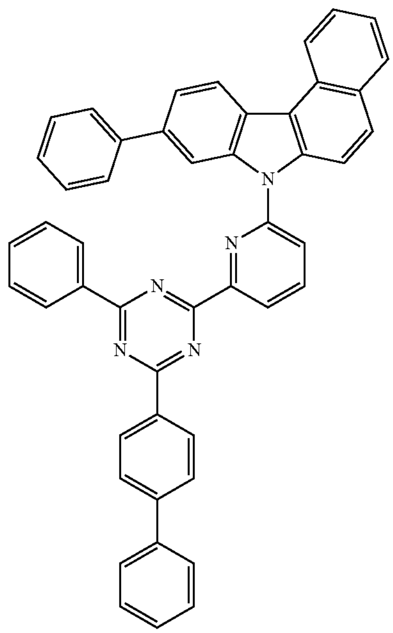
REH-24
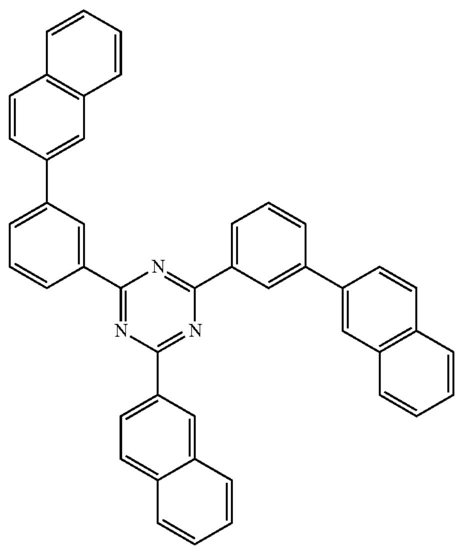
-continued
REH-25
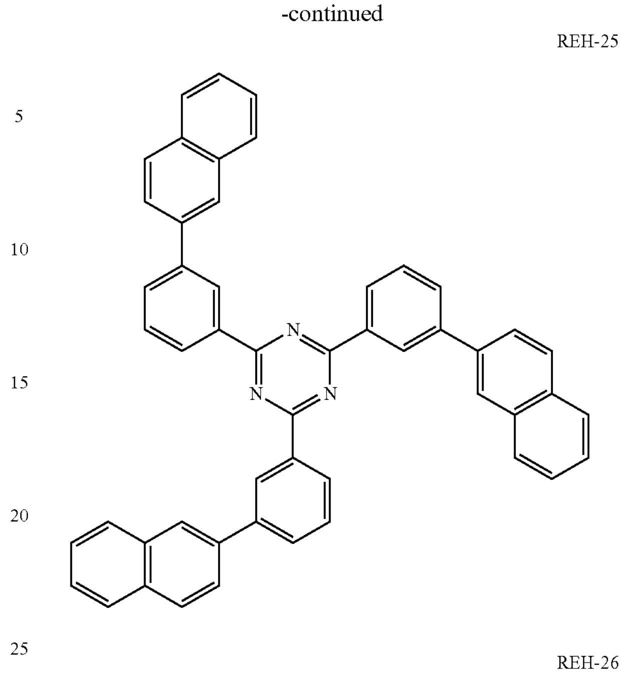
REH-26
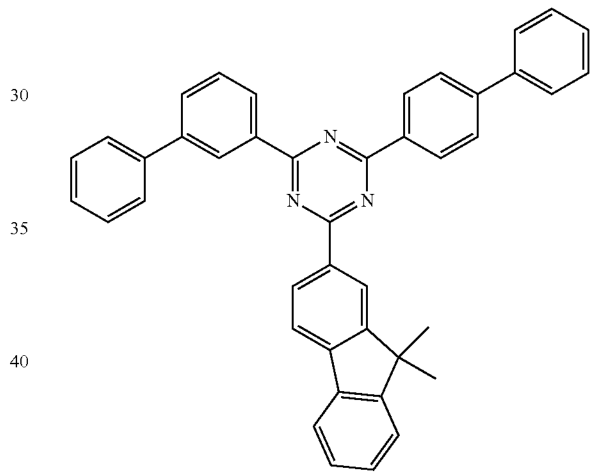
REH-27
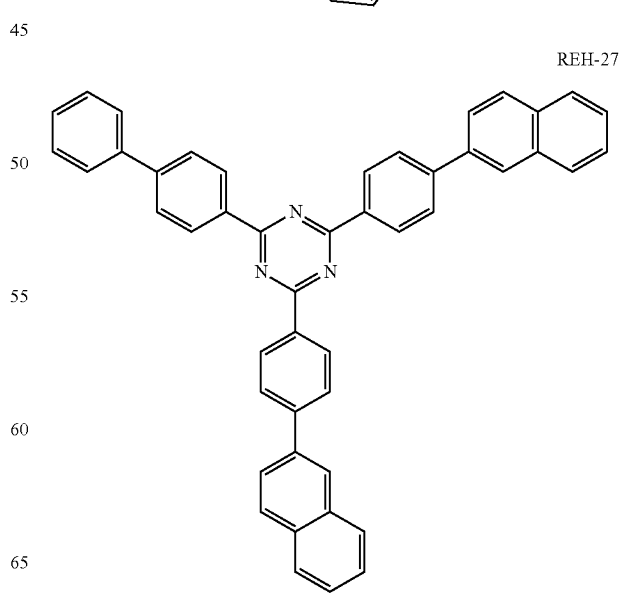

-continued

REH-28

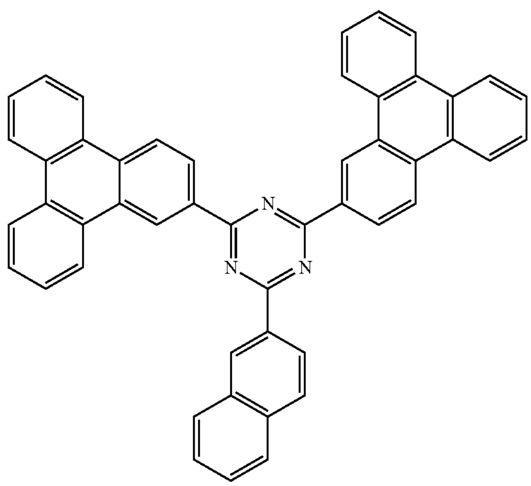

REH-29

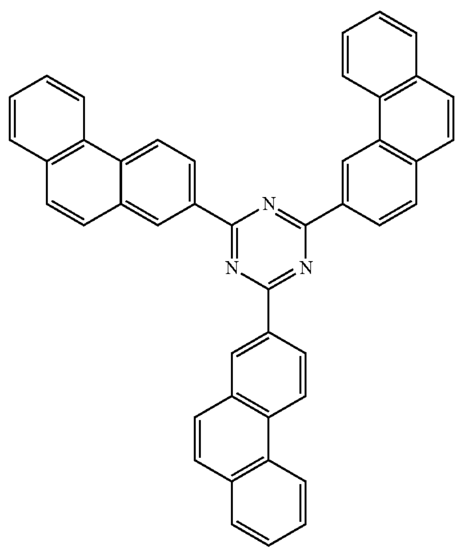

REH-30

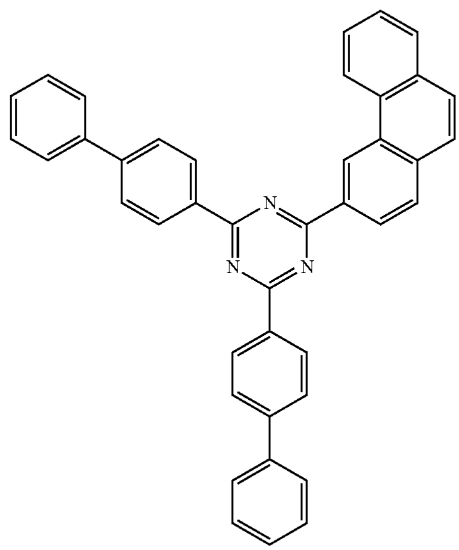

18. The organic light emitting diode of claim 1, wherein each of a weight % of the second and third compounds is greater than a weight % of the first compound.

19. The organic light emitting diode of claim 1, further comprising:

a second emitting part including a second red emitting material layer and positioned between the first emitting part and the second electrode; and a charge generation layer positioned between the first and second emitting parts.

20. The organic light emitting diode of claim 19, wherein the second emitting material layer includes a fourth compound represented by Formula 1-1, a fifth compound represented by Formula 2-1 and a sixth compound represented by Formula 3-1.

21. The organic light emitting diode of claim 1, further comprising:

a second emitting part including a first blue emitting material layer and positioned between the first electrode and the first emitting part; and a first charge generation layer positioned between the first and second emitting parts.

22. The organic light emitting diode of claim 21, further comprising:

a third emitting part including a second blue emitting material layer and positioned between the first emitting part and the second electrode; and a second charge generation layer positioned between the first and third emitting parts.

23. The organic light emitting diode of claim 22, wherein the first emitting part further includes a green emitting material layer positioned between the red emitting material layer and the second charge generation layer.

24. The organic light emitting diode of claim 23, wherein the first emitting part further includes a yellow-green emitting material layer positioned between the red and green emitting material layers.

25. An organic light emitting device, comprising:

a substrate;

the organic light emitting diode of claim 1 positioned on the substrate.

* * * * *